US012501826B2

(12) United States Patent
Oh et al.

(10) Patent No.: US 12,501,826 B2
(45) Date of Patent: Dec. 16, 2025

(54) LIGHT EMITTING DEVICE

(71) Applicant: Samsung Display Co., Ltd., Yongin-si (KR)

(72) Inventors: Chanseok Oh, Seoul (KR); Taeil Kim, Hwaseong-si (KR); Sun Young Pak, Suwon-si (KR); Junha Park, Gwacheon-si (KR); Jang Yeol Baek, Yongin-si (KR); Kyoung Sunwoo, Hwaseong-si (KR); Mun-Ki Sim, Seoul (KR); Minjung Jung, Hongcheon-gun (KR)

(73) Assignee: Samsung Display Co., Ltd., Yongin-si (KR)

( * ) Notice: Subject to any disclaimer, the term of this patent is extended or adjusted under 35 U.S.C. 154(b) by 960 days.

(21) Appl. No.: 17/543,385

(22) Filed: Dec. 6, 2021

(65) Prior Publication Data

US 2022/0263026 A1 Aug. 18, 2022

(30) Foreign Application Priority Data

Feb. 8, 2021 (KR) ........................ 10-2021-0017667

(51) Int. Cl.
*H10K 85/60* (2023.01)
*H10K 50/11* (2023.01)
(Continued)

(52) U.S. Cl.
CPC ......... *H10K 85/636* (2023.02); *H10K 85/322* (2023.02); *H10K 85/6572* (2023.02);
(Continued)

(58) Field of Classification Search
CPC ............... H10K 85/636; H10K 85/322; H10K 85/6572; H10K 50/11; H10K 50/12;
(Continued)

(56) References Cited

U.S. PATENT DOCUMENTS 7,867,631 B2 * 1/2011 Kim ....................... H05B 33/14 548/440
10,374,166 B2 8/2019 Hatakeyama et al.
(Continued)

FOREIGN PATENT DOCUMENTS

KR 10-2016-0119683 A 10/2016
KR 10-2018-0108604 A 10/2018
(Continued)

OTHER PUBLICATIONS

Yang, M., Park, I. S., & Yasuda, T. (2020). Full-color, narrowband, and high-efficiency electroluminescence from boron and carbazole embedded polycyclic heteroaromatics. Journal of the American Chemical Society, 142(46), 19468-19472. (Year: 2020).*
(Continued)

*Primary Examiner* — Dawn L Garrett
(74) *Attorney, Agent, or Firm* — Womble Bond Dickinson (US) LLP

(57) ABSTRACT

A light emitting device according to an embodiment includes a first electrode and a second electrode facing the first electrode, and a plurality of organic layers between the first electrode and the second electrode, wherein at least one among the plurality of organic layers includes a fused polycyclic compound represented by Formula 1 below, thereby showing improved emission efficiency.
(Continued)

Formula 1

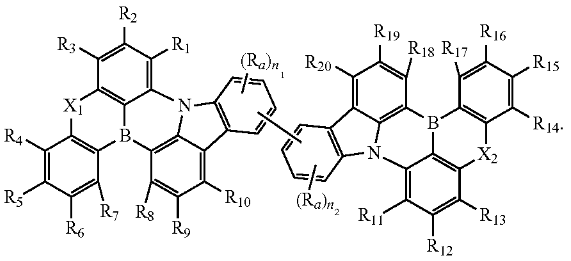

20 Claims, 6 Drawing Sheets

(51) Int. Cl.
*H10K 50/12* (2023.01)
*H10K 85/30* (2023.01)
*H10K 101/10* (2023.01)
*H10K 101/20* (2023.01)

(52) U.S. Cl.
CPC .............. *H10K 50/11* (2023.02); *H10K 50/12* (2023.02); *H10K 2101/10* (2023.02); *H10K 2101/20* (2023.02)

(58) Field of Classification Search
CPC ........... H10K 2101/10; H10K 2101/20; H10K 85/657; H10K 85/631
See application file for complete search history.

(56) References Cited

U.S. PATENT DOCUMENTS

| | | | | |
|---|---|---|---|---|
| 2017/0098686 A1* | 4/2017 | Jeong | ..................... | H10K 50/84 |
| 2019/0058124 A1 | 2/2019 | Hatakeyama et al. | | |
| 2019/0115538 A1 | 4/2019 | Lim et al. | | |
| 2020/0190115 A1 | 6/2020 | Hatakeyama et al. | | |

FOREIGN PATENT DOCUMENTS

| | | |
|---|---|---|
| KR | 10-1955647 B1 | 3/2019 |
| KR | 10-1955648 B1 | 3/2019 |
| KR | 10-2020-0006965 A | 1/2020 |
| KR | 10-2020-0062329 A | 6/2020 |
| KR | 10-2020-0090123 A | 7/2020 |
| KR | 10-2020-0099107 A | 8/2020 |
| WO | WO 2018/212169 A1 | 11/2018 |

OTHER PUBLICATIONS

Huang, J., & Li, Y. (2018). BN embedded polycyclic π-conjugated systems: Synthesis, optoelectronic properties, and photovoltaic applications. Frontiers in chemistry, 6, 341. (Year: 2018).*

Hirai, M., Tanaka, N., Sakai, M., & Yamaguchi, S. (2019). Structurally constrained boron-, nitrogen-, silicon-, and phosphorus-centered polycyclic π-conjugated systems. Chemical reviews, 119(14), 8291-8331. (Year: 2019).*

Escande, A., & Ingleson, M. J. (2015). Fused polycyclic aromatics incorporating boron in the core: fundamentals and applications. Chemical Communications, 51(29), 6257-6274. (Year: 2015).*

Anton Pershin et al., Highly emissive excitons with reduced exchange energy in thermally activated delayed fluorescent molecules, Article, 2019, pp. 1-5, vol. 10, No. 597, Nature Communications.

* cited by examiner

LIGHT EMITTING DEVICE

CROSS-REFERENCE TO RELATED APPLICATION

This application claims priority to and the benefit of Korean Patent Application No. 10-2021-0017667, filed on Feb. 8, 2021, in the Korean Intellectual Property Office, the entire content of which is hereby incorporated by reference.

BACKGROUND

The present disclosure herein relates to a light emitting device, and particularly, to a light emitting device including a novel fused polycyclic compound as a light emitting material.

Recently, the development of an organic electroluminescence display as an image display is being actively conducted. The organic electroluminescence display is different from a liquid crystal display and is a so-called self-luminescent display, in which holes and electrons injected from a first electrode and a second electrode recombine in an emission layer so that a light emitting material including an organic compound in the emission layer emits light to achieve display (e.g., to display an image).

In the application of an organic electroluminescence device to a display, the decrease of a driving voltage, and the increase of emission efficiency and the life (e.g., lifespan) of the organic electroluminescence device are desired (e.g., required), and development on materials for an organic electroluminescence device capable of stably achieving the requirements is being continuously conducted.

Recently, in order to accomplish (e.g., manufacture) an organic electroluminescence device with high efficiency, techniques on phosphorescence emission (which utilizes energy in a triplet state) and/or delayed fluorescence emission (which utilizes the generating phenomenon of singlet excitons by the collision of triplet excitons (triplet-triplet annihilation, TTA)) are being developed, and development on a material for thermally activated delayed fluorescence (TADF) utilizing delayed fluorescence phenomenon is being conducted.

SUMMARY

One or more aspects of embodiments of the present disclosure are directed toward a light emitting device showing improved emission efficiency.

One or more aspects of embodiments of the present disclosure are directed toward a fused polycyclic compound which is capable of improving the emission efficiency of a light emitting device.

According to an embodiment of the present disclosure, a light emitting device includes a first electrode, a second electrode facing the first electrode, and a plurality of organic layers between the first electrode and the second electrode, wherein at least one organic layer among the plurality of organic layers includes a fused polycyclic compound represented by Formula 1.

Formula 1

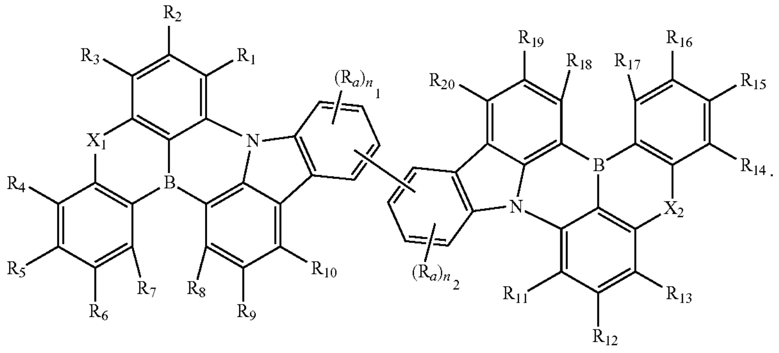

In Formula 1, $X_1$ and $X_2$ are each independently $NR_c$, O, S, or Se; $R_1$ to $R_{20}$, and $R_a$ to $R_c$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms; and "$n_1$" and "$n_2$" are each independently an integer of 1 to 3.

In an embodiment, the organic layers may include a hole transport region on the first electrode, an emission layer on the hole transport region, and an electron transport region on the emission layer, and the emission layer may include the fused polycyclic compound represented by Formula 1.

In an embodiment, the emission layer may emit delayed fluorescence.

In an embodiment, the emission layer may be a delayed fluorescence emission layer including a host and a dopant, and the dopant may include the fused polycyclic compound represented by Formula 1.

In an embodiment, the emission layer may emit light with a central wavelength of about 430 nm to about 490 nm.

In an embodiment, the fused polycyclic compound represented by Formula 1 may be represented by any one among Formula 2-1 to Formula 2-6.

Formula 2-1
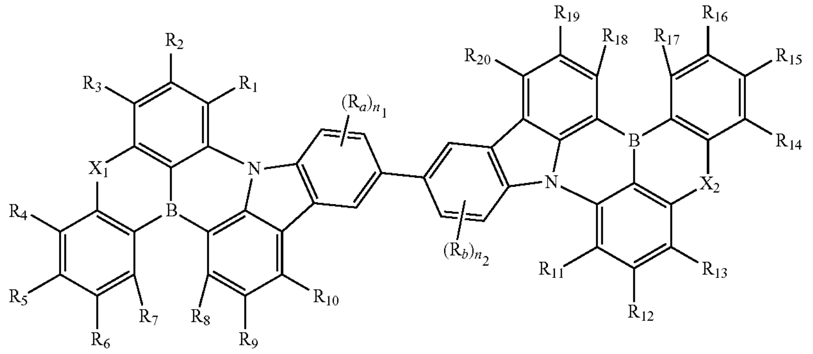
Formula 2-2
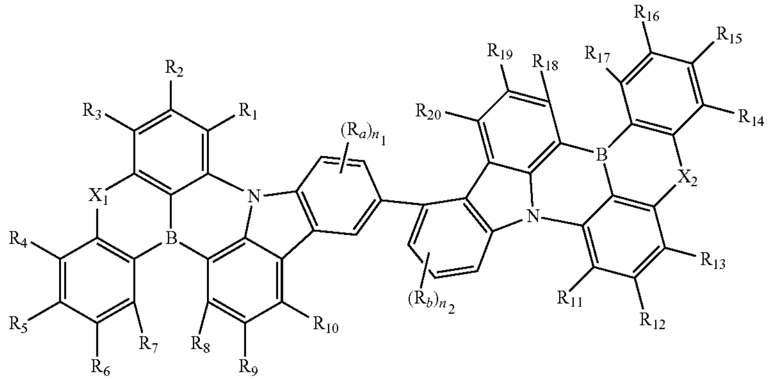
Formula 2-3
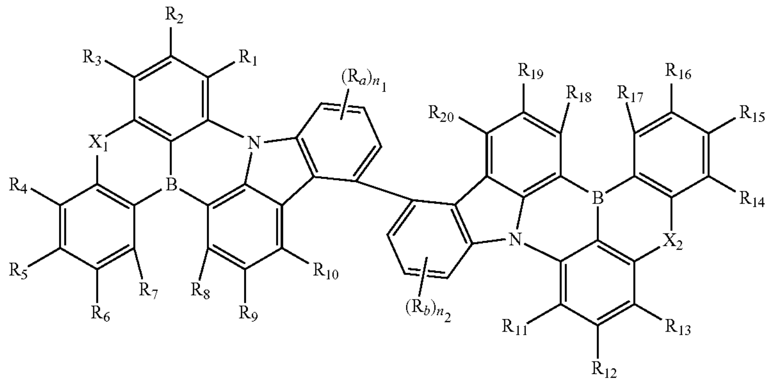
Formula 2-4
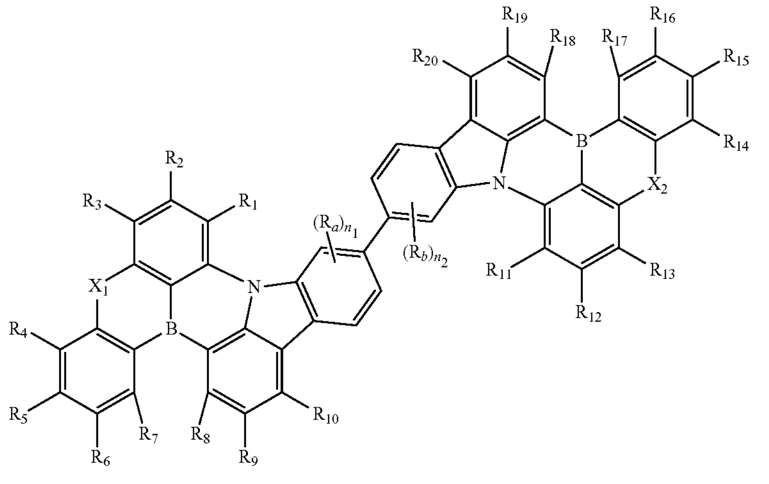

-continued

Formula 2-5

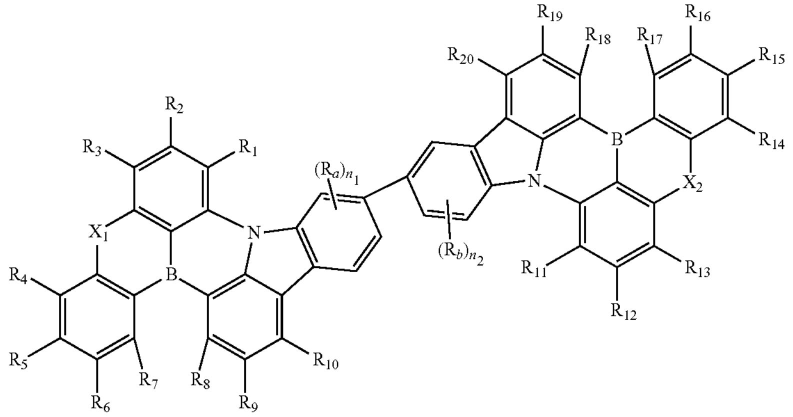

Formula 2-6

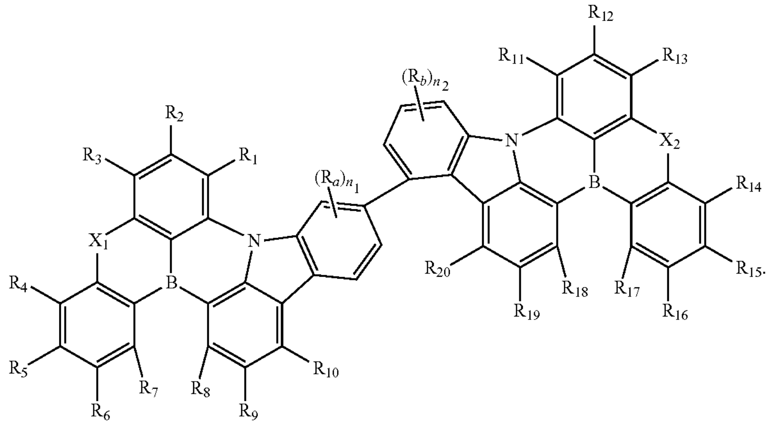

In Formula 2-1 to Formula 2-6, the same explanation on $X_1$, $X_2$, $R_1$ to $R_{20}$, $R_a$ to $R_c$, "$n_1$" and "$n_2$" defined in Formula 1 may be applied.

In an embodiment, the fused polycyclic compound represented by Formula 1 may be represented by Formula 3.

Formula 3

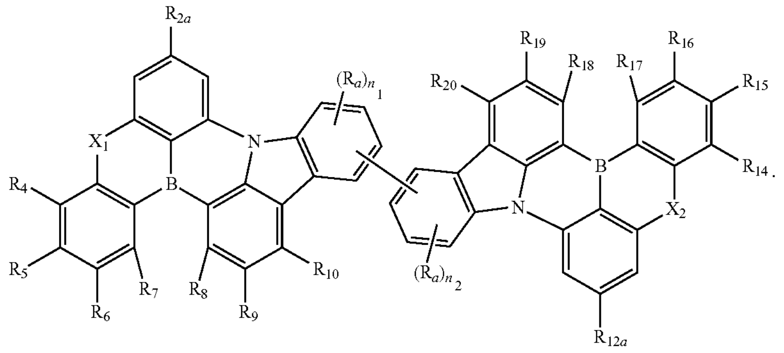

In Formula 3, $R_{2a}$ and $R_{12a}$ are each independently a deuterium atom, a halogen atom, a substituted or unsubstituted amine group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms.

In Formula 3, the same explanation on $X_1$, $X_2$, $R_4$ to $R_{10}$, $R_{14}$ to $R_{20}$, $R_a$ to $R_c$, "$n_1$" and "$n_{2a}$" defined in Formula 1 may be applied.

In an embodiment, the fused polycyclic compound represented by Formula 1 may be represented by any one among Formula 4-1 to Formula 4-3.

Formula 4-1

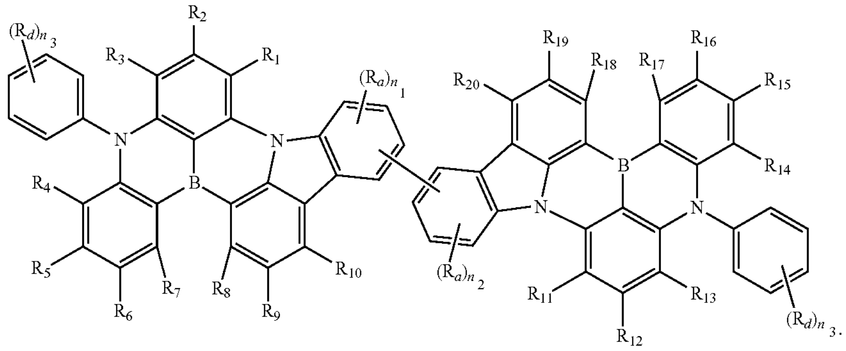

Formula 4-2

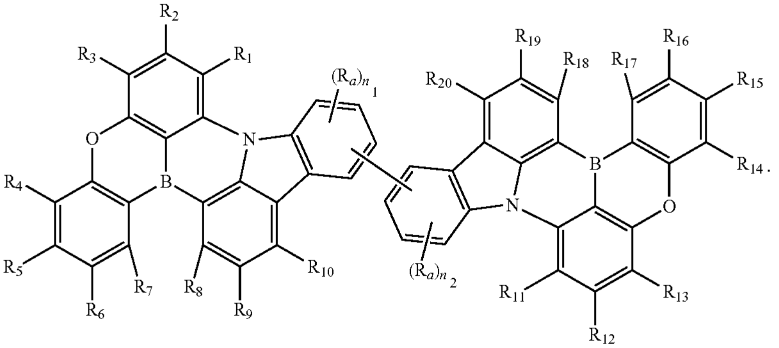

Formula 4-3

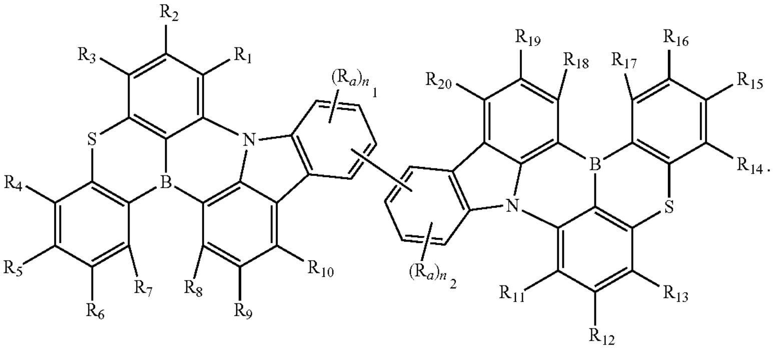

In Formula 4-1 to Formula 4-3, $R_a$ and $R_e$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and "$n_3$" and "$n_4$" are each independently an integer of 1 to 5.

In Formula 4-1 to Formula 4-3, the same explanation on $R_1$ to $R_{20}$, $R_a$, $R_b$, "$n_1$" and "$n_2$" defined in Formula 1 may be applied.

In an embodiment, in Formula 1, $X_1$ and $X_2$ may be the same, $R_1$ and $R_{11}$ may be the same, $R_2$ and $R_{12}$ may be the same, $R_3$ and $R_{13}$ may be the same, $R_4$ and $R_{14}$ may be the same, $R_5$ and $R_{15}$ may be the same, $R_6$ and $R_{16}$ may be the same, $R_7$ and $R_{17}$ may be the same, $R_5$ and $R_{18}$ may be the same, $R_9$ and $R_{19}$ may be the same, $R_{10}$ and $R_{20}$ may be the same, and $R_a$ and $R_b$ may be the same.

In an embodiment, in Formula 1, $R_1$ to $R_{20}$ may be each independently a hydrogen atom, a deuterium atom, a substituted or unsubstituted diphenylamine group, a substituted or unsubstituted t-butyl group, a substituted or unsubstituted phenyl group, or a substituted or unsubstituted carbazole group.

In an embodiment, in Formula 1, $R_a$ and $R_b$ may be each independently a hydrogen atom or a deuterium atom.

In an embodiment, the light emitting device according to an embodiment may further include a capping layer on the second electrode, and the capping layer may have a refractive index of about 1.6 or more.

In an embodiment, the host may include a compound represented by Formula E-2a or Formula E-2b.

Formula E-2a

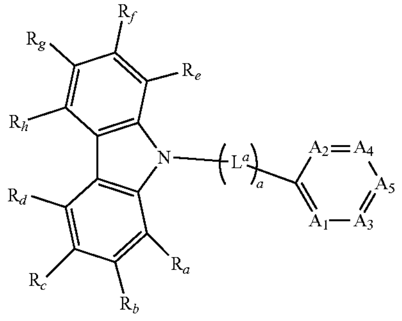

Formula E-2b $(Cbz1)-(L_b)_b-(Cbz2)$.

In Formula E-2a, “a” is an integer of 0 to 10; $L_a$ is a direct linkage, a substituted or unsubstituted arylene group having 6 to 30 ring-forming carbon atoms, or a substituted or unsubstituted heteroarylene group having 2 to 30 ring-forming carbon atoms; $A_1$ to $A_5$ are each independently N or $CR_i$; $R_a$ to $R_i$ are each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms; or combined with an adjacent group to form a ring; and two or three selected among $A_1$ to $A_5$ are N, and a remainder thereof are each independently $CR_i$.

In Formula E-2b, Cbz1 and Cbz2 are each independently an unsubstituted carbazole group, or a carbazole group substituted with an aryl group having 6 to 30 ring-forming carbon atoms; $L_b$ is a direct linkage, a substituted or unsubstituted arylene group having 6 to 30 ring-forming carbon atoms, or a substituted or unsubstituted heteroarylene group having 2 to 30 ring-forming carbon atoms; and “b” is an integer of 0 to 10.

In an embodiment, the hole transport region may include a compound represented by Formula H-a.

Formula H-a

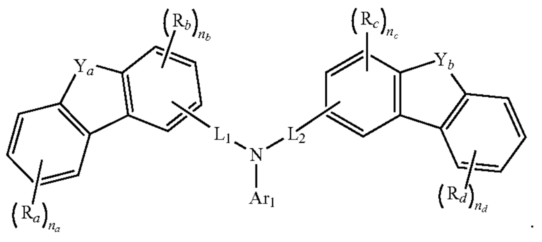

In Formula H-a, $Y_a$ and $Y_b$ are each independently $CR_eR_f$, $NR_g$, O, or S; $Ar_1$ is a substituted or unsubstituted aryl group having 6 to 30 ring-forming carbon atoms, or a substituted or unsubstituted heteroaryl group having 2 to 30 ring-forming carbon atoms; $L_1$ and $L_2$ are each independently a direct linkage, a substituted or unsubstituted arylene group having 6 to 30 ring-forming carbon atoms, or a substituted or unsubstituted heteroarylene group having 2 to 30 ring-forming carbon atoms; $R_a$ to $R_g$ are each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms; or combined with an adjacent group to form a ring; “$n_a$” and “$n_a$” are each independently an integer of 0 to 4, and “$n_b$” and “$n_c$” are each independently an integer of 0 to 3.

A fused polycyclic compound according to an embodiment of the present disclosure may be represented by Formula 1.

BRIEF DESCRIPTION OF THE DRAWINGS

The accompanying drawings are included to provide a further understanding of the present disclosure and are incorporated in and constitute a part of this specification. The drawings illustrate embodiments of the present disclosure and, together with the description, serve to explain principles of the present disclosure. In the drawings.

DETAILED DESCRIPTION

Figure 1:
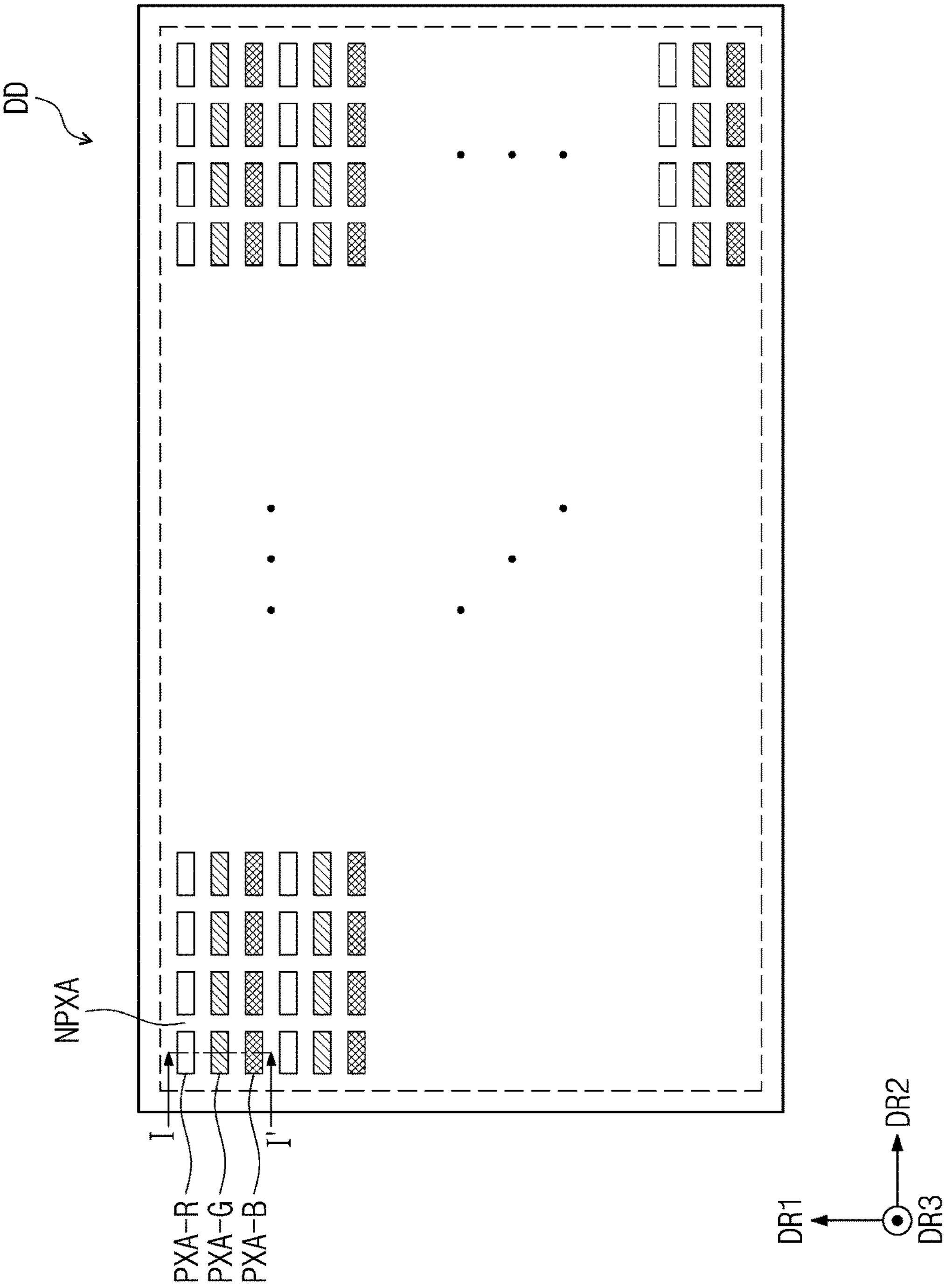
FIG. 1 is a plan view of a display apparatus according to an embodiment of the present disclosure.

The present disclosure may have various suitable modifications and may be embodied in different forms, and example embodiments will be explained in more detail with reference to the accompany drawings. The present disclosure may, however, be embodied in different forms and should not be construed as being limited to the embodiments set forth herein. Rather, all modifications, equivalents, and substituents which are included in the spirit and technical scope of the present disclosure should be included in the present disclosure.

Like reference numerals refer to like elements throughout. In the drawings, the dimensions of structures may be exaggerated for clarity of illustration. It will be understood that, although the terms first, second, etc. may be used herein to describe various suitable elements, these elements should not be limited by these terms. These terms are only used to distinguish one element from another element. Thus, a first element could be alternatively termed a second element without departing from the teachings of the present invention. Similarly, a second element could be alternatively termed a first element. As used herein, the singular forms are intended to include the plural forms as well, unless the context clearly indicates otherwise.

In the description, it will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

In the description, when a layer, a film, a region, a plate, etc. is referred to as being "on" or "above" another part, it can be "directly on" the other part, or intervening layers may also be present. On the contrary, when a layer, a film, a region, a plate, etc. is referred to as being "under" or "below" another part, it can be "directly under" the other part, or intervening layers may also be present. Also, when an element is referred to as being "on" another element, it can be under the other element.

In the description, the term "substituted or unsubstituted" corresponds to an unsubstituted group or a group substituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine group, a phosphine oxide group, a phosphine sulfide group, an alkyl group, an alkenyl group, an alkynyl group, an alkoxy group, a hydrocarbon ring group, an aryl group, and a heterocyclic group. In addition, each of the example substituents may be substituted or unsubstituted. For example, a biphenyl group may be interpreted as an aryl group or a phenyl group substituted with a phenyl group.

In the description, the term "forming a ring via the combination with an adjacent group" may refer to forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocycles or polycycles. In addition, the ring formed via the combination with an adjacent group may be combined with another ring to form a spiro structure.

In the description, the term "adjacent group" may refer to a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other. In addition, in 1,13-dimethylquinolino [3,2,1-de]acridine-5,9-dione, two methyl groups connected with carbon at position 1 and carbon at position 13, respectively, may be interpreted as "adjacent groups" to each other.

In the description, the halogen atom may be a fluorine atom, a chlorine atom, a bromine atom, or an iodine atom.

In the description, the alkyl group may be a linear, branched, or cyclic alkyl group. The carbon number of the alkyl group may be 1 to 50, 1 to 30, 1 to 20, 1 to 10, or 1 to 6. Non-limiting examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc.

In the description, the term "hydrocarbon ring group" refers to an optional functional group or substituent derived from an aliphatic hydrocarbon ring. The hydrocarbon ring group may be a saturated hydrocarbon ring group having 5 to 30 or 5 to 20 ring-forming carbon atoms.

In the description, the term "aryl group" refers to an optional functional group or substituent derived from an aromatic hydrocarbon ring. The aryl group may be a monocyclic aryl group or a polycyclic aryl group. The carbon number for forming ring(s) in the aryl group may be 6 to 60, 6 to 30, 6 to 20, or 6 to 15. Non-limiting examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc.

In the description, the fluorenyl group may be substituted, and two substituents may be combined with each other to form a spiro structure. Non-limiting examples of a substituted fluorenyl group are as follows, but the present disclosure is not limited thereto.

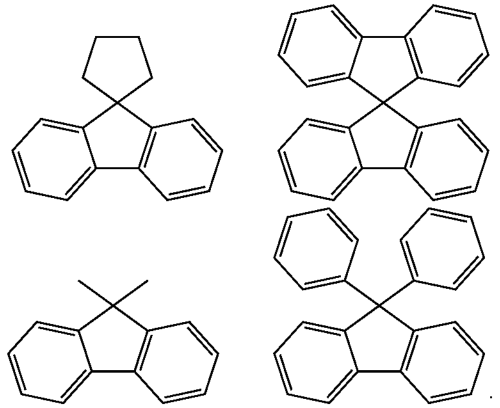

In the description, the term "heterocyclic group" refers to an optional functional group or substituent derived from a ring including one or more among B, O, N, P, Si, S and Se as heteroatoms. The heterocyclic group includes an aliphatic heterocyclic group and an aromatic heterocyclic group. The aromatic heterocyclic group may be a heteroaryl group. The aliphatic heterocyclic group and the aromatic heterocyclic group may be a monocycle or a polycycle.

In the description, the heterocyclic group may include one or more among B, O, N, P, Si, S and Se as heteroatoms. When the heterocyclic group includes two or more heteroatoms, two or more heteroatoms may be the same or different.

The heterocyclic group may be a monocyclic heterocyclic group or a polycyclic heterocyclic group, and has the concept including a heteroaryl group. The carbon number for forming ring(s) of the heteroaryl group may be 2 to 60, 2 to 30, 2 to 20, and 2 to 10. In the description, the aliphatic heterocyclic group may include one or more among B, O, N, P, Si, S and Se as heteroatoms. The number of ring-forming carbon atoms of the aliphatic heterocyclic group may be 2 to 60, 2 to 30, 2 to 20, or 2 to 10. Non-limiting examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc.

In the description, the heteroaryl group may include one or more among B, O, N, P, Si, S and Se as heteroatoms. When the heteroaryl group includes two or more heteroatoms, two or more heteroatoms may be the same or different. The heteroaryl group may be a monocyclic heterocyclic group or polycyclic heterocyclic group. The carbon number for forming rings of the heteroaryl group may be 2 to 60, 2 to 30, 2 to 20, or 2 to 10. Non-limiting examples of the heteroaryl group may include thiophene, furan, pyrrole, imidazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofurane, phenanthroline, thiazole, isooxazole, oxazole, oxadiazole, thiadiazole, phenothiazine, dibenzosilole, dibenzofuran, etc.

In the description, the explanation on the aryl group may be applied to the arylene group except that the arylene group is a divalent group. The explanation on the heteroaryl group may be applied to the heteroarylene group except that the heteroarylene group is a divalent group.

In the description, the alkenyl group may be a linear chain or a branched chain. The carbon number is not specifically limited but may be 2 to 30, 2 to 20, or 2 to 10. Non-limiting examples of the alkenyl group may include a vinyl group, a 1-butenyl group, a 1-pentenyl group, a 1,3-butadienyl aryl group, a styrenyl group, a styrylvinyl group, etc.

In the description, the carbon number of the alkynyl group is not specifically limited, but may be 2 to 30, 2 to 20, or 2 to 10. Non-limiting examples of the alkynyl group may include a vinyl group, a 2-butynyl group, a 2-pentynyl group, and a 1,3-pentadienyl aryl group.

In the description, the explanation on the alkyl group, the alkenyl group, the alkynyl group, the aryl group, and the heteroaryl group may be applied to an alkyl connecting group, an alkenyl connecting group, an alkynyl connecting group, an aryl connecting group, and a heteroaryl connecting group, respectively, except that these are divalent, trivalent, or tetravalent groups.

In the description, the silyl group includes an alkyl silyl group and an aryl silyl group. Non-limiting examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc.

In the description, the carbon number of a carbonyl group is not specifically limited, but the carbon number may be 1 to 40, 1 to 30, or 1 to 20. For example, the carbonyl group may have the structures below, but the present disclosure is not limited thereto.

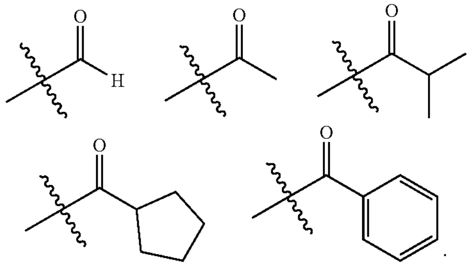

In the description, the carbon number of the sulfinyl group and the sulfonyl group is not specifically limited, but may be 1 to 30. The sulfinyl group may include an alkyl sulfinyl group and an aryl sulfinyl group. The sulfonyl group may include an alkyl sulfonyl group and an aryl sulfonyl group.

In the description, the thiol group may include an alkyl thio group and an aryl thio group. The thiol group may refer to the above-defined alkyl group or aryl group combined with a sulfur atom. Non-limiting examples of the thiol group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc.

In the description, the oxy group may refer to the above-defined alkyl group or aryl group which is combined with an oxygen atom. The oxy group may include an alkoxy group and an aryl oxy group. The alkoxy group may be a linear, branched, or cyclic chain. The carbon number of the alkoxy group is not specifically limited but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc. However, an embodiment of the present disclosure is not limited thereto.

In the description, the boron group may refer to the above-defined alkyl group or aryl group which is combined with a boron atom. The boron group includes an alkyl boron group and an aryl boron group. Non-limiting examples of the boron group may include a trimethylboron group, a triethylboron group, a t-butyldimethylboron group, a triphenylboron group, a diphenylboron group, a phenylboron group, etc.

In the description, the carbon number of the amine group is not specifically limited, but may be 1 to 30. The amine group may include an alkyl amine group and an aryl amine group. Non-limiting examples of the amine group may include a methylamine group, a dimethylamine group, a phenylamine group, a diphenylamine group, a naphthylamine group, a 9-methyl-anthracenylamine group, a triphenylamine group, etc.

In the description, an alkyl group in the alkylthio group, the alkylsulfoxy group, the alkylaryl group, the alkylamino group, the alkylboron group, the alkyl silyl group, and the alkyl amine group may be the same as the examples of the above-described alkyl group.

In the description, the aryl group in the aryloxy group, the arylthio group, the arylsulfoxy group, the aryl amino group, the arylboron group, and the aryl silyl group may be the same as the examples of the above-described aryl group.

In the description, a direct linkage may refer to a single bond.

Meanwhile, in the description,

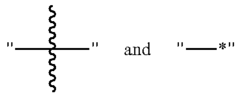

and each refer to positions to be connected.

Hereinafter, embodiments of the present disclosure will be explained referring to the drawings.

Figure 2:
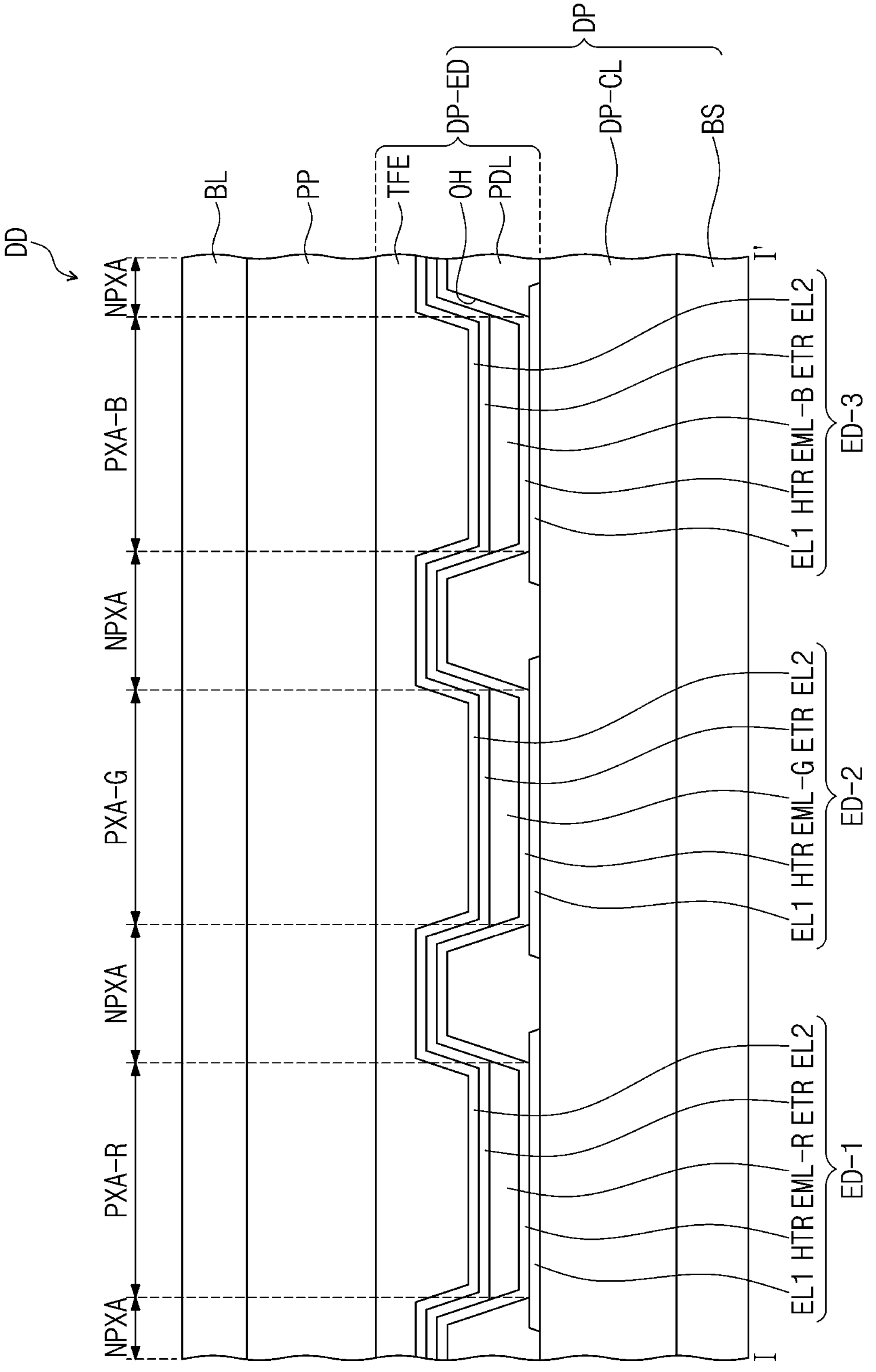
FIG. 2 is a cross-sectional view of a display apparatus according to an embodiment of the present disclosure.

FIG. 1 is a plan view showing an embodiment of a display apparatus DD. FIG. 2 is a cross-sectional view of a display apparatus DD of an embodiment. FIG. 2 is a cross-sectional view showing a part corresponding to line I-I'.

The display apparatus DD may include a display panel DP and an optical layer PP on the display panel DP. The display panel DP includes light emitting devices ED-1, ED-2, and ED-3. The display apparatus DD may include multiple light emitting devices ED-1, ED-2, and ED-3. The optical layer PP may be on the display panel DP and control reflection of external light by the display panel DP. The optical layer PP may include, for example, a polarization layer or a color filter layer. In some embodiments, different from the drawings, the optical layer PP may be omitted (e.g., may not be included) in the display apparatus DD of an embodiment.

On the optical layer PP, an upper base layer BL may be disposed. The upper base layer BL may be a member providing a base surface where the optical layer PP is disposed. The upper base layer BL may be a glass substrate, a metal substrate, a plastic substrate, etc. However, an embodiment of the present disclosure is not limited thereto, and the upper base layer BL may be an inorganic layer, an organic layer, or a composite material layer. In some embodiments, different from the drawings, the upper base layer BL may be omitted.

The display apparatus DD according to an embodiment may further include a plugging layer. The plugging layer may be between a display device layer DP-ED and the upper base layer BL. The plugging layer may be an organic layer. The plugging layer may include at least one selected from among an acrylic resin, a silicon-based resin, and an epoxy-based resin.

The display panel DP may include a base layer BS, a circuit layer DP-CL provided on the base layer BS and a display device layer DP-ED. The display device layer DP-ED may include a pixel definition layer PDL, light emitting devices ED-1, ED-2 and ED-3 in the pixel definition layer PDL, and an encapsulating layer TFE on the light emitting devices ED-1, ED-2, and ED-3.

The base layer BS may be a member providing a base surface where the display device layer DP-ED is disposed. The base layer BS may be a glass substrate, a metal substrate, a plastic substrate, etc. However, an embodiment of the present disclosure is not limited thereto, and the base layer BS may be an inorganic layer, an organic layer, or a composite material layer.

In an embodiment, the circuit layer DP-CL is on the base layer BS, and the circuit layer DP-CL may include multiple transistors. Each of the transistors may include a control electrode, an input electrode, and an output electrode. For example, the circuit layer DP-CL may include switching transistors and driving transistors for driving the light emitting devices ED-1, ED-2, and ED-3 of the display device layer DP-ED.

Each of the light emitting devices ED-1, ED-2 and ED-3 may have the structures of light emitting devices ED of embodiments according to FIG. 3 to FIG. 6, which will be explained in more detail later. Each of the light emitting devices ED-1, ED-2 and ED-3 may include a first electrode EL1, a hole transport region HTR, emission layers EML-R, EML-G and EML-B, an electron transport region ETR, and a second electrode EL2.

FIG. 2 shows an embodiment where the emission layers EML-R, EML-G and EML-B of light emitting devices ED-1, ED-2, and ED-3 are provided in opening portions OH defined in a pixel definition layer PDL, and a hole transport region HTR, an electron transport region ETR and a second electrode EL2 are provided as common layers in all light emitting devices ED-1, ED-2, and ED-3. However, an embodiment of the present disclosure is not limited thereto. Different from FIG. 2, in an embodiment, the hole transport region HTR and the electron transport region ETR may be patterned and provided in the opening portions OH defined in the pixel definition layer PDL. For example, in an embodiment, the hole transport region HTR, the emission layers EML-R, EML-G and EML-B, and the electron transport region ETR of the light emitting devices ED-1, ED-2 and ED-3 may all be patterned and provided by an ink jet printing method.

An encapsulating layer TFE may cover the light emitting devices ED-1, ED-2, and ED-3. The encapsulating layer TFE may encapsulate the display device layer DP-ED. The encapsulating layer TFE may be a thin film encapsulating layer. The encapsulating layer TFE may be one layer or a stacked layer of multiple layers. The encapsulating layer TFE includes at least one insulating layer. The encapsulating layer TFE according to an embodiment may include at least one inorganic layer (hereinafter, encapsulating inorganic layer). In some embodiments, the encapsulating layer TFE according to an embodiment may include at least one organic layer (hereinafter, encapsulating organic layer) and at least one encapsulating inorganic layer.

The encapsulating inorganic layer protects the display device layer DP-ED from moisture/oxygen, and the encapsulating organic layer protects the display device layer DP-ED from foreign materials such as dust particles. The encapsulating inorganic layer may include silicon nitride, silicon oxy nitride, silicon oxide, titanium oxide, and/or aluminum oxide, without specific limitation. The encapsulating organic layer may include an acrylic compound, an epoxy-based compound, etc. The encapsulating organic layer may include a photopolymerizable organic material, without specific limitation.

The encapsulating layer TFE may be on the second electrode EL2 and may be while filling the opening portion OH.

Referring to FIG. 1 and FIG. 2, the display apparatus DD may include a non-luminous area NPXA and luminous areas PXA-R, PXA-G and PXA-B. The luminous areas PXA-R, PXA-G and PXA-B may be areas emitting light produced from the light emitting devices ED-1, ED-2, and ED-3, respectively. The luminous areas PXA-R, PXA-G and PXA-B may be separated from each other on a plane.

The luminous areas PXA-R, PXA-G and PXA-B may be areas separated by the pixel definition layer PDL. The non-luminous areas NPXA may be areas between neighboring luminous areas PXA-R, PXA-G and PXA-B and may be areas corresponding to the pixel definition layer PDL. In some embodiments, each of the luminous areas PXA-R, PXA-G and PXA-B may correspond to a pixel. The pixel definition layer PDL may divide the light emitting devices ED-1, ED-2, and ED-3. The emission layers EML-R, EML-G and EML-B of the light emitting devices ED-1, ED-2 and ED-3 may be and divided in the opening portions OH defined in the pixel definition layer PDL.

The luminous areas PXA-R, PXA-G and PXA-B may be divided into multiple groups according to the color of light produced from the light emitting devices ED-1, ED-2, and ED-3. In the display apparatus DD of an embodiment, shown in FIG. 1 and FIG. 2, three luminous areas PXA-R, PXA-G and PXA-B to respectively emit red light, green light and blue light are illustrated as an embodiment. For example, the display apparatus DD of an embodiment may include a red luminous area PXA-R, a green luminous area PXA-G and a blue luminous area PXA-B, which are separated from each other.

In the display apparatus DD according to an embodiment, multiple light emitting devices ED-1, ED-2 and ED-3 may be to emit light having different wavelength regions. For example, in an embodiment, the display apparatus DD may include a first light emitting device ED-1 to emit red light, a second light emitting device ED-2 to emit green light, and a third light emitting device ED-3 to emit blue light. That is, each of the red luminous area PXA-R, the green luminous area PXA-G, and the blue luminous area PXA-B of the display apparatus DD may respectively correspond to the first light emitting device ED-1, the second light emitting device ED-2, and the third light emitting device ED-3.

However, an embodiment of the present disclosure is not limited thereto, and the first to third light emitting devices ED-1, ED-2 and ED-3 may be to emit light in the same wavelength region, or at least one thereof may be to emit light in a different wavelength region. For example, all the first to third light emitting devices ED-1, ED-2 and ED-3 may be to emit blue light.

The luminous areas PXA-R, PXA-G and PXA-B in the display apparatus DD according to an embodiment may be arranged in a stripe shape. Referring to FIG. 1, multiple red luminous areas PXA-R may be arranged with each other along a second direction axis DR2, multiple green luminous areas PXA-G may be arranged with each other along the second direction axis DR2, and multiple blue luminous areas PXA-B may be arranged with each other along the second direction axis DR2. In some embodiments, the red luminous area PXA-R, the green luminous area PXA-G, and the blue luminous area PXA-B may be arranged by turns along a first direction axis DR1.

In FIG. 1 and FIG. 2, the areas of the luminous areas PXA-R, PXA-G and PXA-B are shown as being similar, but the present disclosure is not limited thereto. The areas of the luminous areas PXA-R, PXA-G and PXA-B may be different from each other according to the wavelength region of light emitted. The areas of the luminous areas PXA-R, PXA-G and PXA-B may refer to areas in a plan view (e.g., on a plane defined by the first direction axis DR1 and the second direction axis DR2).

In some embodiments, the arrangement pattern of the luminous areas PXA-R, PXA-G and PXA-B is not limited to the configuration shown in FIG. 1, and the arrangement order of the red luminous areas PXA-R, the green luminous areas PXA-G and the blue luminous areas PXA-B may be provided in various suitable combinations according to the properties of display quality required for the display apparatus DD. For example, the arrangement pattern of the luminous areas PXA-R, PXA-G and PXA-B may be a PENTILE® arrangement pattern, or a diamond arrangement pattern. PENTILE® is a duly registered trademark of Samsung Display Co., Ltd.

In some embodiments, the areas of the luminous areas PXA-R, PXA-G and PXA-B may be different from each other. For example, in an embodiment, the area of the green luminous area PXA-G may be smaller than the area of the blue luminous area PXA-B, but the present disclosure is not limited thereto.

Hereinafter, FIG. 3 to FIG. 6 are cross-sectional views schematically showing light emitting devices according to embodiments. The light emitting device ED according to an embodiment may include a first electrode EL1, a hole transport region HTR, an emission layer EML, an electron transport region ETR, and a second electrode EL2 stacked in order.

Figure 3:
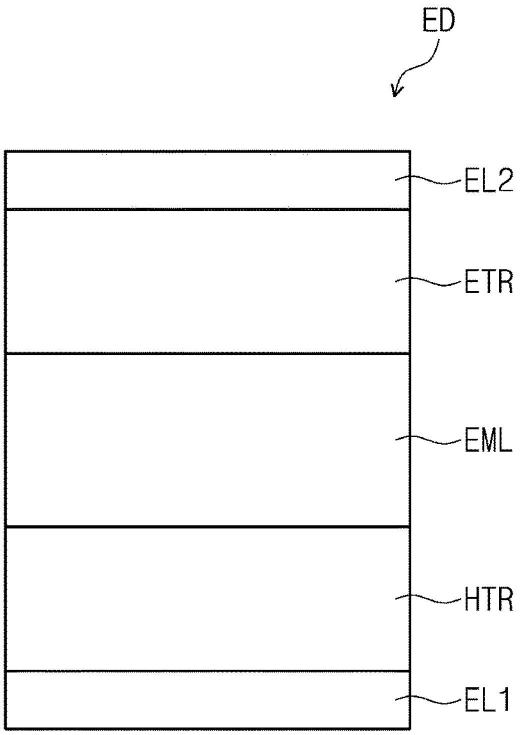
FIG. 3 is a cross-sectional view schematically showing a light emitting device according to an embodiment of the present disclosure.
Figure 4:
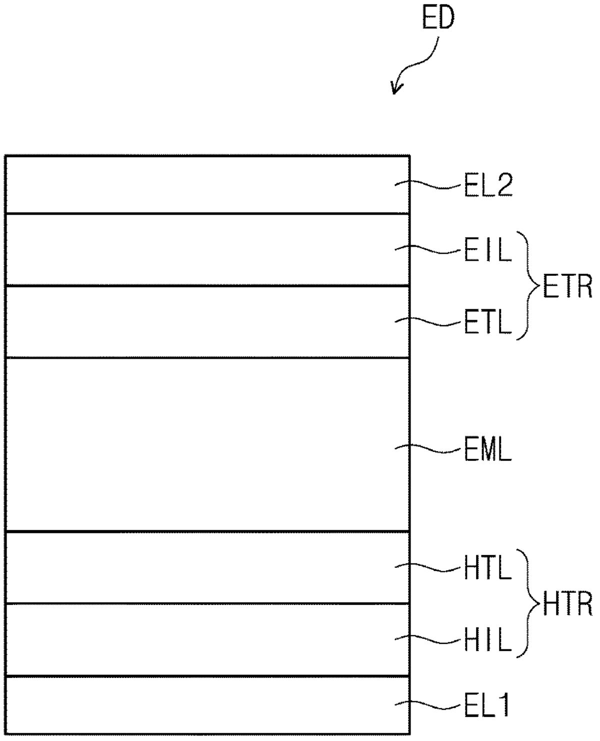
FIG. 4 is a cross-sectional view schematically showing a light emitting device according to an embodiment of the present disclosure.
Figure 5:
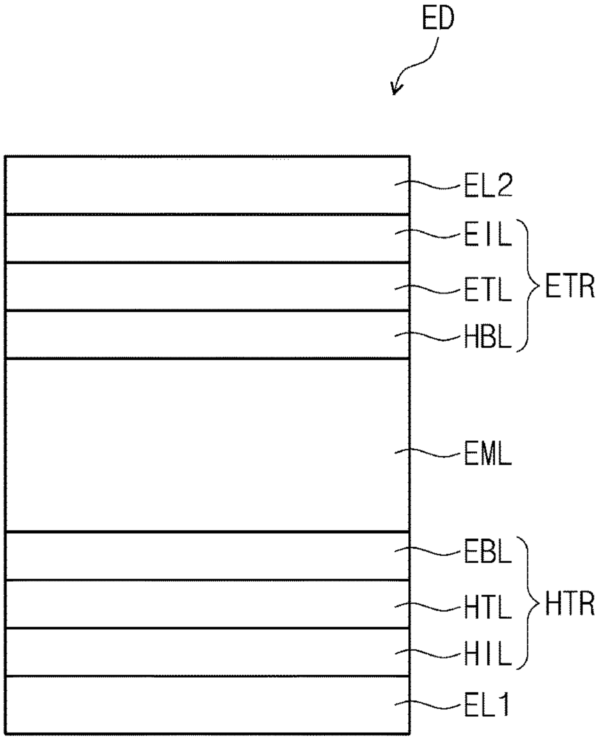
FIG. 5 is a cross-sectional view schematically showing a light emitting device according to an embodiment of the present disclosure.
Figure 6:
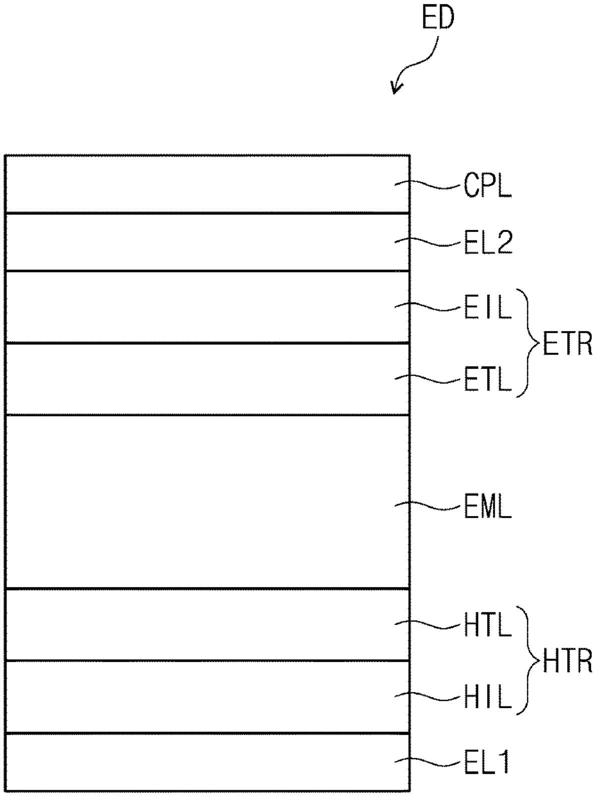
FIG. 6 is a cross-sectional view schematically showing a light emitting device according to an embodiment of the present disclosure.

Compared with FIG. 3, FIG. 4 shows the cross-sectional view of a light emitting device ED of an embodiment, wherein a hole transport region HTR includes a hole injection layer HIL and a hole transport layer HTL, and an electron transport region ETR includes an electron injection layer EIL and an electron transport layer ETL. Compared with FIG. 3, FIG. 5 shows the cross-sectional view of a light emitting device ED of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared with FIG. 4, FIG. 6 shows the cross-sectional view of a light emitting device ED of an embodiment, including a capping layer CPL on the second electrode EL2.

The first electrode EL1 has conductivity. The first electrode EL1 may be formed utilizing a metal material, a metal alloy, or a conductive compound. The first electrode EL1 may be an anode or a cathode. However, an embodiment of the present disclosure is not limited thereto. In some embodiments, the first electrode EL1 may be a pixel electrode. The first electrode EL1 may be a transmissive electrode, a transflective electrode, or a reflective electrode. When the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, In, Zn, Sn, one or more compounds thereof, or one or more mixtures thereof (for example, a mixture of Ag and Mg). In some embodiments, the first electrode EL1 may have a structure including multiple layers including a reflective layer or a transflective layer formed utilizing the above materials, and a transmissive conductive layer formed utilizing ITO, IZO, ZnO, and/or ITZO. For example, the first electrode EL1 may include a three-layer structure of ITO/Ag/ITO. However, an embodiment of the present disclosure is not limited thereto. The first electrode EL1 may include the above-described metal materials, combinations of two or more metal materials selected from the above-described metal materials, or oxides of the above-described metal materials. The thickness of the first electrode EL1 may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may include at least one of a hole injection layer HIL, a hole transport layer HTL, a buffer layer, an emission auxiliary layer or an electron blocking layer EBL. The thickness of the hole transport region HTR may be from about 50 Å to about 15,000 Å.

The hole transport region HTR may have a single layer formed utilizing a single material, a single layer formed utilizing multiple different materials, or a multilayer structure including multiple layers formed utilizing multiple different materials.

For example, the hole transport region HTR may have the structure of a single layer of a hole injection layer HIL or a hole transport layer HTL, and may have a structure of a single layer formed utilizing a hole injection material and a hole transport material. In some embodiments, the hole transport region HTR may have a structure of a single layer formed utilizing multiple different materials, or a structure stacked from the first electrode EL1 of hole injection layer HIL/hole transport layer HTL, hole injection layer HIL/hole transport layer HTL/buffer layer, hole injection layer HIL/buffer layer, hole transport layer HTL/buffer layer, or hole injection layer HIL/hole transport layer HTL/electron blocking layer EBL, without limitation.

The hole transport region HTR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include a compound represented by Formula H-1 below.

Formula H-1

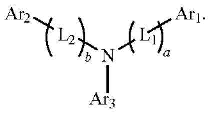

In Formula H-1 above, $L_1$ and $L_2$ may be each independently a direct linkage, a substituted or unsubstituted arylene group having 6 to 30 ring-forming carbon atoms, or a substituted or unsubstituted heteroarylene group having 2 to 30 ring-forming carbon atoms. "a" and "b" may be each independently an integer of 0 to 10. In some embodiments, when "a" or "b" is an integer having 2 or more, multiple $L_1$ and $L_2$ may be each independently a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. In Formula H-1, $Ar_3$ may be a substituted or unsubstituted aryl group having 6 to 30 ring-forming carbon atoms.

The compound represented by Formula H-1 may be a monoamine compound. In some embodiments, the compound represented by Formula H-1 may be a diamine compound in which at least one among $Ar_1$ to $Ar_3$ includes an amine group as a substituent. In some embodiments, the compound represented by Formula H-1 may be a carbazole-based compound in which at least one among $Ar_1$ to $Ar_3$ includes a substituted or unsubstituted carbazole group, or a fluorene-based compound in which at least one among $Ar_1$ to $Ar_3$ includes a substituted or unsubstituted fluorene group.

The compound represented by Formula H-1 may be represented by any one among the compounds in Compound Group H below. However, the compounds shown in Compound Group H are only illustrations, and the compound represented by Formula H-1 is not limited to the compounds represented in Compound Group H below.

Compound Group H

H-1-1

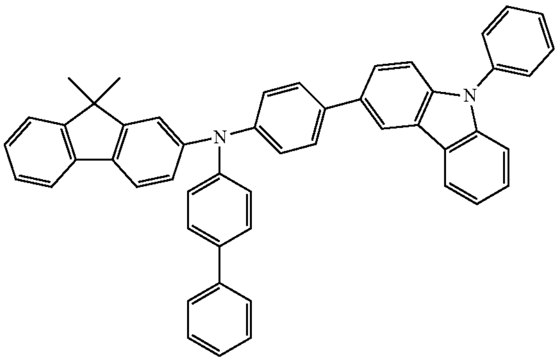

H-1-2

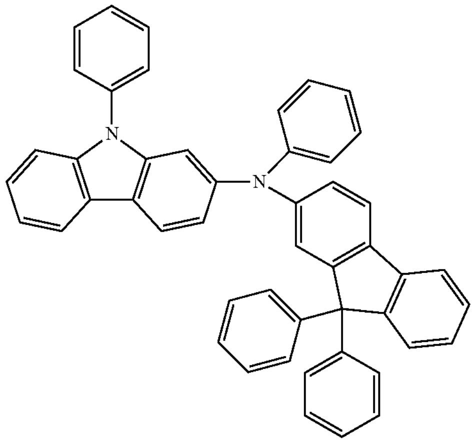

H-1-3

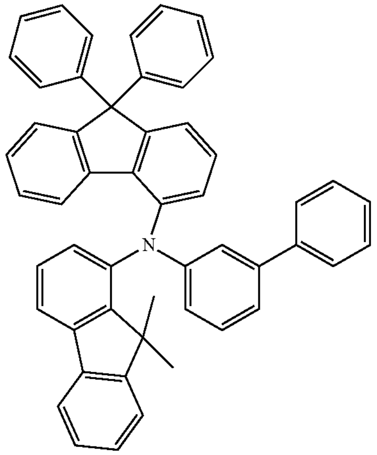

-continued
H-1-4
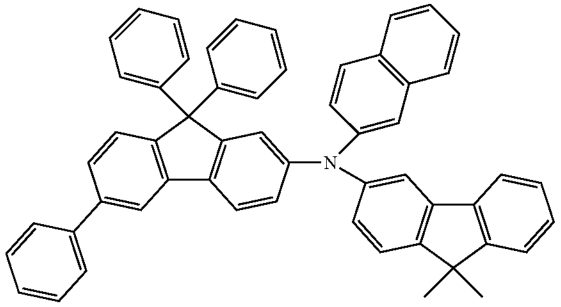
H-1-5
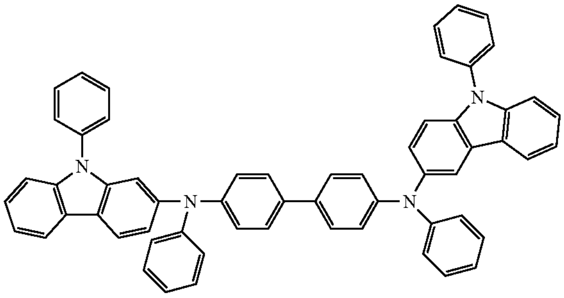
H-1-6
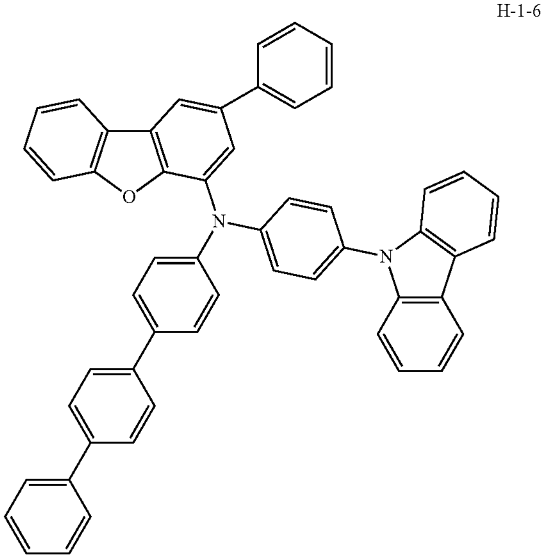
-continued
H-1-7
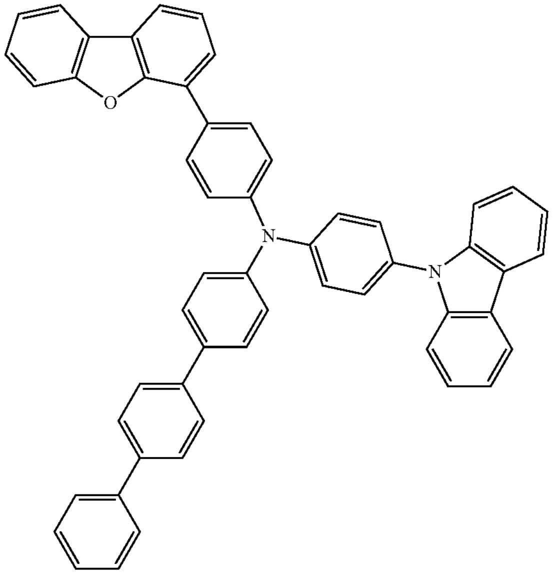
H-1-8
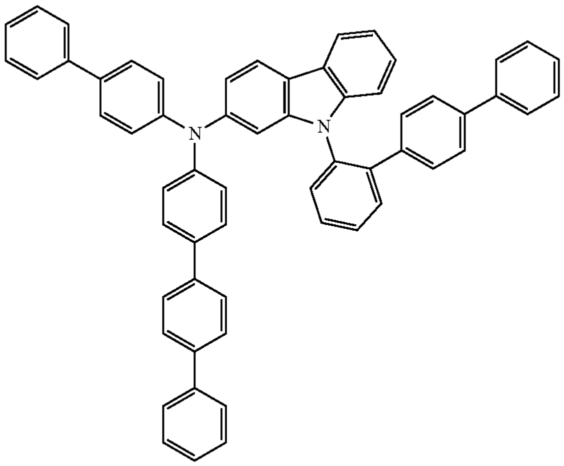
H-1-9
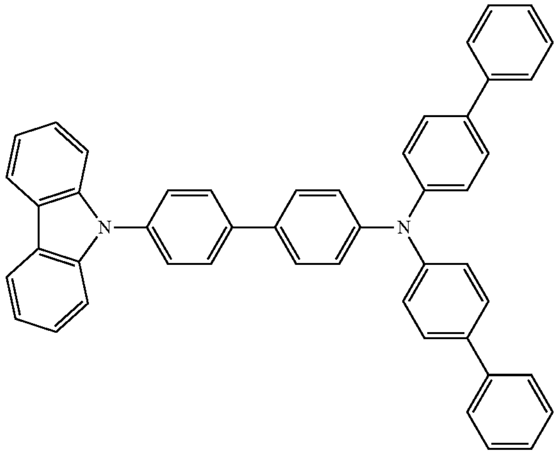

-continued
H-1-10
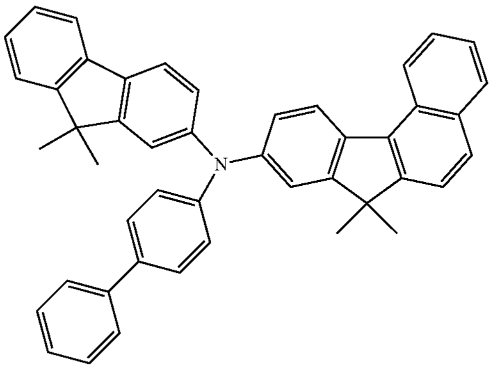
H-1-11
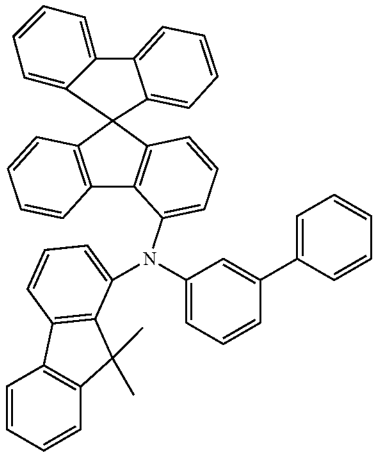
H-1-12
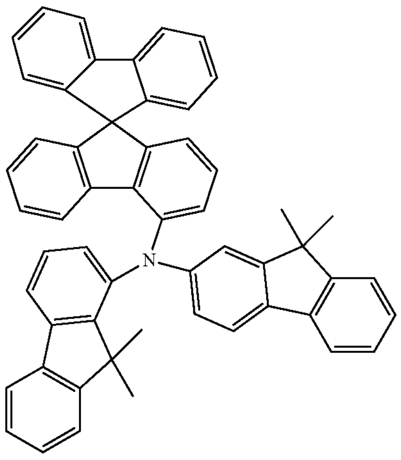
H-1-13
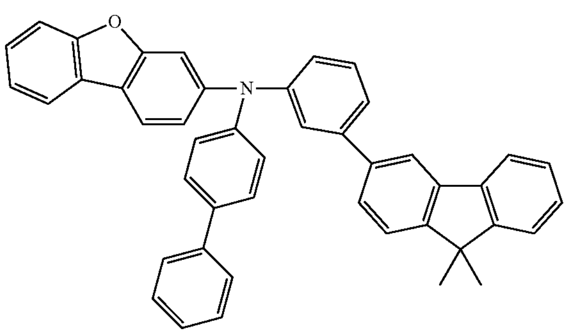
-continued
H-1-14
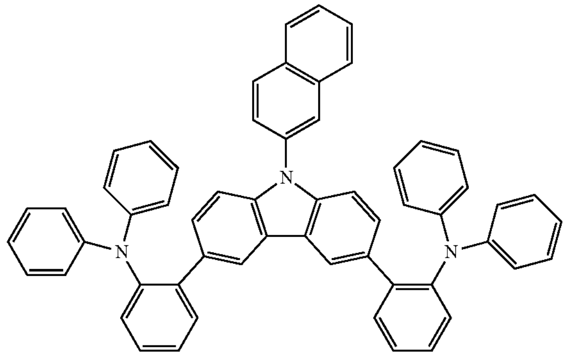
H-1-15
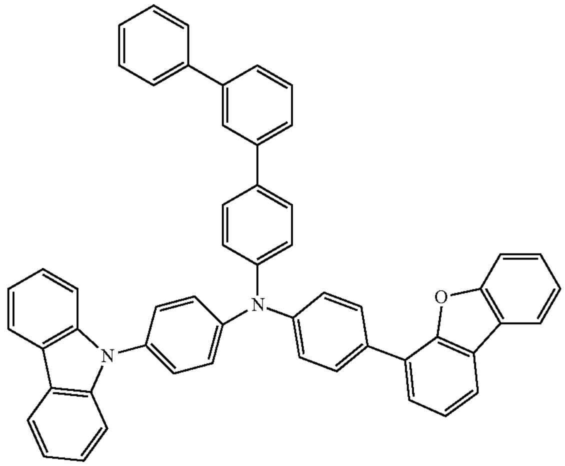
H-1-16
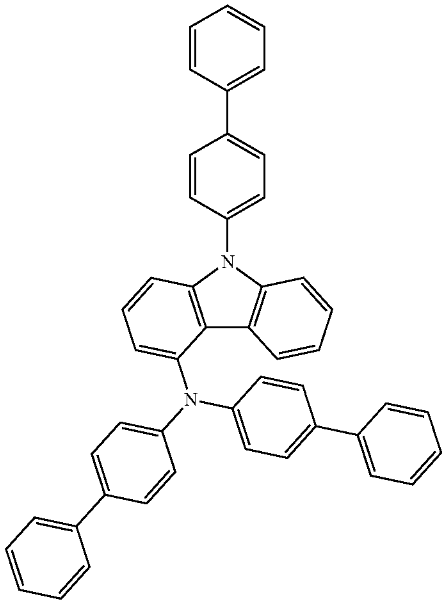

-continued

H-1-17

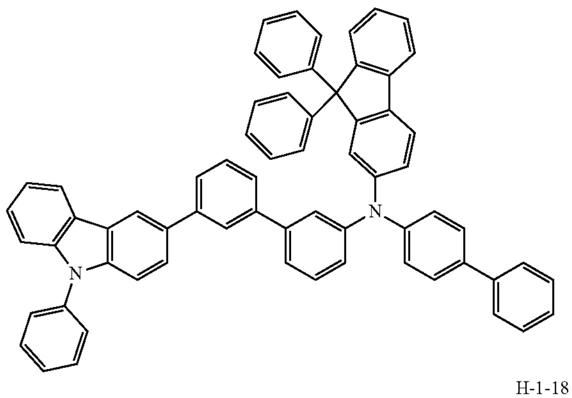

H-1-18

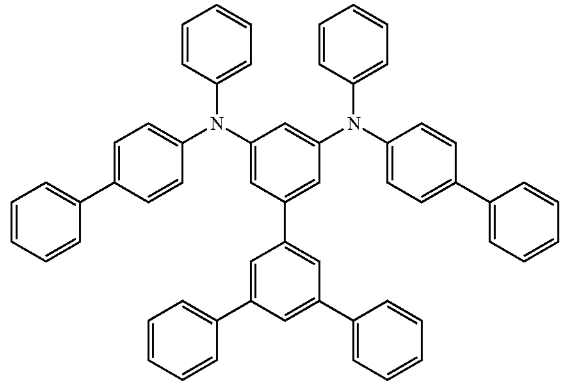

H-1-19

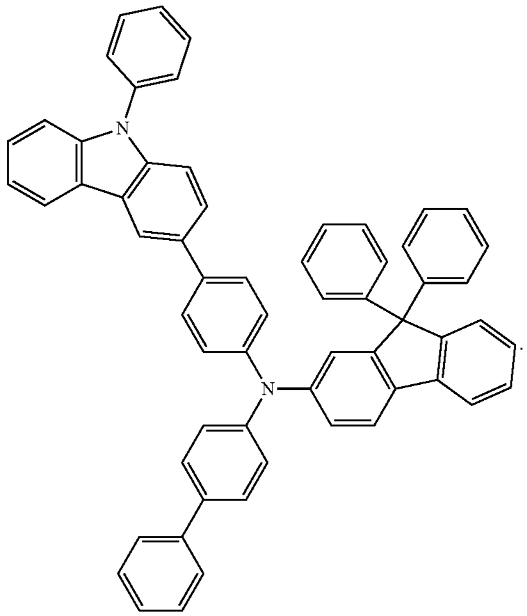

The hole transport region HTR may include a compound represented by Formula H-a below. The compound represented by Formula H-a may be a monoamine compound.

Formula H-a

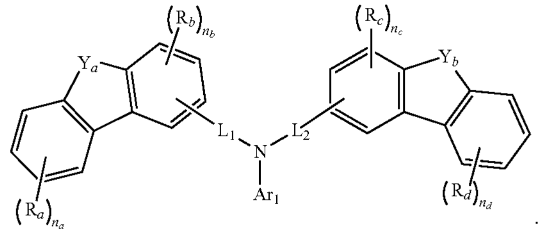

In Formula H-a, $Y_a$ and $Y_b$ are each independently $CR_eR_f$, $NR_g$, O, or S. $Y_a$ and $Y_b$ may be the same or different. In an embodiment, both $Y_a$ and $Y_b$ may be $CR_eR_f$. In some embodiments, $Y_a$ or $Y_b$ may be $CR_eR_f$, and the other one may be $NR_g$.

In Formula H-a, $Ar_1$ is a substituted or unsubstituted aryl group having 6 to 30 ring-forming carbon atoms, or a substituted or unsubstituted heteroaryl group having 2 to 30 ring-forming carbon atoms. For example, Ar may be a substituted or unsubstituted phenyl group, a substituted or unsubstituted biphenyl group, a substituted or unsubstituted naphthyl group, a substituted or unsubstituted fluorenyl group, or a substituted or unsubstituted terphenyl group.

In Formula H-a, $L_1$ and $L_2$ are each independently a direct linkage, a substituted or unsubstituted arylene group having 6 to 30 ring-forming carbon atoms, or a substituted or unsubstituted heteroarylene group having 2 to 30 ring-forming carbon atoms. For example, $L_1$ and $L_2$ may be each independently a direct linkage, a substituted or unsubstituted phenylene group, or a substituted or unsubstituted divalent biphenyl group.

In Formula H-a, $R_a$ to $R_g$ are each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms; or may be combined with an adjacent group to form a ring. For example, $R_a$ to $R_g$ may be each independently a hydrogen atom, a substituted or unsubstituted methyl group, or a substituted or unsubstituted phenyl group.

In Formula H-a, "$n_a$" and "$n_a$" are each independently an integer of 0 to 4, and "$n_b$" and "$n_c$" are each independently an integer of 0 to 3.

The hole transport region HTR may include a phthalocyanine compound (such as copper phthalocyanine), $N^1$,$N^{1\prime}$-([1,1'-biphenyl]-4,4'-diyl)bis($N^1$-phenyl-$N^4$,$N^4$-di-m-tolylbenzene-1,4-diamine) (DNTPD), 4,4',4"-[tris(3-methylphenyl)phenylamino]triphenylamine (m-MTDATA), 4,4',4"-tris(N,N-diphenylamino)triphenylamine (TDATA), 4,4',4"-tris [N (2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium

[tetrakis(pentafluorophenyl) borate], and/or dipyrazino[2,3-f: 2',3'-h]quinoxaline-2,3,6,7,10,11-hexacarbonitrile (HAT-CN).

The hole transport region HTR may include carbazole derivatives (such as N-phenyl carbazole and/or polyvinyl carbazole), fluorene-based derivatives, N,N'-bis(3-methylphenyl)-N,N'-diphenyl-[1,1'-biphenyl]-4,4'-diamine (TPD), triphenylamine-based derivatives (such as 4,4',4"-tris(N-carbazolyl)triphenylamine (TCTA)), N,N'-di(1-naphthalene-1-yl)-N,N'-diphenyl-benzidine (NPB), 4,4'-cyclohexylidene bis[N,N-bis(4-methylphenyl)benzeneamine] (TAPC), 4,4'-bis[N,N'-(3-tolyl)amino]-3,3'-dimethylbiphenyl (HMTPD), 9-(4-tert-butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), 1,3-bis(1,8-dimethyl-9H-carbazol-9-yl)benzene (mDCP), etc.

The hole transport region HTR may include the compounds of the hole transport region in at least one among the hole injection layer HIL, hole transport layer HTL, and electron blocking layer EBL.

The thickness of the hole transport region HTR may be from about 100 Å to about 10,000 Å, for example, from about 100 Å to about 5,000 Å. When the hole transport region HTR includes a hole injection layer HIL, the thickness of the hole injection region HIL may be, for example, from about 30 Å to about 1,000 Å. When the hole transport region HTR includes a hole transport layer HTL, the thickness of the hole transport layer HTL may be from about 30 Å to about 1,000 Å. For example, when the hole transport region HTR includes an electron blocking layer, the thickness of the electron blocking layer EBL may be from about 10 Å to about 1,000 Å. When the thicknesses of the hole transport region HTR, the hole injection layer HIL, the hole transport layer HTL and the electron blocking layer EBL satisfy the above-described ranges, satisfactory hole transport properties may be achieved without substantial increase of a driving voltage.

The hole transport region HTR may further include a charge generating material to increase conductivity in addition to the above-described materials. The charge generating material may be dispersed uniformly or non-uniformly in the hole transport region HTR. The charge generating material may be, for example, a p-dopant. The p-dopant may include at least one of metal halide compounds, quinone derivatives, metal oxides, and cyano group-containing compounds, without limitation. For example, non-limiting examples of the p-dopant may include metal halide compounds such as CuI and/or RbI, quinone derivatives such as tetracyanoquinodimethane (TCNQ) and/or 2,3,5,6-tetrafluoro-7,7',8,8-tetracyanoquinodimethane (F4-TCNQ), metal oxides such as tungsten oxide and/or molybdenum oxide, cyano group-containing compounds such as dipyrazino[2,3-f: 2',3'-h]quinoxaline-2,3,6,7,10,11-hexacarbonitrile (HATCN) and/or 4-[2,3-bis [cyano-(4-cyano-2,3,5,6-tetrafluorophenyl) methylidene]cyclopropylidene]-cyanomethyl]-2,3,5,6-tetrafluorobenzonitrile, etc., As described above, the hole transport region HTR may further include at least one among a buffer layer or an electron blocking layer EBL in addition to the hole injection layer HIL and the hole transport layer HTL. The buffer layer may compensate resonance distance according to the wavelength of light emitted from an emission layer EML and may increase light emitting efficiency. As materials included in the buffer layer, materials which may be included in the hole transport region HTR may be utilized. The electron blocking layer EBL is a layer playing the role of blocking the injection of electrons from an electron transport region ETR to a hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed utilizing a single material, a single layer formed utilizing multiple different materials, or a multilayer structure having multiple layers formed utilizing multiple different materials.

In the light emitting device ED according to an embodiment, the emission layer EML may include a fused polycyclic compound of an embodiment.

The fused polycyclic compound of an embodiment has a wide plate-type resonance structure containing two boron atoms and at least one nitrogen atom, wherein an additional aromatic structure is fused via a pentagonal heterocycle, and a phenyl group in which at least one phenyl group is substituted at an ortho position, is substituted at the nitrogen atom.

The fused polycyclic compound of an embodiment is represented by Formula 1 below.

Formula 1

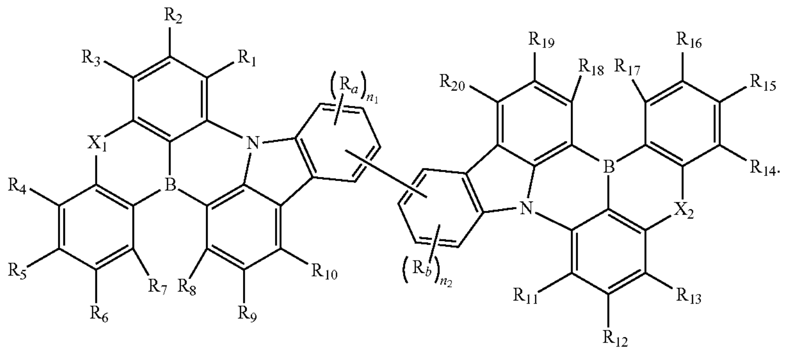

In Formula 1, $X_1$ and $X_2$ are each independently $NR_c$, O, S, or Se. $X_1$ and $X_2$ may be the same or different. For example, both $X_1$ and $X_2$ may be $NR_c$. In some embodiments, $X_1$ or $X_2$ may be $NR_c$, and the remainder may be O, S, or Se.

In Formula 1, $R_1$ to $R_{20}$, and $R_a$ to $R_c$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms. For example, $R_1$ to $R_{20}$ may be each independently a hydrogen atom, a deuterium atom, a substituted or unsubstituted diphenylamine group, a substituted or unsubstituted t-butyl group, a substituted or unsubstituted phenyl group, or a substituted or unsubstituted carbazole group. In some embodiments, $R_a$ and $R_b$ may be each independently a hydrogen atom or a deuterium atom. $R_c$ may be a substituted or unsubstituted phenyl group, or a substituted or unsubstituted terphenyl group.

In Formula 1, "$n_1$" and "$n_2$" are each independently an integer of 1 to 4. When "$n_1$" is an integer of 2 or more, two or more $R_1$ groups may be all the same, or at least one among the two or more $R_1$ groups may be different. When "$n_2$" is an integer of 2 or more, two or more $R_2$ groups may be all the same, or at least one among the two or more $R_2$ groups may be different.

The fused polycyclic compound represented by Formula 1 includes two plate-type skeleton structures, each of which includes one boron atom and one carbazole moiety in a resonance structure, and the two plate-type skeleton structures may be directly bonded via benzene rings which are not connected with boron in the carbazole moieties. In some embodiments, the two plate-type skeleton structures may be the same. More particularly, in Formula 1, $X_1$ and $X_2$ may be the same, $R_1$ and $R_{11}$ may be the same, $R_2$ and $R_{12}$ may be the same, $R_3$ and $R_{13}$ may be the same, $R_4$ and $R_{14}$ may be the same, $R_5$ and $R_{15}$ may be the same, $R_6$ and $R_{16}$ may be the same, $R_7$ and $R_{17}$ may be the same, $R_5$ and $R_{18}$ may be the same, Ry and $R_{19}$ may be the same, $R_{10}$ and $R_{20}$ may be the same, and $R_a$ and $R_b$ may be the same.

The fused polycyclic compound of an embodiment includes two plate-type skeleton structures, each of which includes one boron atom and one carbazole moiety in a resonance structure, and two plate-type skeleton structures have a directly bonded structure via benzene rings which are not connected with boron in the carbazole moieties. Accordingly, the fused polycyclic compound of an embodiment forms a broad conjugation structure and has a low AEst value (e.g., energy difference between the lowest triplet excitation energy level (T1 level) and the lowest singlet excitation energy level (S1 level)), and a polycyclic aromatic ring structure is stabilized. Accordingly, a light emitting material with a wavelength region suitable for blue light emission may be provided, and when applied to a light emitting device, the efficiency of the light emitting device may be improved. In addition, the fused polycyclic compound of an embodiment shows high light-absorbance through two boron atoms and two plate-type skeleton structures, and includes carbazole moieties at positions directly bonded to the boron atoms, and accordingly, multiple resonance may be increased, and when applied to a light emitting device, the emission efficiency of the light emitting device may be improved.

The fused polycyclic compound represented by Formula 1 may be represented by any one among Formula 2-1 to Formula 2-6 below.

Formula 2-1

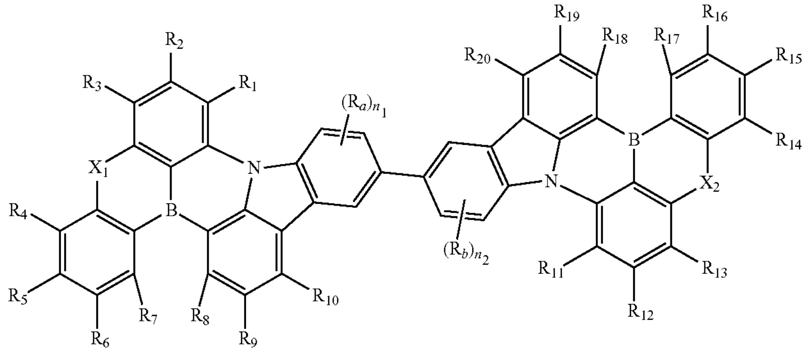

Formula 2-2

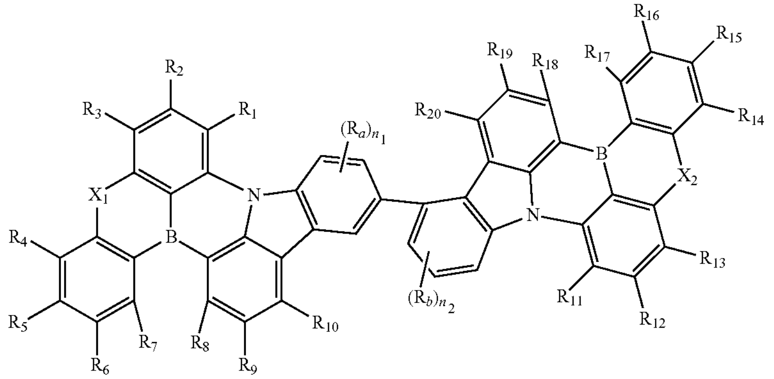

-continued
Formula 2-3
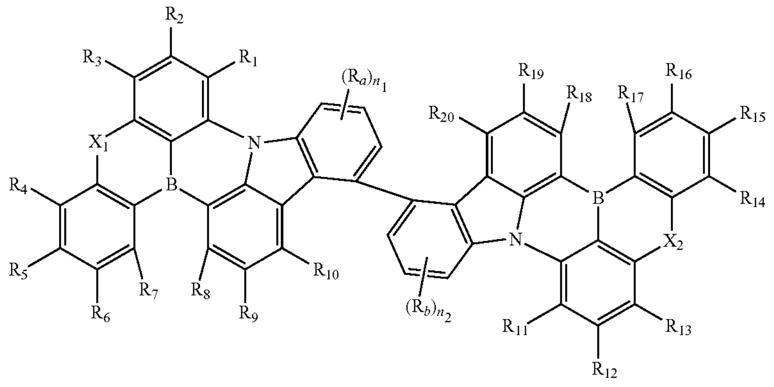
Formula 2-4
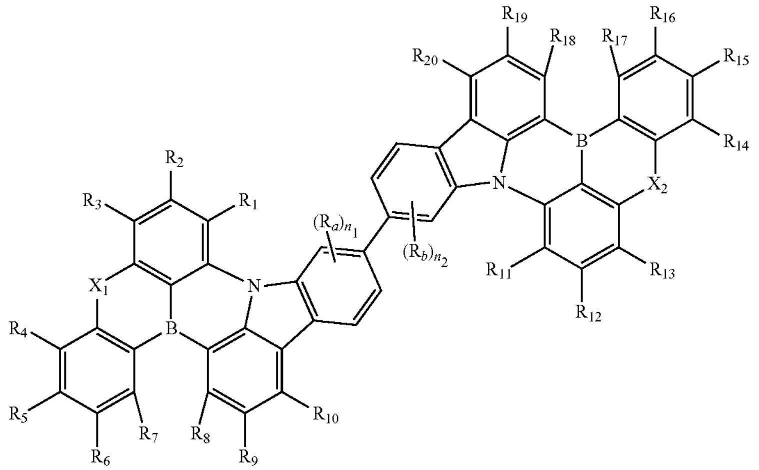
Formula 2-5
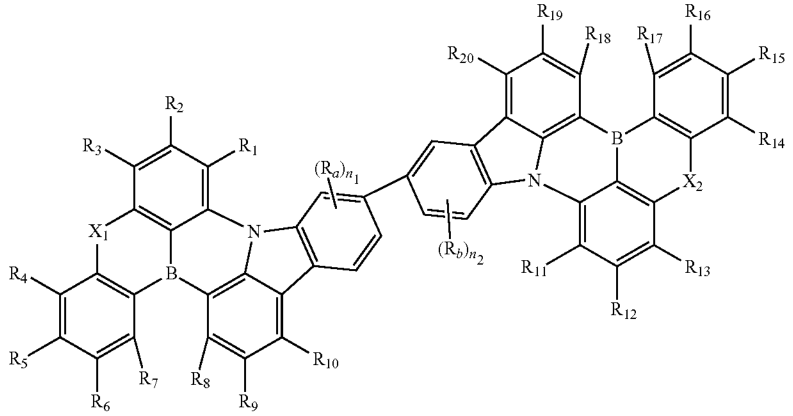

-continued

Formula 2-6

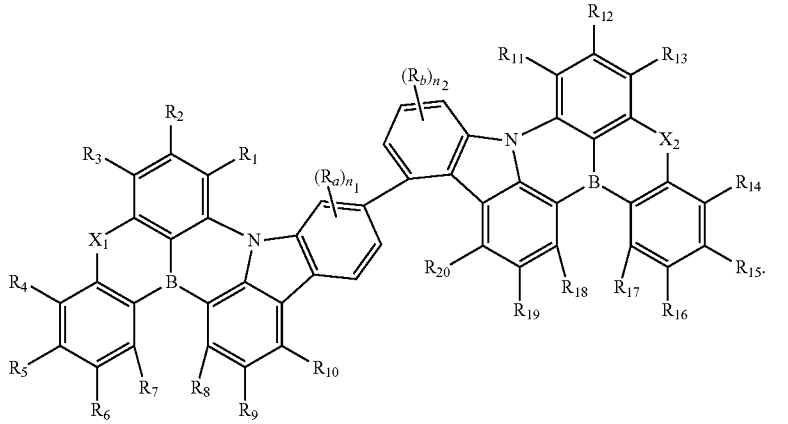

Formula 2-1 to Formula 2-6 represent cases of Formula 1 in which the connecting positions of the plate-type skeleton structures are specified. Formula 2-1 is a case of Formula 1, in which carbon at position 3 in the carbazole moiety of a left plate-type skeleton structure and carbon at position 3 in the carbazole moiety of a right plate-type skeleton structure are connected. Formula 2-2 is a case of Formula 1, in which carbon at position 3 in the carbazole moiety of a left plate-type skeleton structure and carbon at position 4 in the carbazole moiety of a right plate-type skeleton structure are connected. Formula 2-3 is a case of Formula 1, in which carbon at position 4 in the carbazole moiety of a left plate-type skeleton structure and carbon at position 4 in the carbazole moiety of a right plate-type skeleton structure are connected. Formula 2-4 is a case of Formula 1, in which carbon at position 2 in the carbazole moiety of a left plate-type skeleton structure and carbon at position 2 in the carbazole moiety of a right plate-type skeleton structure are connected. Formula 2-5 is a case of Formula 1, in which carbon at position 2 in the carbazole moiety of a left plate-type skeleton structure and carbon at position 3 in the carbazole moiety of a right plate-type skeleton structure are connected. Formula 2-6 is a case of Formula 1, in which carbon at position 2 in the carbazole moiety of a left plate-type skeleton structure and carbon at position 4 in the carbazole moiety of a right plate-type skeleton structure are connected.

As in Formula 2-1 to Formula 2-6, two plate-type skeleton structures including boron atoms and carbazole moieties may be connected with each other through carbon at position 2, carbon at position 3, or carbon at position 4 in the carbazole moiety. Through this, the fused polycyclic compound of an embodiment may be selected so that molecular twist and orbital distribution are suitable for blue emission properties, and accordingly, when applied to an emission layer of a blue light emitting device, emission efficiency may be improved.

In some embodiments, in Formula 2-1 to Formula 2-6, the same explanation on $X_1$, $X_2$, $R_1$ to $R_{20}$, $R_a$ to $R_c$, "$n_1$" and "$n_2$" referring to Formula 1 may be applied.

The fused polycyclic compound represented by Formula 1 may be represented by Formula 3 below.

Formula 3

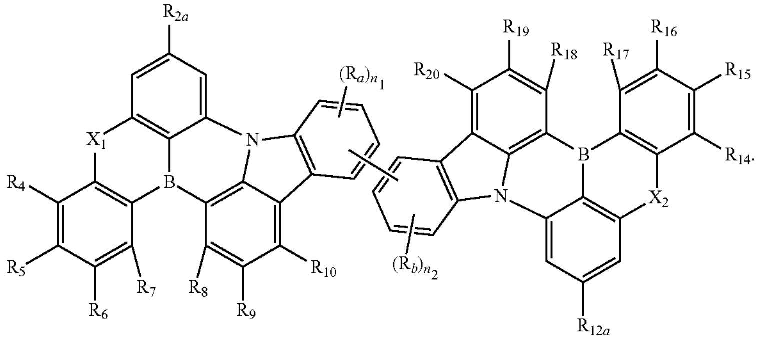

Formula 3 represents an embodiment of Formula 1 where the substituents of $R_1$ to $R_3$, and $R_{11}$ to $R_{13}$ are specified. Formula 3 represents a case of Formula 1, where $R_1$, $R_3$, and $R_{11}$ and $R_{13}$ are each hydrogen atoms, and $R_2$ and $R_{12}$ are substituents other than a hydrogen atom.

In Formula 3, $R_{2a}$ and $R_{12a}$ are each independently a deuterium atom, a halogen atom, a substituted or unsubstituted amine group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms. $R_{2a}$ and $R_{12a}$ may be the same or different. For example, both $R_{2a}$ and $R_{12a}$ may be substituted or unsubstituted phenyl groups or substituted or unsubstituted t-butyl groups. In some embodiments, both $R_{2a}$ and $R_{12a}$ may be diphenylamine groups. In some embodiments, both $R_{2a}$ and $R_{12a}$ may be diphenylamine groups substituted The fused polycyclic compound represented by Formula 1 may be represented by any one among Formula 4-1 to Formula 4-3 below.

Formula 4-1

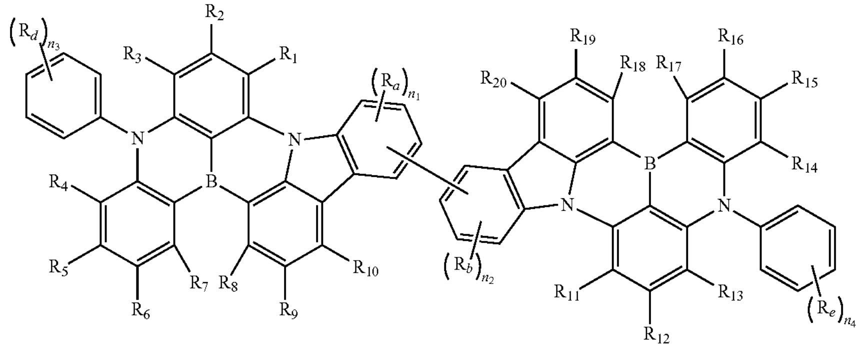

Formula 4-2

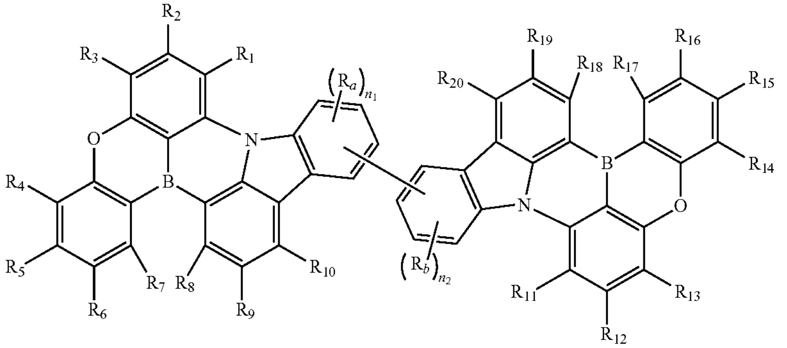

Formula 4-3

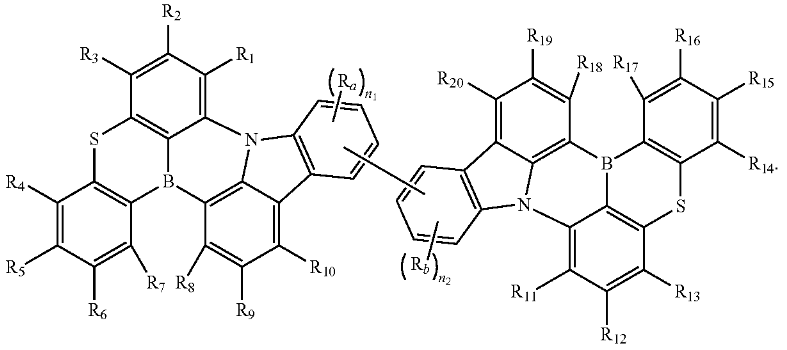

with phenyl groups. In some embodiments, both $R_{2a}$ and $R_{12a}$ may be substituted or unsubstituted carbazole groups. In some embodiments, both $R_{2a}$ and $R_{12a}$ may be carbazole groups substituted with t-butyl groups or carbazole groups substituted with phenyl groups.

As in Formula 3, in the plate-type skeleton structure including boron atoms and carbazole moieties, an electron donating substituent including a phenyl group, a t-butyl group, a diphenylamine group or a carbazole group may be bonded at the para position with respect to the boron atom. Through this, the fused polycyclic compound of an embodiment may be selected so that orbital distribution is suitable for blue emission properties, and accordingly, when applied to an emission layer of a blue light emitting device, emission efficiency may be improved.

In some embodiments, in Formula 3, the same explanation on $X_1$, $X_2$, $R_4$ to $R_{10}$, $R_{14}$ to $R_{20}$, $R_a$ to $R_c$, "$n_1$" and "$n_2$" referring to Formula 1 may be applied.

Formula 4-1 to Formula 4-3 are cases of Formula 1, in which $X_1$ and $X_2$ are specified. Formula 4-1 represents a case of Formula 1 where both $X_1$ and $X_2$ are $NR_c$, and $R_c$ is a substituted or unsubstituted phenyl group. Formula 4-2 represents a case of Formula 1 where both $X_1$ and $X_2$ are each O, and Formula 4-3 represents a case where both $X_1$ and $X_2$ are each S.

In Formula 4-1, $R_d$ and $R_e$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms.

$R_d$ and $R_e$ may be the same or different. For example, both $R_d$ and $R_e$ may be hydrogen atoms, deuterium atoms, substituted or unsubstituted phenyl groups, or substituted or unsubstituted biphenyl groups.

In Formula 4-1, "$n_3$" and "$n_4$" are each independently an integer of 1 to 5. When "$n_3$" is an integer of 2 or more, two or more $R_a$ groups may be all the same, or at least one among the two or more $R_a$ groups may be different. When "$n_4$" is an integer of 2 or more, two or more $R_e$ groups may be all the same, or at least one among the two or more $R_e$ groups may be different.

In some embodiments, in Formula 4-1 to Formula 4-3, the same explanation on $R_1$ to $R_{20}$, $R_a$, $R_b$, "$n_1$" and "$n_2$" referring to Formula 1 may be applied.

The fused polycyclic compound of an embodiment may be any one among the compounds represented in Compound Group 1 below. A light emitting device ED of an embodiment may include at least one among the compounds represented in Compound Group 1 in an emission layer EML.

Compound Group 1

1

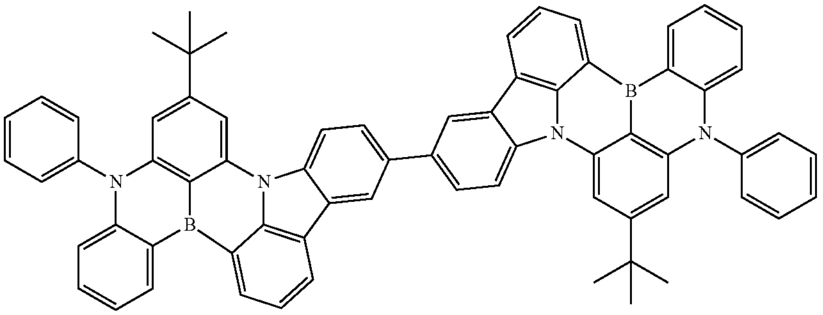

2

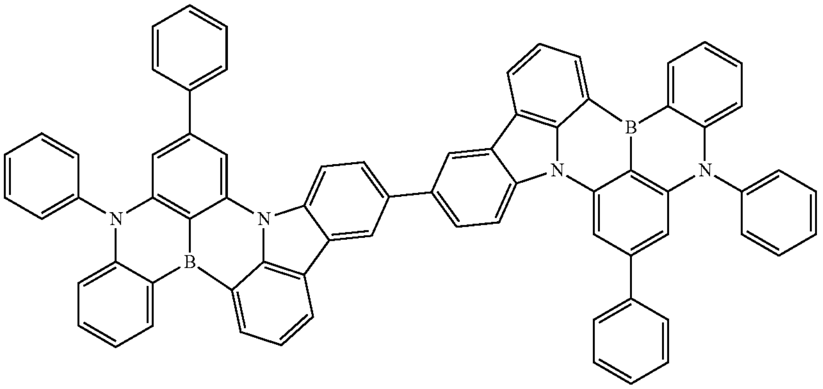

3

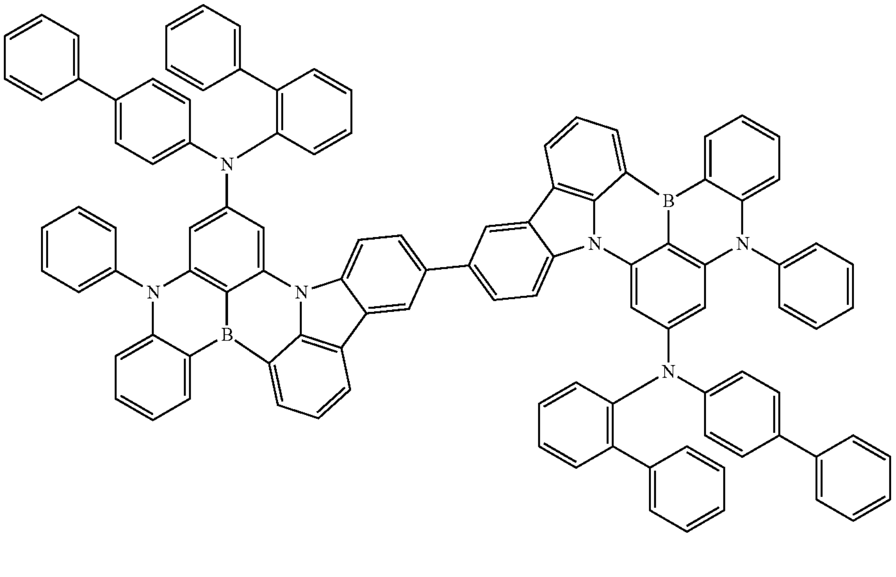

-continued
4
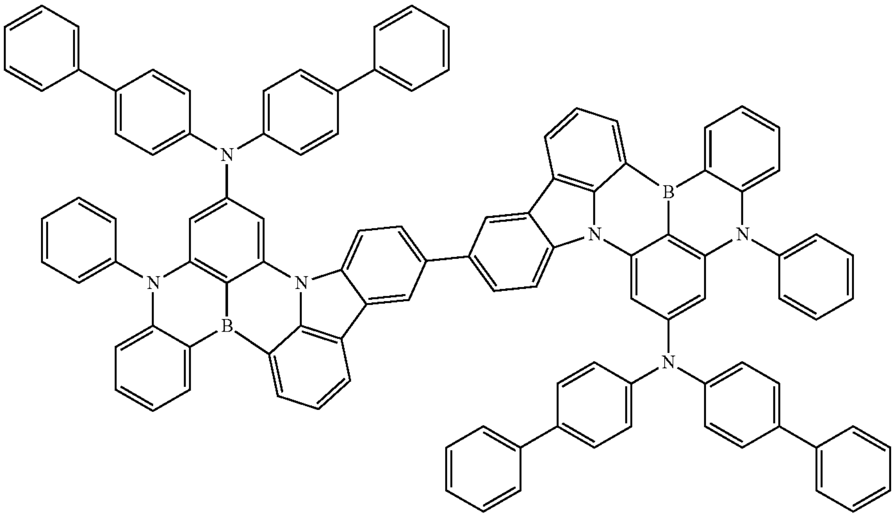
5
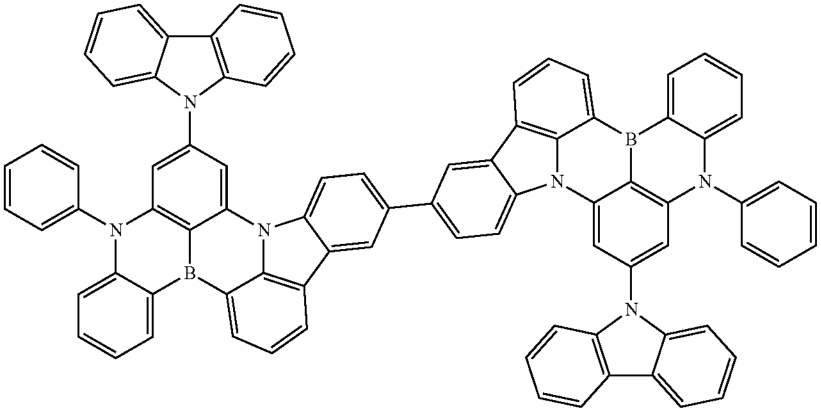
6
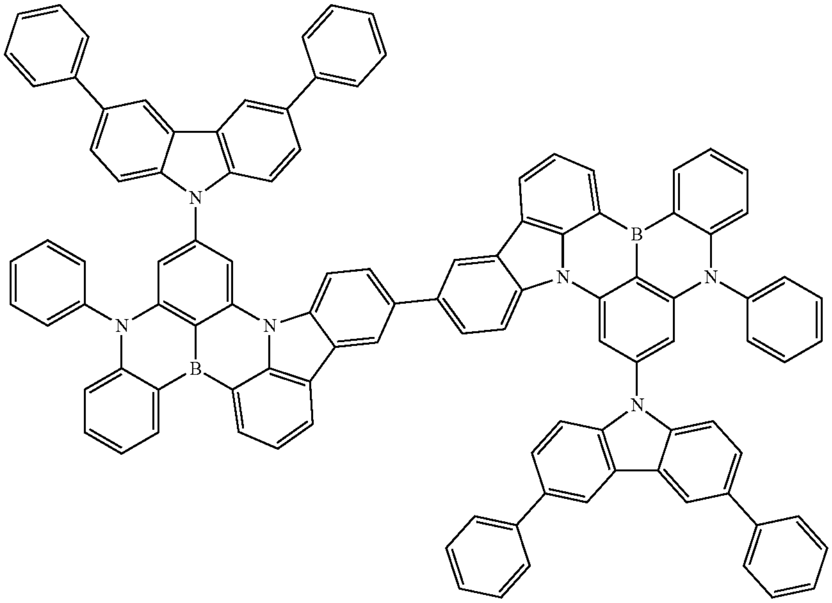

-continued
7
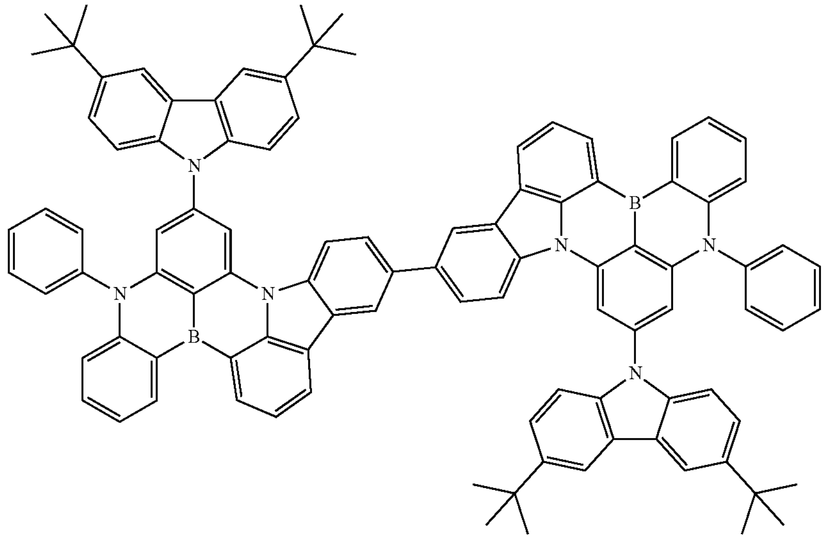
8
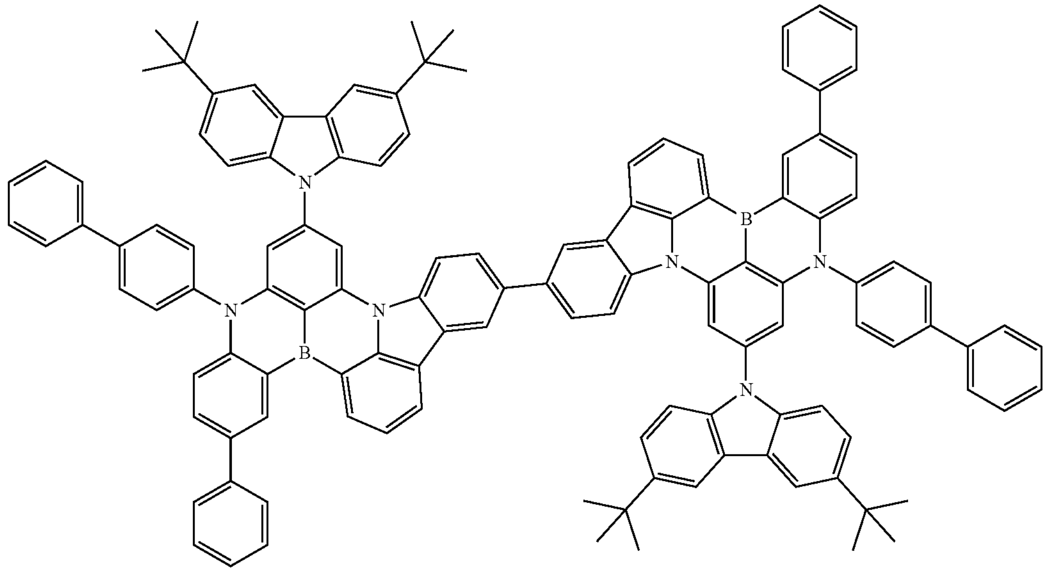
9
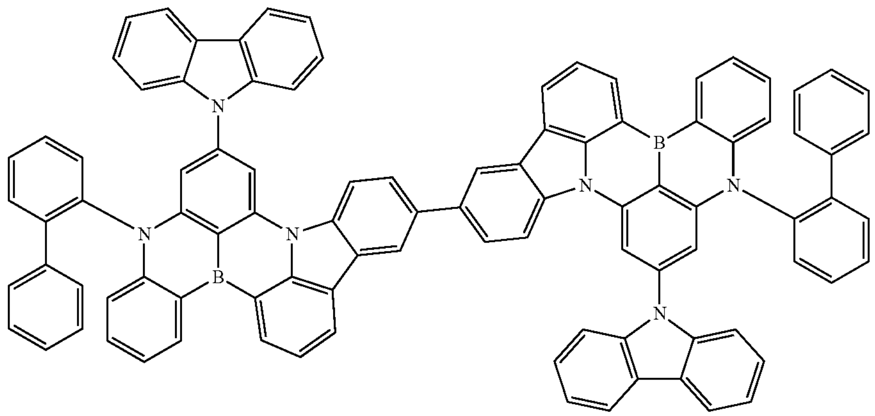

-continued
10
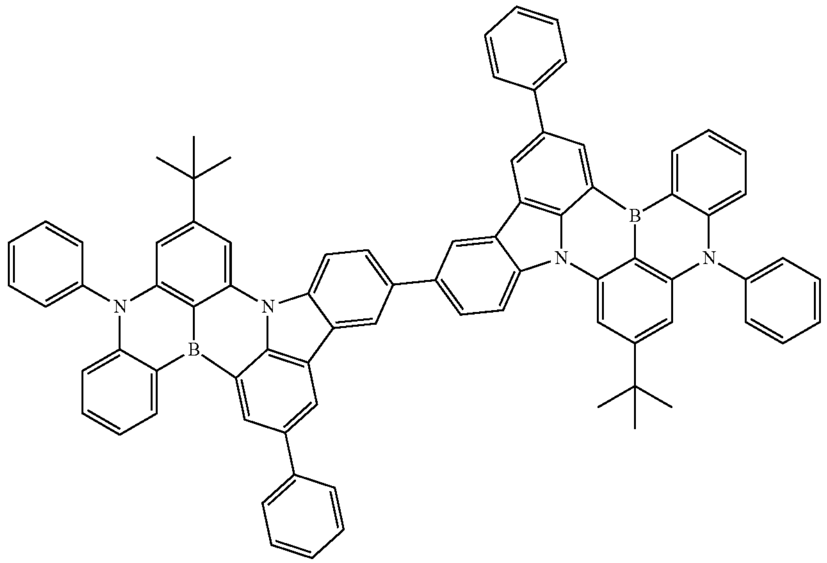
11
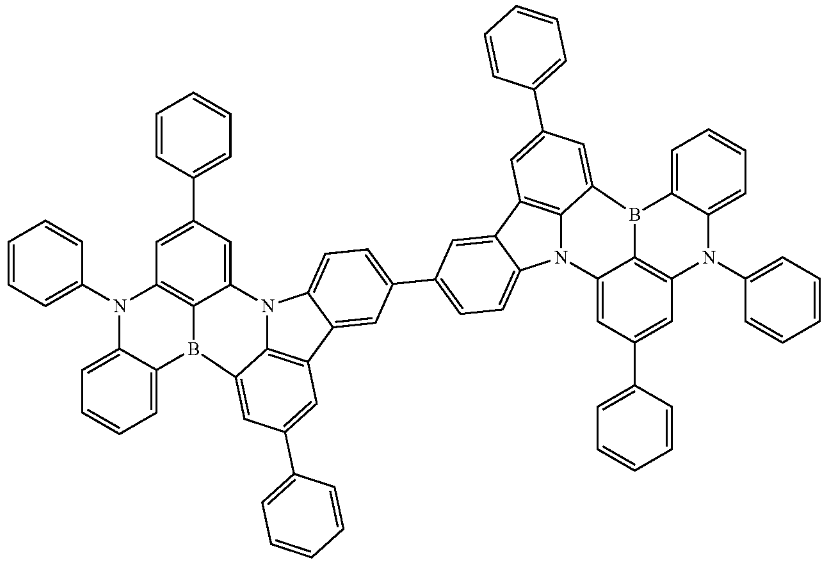

-continued
12
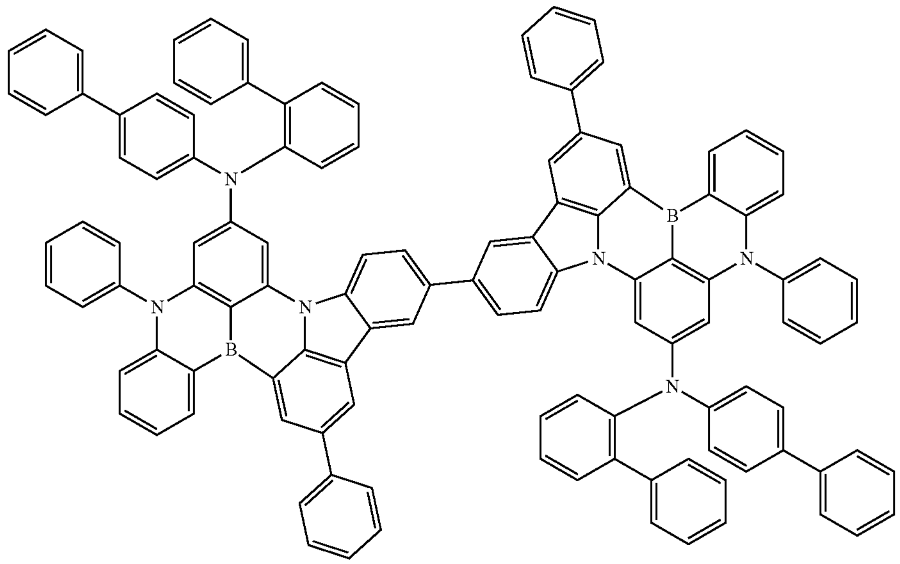
13
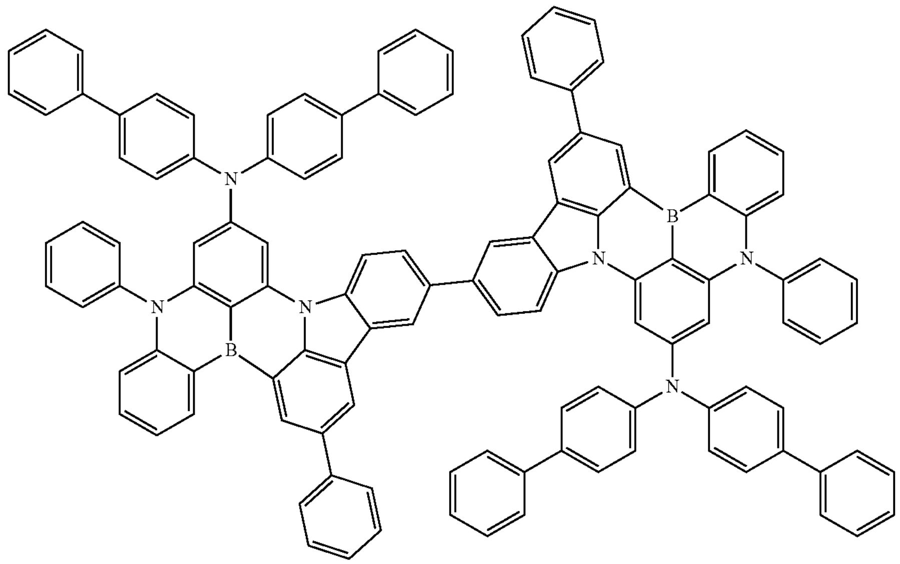

-continued
14
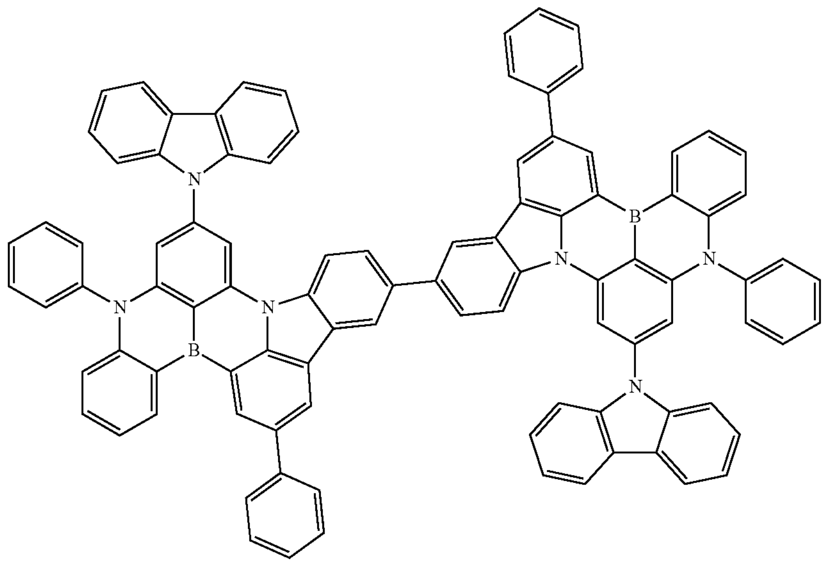
15
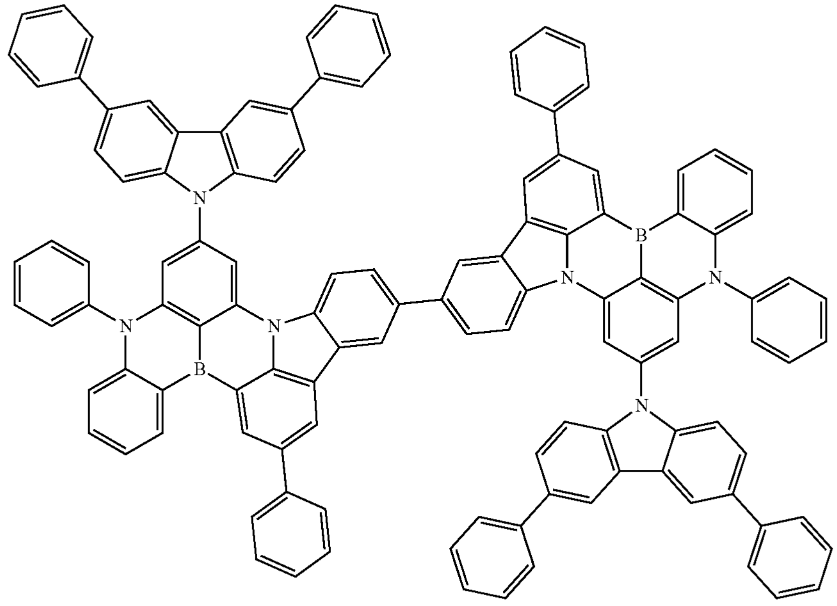

-continued
16
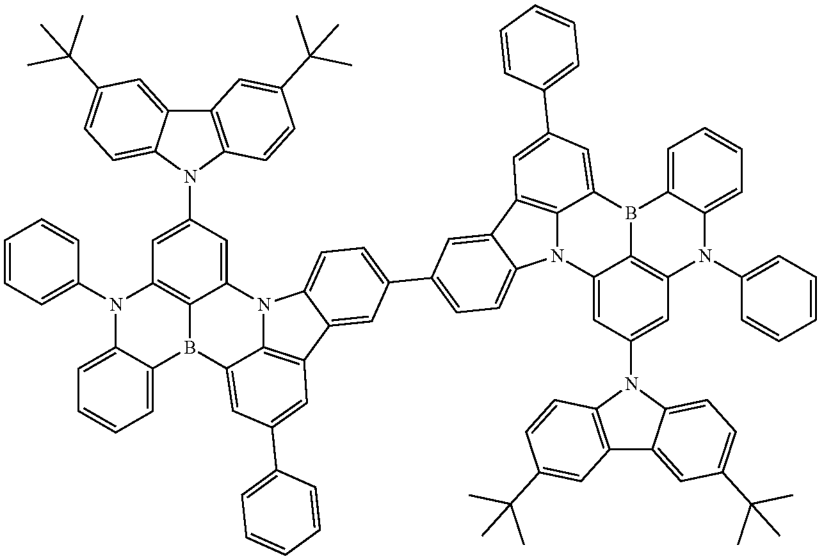
17
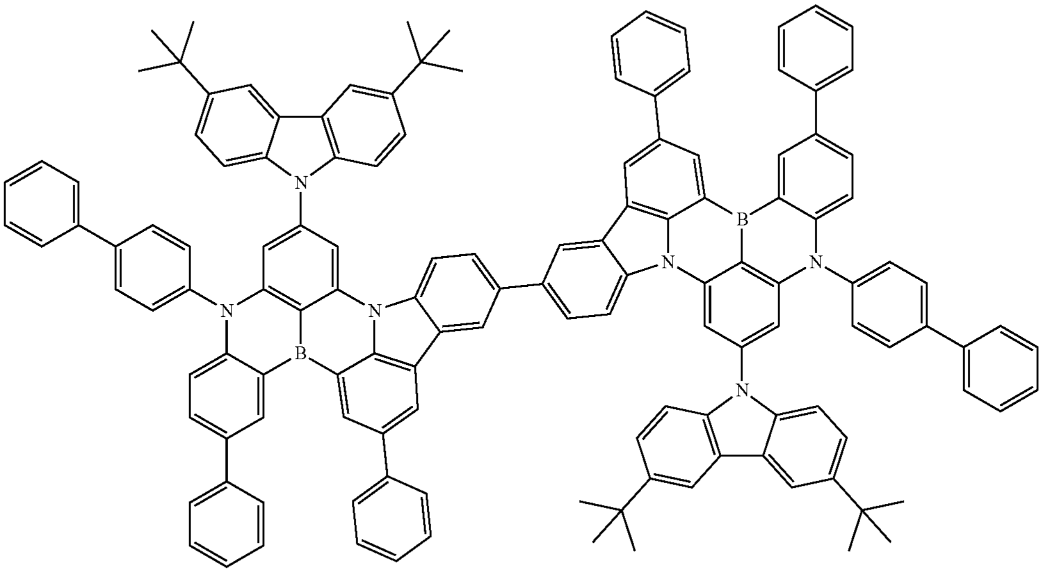

-continued
18
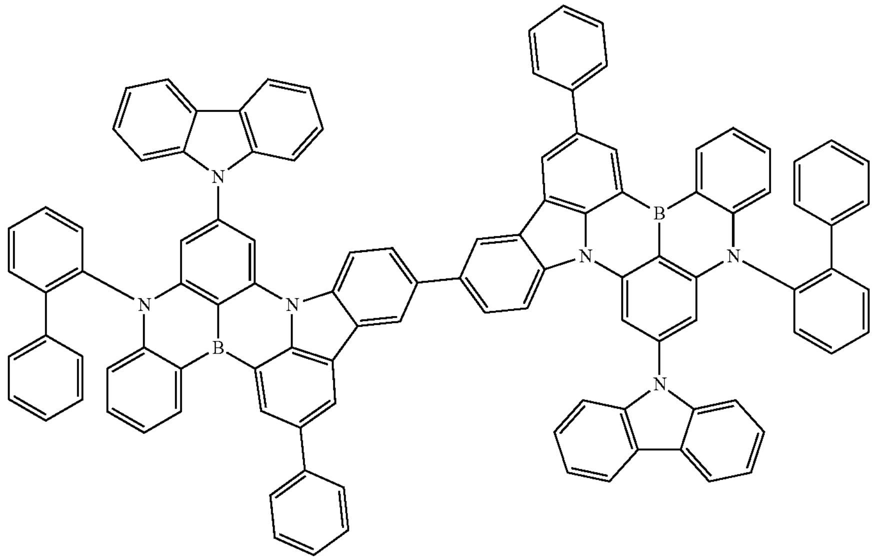
19
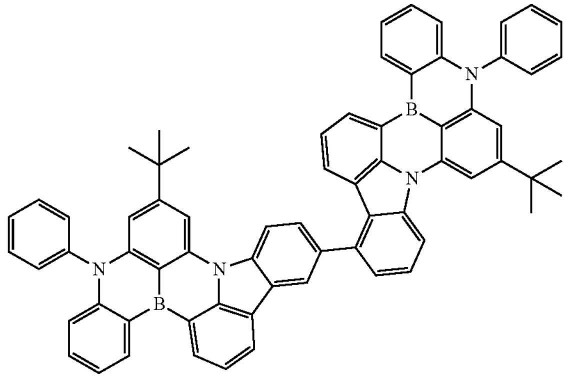
20
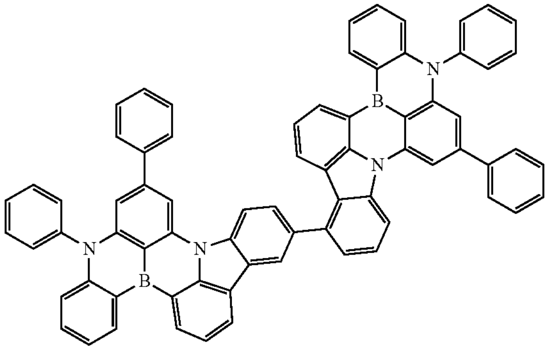
21
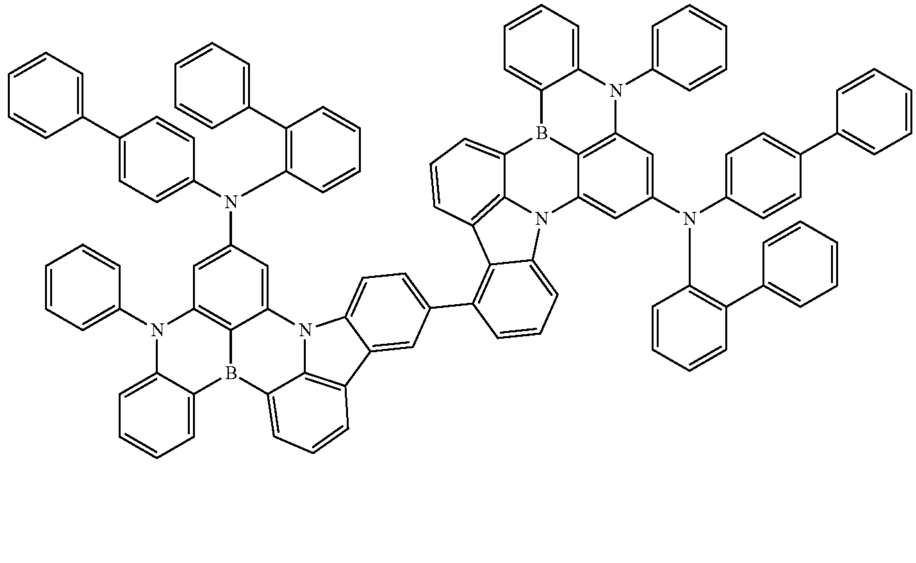

-continued
22
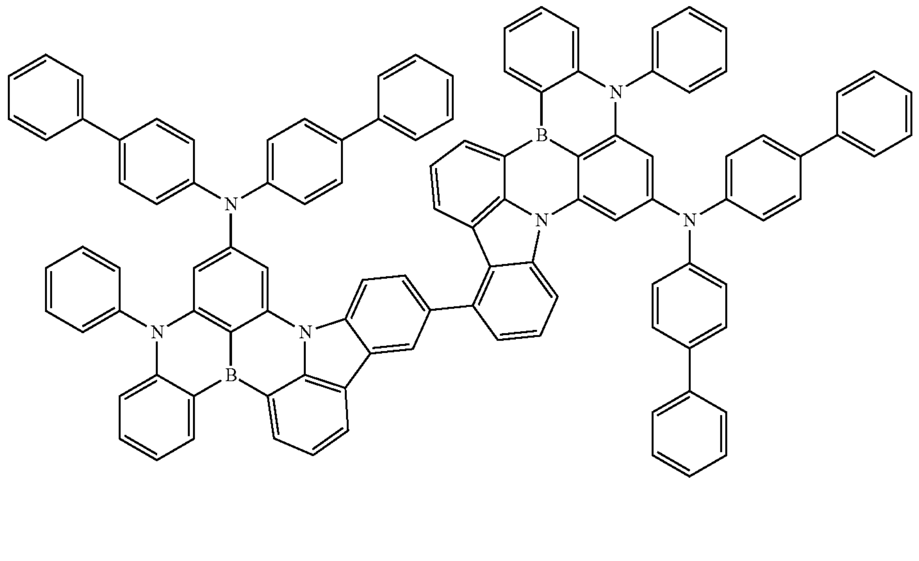
23
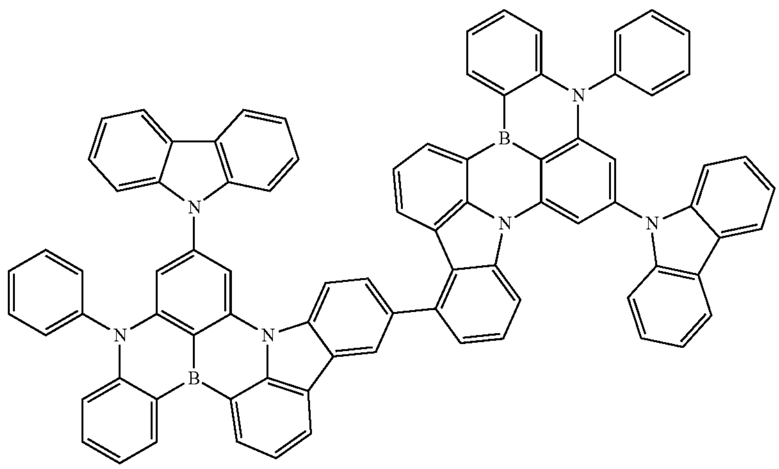
24
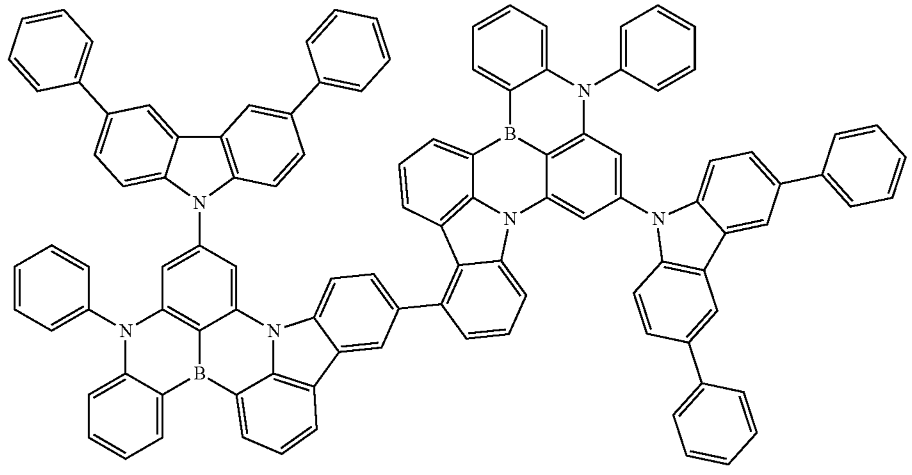

-continued
25
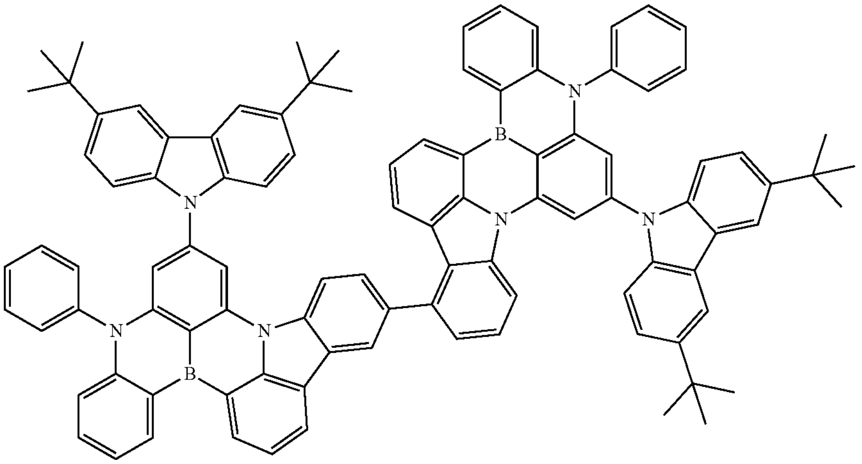
26
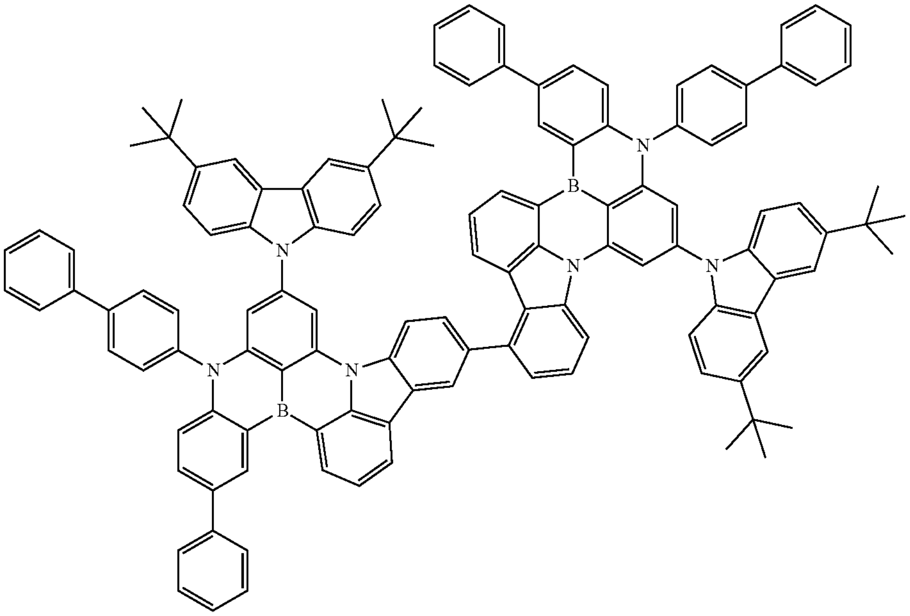
27
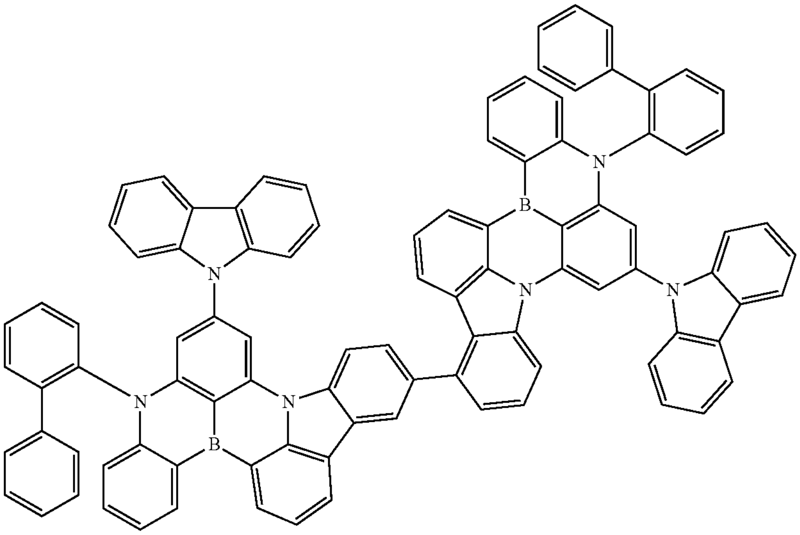

-continued
28
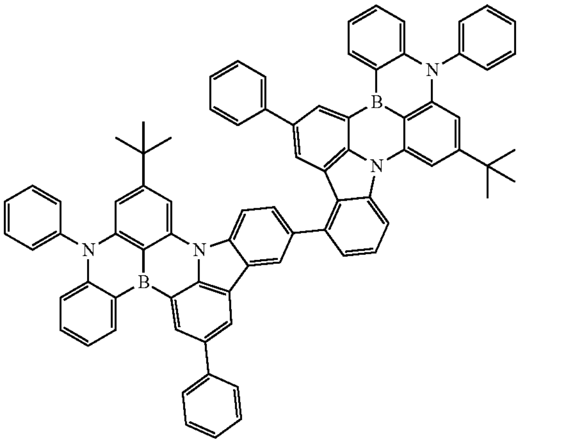
29
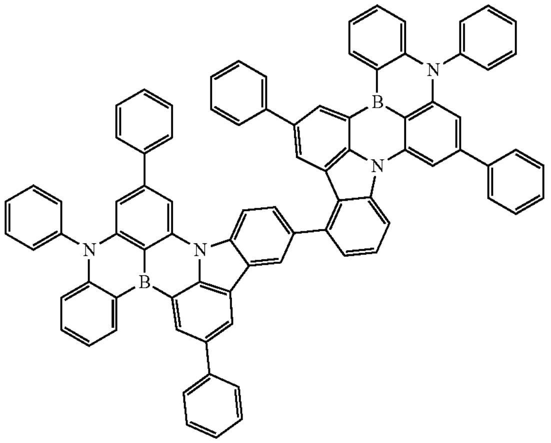
30
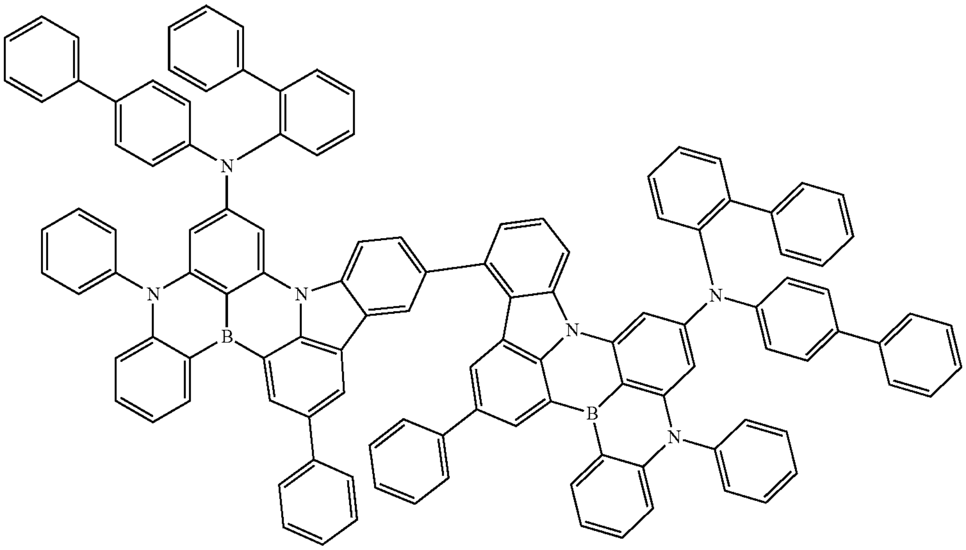
31
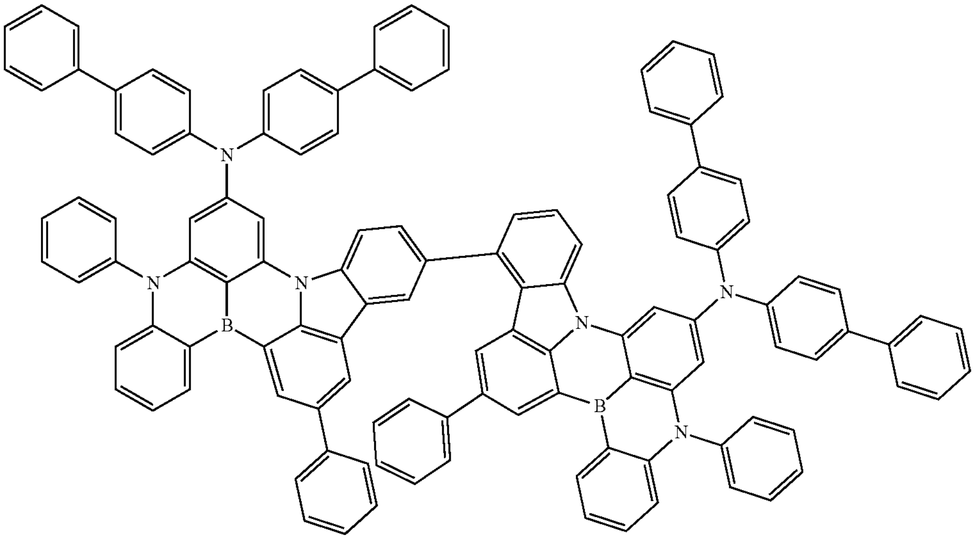

-continued
32
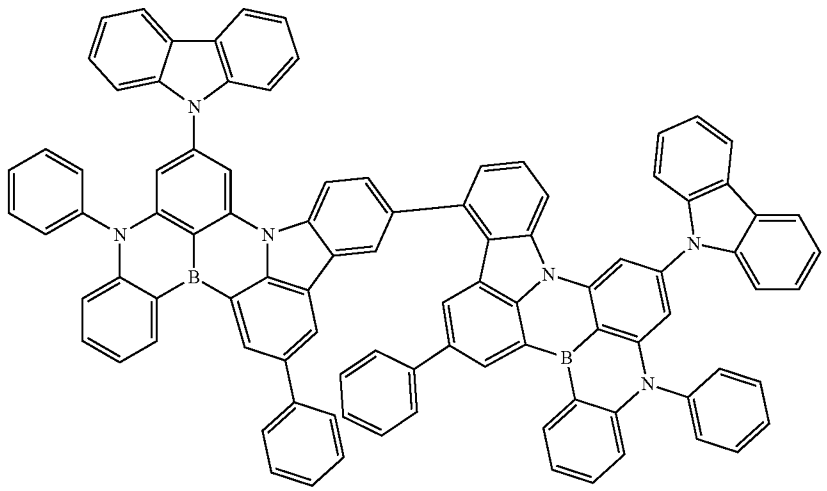
33
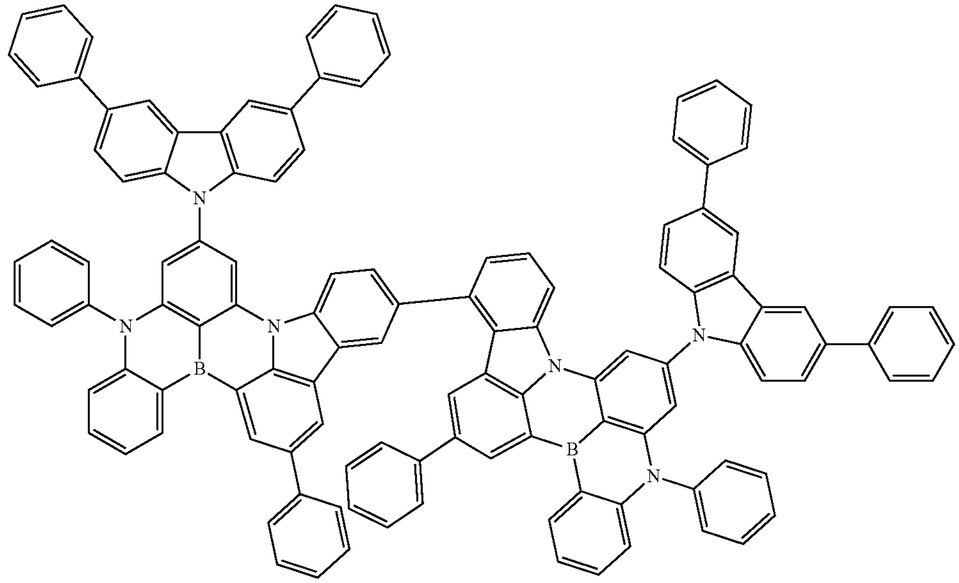
34
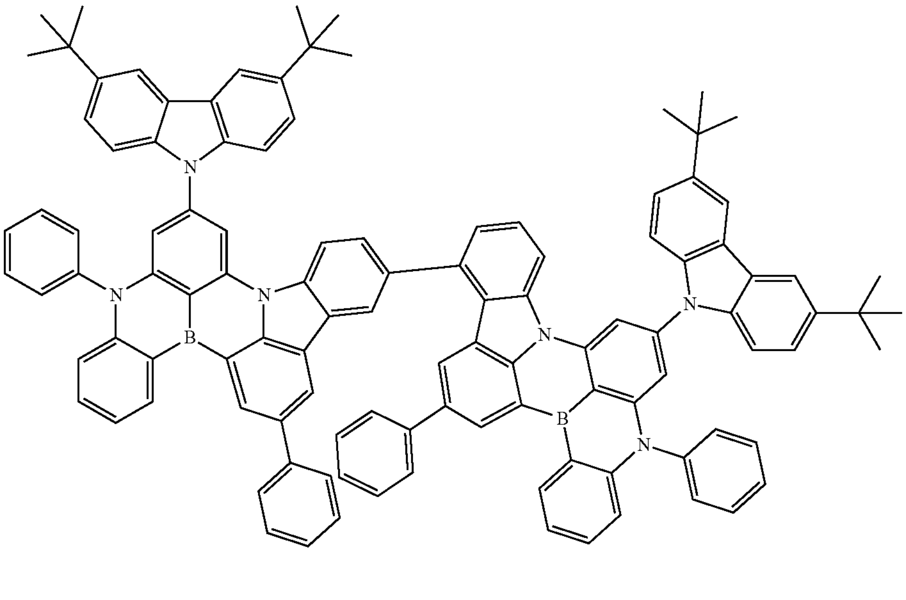

-continued
35
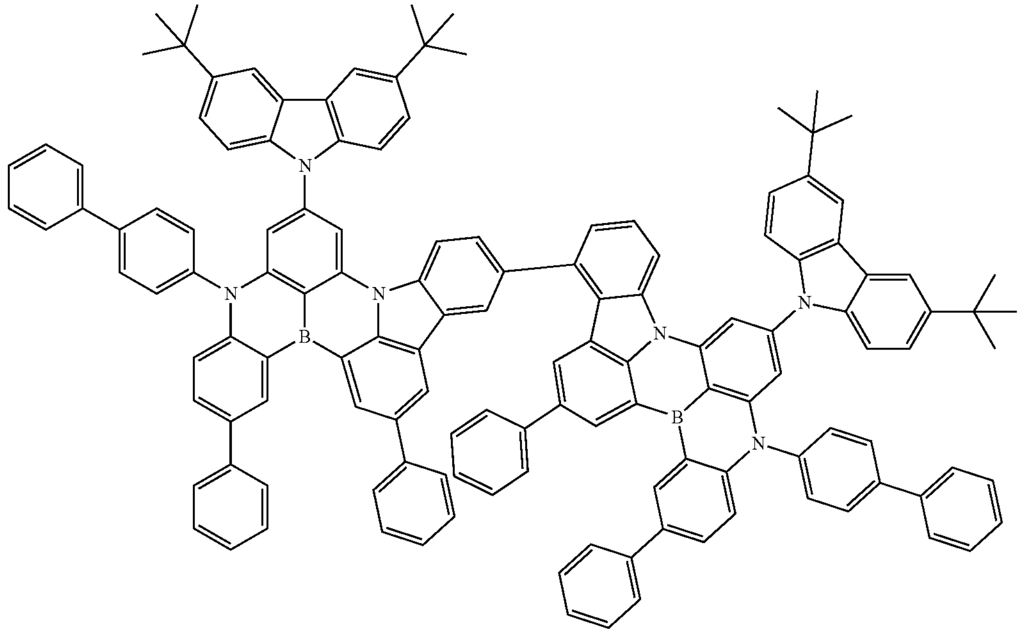
36
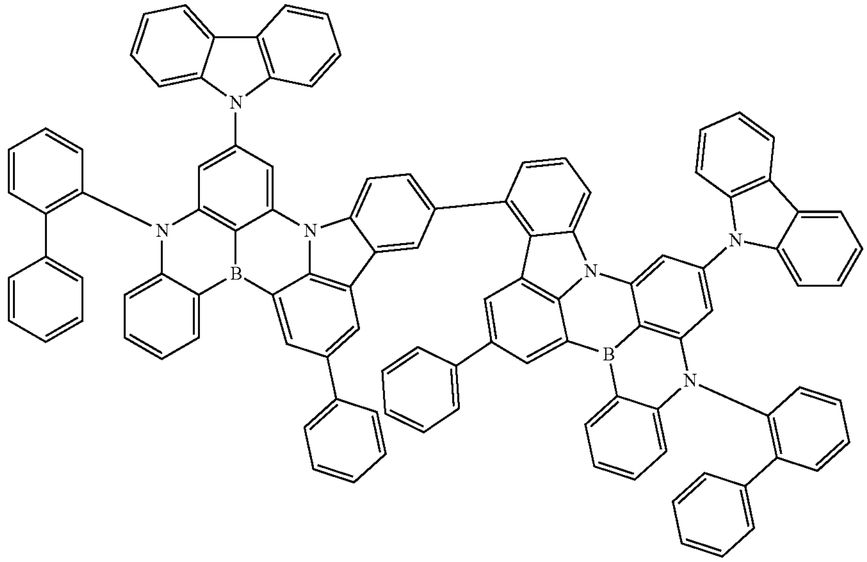
37
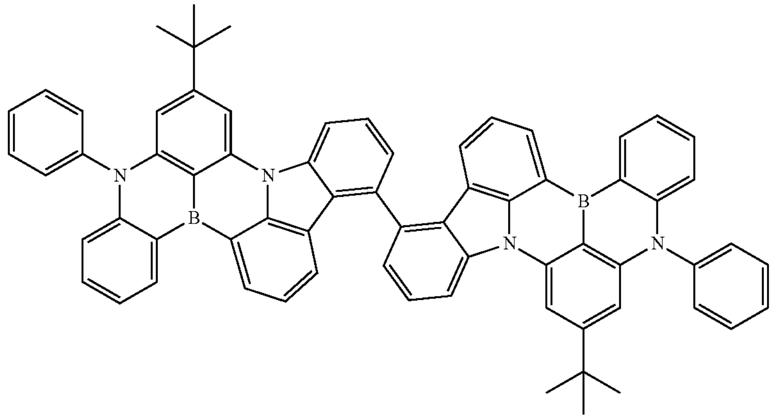

-continued
38
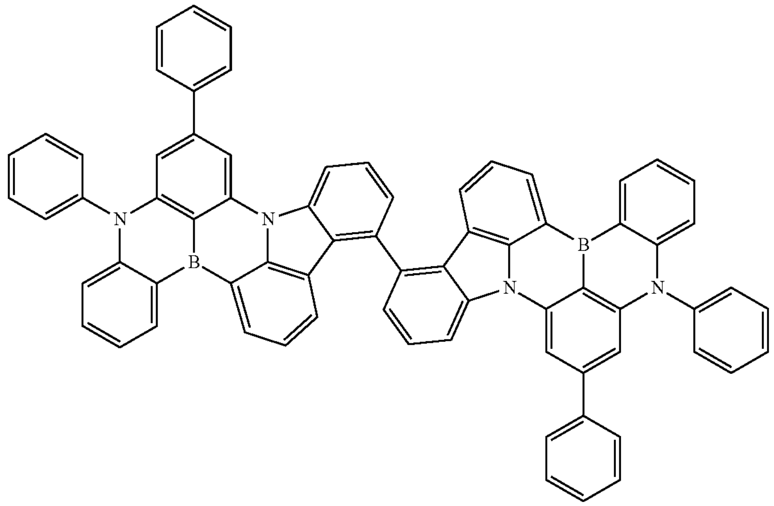
39
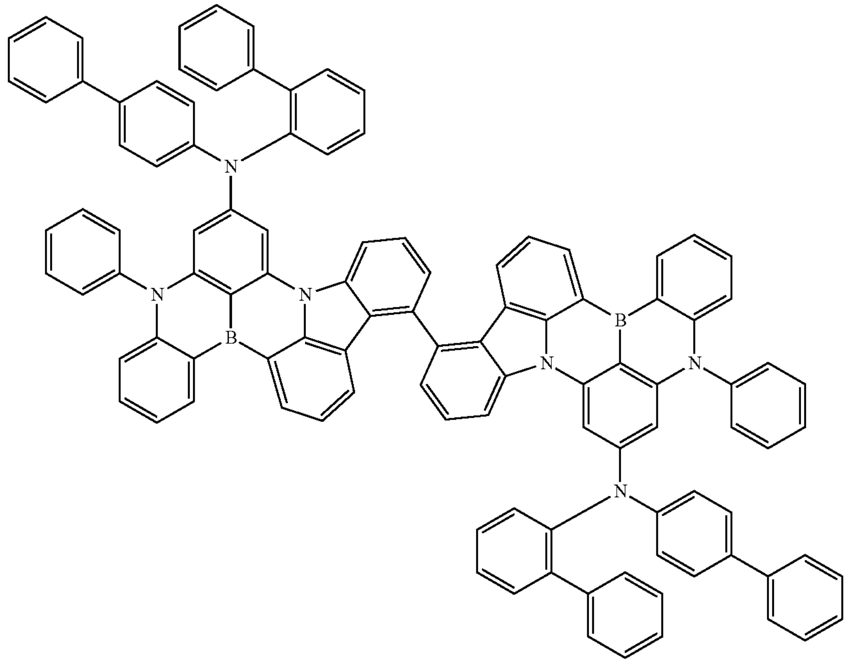

-continued
40
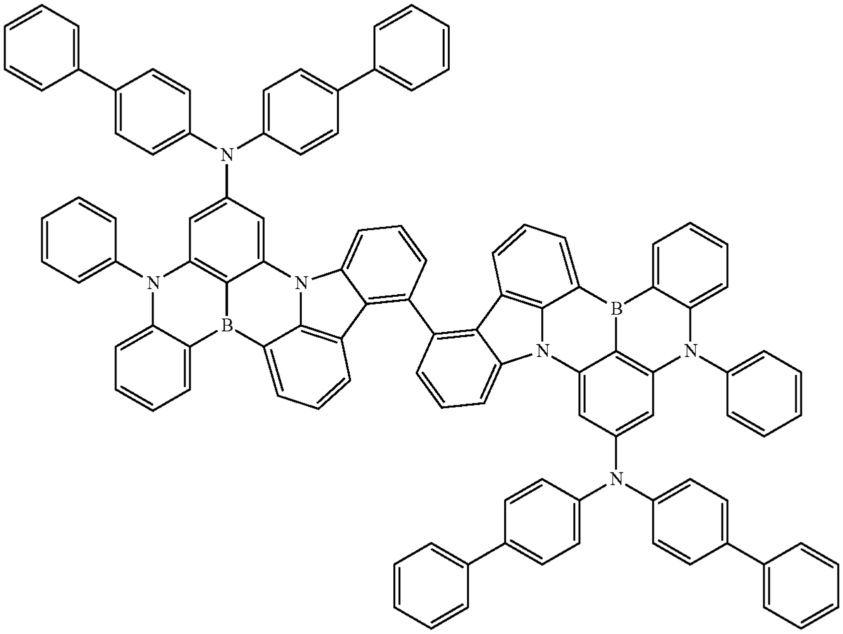
41
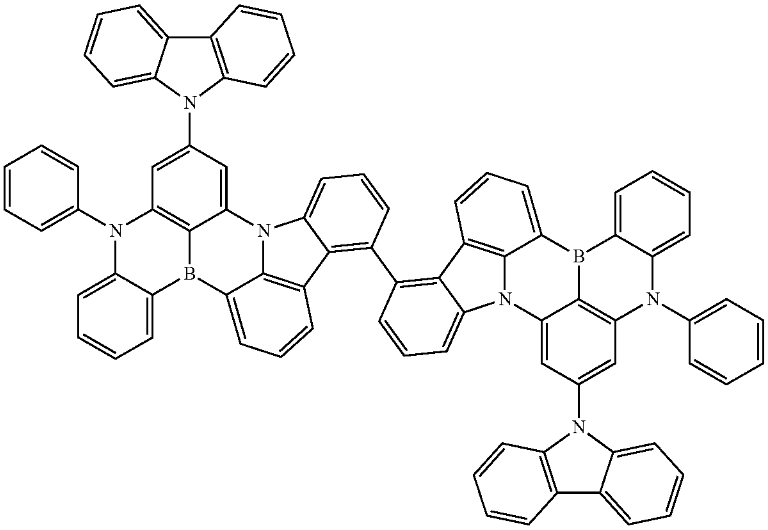

-continued
42
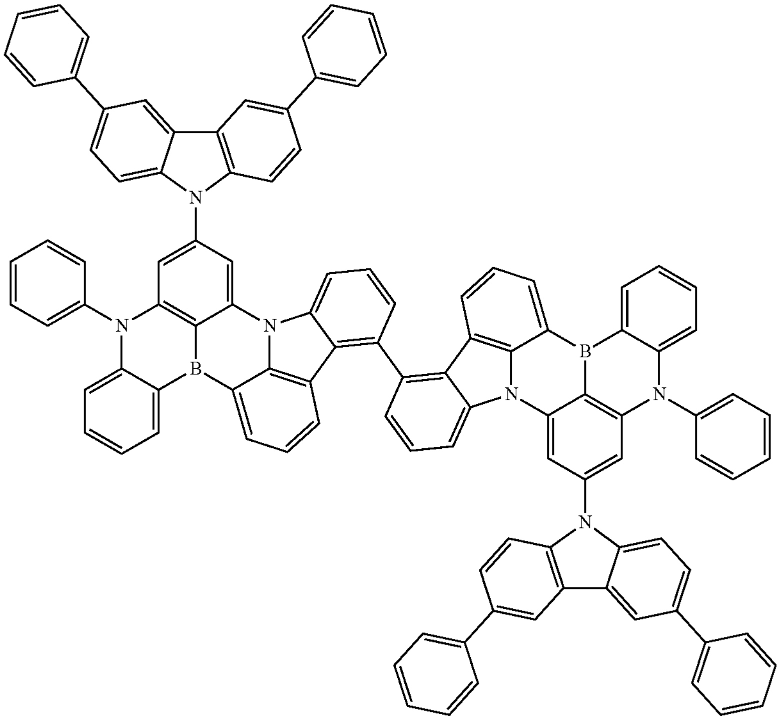
43
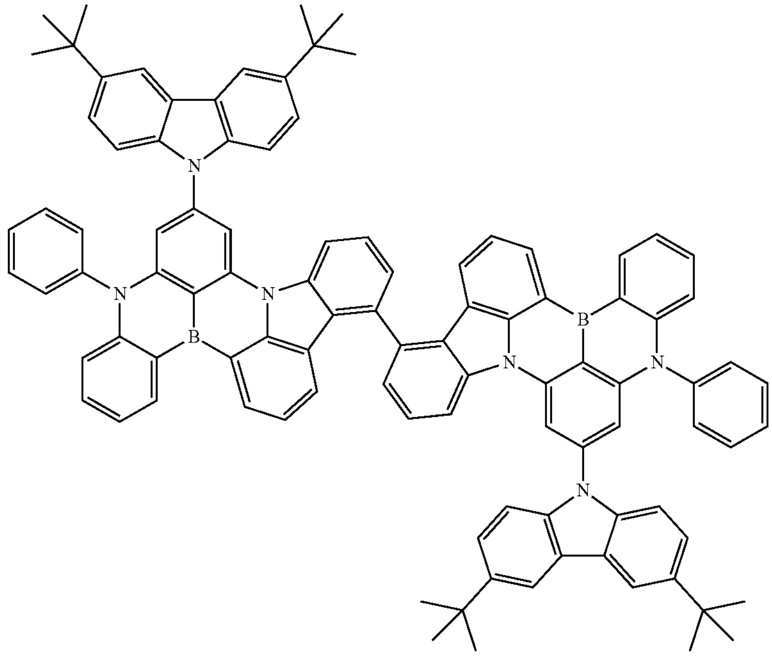

-continued
44
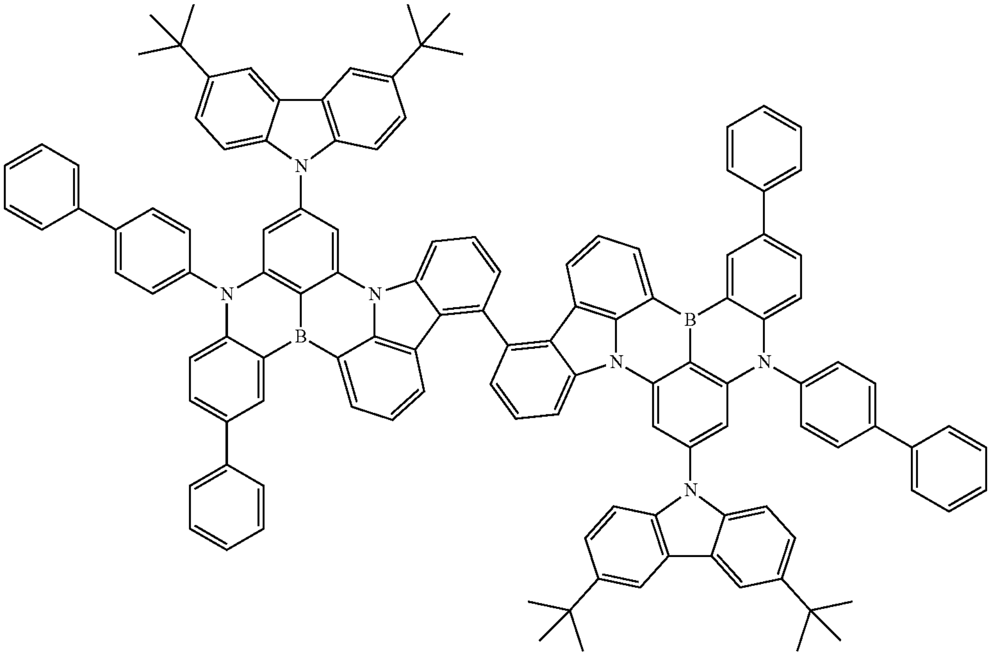
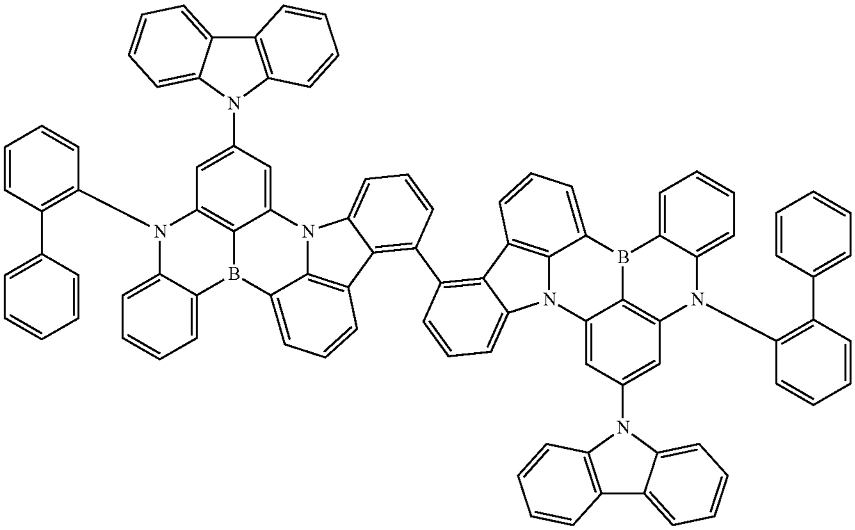
46
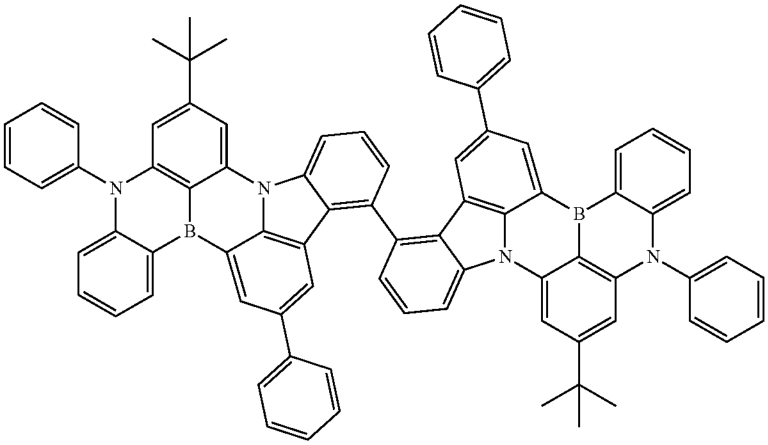

-continued
47
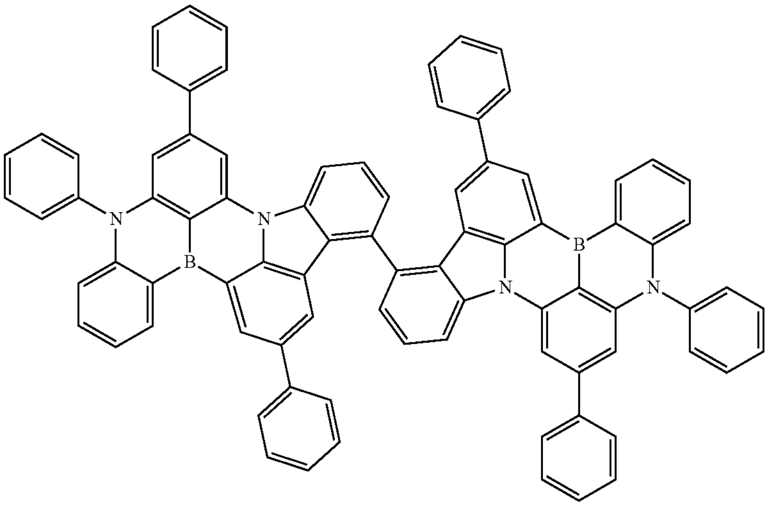
48
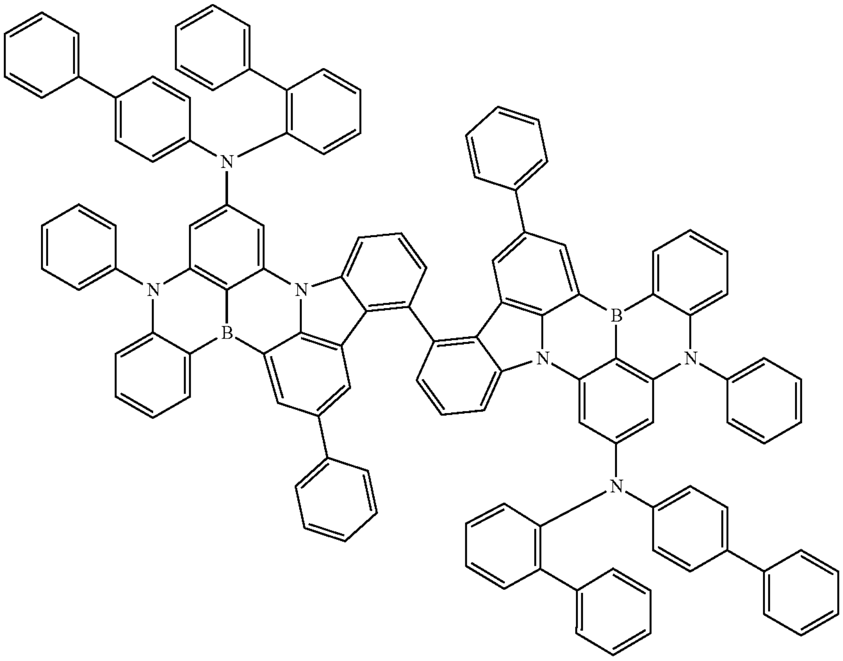

-continued
49
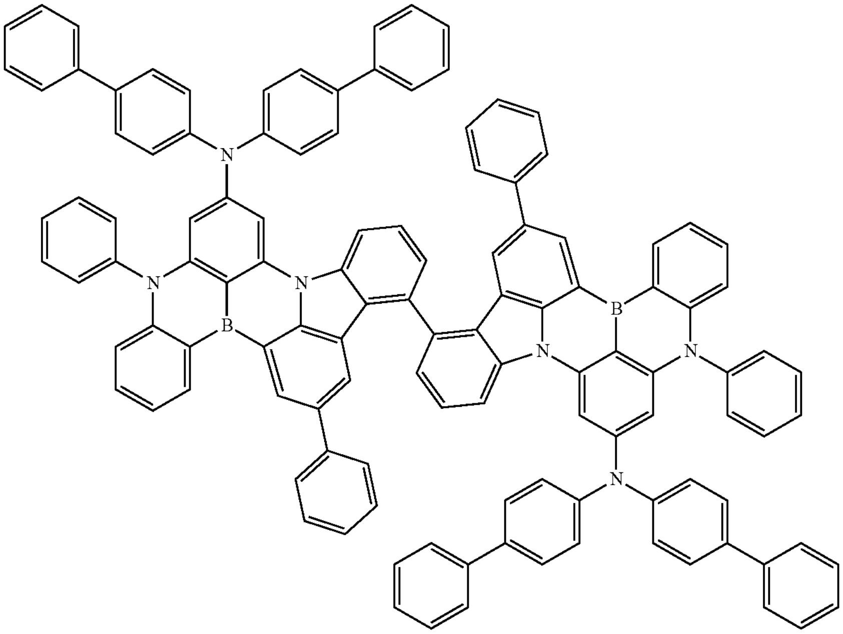
50
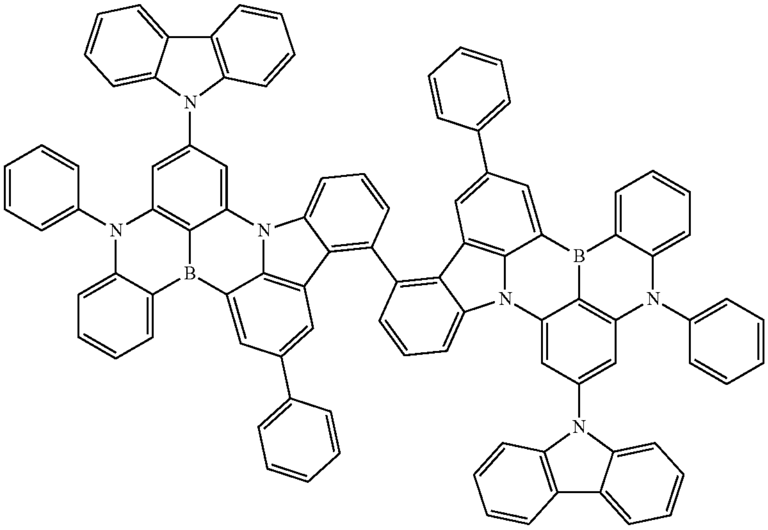

-continued
51
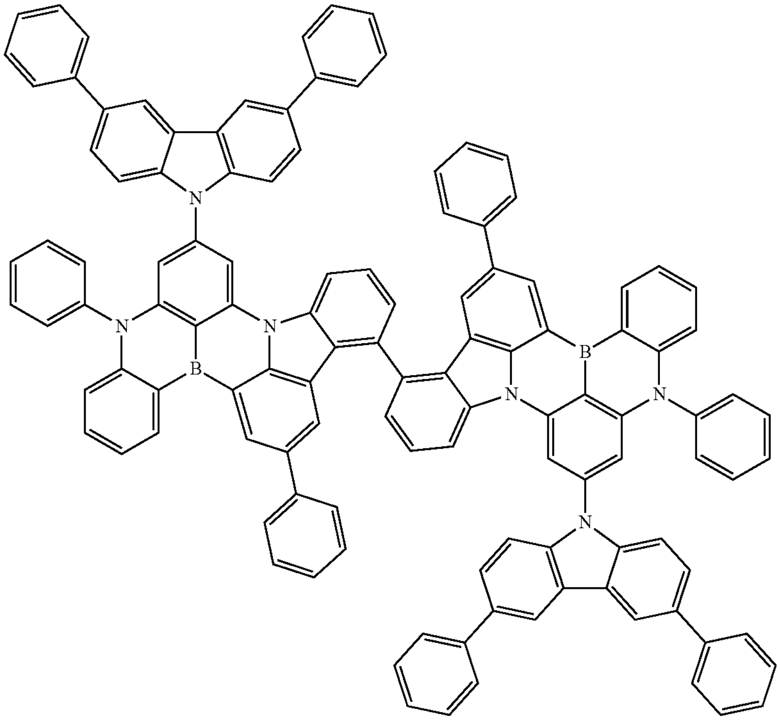
52
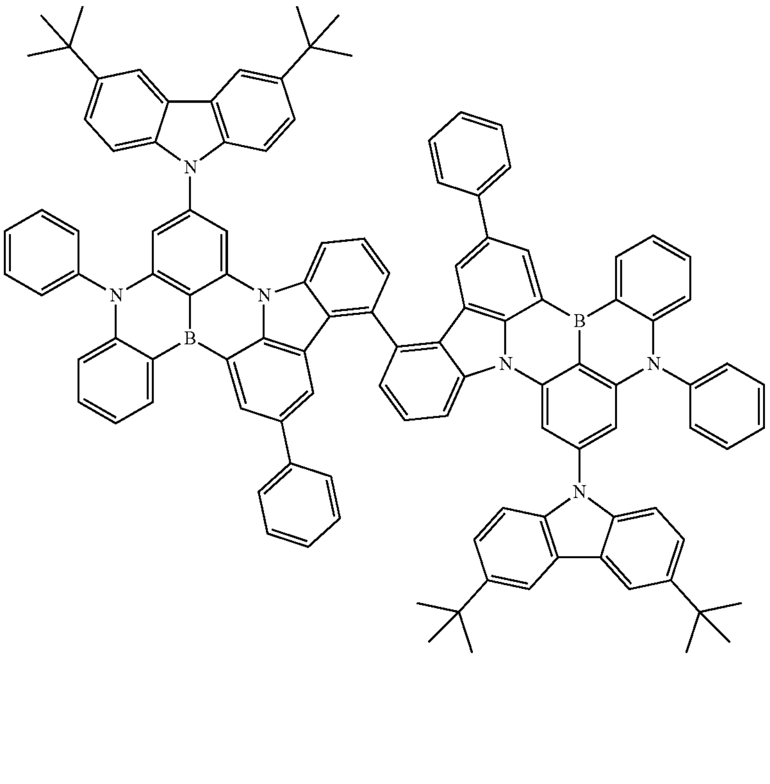

-continued
53
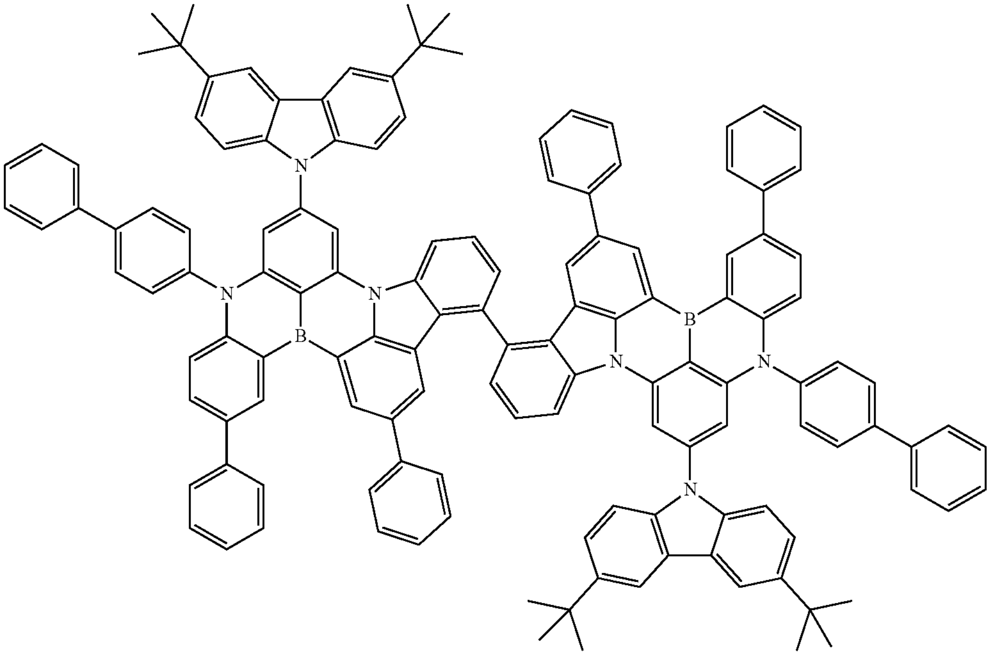
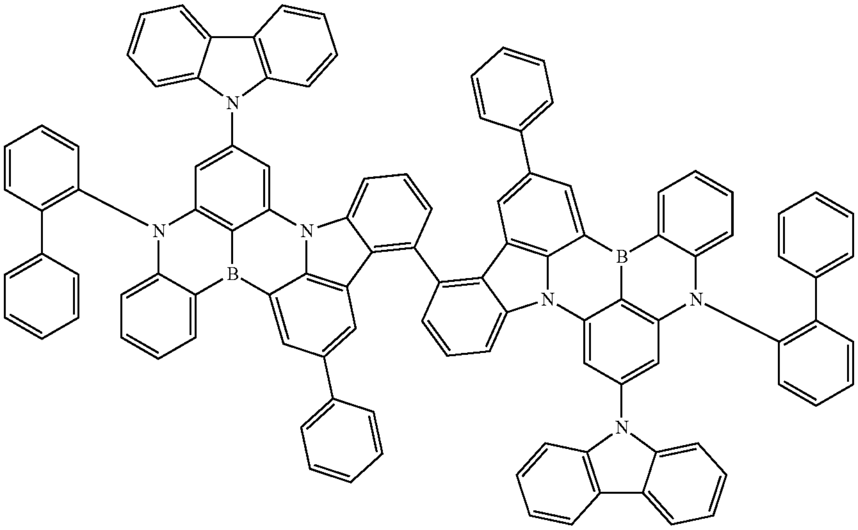
55
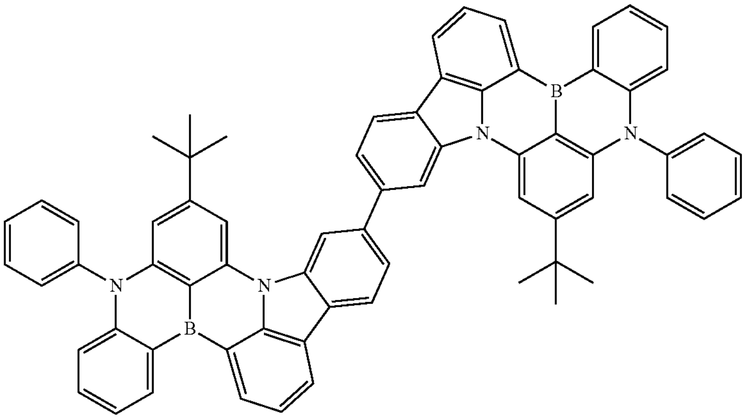

-continued
56
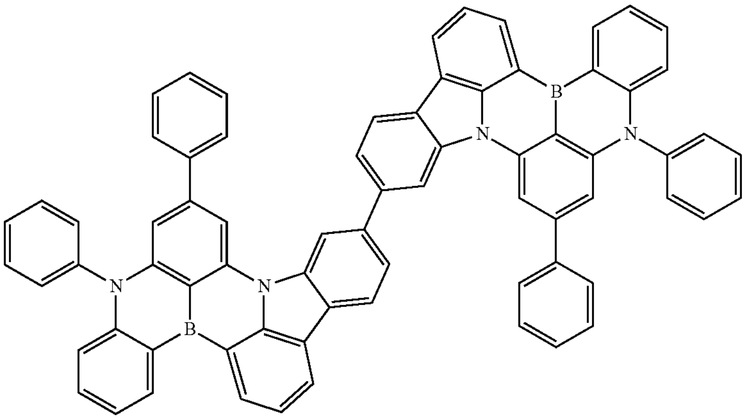
57
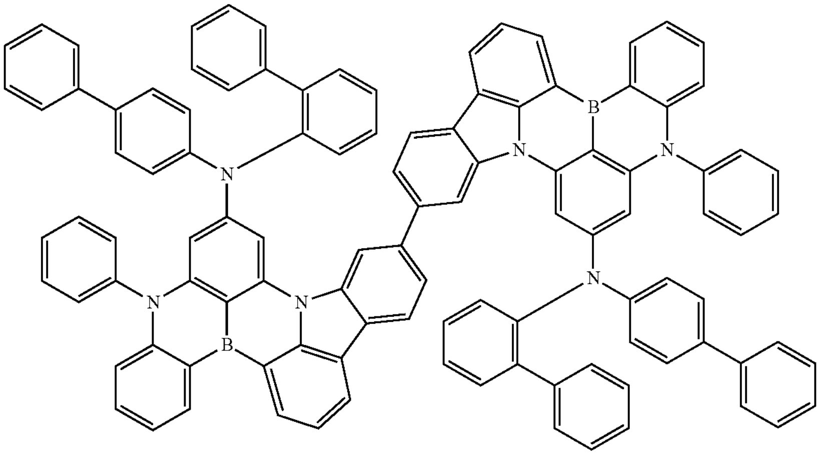
58
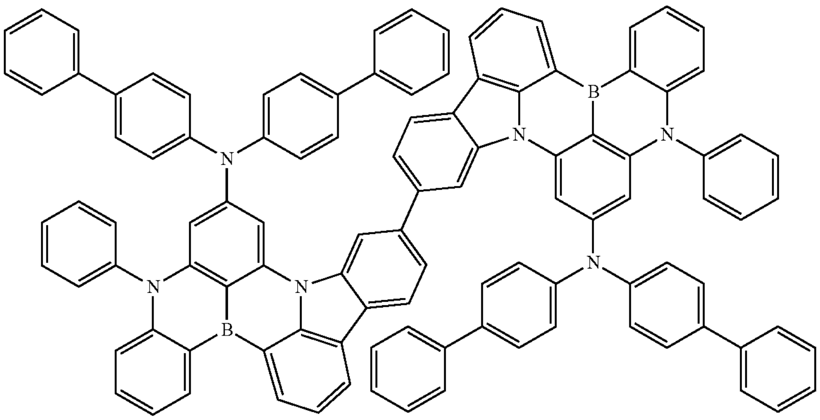

-continued
59
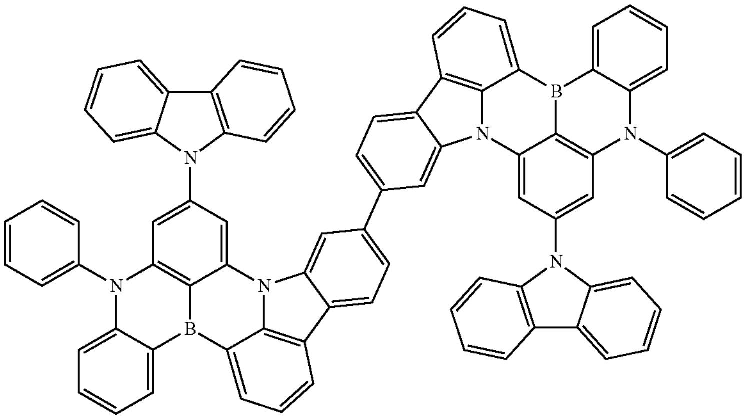
60
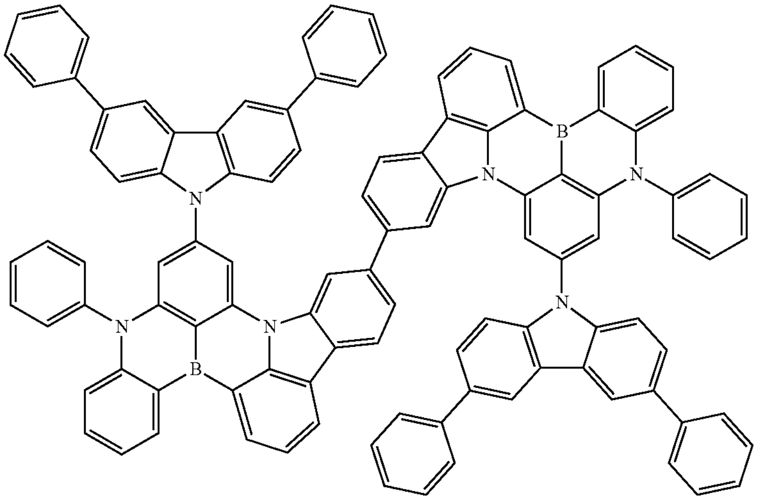
61
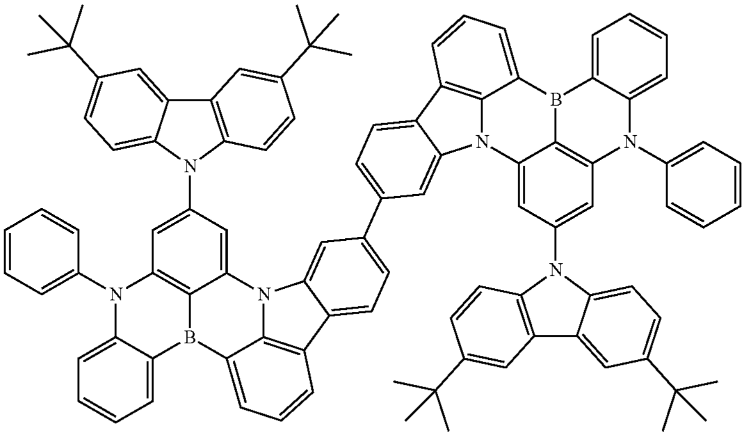

-continued
62
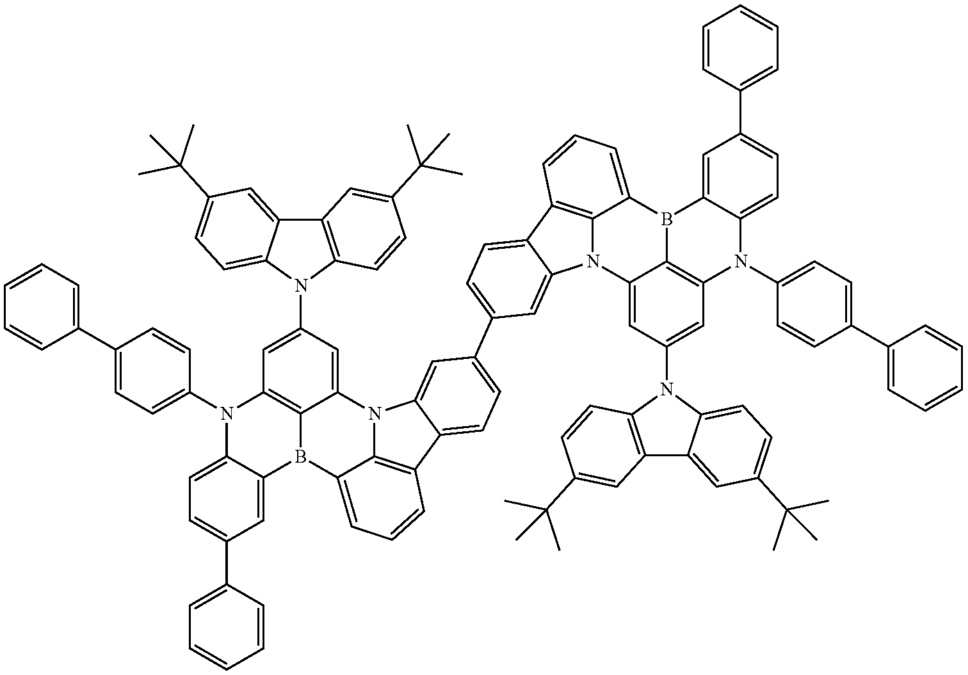
63
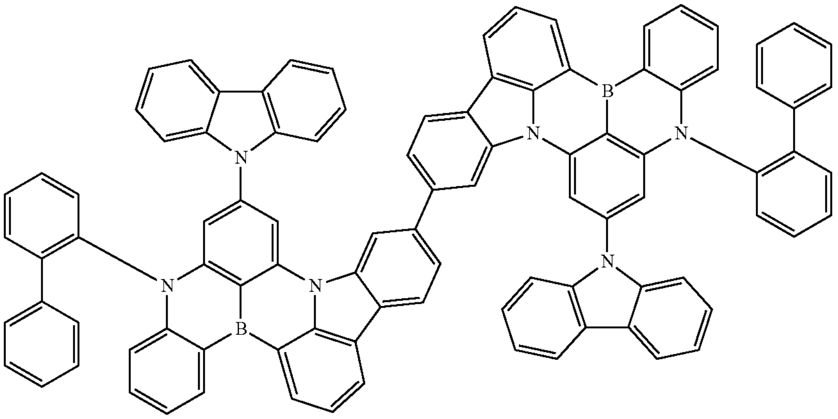

-continued
64
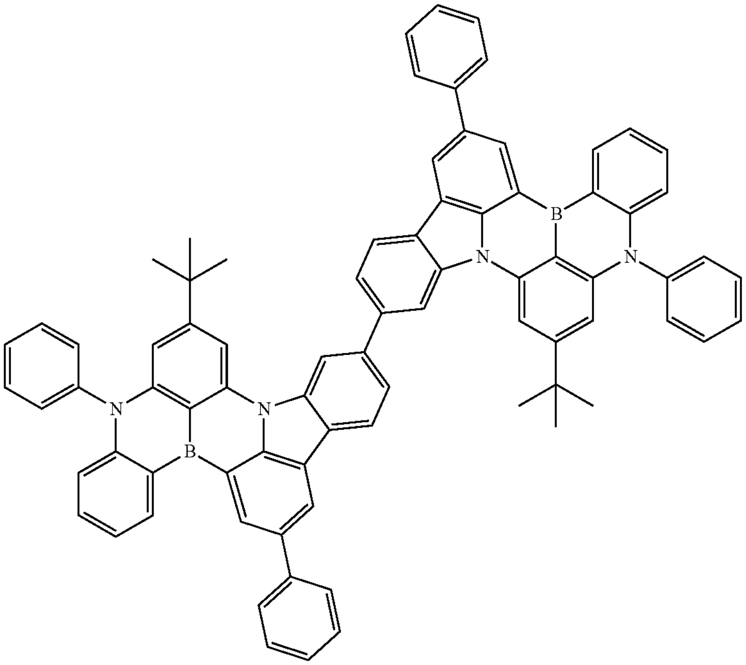
65
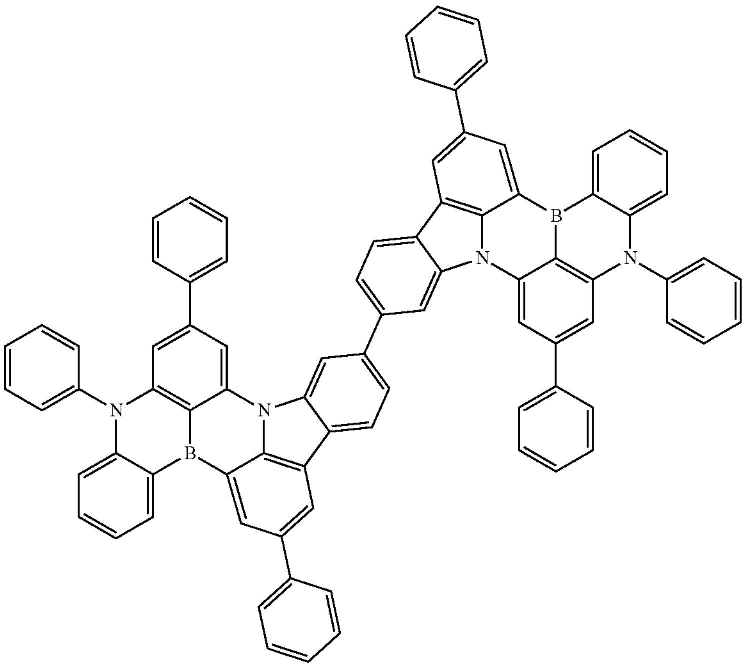

-continued
66
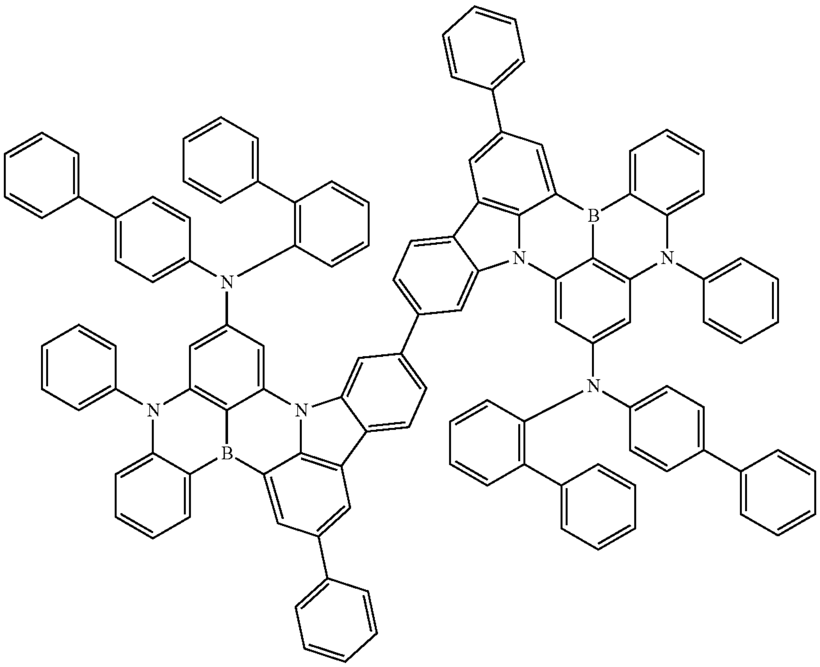
67
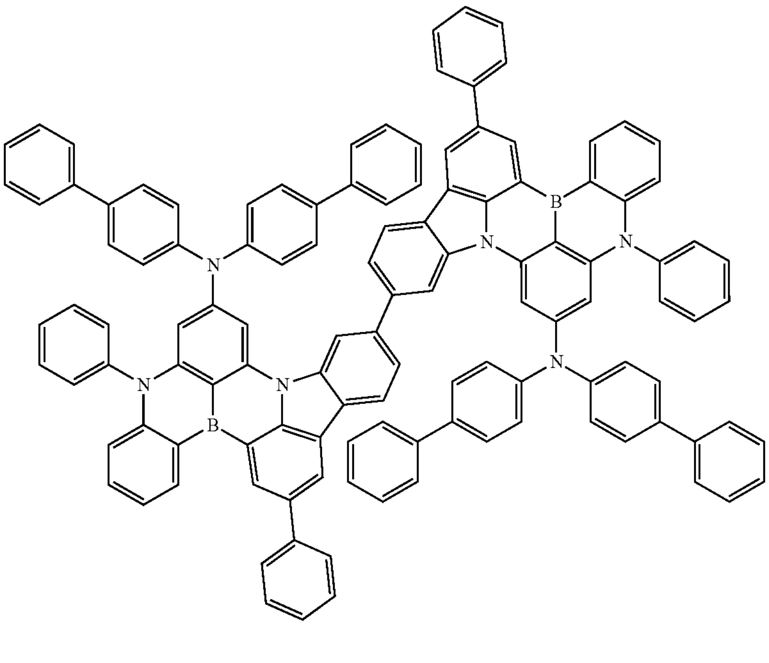

-continued
68
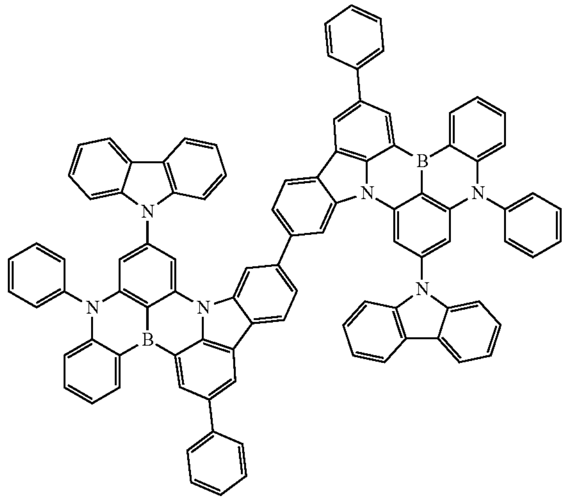
69
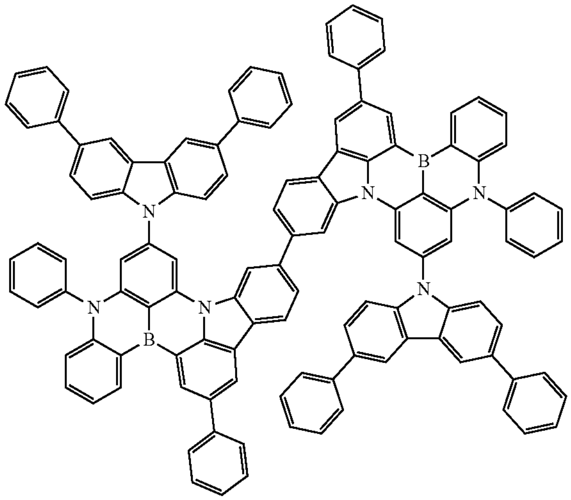
70
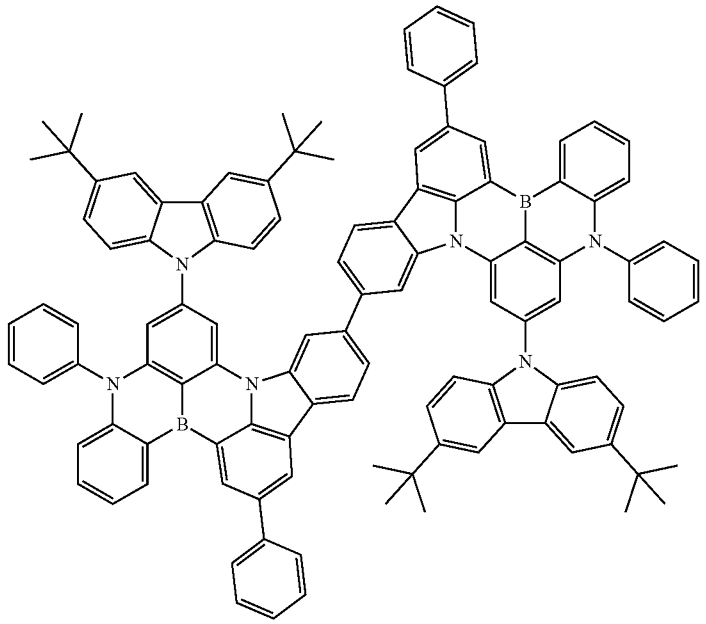

-continued
71
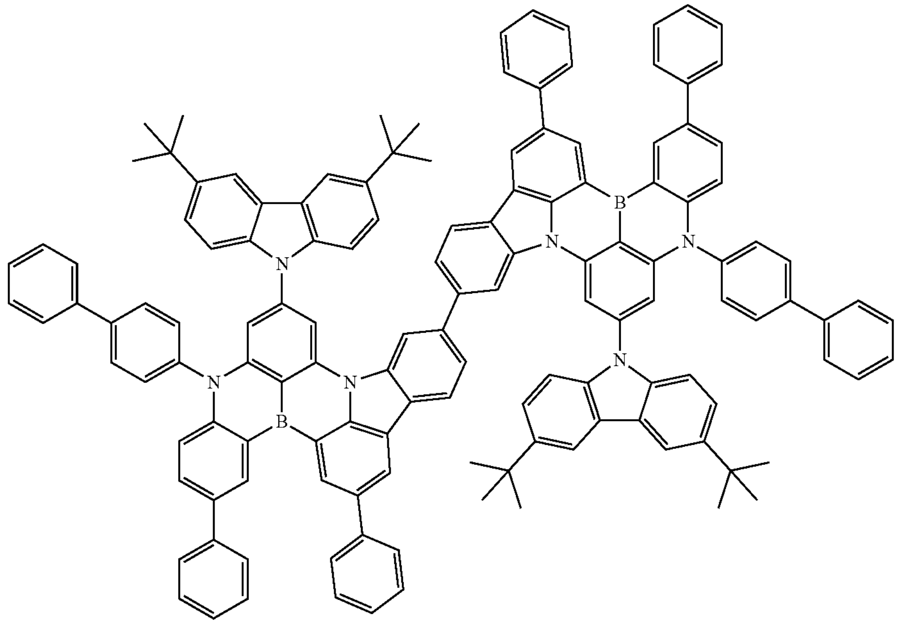
72
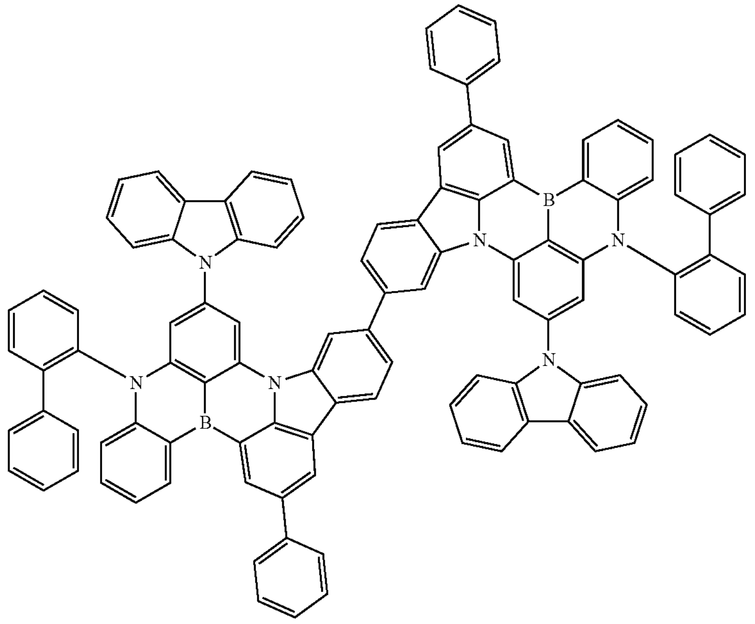

-continued
73
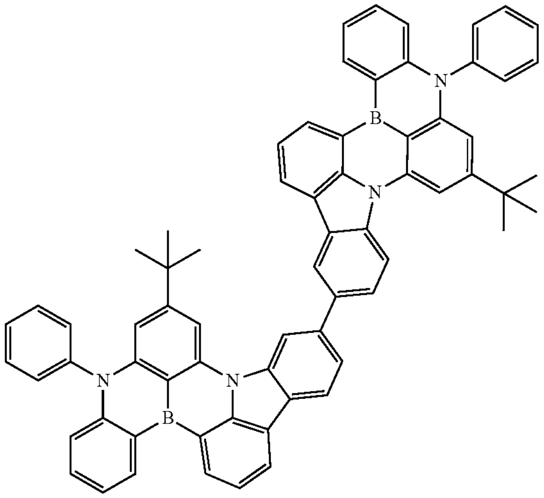
74
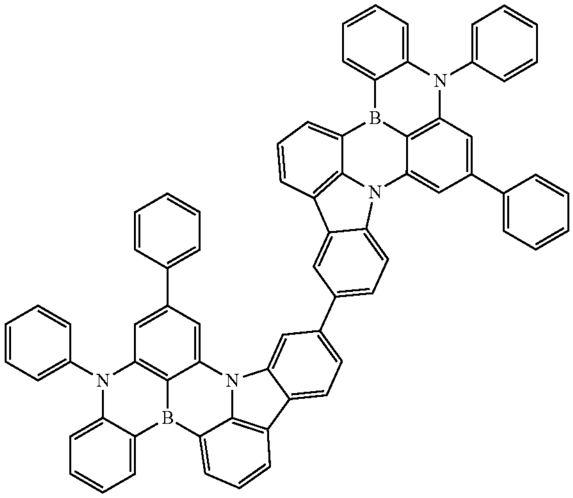
75
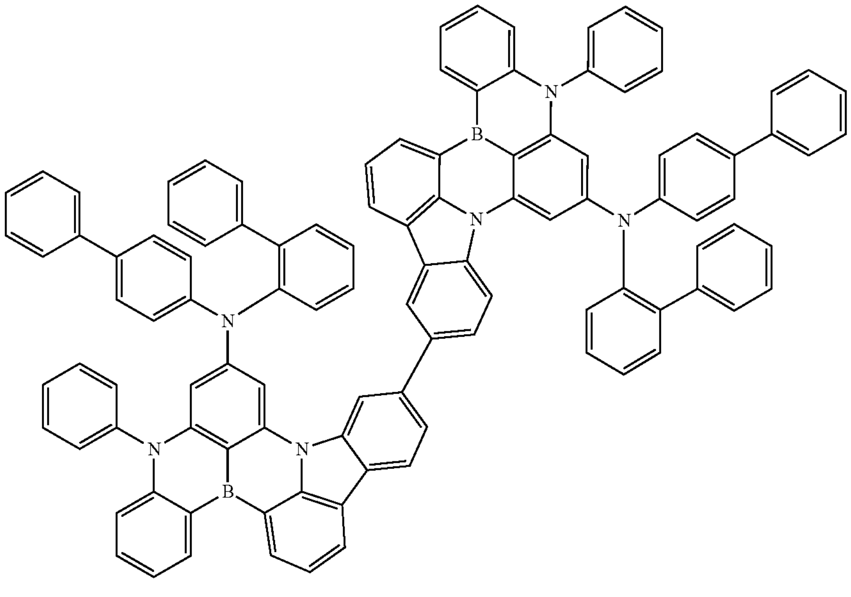

-continued
76
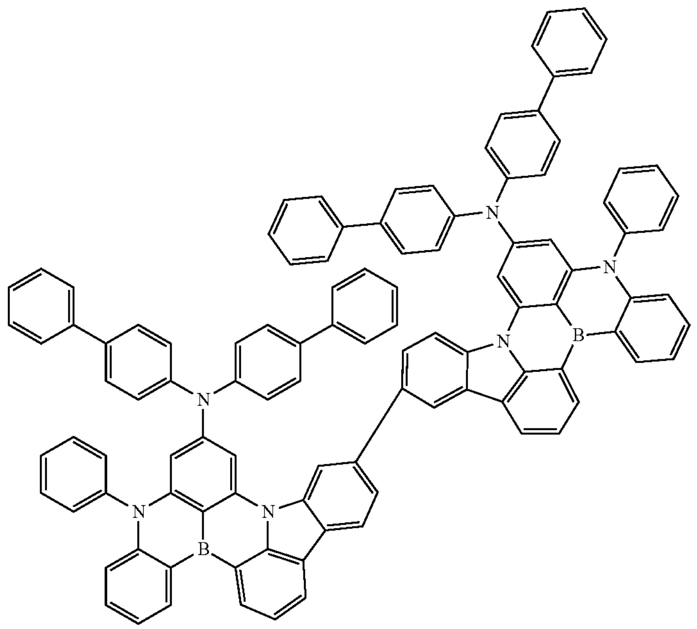
77
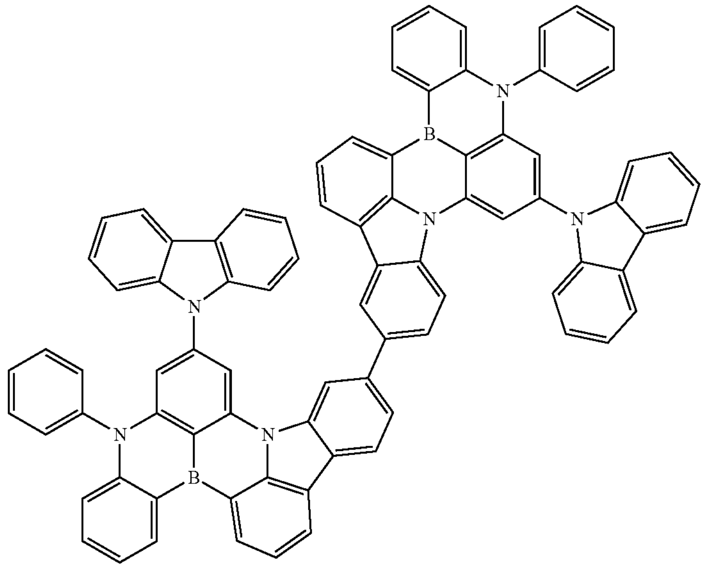

-continued
78
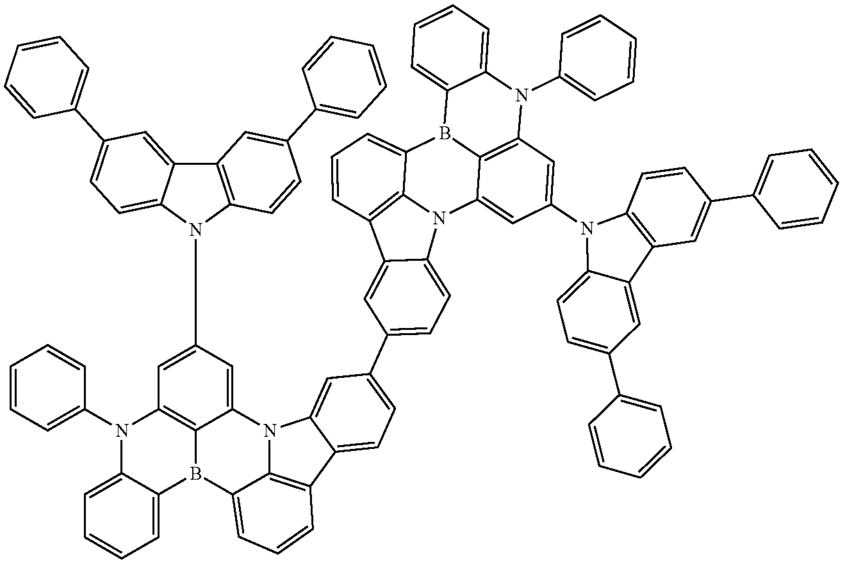
79
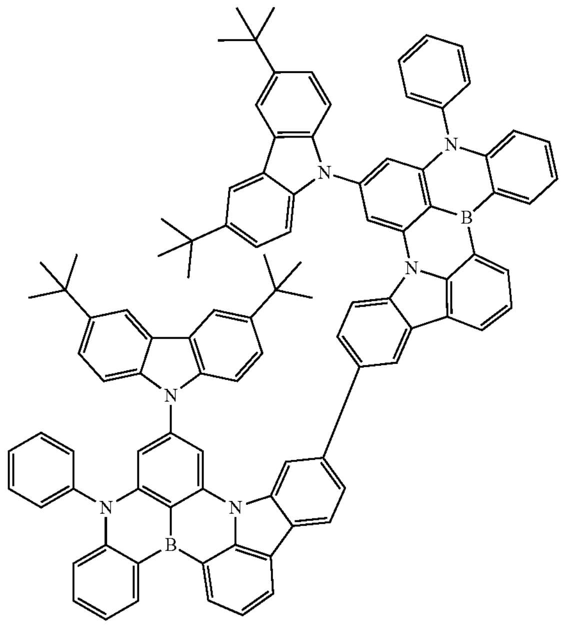
80
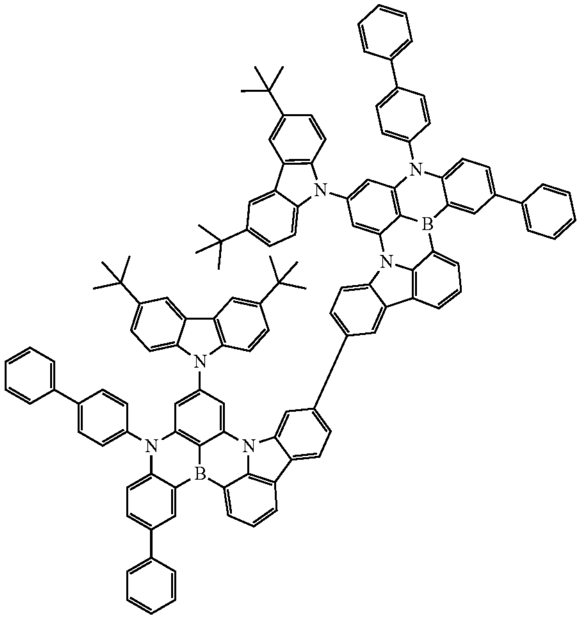

-continued
81
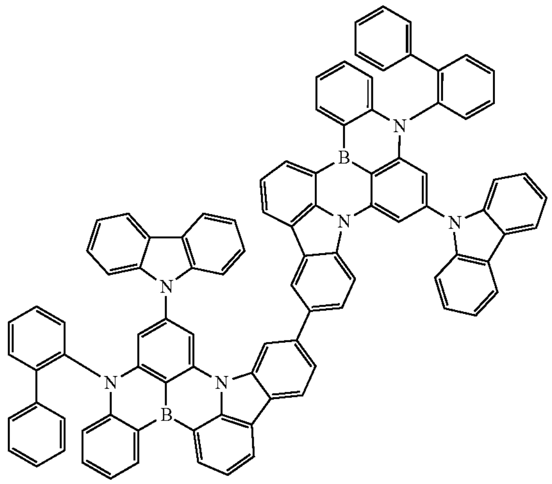
82
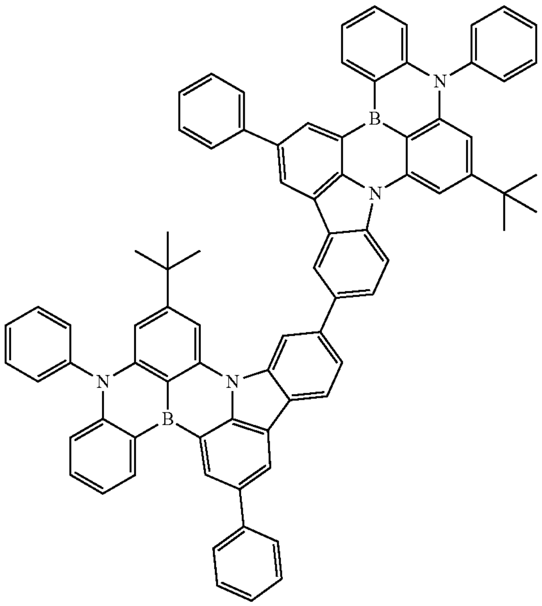
83
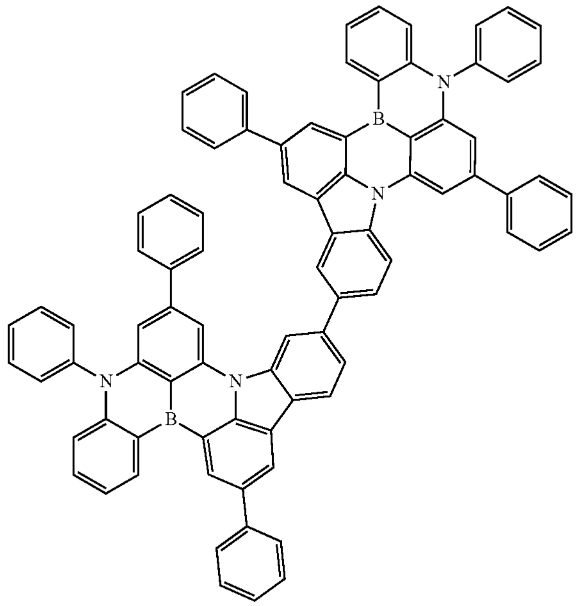

-continued
84
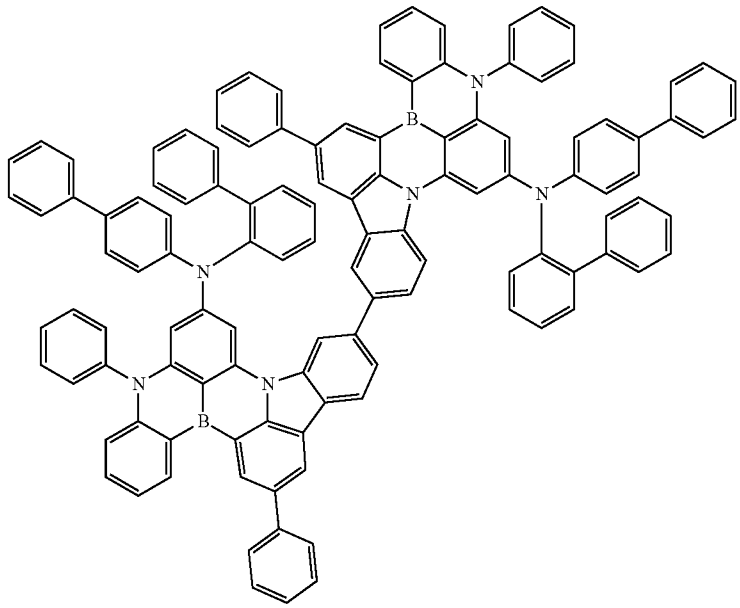
85
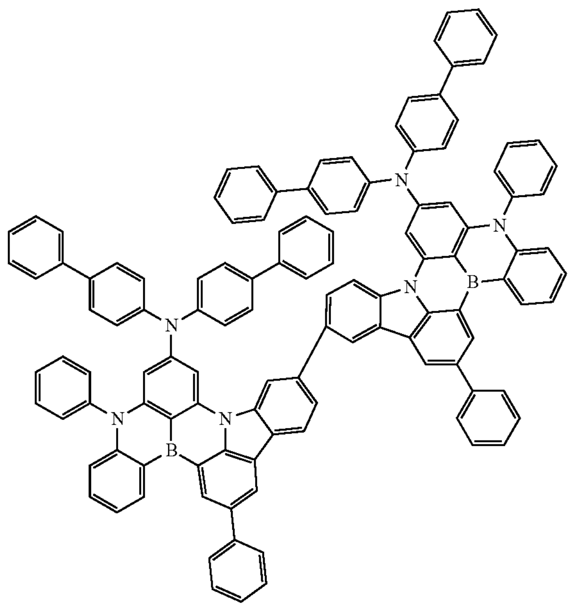
86
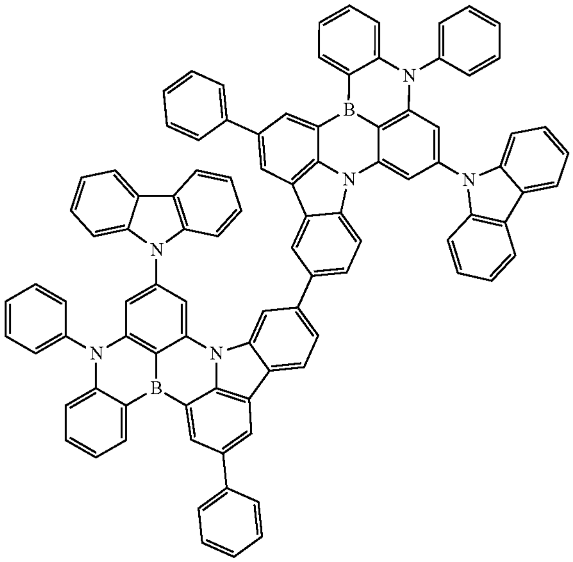

-continued
87
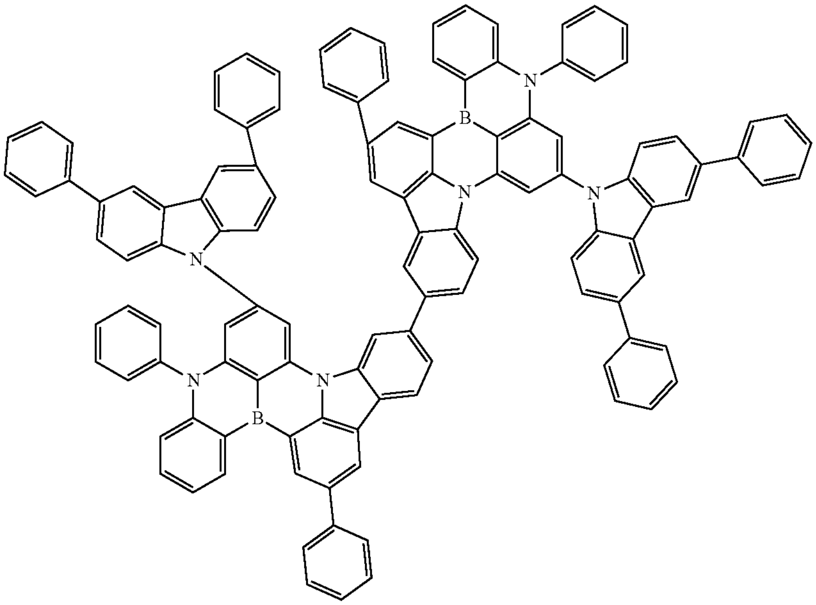
88
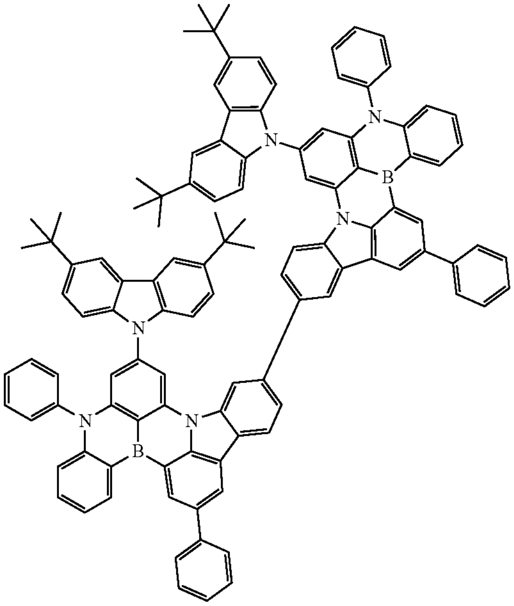
89
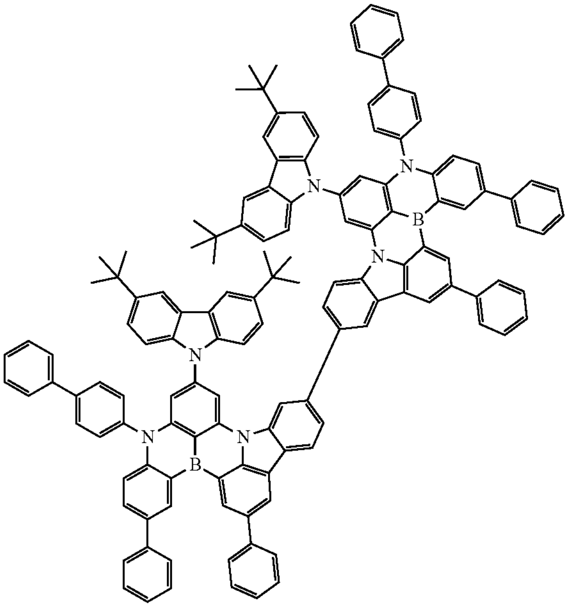

-continued
90
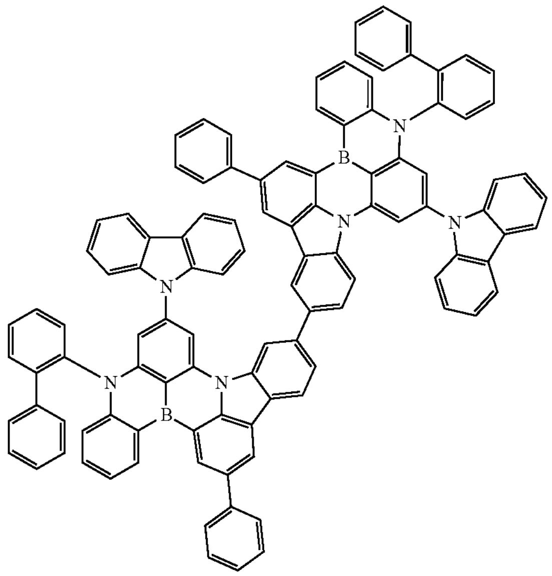
91
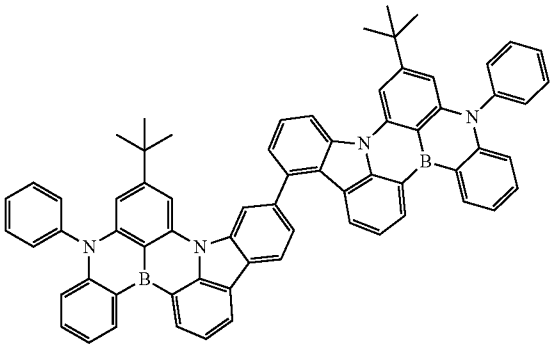
92
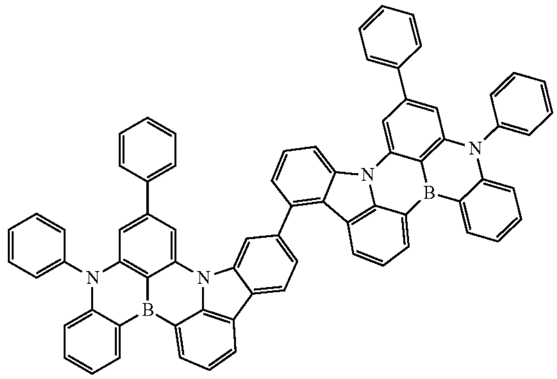
93
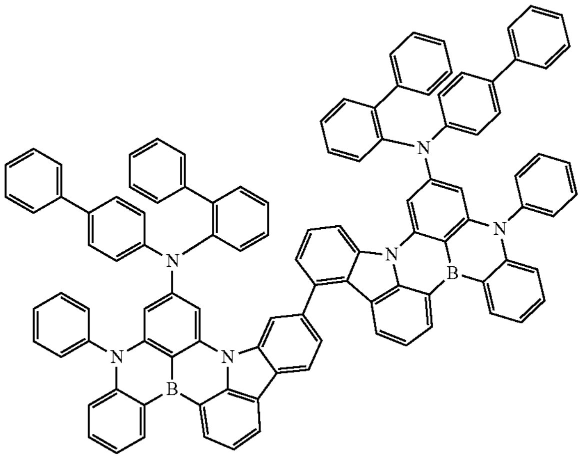
94
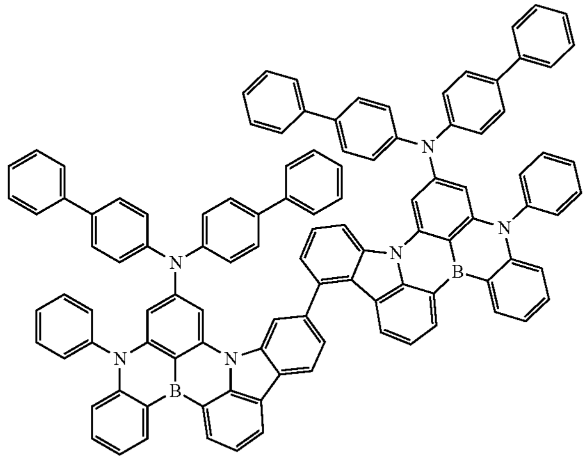
95
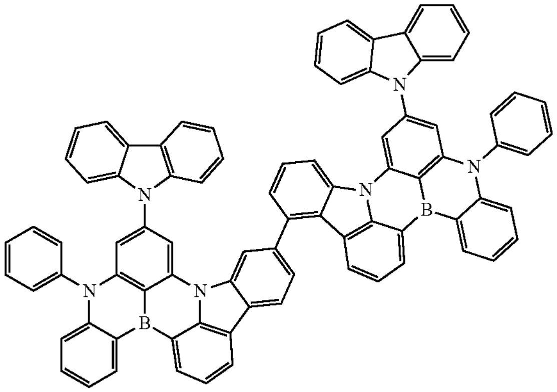

-continued
96
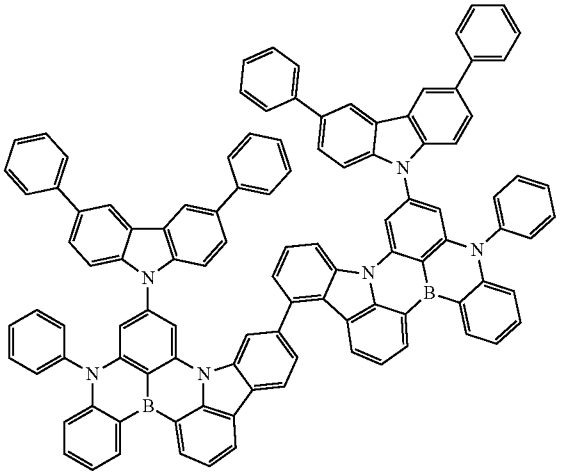
97
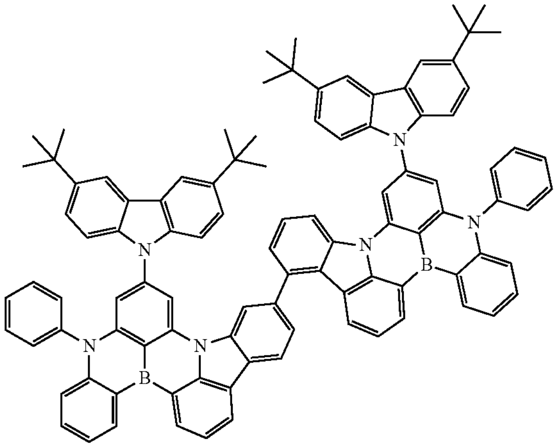
98
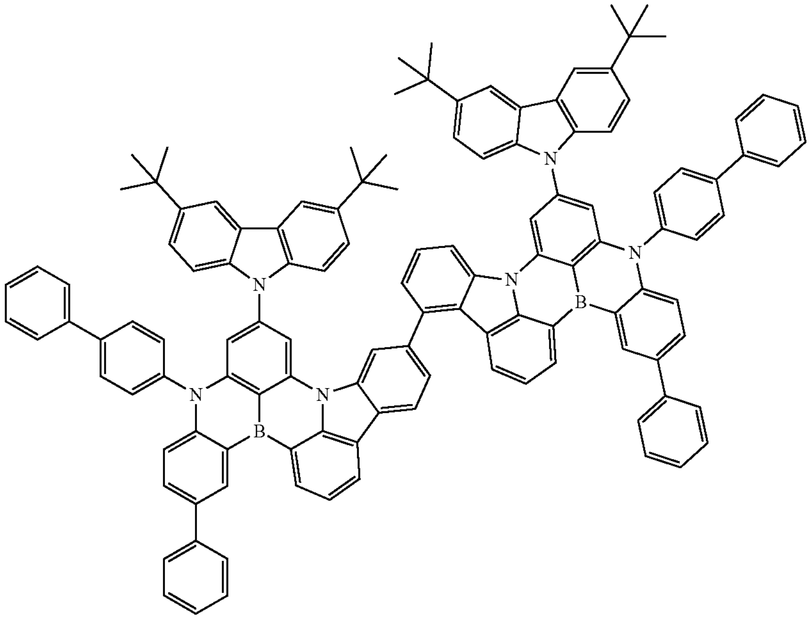
99
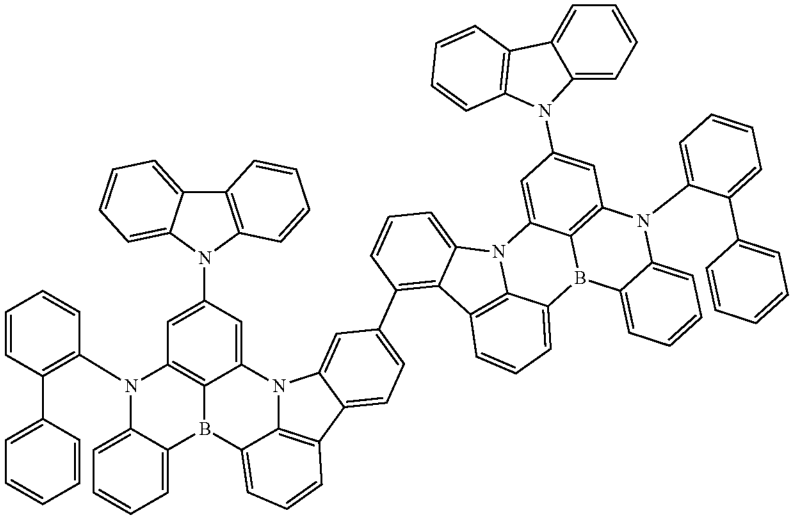

-continued
100
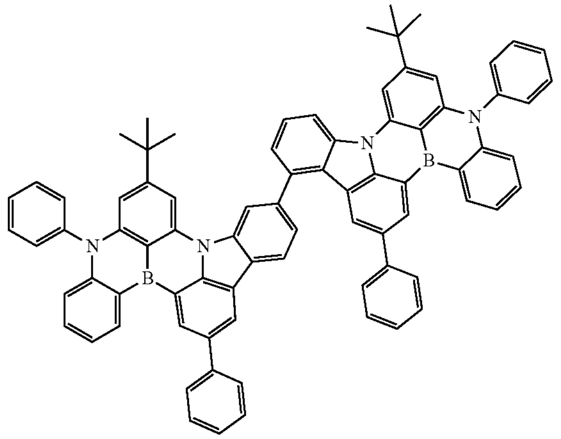
101
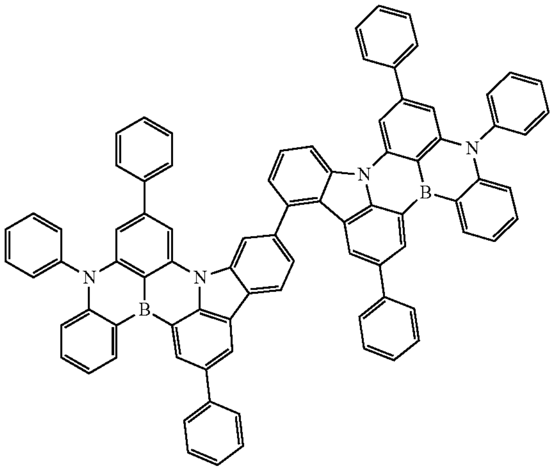
102
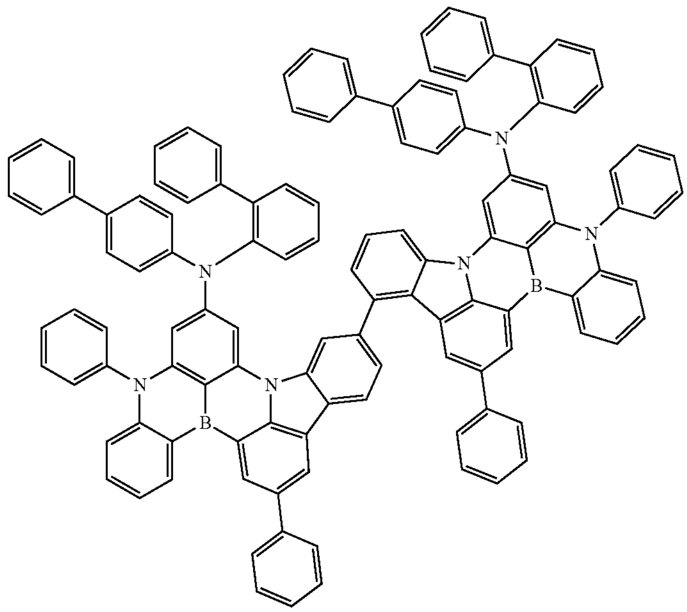

103
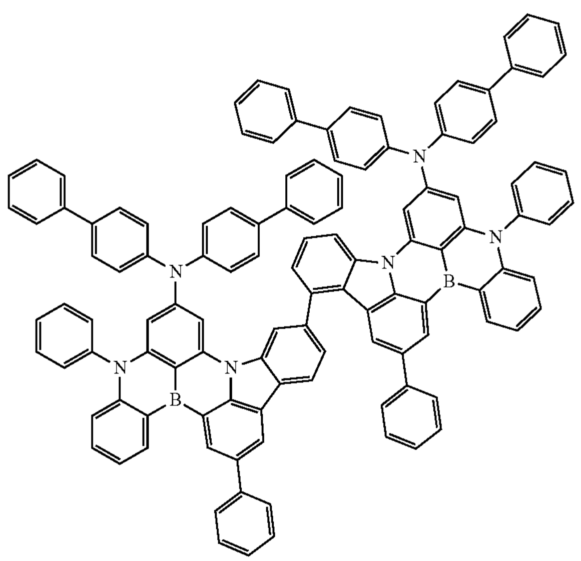
104
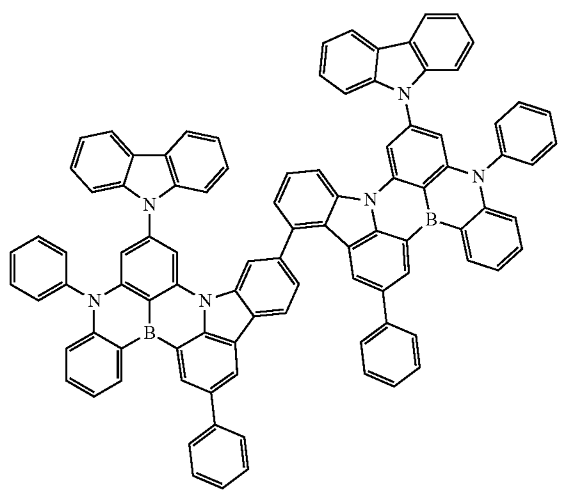
105
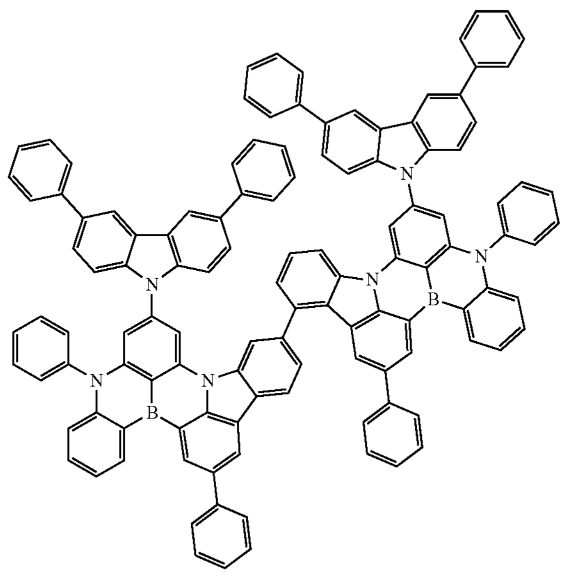
106
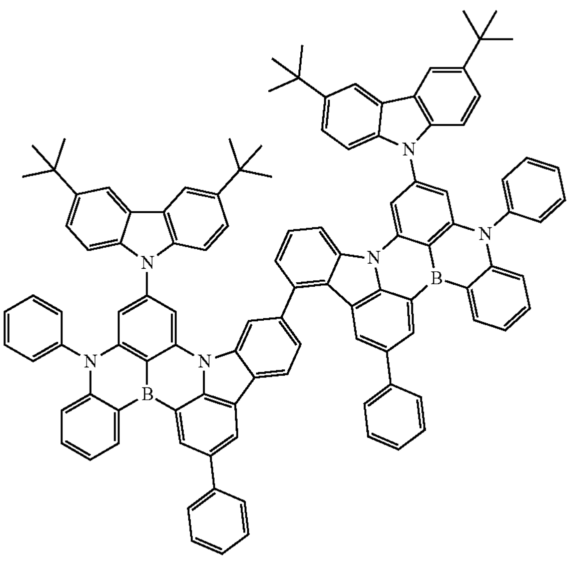

-continued
107
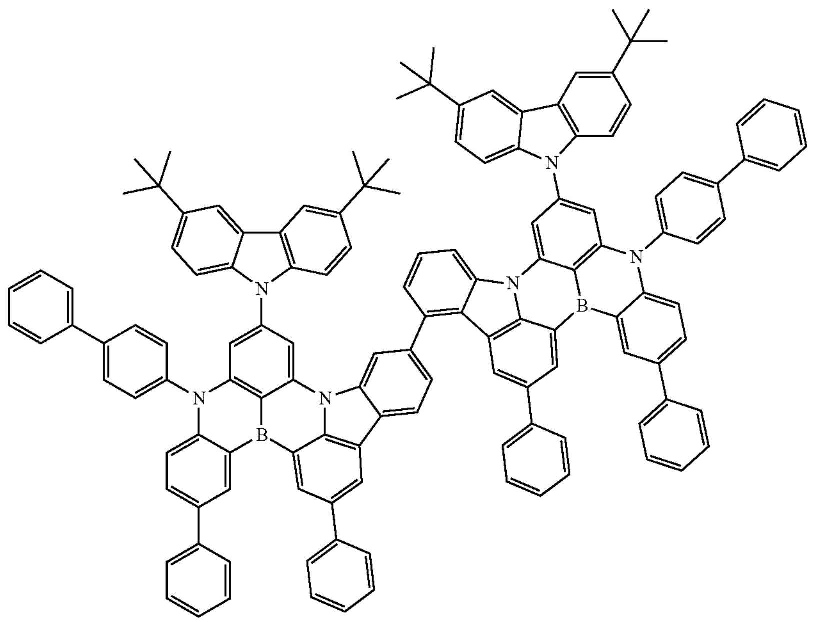
108
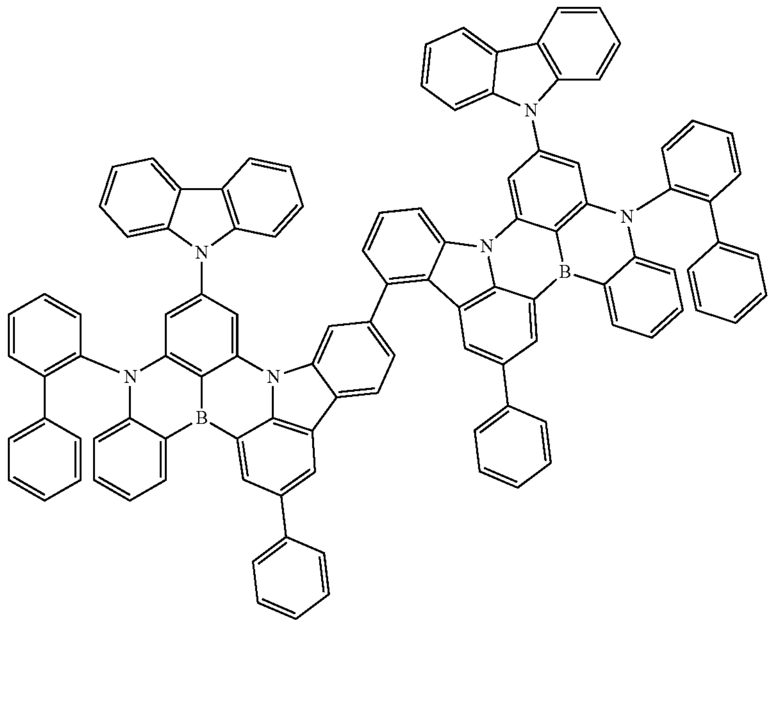

-continued
109
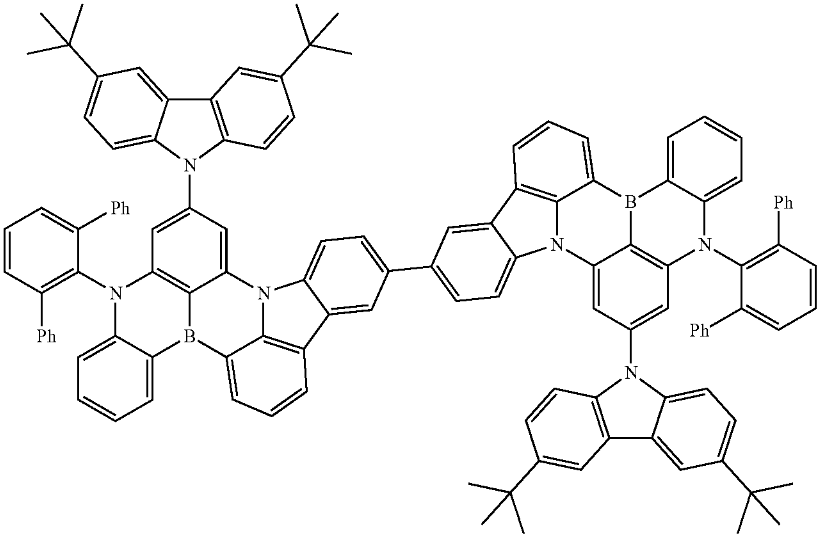
110
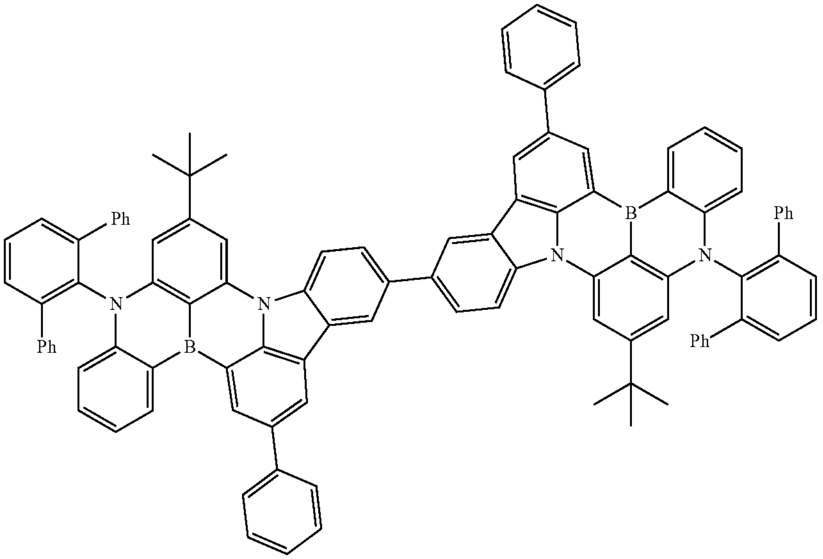
111
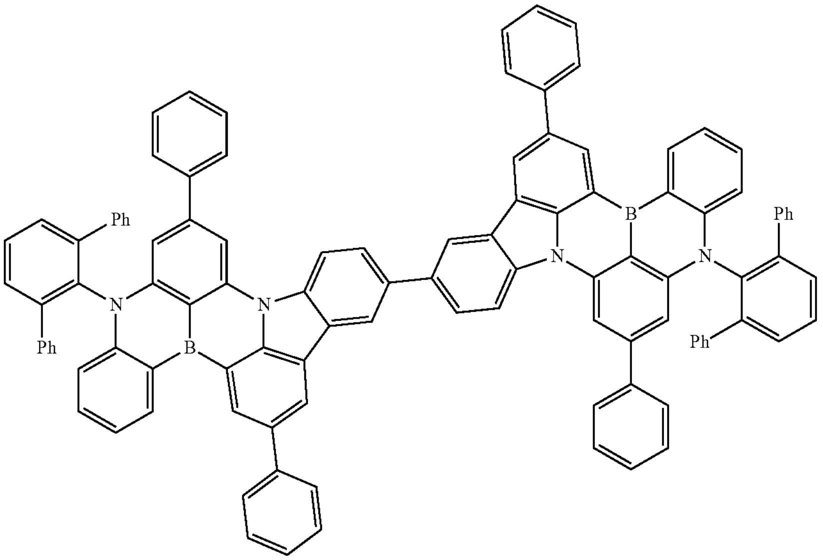

-continued
112
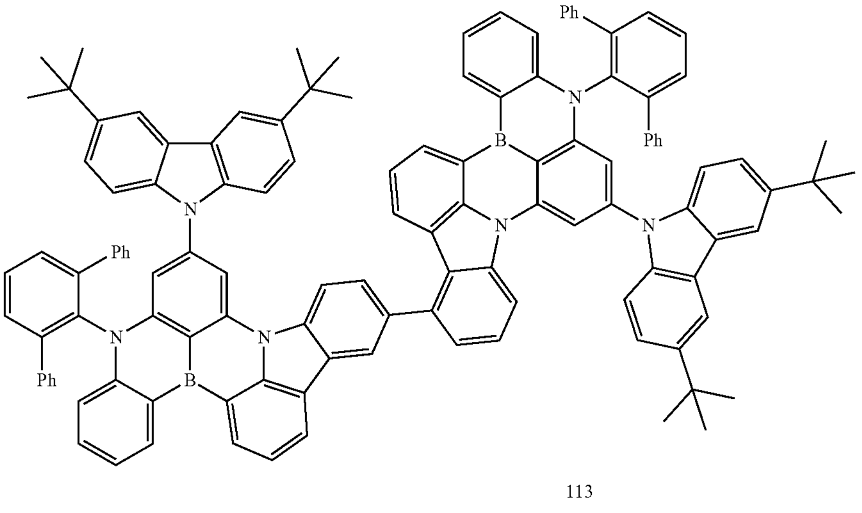
113
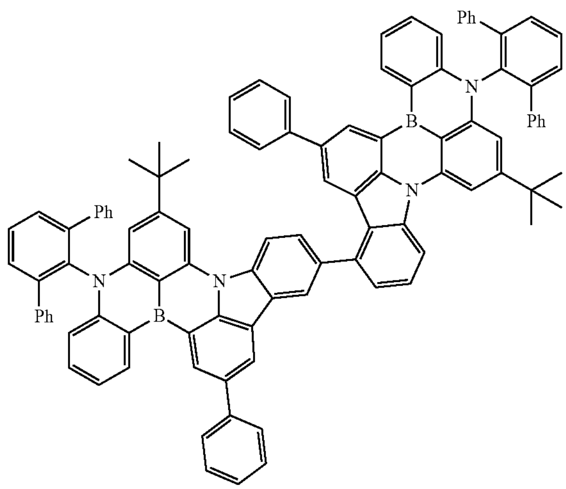
114
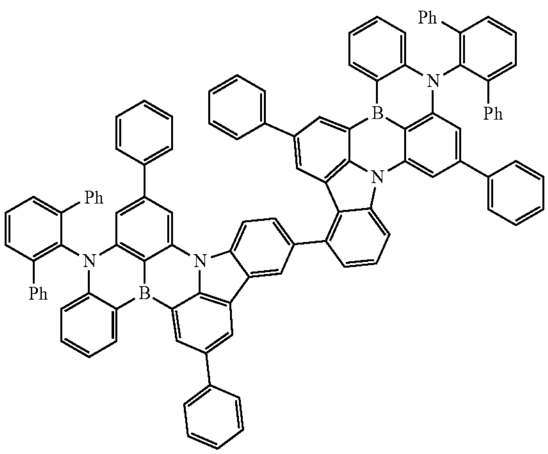
115
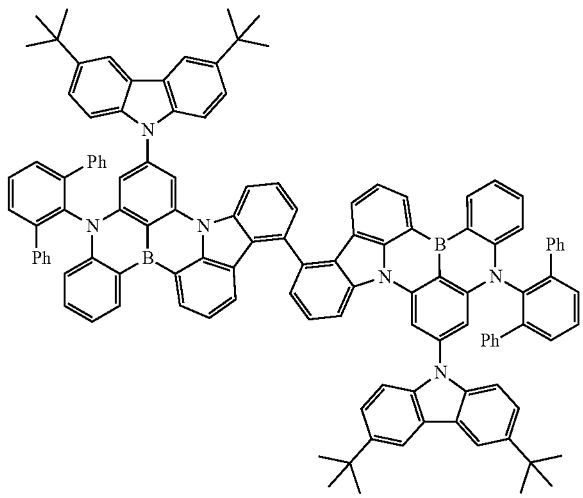
116
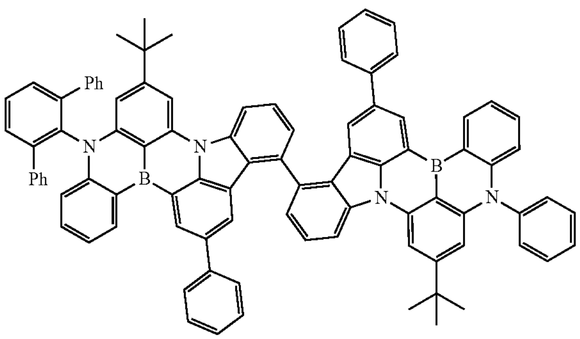

-continued
117
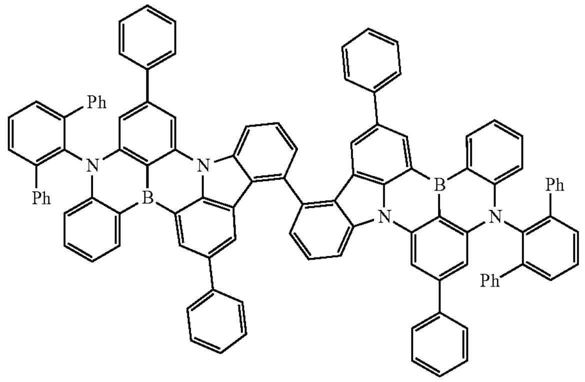
118
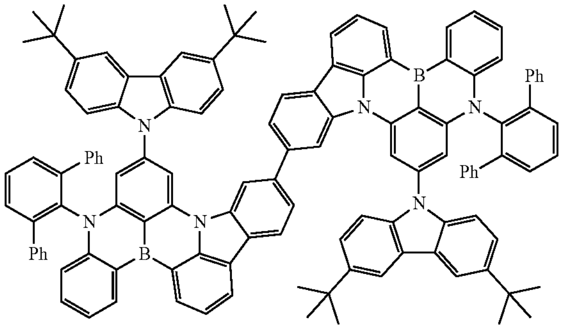
119
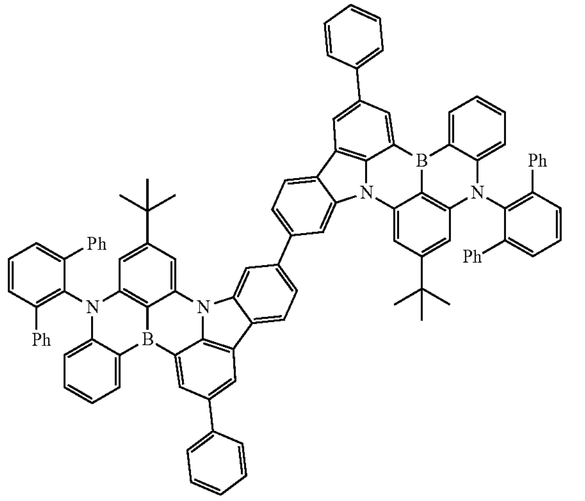
120
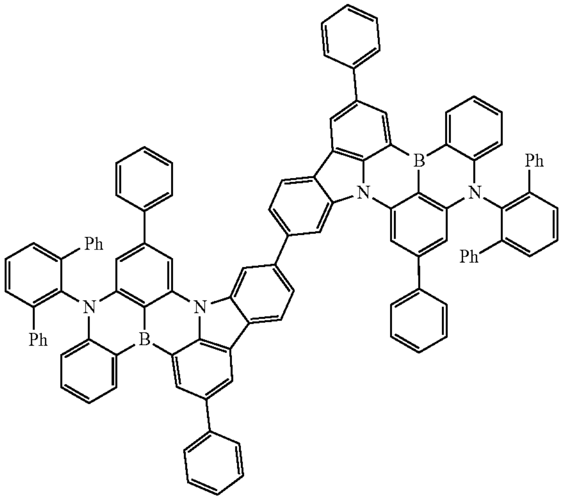
121
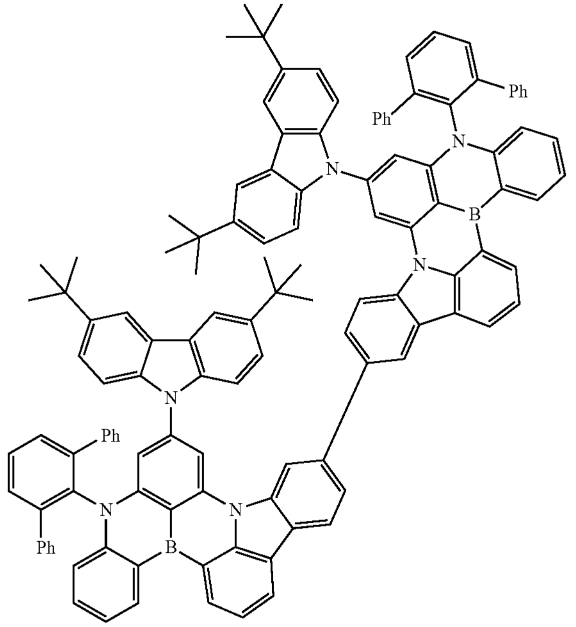
122
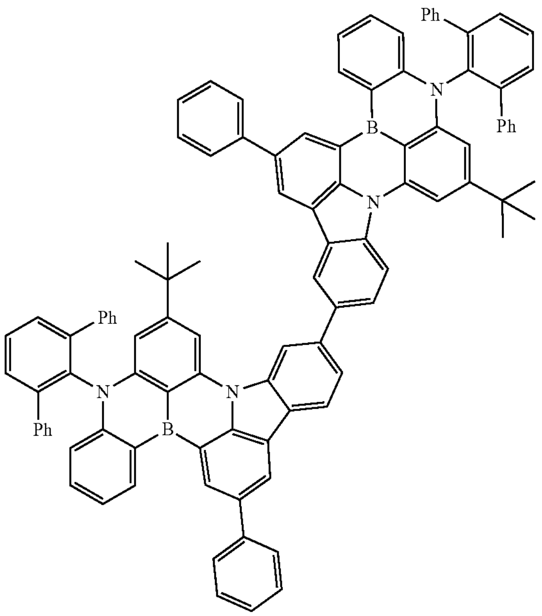

-continued
123
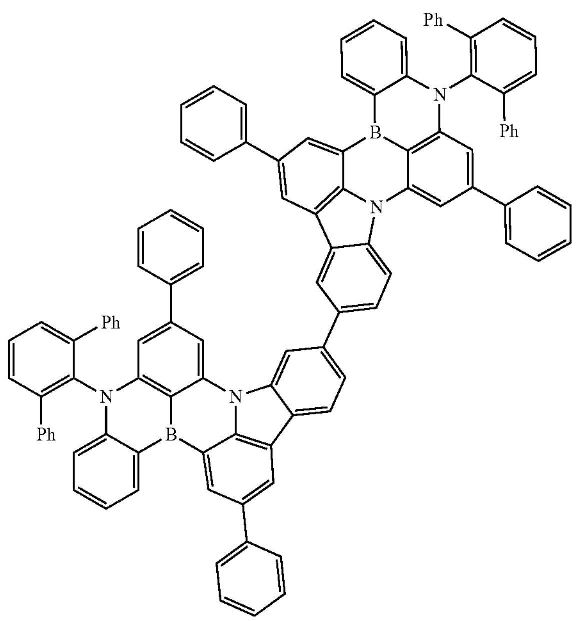
124
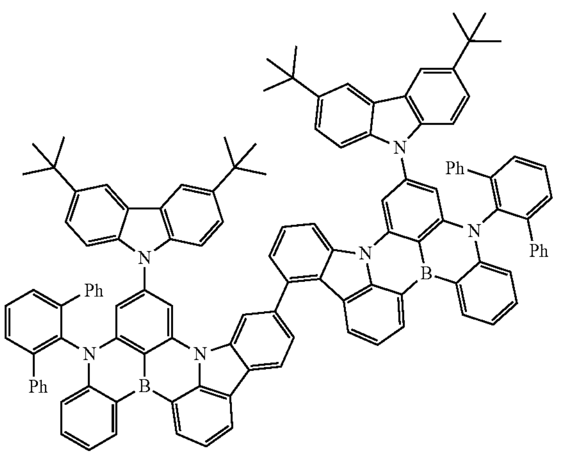
125
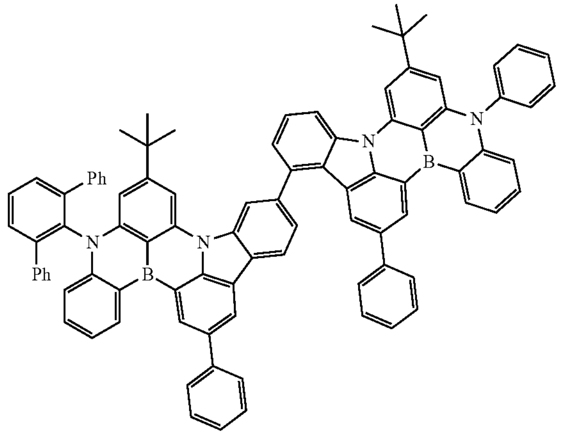
126
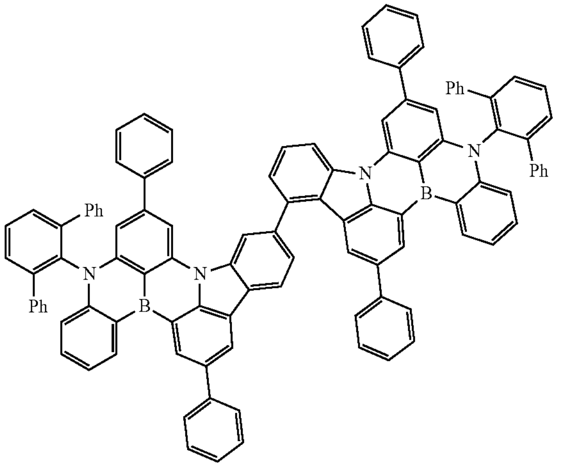
127
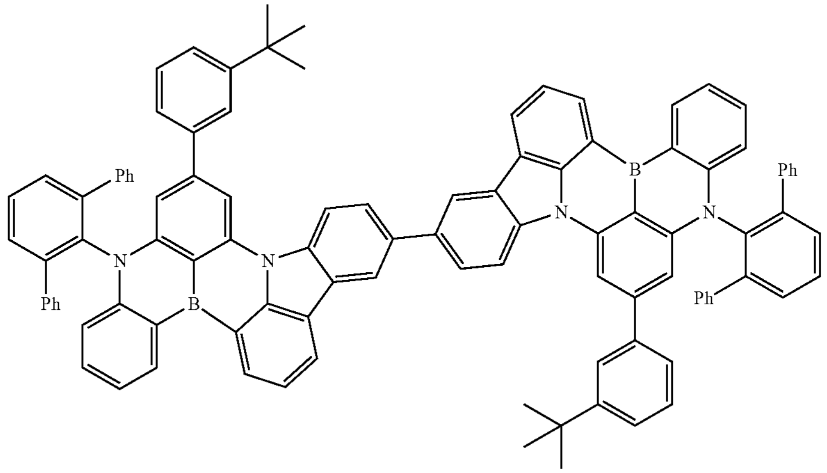

-continued
128
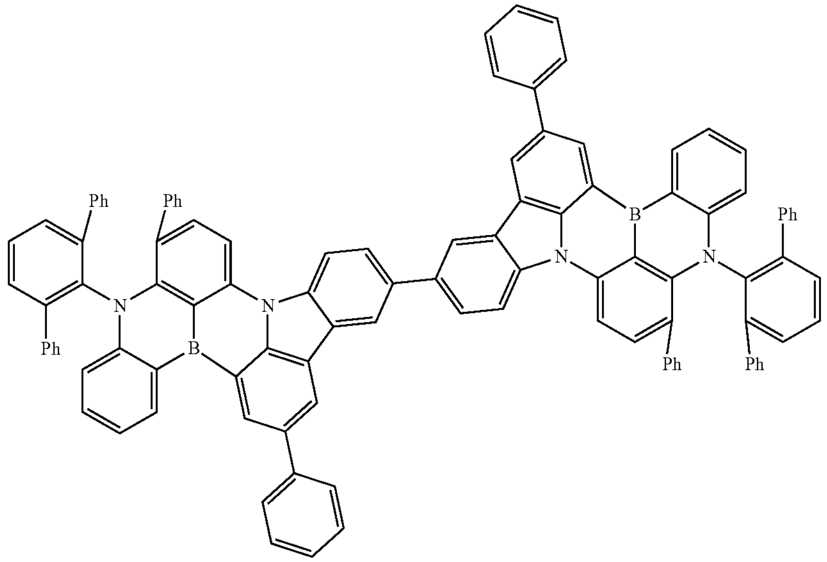
129
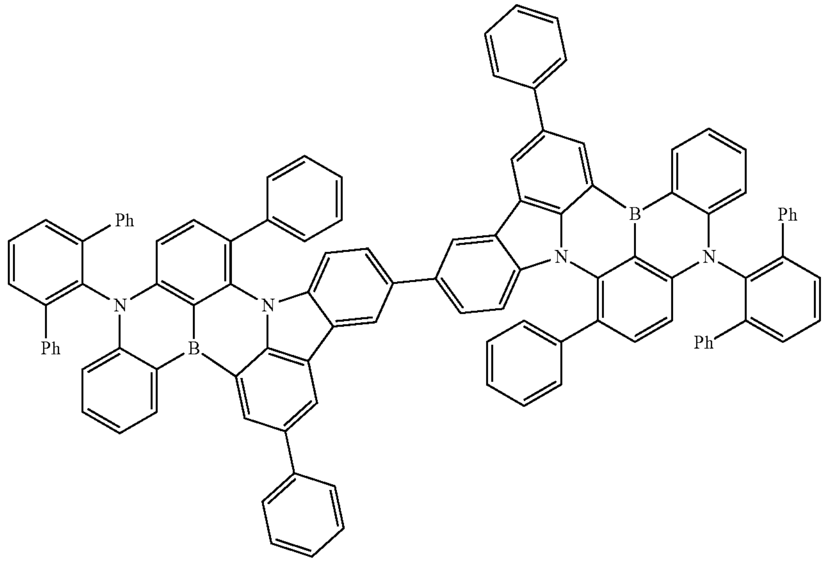
130
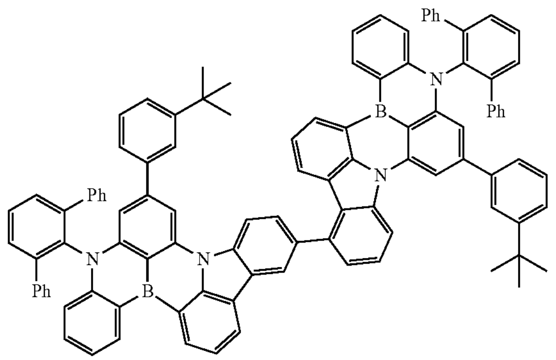
131
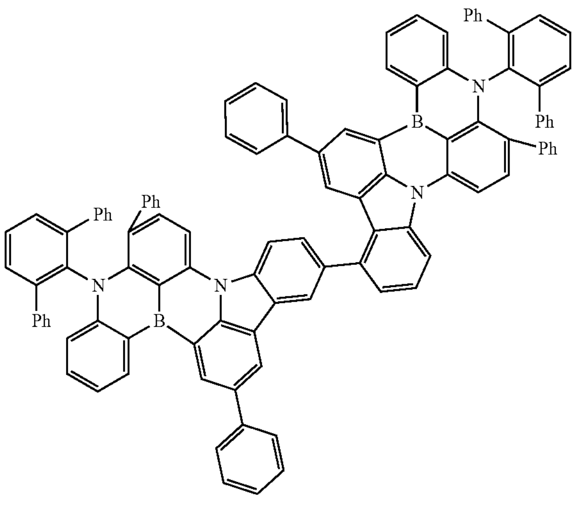

-continued
132
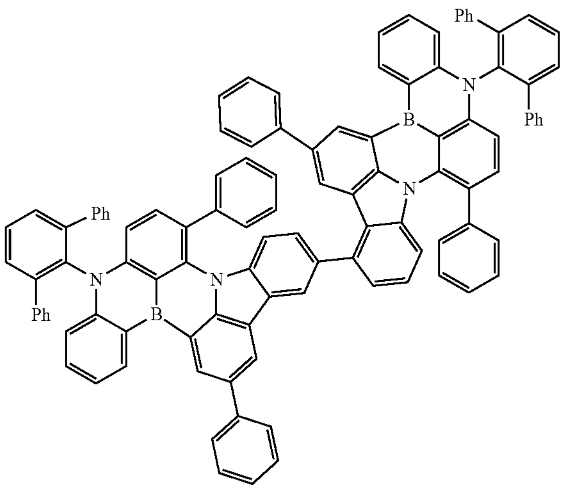
133
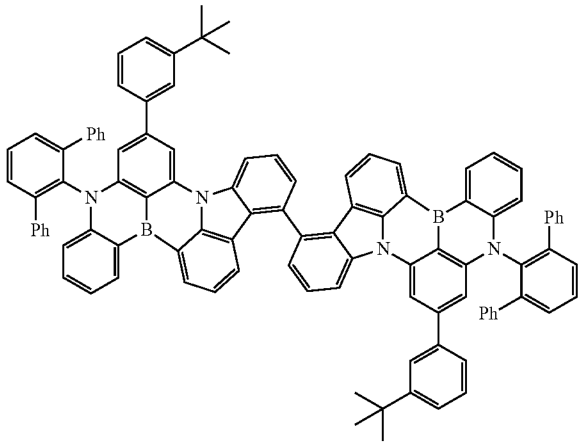
134
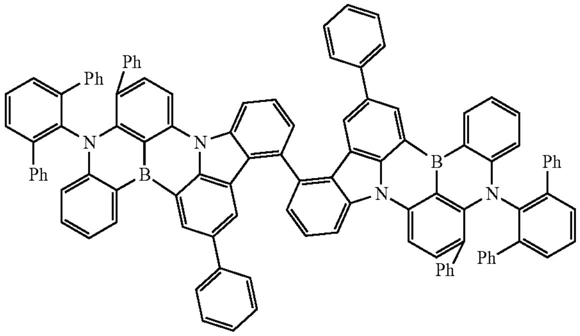
135
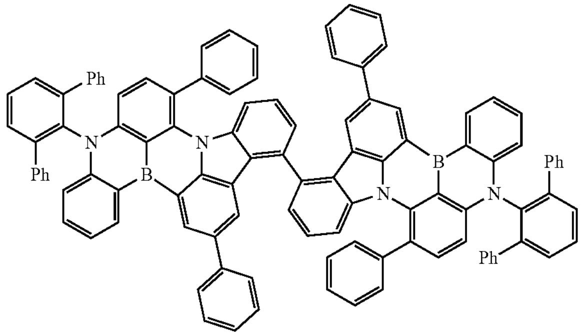
136
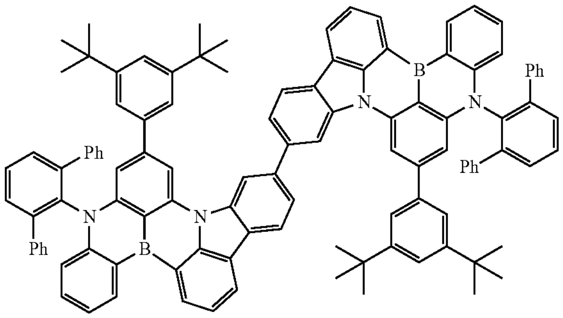
137
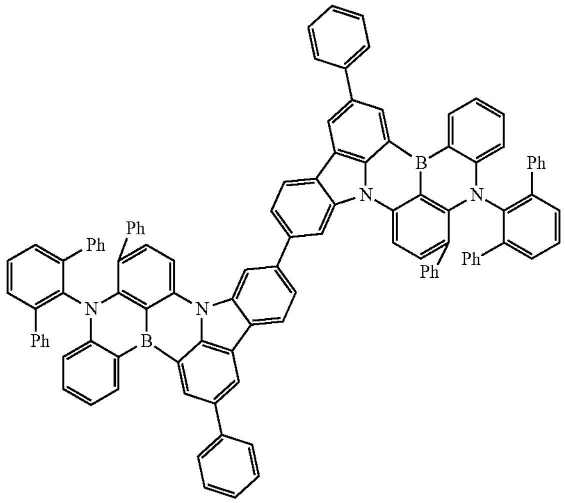

-continued
138
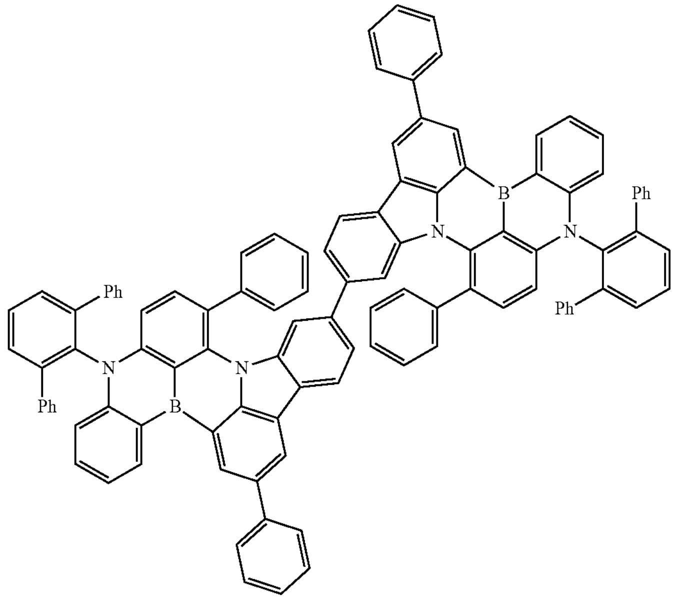
139
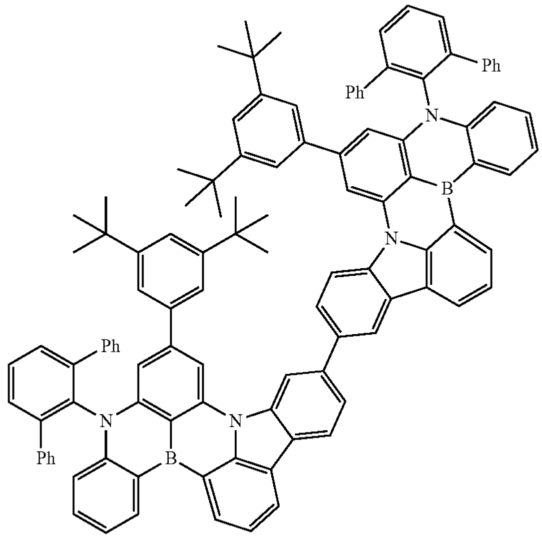
140
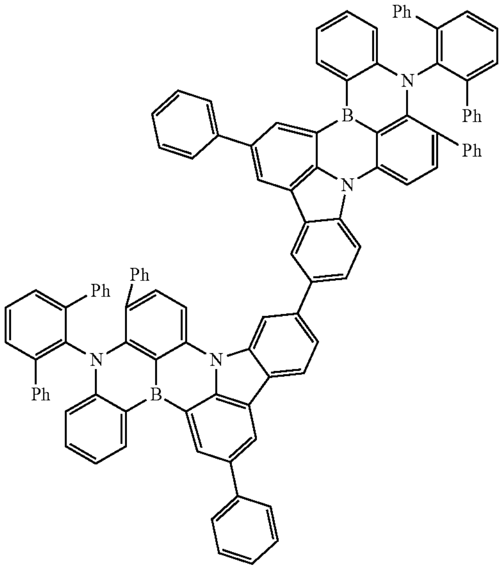

-continued
141
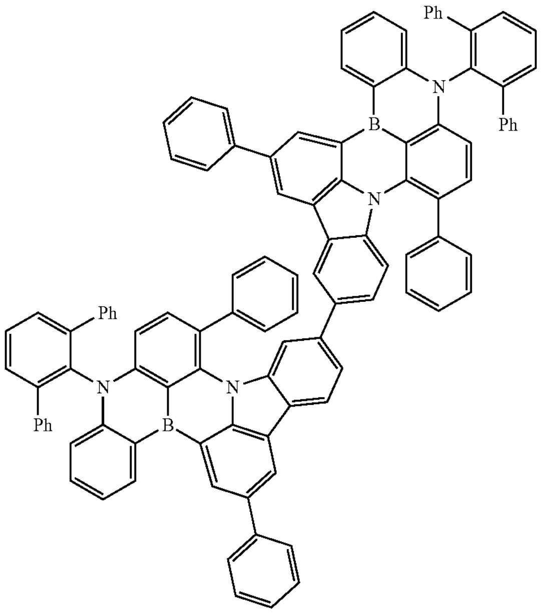
142
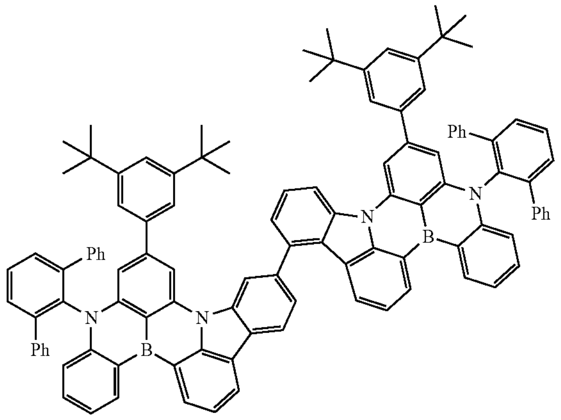
143
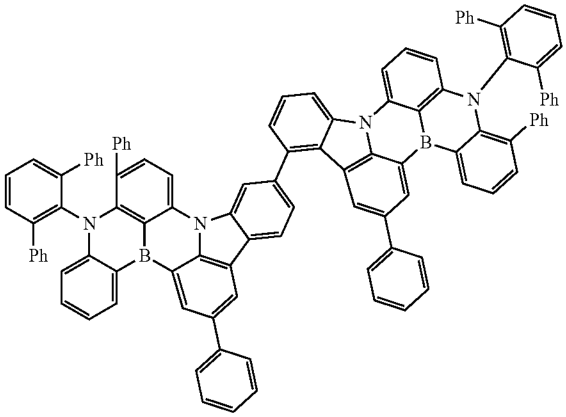
144
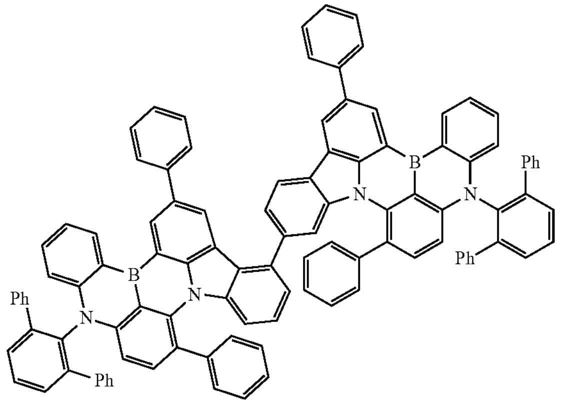
145
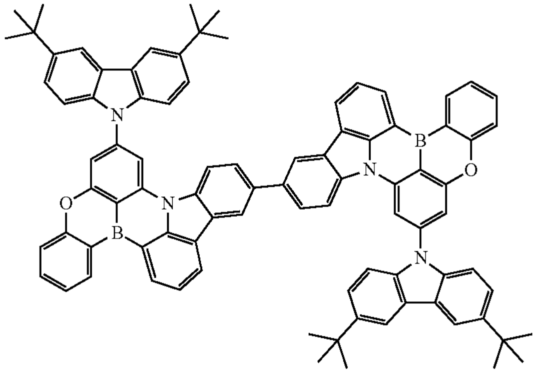
146
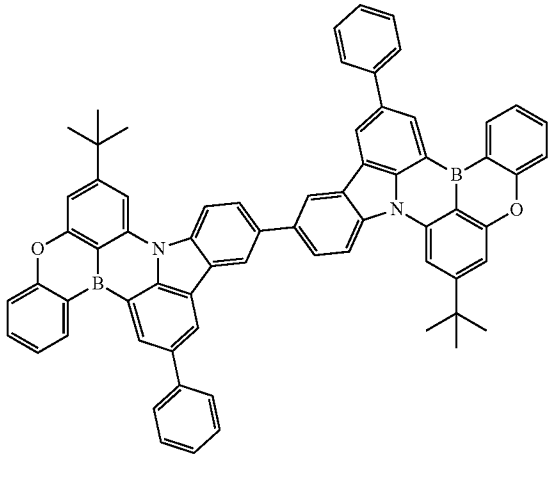

-continued
147
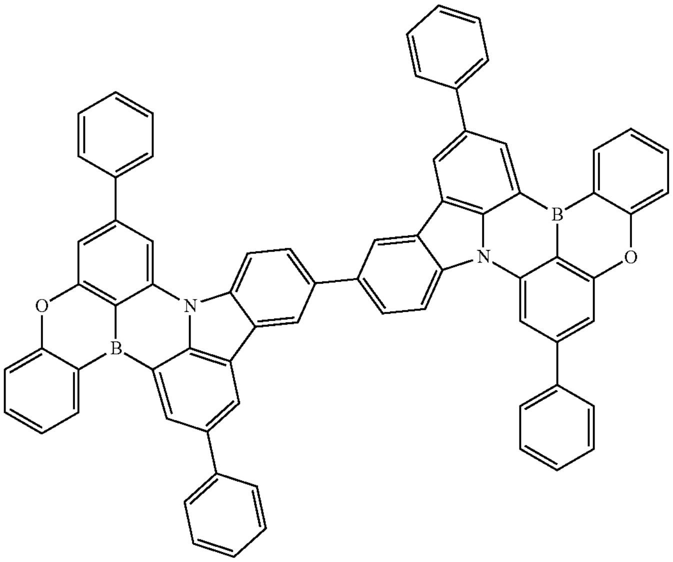
148
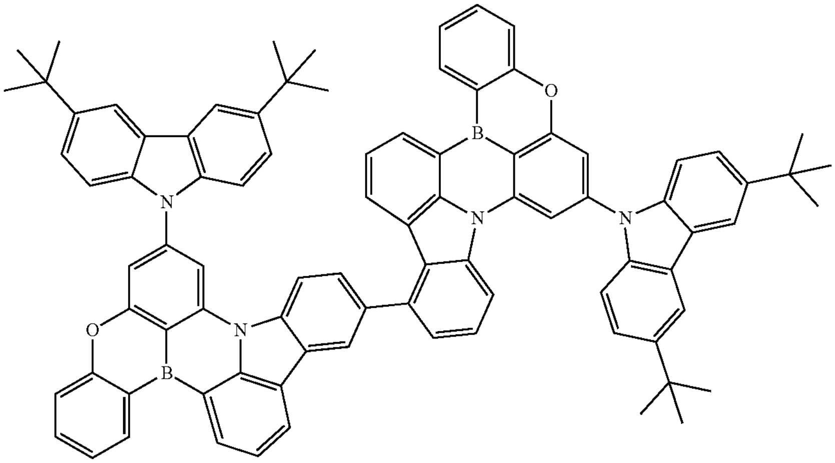
149
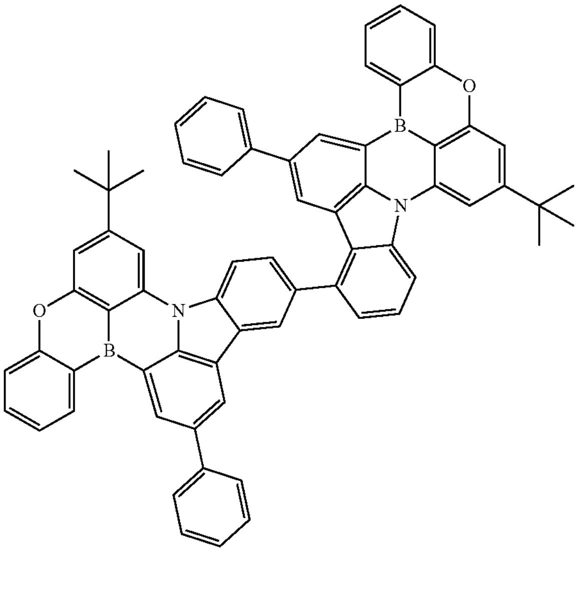
150
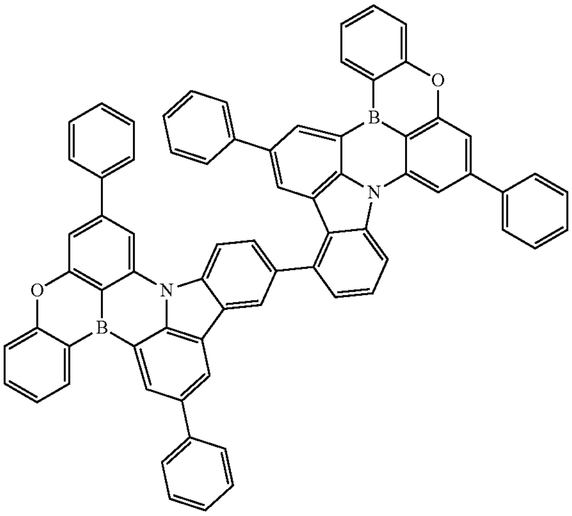

-continued
151
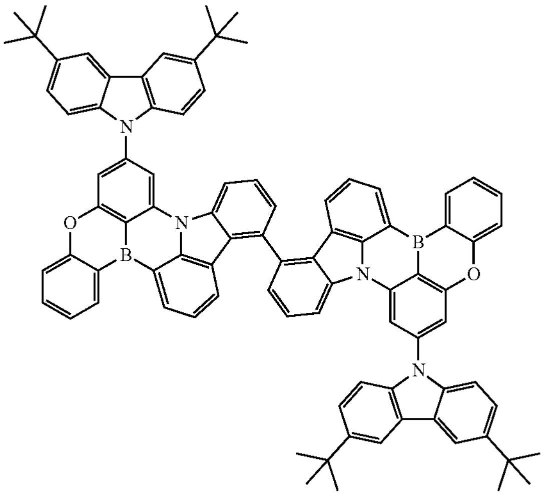
152
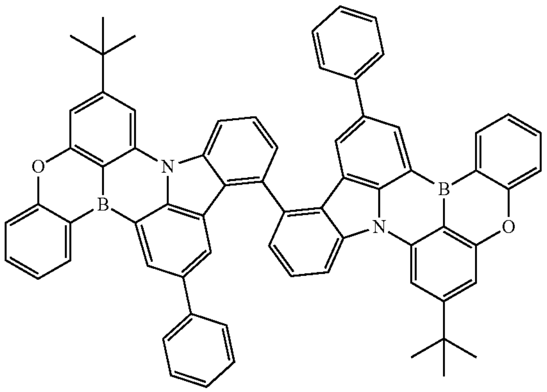
153
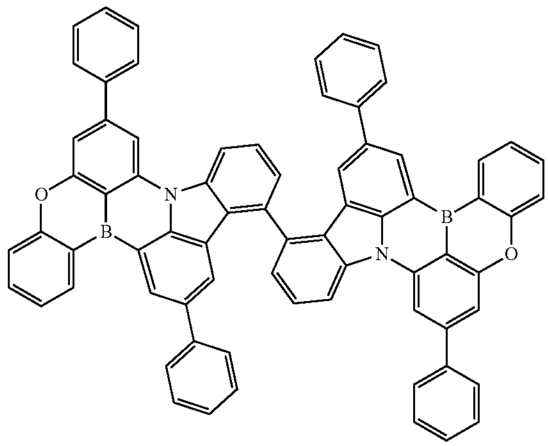
154
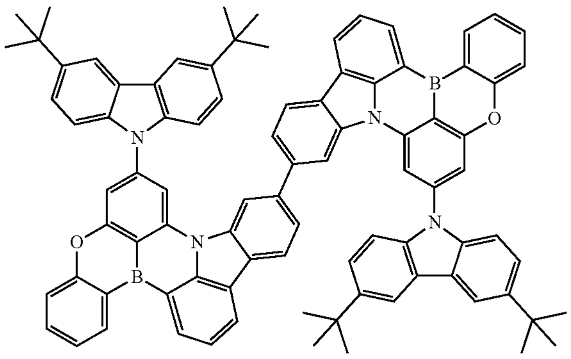
155
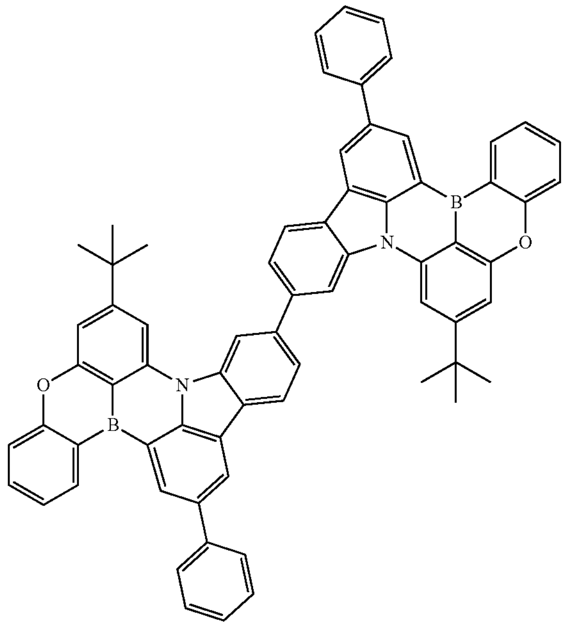
156
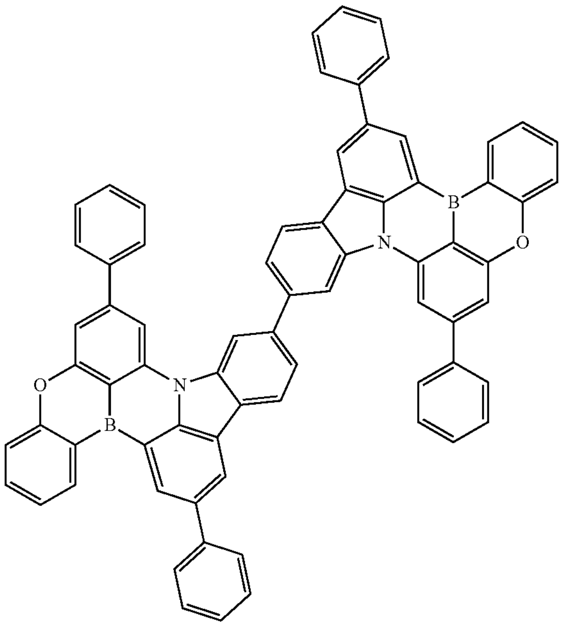

-continued
157
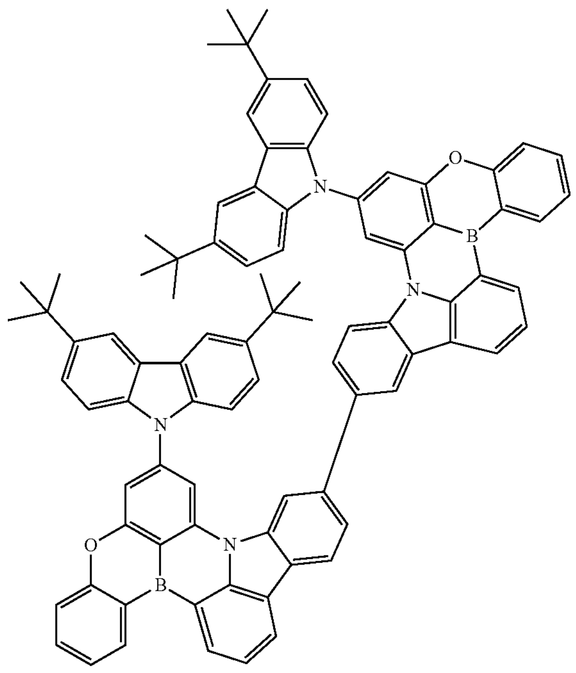
158
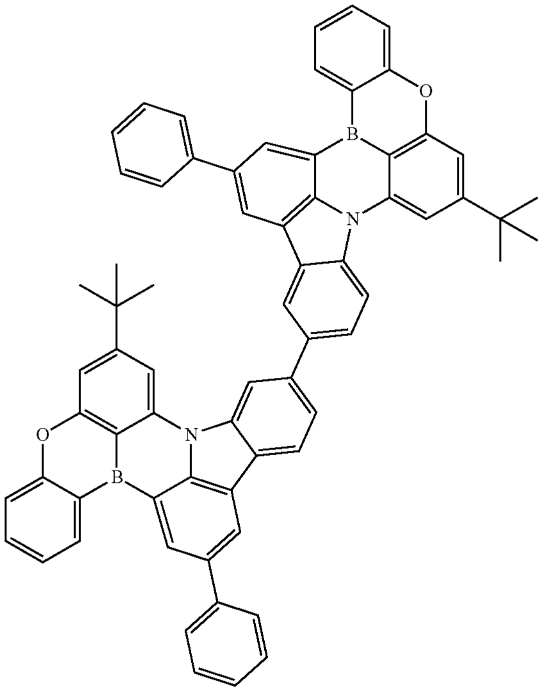
159
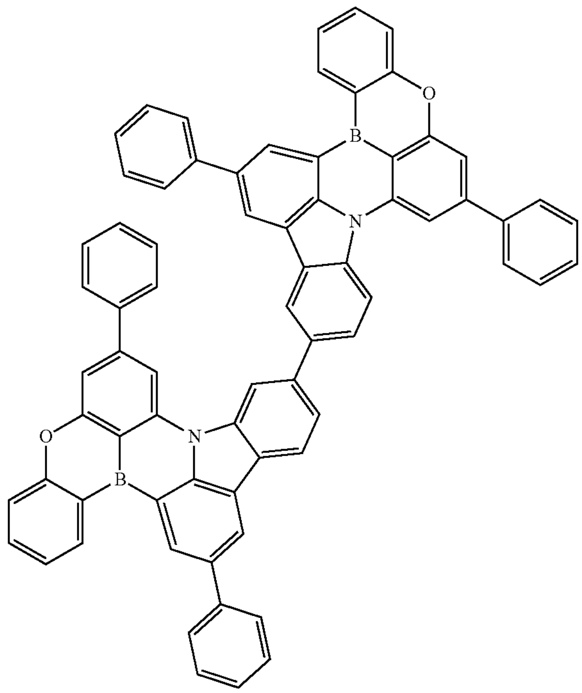
160
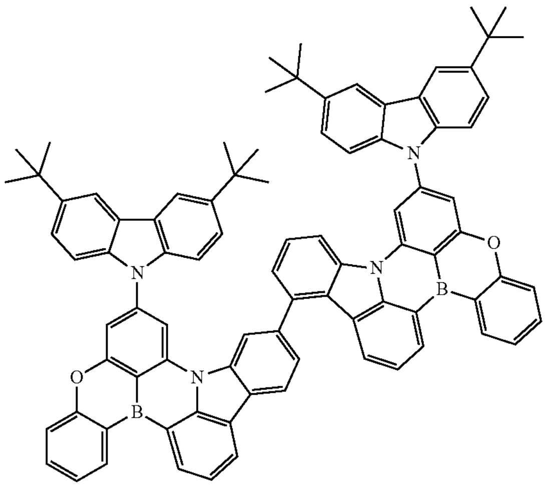

-continued
161
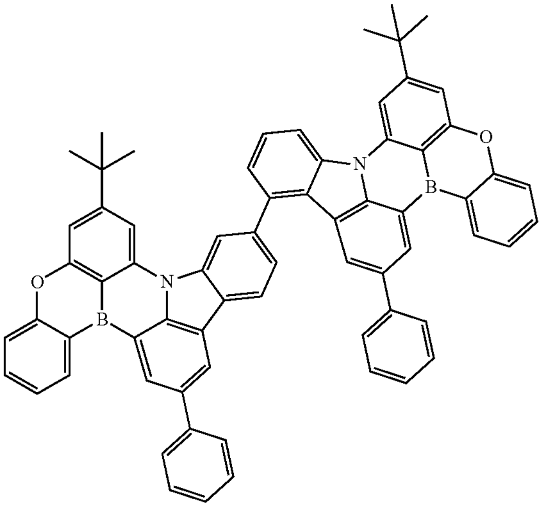
162
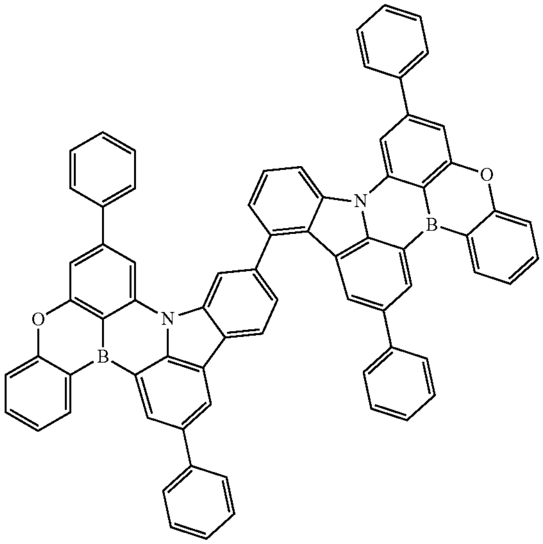
163
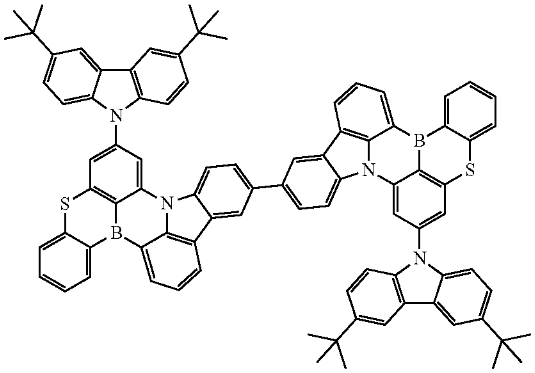
164
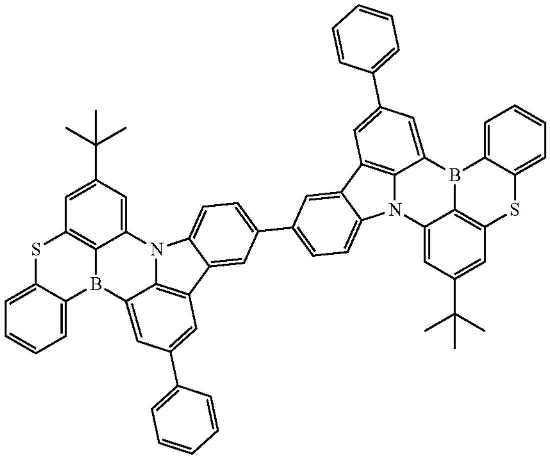
165
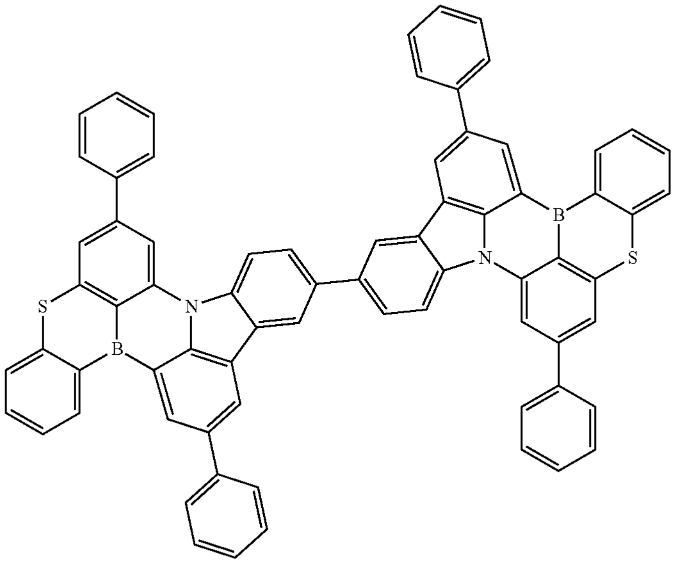

-continued
166
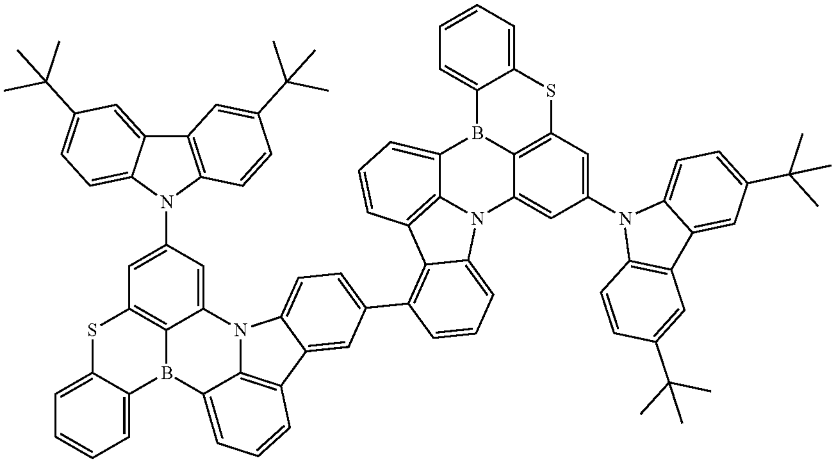
167
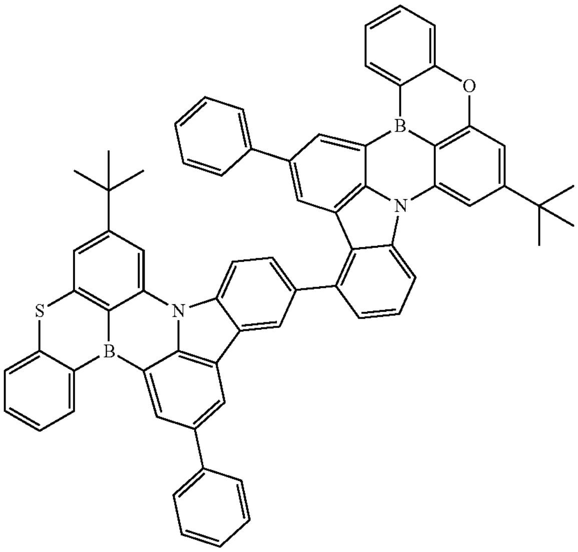
168
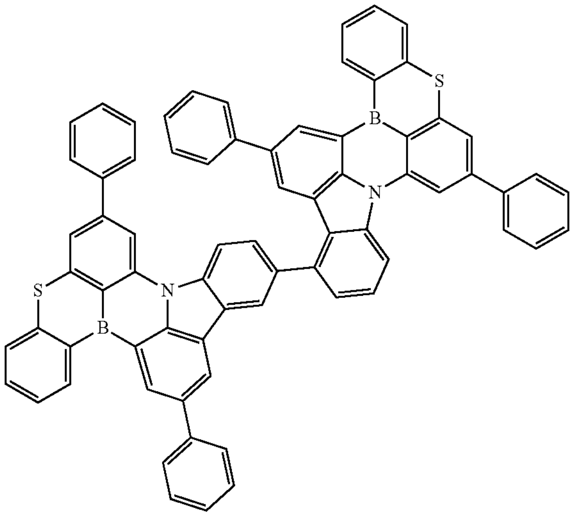
169
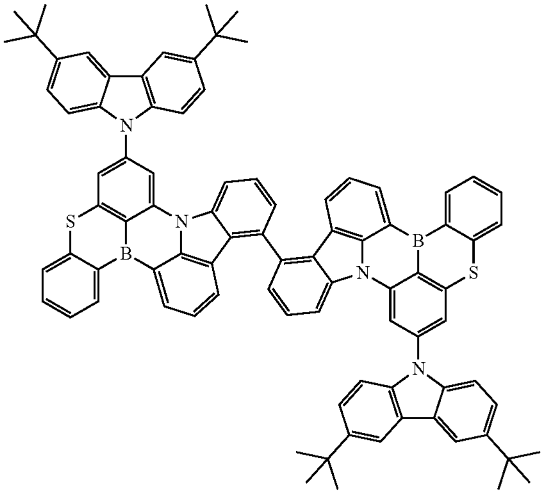
170
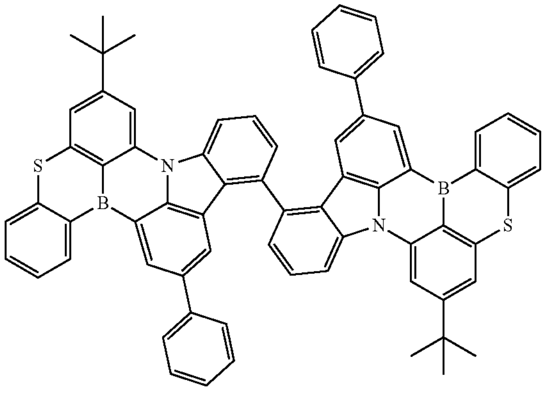

-continued
171
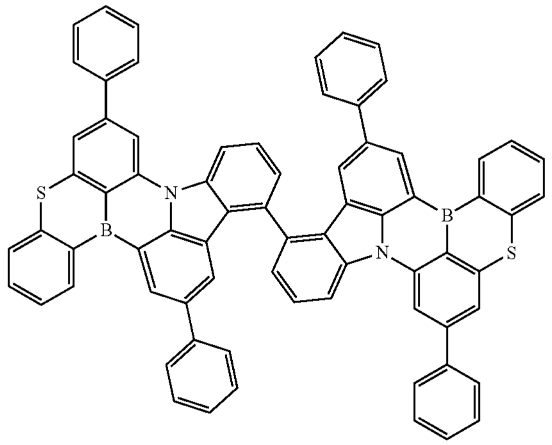
172
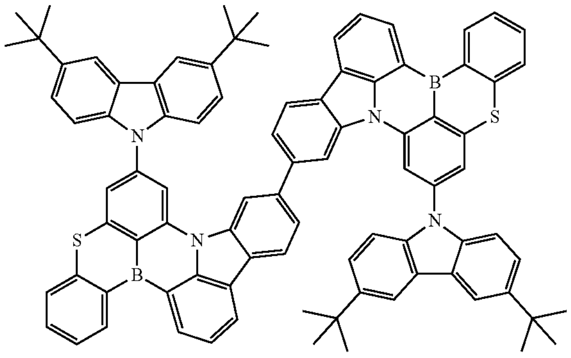
173
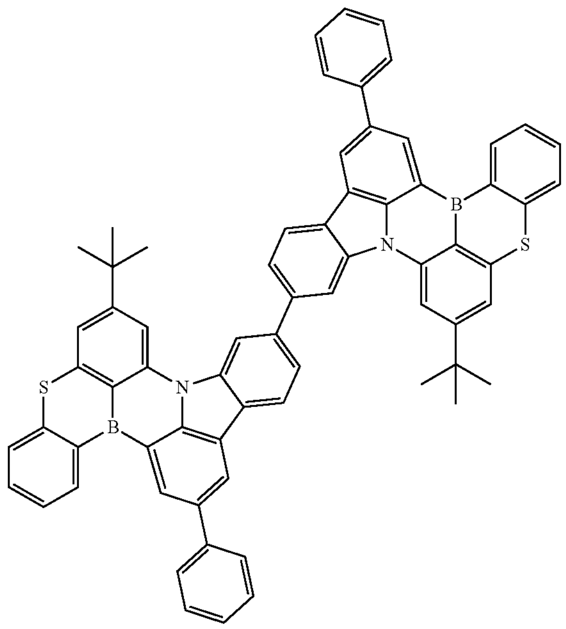
174
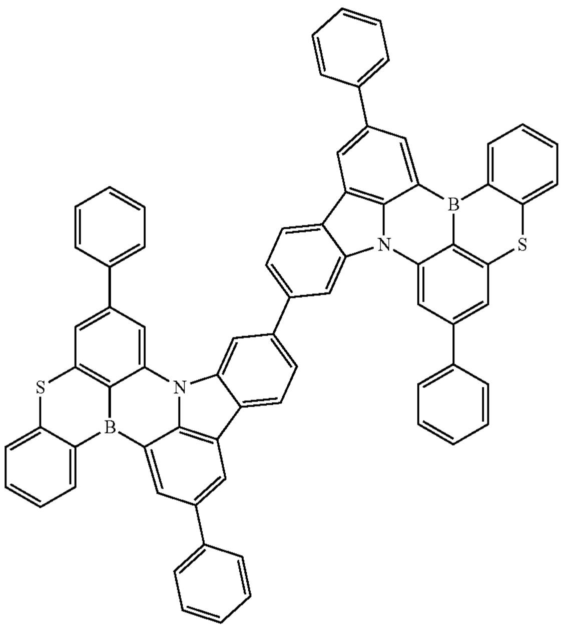

-continued
175
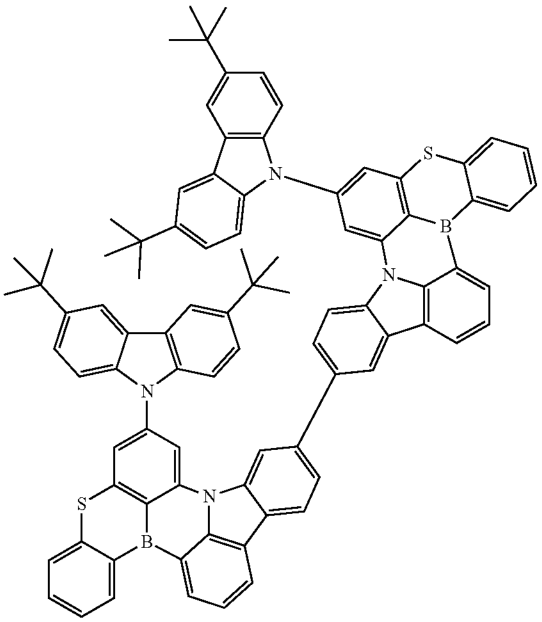
177
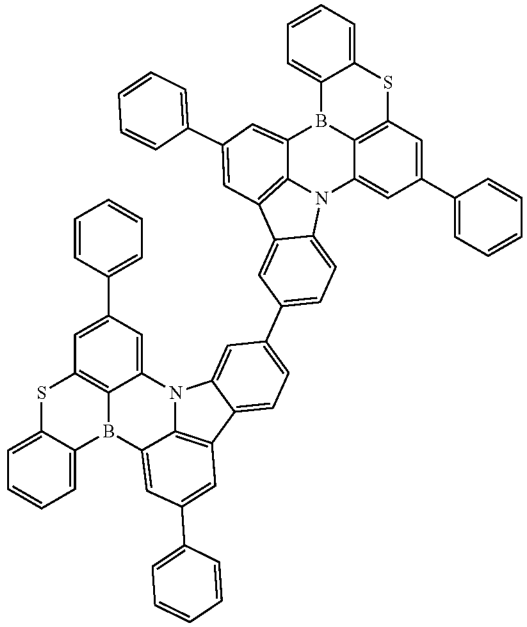
176
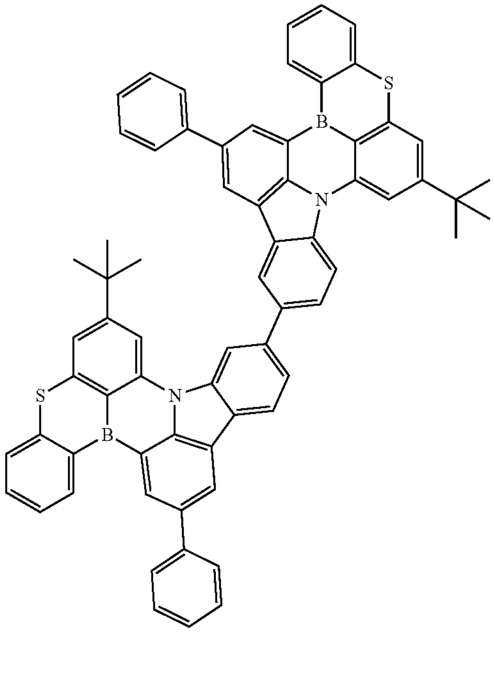
178
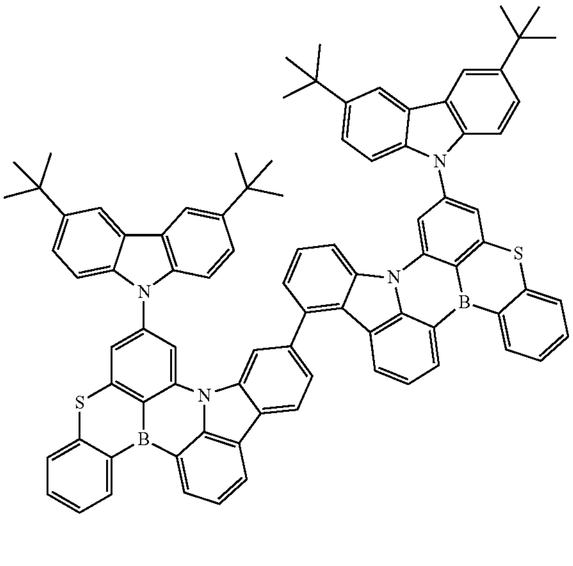

-continued

179

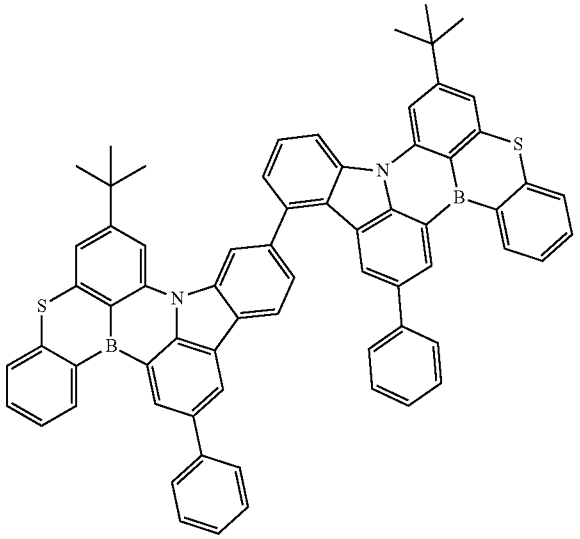

180

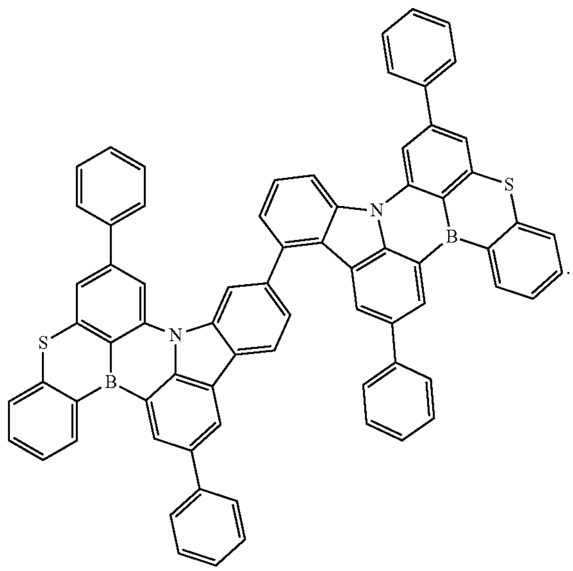

In Compound Group 1, Ph represents a phenyl group.

The fused polycyclic compound of an embodiment, represented by Formula 1, may have a full width at half maximum of about 10 to 50 nm, for example, about 20 to 40 nm. Because the light emitting spectrum of the fused polycyclic compound of an embodiment, represented by Formula 1, has the full width at half maximum in the aforementioned range, when applied to a light emitting device, emission efficiency may be improved.

The fused polycyclic compound of an embodiment, represented by Formula 1, may be a material for emitting thermally activated delayed fluorescence. In addition, the fused polycyclic compound of an embodiment, represented by Formula 1, may be a thermally activated delayed fluorescence dopant having a difference (AEST) between the lowest triplet excitation energy level (T1 level) and the lowest singlet excitation energy level (S1 level) of about 0.6 eV or less. The fused polycyclic compound of an embodiment, represented by Formula 1, may be a thermally activated delayed fluorescence dopant having a difference (AEST) between the lowest triplet excitation energy level (T1 level) and the lowest singlet excitation energy level (S1 level) of about 0.2 eV or less.

The fused polycyclic compound of an embodiment, represented by Formula 1, may be a light emitting material having the central wavelength of light (e.g., central wavelength of light emission spectrum) in a wavelength region of about 430 nm to about 490 nm. For example, the fused polycyclic compound of an embodiment, represented by Formula 1, may be a blue thermally activated delayed fluorescence (TADF) dopant. However, an embodiment of the present disclosure is not limited thereto. In case of utilizing the fused polycyclic compound of an embodiment as a light emitting material, the fused polycyclic compound may be utilized as a dopant material emitting light in various suitable wavelength regions, including a red light emitting dopant, a green light emitting dopant, etc.

In the light emitting device ED of an embodiment, an emission layer EML may emit delayed fluorescence. For example, the emission layer EML may emit thermally activated delayed fluorescence (TADF).

In some embodiments, the emission layer EML of the light emitting device ED may emit blue light. For example, the emission layer EML of the light emitting device ED may emit blue light in a region of about 490 nm or less. However, an embodiment of the present disclosure is not limited thereto. The emission layer EML may emit green light or red light.

In an embodiment, the emission layer EML includes a host and a dopant and may include the fused polycyclic compound as the dopant. For example, in the light emitting device ED of an embodiment, the emission layer EML may include a host for emitting delayed fluorescence and a dopant for emitting delayed fluorescence. The fused polycyclic compound may be included as the dopant for emitting delayed fluorescence. The emission layer EML may include at least one among the fused polycyclic compounds represented in Compound Group 1 as a thermally activated delayed fluorescence dopant.

In some embodiments, in the light emitting device ED of an embodiment, the emission layer EML may further include a suitable (e.g., known) material. The emission layer EML may include one or more anthracene derivatives, pyrene derivatives, fluoranthene derivatives, chrysene derivatives, dihydrobenzanthracene derivatives, and/or triphenylene derivatives. For example, the emission layer EML may include one or more anthracene derivatives and/or pyrene derivatives.

In the light emitting devices ED of embodiments, shown in FIG. 3 to FIG. 6, the emission layer EML may include a host and a dopant, and the emission layer EML may include a compound represented by Formula E-1 below. The compound represented by Formula E-1 below may be utilized as a fluorescence host material or a delayed fluorescence host material.

Formula E-1

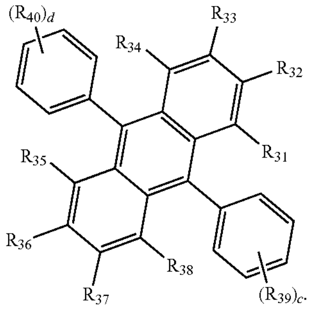

In Formula E-1, $R_{31}$ to $R_{40}$ may be each independently a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or combined with an adjacent group to form a ring. In some embodiments, $R_{31}$ to $R_{40}$ may be combined with an adjacent group to form a saturated hydrocarbon ring or an unsaturated hydrocarbon ring.

In Formula E-1, "c" and "d" may be each independently an integer of 0 to 5.

Formula E-1 may be represented by any one among Compound E1 to Compound E18 below.

E1

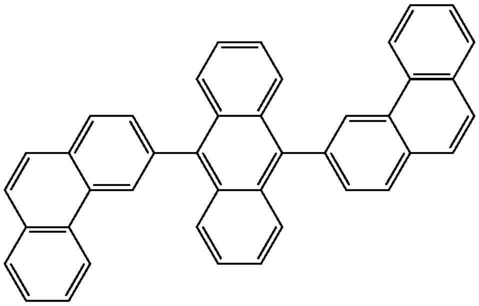

E2

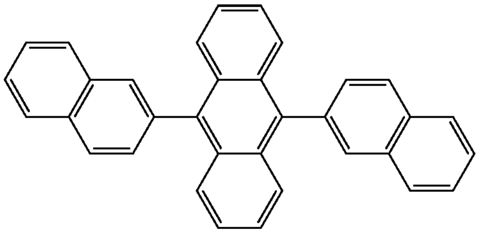

E3

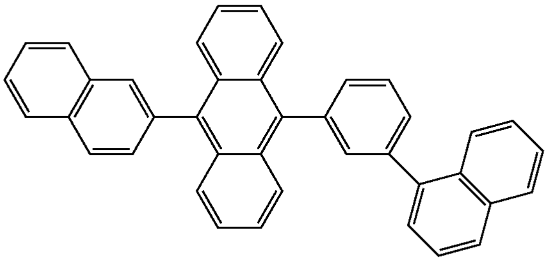

-continued

E4

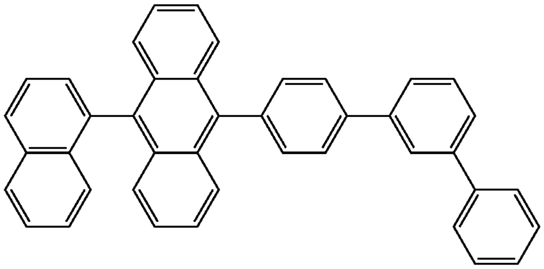

E5

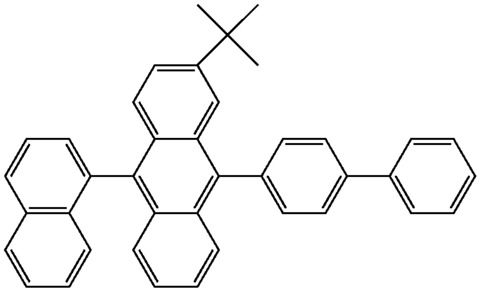

E6

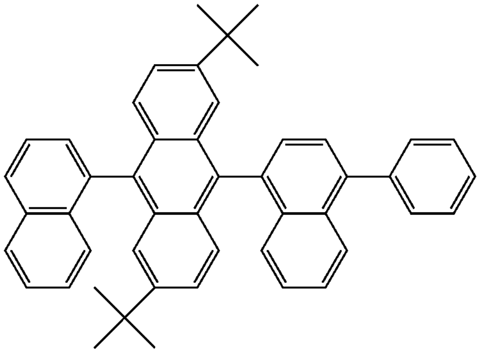

E7

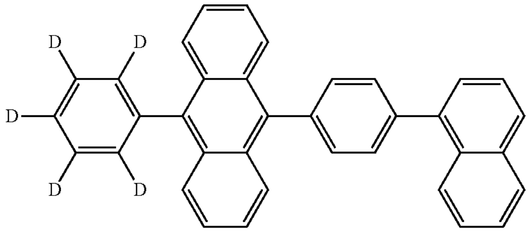

E8

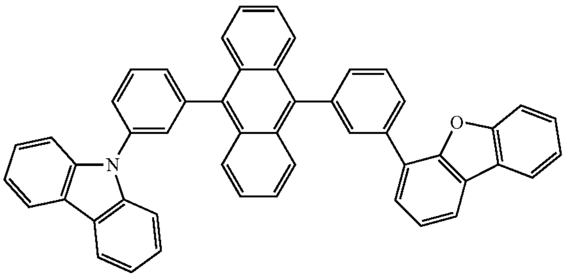

-continued
E9
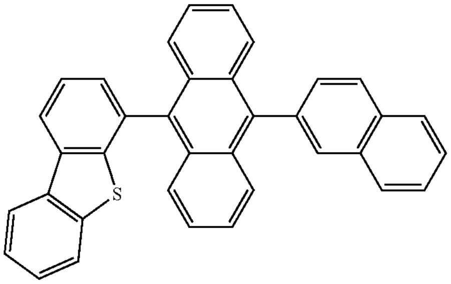
E10
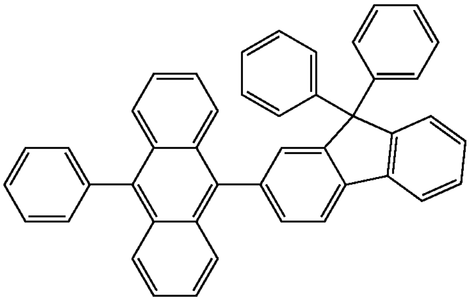
E11
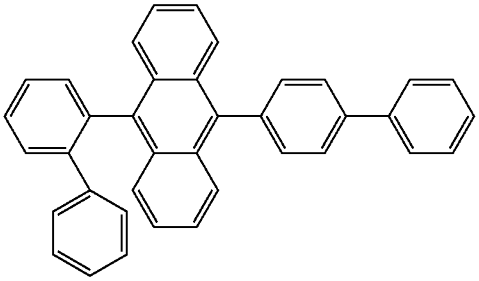
E12
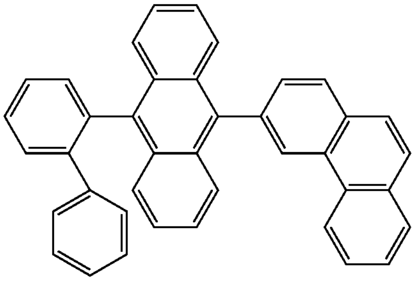
E13
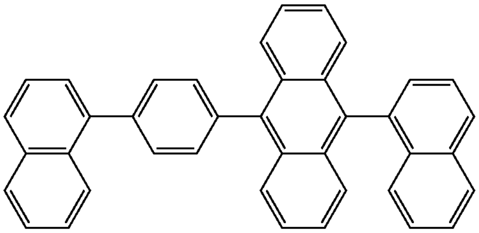
-continued
E14
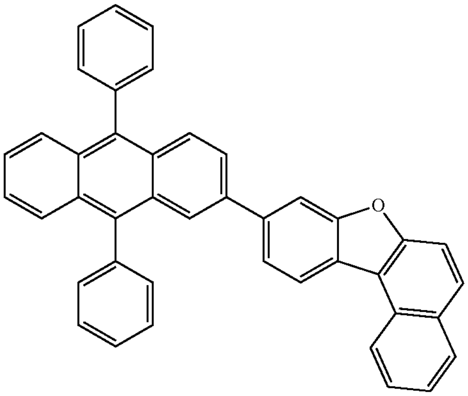
E15
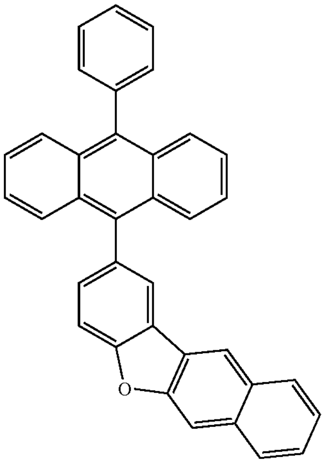
E16
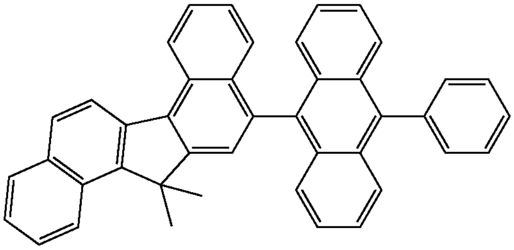
E17
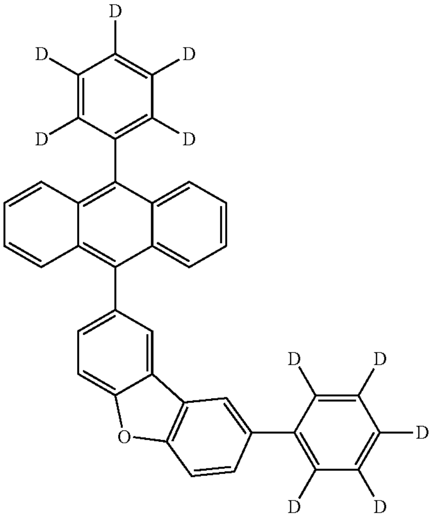

-continued

E18

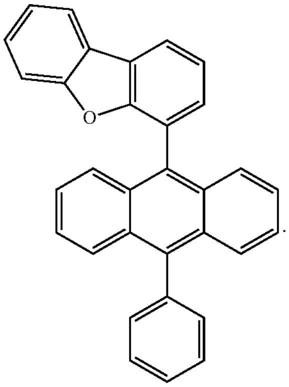

In an embodiment, the emission layer EML may include a compound represented by Formula E-2a or Formula E-2b below. The compound represented by Formula E-2a or Formula E-2b below may be utilized as a phosphorescence host material or a delayed fluorescence host material:

Formula E-2a

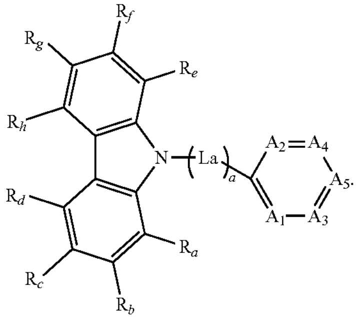

In Formula E-2a, “a” may be an integer of 0 to 10, and $L_a$ may be a direct linkage, a substituted or unsubstituted arylene group having 6 to 30 ring-forming carbon atoms, or a substituted or unsubstituted heteroarylene group having 2 to 30 ring-forming carbon atoms. In some embodiments, when “a” is an integer of 2 or more, two or more $L_a$ may be each independently a substituted or unsubstituted arylene group having 6 to 30 ring-forming carbon atoms, or a substituted or unsubstituted heteroarylene group having 2 to 30 ring-forming carbon atoms.

In some embodiments, in Formula E-2a, $A_1$ to $A_5$ may be each independently N or CRi. $R_a$ to $R_i$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be combined with an adjacent group to form a ring. $R_a$ to $R_i$ may be combined with an adjacent group to form a hydrocarbon ring or a heterocycle including N, O, S, etc. as a ring-forming atom.

In some embodiments, in Formula E-2a, two or three selected from $A_1$ to $A_5$ may be N, and the remainder may be $CR_i$.

Formula E-2b $$(Cbz1 -\!\!(L_b)_b\!\!- Cbz2).$$

In Formula E-2b, Cbz1 and Cbz2 may be each independently an unsubstituted carbazole group, or a carbazole group substituted with an aryl group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. “b” may be an integer of 0 to 10, and when “b” is an integer of 2 or more, two or more $L_b$ may be each independently a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one among the compounds in Compound Group E-2 below. However, the compounds shown in Compound Group E-2 below are only illustrations, and the compound represented by Formula E-2a or Formula E-2b is not limited to the compounds represented in Compound Group E-2 below.

Compound Group E-2

E-2-1

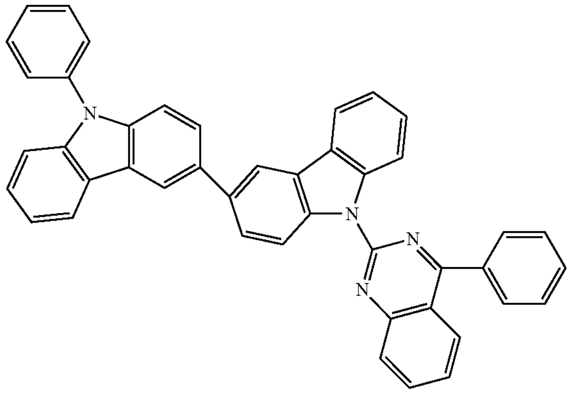

E-2-2

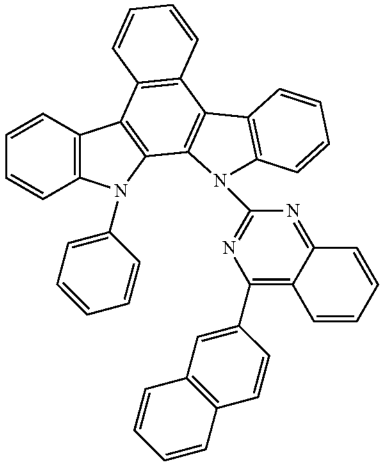

-continued
E-2-3
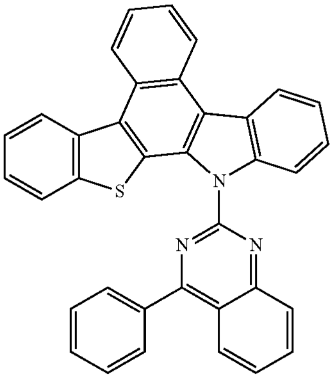
E-2-4
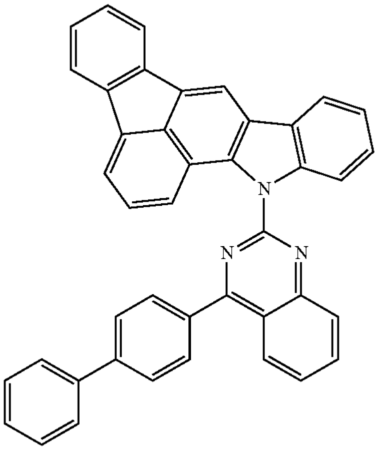
E-2-5
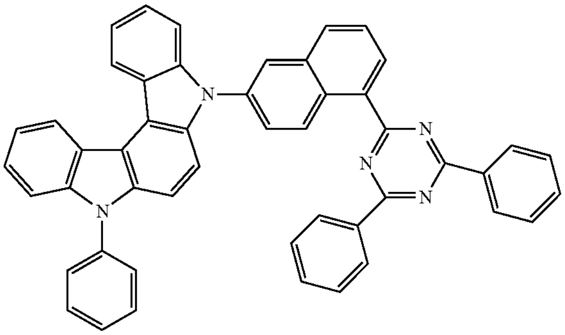
E-2-6
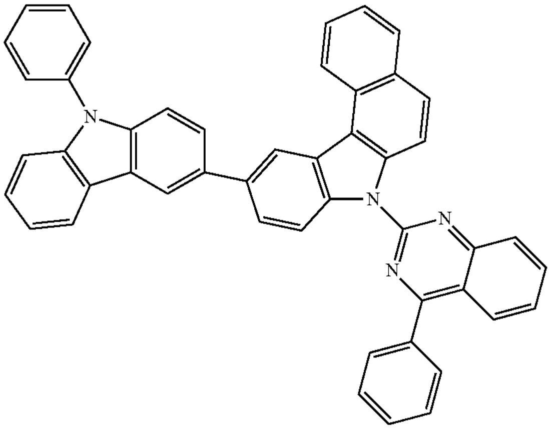
-continued
E-2-7
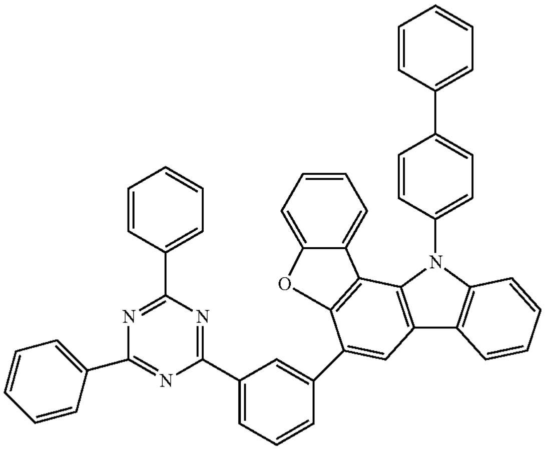
E-2-8
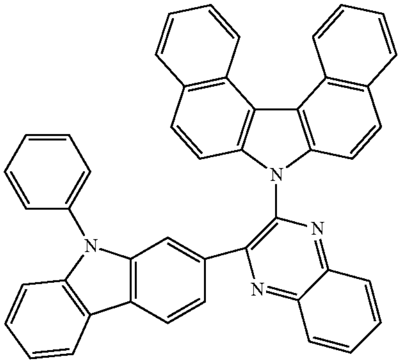
E-2-9
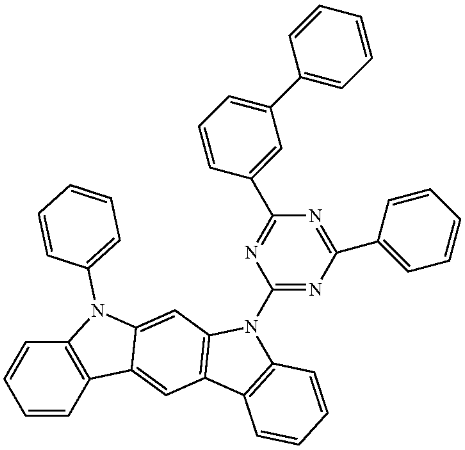

-continued
E-2-10
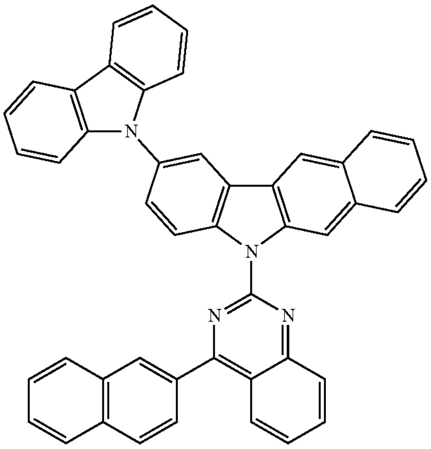
E-2-11
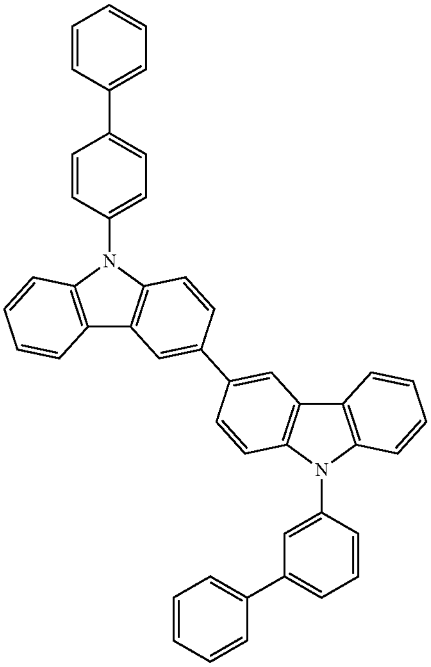
E-2-12
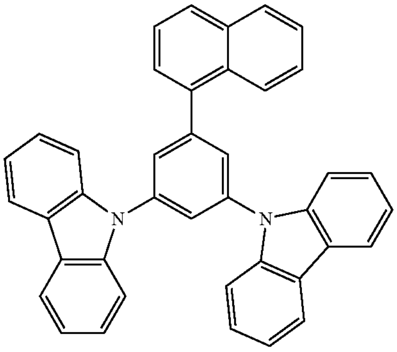
-continued
E-2-13
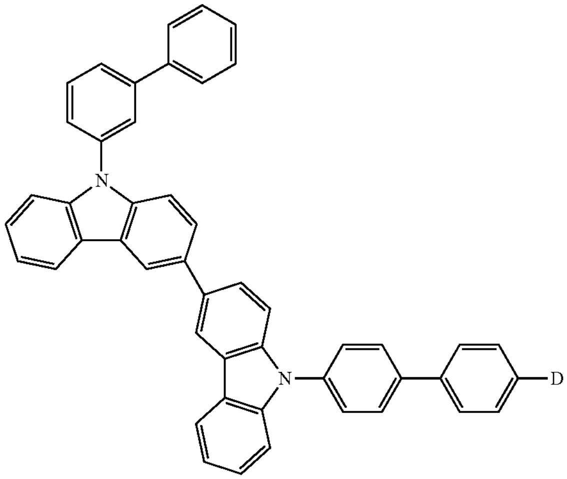
E-2-14
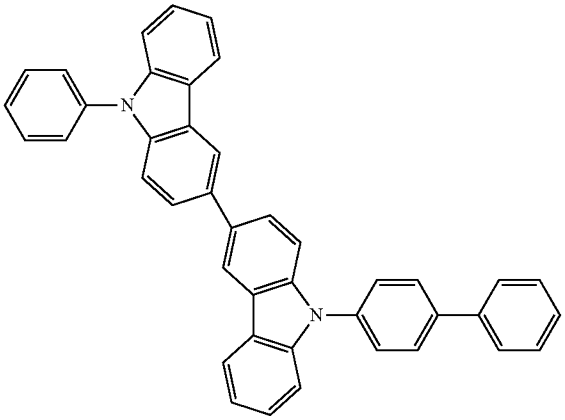
E-2-15
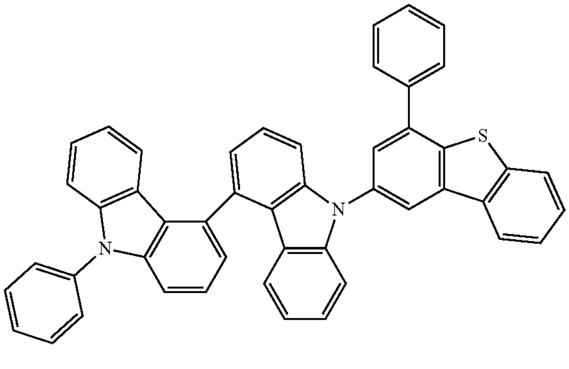

-continued

E-2-16

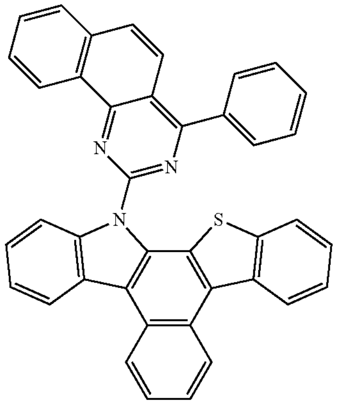

E-2-17

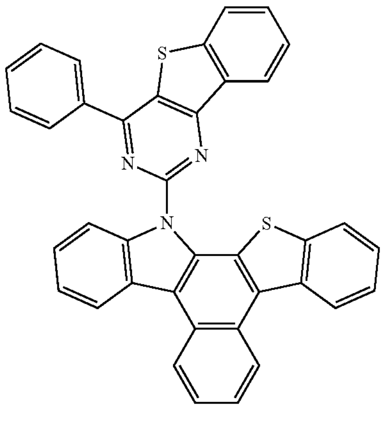

E-2-18

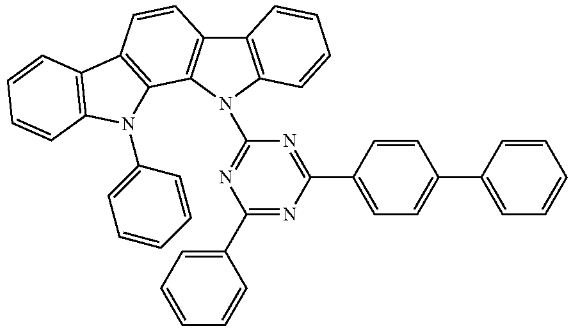

E-2-19

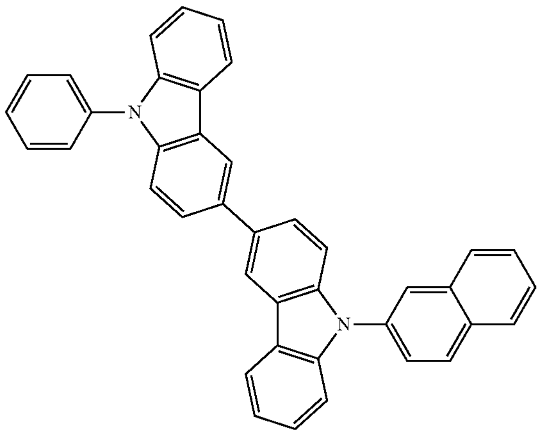

-continued

E-2-20

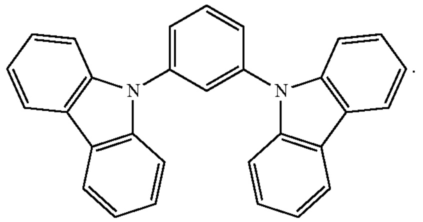

The emission layer EML may further include a common material (e.g., well-known) in the art as a host material. For example, the emission layer EML may include as a host material, at least one of bis [2-(diphenylphosphino)phenyl] ether oxide (DPEPO), 4,4'-bis(carbazol-9-yl) biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, an embodiment of the present disclosure is not limited thereto. For example, tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl) anthracene (ADN), 4,4',4"-tris(carbazol-9-yl)-triphenyamine (TCTA), 1,3,5-tris(N-phenylbenzimidazole-2-yl)benzene (TPBi), 2-tert-butyl-9,10-di(naphth-2-yl) anthracene (TBADN), distyrylarylene (DSA), 4,4'-bis(9-carbazolyl)-2,2'-dimethyl-biphenyl (CDBP), 2-methyl-9,10-bis(naphthalen-2-yl) anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), 2,8-bis(diphenylphosphoryl)dibenzofuran (PPF), etc. may be utilized as the host material.

The emission layer EML may include a compound represented by Formula M-a or Formula M-b below. The compound represented by Formula M-a or Formula M-b may be utilized as a phosphorescence dopant material.

Formula M-a

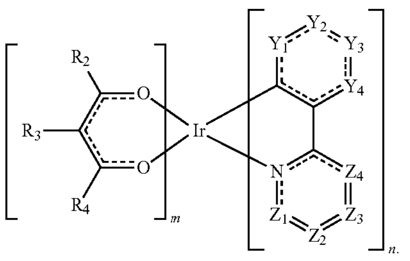

In Formula M-a, $Y_1$ to $Y_4$, and $Z_1$ to $Z_4$ may be each independently $CR_1$ or N, and $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms; or may be combined with an adjacent group to form a ring. In Formula M-a, "m" may be 0 or 1, and "n" may be 2 or 3. In Formula M-a, when "m" is 0, "n" is 3, and when "m" is 1, "n" is 2.

The compound represented by Formula M-a may be utilized as a red phosphorescence dopant or a green phosphorescence dopant.

The compound represented by Formula M-a may be represented by any one among Compounds M-a1 to M-a25 below. However, Compounds M-a1 to M-a25 below are illustrations, and the compound represented by Formula M-a is not limited to the compounds represented by Compounds M-a1 to M-a25 below.

M-a1

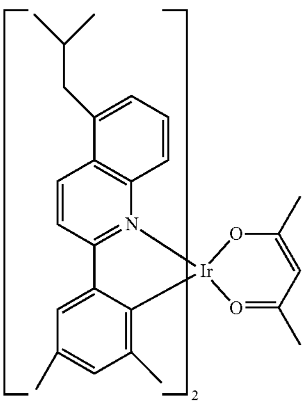

M-a2

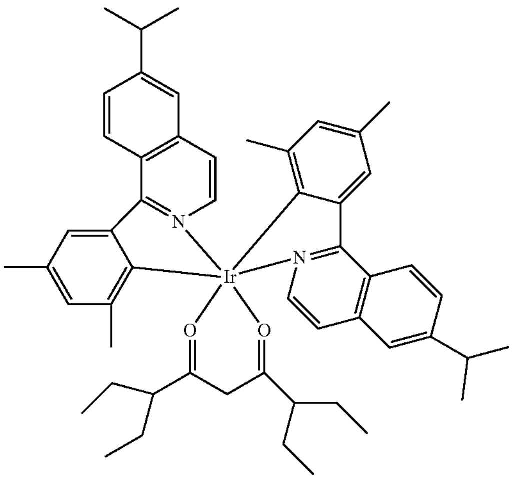

M-a3

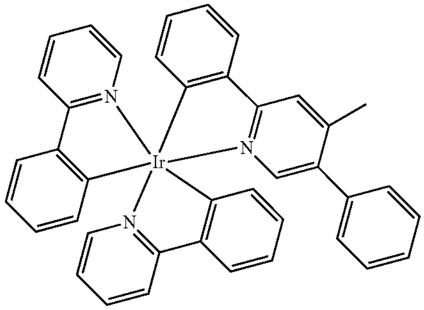

-continued

M-a4

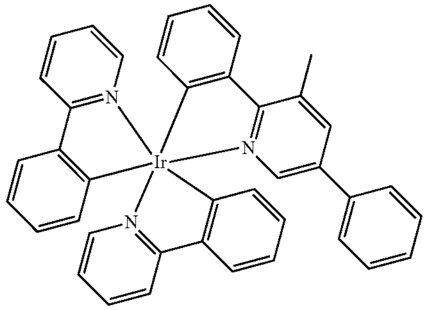

M-a5

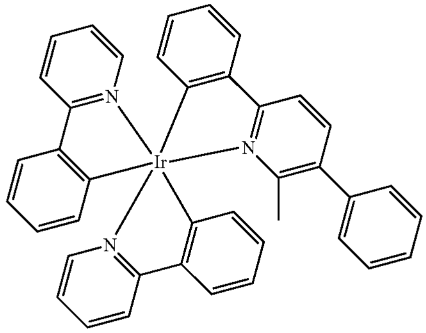

M-a6

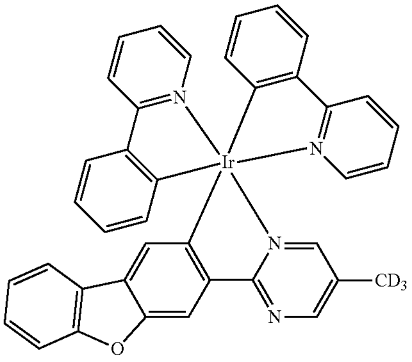

M-a7

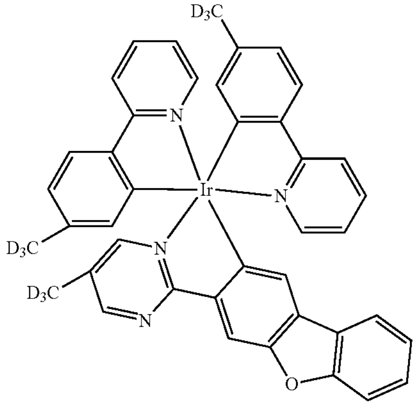

-continued
M-a8
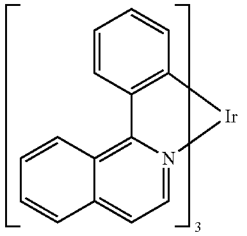
M-a9
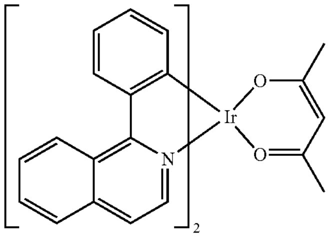
M-a10
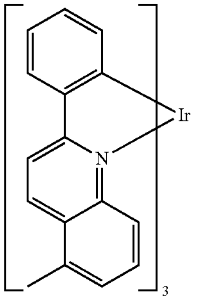
M-a11
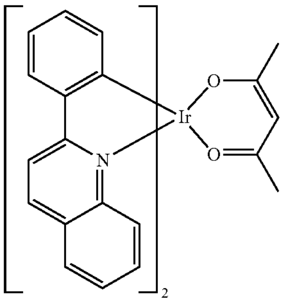
M-a12
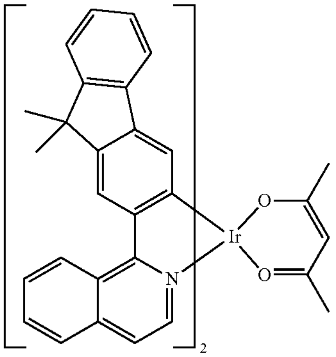
-continued
M-a13
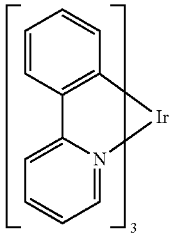
M-a14
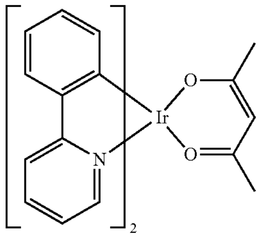
M-a15
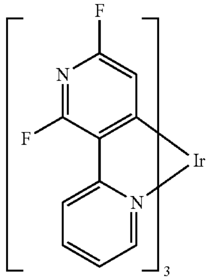
M-a16
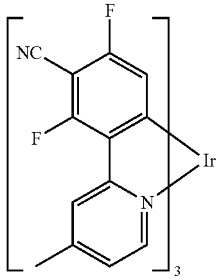
M-a17
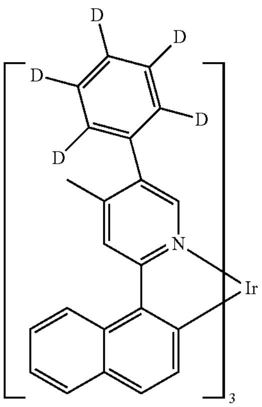

-continued
M-a18
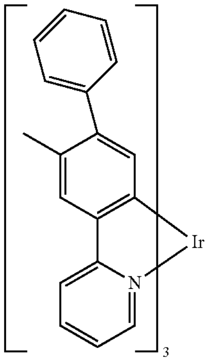
M-a19
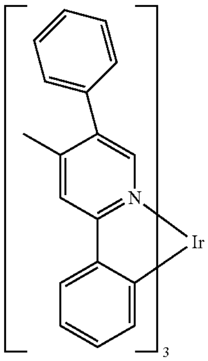
M-a20
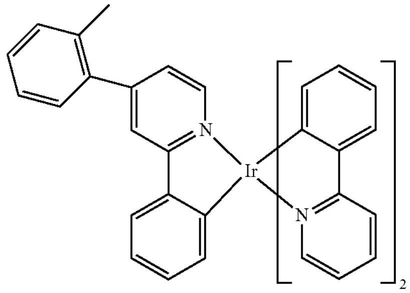
M-a21
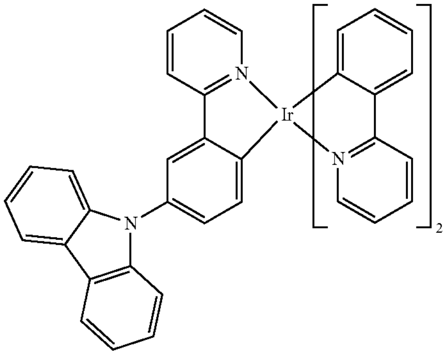
-continued
M-a22
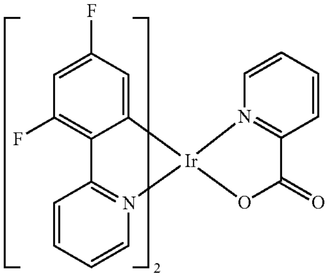
M-a23
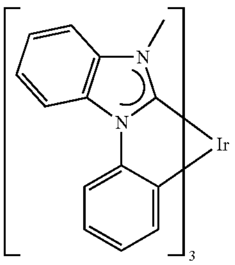
M-a24
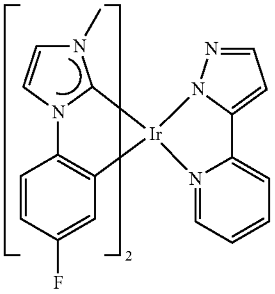
M-a25
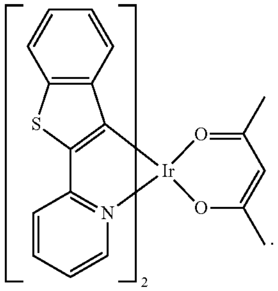
Compound M-a1 and Compound M-a2 may be utilized as red dopant materials, and Compound M-a3 to Compound M-a5 may be utilized as green dopant materials.

Formula M-b

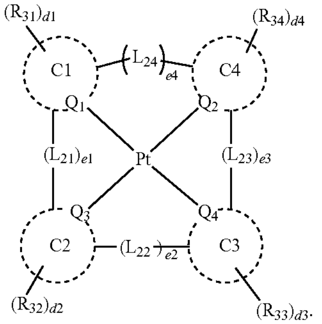

In Formula M-b, $Q_1$ to $Q_4$ may each independently be C or N, $C_1$ to $C_4$ may each independently be a substituted or unsubstituted hydrocarbon ring of 5 to 30 ring-forming carbon atoms, or a substituted or unsubstituted heterocycle of 2 to 30 ring-forming carbon atoms. $L_{21}$ to $L_{24}$ may each independently be a direct linkage,

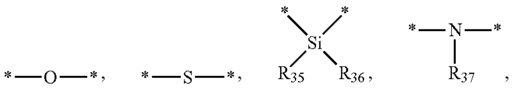

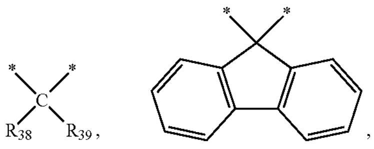

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 are each independently 0 or 1. $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms; or combined with an adjacent group to form a ring, and d1 to d4 may each independently be an integer of 0 to 4.

The compound represented by Formula M-b may be utilized as a blue phosphorescence dopant or a green phosphorescence dopant.

The compound represented by Formula M-b may be represented by any one among the compounds below. However, the compounds below are illustrations, and the compound represented by Formula M-b is not limited to the compounds represented below.

M-b-1

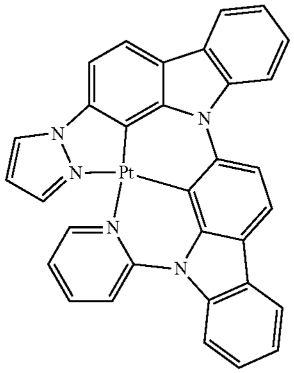

M-b-2

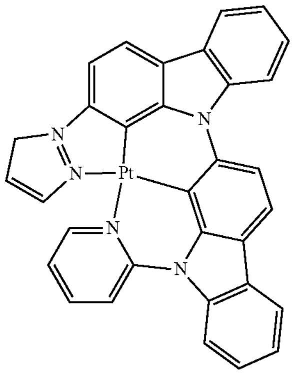

M-b-3

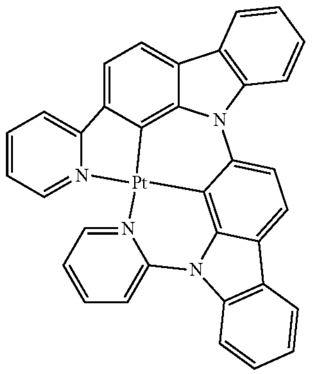

M-b-4

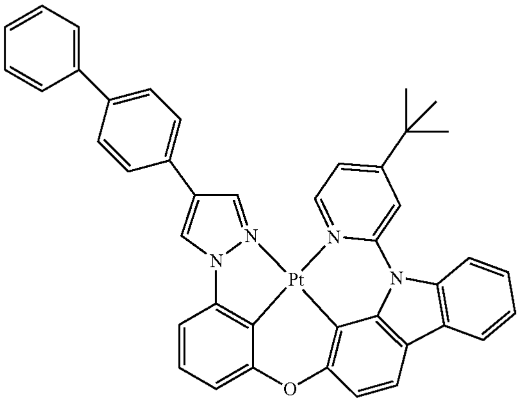

-continued

M-b-5

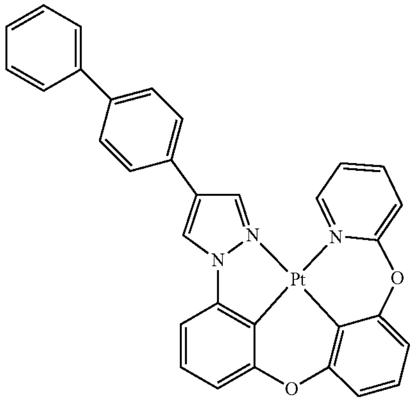

M-b-6

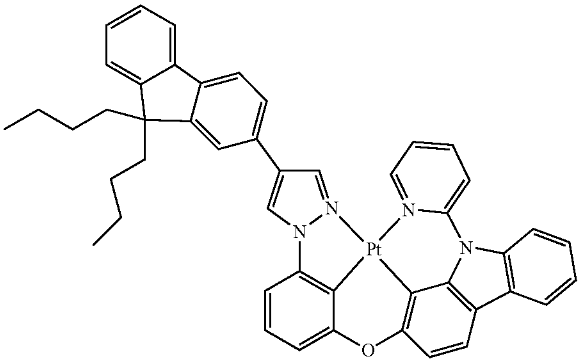

M-b-7

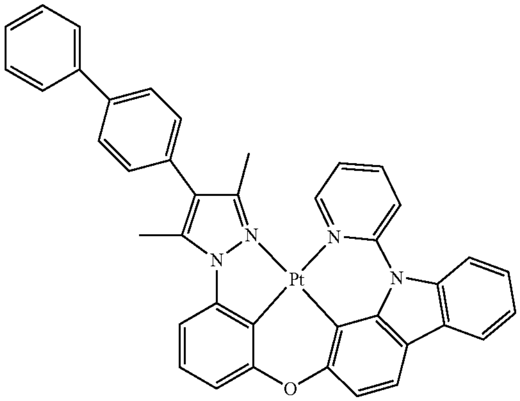

M-b-8

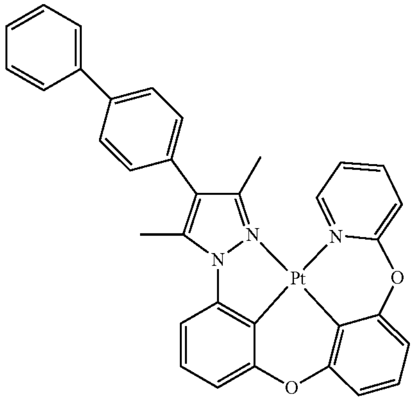

-continued

M-b-9

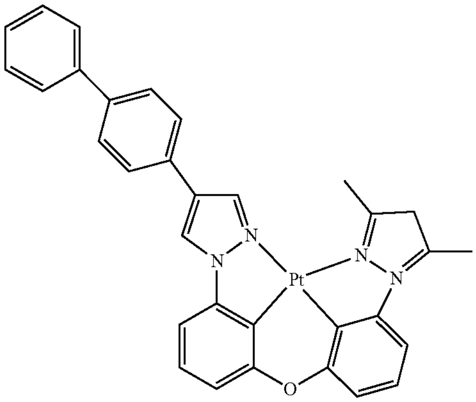

M-b-10

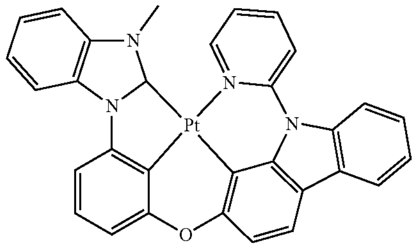

M-b-11

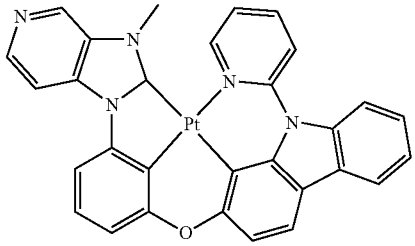

M-b-12

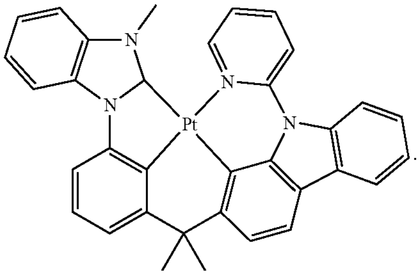

In the compounds above, R, $R_{38}$, and $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include any compound represented by Formula F-a to Formula F-c below. The compounds represented by Formula F-a to Formula F-c below may be utilized as fluorescence dopant materials.

Formula F-a

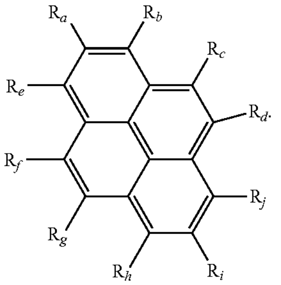

In Formula F-a, two selected from $R_a$ to $R_j$ may be each independently substituted with $$*\text{—}NAr_1Ar_2.$$

The remainder not substituted with $$*\text{—}NAr_1Ar_2$$

among $R_a$ to $R_j$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In $$*\text{—}NAr_1Ar_2,$$

$Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. For example, $Ar_1$ and/or $Ar_2$ may be a heteroaryl group including O or S as a ring-forming atom.

Formula F-b

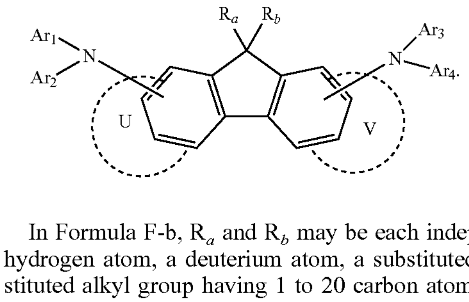

In Formula F-b, $R_a$ and $R_b$ may be each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be combined with an adjacent group to form a ring.

In Formula F-b, U and V may be each independently a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may be each independently 0 or 1. For example, in Formula F-b, when the number of U or V is 1, one ring at the part designated by U or V forms a fused ring, and when the number of U or V is 0, a ring is not present at the part designated by U or V. For example, when the number of U is 0, and the number of V is 1, or when the number of U is 1, and the number of V is 0, a fused ring having the fluorene core of Formula F-b may be a ring compound with four rings. In addition, when the number of both U and Vis 0, the fused ring of Formula F-b may be a ring compound with three rings. In addition, when the number of both U and V is 1, a fused ring having the fluorene core of Formula F-b may be a ring compound with five rings.

Formula F-c

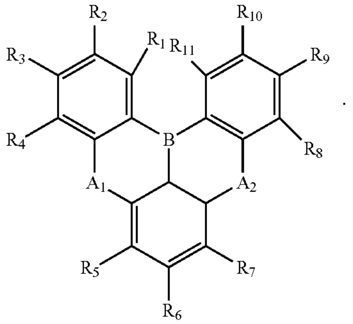

In Formula F-c, $A_1$ and $A_2$ may be each independently O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ are each independently a hydrogen atom, a deuterium atom, a halogen atom, a cyano group, a substituted or unsubstituted amine group, a substituted or unsubstituted boron group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or combined with an adjacent group to form a ring.

In Formula F-c, $A_1$ and $A_2$ may be each independently combined with the substituents of an adjacent ring to form a fused ring. For example, when $A_1$ and $A_2$ are each independently $NR_m$, $A_1$ may be combined with $R_4$ or $R_5$ to form a ring. In addition, $A_2$ may be combined with $R_7$ or $R_8$ to form a ring.

In an embodiment, the emission layer EML may include as a suitable (e.g., known) dopant material, styryl derivatives (for example, 1,4-bis[2-(3-N-ethylcarbazolyl)vinyl]benzene (BCzVB), 4-(di-p-tolylamino)-4'-[(di-p-tolylamino)styryl] stilbene (DPAVB), N-(4-((E)-2-(6-((E)-4-(diphenylamino) styryl) naphthalen-2-yl)vinyl)phenyl)-N-phenylbenzenamine (N-BDAVBi), and/or 4,4'-bis [2-(4-(N,N-diphenylamino)phenyl)vinyl]biphenyl(DPAVBi)), perylene and the derivatives thereof (for example, 2,5,8,11-tetra-t-butylperylene (TBP)), pyrene and/or the derivatives thereof (for example, 1,1-dipyrene, 1,4-dipyrenylbenzene, and/or 1,4-bis(N,N-diphenylamino) pyrene), etc.

The emission layer EML may include a suitable (e.g., known) phosphorescence dopant material. For example, the phosphorescence dopant may use a metal complex including iridium (Ir), platinum (Pt), osmium (Os), gold (Au), titanium (Ti), zirconium (Zr), hafnium (Hf), europium (Eu), terbium (Tb) or thulium (Tm). For example, iridium (III) bis(4,6-difluorophenylpyridinato-N,C2') picolinate (Frpic), bis(2,4-difluorophenylpyridinato)-tetrakis(1-pyrazolyl) borate iridium (III) (Fir6), and/or platinum octaethyl porphyrin (PtOEP) may be utilized as the phosphorescence dopant. However, an embodiment of the present disclosure is not limited thereto.

The emission layer EML may include a quantum dot material. The core of the quantum dot may be selected from a Group II-VI compound, a Group III-VI compound, a Group I-III-VI compound, a Group III-V compound, a Group IV-VI compound, a Group IV element, a Group IV compound, and combinations thereof.

The Group II-VI compound may be selected from the group consisting of: a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The Group III-VI compound may include a binary compound such as $In_2S_3$ and/or $In_2Se_3$, a ternary compound such as $InGaS_3$ and/or $InGaSe_3$, or one or more optional combinations thereof.

The Group I-III-VI compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof, or a quaternary compound such as $AgInGaS_2$, and $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In some embodiments, the Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, and a quaternary compound selected from the group consisting of SnPbSSe, SnPbSeTe, SnPbSTe, and mixtures thereof. The Group IV element may be selected from the group consisting of Si, Ge, and a mixture thereof. The Group IV compound may be a binary compound selected from the group consisting of SiC, SiGe, and a mixture thereof.

In this case, the binary compound, the ternary compound, and/or the quaternary compound may be present at uniform concentration in a particle or may be present at a partially different concentration distribution state in the same particle. In addition, a core/shell structure in which one quantum dot is around (e.g., wraps) another quantum dot may be utilized. The interface of the core and the shell may have a concentration gradient in which the concentration of an element present in the shell is decreased toward the center of the core.

In some embodiments, the quantum dot may have the above-described core-shell structure including a core including a nanocrystal and a shell around (e.g., wrapping) the core. The shell of the quantum dot may play the role of a protection layer for preventing or reducing the chemical deformation of the core to maintain semiconductor properties and/or the role of a charging layer for imparting the quantum dot with electrophoretic properties. The shell may have a single layer or a multilayer structure. The interface of the core and the shell may have concentration gradient in which the concentration of an element present in the shell decreases toward a center of the core. Examples of the shell of the quantum dot may include a metal or a non-metal oxide, a semiconductor compound, or combinations thereof.

For example, the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and/or NiO, or a ternary compound such as $MgAl_2O_4$, $CoFe_2O_4$, $NiFe_2O_4$ and/or $CoMn_2O_4$, but the present disclosure is not limited thereto.

In some embodiments, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the present disclosure is not limited thereto.

The quantum dot may have a full width of half maximum (FWHM) of emission wavelength spectrum of about 45 nm or less, for example, about 40 nm or less, or, about 30 nm or less. Within these ranges, color purity and/or color reproducibility may be improved. In addition, light emitted via such quantum dot is emitted in all directions, and light view angle properties may be improved.

In addition, the shape of the quantum dot may be generally utilized shapes in the art, without specific limitation. For example, the shape may be spherical, pyramidal, multi-arm, or cubic nanoparticle, nanotube, nanowire, nanofiber, nanoplate particle, etc.

The quantum dot may control the color of light emitted according to the particle size, and accordingly, the quantum dot may have various suitable emission colors such as blue, red, and green.

In the light emitting device ED of an embodiment, as shown in FIG. 3 to FIG. 6, the electron transport region ETR is provided on the emission layer EML. The electron transport region ETR may include an electron blocking layer HBL, an electron transport layer ETL and/or an electron injection layer EIL. However, an embodiment of the present disclosure is not limited thereto.

The electron transport region ETR may have a single layer formed utilizing a single material, a single layer formed utilizing multiple different materials, or a multilayer structure having multiple layers formed utilizing multiple different materials.

For example, the electron transport region ETR may have a single layer structure of an electron injection layer EIL or an electron transport layer ETL, or a single layer structure formed utilizing an electron injection material and an electron transport material. Further, the electron transport region ETR may have a single layer structure formed utilizing multiple different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, from about 1,000 Å to about 1,500 Å.

The electron transport region ETR may be formed utilizing various suitable methods such as a vacuum deposition method, a spin coating method, a cast method, a Langmuir-Blodgett (LB) method, an inkjet printing method, a laser printing method, and/or a laser induced thermal imaging (LITI) method.

The electron transport region ETR may include a compound represented by Formula ET-1 below.

Formula ET-1

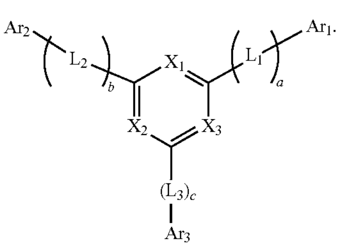

In Formula ET-1, at least one among $X_1$ to $X_3$ may be N, and the remainder may be $CR_a$. $R_a$ may be a hydrogen atom, a deuterium atom, a substituted or unsubstituted alkyl of 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_3$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, "a" to "c" may be each independently an integer of 0 to 10. In Formula ET-1, $L_1$ to $L_3$ may be each independently a direct linkage, a substituted or unsubstituted arylene group having 6 to 30 ring-forming carbon atoms, or a substituted or unsubstituted heteroarylene group having 2 to 30 ring-forming carbon atoms. In some embodiments, when "a" to "c" are integers of 2 or more, $L_1$ to $L_3$ may be each independently a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, an embodiment of the present disclosure is not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl) biphenyl-3-yl)-1,3,5-triazine, 2-(4-(N-phenylbenzoimidazolyl-1-ylphenyl)-9,10-dinaphthylanthracene, 1,3,5-tri (1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-$N^{1,08}$)-(1,1'-biphenyl-4-olato) aluminum (BAlq), berylliumbis(benzoquinolin-10-olate ($Bebq_2$), 9,10-di(naphthalene-2-yl) anthracene (ADN), 1,3-bis[3,5-di(pyridin-3-yl)phenyl]benzene (BmPyPhB), and mixtures thereof, without limitation.

The electron transport region ETR may include at least one among Compounds ET1 to FT36 below.

ET1

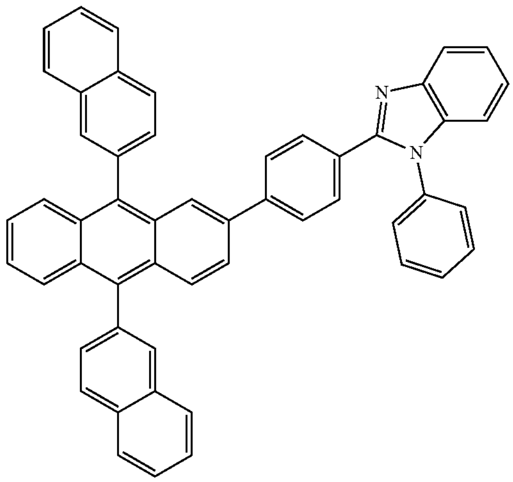

ET2

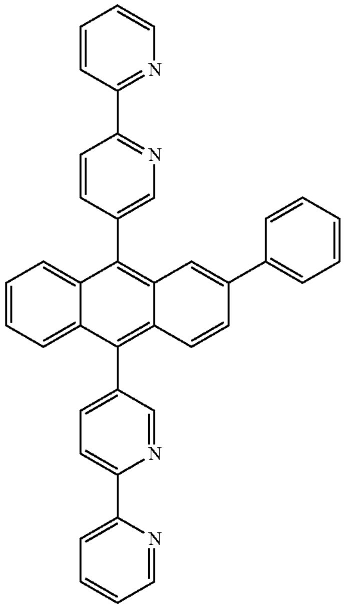

-continued
ET3
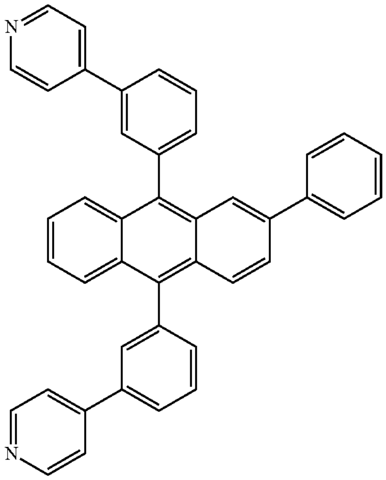
ET4
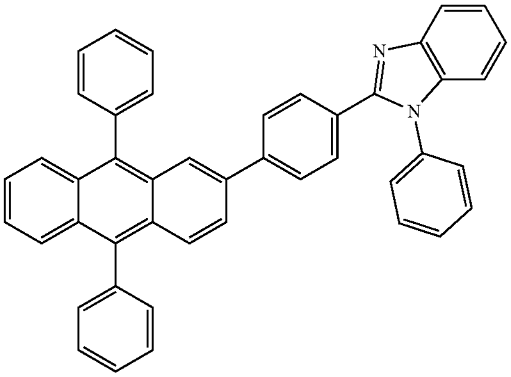
ET5
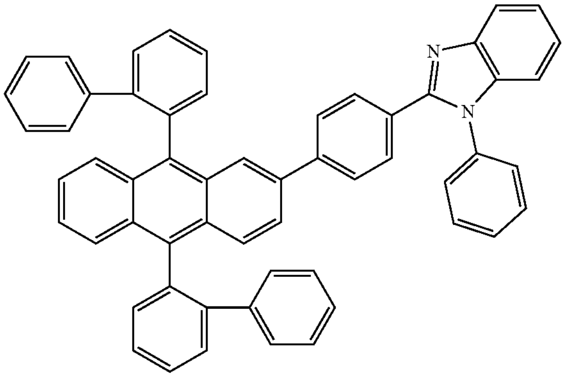
ET6
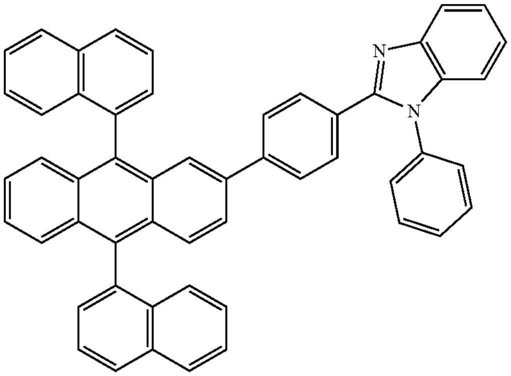
-continued
ET7
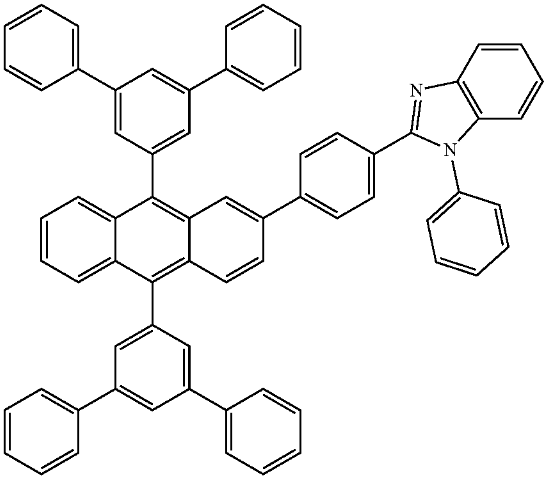
ET8
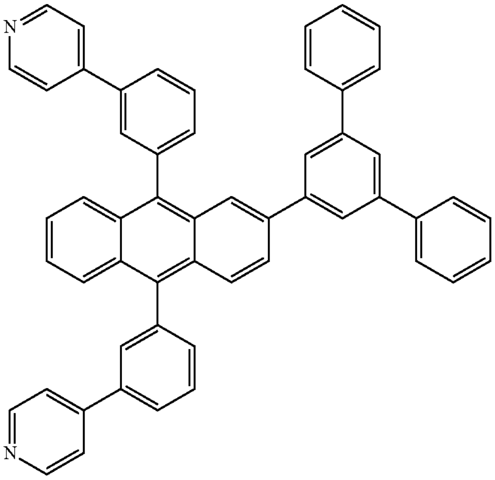
ET9
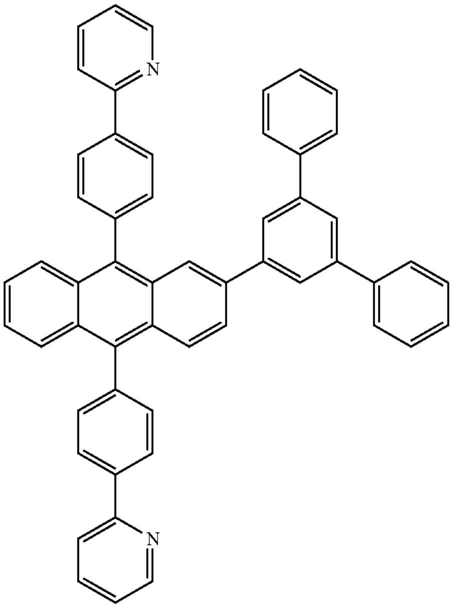

-continued
ET10
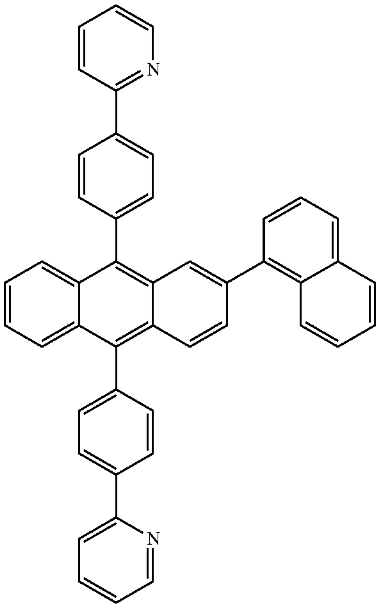
ET11
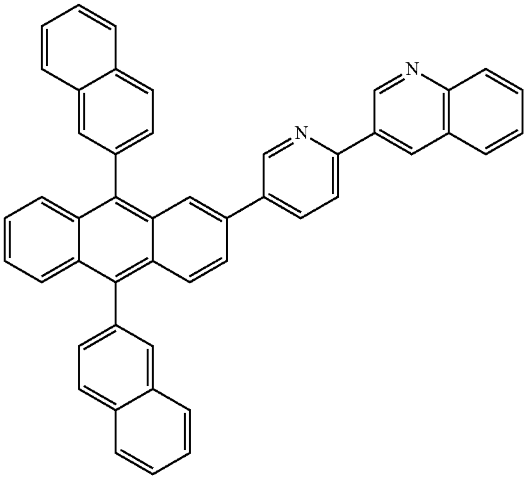
ET12
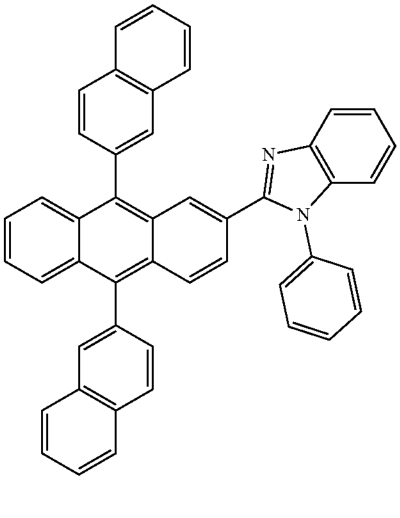
-continued
ET13
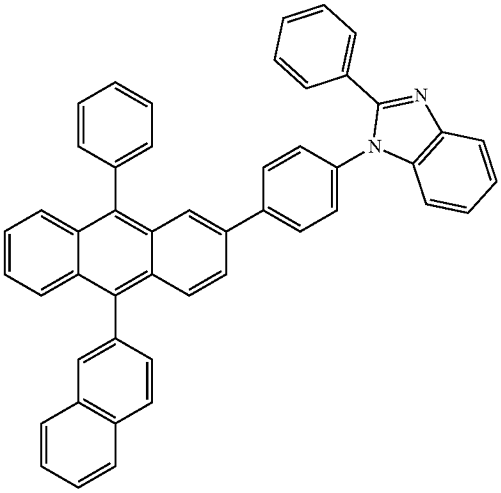
ET14
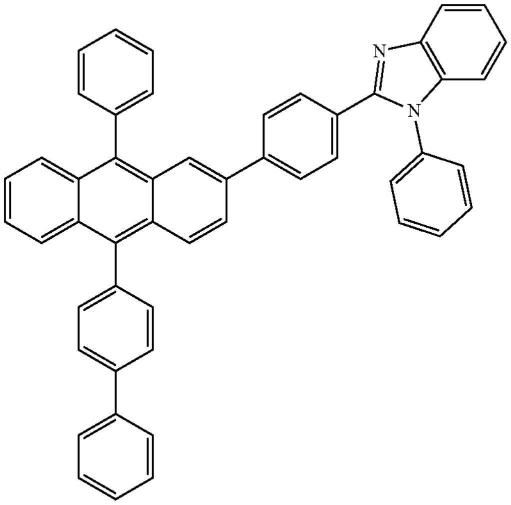
ET15
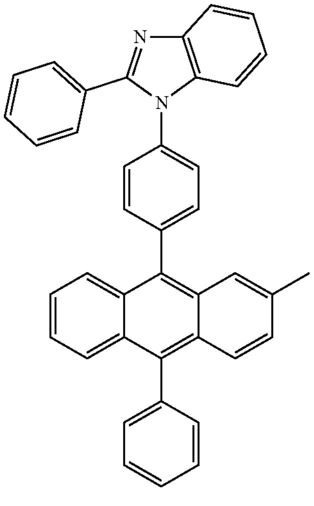

-continued
ET16
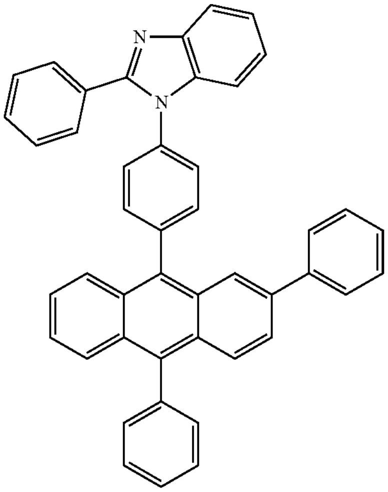
ET17
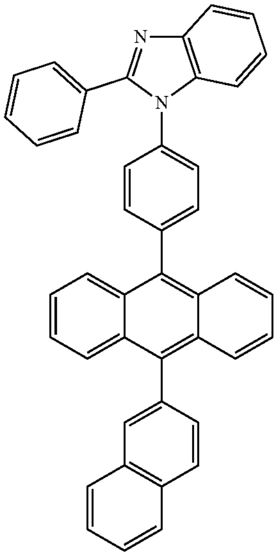
ET18
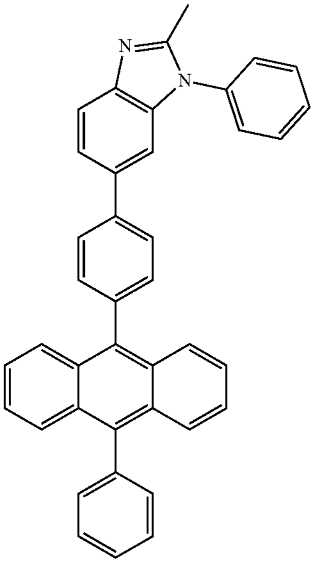
-continued
ET19
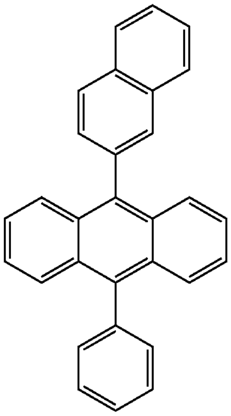
ET20
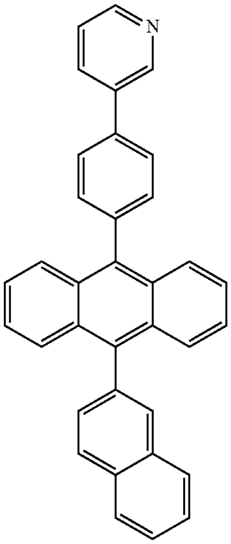
ET21
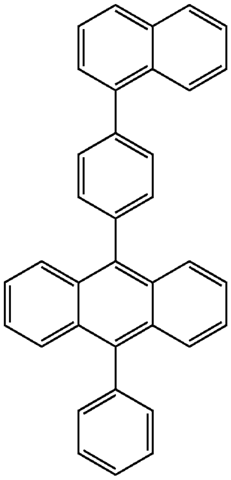

-continued
ET22
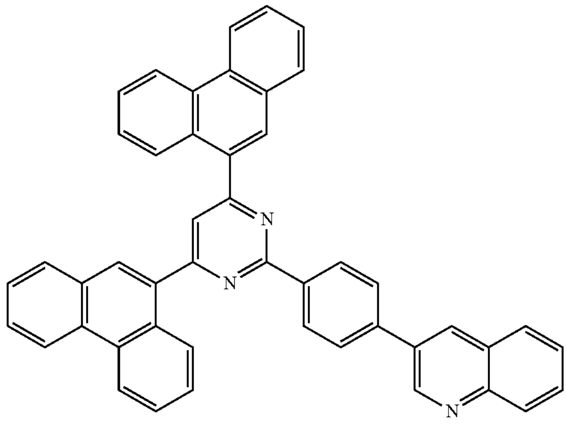
ET23
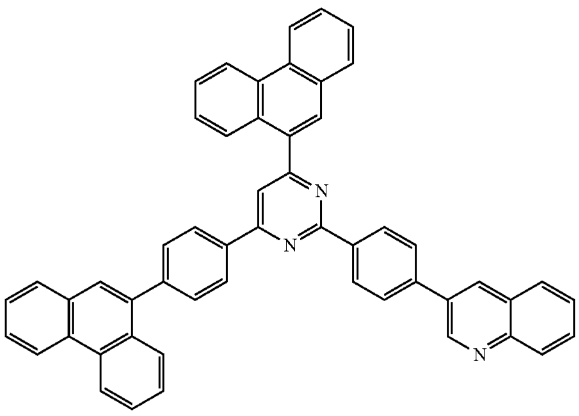
ET24
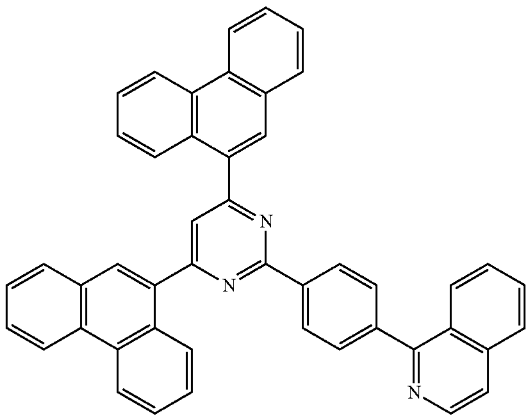
-continued
ET25
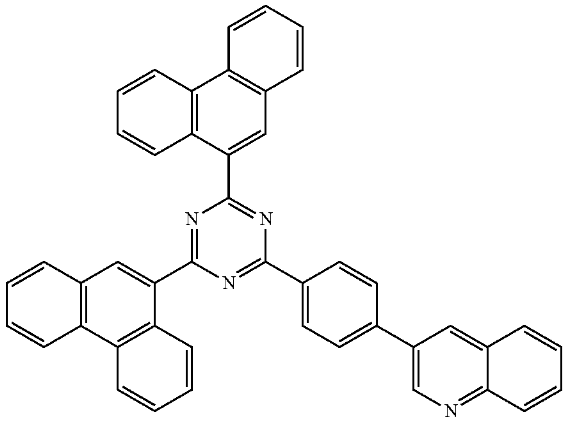
ET26
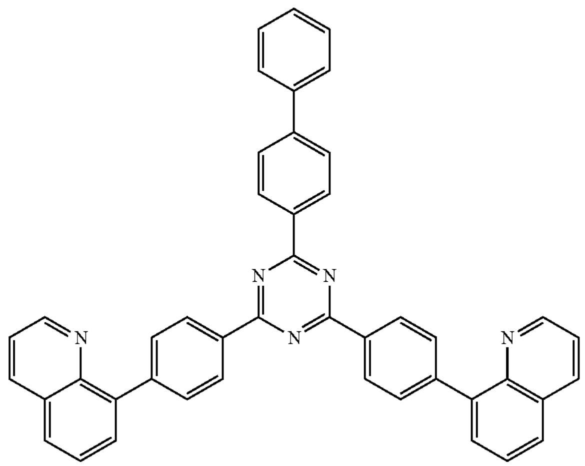
ET27
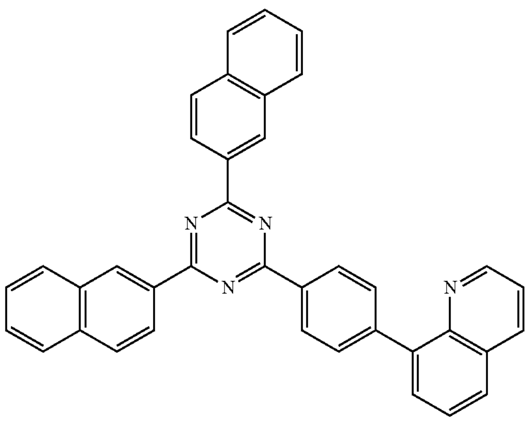

-continued
ET28
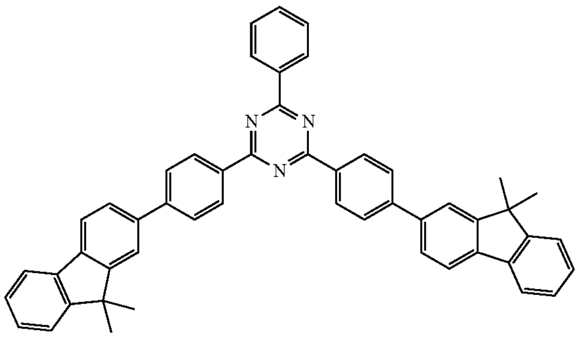
ET29
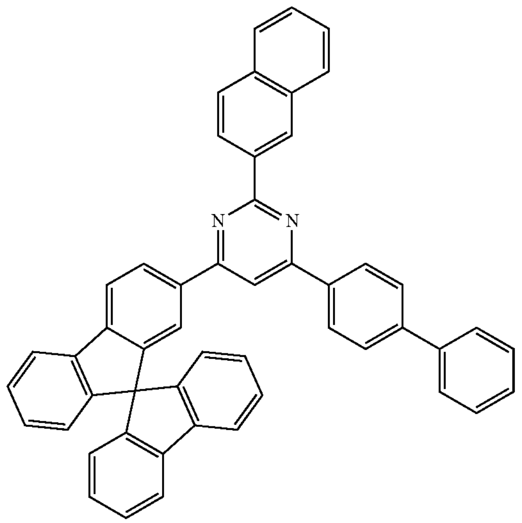
ET30
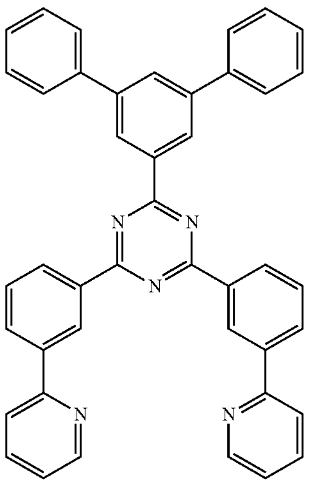
-continued
ET31
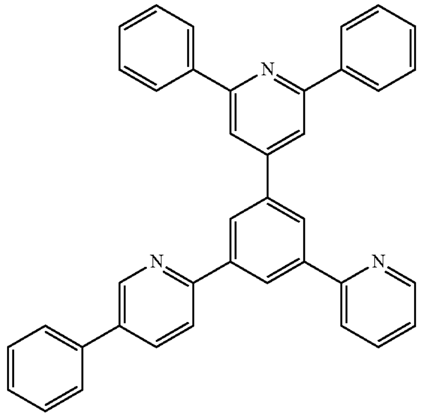
ET32
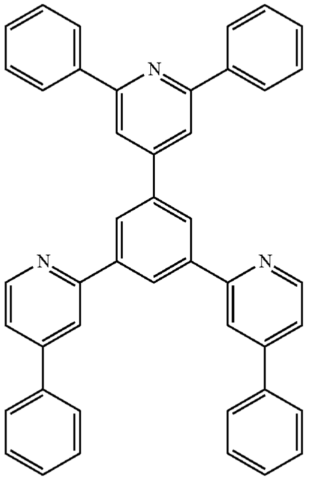
ET33
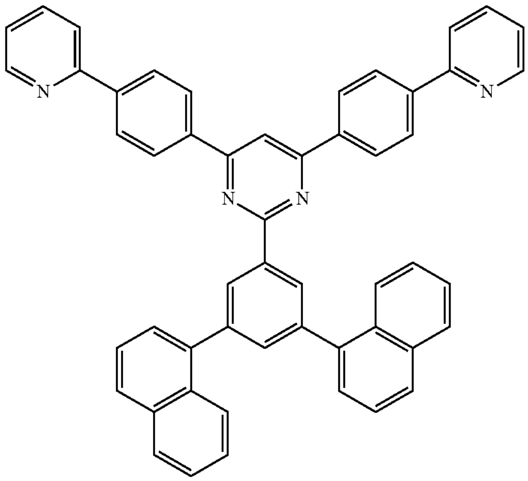

-continued

ET34

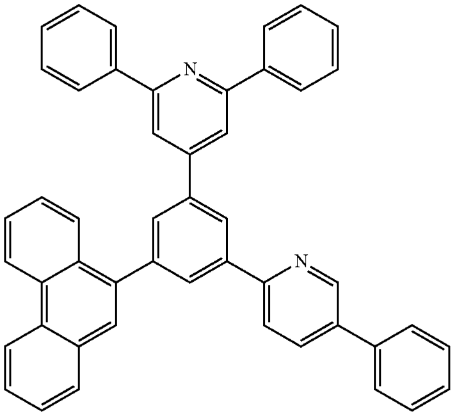

ET35

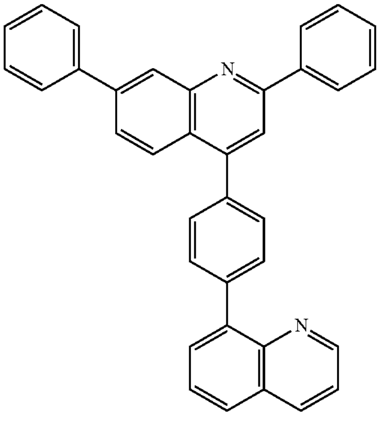

ET36

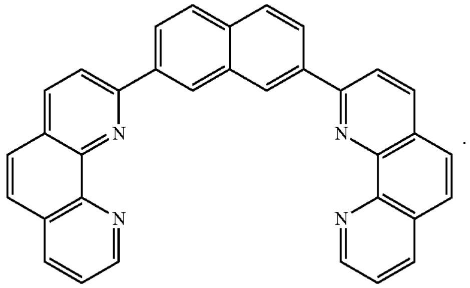

In some embodiments, the electron transport region ETR may include a metal halide (such as LiF, NaCl, CsF, RbCl, RbI, CuI and/or KI), a lanthanide metal (such as $Y_b$), or a co-depositing material of the metal halide and the lanthanide metal. For example, the electron transport region ETR may include KI: $Y_b$, RbI: $Y_b$, etc., as the co-depositing material. In some embodiments, the electron transport region ETR may utilize a metal oxide (such as $Li_2O$ and/or BaO), or 8-hydroxy-lithium quinolate (Liq). However, an embodiment of the present disclosure is not limited thereto. The electron transport region ETR also may be formed utilizing a mixture material of an electron transport material and an insulating organo metal salt. The organo metal salt may be a material having an energy band gap of about 4 eV or more. For example, the organo metal salt may include, for example, metal acetates, metal benzoates, metal acetoacetates, metal acetylacetonates, and/or metal stearates.

The electron transport region ETR may include at least one of 2,9-dimethyl-4,7-diphenyl-1,10-phenanthroline (BCP), or 4,7-diphenyl-1,10-phenanthroline (Bphen) in addition to the aforementioned materials. However, an embodiment of the present disclosure is not limited thereto.

The electron transport region ETR may include the compounds of the electron transport region in at least one among an electron injection layer EIL, an electron transport layer ETL, or a hole blocking layer HBL.

When the electron transport region ETR includes the electron transport layer ETL, the thickness of the electron transport layer ETL may be from about 100 Å to about 1,000 Å, for example, from about 150 Å to about 500 Å. When the thickness of the electron transport layer ETL satisfies the above-described ranges, satisfactory electron transport properties may be obtained without substantial increase of a driving voltage. When the electron transport region ETR includes the electron injection layer EIL, the thickness of the electron injection layer EIL may be from about 1 Å to about 100 Å, or from about 3 Å to about 90 Å. When the thickness of the electron injection layer EIL satisfies the above described ranges, satisfactory electron injection properties may be obtained without inducing substantial increase of a driving voltage.

The second electrode EL2 is provided on the electron transport region ETR. The second electrode EL2 may be a common electrode. The second electrode EL2 may be a cathode or an anode, but the present disclosure is not limited thereto. For example, when the first electrode EL1 is an anode, the second cathode EL2 may be a cathode, and when the first electrode EL1 is a cathode, the second electrode EL2 may be an anode.

The second electrode EL2 may be a transmissive electrode, a transflective electrode or a reflective electrode. When the second electrode EL2 is the transmissive electrode, the second electrode EL2 may include a transparent metal oxide, for example, ITO, IZO, ZnO, ITZO, etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, $Y_b$, W, In, Zn, Sn, one or more compounds including thereof, or one or more mixtures thereof (for example, AgMg, AgYb, or MgAg). In some embodiments, the second electrode EL2 may have a multi-layered structure including a reflective layer or a transflective layer formed utilizing the above-described materials and a transparent conductive layer formed utilizing ITO, IZO, ZnO, ITZO, etc. For example, the second electrode EL2 may include the aforementioned metal materials, combinations of two or more metal materials selected from the aforementioned metal materials, or oxides of the aforementioned metal materials.

In some embodiments, the second electrode EL2 may be connected with an auxiliary electrode. When the second electrode EL2 is connected with the auxiliary electrode, the resistance of the second electrode EL2 may decrease.

In some embodiments, on the second electrode EL2 in the light emitting device ED of an embodiment, a capping layer CPL may be further disposed. The capping layer CPL may include a multilayer or a single layer.

In an embodiment, the capping layer CPL may be an organic layer or an inorganic layer. For example, when the capping layer CPL includes an inorganic material, the inorganic material may include an alkali metal compound such as LiF, an alkaline earth metal compound such as $MgF_2$, SION, SiNx, SiOy, etc.

For example, when the capping layer CPL includes an organic material, the organic material may include α-NPD, NPB, TPD, m-MTDATA, $Alq_3$, CuPc, N4,N4,N4',N4'-tetra (biphenyl-4-yl) biphenyl-4,4'-diamine (TPD15), 4,4',4"-tris (carbazol sol-9-yl)triphenylamine (TCTA), etc., or may include an epoxy resin, or an acrylate such as methacrylate. In some embodiments, a capping layer CPL may include at least one among Compounds P1 to P5 below, but the present disclosure is not limited thereto.

P1

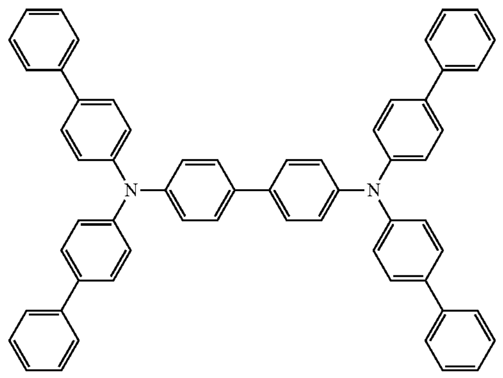

P2

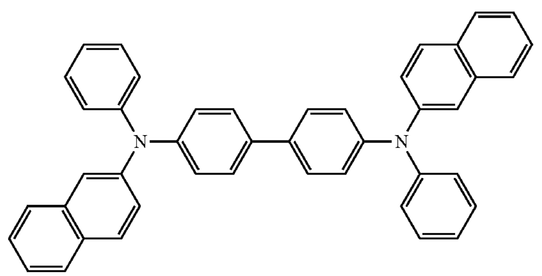

P3

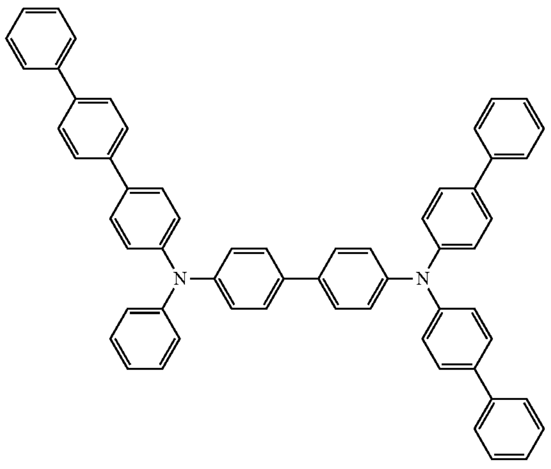

P4

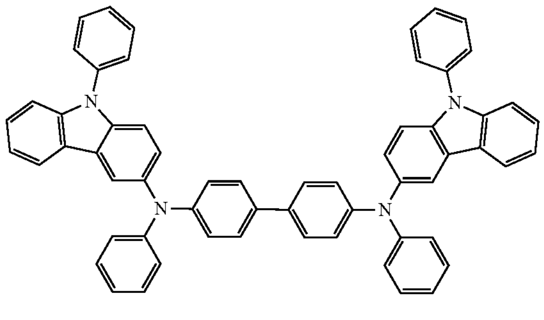

-continued

P5

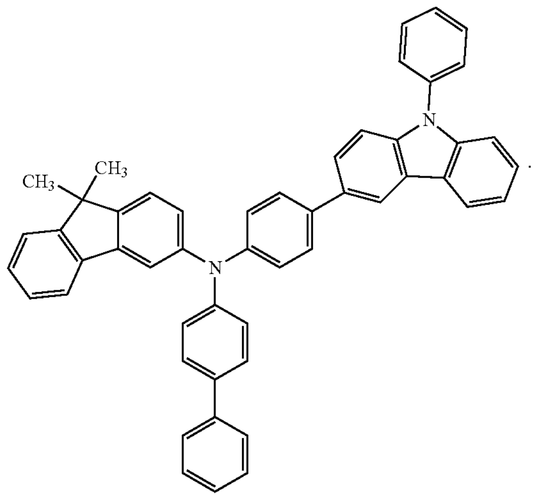

In some embodiments, the refractive index of the capping layer CPL may be about 1.6 or more. For example, the refractive index of the capping layer CPL with respect to light in a wavelength range of about 550 nm to about 660 nm may be about 1.6 or more.

Figure 7:
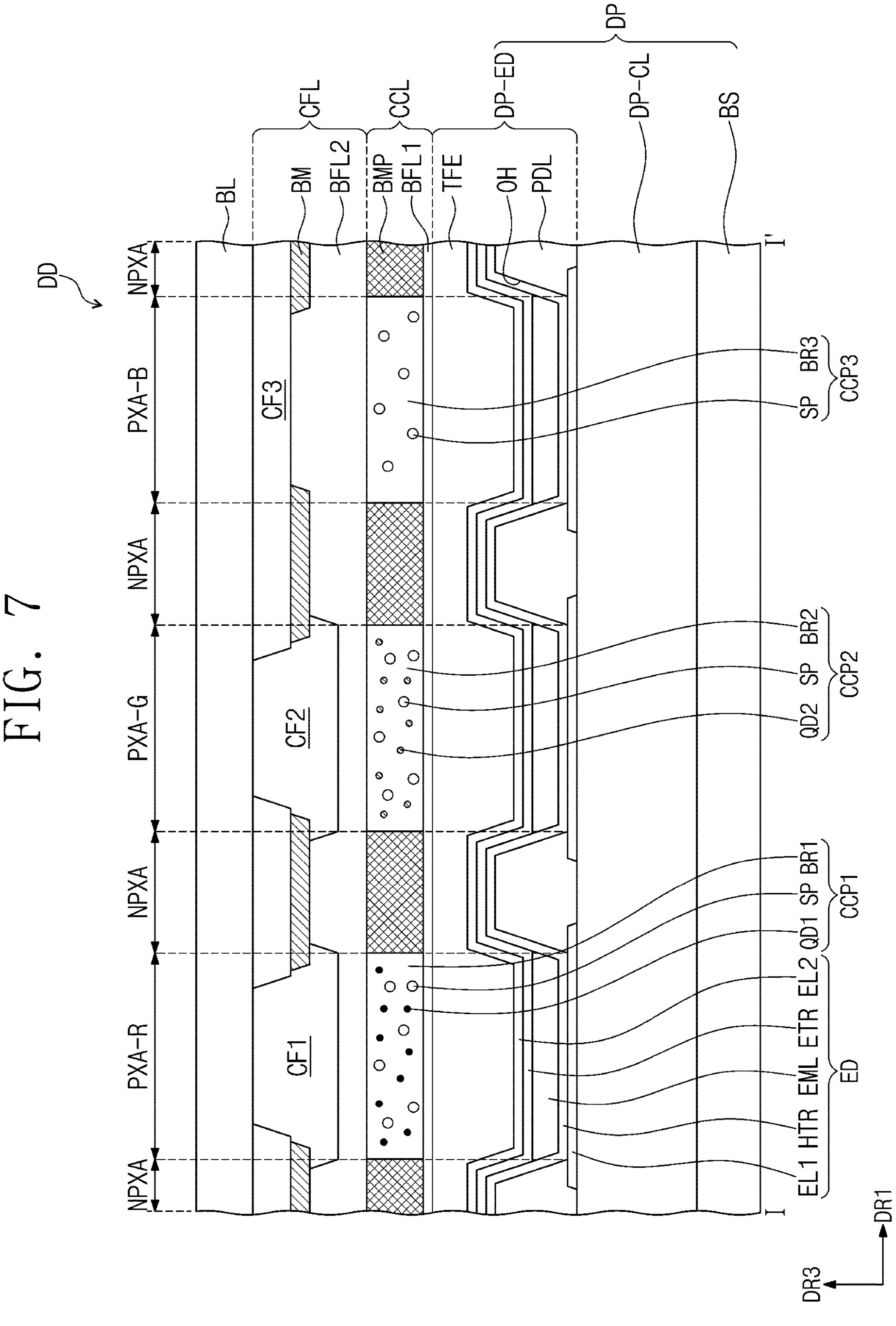
FIG. 7 is a cross-sectional view showing a display apparatus according to an embodiment of the present disclosure.
Figure 8:
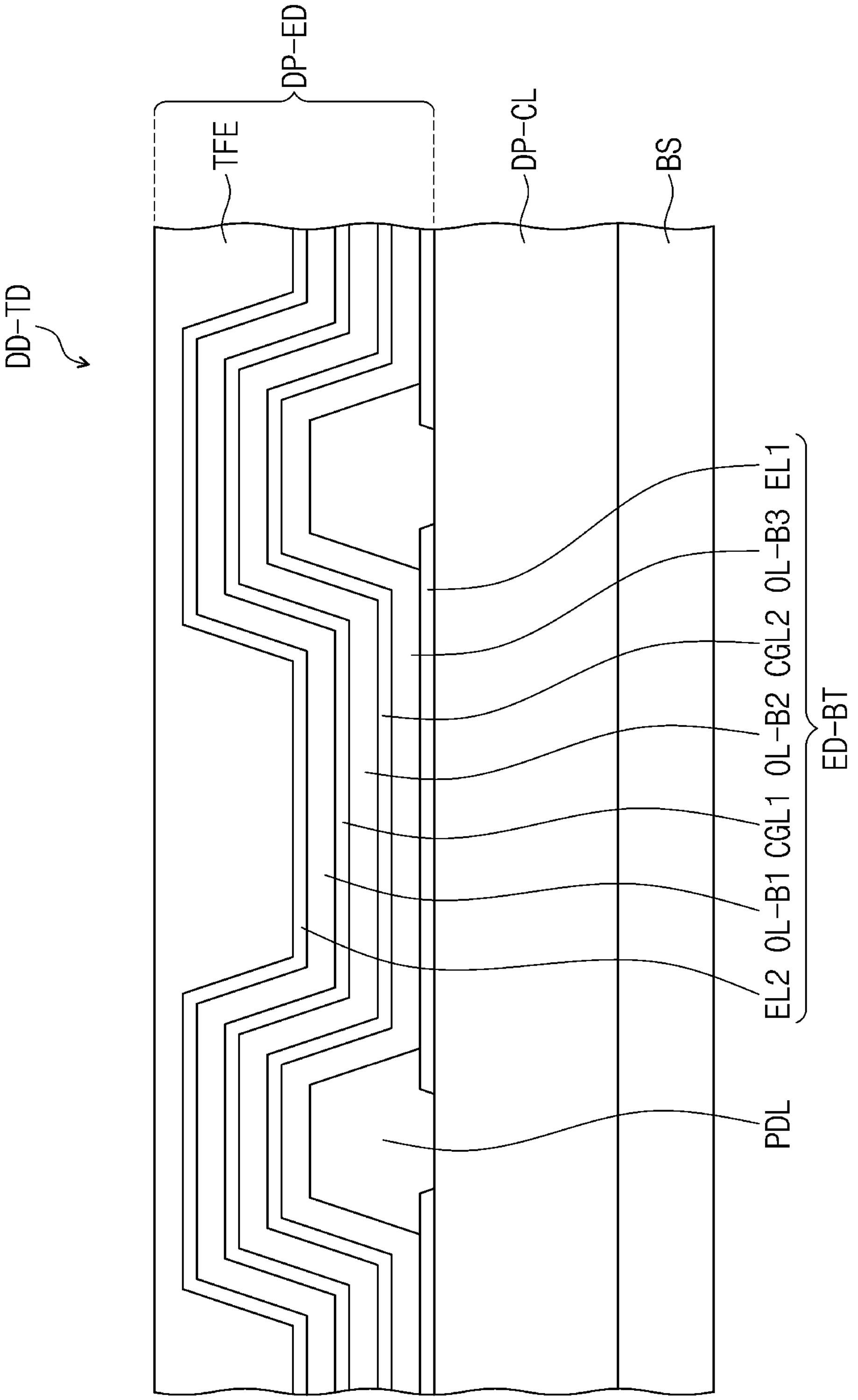
FIG. 8 is a cross-sectional view showing a display apparatus according to an embodiment of the present disclosure.

FIG. 7 and FIG. 8 are cross-sectional views on display apparatuses according to embodiments, respectively. In the explanation on the display apparatuses of embodiments, referring to FIG. 7 and FIG. 8, the overlapping parts with the explanation on FIG. 1 to FIG. 6 will not be explained again, and the different features will be explained chiefly.

Referring to FIG. 7, the display apparatus DD according to an embodiment may include a display panel DP including a display device layer DP-ED, a light controlling layer CCL on the display panel DP and a color filter layer CFL.

In an embodiment shown in FIG. 7, the display panel DP includes a base layer BS, a circuit layer DP-CL provided on the base layer BS and a display device layer DP-ED, and the display device layer DP-ED may include a light emitting device ED.

The light emitting device ED may include a first electrode EL1, a hole transport region HTR on the first electrode EL1, an emission layer EML on the hole transport region HTR, an electron transport region ETR on the emission layer EML, and a second electrode EL2 on the electron transport region ETR. The same structures of the light emitting devices of FIG. 3 to FIG. 6 may be applied to the structure of the light emitting device ED shown in FIG. 7.

Referring to FIG. 7, the emission layer EML may be in an opening part OH defined in a pixel definition layer PDL. For example, the emission layer EML divided by the pixel definition layer PDL and correspondingly provided to each of luminous areas PXA-R, PXA-G and PXA-B may emit light in the same wavelength region. In the display apparatus DD of an embodiment, the emission layer EML may emit blue light. In some embodiments, different from the drawings, the emission layer EML may be provided as a common layer for all luminous areas PXA-R, PXA-G and PXA-B.

The light controlling layer CCL may be on the display panel DP. The light controlling layer CCL may include a light converter. The light converter may be a quantum dot or a phosphor. The light converter may transform the wavelength of light provided and then emit (e.g., emit a different color light). For example, the light controlling layer CCL may be a layer including a quantum dot or a layer including a phosphor.

The light controlling layer CCL may include multiple light controlling parts CCP1, CCP2 and CCP3. The light controlling parts CCP1, CCP2 and CCP3 may be separated from one another.

Referring to FIG. 7, a partition pattern BMP may be between the separated light controlling parts CCP1, CCP2 and CCP3, but the present disclosure is not limited thereto. In FIG. 7, the partition pattern BMP is shown not to be overlapped with the light controlling parts CCP1, CCP2 and CCP3, but in some embodiments, at least a portion of the edge of the light controlling parts CCP1, CCP2 and CCP3 may be overlapped with the partition pattern BMP.

The light controlling layer CCL may include a first light controlling part CCP1 including a first quantum dot QD1 to convert a first color light provided from the light emitting device ED into a second color light, a second light controlling part CCP2 including a second quantum dot QD2 to convert the first color light into a third color light, and a third light controlling part CCP3 to transmit the first color light.

In an embodiment, the first light controlling part CCP1 may provide red light which is the second color light, and the second light controlling part CCP2 may provide green light which is the third color light. The third color controlling part CCP3 may transmit and provide blue light which is the first color light provided from the light emitting device ED. For example, the first quantum dot QD1 may be a red quantum dot, and the second quantum dot QD2 may be a green quantum dot. For the quantum dots QD1 and QD2, the same contents as those described above may be applied.

In some embodiments, the light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but may include the scatterer SP.

The scatterer SP may be an inorganic particle. For example, the scatterer SP may include at least one among $TiO_2$, ZnO, $Al_2O_3$, $SiO_2$, and hollow silica. The scatterer SP may include at least one among $TiO_2$, ZnO, $Al_2O_3$, $SiO_2$, and hollow silica, or may be a mixture of two or more materials selected among $TiO_2$, ZnO, $Al_2O_3$, $SiO_2$, and hollow silica.

The first light controlling part CCP1, the second light controlling part CCP2, and the third light controlling part CCP3 may include base resins BR1, BR2 and BR3 respectively dispersing the quantum dots QD1 and QD2 and the scatterer SP. In an embodiment, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatterer particle SP dispersed in the third base resin BR3. The base resins BR1, BR2 and BR3 are mediums in which the quantum dots QD1 and QD2 and the scatterer SP are dispersed, and may be composed of various suitable resin compositions which may be generally referred to as a binder. For example, the base resins BR1, BR2 and BR3 may be one or more acrylic resins, urethane-based resins, silicone-based resins, epoxy-based resins, etc. The base resins BR1, BR2 and BR3 may be transparent resins. In an embodiment, the first base resin BR1, the second base resin BR2 and the third base resin BR3 may be the same or different from each other.

The light controlling layer CCL may include a barrier layer BFL1. The barrier layer BFL1 may play the role of blocking or reducing the penetration of moisture and/or oxygen (hereinafter, will be referred to as "humidity/oxygen"). The barrier layer BFL1 may be on the light controlling parts CCP1, CCP2 and CCP3 to block or reduce the exposure of the light controlling parts CCP1, CCP2 and CCP3 to humidity/oxygen. In some embodiments, the barrier layer BFL1 may cover the light controlling parts CCP1, CCP2 and CCP3. In some embodiments, the barrier layer BFL2 may be provided between a color filter layer CFL and the light controlling parts CCP1, CCP2 and CCP3.

The barrier layers BFL1 and BFL2 may include at least one inorganic layer. For example, the barrier layers BFL1 and BFL2 may be formed by including an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride and/or a metal thin film for securing light transmittance. In some embodiments, the barrier layers BFL1 and BFL2 may further include an organic layer. The barrier layers BFL1 and BFL2 may be composed of a single layer of multiple layers.

In the display apparatus DD of an embodiment, the color filter layer CFL may be on the light controlling layer CCL. For example, the color filter layer CFL may be directly on the light controlling layer CCL. In this case, the barrier layer BFL2 may be omitted.

The color filter layer CFL may include a light blocking part BM and filters CF1, CF2 and CF3. The color filter layer CFL may include a first filter CF1 transmitting second color light, a second filter CF2 transmitting third color light, and a third filter CF3 transmitting first color light. For example, the first filter CF1 may be a red filter, the second filter CF2 may be a green filter, and the third filter CF3 may be a blue filter. Each of the filters CF1, CF2 and CF3 may include a polymer photosensitive resin and a pigment and/or dye. The first filter CF1 may include a red pigment and/or dye, the second filter CF2 may include a green pigment and/or dye, and the third filter CF3 may include a blue pigment and/or dye. In some embodiments, an embodiment of the present disclosure is not limited thereto, and the third filter CF3 may not include the pigment or dye. The third filter CF3 may include a polymer photosensitive resin and not include a pigment or dye. The third filter CF3 may be transparent. The third filter CF3 may be formed utilizing a transparent photosensitive resin.

In some embodiments, in an embodiment, the first filter CF1 and the second filter CF2 may be yellow filters. The first filter CF1 and the second filter CF2 may be provided in one body without distinction.

The light blocking part BM may be a black matrix. The light blocking part BM may be formed by including an organic light blocking material or an inorganic light blocking material including a black pigment or black dye. The light blocking part BM may prevent or reduce light leakage phenomenon and divide the boundaries among adjacent filters CF1, CF2 and CF3. In an embodiment, the light blocking part BM may be formed as a blue filter.

Each of the first to third filters CF1, CF2 and CF3 may be disposed to respectively correspond to a red luminous area PXA-R, a green luminous area PXA-G, and a blue luminous area PXA-B.

On the color filter layer CFL, an upper base layer BL may be disposed. The upper base layer BL may be a member providing a base surface on which the color filter layer CFL, the light controlling layer CCL, etc. are disposed. The upper base layer BL may be a glass substrate, a metal substrate, a plastic substrate, etc. However, an embodiment of the present disclosure is not limited thereto, and the upper base layer BL may be an inorganic layer, an organic layer, or a composite material layer. In some embodiments, different from the drawing, the upper base layer BL may be omitted in an embodiment.

FIG. 8 is a cross-sectional view showing a portion of the display apparatus according to an embodiment. In FIG. 8, the cross-sectional view of a portion corresponding to the display panel DP in FIG. 7 is shown. In a display apparatus DD-TD of an embodiment, the light emitting device ED-BT may include multiple light emitting structures OL-B1, OL-B2 and OL-B3. The light emitting device ED-BT may include oppositely disposed first electrode EL1 and second electrode EL2, and the multiple light emitting structures OL-B1, OL-B2 and OL-B3 stacked in order in a thickness direction and provided between the first electrode EL1 and the second electrode EL2. Each of the light emitting structures OL-B1, OL-B2 and OL-B3 may include an emission layer EML (FIG. 7), and a hole transport region HTR and an electron transport region ETR with the emission layer EML (FIG. 7) therebetween.

For example, the light emitting device ED-BT included in the display apparatus DD-TD of an embodiment may be a light emitting device of a tandem structure including multiple emission layers.

In an embodiment shown in FIG. 8, light emitted from the light emitting structures OL-B1, OL-B2 and OL-B3 may be all blue light. However, an embodiment of the present disclosure is not limited thereto, and the wavelength regions of light emitted from the light emitting structures OL-B1, OL-B2 and OL-B3 may be different from each other. For example, the light emitting device ED-BT including the multiple light emitting structures OL-B1, OL-B2 and OL-B3 emitting light in different wavelength regions may emit white light.

Between neighboring light emitting structures OL-B1, OL-B2 and OL-B3, a charge generating layer CGL1 and CGL2 may be respectively disposed. The charge generating layer CGL1 and CGL2 may include a p-type charge generating layer and/or an n-type charge generating layer.

The fused polycyclic compound of an embodiment includes two plate-type skeleton structures, each of which includes one boron atom and one carbazole moiety in a resonance structure, and two plate-type skeleton structures have a directly bonded structure via benzene rings which are not connected with boron in the carbazole moieties. Accordingly, the fused polycyclic compound of an embodiment forms a broad conjugation structure, and when the fused polycyclic compound of an embodiment is utilized as a light emitting material for a light emitting device, the high efficiency of the light emitting device may be achieved.

Hereinafter, the fused polycyclic compound according to an embodiment and the light emitting device of an embodiment will be particularly explained referring to embodiments and comparative embodiments. The embodiments below are only illustrations to assist the understanding of the present disclosure, and the scope of the present disclosure is not limited thereto.

EXAMPLES

1. Synthesis of Fused Polycyclic Compound

First, the synthesis method of a fused polycyclic compound according to an embodiment will be explained in particular to illustrate the synthesis methods of Compounds 4, 9, 11, 27, 34, 115, 144, and 154. In addition, the synthesis methods of the fused polycyclic compounds explained hereinafter are embodiments, and the synthesis method of the fused polycyclic compound according to an embodiment of the present disclosure is not limited to the embodiments below.

(1) Synthesis of Compound 4

Fused Polycyclic Compound 4 according to an embodiment may be synthesized, for example, by the reaction below.

Synthesis of Intermediate 4-1

Reaction 1-1

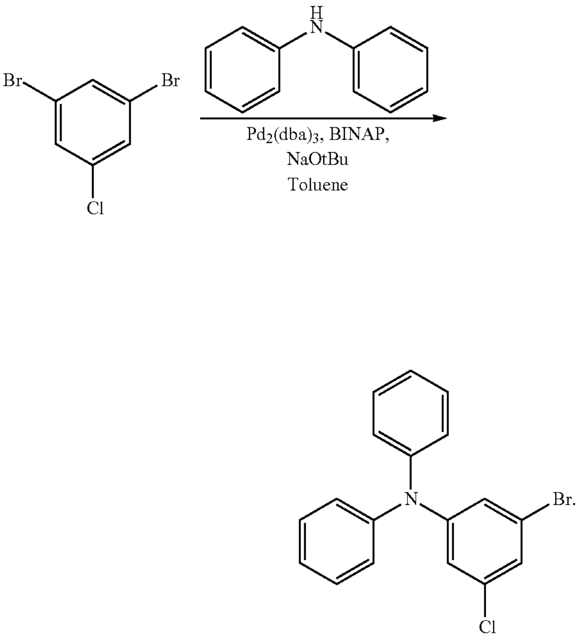

4-1

1,3-dibromo-5-chlorobenzene (1 eq), diphenylamine (1 eq), tris(dibenzylideneacetone) dipalladium (0) (0.05 eq), BINAP (0.1 eq), and sodium tert-butoxide (2 eq) were dissolved in toluene and stirred under a nitrogen atmosphere at about 80 degrees centigrade (e.g., Celsius,° C.) for about 12 hours. After cooling, the reaction solution was dried under a reduced pressure to remove toluene. Then, the resultant product was washed with ethyl acetate and water three times, and an organic layer obtained was dried with $MgSO_4$ and then, dried under a reduced pressure. By separating through column chromatography (n-hexane), Intermediate 4-1 was obtained (yield: 75%).

Synthesis of Intermediate 4-2

Reaction 1-2

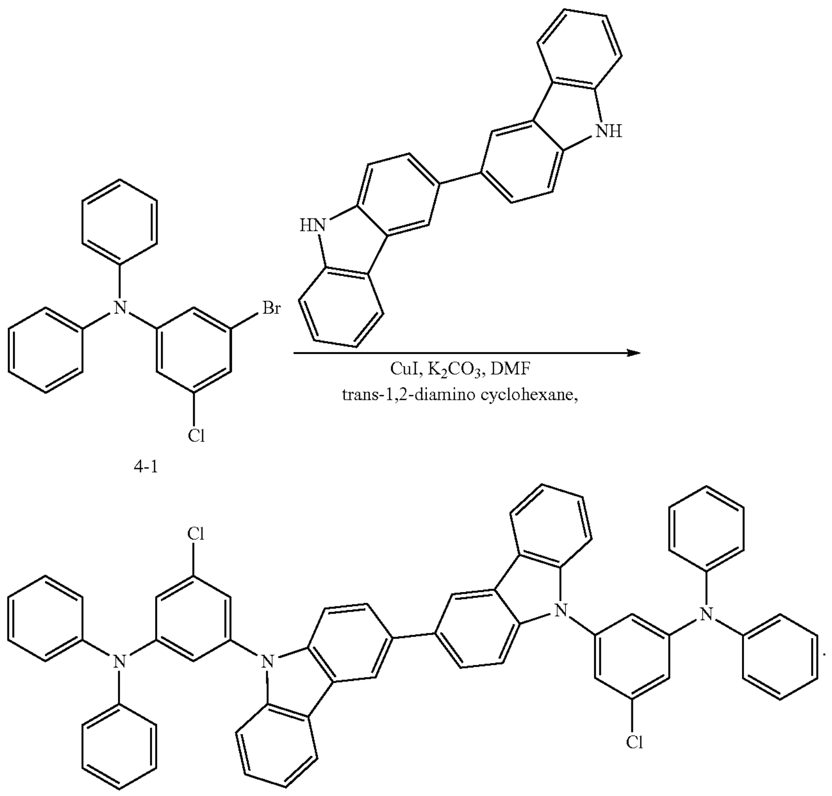

4-1

4-2

Intermediate 4-1 (1 eq), 9H,9'H-3,3'-bicarbazole (0.5 eq), CuI (0.5 eq), trans-1,2-diaminocyclohexane (0.5 eq), and $K_2CO_3$ (4 eq) were dissolved in DMF and stirred under a nitrogen atmosphere at about 160° C. for about 24 hours. After cooling, the reaction solution was dried under a reduced pressure to remove DMF. Then, the resultant product was washed with ethyl acetate and water three times, and an organic layer obtained was dried with $MgSO_4$ and then, dried under a reduced pressure. By separating through column chromatography (dichloromethane: n-hexane), Intermediate 4-2 was obtained (yield: 64%).

Synthesis of Intermediate 4-3

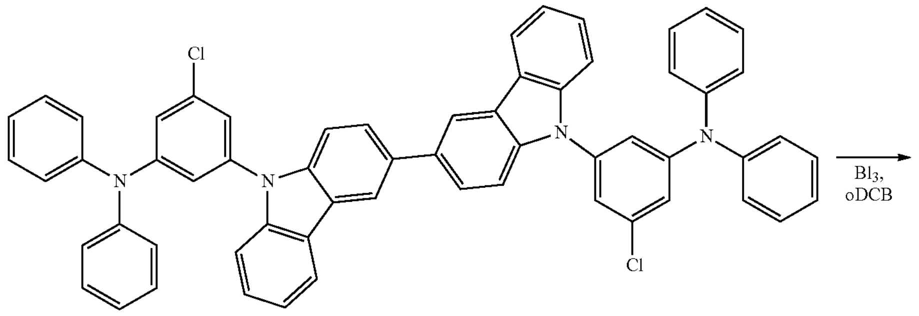

4-2

-continued

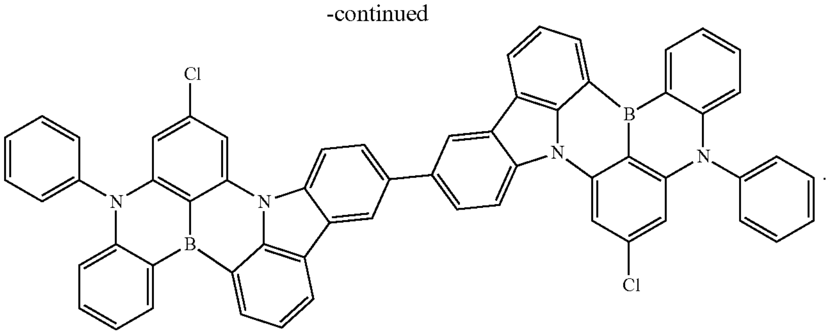

4-3

Intermediate 4-2 (1 eq), and BI3 (1.5 eq) were dissolved in ortho dichlorobenzene in a flask under a nitrogen atmosphere and heated to about 140° C. and stirred for about 6 hours. After cooling to 0° C., triethylamine was added to the flask slowly and dropwisely until heating stopped to finish the reaction, then hexane was added for precipitation, and the solid content was obtained through filtering. The solid content thus obtained was separated by column chromatography (dichloromethane: n-hexane) and then, separated again by recrystallization to obtain Intermediate 4-3. Then, final separation was performed by sublimation purification (yield after sublimation: 15.3%).

Synthesis of Compound 4

Intermediate 4-3 (1 eq), di([1,1'-biphenyl]-4-yl)amine (2.1 eq), tris(dibenzylideneacetone) dipalladium (0) (0.05 eq), tri-tert-butylphosphine (0.1 eq), and sodium tert-butoxide (3 eq) were dissolved in ortho xylene and stirred under a nitrogen atmosphere at about 140° C. for about 24 hours. After cooling, the reaction solution was dried under a reduced pressure to remove ortho xylene. Then, the resultant product was washed with dichloromethane and water three times, and an organic layer obtained was dried with $MgSO_4$ and then, dried under a reduced pressure. After separation by column chromatography (dichloromethane: n-hexane), sublimation purification was performed. Compound 4 was thereby obtained (yield: 68%).

Reaction 1-4

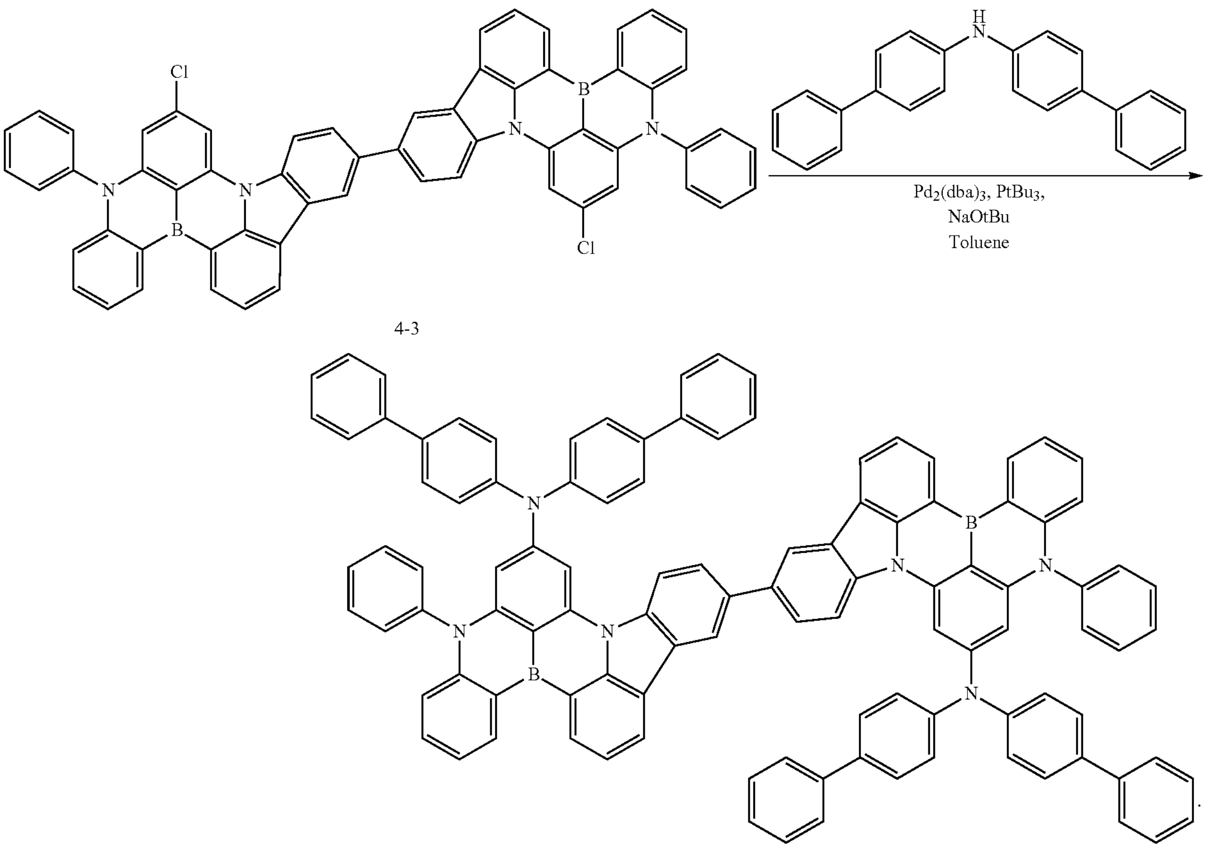

4-3

4

(2) Synthesis of Compound 9

Fused Polycyclic Compound 9 according to an embodiment may be synthesized by, for example, the reaction below.

Synthesis of Intermediate 9-1

Reaction 2-1

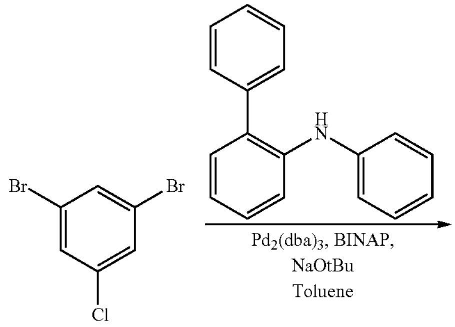

-continued

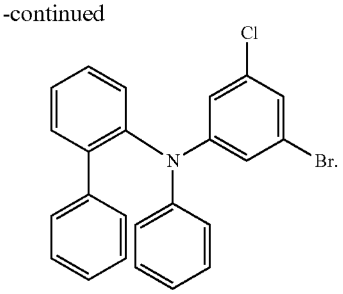

9-1

1,3-dibromo-5-chlorobenzene (1 eq), N-phenyl-[1,1'-biphenyl]-2-amine (1 eq), tris(dibenzylideneacetone) dipalladium (0) (0.05 eq), BINAP (0.1 eq), and sodium tert-butoxide (2 eq) were dissolved in toluene and stirred under a nitrogen atmosphere at about 85° C. for about 12 hours. After cooling, the reaction solution was dried under a reduced pressure to remove toluene. Then, the resultant product was washed with ethyl acetate and water three times, and an organic layer obtained was dried with $MgSO_4$ and then, dried under a reduced pressure. Through column chromatography (dichloromethane: n-hexane), Intermediate 9-1 was obtained (yield: 77%).

Synthesis of Intermediate 9-2

Reaction 2-2

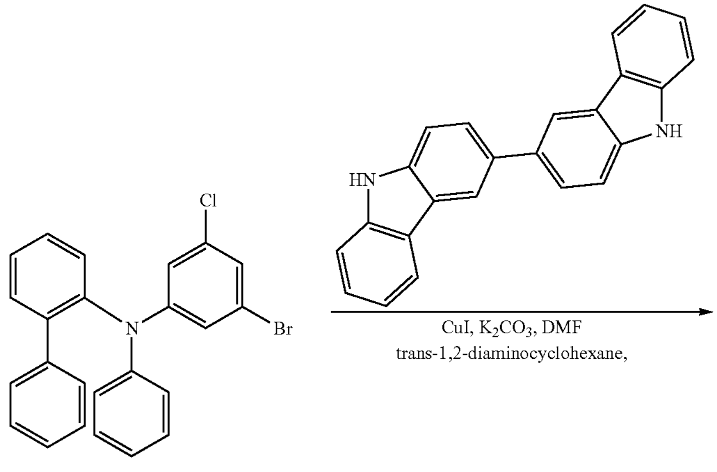

9-1

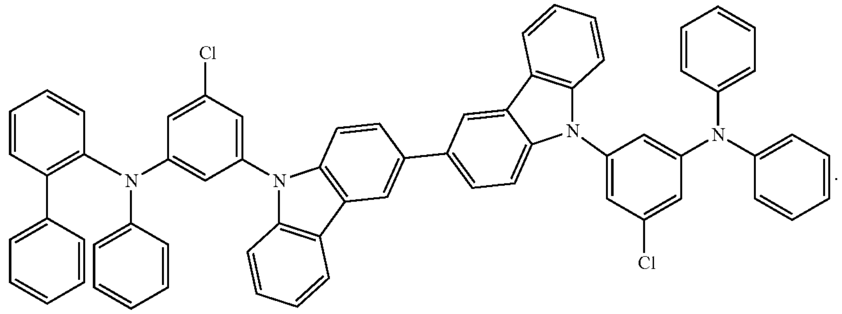

9-2

Intermediate 9-1 (1 eq), 9H,9'H-3,3'-bicarbazole (0.5 eq), CuI (0.5 eq), trans-1,2-diaminocyclohexane (0.5 eq), and $K_2CO_3$ (4 eq) were dissolved in DMF and stirred under a nitrogen atmosphere at about 160° C. for about 24 hours. After cooling, the reaction solution was dried under a reduced pressure to remove DMF. Then, the resultant product was washed with ethyl acetate and water three times, and an organic layer obtained was dried with $MgSO_4$ and then, dried under a reduced pressure. Through column chromatography (dichloromethane: n-hexane), Intermediate 9-2 was obtained (yield: 61%).

Synthesis of Intermediate 9-3

Reaction 2-3

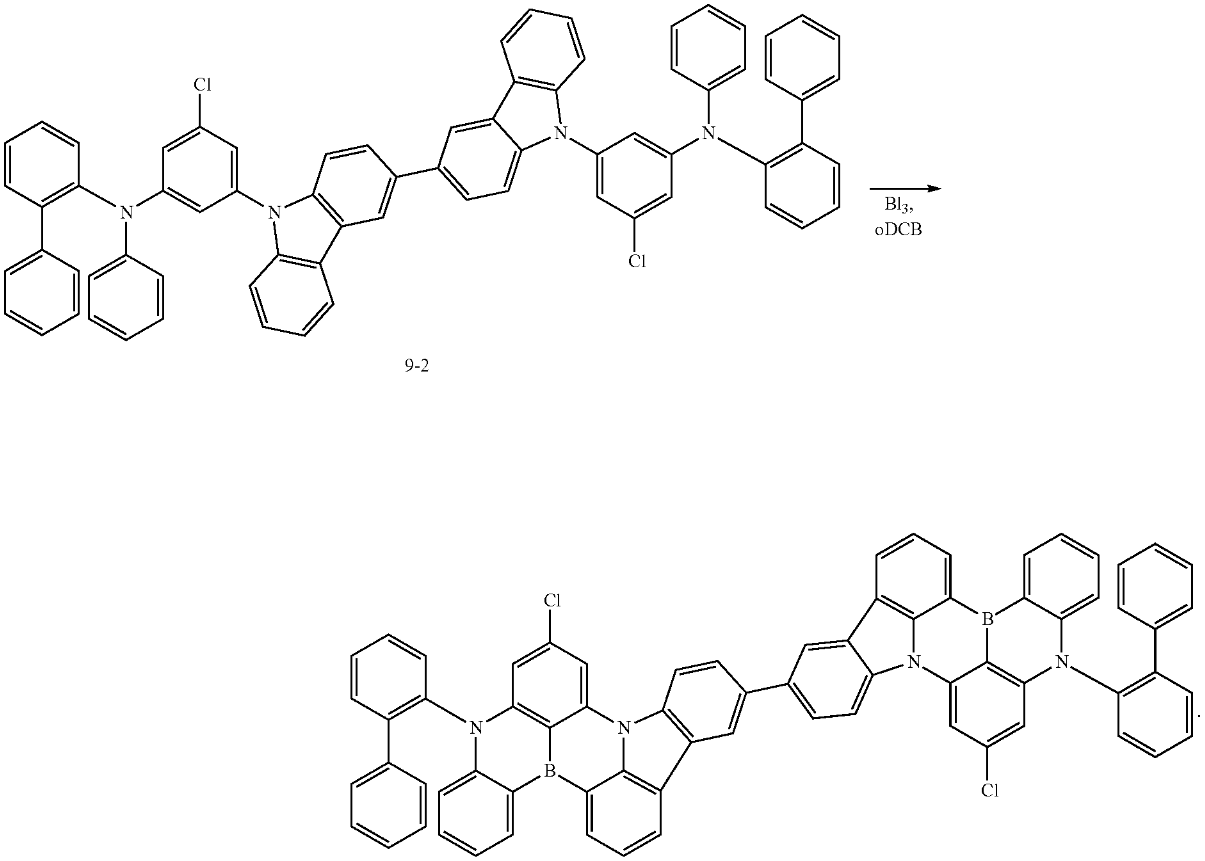

9-2

9-3

Intermediate 9-2 (1 eq), and $BI_3$ (1.5 eq) were dissolved in ortho dichlorobenzene in a flask under a nitrogen atmosphere and heated to about 140° C. and stirred for about 5 hours. After cooling to 0° C., triethylamine was added to the flask slowly and dropwisely until heating stopped to finish the reaction, then hexane was added for precipitation, and the solid content was obtained through filtering. The solid content thus obtained was separated by column chromatography (dichloromethane: n-hexane) and then separated again by recrystallization to obtain Intermediate 9-3. Then, final separation was performed by sublimation purification (yield: 26.8%).

Synthesis of Compound 9

Reaction 2-4

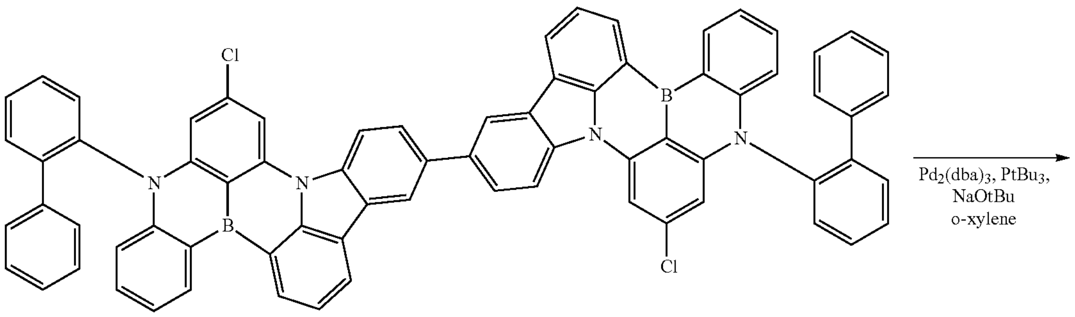

9-3

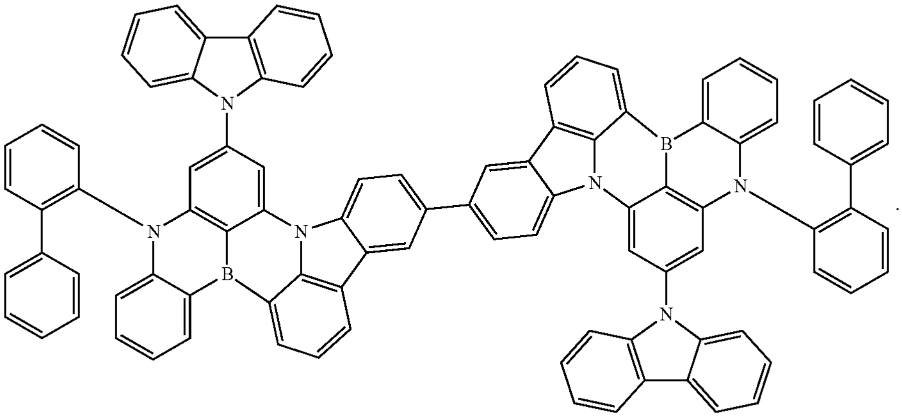

9

Intermediate 9-3 (1 eq), 9H-carbazole (2.2 eq), tris(dibenzylideneacetone) dipalladium (0) (0.05 eq), tri-tert-butylphosphine (0.1 eq), and sodium tert-butoxide (3 eq) were dissolved in ortho xylene and stirred under a nitrogen atmosphere at about 140° C. for about 24 hours. After cooling, the reaction was dried under a reduced pressure to remove ortho xylene. Then, the resultant product was washed with dichloromethane and water three times, and an organic layer obtained was dried with $MgSO_4$ and then, dried under a reduced pressure. After separation by column chromatography (dichloromethane: n-hexane), sublimation purification was performed. Compound 9 was thereby obtained (yield: 57%)

(3) Synthesis of Compound 11

Fused Polycyclic Compound 11 according to an embodiment may be synthesized by, for example, the reaction below.

Synthesis of Intermediate 11-1

Reaction 3-1

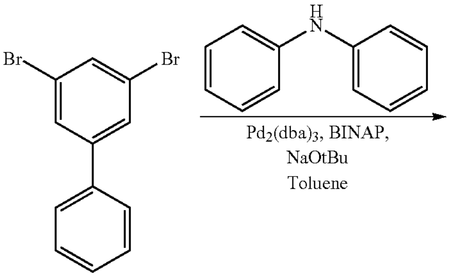

-continued

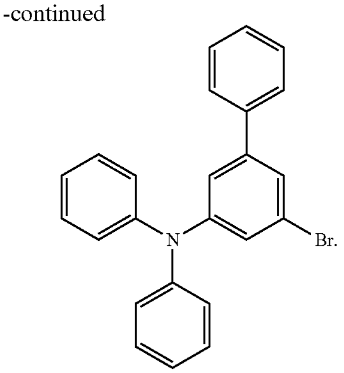

11-1

3,5-dibromo-1,1'-biphenyl (1 eq), diphenylamine (1 eq), tris(dibenzylideneacetone) dipalladium (0) (0.05 eq), BINAP (0.1 eq), and sodium tert-butoxide (2 eq) were dissolved in toluene and stirred under a nitrogen atmosphere at about 80° C. for about 12 hours. After cooling, the reaction solution was dried under a reduced pressure to remove toluene. Then, the resultant product was washed with ethyl acetate and water three times, and an organic layer obtained was dried with $MgSO_4$ and then, dried under a reduced pressure. Through column chromatography (n-hexane), Intermediate 11-1 was obtained (yield: 70%).

Synthesis of Intermediate 11-2

Reaction 3-2

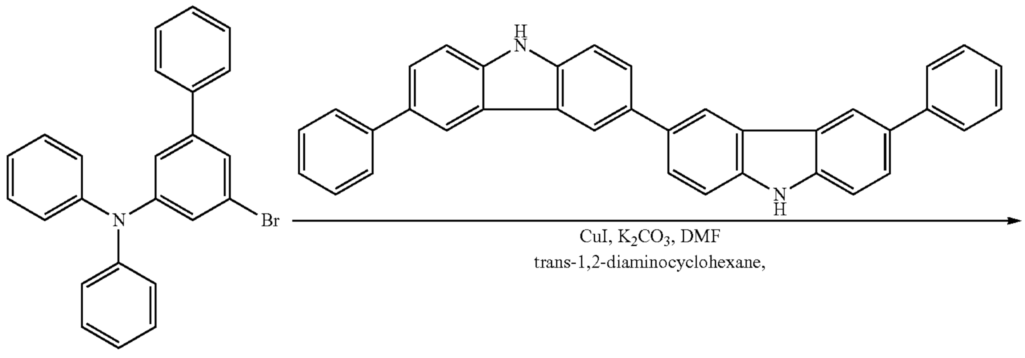

11-1

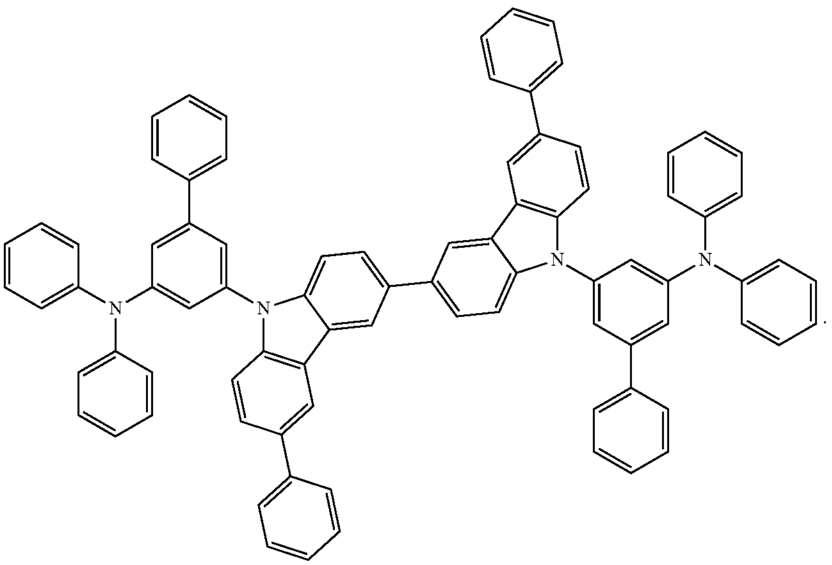

11-2

Intermediate 11-1 (1 eq), 6,6'-diphenyl-9H,9'H-3,3'-bicarbazole (0.5 eq), CuI (0.5 eq), trans-1,2-diaminocyclohexane (0.5 eq), and $K_2CO_3$ (4 eq) were dissolved in DMF and stirred under a nitrogen atmosphere at about 160° C. for about 24 hours. After cooling, the reaction solution was dried under a reduced pressure to remove DMF. Then, the resultant product was washed with ethyl acetate and water three times, and an organic layer obtained was dried with $MgSO_4$ and then, dried under a reduced pressure. Through column chromatography (dichloromethane: n-hexane), Intermediate 11-2 was obtained (yield: 58%).

Synthesis of Compound 11

Intermediate 11-2 (1 eq), and $BI_3$ (1.5 eq) were dissolved in ortho dichlorobenzene in a flask under a nitrogen atmosphere and heated to about 140° C. and stirred for about 6 hours. After cooling to 0° C., triethylamine was added to the flask slowly and dropwisely until heating stopped to finish the reaction, then hexane and methyl alcohol were added for precipitation, and the solid content was obtained through filtering. The solid content thus obtained was separated by column chromatography (dichloromethane: n-hexane) and then separated again by recrystallization. Then, final separation was performed by sublimation purification to obtain Compound 11 (yield: 18.9%).

Reaction 3-3

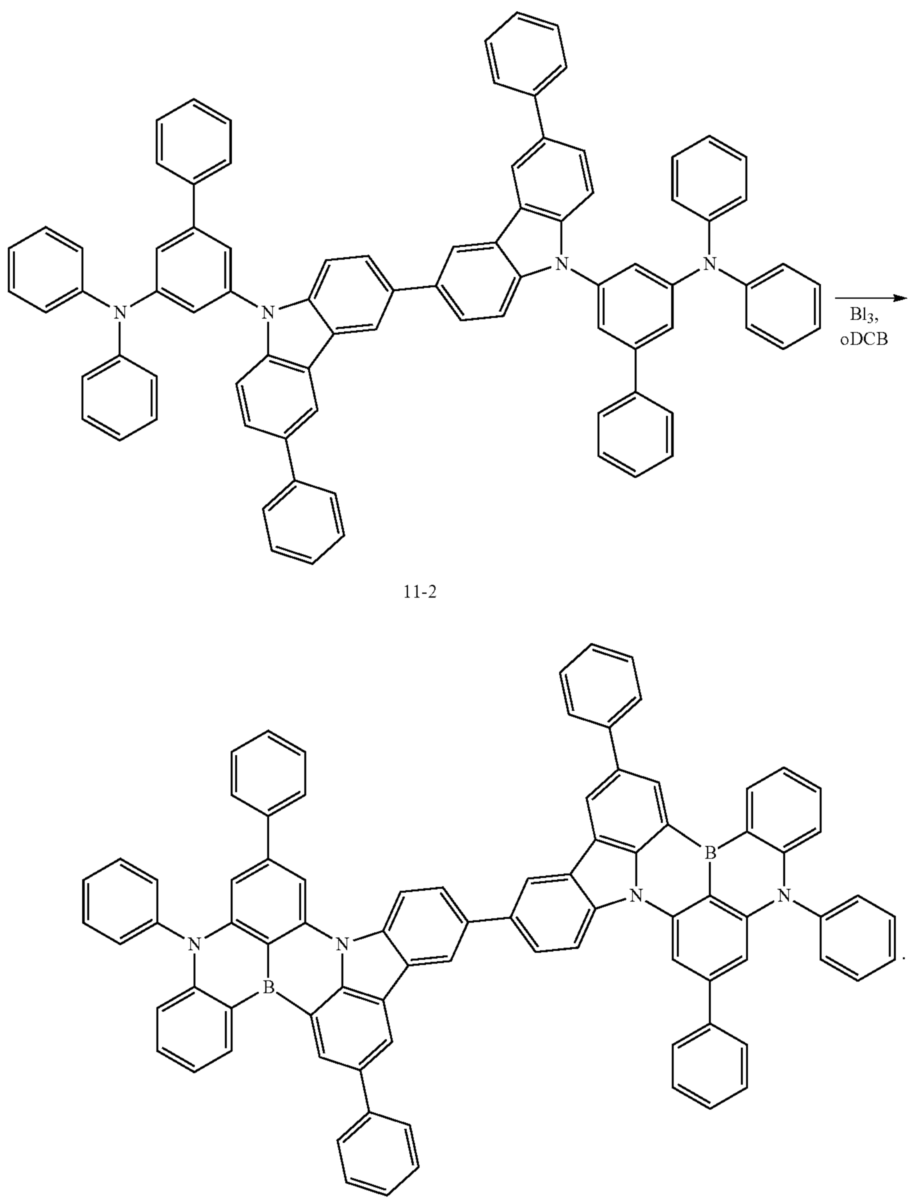

11-2

11

(4) Synthesis of Compound 27

Fused Polycyclic Compound 27 according to an embodiment may be synthesized by, for example, the reaction below.

Synthesis of Intermediate 27-2

Reaction 4-1

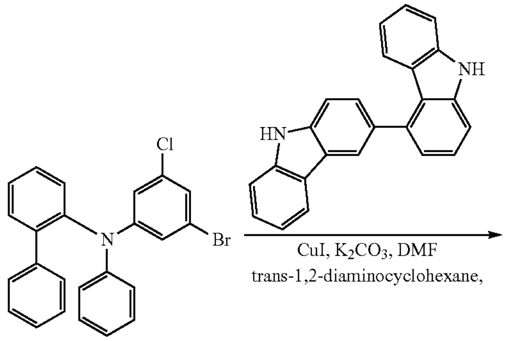

9-1

-continued

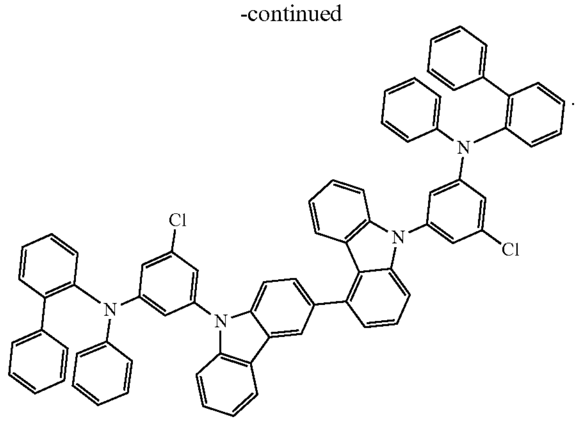

27-2

Intermediate 9-1 (1 eq), 9H,9'H-3,4'-bicarbazole (0.5 eq), CuI (0.5 eq), trans-1,2-diaminocyclohexane (0.5 eq), and $K_2CO_3$ (4 eq) were dissolved in DMF and stirred under a nitrogen atmosphere at about 150° C. for about 24 hours. After cooling, the reaction solution was dried under a reduced pressure to remove DMF. Then, the resultant product was washed with ethyl acetate and water three times, and an organic layer obtained was dried with $MgSO_4$ and then, dried under a reduced pressure. Through column chromatography (dichloromethane: n-hexane), Intermediate 27-2 was obtained (yield: 53%).

Synthesis of Intermediate 27-3

Reaction 4-2

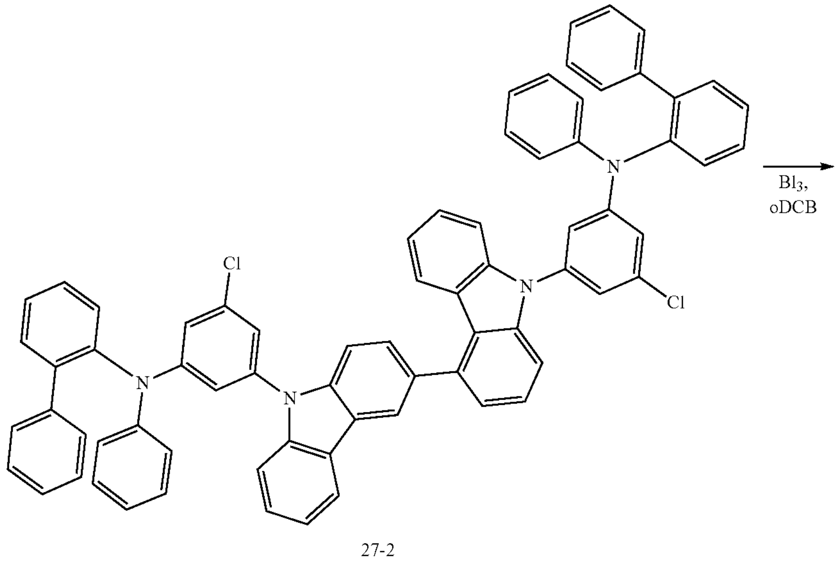

27-2

-continued

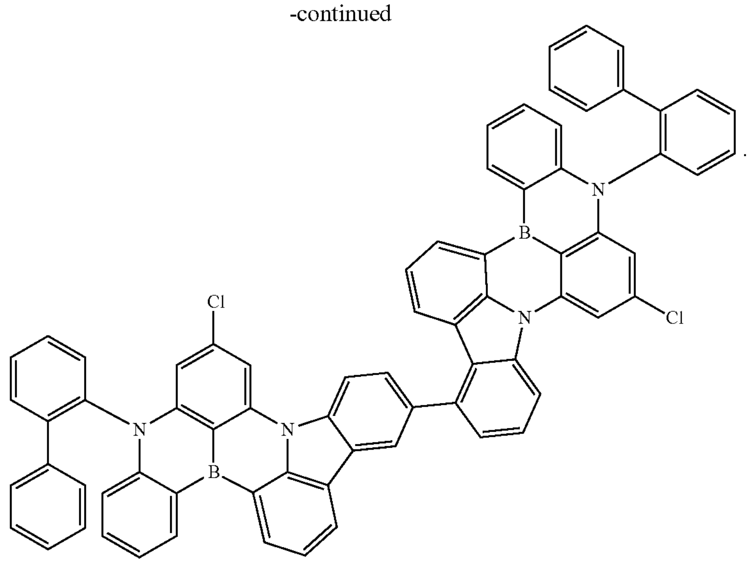

27-3

Intermediate 27-2 (1 eq), and $BI_3$ (1.5 eq) were dissolved in ortho dichlorobenzene in a flask under a nitrogen atmosphere and heated to about 140° C. and stirred for about 5 hours. After cooling to 0° C., triethylamine was added to the flask slowly and dropwisely until heating stopped to finish the reaction, then hexane was added for precipitation, and the solid content was obtained through filtering. The solid content thus obtained was separated by column chromatography (dichloromethane: n-hexane) and then separated again by recrystallization to obtain Intermediate 27-3. Then, final separation was performed by sublimation purification (yield: 21.5%).

Synthesis of Compound 27

Reaction 4-3

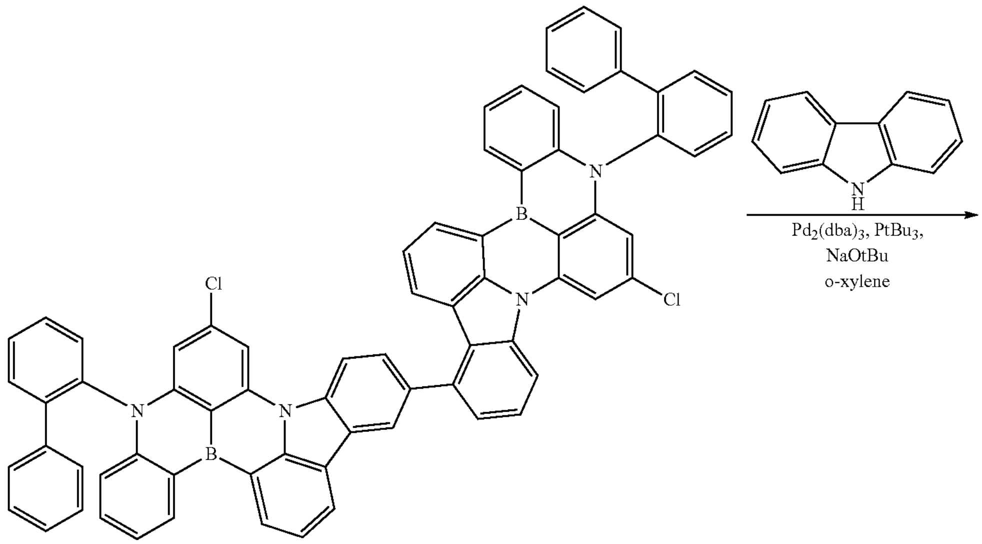

27-3

-continued

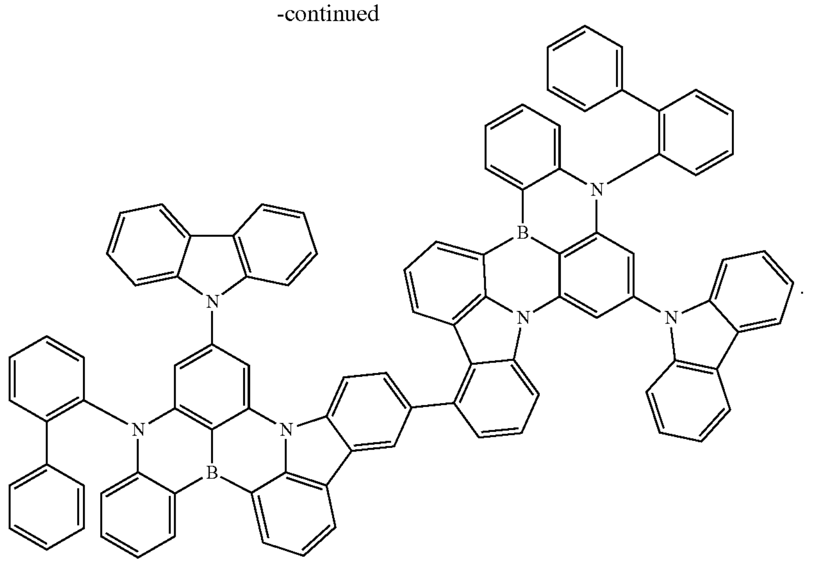

27

Intermediate 27-3 (1 eq), 9H-carbazole (2.1 eq), tris (dibenzylideneacetone) dipalladium (0) (0.05 eq), tri-tert-butylphosphine (0.1 eq), and sodium tert-butoxide (3 eq) were dissolved in ortho xylene and stirred under a nitrogen atmosphere at about 140° C. for about 24 hours. After cooling, the reaction solution was dried under a reduced pressure to remove ortho xylene. Then, the resultant product was washed with dichloromethane and water three times, and an organic layer obtained was dried with $MgSO_4$ and then, dried under a reduced pressure. After separation by column chromatography (dichloromethane: n-hexane), sublimation purification was performed. Compound 27 was thereby obtained (yield: 67%).

(5) Synthesis of Compound 34

Fused Polycyclic Compound 34 according to an embodiment may be synthesized by, for example, the reaction below.

Synthesis of Intermediate 34-2

Reaction 5-1

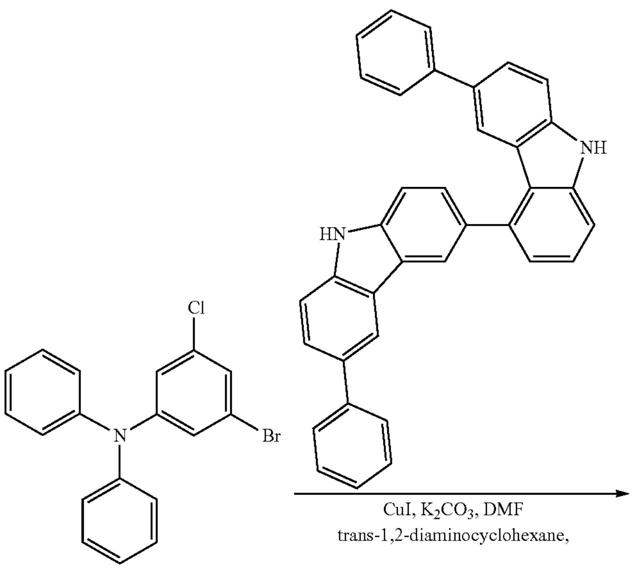

4-1

-continued

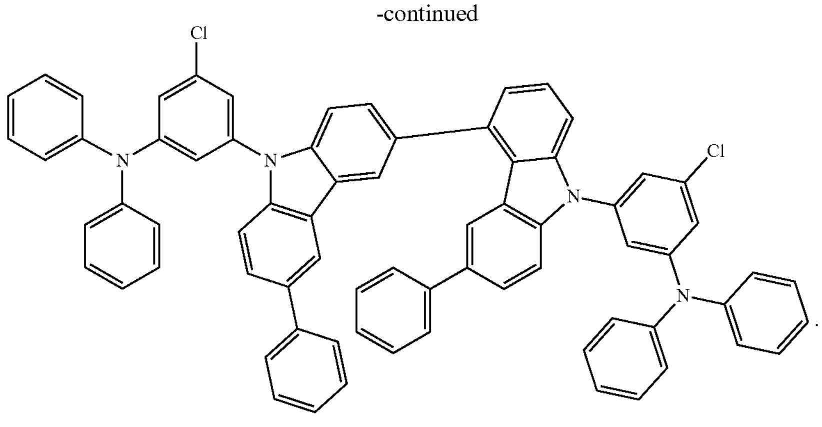

34-2

Intermediate 4-1 (1 eq), 6,6'-diphenyl-9H,9'H-3,4'-bicarbazole (0.5 eq), CuI (0.5 eq), trans-1,2-diaminocyclohexane (0.5 eq), and $K_2CO_3$ (4 eq) were dissolved in DMF and stirred under a nitrogen atmosphere at about 150° C. for about 24 hours. After cooling, the reaction solution was dried under a reduced pressure to remove DMF. Then, the resultant product was washed with ethyl acetate and water three times, and an organic layer obtained was dried with $MgSO_4$ and then, dried under a reduced pressure. Through column chromatography (dichloromethane: n-hexane), Intermediate 34-2 was obtained (yield: 59%).

Synthesis of Intermediate 34-3

Reaction 5-2

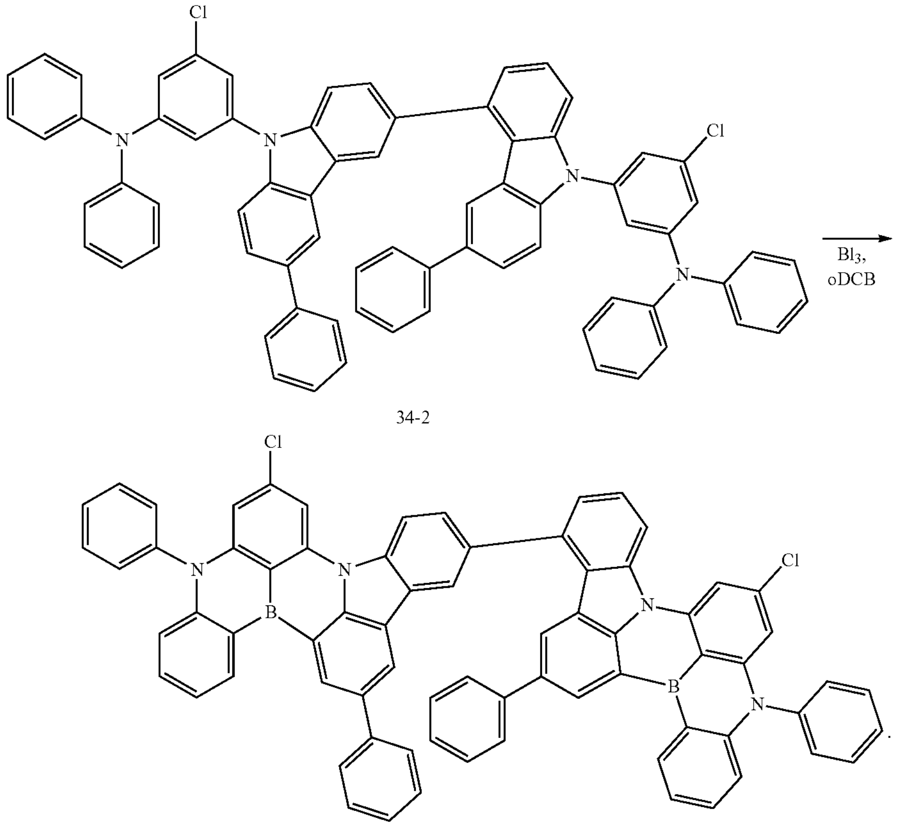

34-2

34-3

Intermediate 34-2 (1 eq), and $BI_3$ (1.5 eq) were dissolved in ortho dichlorobenzene in a flask under a nitrogen atmosphere and heated to about 140° C. and stirred for about 6 hours. After cooling to 0° C., triethylamine was added to the flask slowly and dropwisely until heating stopped to finish the reaction, then hexane was added for precipitation, and the solid content was obtained through filtering. The solid content thus obtained was separated by column chromatography (dichloromethane: n-hexane) and then, separated again by recrystallization to obtain Intermediate 34-3. After that, final separation was performed by sublimation purification (yield: 27.7%).

Synthesis of Compound 34

Reaction 5-3

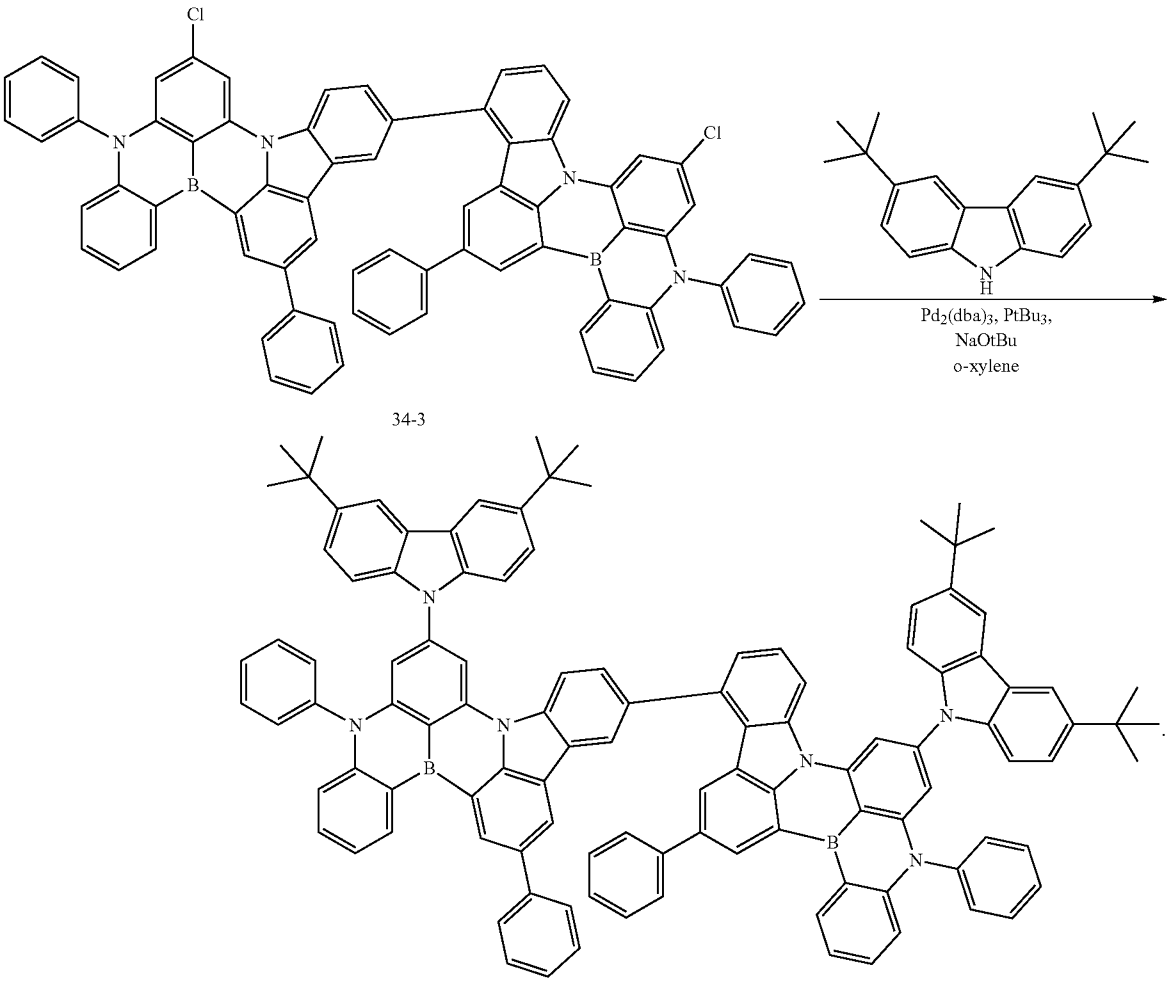

34-3

34

Intermediate 34-3 (1 eq), 3,6-di-tert-butyl-9H-carbazole (2.1 eq), tris(dibenzylideneacetone) dipalladium (0) (0.05 eq), tri-tert-butylphosphine (0.1 eq), and sodium tert-butoxide (3 eq) were dissolved in ortho xylene and stirred under a nitrogen atmosphere at about 140° C. for about 24 hours. After cooling, the reaction solution was dried under a reduced pressure to remove ortho xylene. Then, the resultant product was washed with dichloromethane and water three times, and an organic layer obtained was dried with $MgSO_4$ and then, dried under a reduced pressure. After separation by column chromatography (dichloromethane: n-hexane), sublimation purification was performed. Compound 34 was thereby obtained (yield: 67%).

(6) Synthesis of Compound 115

Fused Polycyclic Compound 115 according to an embodiment may be synthesized by, for example, the reaction below.

Synthesis of Intermediate 115-1

Reaction 6-1

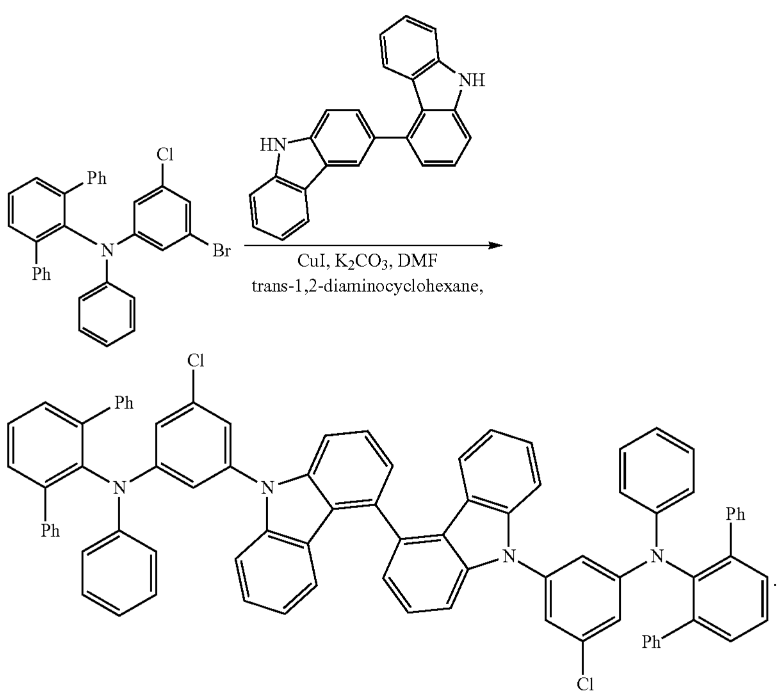

115-1

N-(3-bromo-5-chlorophenyl)-N-phenyl-[1,1': 3',1"-terphenyl]-2'-amine (1 eq), 9H,9'H-3,4'-bicarbazole (0.5 eq), CuI (0.5 eq), trans-1,2-diaminocyclohexane (0.5 eq), and $K_2CO_3$ (4 eq) were dissolved in DMF and stirred under a nitrogen atmosphere at about 150° C. for about 24 hours. After cooling, the reaction solution was dried under a reduced pressure to remove DMF. Then, the resultant product was washed with ethyl acetate and water three times, and an organic layer obtained was dried with $MgSO_4$ and then, dried under a reduced pressure. Through column chromatography (dichloromethane: n-hexane), Intermediate 115-1 was obtained (yield: 56%).

Synthesis of Intermediate 115-2

Reaction 6-2

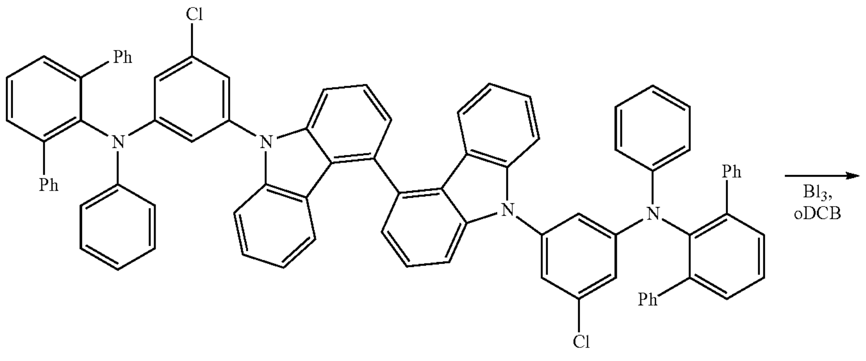

115-1

-continued

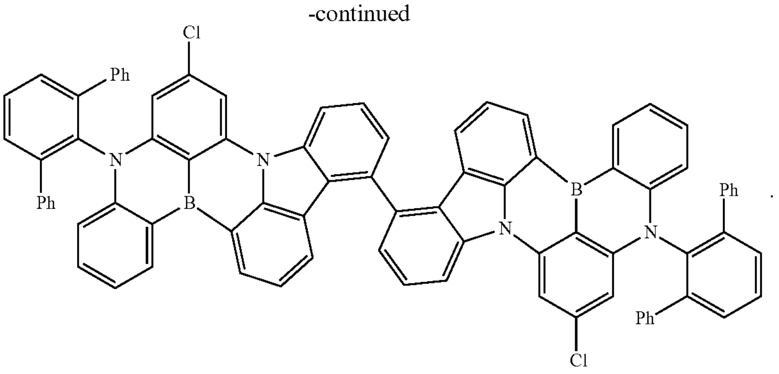

115-2

Intermediate 115-1 (1 eq), and $BI_3$ (1.5 eq) were dissolved in ortho dichlorobenzene in a flask under a nitrogen atmosphere and heated to about 140° C. and stirred for about 6 hours. After cooling to 0° C., triethylamine was added to the flask slowly and dropwisely until heating stopped to finish the reaction, then hexane and methyl alcohol were added for precipitation, and the solid content was obtained through filtering. The solid content thus obtained was separated by column chromatography (dichloromethane: n-hexane) and then separated again by recrystallization to obtain Intermediate 115-2. Then, final separation was performed by sublimation purification (yield: 31.7%).

Synthesis of Compound 115

Reaction 6-3

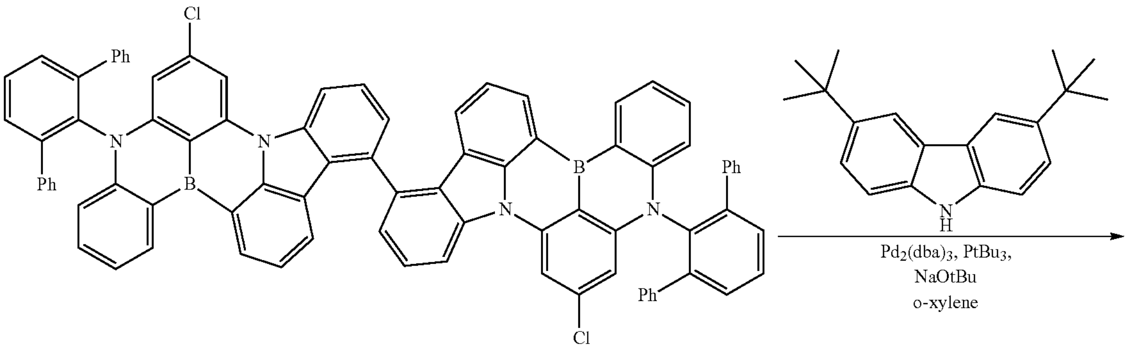

115-2

-continued

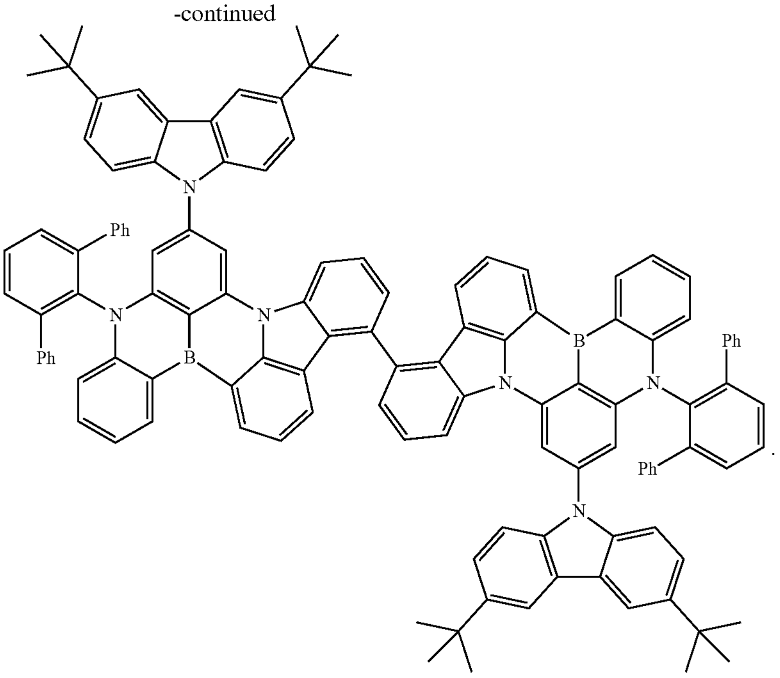

115

Intermediate 115-2 (1 eq), 3,6-di-tert-butyl-9H-carbazole (2.1 eq), tris(dibenzylideneacetone) dipalladium (0) (0.05 eq), tri-tert-butylphosphine (0.1 eq), and sodium tert-butoxide (3 eq) were dissolved in ortho xylene and stirred under a nitrogen atmosphere at about 140° C. for about 24 hours. After cooling, the reaction was dried under a reduced pressure to remove ortho xylene. Then, the resultant product was washed with dichloromethane and water three times, and an organic layer obtained was dried with $MgSO_4$ and then, dried under a reduced pressure. After separation by column chromatography (dichloromethane: n-hexane), sublimation purification was performed. Compound 115 was thereby obtained (yield: 52%).

(7) Synthesis of Compound 144

Fused Polycyclic Compound 144 according to an embodiment may be synthesized by, for example, the reaction below.

Synthesis of Intermediate 144-1

Reaction 7-1

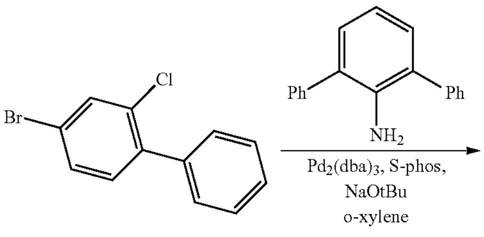

-continued

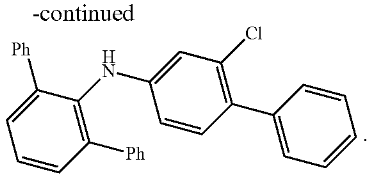

144-1

4-bromo-2-chloro-1,1'-biphenyl (1 eq), [1,1': 3',1"-terphenyl]-2'-amine (1 eq), tris(dibenzylideneacetone) dipalladium (0) (0.05 eq), S-phos (0.1 eq), and sodium tert-butoxide (3 eq) were dissolved in ortho xylene and stirred under a nitrogen atmosphere at about 120° C. for about 24 hours. After cooling, the reaction solution was dried under a reduced pressure to remove ortho xylene. Then, the resultant product was washed with dichloromethane and water three times, and an organic layer obtained was dried with $MgSO_4$ and then, dried under a reduced pressure. Through column chromatography (dichloromethane: n-hexane), Intermediate 144-1 was obtained (yield: 60%). After that, sublimation purification was performed.

Synthesis of Intermediate 144-2

Reaction 7-2

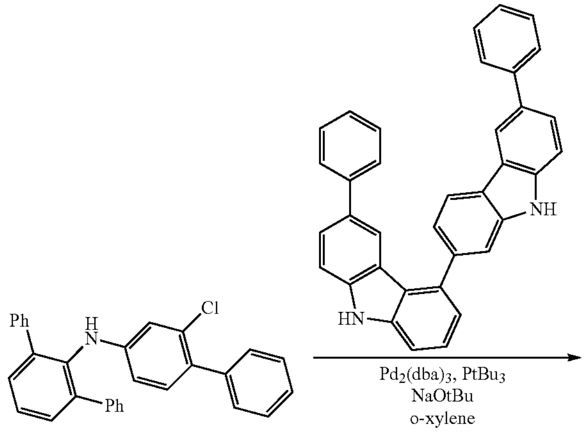

144-1

-continued

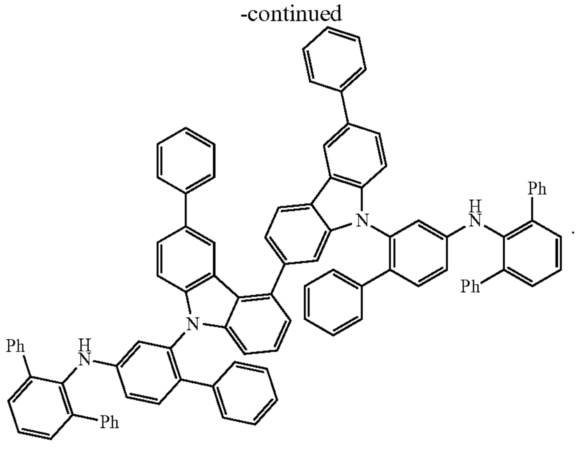

144-2

Intermediate 144-1 (1 eq), 6,6'-diphenyl-9H,9'H-2,4'-bicarbazole (0.5 eq), tris(dibenzylideneacetone) dipalladium (0) (0.05 eq), tri-tert-butylphosphine (0.1 eq), and sodium tert-butoxide (3 eq) were dissolved in ortho xylene and stirred under a nitrogen atmosphere at about 140° C. for about 24 hours. After cooling, the reaction solution was dried under a reduced pressure to remove ortho xylene. Then, the resultant product was washed with dichloromethane and water three times, and an organic layer obtained was dried with $MgSO_4$ and then, dried under a reduced pressure. Through separation by column chromatography (dichloromethane: n-hexane), Intermediate 144-2 was obtained (yield: 63%). Then, sublimation purification was performed.

Synthesis of Intermediate 144-3

Reaction 7-3

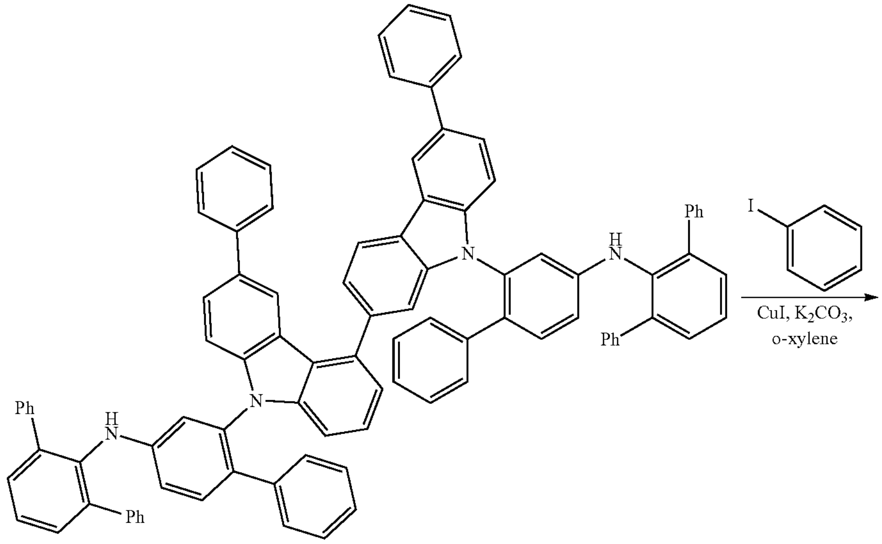

144-2

-continued

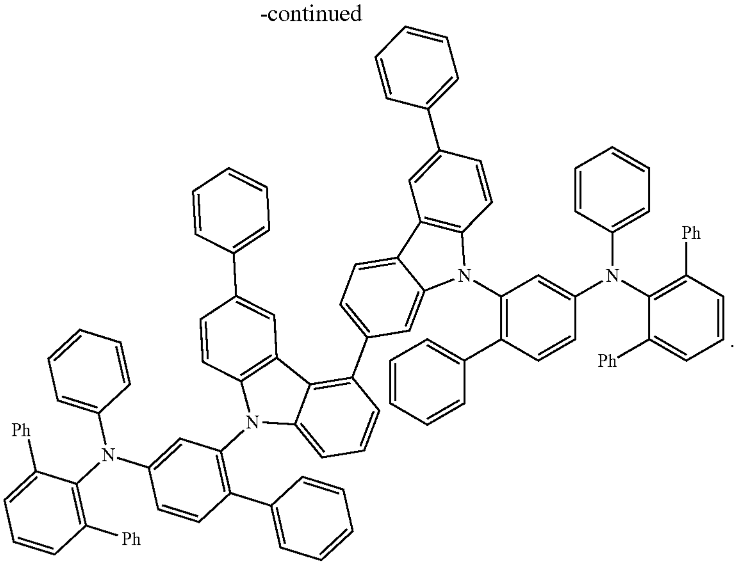

144-3

Intermediate 144-2 (1 eq), iodobenzene (10 eq), and $K_2CO_3$ (10 eq) were dissolved in ortho xylene and stirred under a nitrogen atmosphere at about 185° C. for about 48 hours. After cooling, the reaction solution was dried under a reduced pressure to remove ortho xylene. Then, the resultant product was washed with dichloromethane and water three times, and an organic layer obtained was dried with $MgSO_4$ and then, dried under a reduced pressure. Through separation by column chromatography (dichloromethane: n-hexane), Intermediate 144-3 was obtained (yield: 57%).

Synthesis of Compound 144

Reaction 7-4

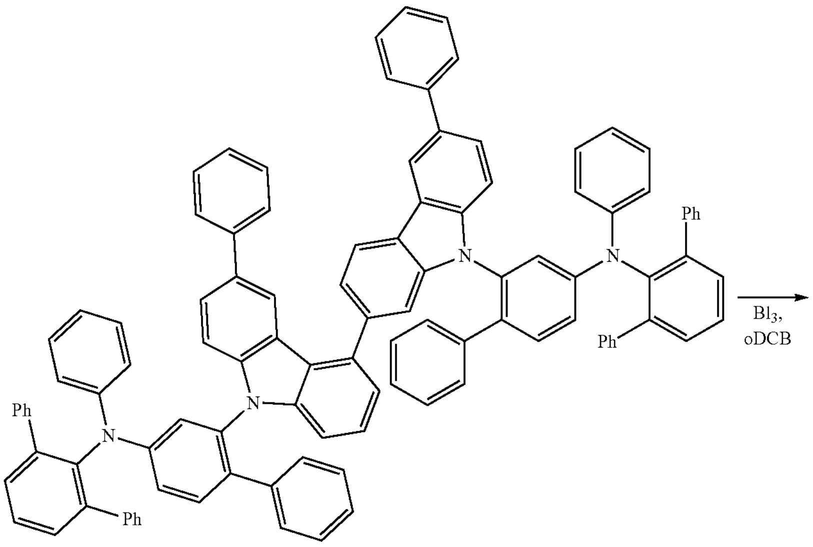

144-3

-continued

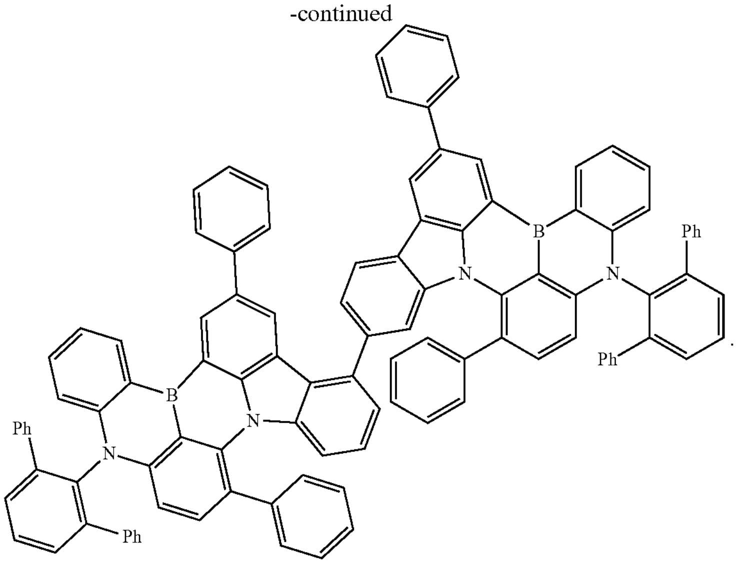

144

Intermediate 144-3 (1 eq), and $BI_3$ (1.5 eq) were dissolved in ortho dichlorobenzene in a flask under a nitrogen atmosphere and heated to about 140° C. and stirred for about 18 hours. After cooling to 0° C., triethylamine was added to the flask slowly and dropwisely until heating stopped to finish the reaction, then hexane and methyl alcohol were added for precipitation, and the solid content was obtained through filtering. The solid content thus obtained was separated by column chromatography (dichloromethane: n-hexane) and then separated again by recrystallization. Then, final separation was performed by sublimation purification to obtain Compound 144 (yield: 8.2%).

(8) Synthesis of Compound 154

Fused Polycyclic Compound 154 according to an embodiment may be synthesized by, for example, the reaction below.

Synthesis of Intermediate 154-1

Reaction 8-1

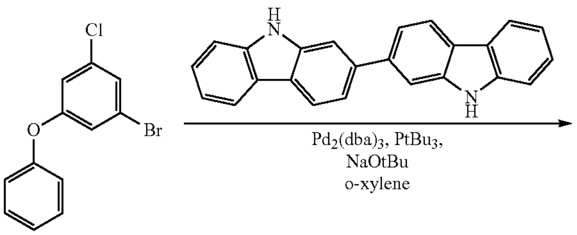

-continued

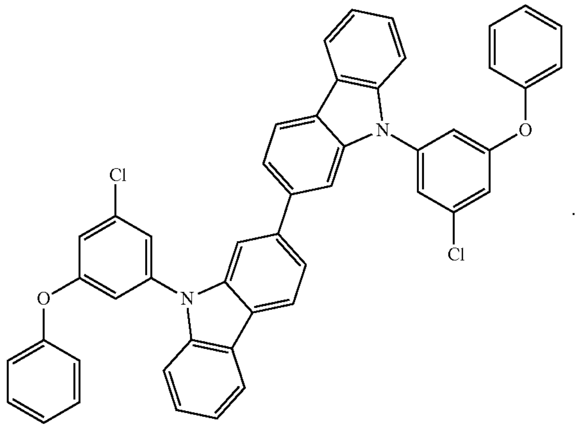

154-1

1-bromo-3-chloro-5-phenoxybenzene (1 eq), 9H,9'H-2,2'-bicarbazole (0.5 eq), tris(dibenzylideneacetone) dipalladium (0) (0.05 eq), tri-tert-butylphosphine (0.1 eq), and sodium tert-butoxide (3 eq) were dissolved in ortho xylene and stirred under a nitrogen atmosphere at about 140° C. for about 24 hours. After cooling, the reaction solution was dried under a reduced pressure to remove ortho xylene. Then, the resultant product was washed with dichloromethane and water three times, and an organic layer obtained was dried with $MgSO_4$ and then, dried under a reduced pressure. Through separation by column chromatography (dichloromethane: n-hexane), Intermediate 154-1 was obtained (yield: 61%).

Synthesis of Intermediate 154-2

Reaction 8-2

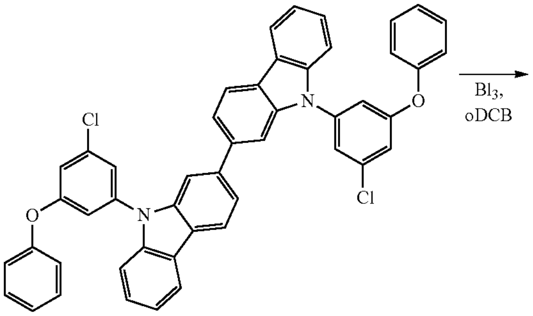

154-1

-continued

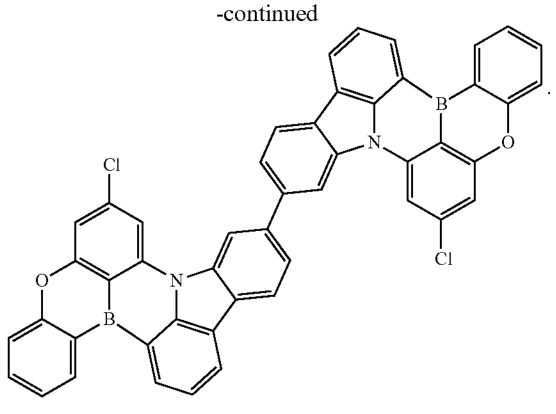

154-2

Intermediate 154-1 (1 eq), and $BI_3$ (1.5 eq) were dissolved in ortho dichlorobenzene in a flask under a nitrogen atmosphere and heated to about 140° C. and stirred for about 5 hours. After cooling to 0° C., triethylamine was added to the flask slowly and dropwisely until heating stopped to finish the reaction, then hexane and methyl alcohol were added for precipitation, and the solid content was obtained through filtering. The solid content thus obtained was separated by column chromatography (dichloromethane: n-hexane) and then separated again by recrystallization to obtain Intermediate 154-2. Then, final separation was performed by sublimation purification (yield: 48.6%).

Synthesis of Compound 154

Reaction 8-3

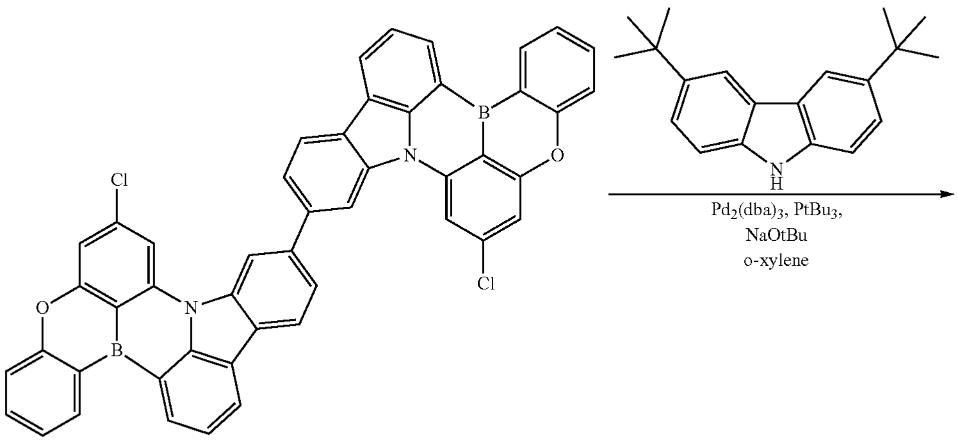

154-2

-continued

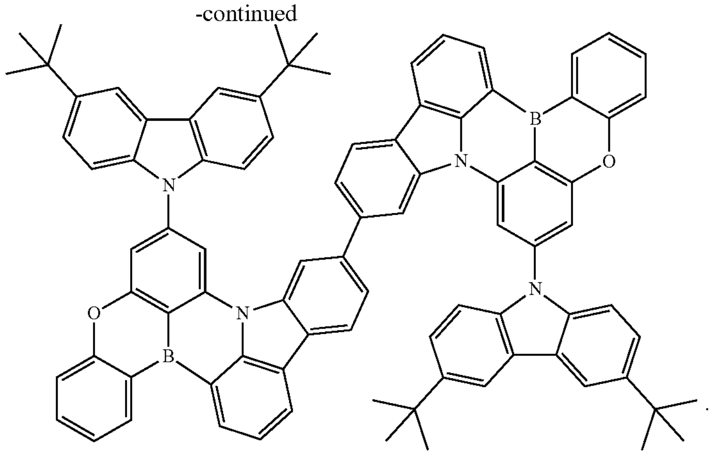

154

Intermediate 154-2 (1 eq), 3,6-di-tert-butyl-9H-carbazole (2 eq), tris(dibenzylideneacetone) dipalladium (0) (0.05 eq), tri-tert-butylphosphine (0.1 eq), and sodium tert-butoxide (3 eq) were dissolved in ortho xylene and stirred under a nitrogen atmosphere at about 140° C. for about 24 hours. After cooling, the reaction solution was dried under a reduced pressure to remove ortho xylene. Then, the resultant product was washed with dichloromethane and water three times, and an organic layer obtained was dried with $MgSO_4$ and then, dried under a reduced pressure. After separation by column chromatography (dichloromethane: n-hexane), sublimation purification was performed. Compound 154 was thereby obtained (yield: 71%).

1. Identification of Compounds Synthesized

The molecular weights and NMR analysis results of the compounds thus obtained are shown in Table 1 below.

TABLE 1

| Compound | H NMR (δ) | Calc | Found |
|---|---|---|---|
| 4 | 8.93 (2H, d), 8.81 (2H, d), 8.10 (2H, s), 7.92 (2H, d), 7.67-7.58 (14H, m), 7.55-7.15 (26H, m), 7.12-6.90 (18H, m), 6.86 (2H, d), 6.22 (2H, s) | 1472.58 | 1473.41 |
| 9 | 9.21 (2H, d), 9.02 (2H, d), 8.18 (2H, s), 7.98 (2H, d), 7.81-7.52 (12H, m), 7.49-7.11 (16H, m), 7.05-6.81 (18H, m), 6.93 (2H, d), 6.31 (2H, s) | 1316.49 | 1317.18 |
| 11 | 9.12 (2H, d), 8.91 (2H, s), 8.03 (2H, s), 7.81 (2H, d), 7.67-7.58 (14H, m), 7.55-7.15 (16H, m), 7.12-6.90 (10H, m), 6.86 (2H, d), 6.22 (2H, s) | 1138.44 | 1138.99 |
| 27 | 8.93 (2H, d), 8.81 (2H, s), 8.10 (2H, s), 7.92 (2H, d), 7.62-7.48 (13H, m), 7.35-7.10 (19H, m), 7.05-6.91 (14H, m), 6.76 (2H, d), 6.34 (2H, s) | 1316.49 | 1317.18 |
| 34 | 8.89 (1H, d), 8.81 (1H, d), 8.75 (1H, s), 8.70 (1H, s), 8.01 (1H, s), 7.95 (1H, s), 7.90 (1H, s), 7.86(1H, s), 7.81-7.63(12H, m), 7.50-7.15 (20H, m), 7.12-6.89 (10H, m), 6.81 (2H, s), 6.37 (2H, s), 1.61 (18H, s) 1.56 (18H, s) | 1540.74 | 1541.61 |
| 115 | 9.17 (2H, d), 9.03 (2H, d), 8.15 (2H, s), 7.85 (2H, s), 7.67-7.58 (14H, m), 7.55-7.15 (23H, m), 7.12-6.90 (15H, m), 6.42 (2H, s), 1.57 (36H, s) | 1692.80 | 1693.81 |
| 144 | 9.26 (1H, d), 9.15 (1H, d), 9.05 (1H, s), 8.89 (1H, s), 8.10 (1H, s), 7.97 (1H, d), 7.85 (1H, s), 7.71-7.61 (17H, m), 7.51-7.16 (24H, m), 7.05-6.81 (18H, m), 6.40 (1H, s), 6.36 (1H, s) | 1442.56 | 1443.38 |
| 154 | 8.85 (1H, d), 8.71 (1H, d), 8.56 (1H, d), 8.51 (1H, d), 7.91(1H, d), 7.85 (1H, d), 7.79 (1H, d), 7.71 (1H, d), 7.61-7.50 (8H, m), 7.45-7.06 (10H, m), 7.01-6.81 (8H, m), 6.31 (1H, s), 6.24 (1H, s), 1.59 (18H, s), 1.52 (18H, s) | 1238.58 | 1239.19 |

2. Manufacture and evaluation of light emitting device including fused polycyclic compound
(Manufacture of Light Emitting Device)
The light emitting devices of Examples 1 to 8 were manufactured utilizing Compounds 4, 9, 11, 27, 34, 115, 144 and 154 respectively as dopant materials of an emission layer.
Example Compounds
4
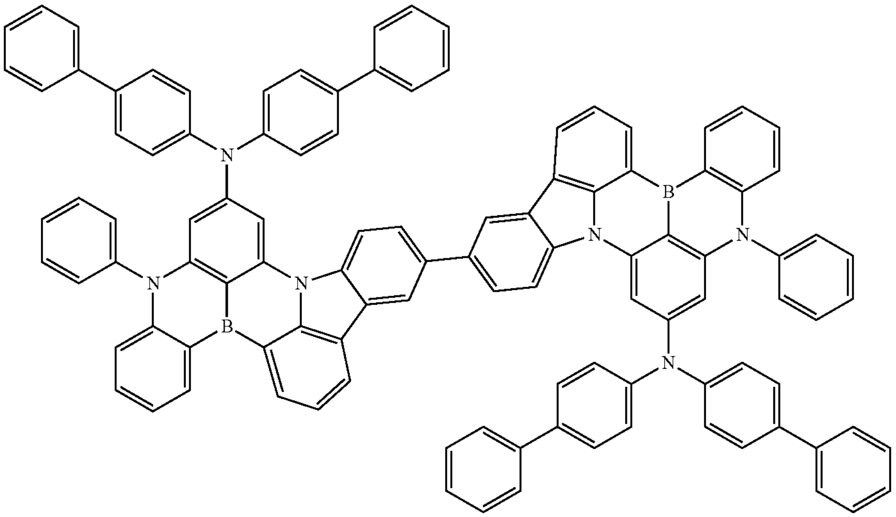
9
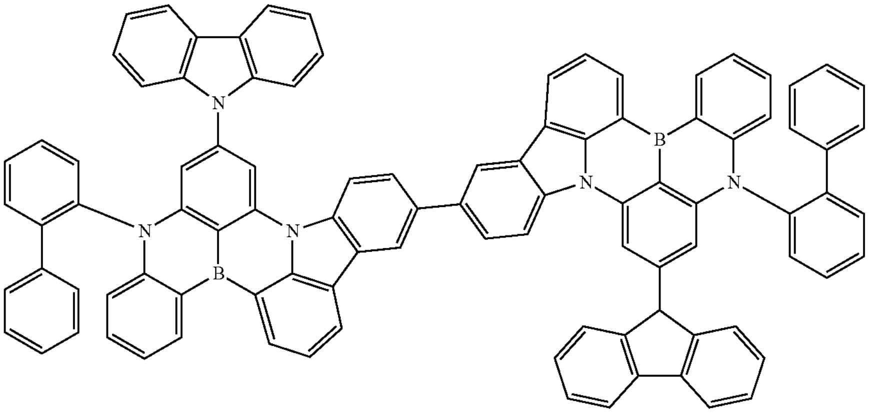

-continued
11
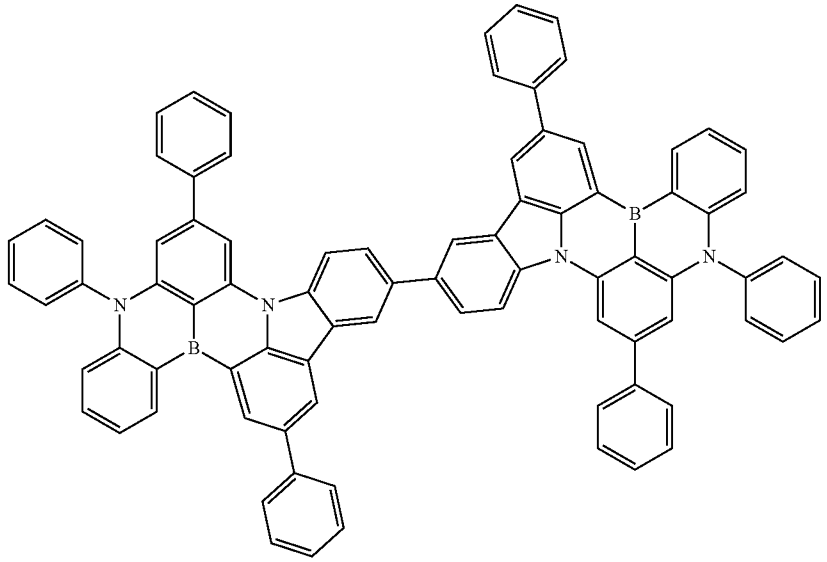
27
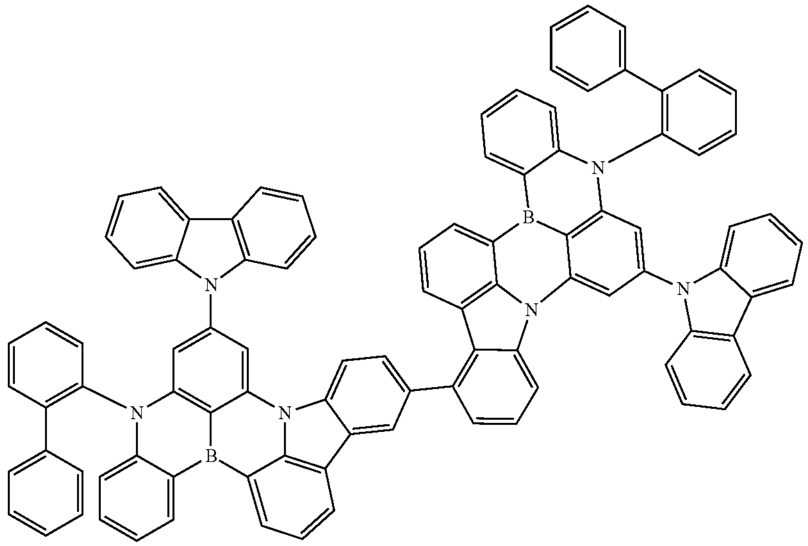
34
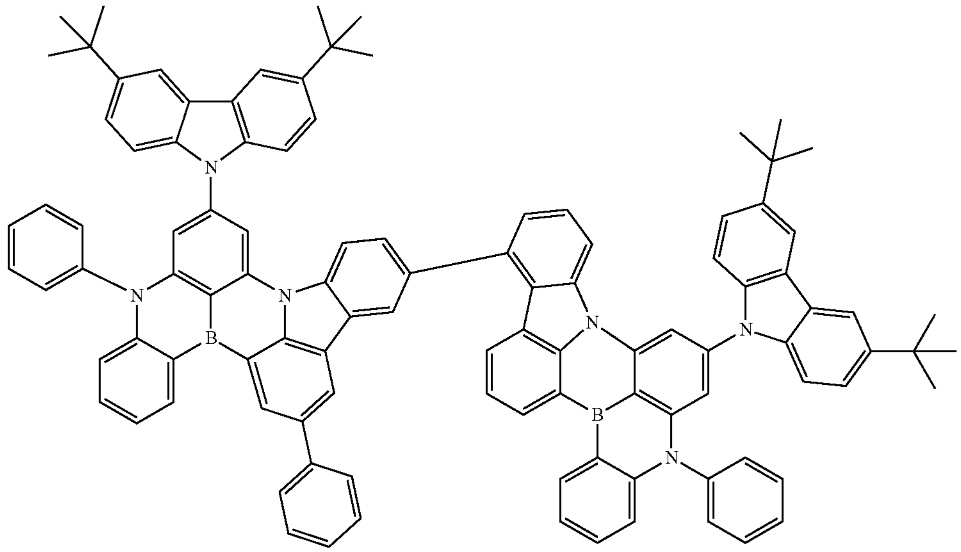

-continued
115
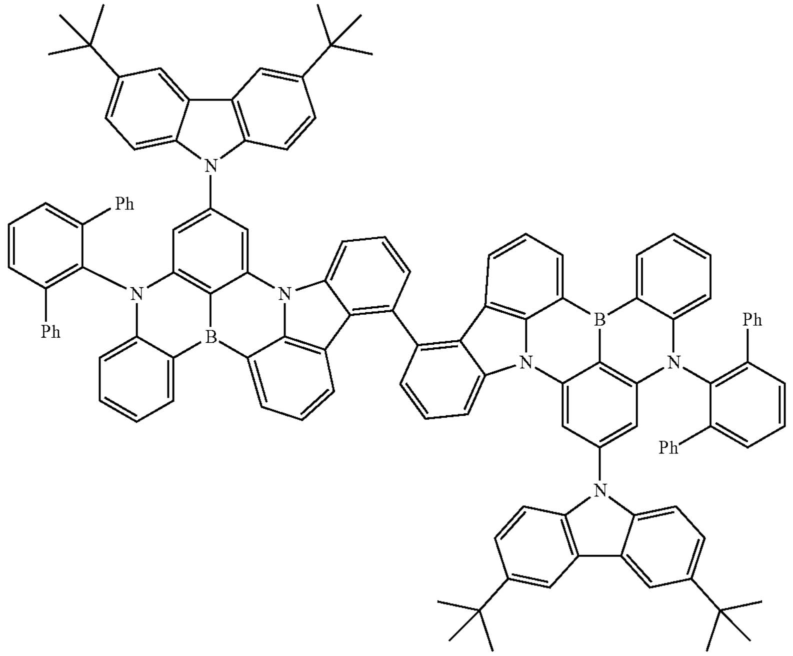
144
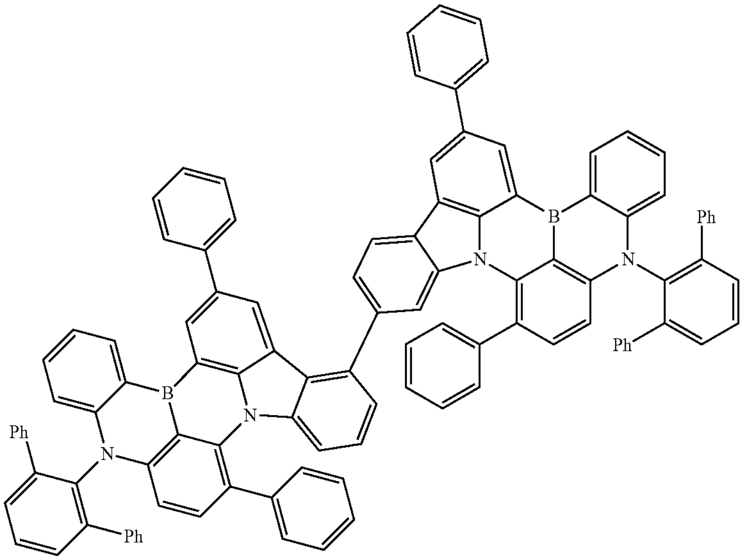

-continued
154
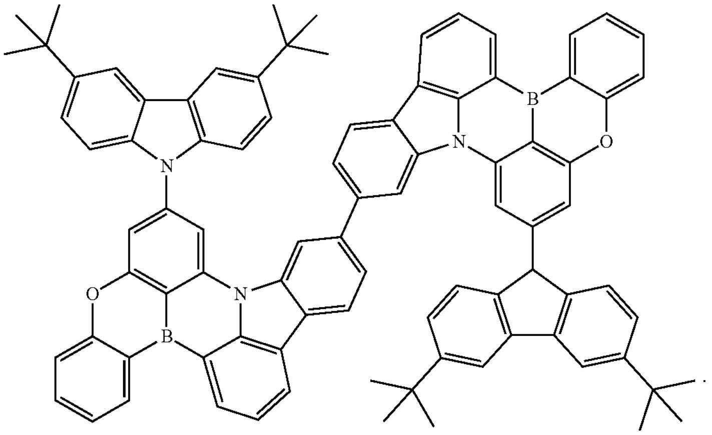
Comparative Compounds X-1 to X-8 below were utilized for the manufacture of the devices of the respective Comparative Examples.
Comparative Compounds
X-1
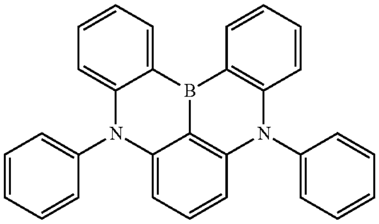
X-2
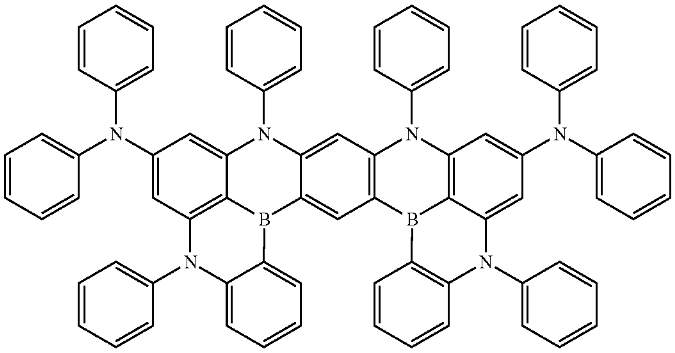
X-3
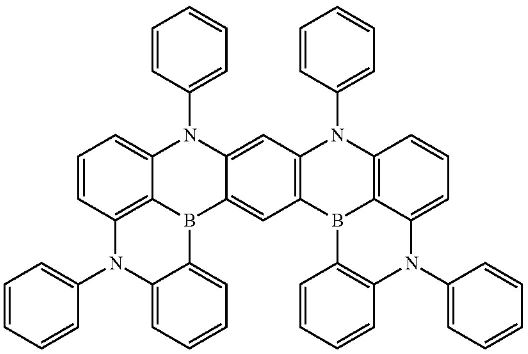

-continued
X-4
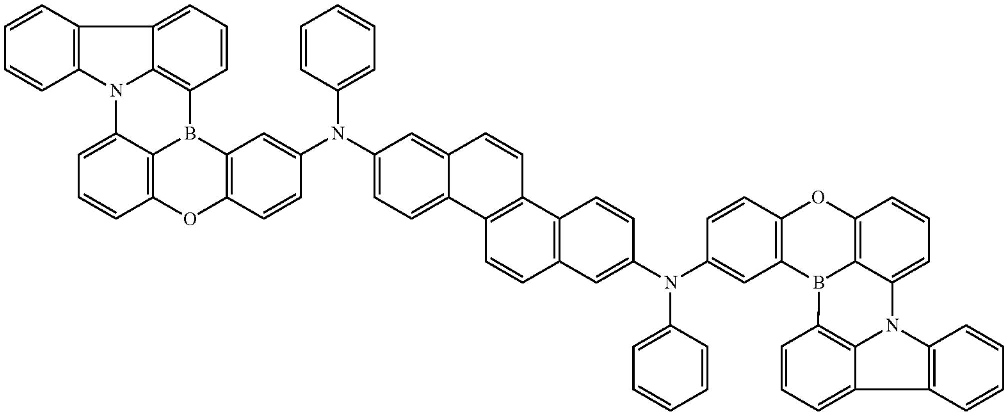
X-5
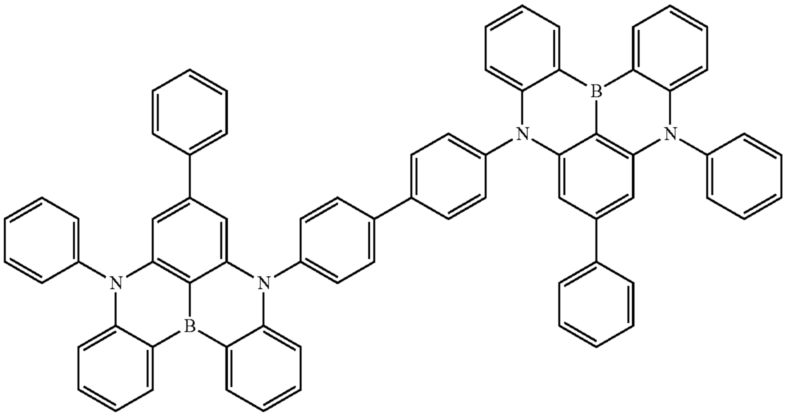
X-6
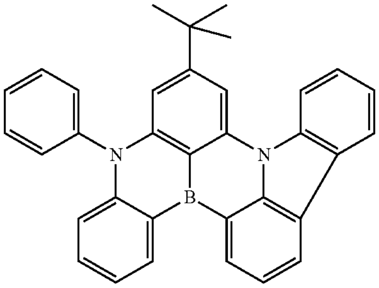
X-7
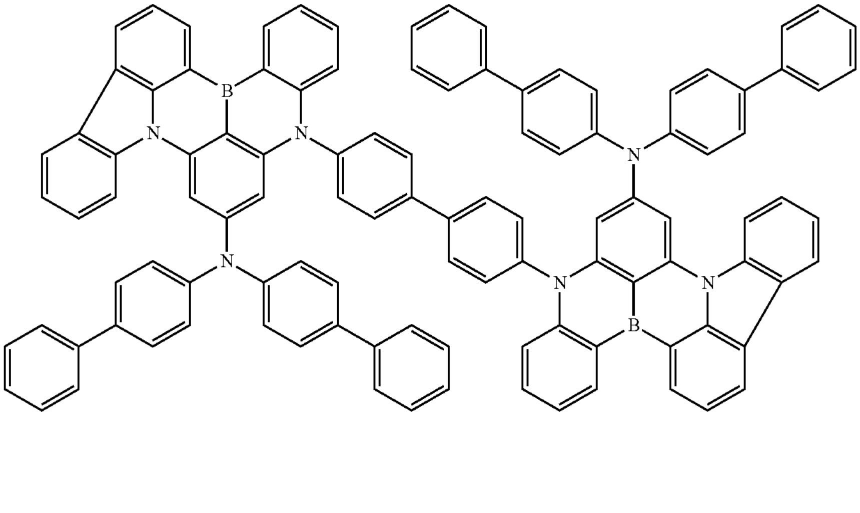

-continued

X-8

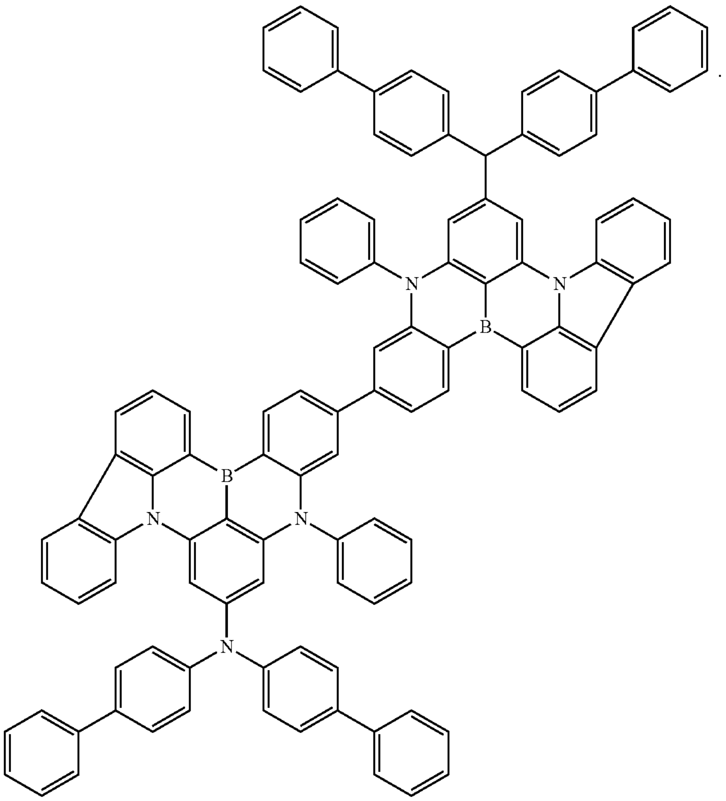

A light emitting device of an embodiment, including the fused polycyclic compound of an embodiment in an emission layer was manufactured by a method below. Example 1 to Example 8 correspond to light emitting devices manufactured by utilizing Compounds 4, 9, 11, 27, 34, 115, 144 and 154, respectively, which are the aforementioned Example Compounds, as light emitting materials. Comparative Example 1 to Comparative Example 8 correspond to light emitting devices manufactured by utilizing Comparative Compound X-1 to Comparative Compound X-8 respectively as light emitting materials.

An ITO glass substrate with 15 $\Omega/cm^2$ (120 nm) of Corning Co. was cut into a size of 50 mm×50 mm×0.7 mm, washed by ultrasonic waves utilizing isopropyl alcohol and pure water for about 5 minutes, respectively, exposed to ultraviolet rays for about 30 minutes, cleaned by exposing to ozone, and installed in a vacuum deposition apparatus. A first electrode was formed utilizing ITO on the glass substrate, a hole injection layer with a thickness of about 20 nm was formed on the first electrode utilizing N,N'-di(1-naphthyl)-N,N'-diphenyl-(1,1'-biphenyl)-4,4'-diamine (NPD), a hole transport layer with a thickness of about 20 nm was formed on the hole injection layer utilizing N-([1,1'-biphenyl]-4-yl)-9,9-diphenyl-N-(4-(9-phenyl-9H-carbazol-3-yl)phenyl)-9H-fluoren-2-amine (H-1-19), an emission auxiliary layer with a thickness of about 10 nm was formed on the hole transport layer utilizing 9-(4-tert-butylphenyl)-3,6-bis(triphenylsilyl)-9H-carbazole (CzSi), an emission layer with a thickness of about 20 nm was formed on the emission auxiliary layer utilizing 1,3-bis(N-carbazolyl)benzene (mCP) doped with 3% of the respective Example Compound or the Comparative Compound, an electron transport layer with a thickness of about 20 nm was formed on the emission layer utilizing diphenyl [4-(triphenylsilyl)phenyl]phosphineoxide (TSPO1), a buffer layer with a thickness of about 30 nm was formed on the electron transport layer utilizing 2,2',2"-(1,3,5-benzinetriyl)-tris(1-phenyl-1-H-benzimidazole) (TPBi), an electron injection layer with a thickness of about 1 nm was formed on the buffer layer utilizing LiF, and a second electrode with a thickness of about 300 nm was formed on the electron injection layer utilizing Al. On the second electrode, a capping layer with a thickness of about 70 nm was formed utilizing P4. All layers were formed under a vacuum atmosphere by a deposition method.

The compounds utilized for the manufacture of the light emitting devices of the Examples and the Comparative Example are shown below. The materials are suitable (e.g., known) materials, and commercial materials were purified by sublimation and then utilized for the manufacture of the devices.

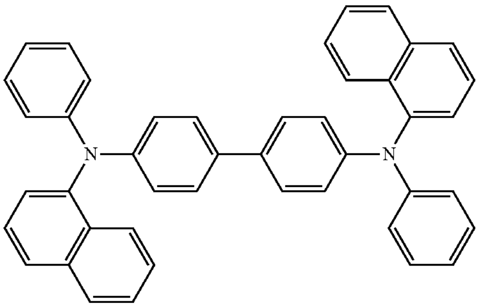

NPD

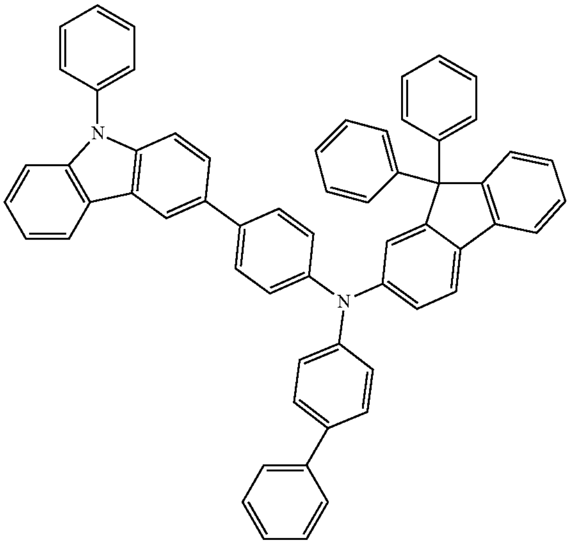

H-1-19

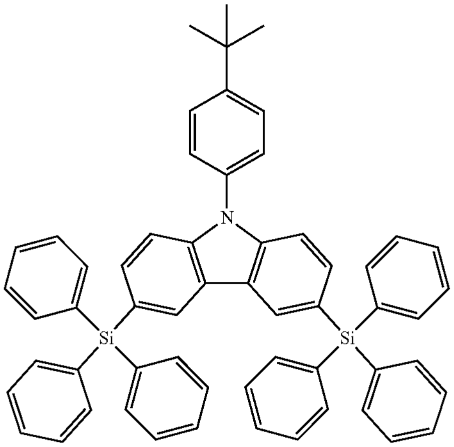

CzSi

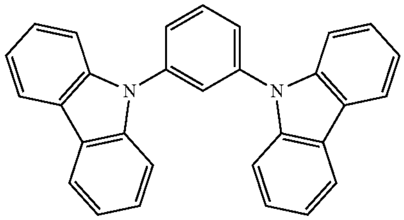

mCP

-continued

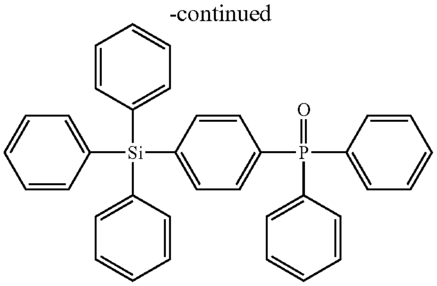

TSPO1

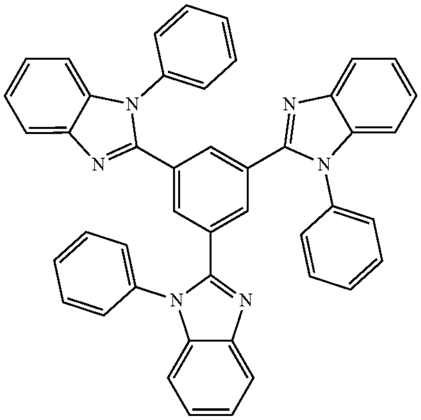

TPBi

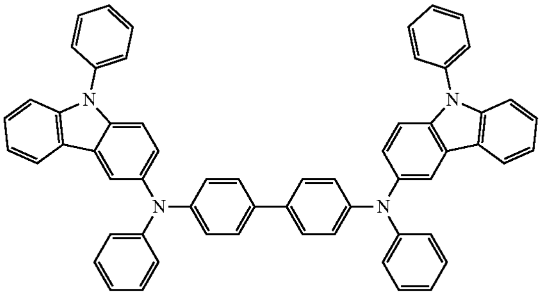

P4

Experimental Examples

The device efficiency of each of the light emitting devices manufactured utilizing Example Compounds 4, 7, 9, 11, 27, 34, 115, 144 and 154, and Comparative Compound X-1 to Comparative Compound X-8 were evaluated. Evaluation results are shown in Table 2 below. In the device evaluation, the driving voltage and device efficiency (cd/A) were measured at a current density of about 10 mA/$cm^2$.

TABLE 2

| Device manufacturing example | Hole transport layer material | Dopant Compound | Driving voltage (V) | Efficiency (cd/A) | Maximum external quantum efficiency (%) | Emission color |
|---|---|---|---|---|---|---|
| Example 1 | HT-1-19 | Compound 4 | 4.5 | 26.0 | 22.1 | Blue |
| Example 2 | HT-1-19 | Compound 9 | 4.5 | 26.3 | 21.3 | Blue |
| Example 3 | HT-1-19 | Compound 11 | 4.4 | 24.6 | 20.9 | Blue |
| Example 4 | HT-1-19 | Compound 27 | 4.3 | 27.0 | 22.6 | Blue |
| Example 5 | HT-1-19 | Compound 34 | 4.6 | 28.4 | 24.9 | Blue |
| Example 6 | HT-1-19 | Compound 115 | 4.5 | 29.2 | 25.0 | Blue |
| Example 7 | HT-1-19 | Compound 144 | 4.4 | 25.2 | 23.4 | Blue |
| Example 8 | HT-1-19 | Compound 154 | 4.6 | 22.1 | 19.9 | Blue |
| Comparative Example 1 | HT-1-19 | Comparative Compound X-1 | 5.4 | 16.7 | 15.4 | Blue |
| Comparative Example 2 | HT-1-19 | Comparative Compound X-2 | 4.9 | 22.6 | 20.8 | Blue |
| Comparative Example 3 | HT-1-19 | Comparative Compound X-3 | 5.1 | 18.9 | 17.6 | Blue |
| Comparative Example 4 | HT-1-19 | Comparative Compound X-4 | 5.6 | 15.4 | 14.2 | Blue |
| Comparative Example 5 | HT-1-19 | Comparative Compound X-5 | 4.4 | 20.3 | 18.7 | Blue |
| Comparative Example 6 | HT-1-19 | Comparative Compound X-6 | 4.5 | 16.8 | 15.4 | Blue |
| Comparative Example 7 | HT-1-19 | Comparative Compound X-7 | 4.7 | 22.7 | 21.3 | Blue |
| Comparative Example 8 | HT-1-19 | Comparative Compound X-8 | 4.8 | 22.4 | 21.5 | Blue |

Referring to the results of Table 2, it could be confirmed that the Examples of the light emitting devices utilizing the fused polycyclic compounds according to embodiments of the present disclosure as light emitting materials showed reduced driving voltages and improved emission efficiencies while maintaining the light emitting wavelengths of blue light when compared with the Comparative Examples.

The Example Compounds include two plate-type skeleton structures, each of which includes one boron atom and one carbazole moiety in a resonance structure, have a structure in which the two plate-type skeleton structures are directly bonded via benzene rings which are not connected with the boron atom in the carbazole moieties, and form a wide conjugation structure to stabilize a polycyclic aromatic ring structure. In addition, multi-resonance effects may be increased, reverse intersystem crossing may be easily generated, and when the Example Compounds are each utilized as thermally activated delayed fluorescence dopants, a full width at half maximum and a wavelength region may become suitable as blue light emitting materials, and emission efficiency may be improved. In addition, in each of the Example Compounds, the bonding positions of the carbazole moieties are selected to be suitable for blue light emission, and when included as the dopant of a blue light emitting device, emission efficiency may be improved. The light emitting device of an embodiment may include the fused polycyclic compound of an embodiment as the dopant of a thermally activated delayed fluorescence (TADF) emitting device, and may accomplish high device efficiency in a blue wavelength region, for example, in a deep blue wavelength region.

Comparative Compound X-1 included in Comparative Example 1 does not include a carbazole moiety via additional condensation but has a structure including only one boron atom, and thus, it could be confirmed that the device of Comparative Example 1 showed high driving voltage and degraded emission efficiency when compared with the Examples. Comparative Compounds X-2 and X-3 included in Comparative Examples 2 and 3, respectively, each include plate-type skeletons with two boron atoms as centers but are not compounds including two condensed unit structures including carbazole moieties through additional condensation, and thus, it could be confirmed that each of the devices of Comparative Examples 2 and 3 showed high driving voltage and degraded emission efficiency when compared with the Examples. Comparative Compound X-4 included in Comparative Example 4, has two plate-type skeleton structures, each of which includes one boron atom and one carbazole moiety in a resonance structure, but the two skeleton structures are connected via an arylene linker, and the two skeleton structures are connected not via the carbazole moieties but via other moieties, and thus, it could be confirmed that the device of Comparative Example 4 showed high driving voltage and degraded emission efficiency when compared with the Examples. Comparative Compound X-5 included in Comparative Example 5 includes two plate-type skeleton structures, each of which includes one boron atom in a resonance structure, but the two skeleton structures do not include carbazole moieties, respectively, and thus, it could be confirmed that the device of Comparative Example 5 showed degraded emission efficiency when compared with the Examples. Comparative Compound X-6 included in Comparative Example 6 includes only one plate-type skeleton structure including one boron atom and one carbazole moiety in a resonance structure, and thus, it could be confirmed that the device of Comparative Example 6 showed degraded emission efficiency when compared with the Examples. Comparative Compounds X-7 and X-8 included in Comparative Examples 7 and 8, respectively, each include two plate-type skeleton structures, each of which includes one boron atom and one carbazole moiety in a resonance structure, but the two skeleton structures are connected not via carbazole moieties but via other parts, and thus, it could be confirmed that the devices of Comparative Examples 7 and 8 showed degraded emission efficiency when compared with the Examples.

The light emitting device of an embodiment may show improved device properties of high efficiency.

The fused polycyclic compound of an embodiment may be included in the emission layer of a light emitting device and may contribute to the increase of efficiency of a light emitting device.

As used herein, the terms "use," "using," and "used" may be considered synonymous with the terms "utilize," "utilizing," and "utilized," respectively. As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items. Further, the use of "may" when describing embodiments of the present disclosure refers to "one or more embodiments of the present disclosure".

Although the embodiments of the present invention have been described, it is understood that the present invention should not be limited to these embodiments, but various suitable changes and modifications can be made by one ordinary skilled in the art within the spirit and scope of the present invention as hereinafter claimed, and equivalents thereof.

The invention claimed is:

1. A light emitting device, comprising:

a first electrode;

a second electrode facing the first electrode; and a plurality of organic layers between the first electrode and the second electrode, wherein at least one organic layer among the plurality of organic layers comprises a fused polycyclic compound represented by Formula 1:

Formula 1

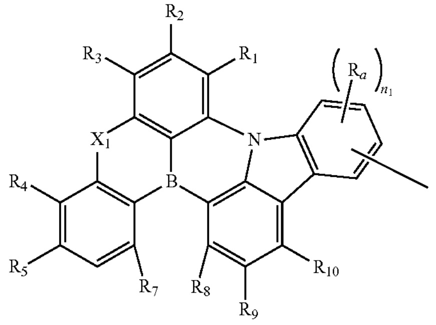

-continued

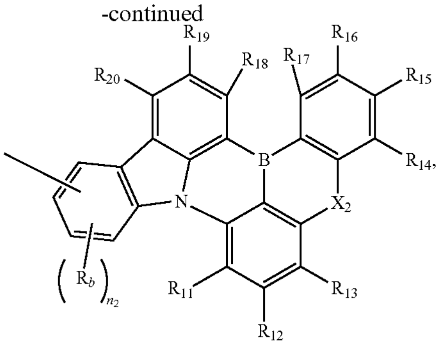

and wherein in Formula 1, $X_1$ and $X_2$ are each independently $NR_c$, O, S, or Se, $R_1$ to $R_{20}$, and $R_a$ to $R_c$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and "$n_1$" and "$n_2$" are each independently an integer of 1 to 3.

2. The light emitting device of claim 1, wherein the plurality of organic layers comprises:

a hole transport region on the first electrode;

an emission layer on the hole transport region; and an electron transport region on the emission layer, and the emission layer comprises the fused polycyclic compound.

3. The light emitting device of claim 2, wherein the emission layer is to emit delayed fluorescence.

4. The light emitting device of claim 2, wherein the emission layer is a delayed fluorescence emission layer comprising a host and a dopant, and the dopant comprises the fused polycyclic compound.

5. The light emitting device of claim 2, wherein the emission layer is to emit light with a central wavelength of about 430 nm to about 490 nm.

6. The light emitting device of claim 1, wherein the fused polycyclic compound represented by Formula 1 is represented by any one among Formula 2-1 to Formula 2-6:

Formula 2-1

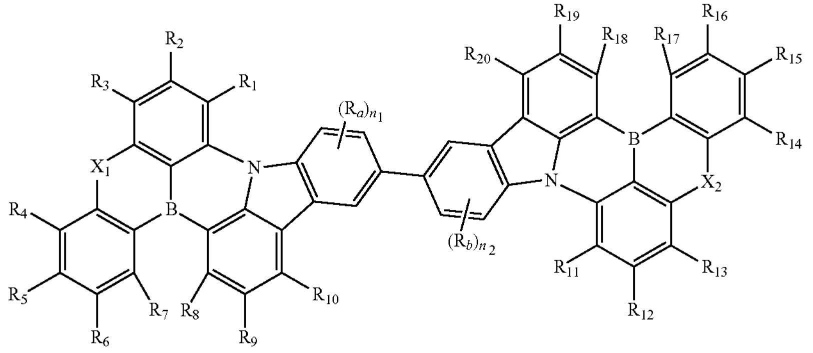

-continued
Formula 2-2
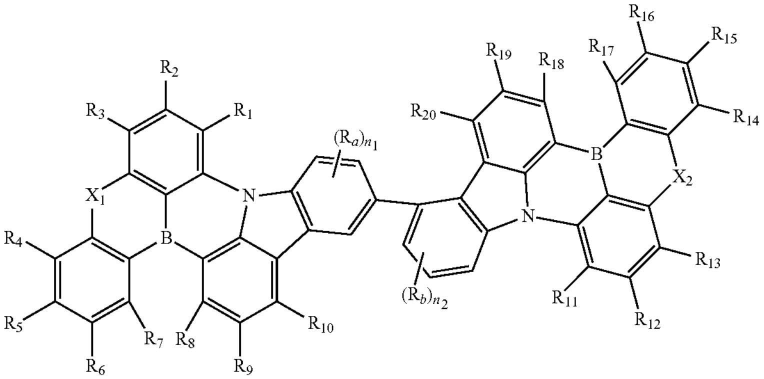
Formula 2-3
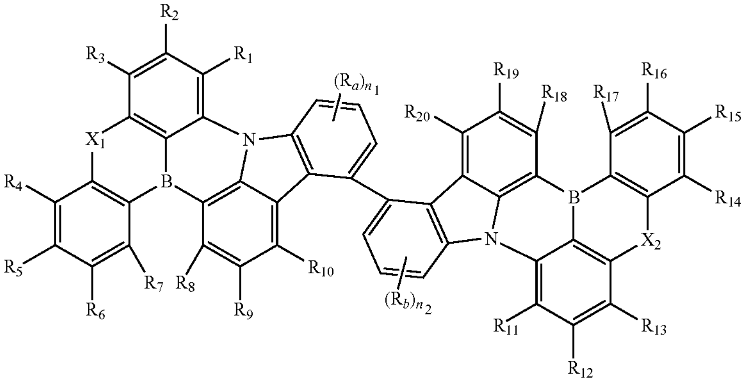
Formula 2-4
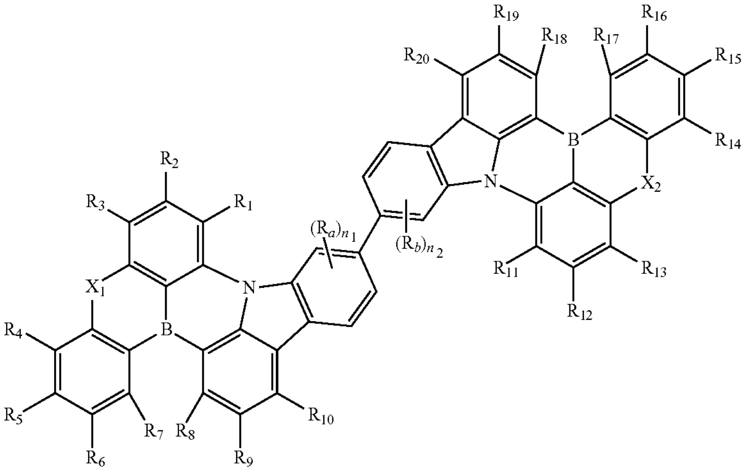
Formula 2-5
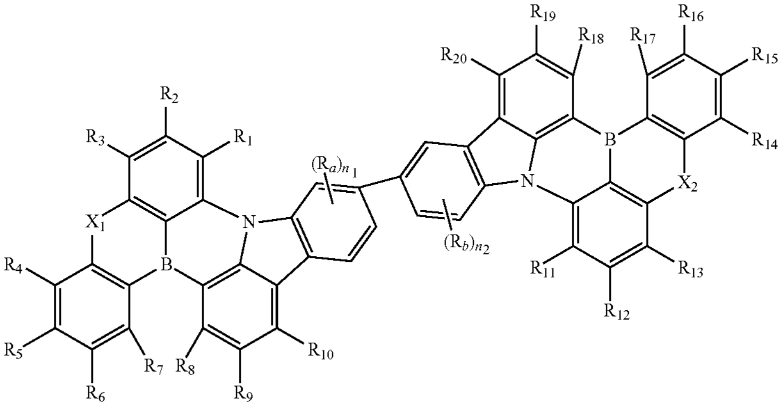

-continued

Formula 2-6

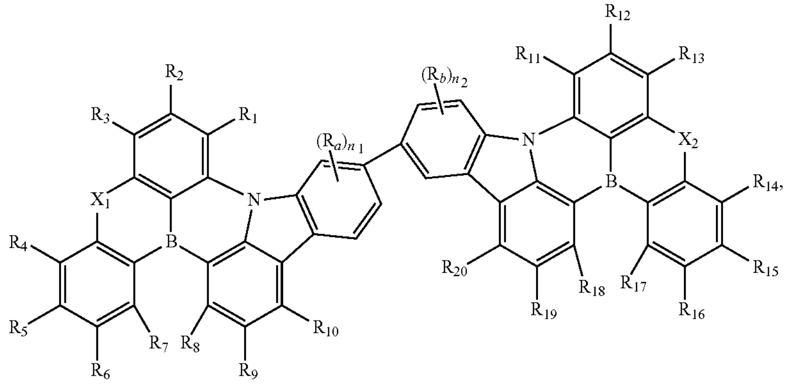

and wherein in Formula 2-1 to Formula 2-6, $X_1$, $X_2$, $R_1$ to $R_{20}$, $R_a$ to $R_c$, "$n_1$" and "$n_2$" are the same as respectively defined in connection with Formula 1.

7. The light emitting device of claim 1, wherein the fused polycyclic compound represented by Formula 1 is represented by Formula 3:

Formula 3

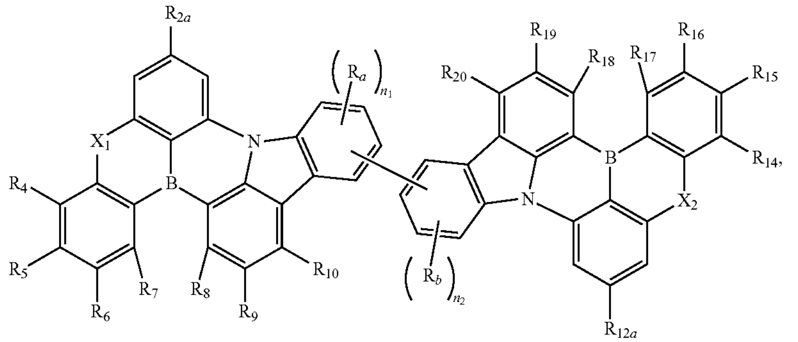

and wherein in Formula 3, $R_{2a}$ and $R_{12a}$ are each independently a deuterium atom, a halogen atom, a substituted or unsubstituted amine group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and $X_1$, $X_2$, $R_4$ to $R_{10}$, $R_{14}$ to $R_{20}$, $R_a$ to $R_c$, "$n_1$" and "$n_2$" are the same as respectively defined in connection with Formula 1.

8. The light emitting device of claim 1, wherein the fused polycyclic compound represented by Formula 1 is represented by any one among Formula 4-1 to Formula 4-3:

Formula 4-1

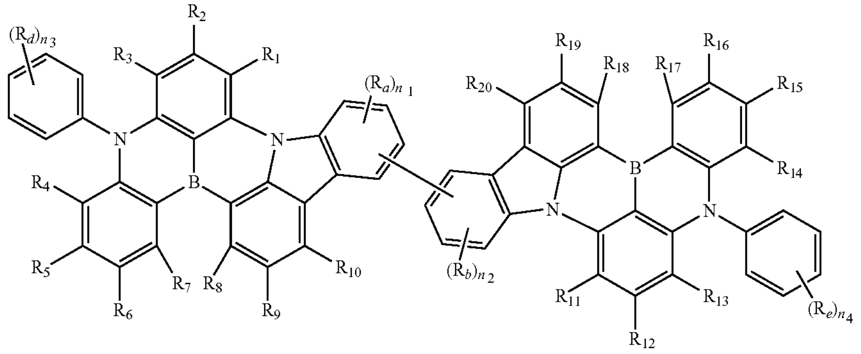

Formula 4-2

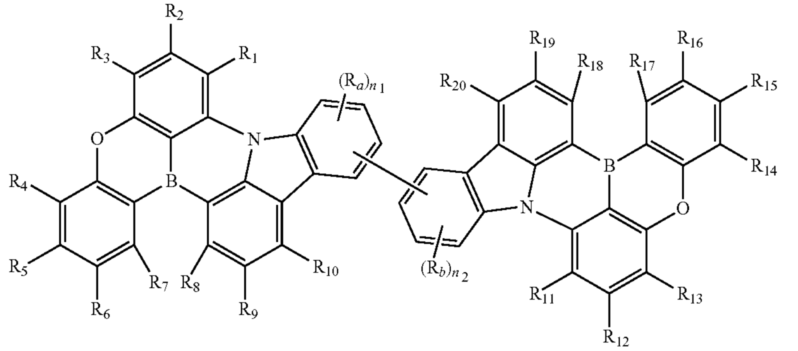

Formula 4-3

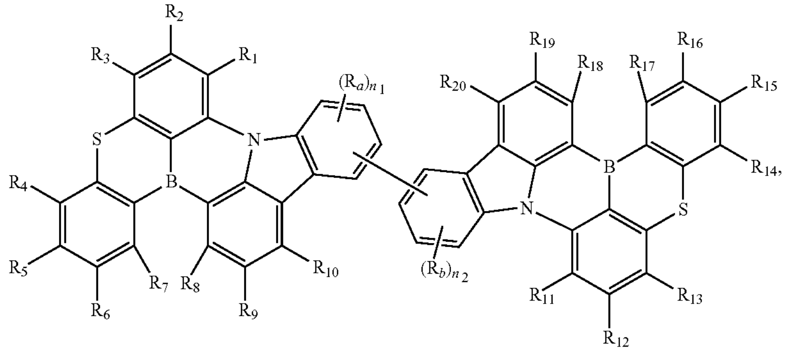

and wherein in Formula 4-1 to Formula 4-3, $R_d$ and $R_e$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, "$n_3$" and "$n_4$" are each independently an integer of 1 to 5, and $R_1$ to $R_{20}$, $R_a$, $R_b$, "$n_1$" and "$n_2$" are the same as respectively defined in connection with Formula 1.

9. The light emitting device of claim 1, wherein, in Formula 1, $X_1$ and $X_2$ are the same, $R_1$ and $R_{11}$ are the same, $R_2$ and $R_{12}$ are the same, $R_3$ and $R_{13}$ are the same, $R_4$ and $R_{14}$ are the same, $R_5$ and $R_{15}$ are the same, $R_e$ and $R_{16}$ are the same, $R_7$ and $R_{17}$ are the same, R& and $R_{18}$ are the same, Ry and $R_{19}$ are the same, $R_{10}$ and $R_{20}$ are the same, and $R_a$ and $R_b$ are the same.

10. The light emitting device of claim 1, wherein, in Formula 1, $R_1$ to $R_{20}$ are each independently a hydrogen atom, a deuterium atom, a substituted or unsubstituted diphenylamine group, a substituted or unsubstituted t-butyl group, a substituted or unsubstituted phenyl group, or a substituted or unsubstituted carbazole group.

11. The light emitting device of claim 1, wherein, in Formula 1, $R_a$ and $R_b$ are each independently a hydrogen atom or a deuterium atom.

12. The light emitting device of claim 1, further comprising a capping layer on the second electrode, wherein the capping layer has a refractive index of about 1.6 or more.

13. The light emitting device of claim 1, wherein the fused polycyclic compound comprises at least one among compounds in Compound Group 1:

Compound Group 1
1
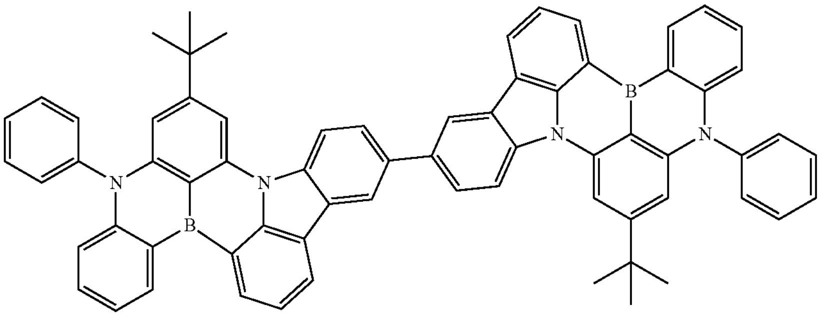
2
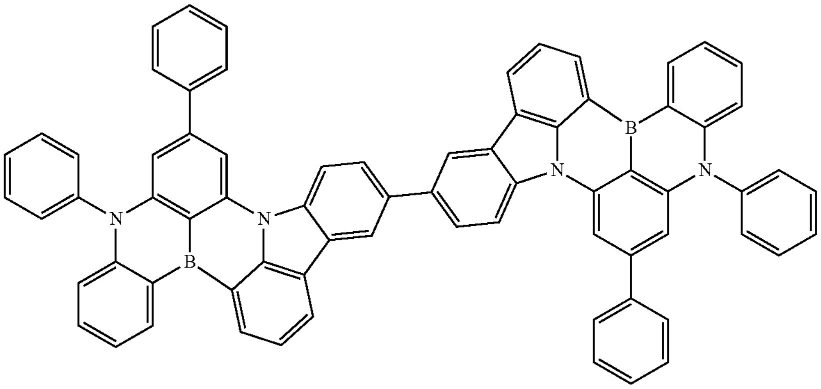
3
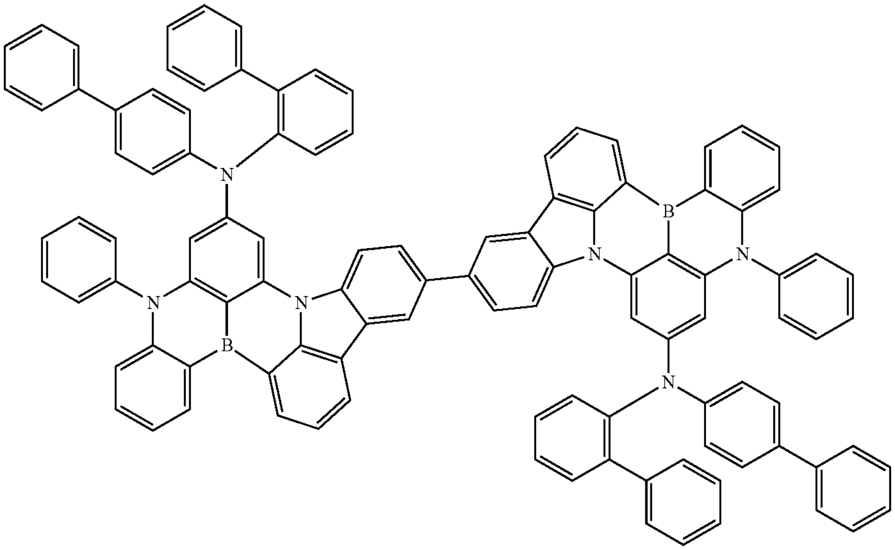

-continued
4
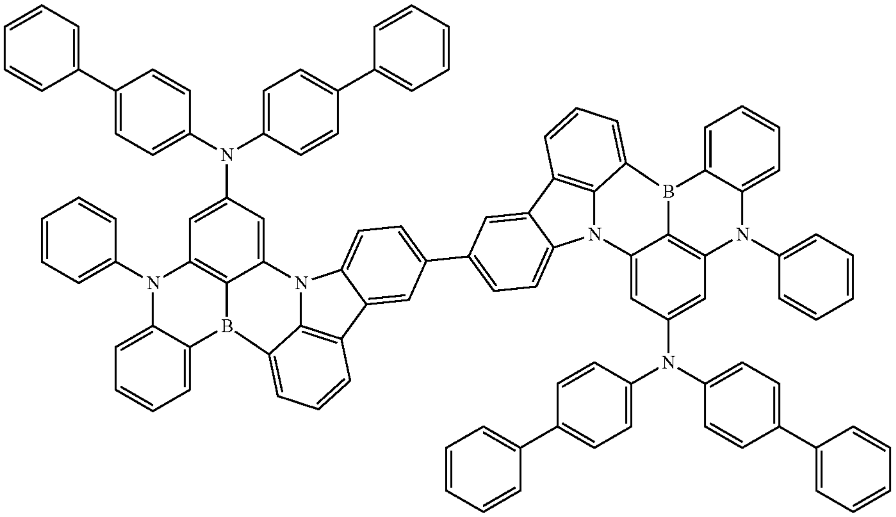
5
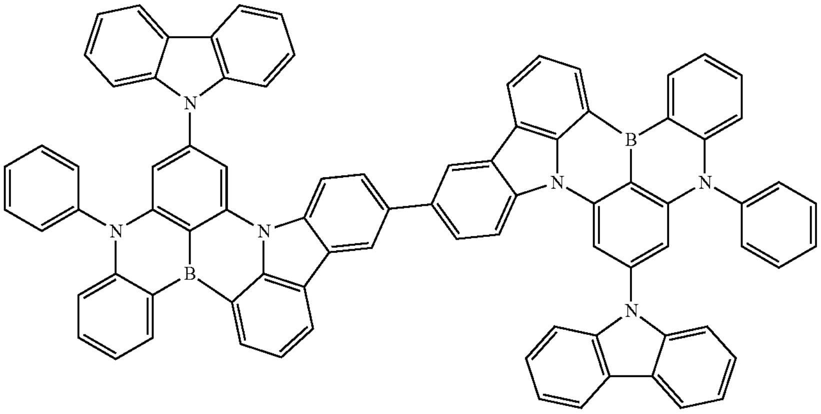
6
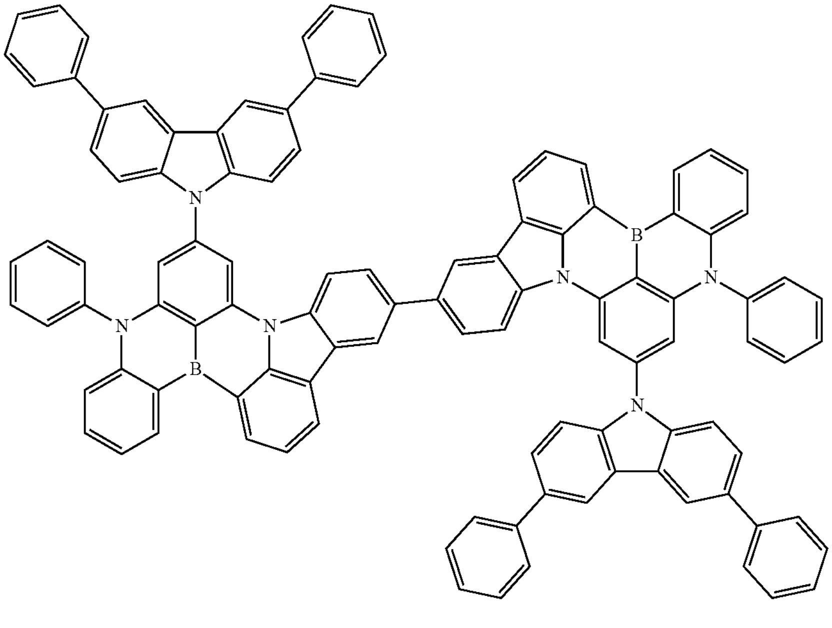

-continued
7
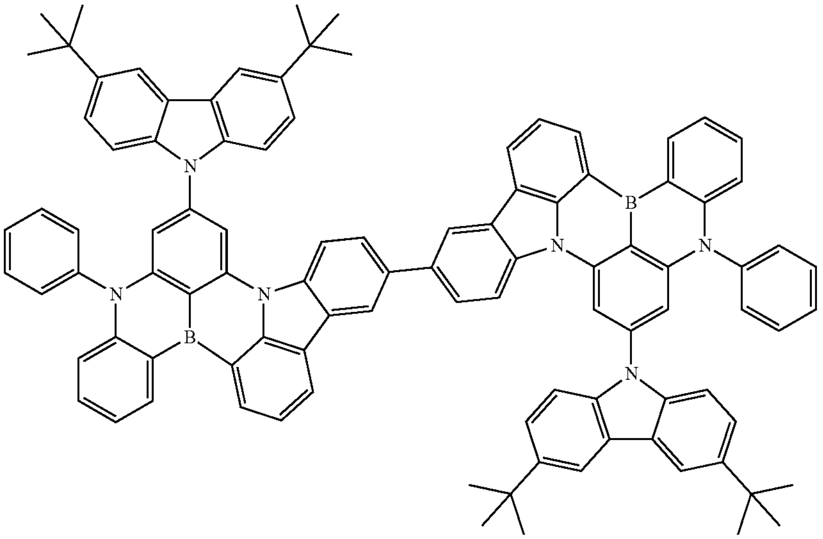
8
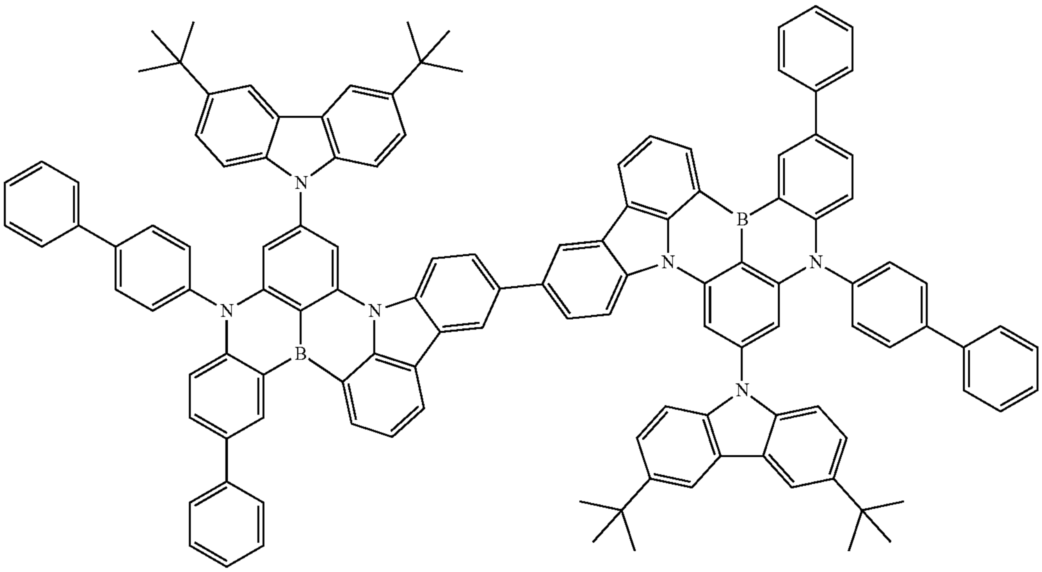
9
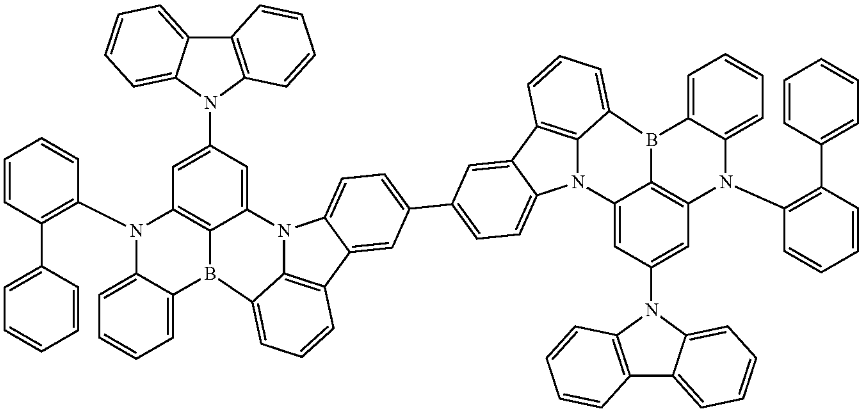

-continued
10
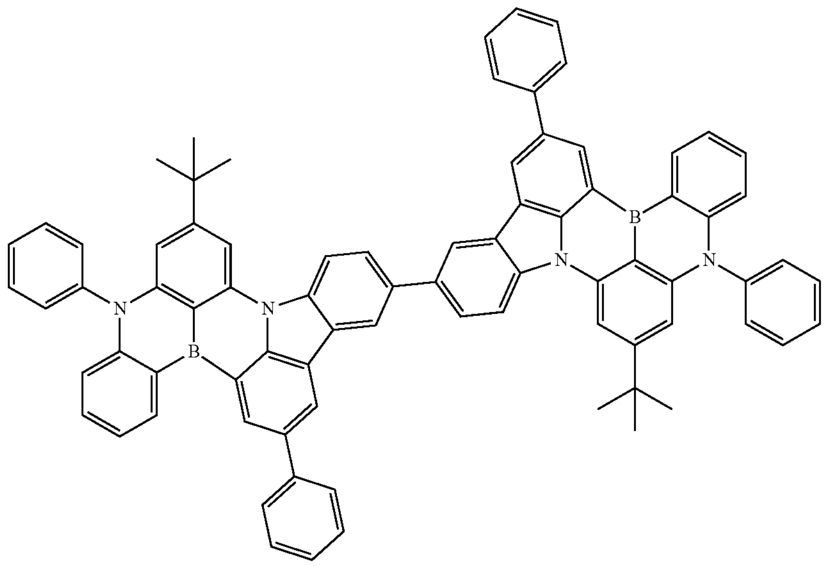
11
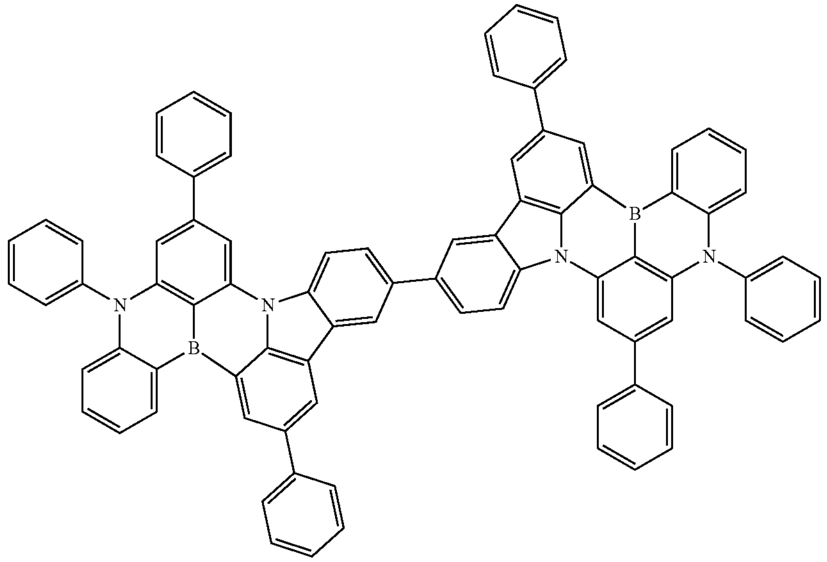

-continued
12
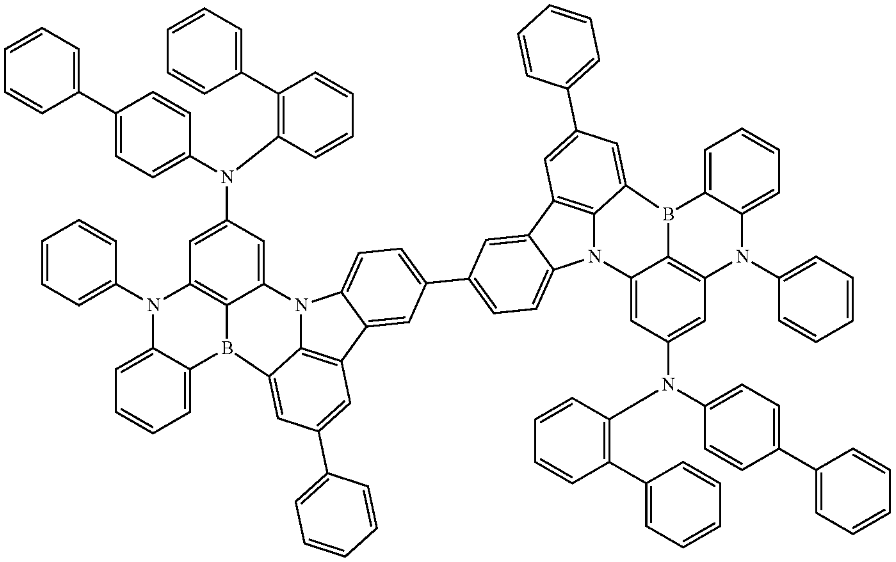
13
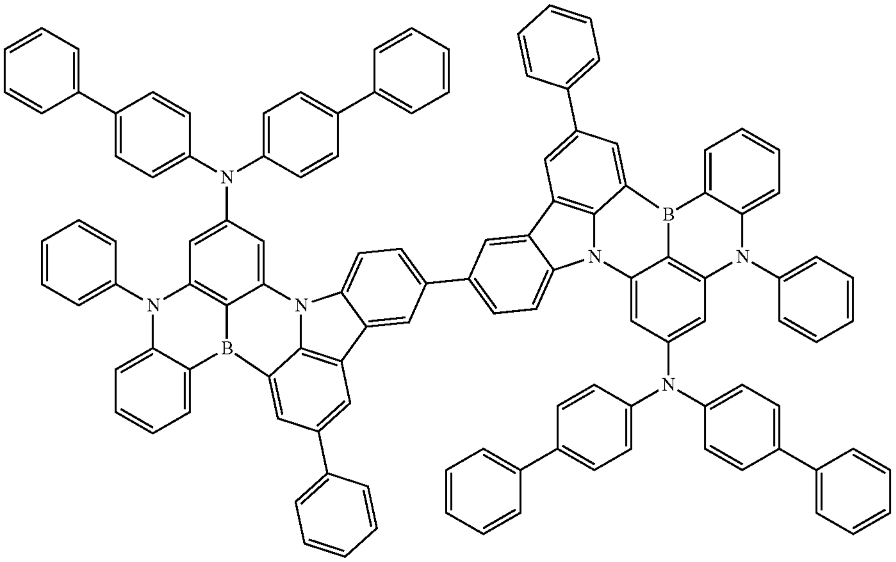

-continued
14
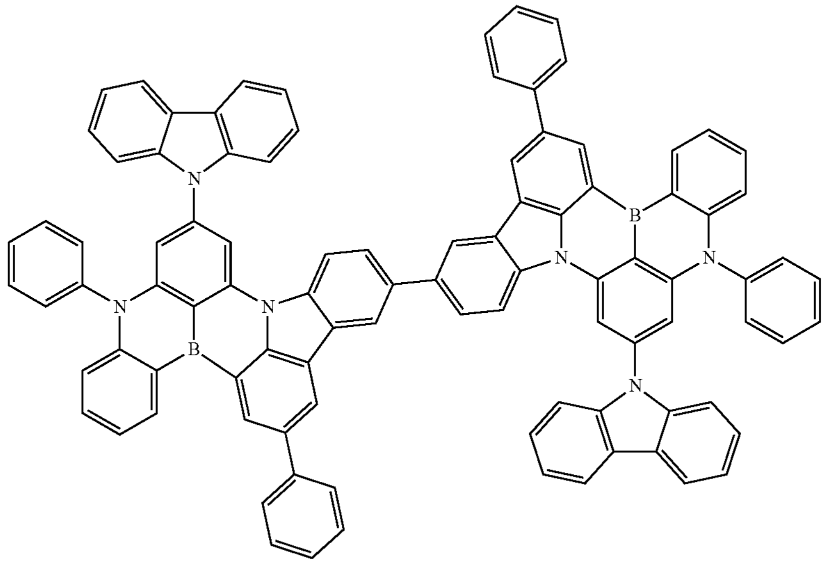
15
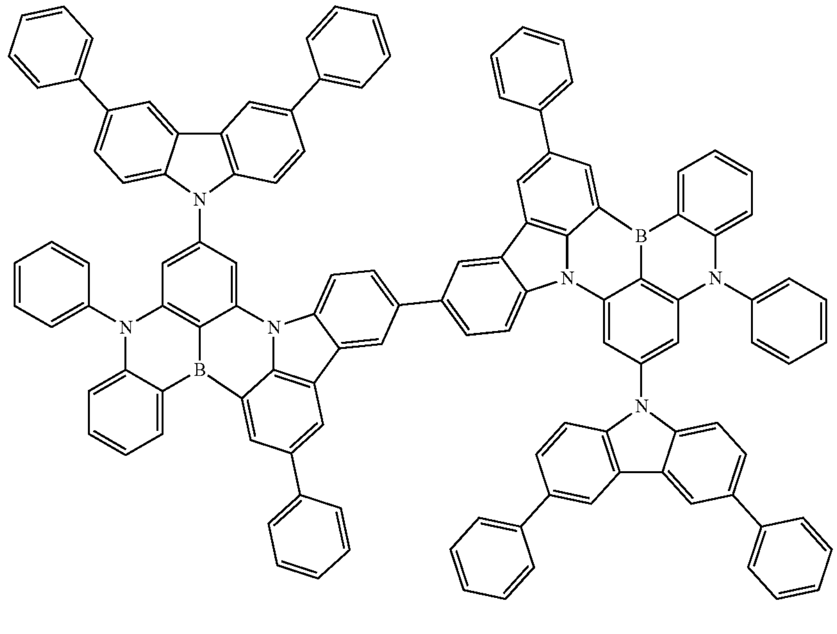

-continued
16
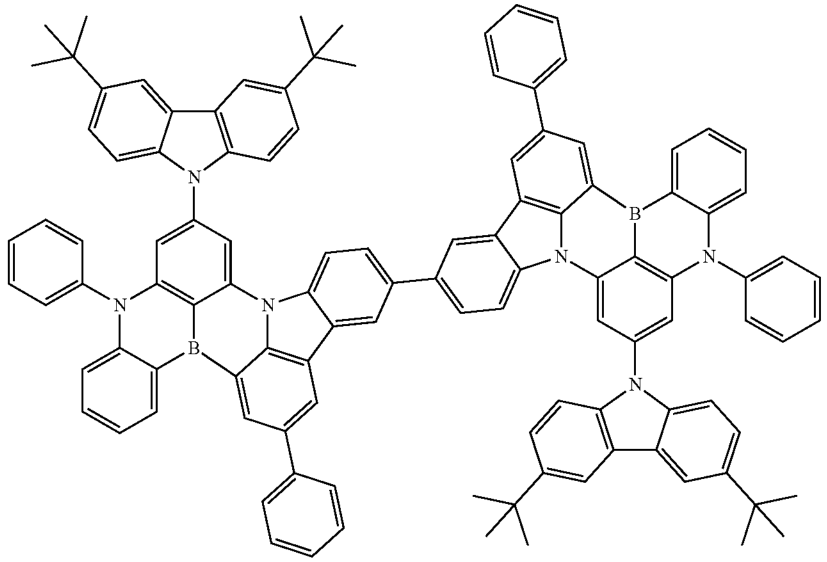
17
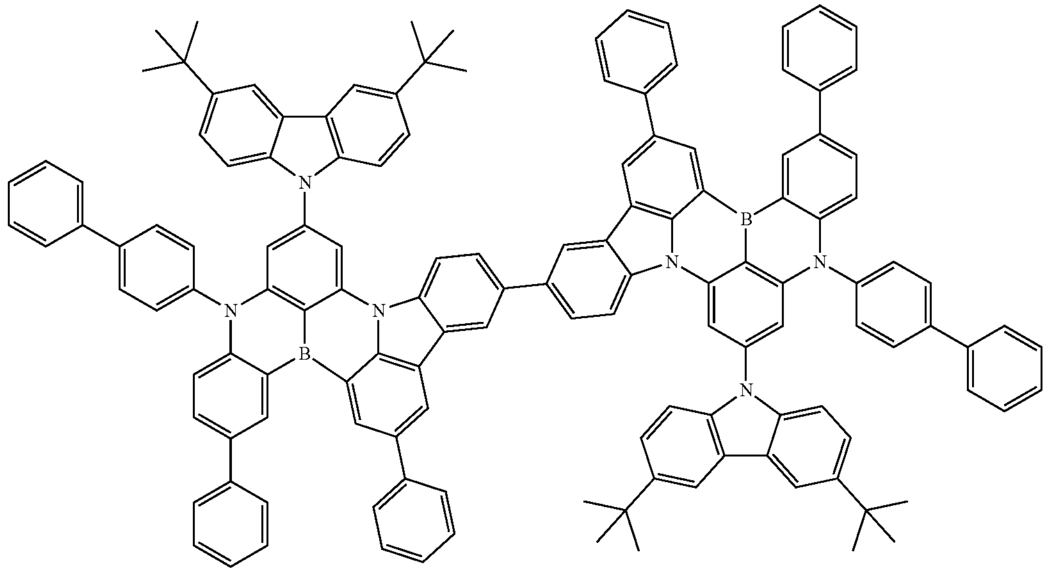

-continued
18
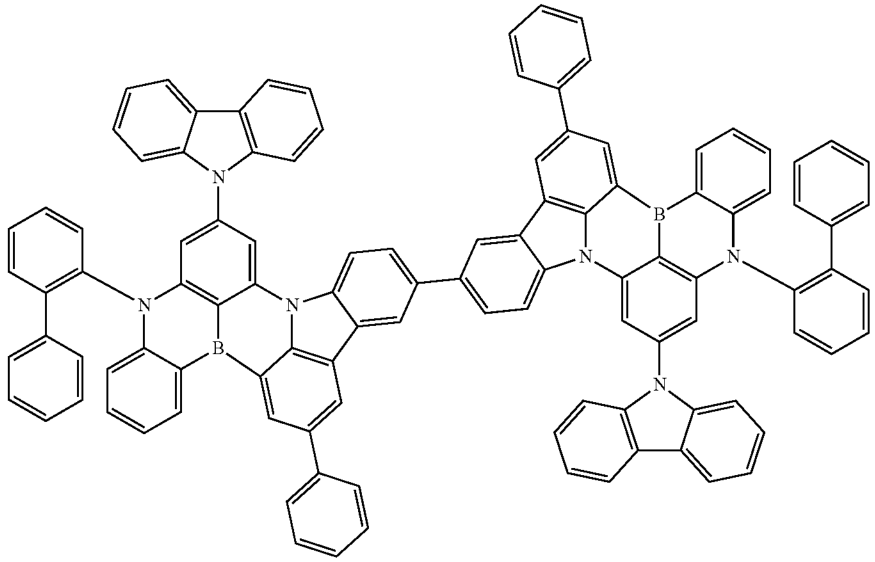
19
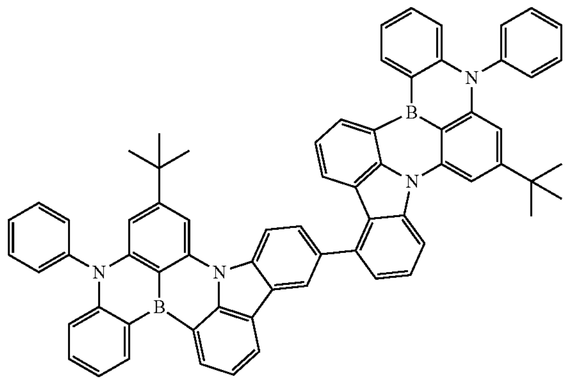
20
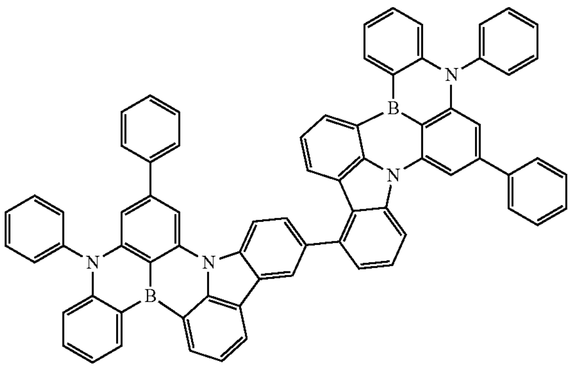
21
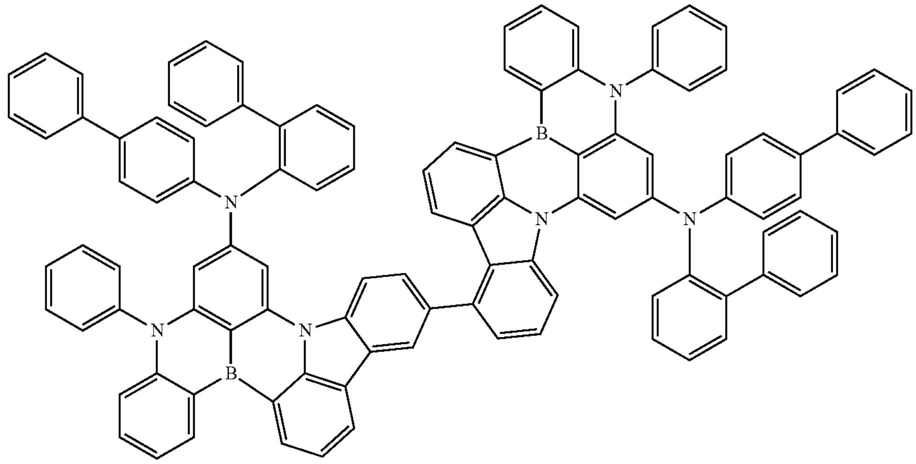

-continued
22
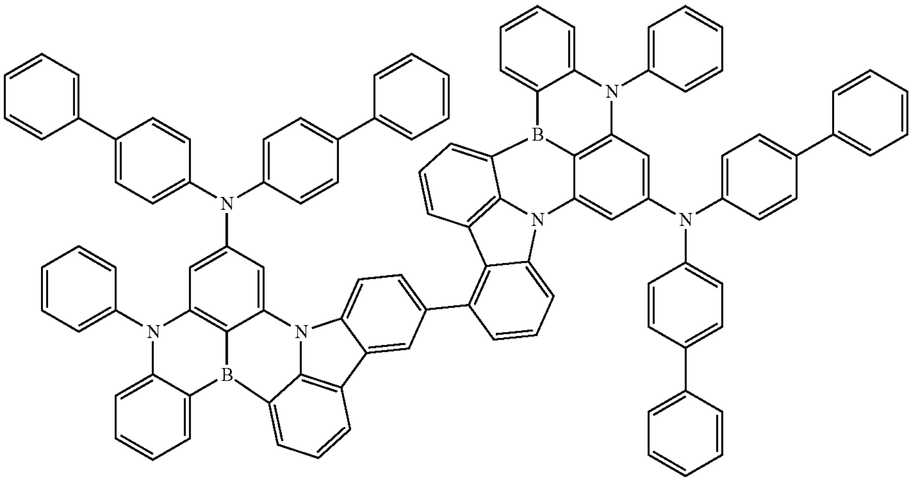
23
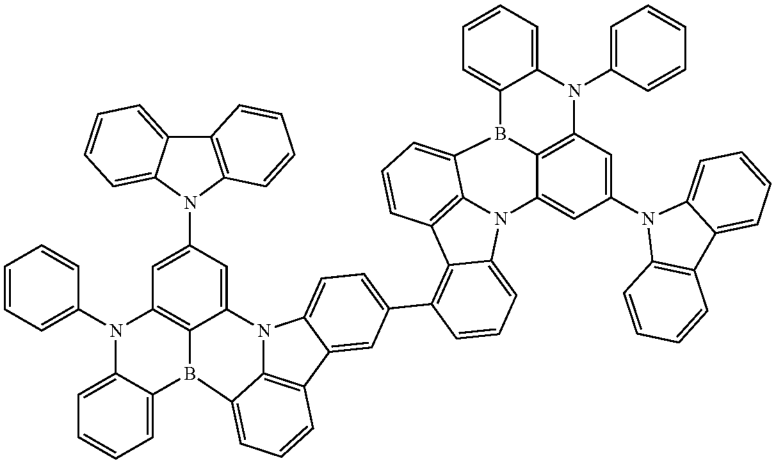
24
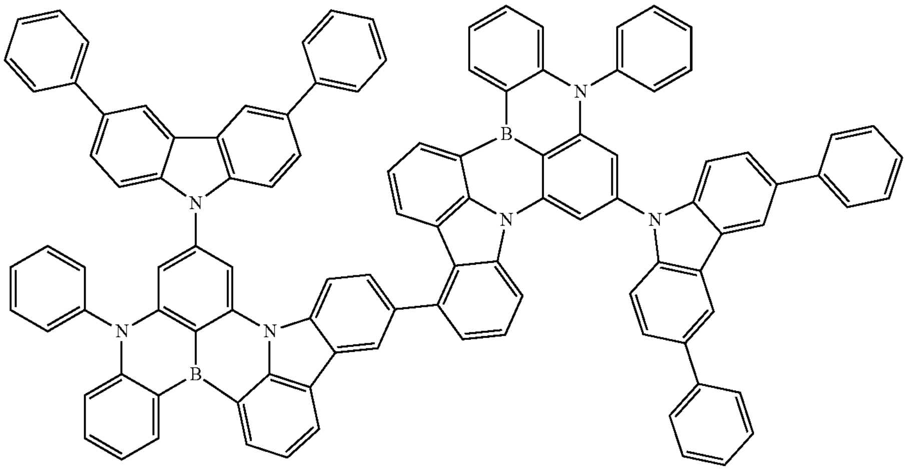

-continued
25
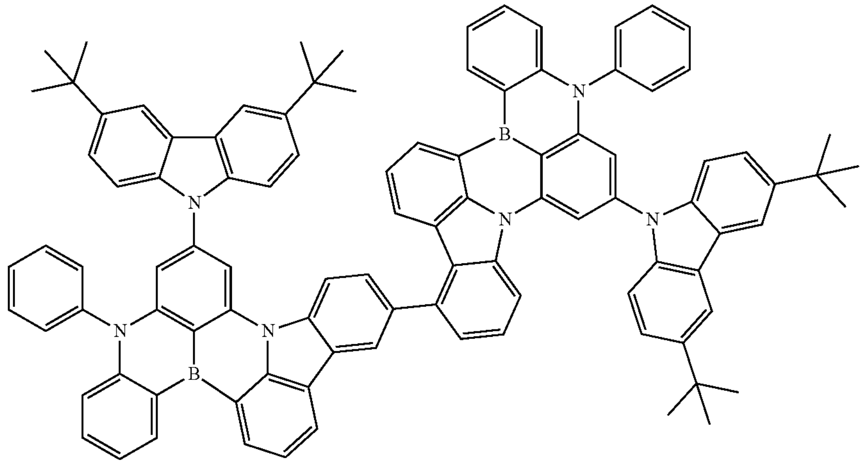
26
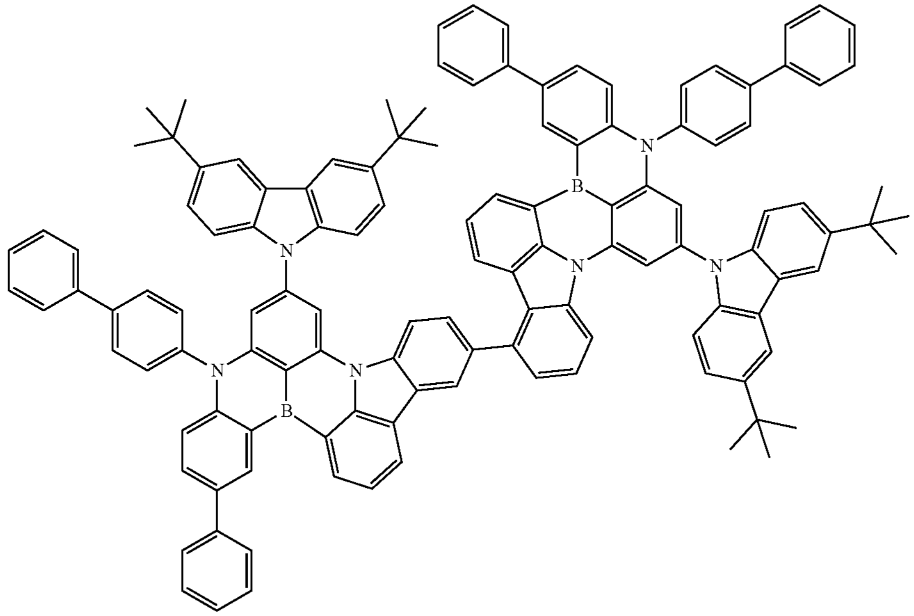
27
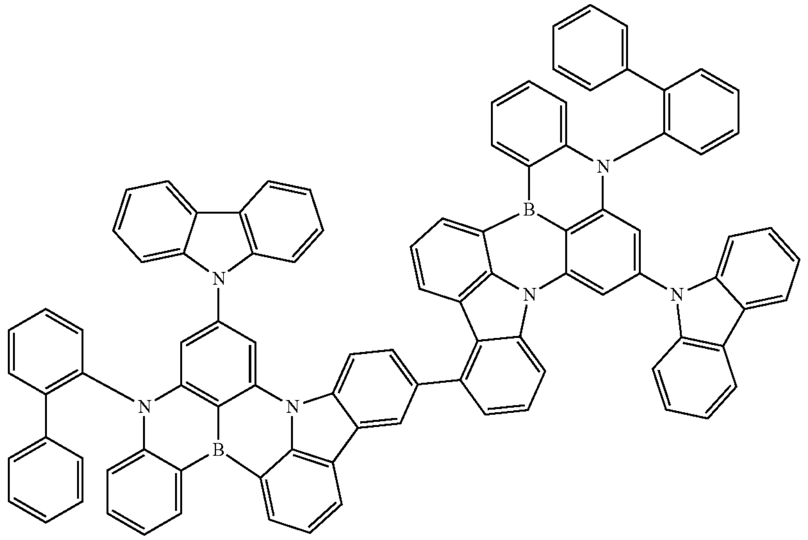

-continued
28
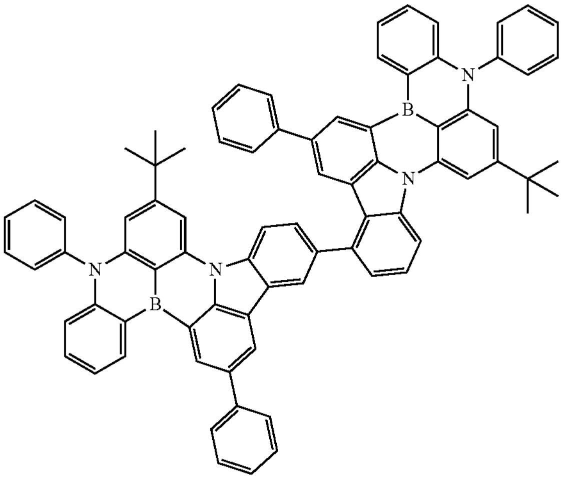
29
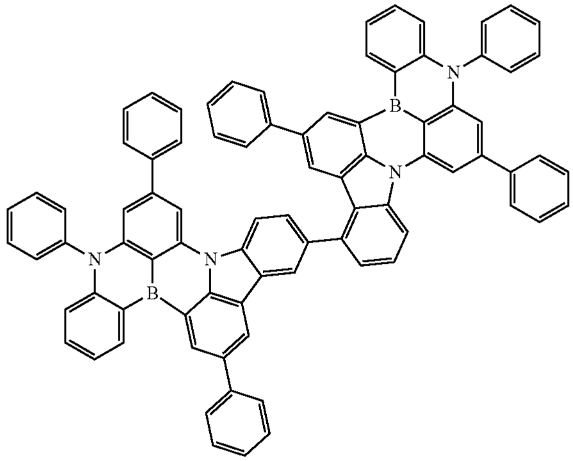
30
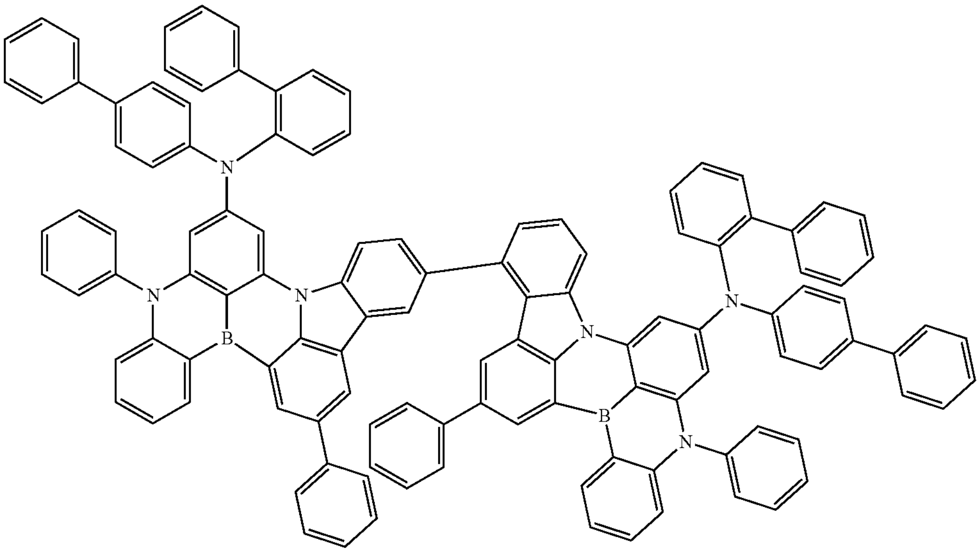
31
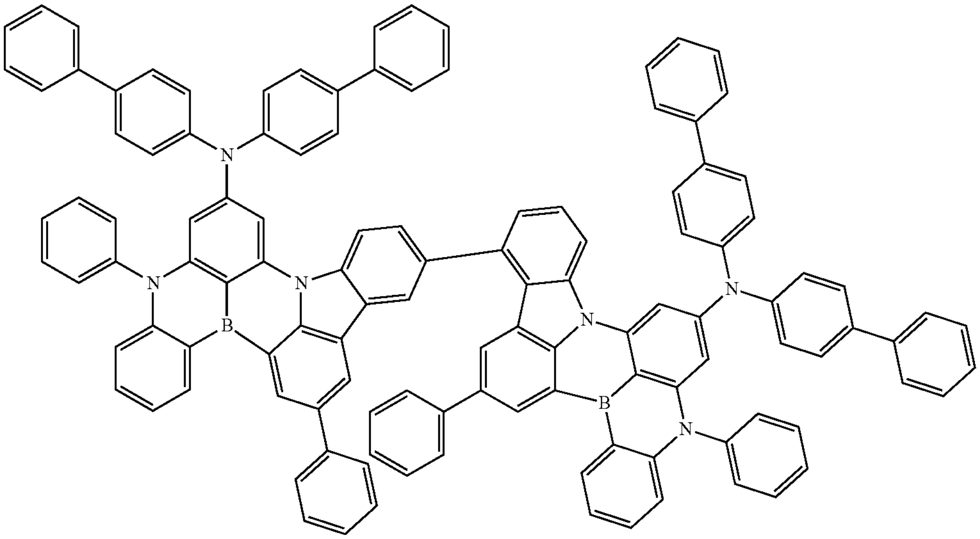

-continued
32
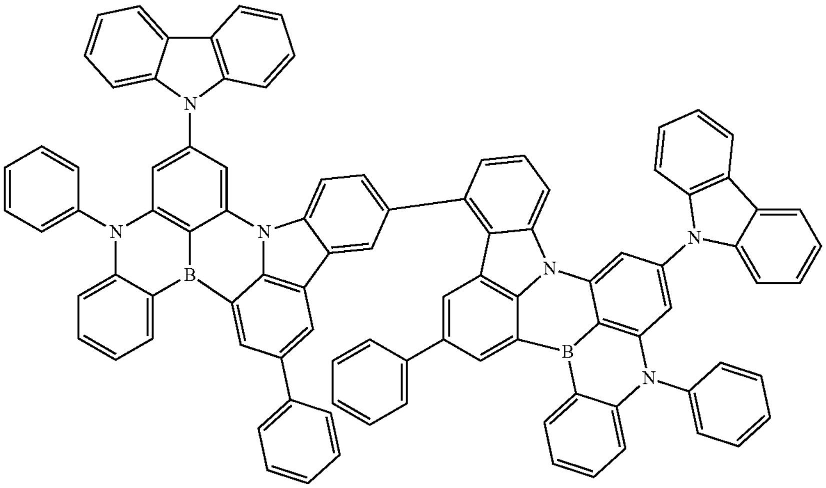
33
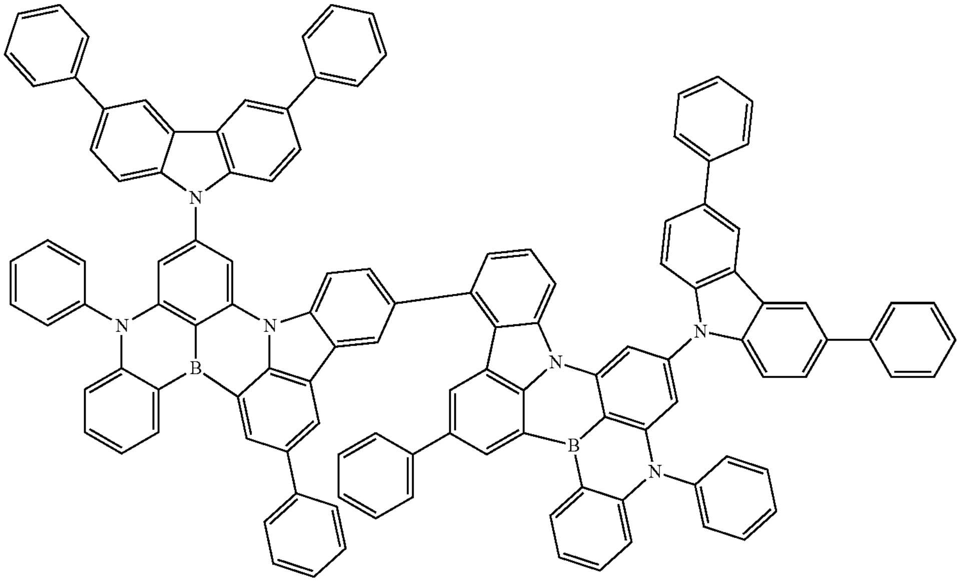
34
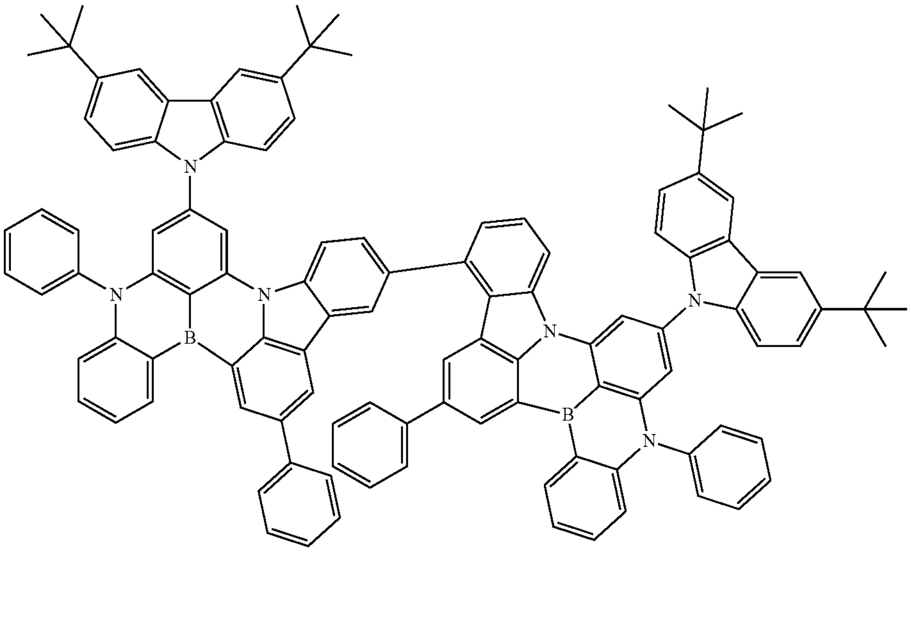

-continued
35
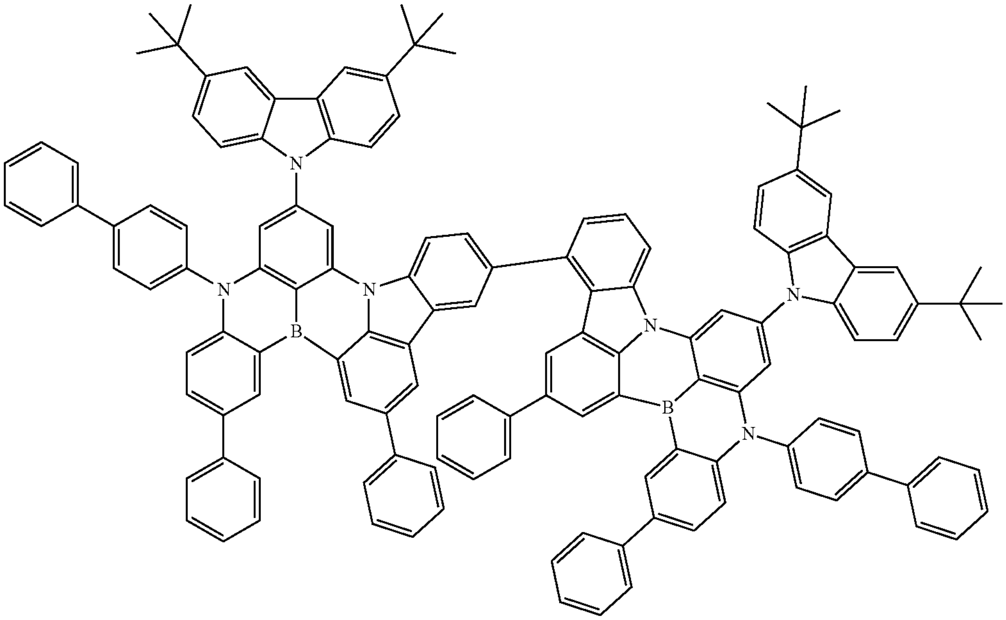
36
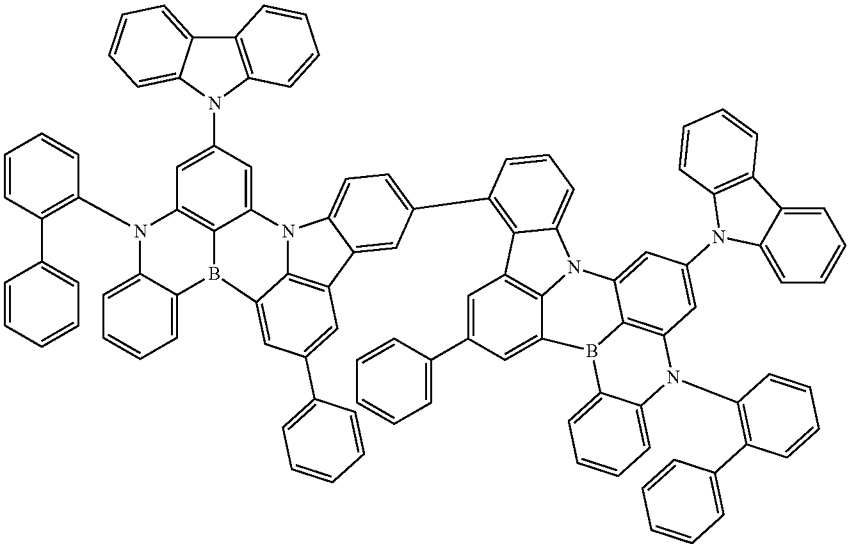
37
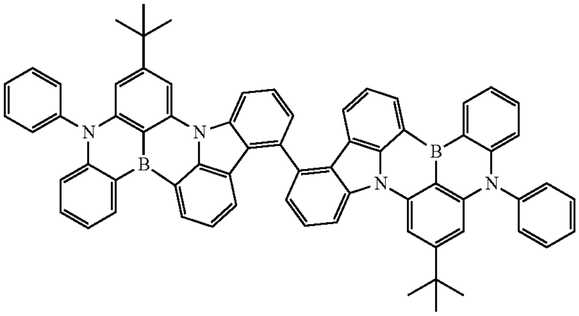
38
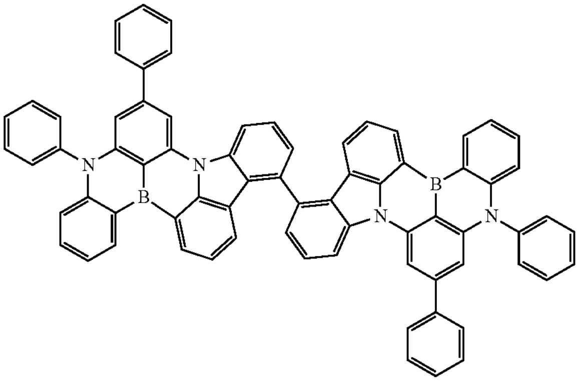

-continued
39
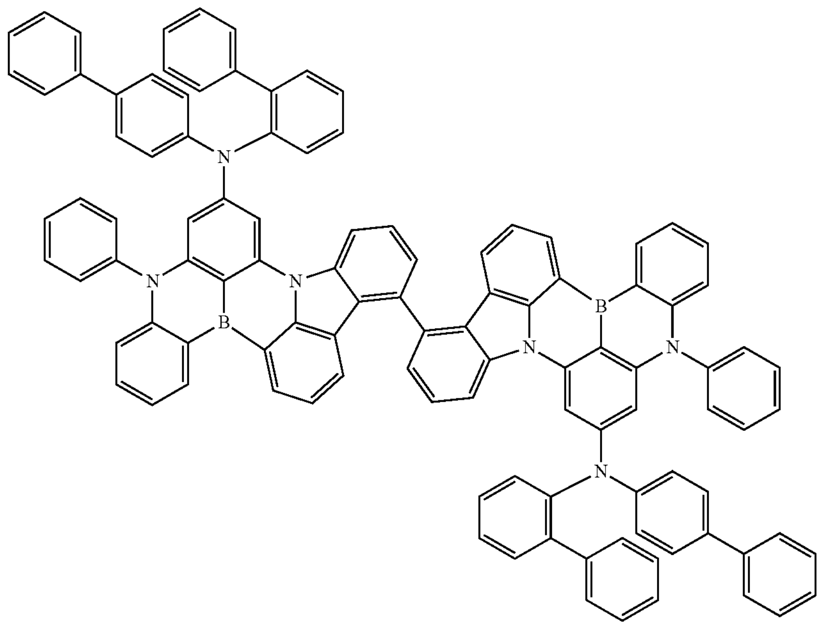
40
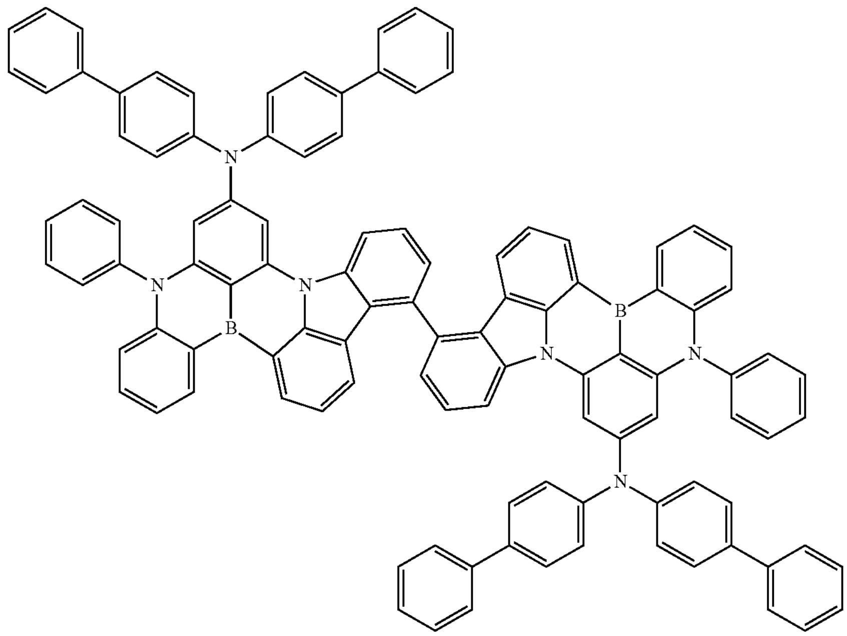

-continued
41
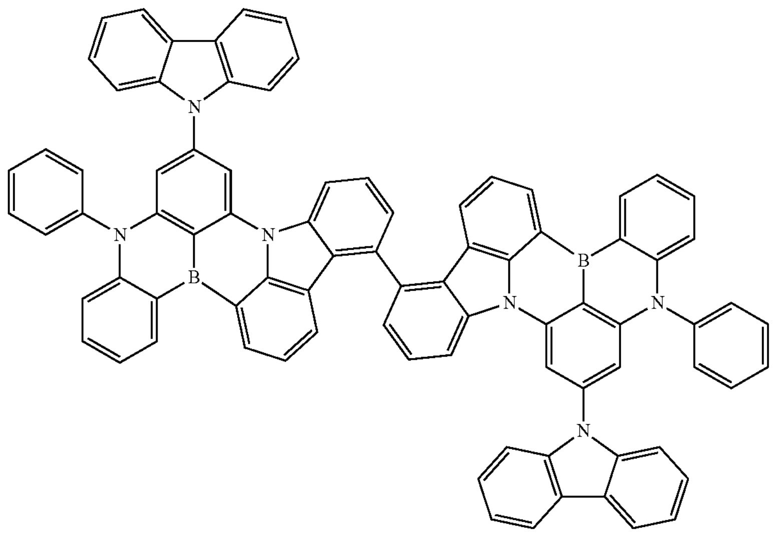
42
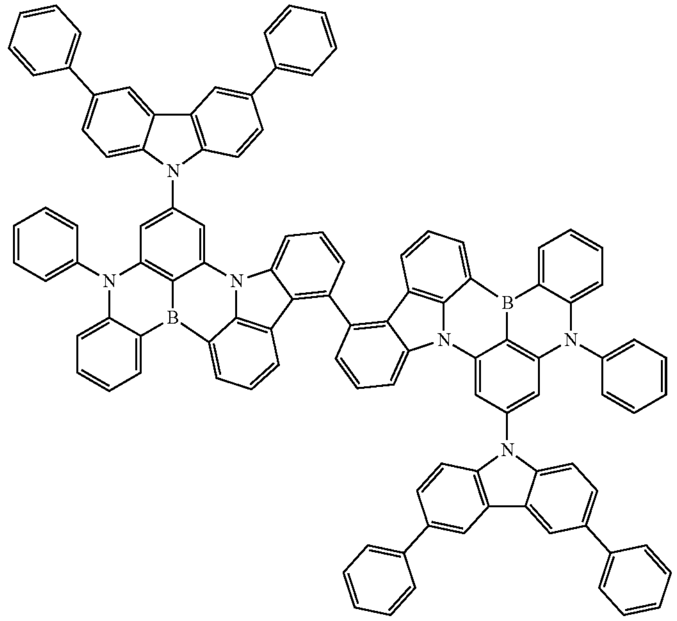

-continued
43
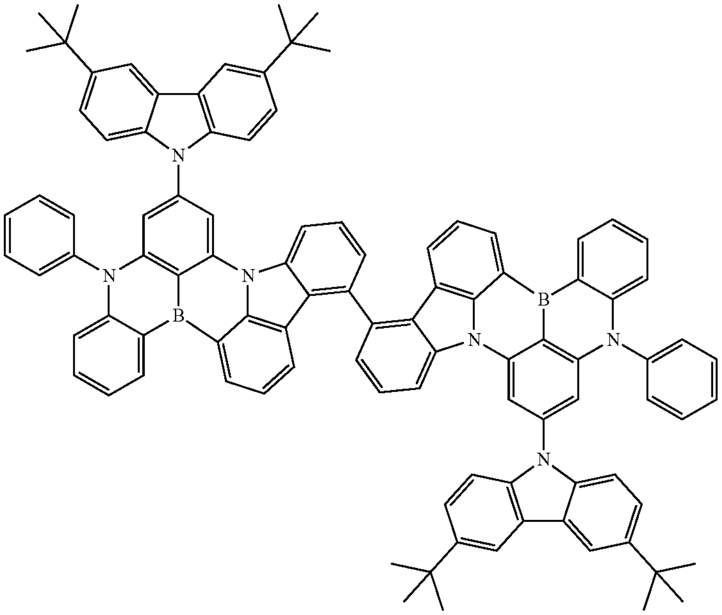
44
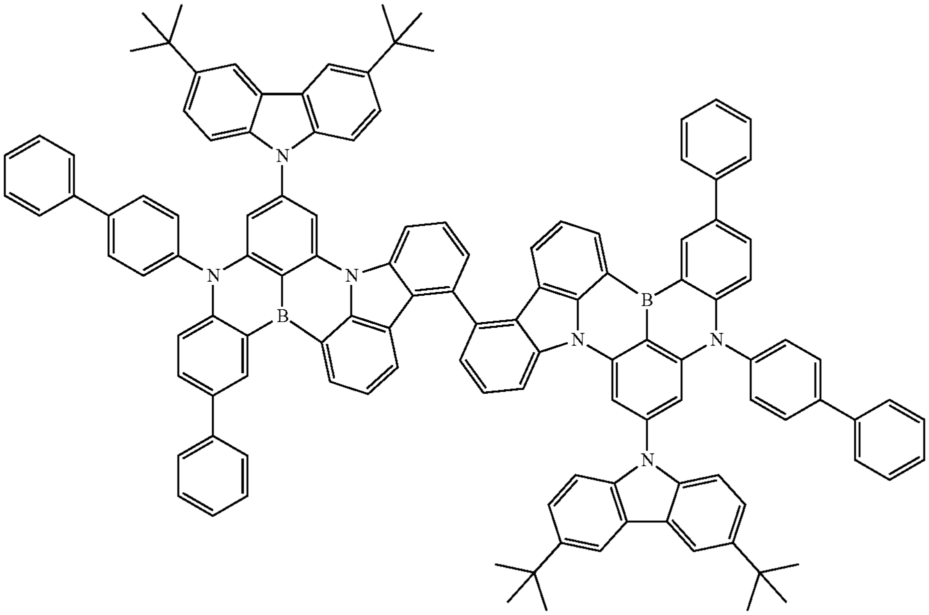

-continued
45
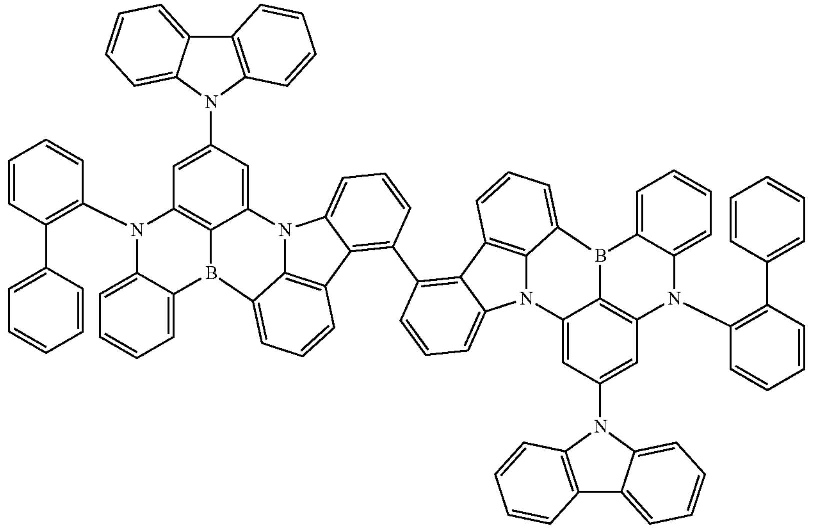
46
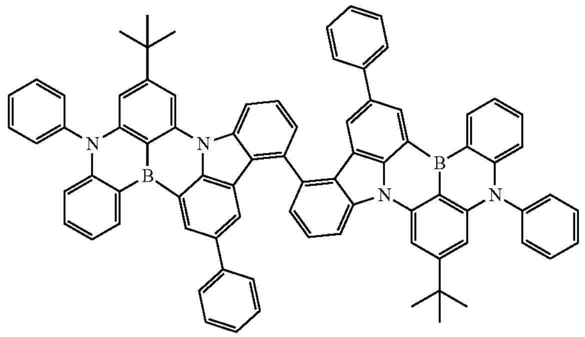
47
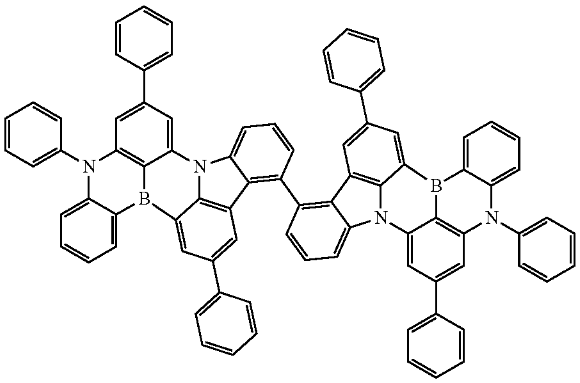
48
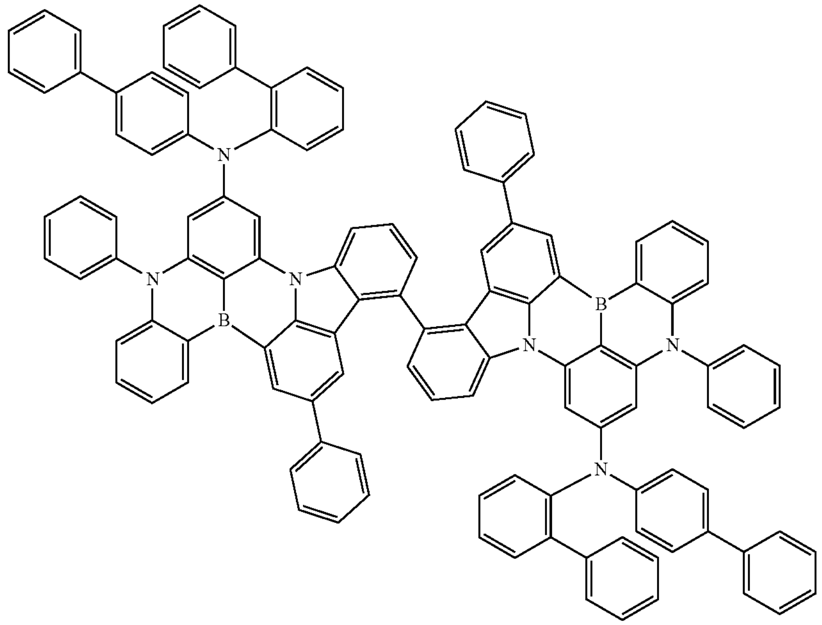

-continued
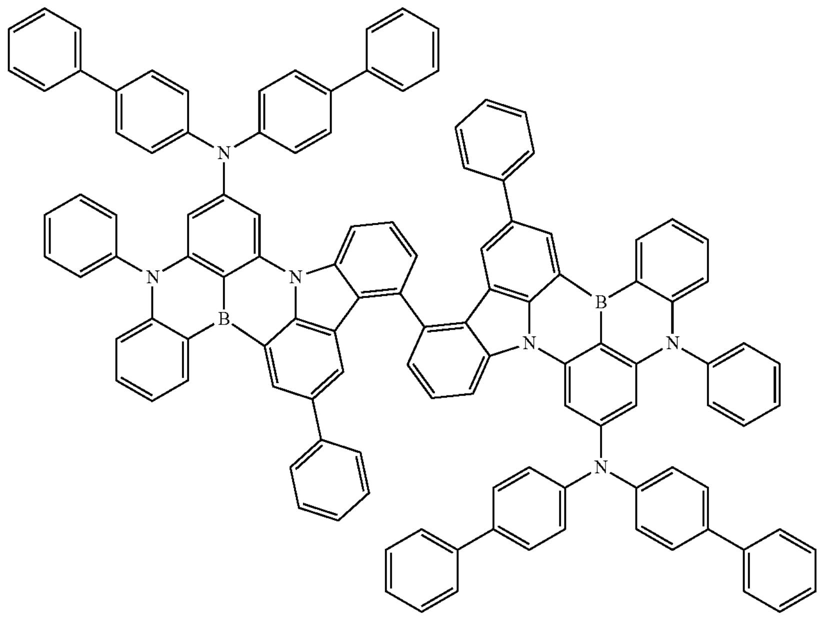
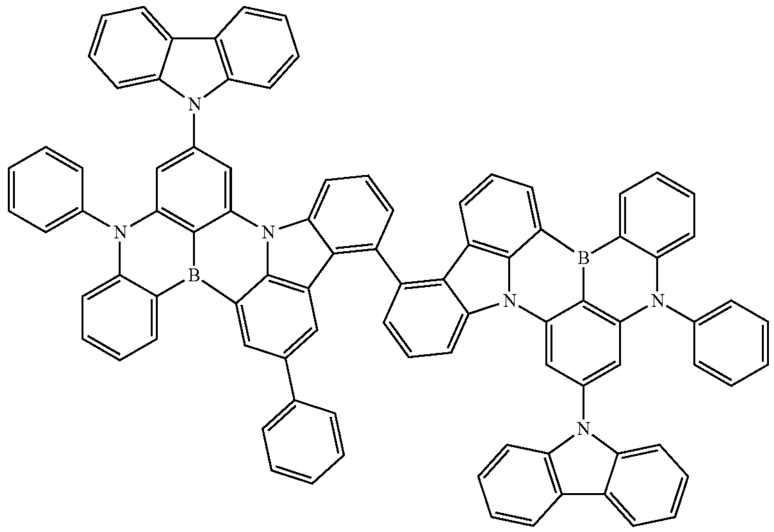

-continued
51
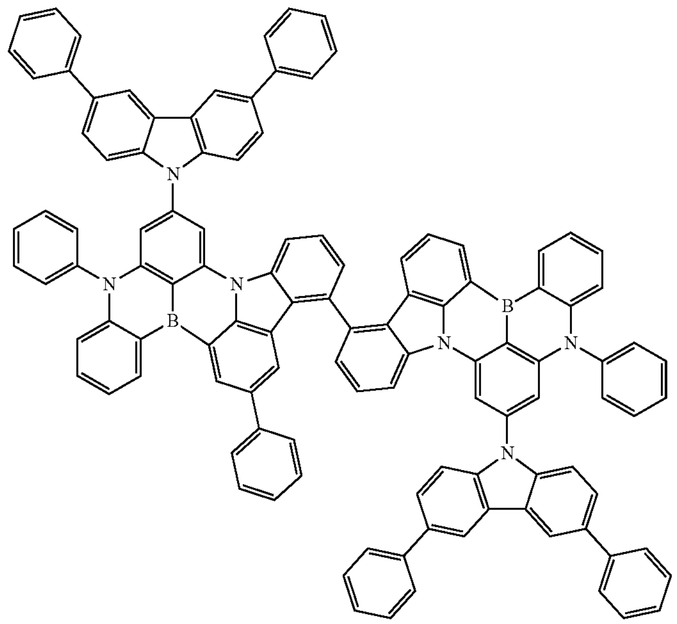
52
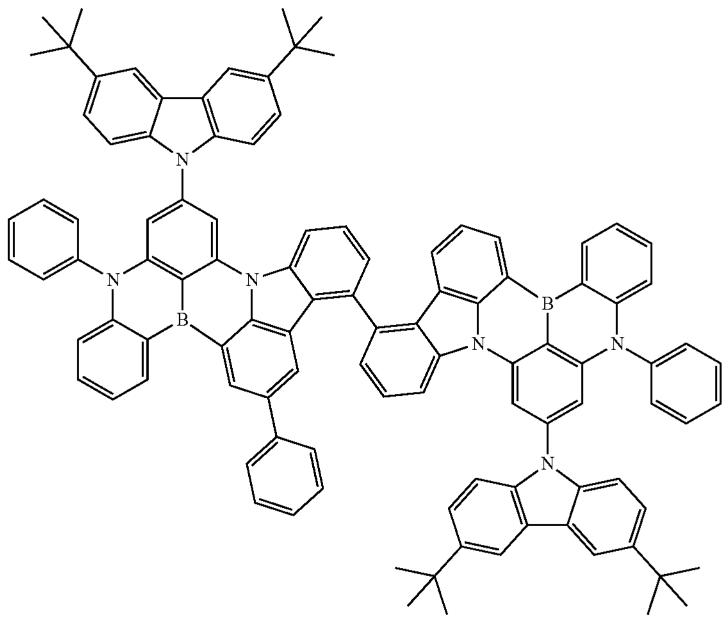

-continued
53
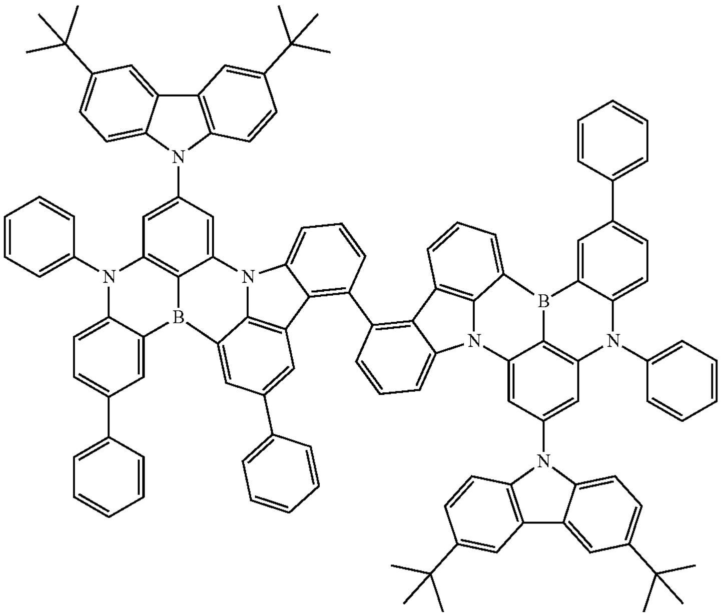
54
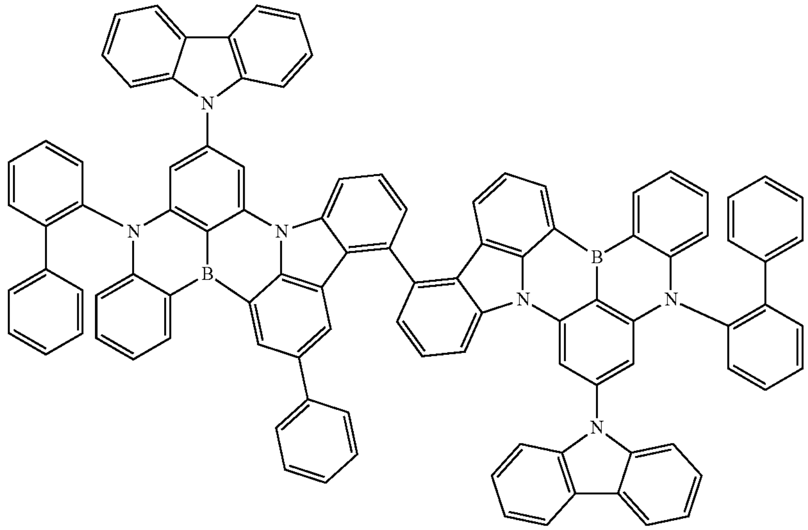
55
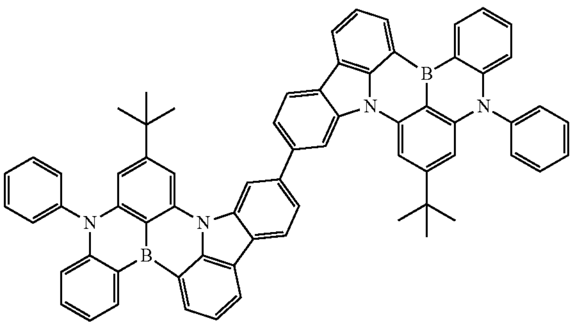
56
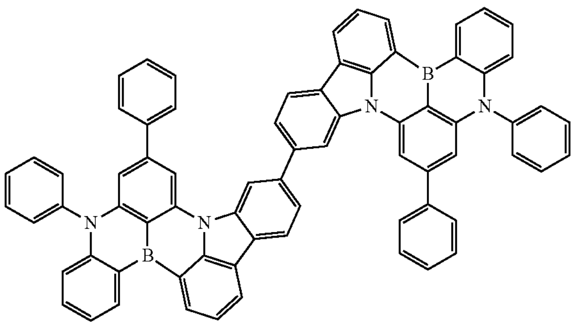

-continued
57
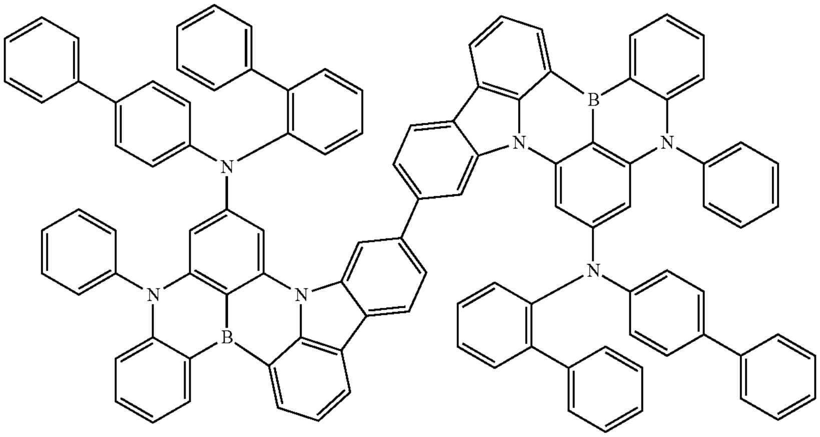
58
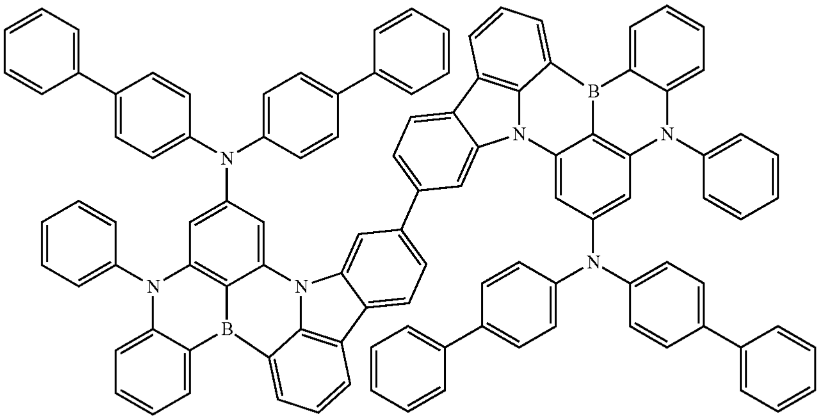
59
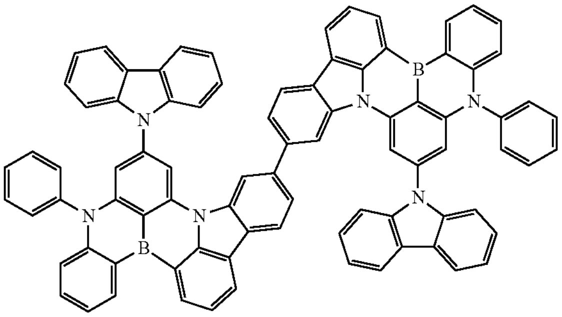
60
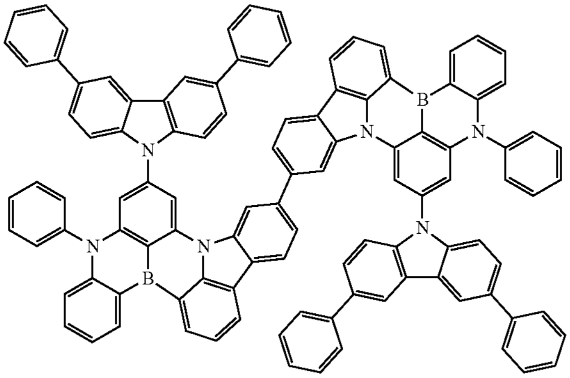

-continued
61
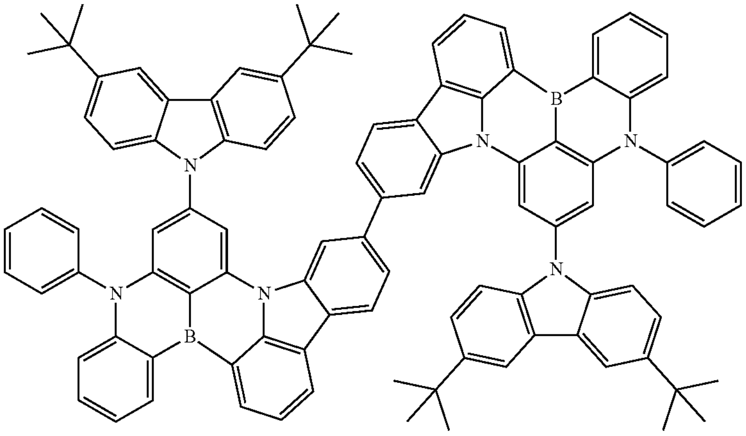
62
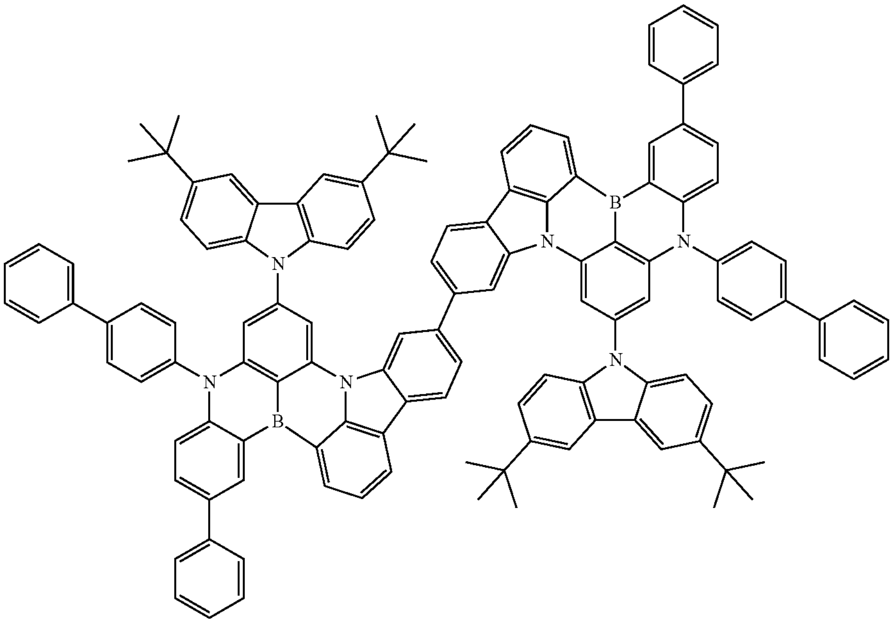
63
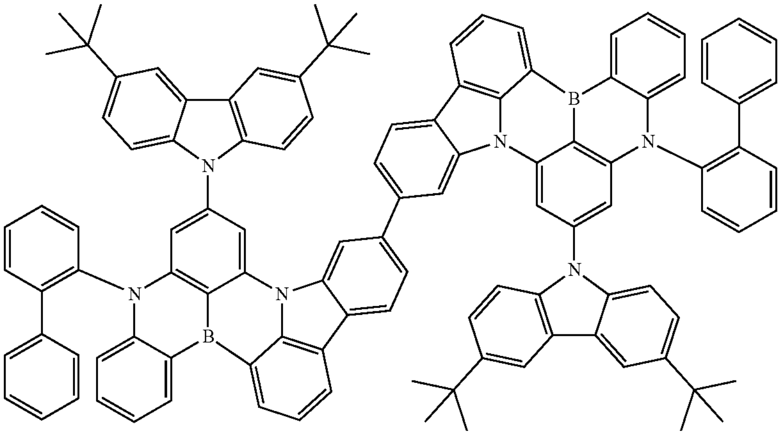

-continued
64
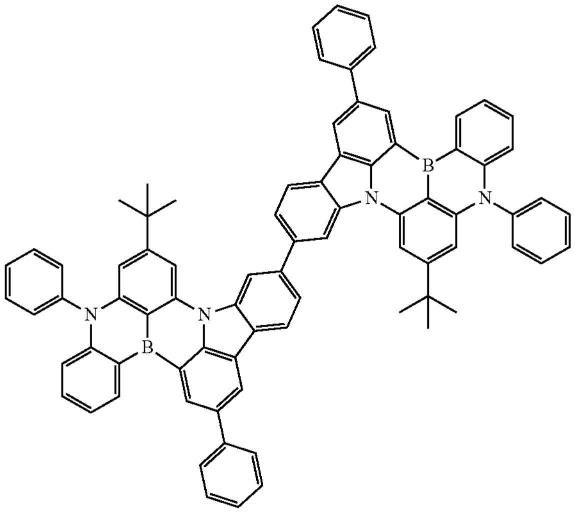
65
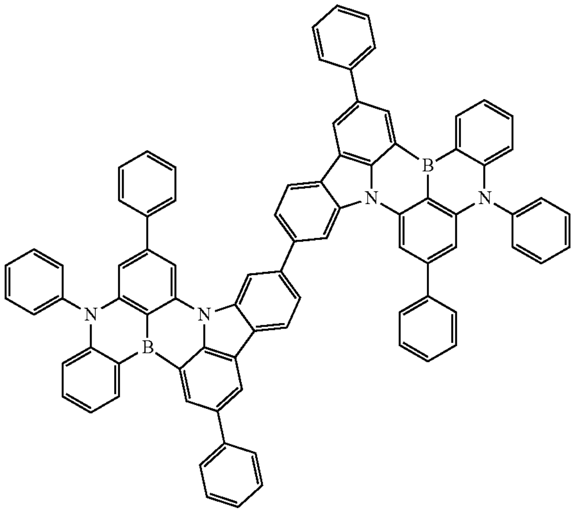
66
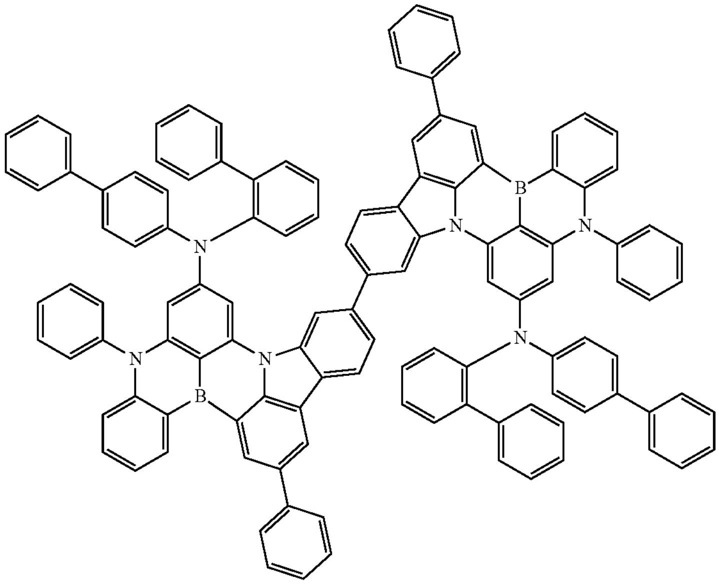

-continued
67
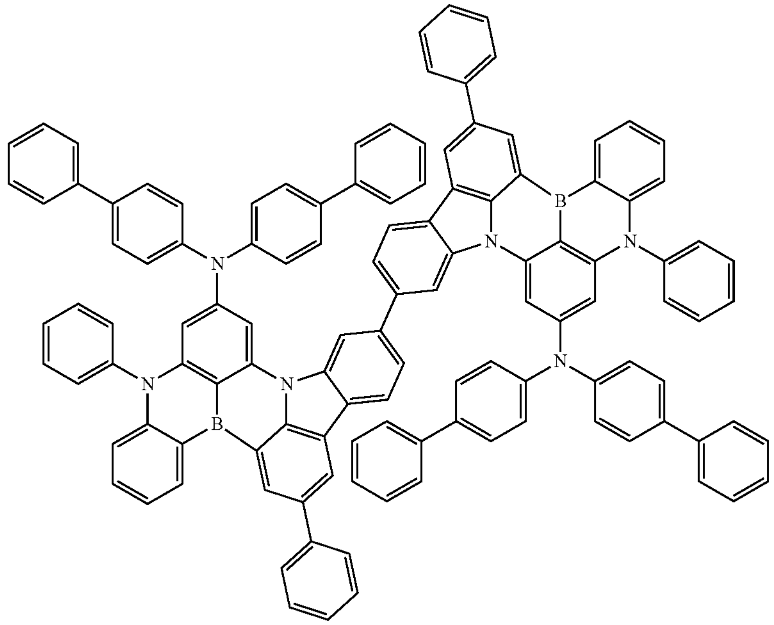
38
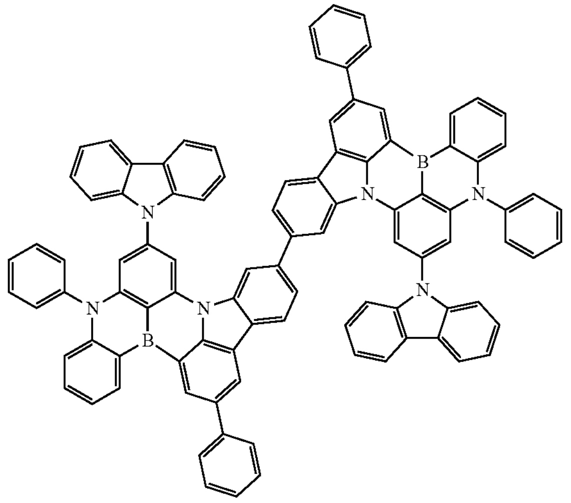
69
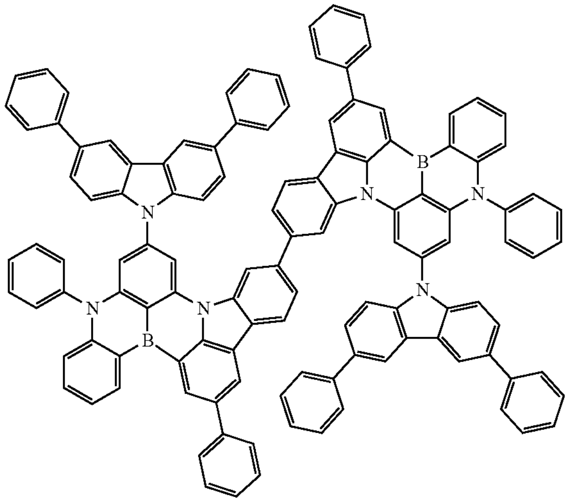

-continued
70
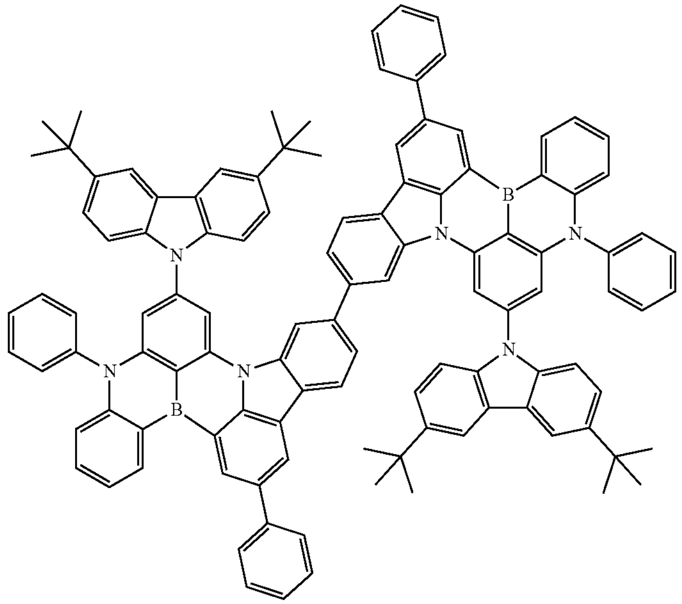
71
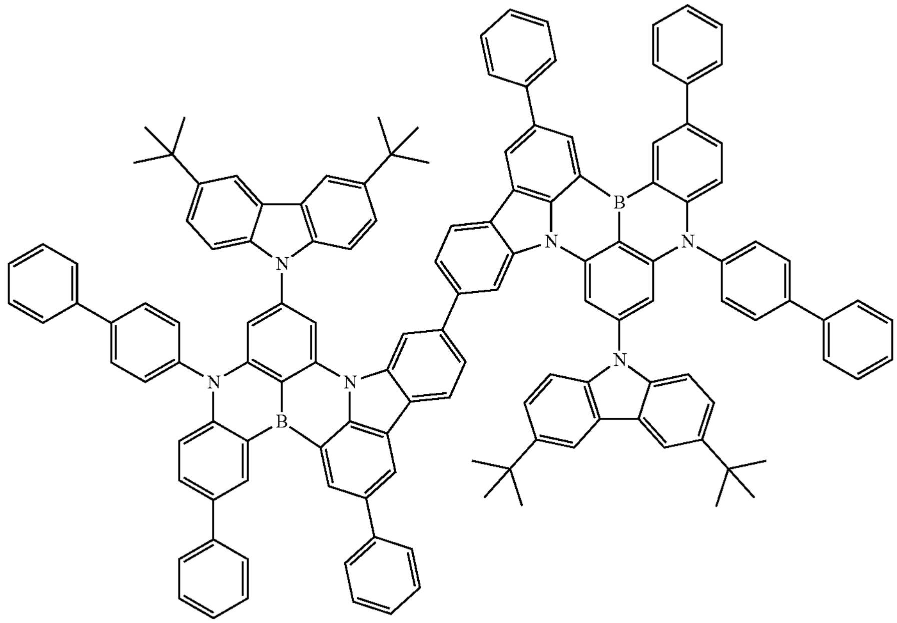

-continued
72
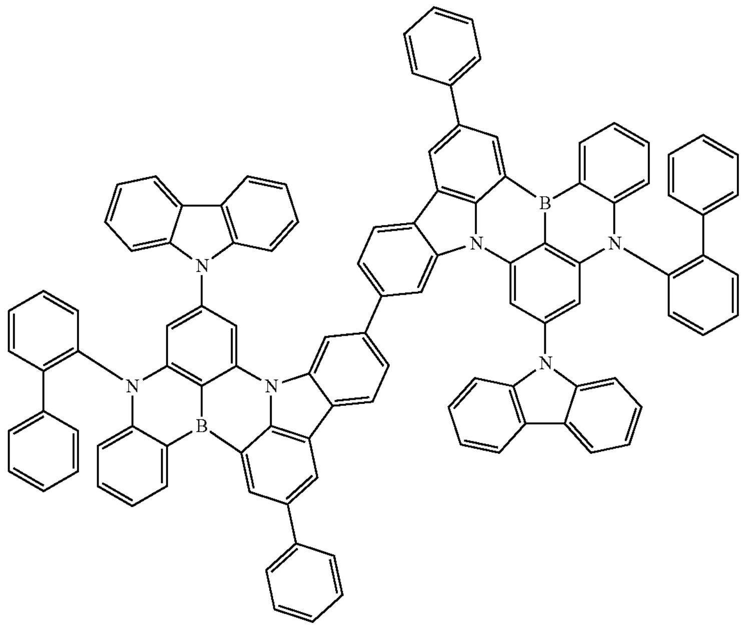
73
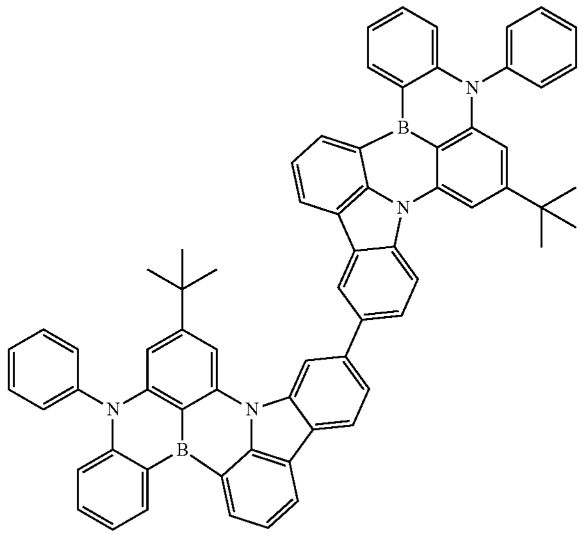
74
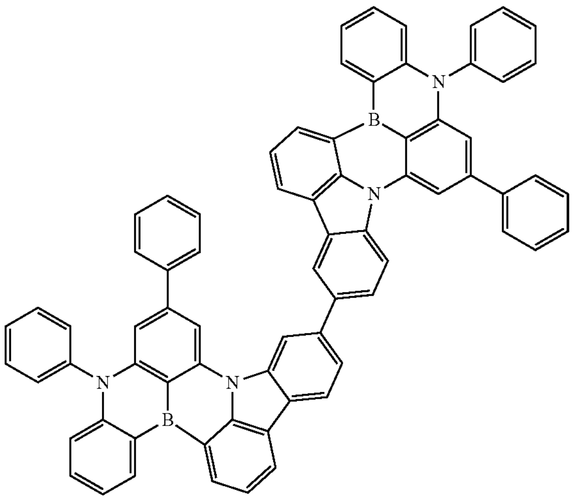

-continued
75
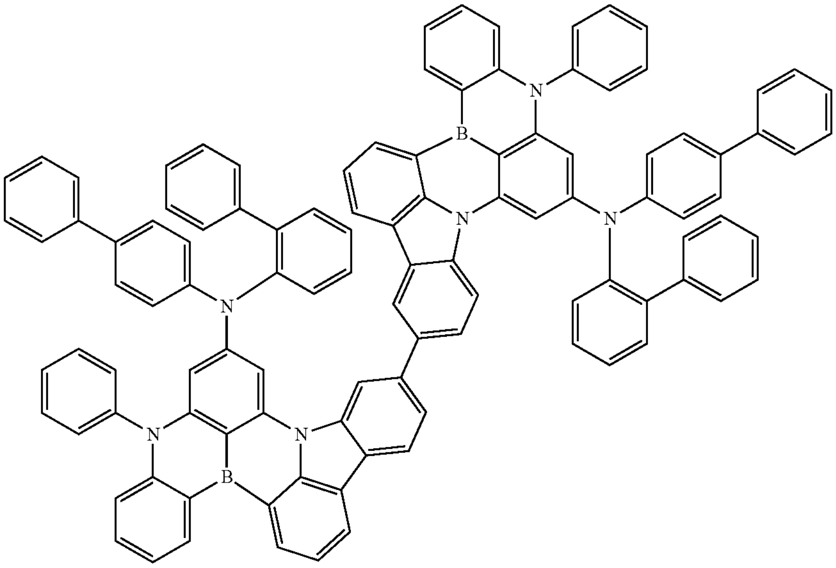
76
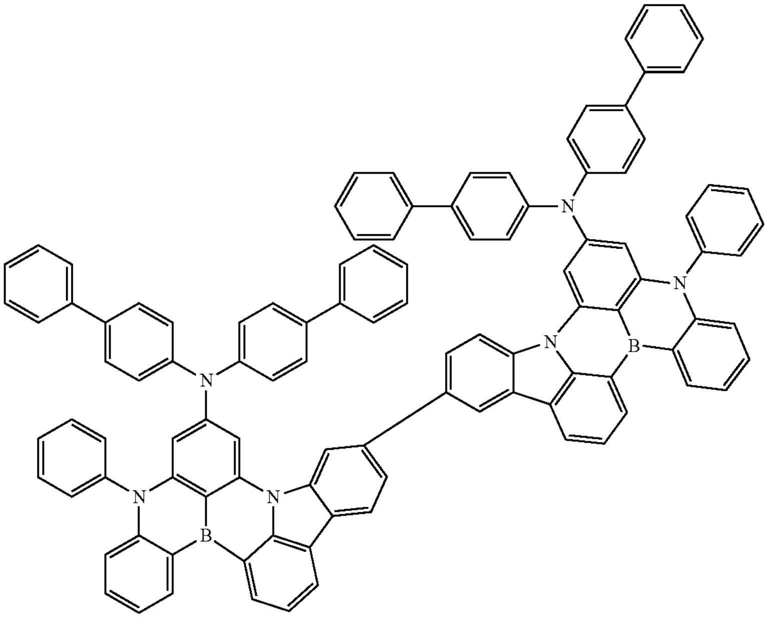

-continued
77
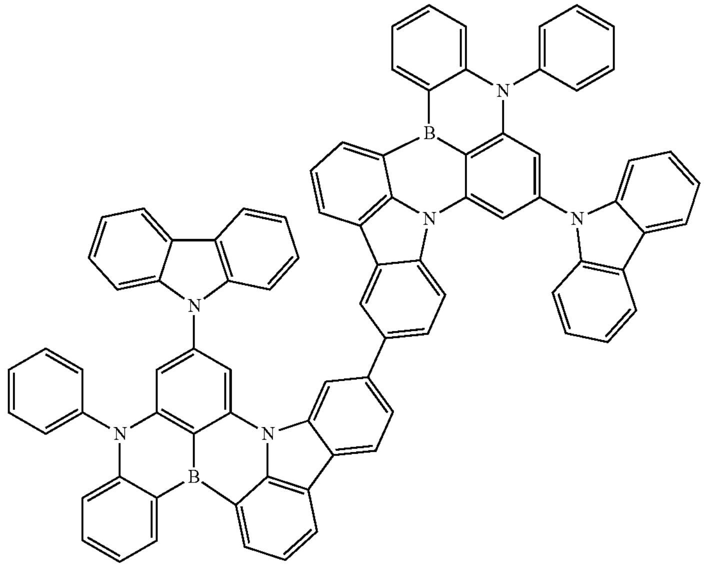
78
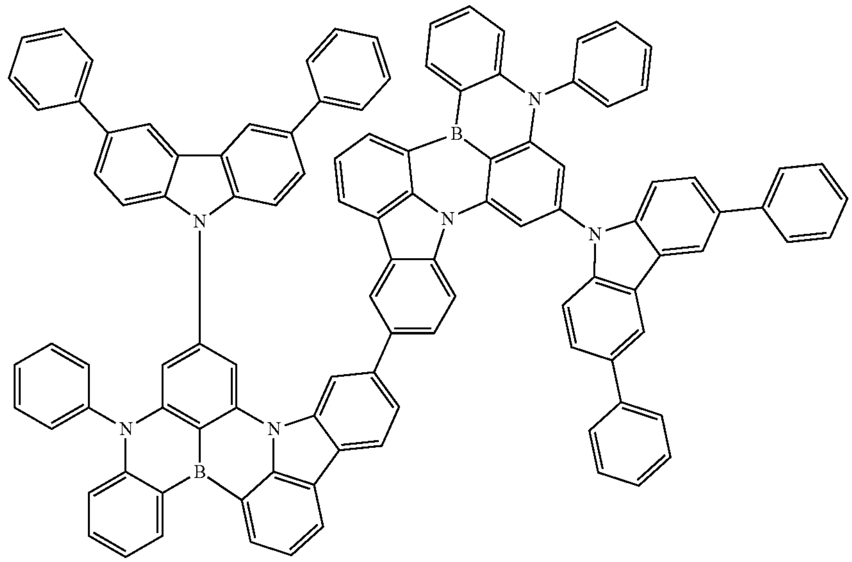

-continued
79
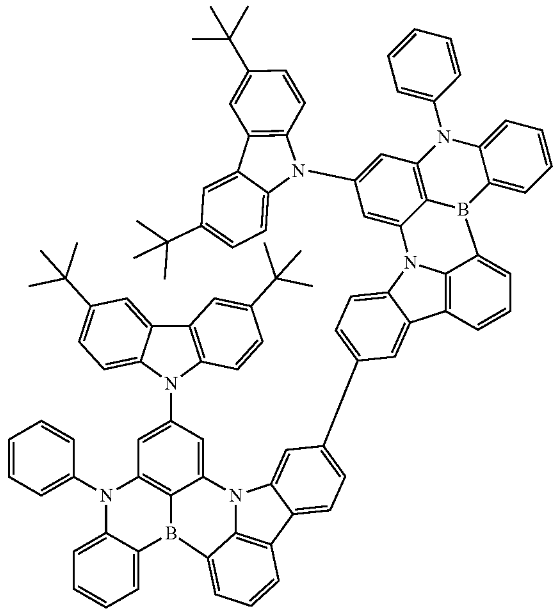
80
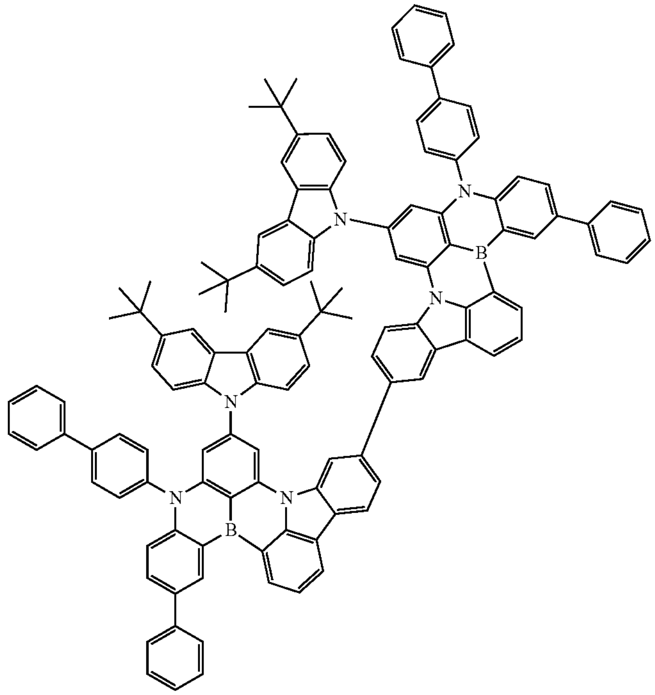

-continued
81
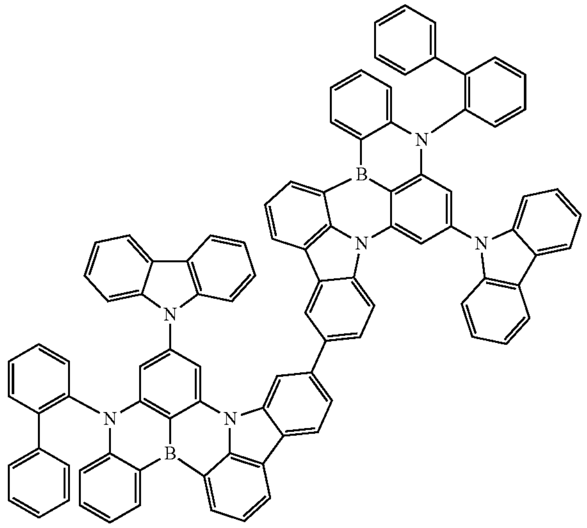
82
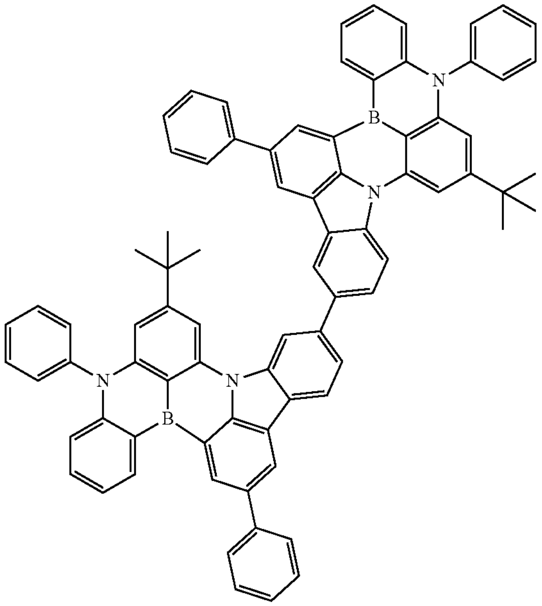
83
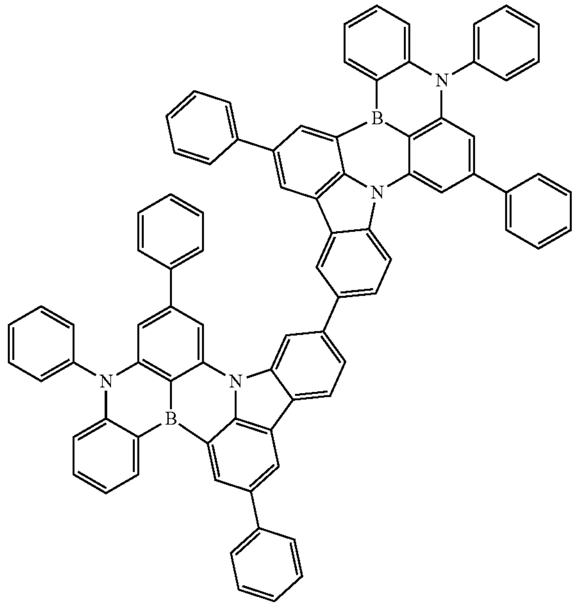

-continued
84
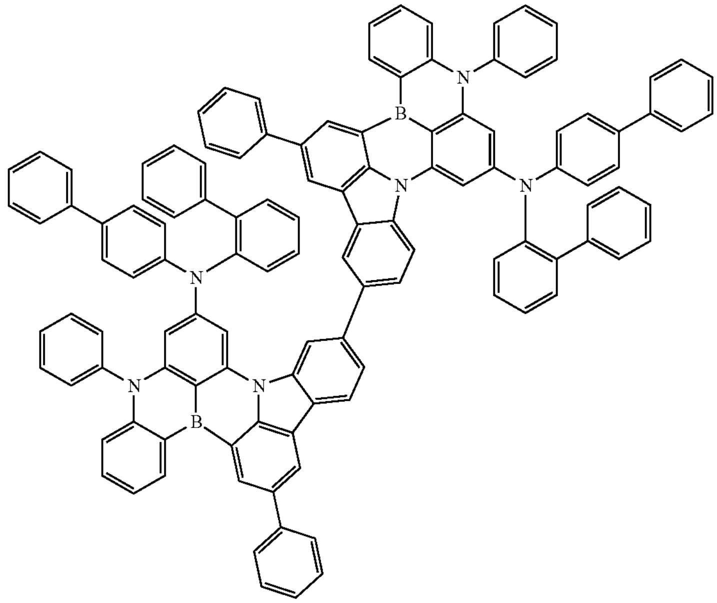
85
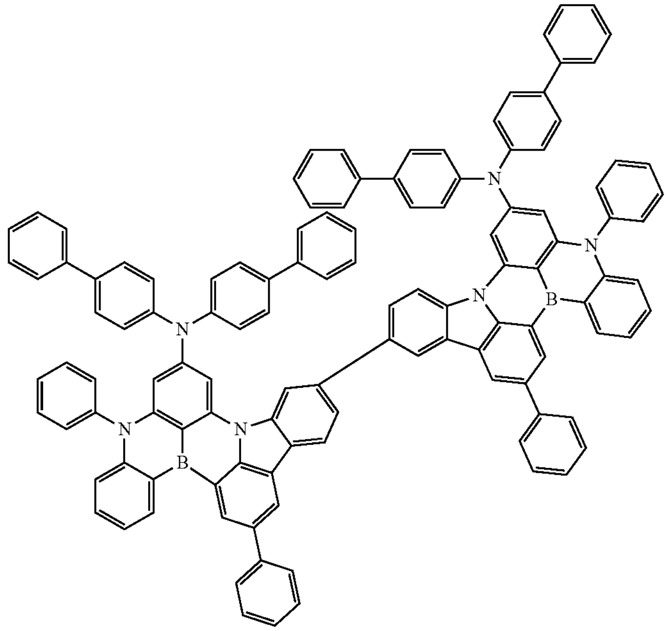

-continued
86
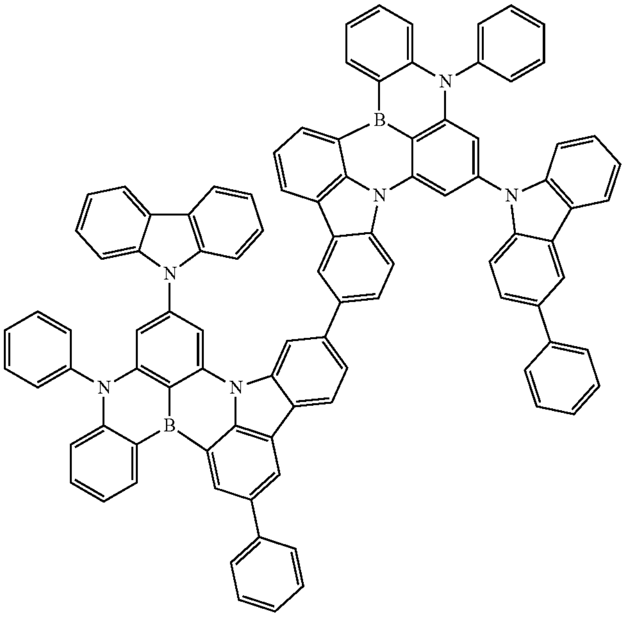
87
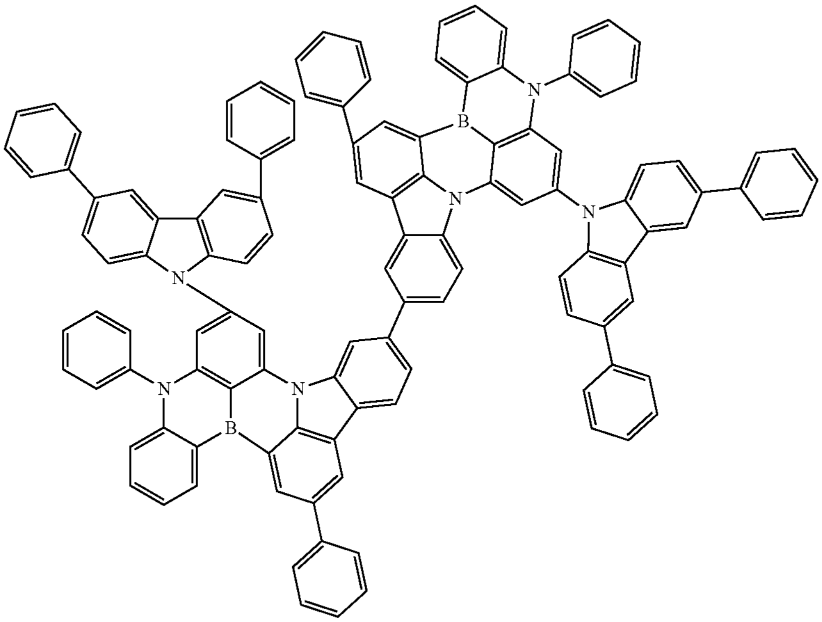

-continued
88
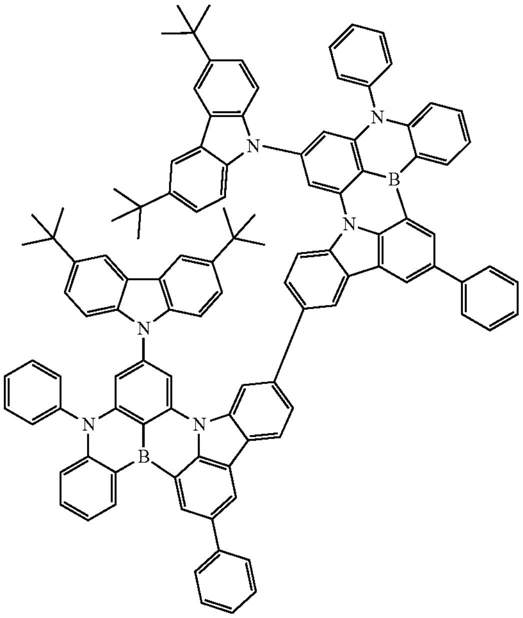
89
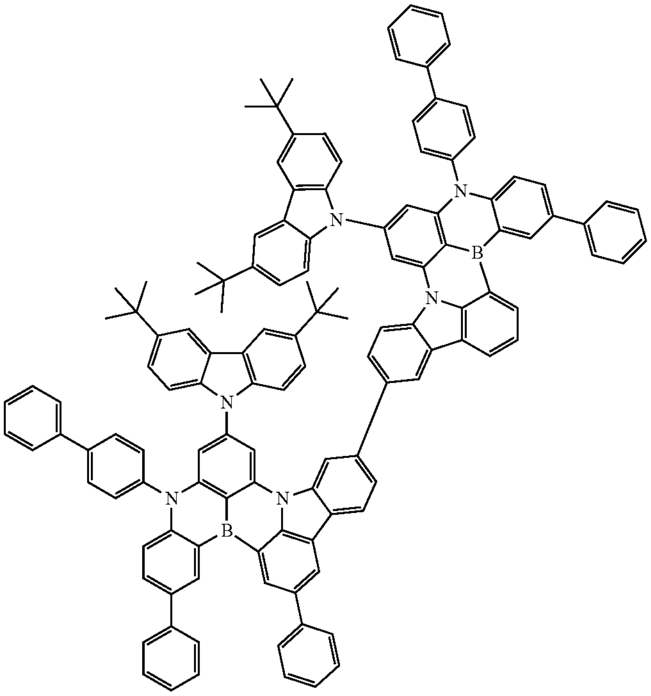

-continued
90
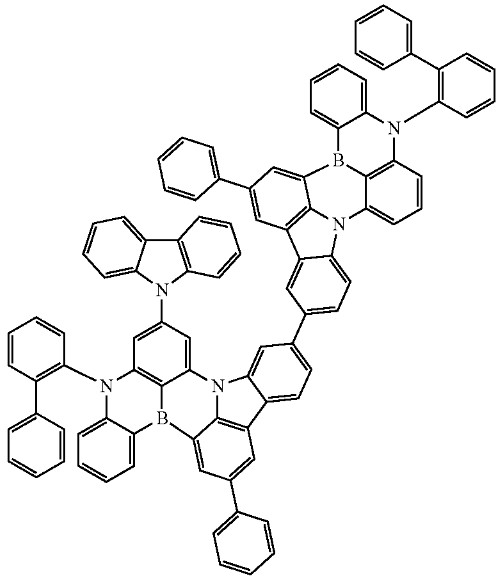
91
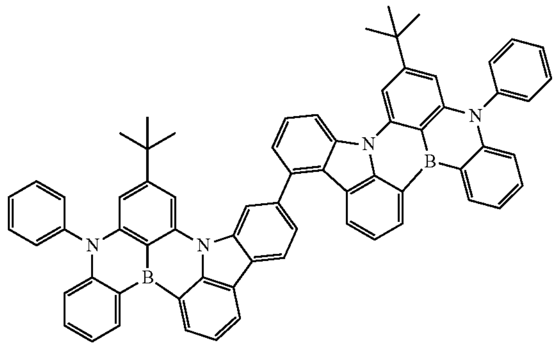
92
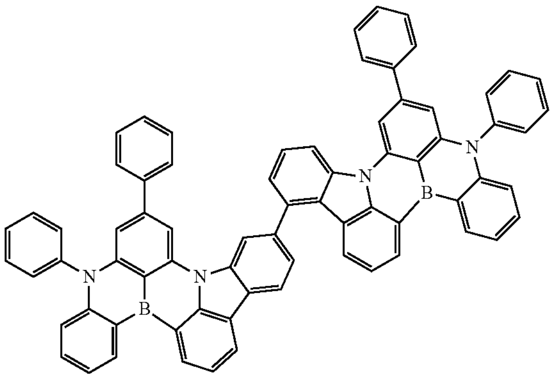
93
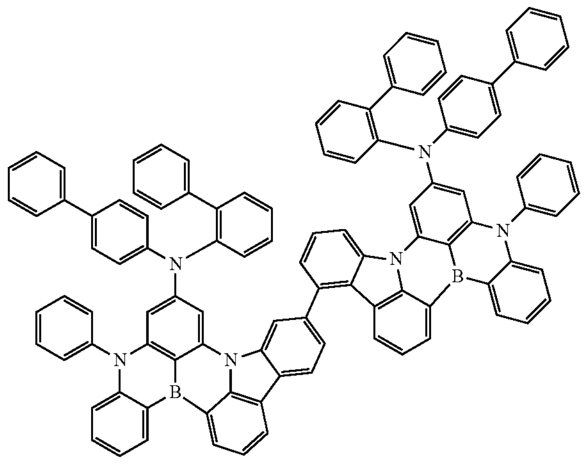
94
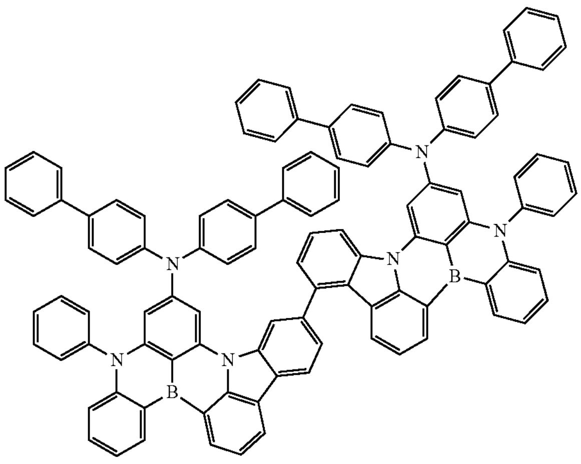

-continued
95
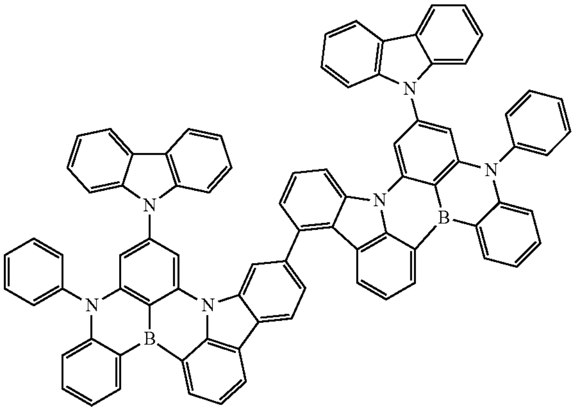
96
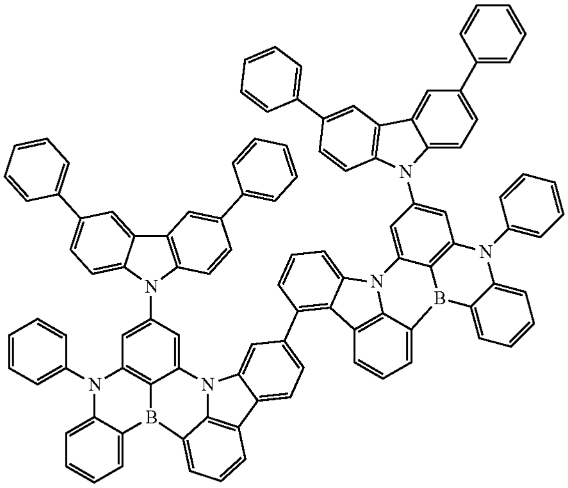
97
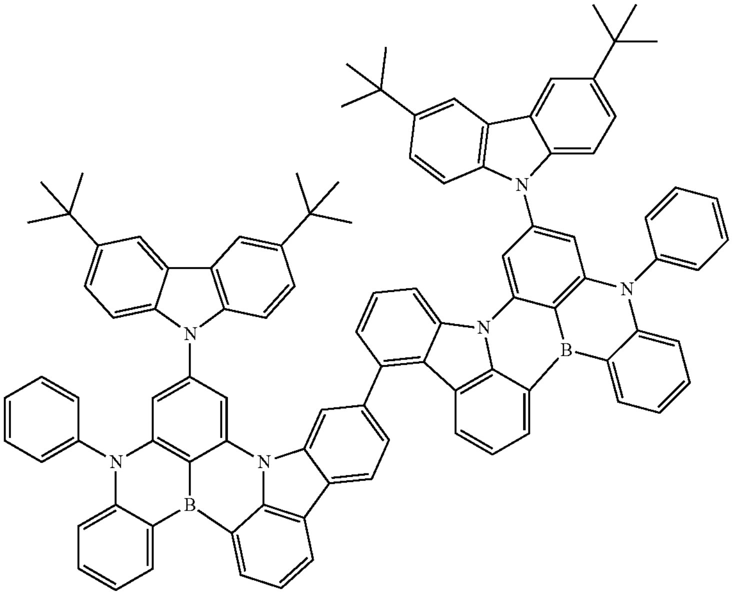

-continued
98
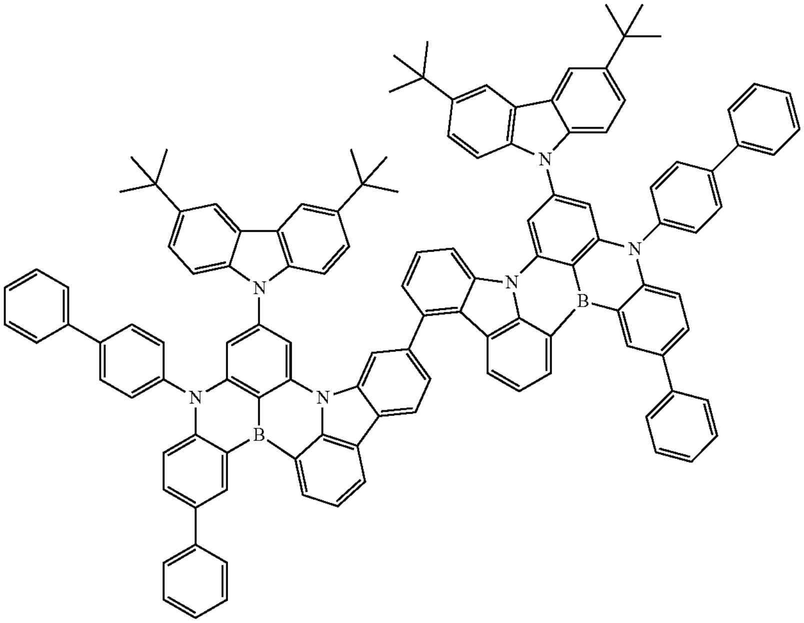
99
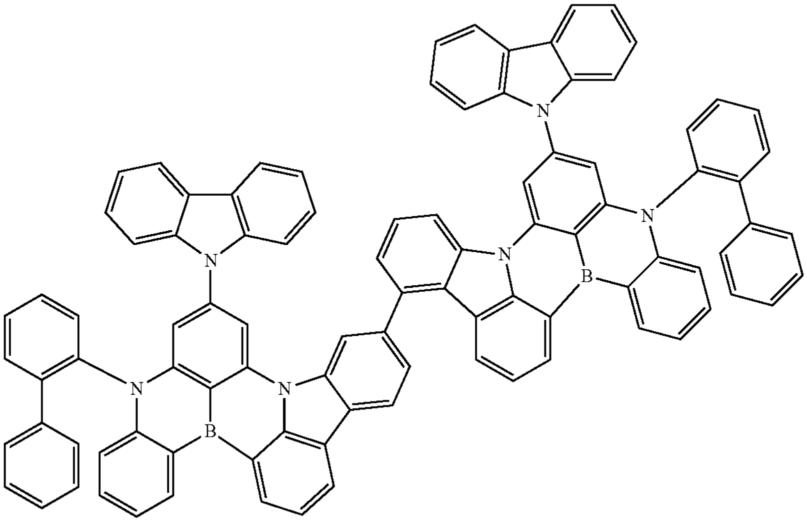
100
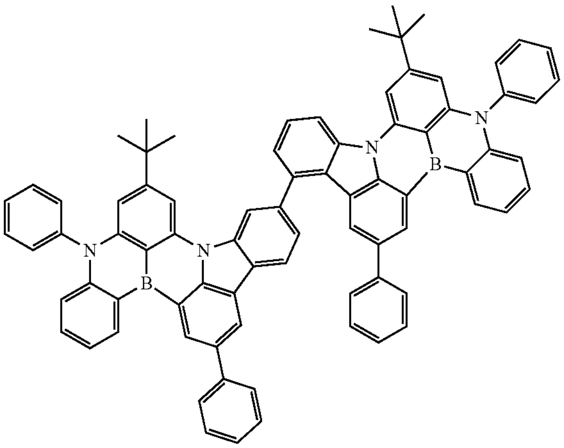
101
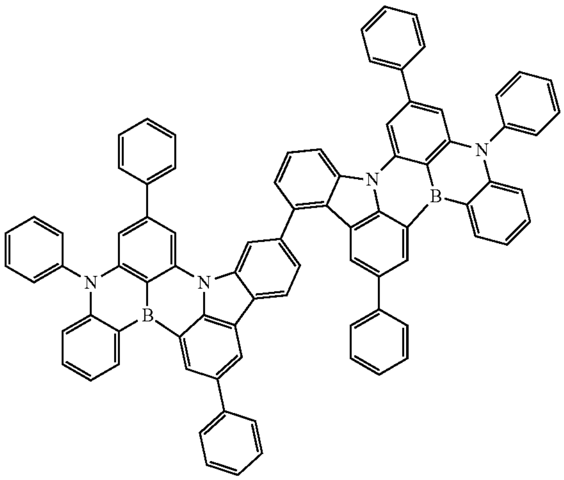

-continued
102
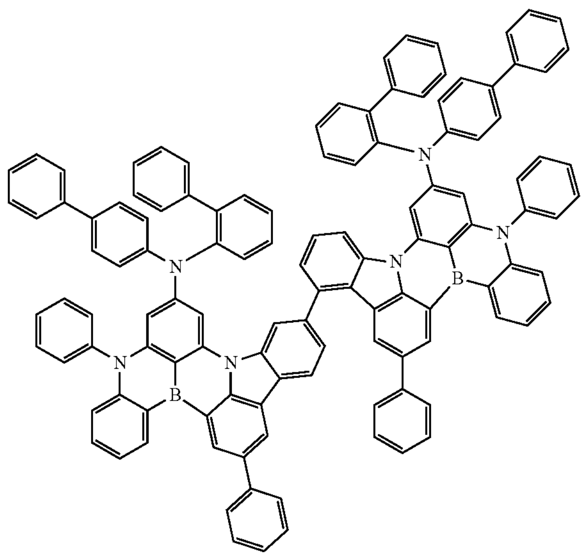
103
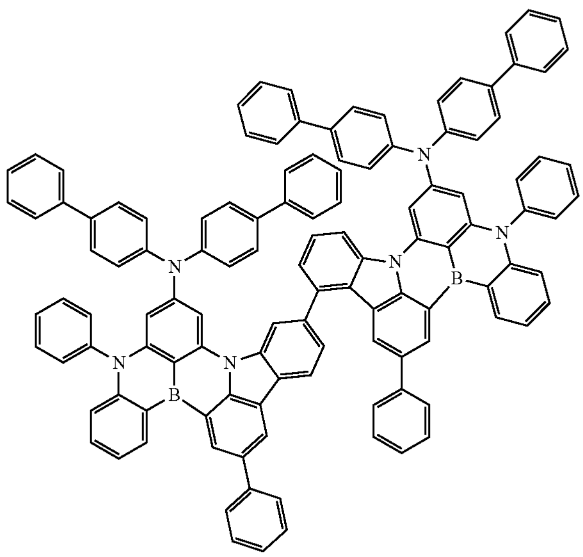
104
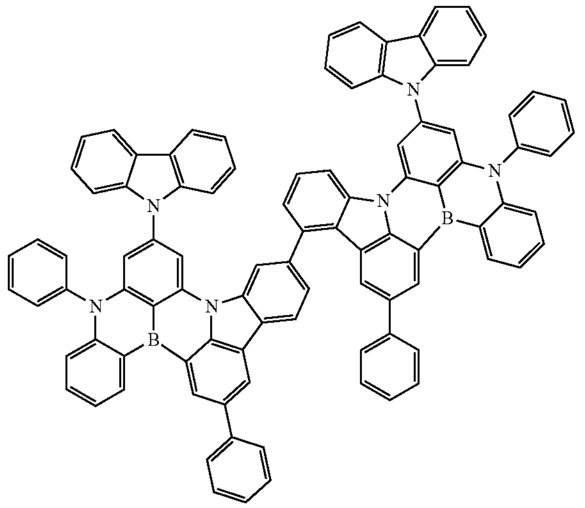
105
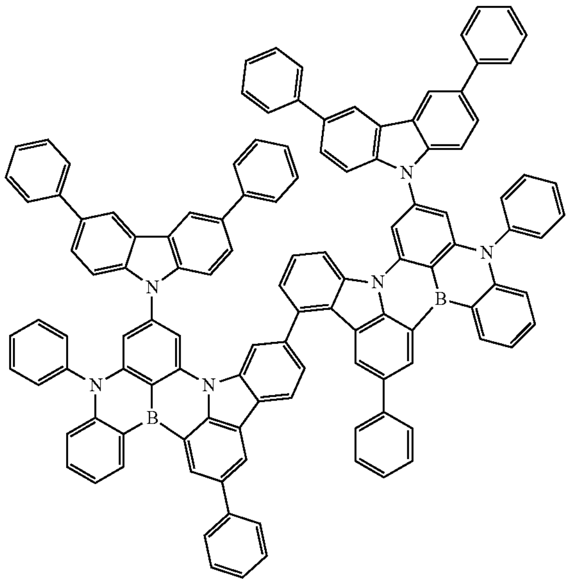

-continued
106
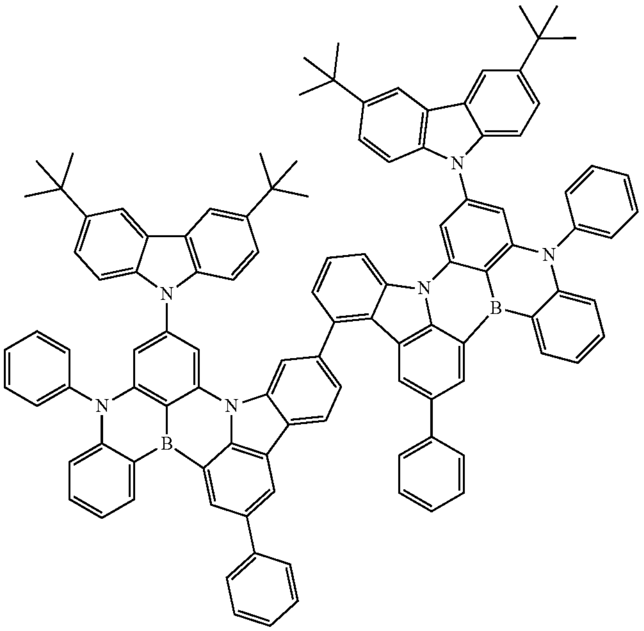
107
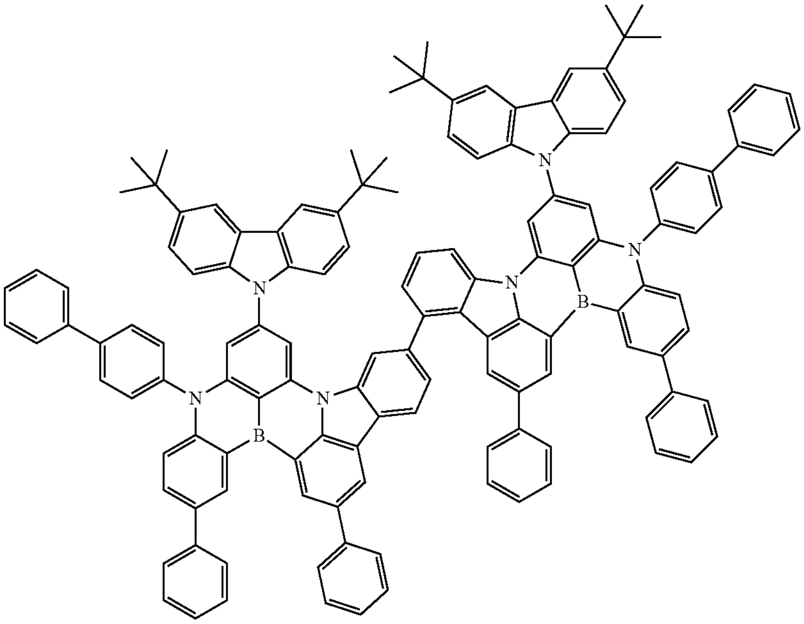

-continued
108
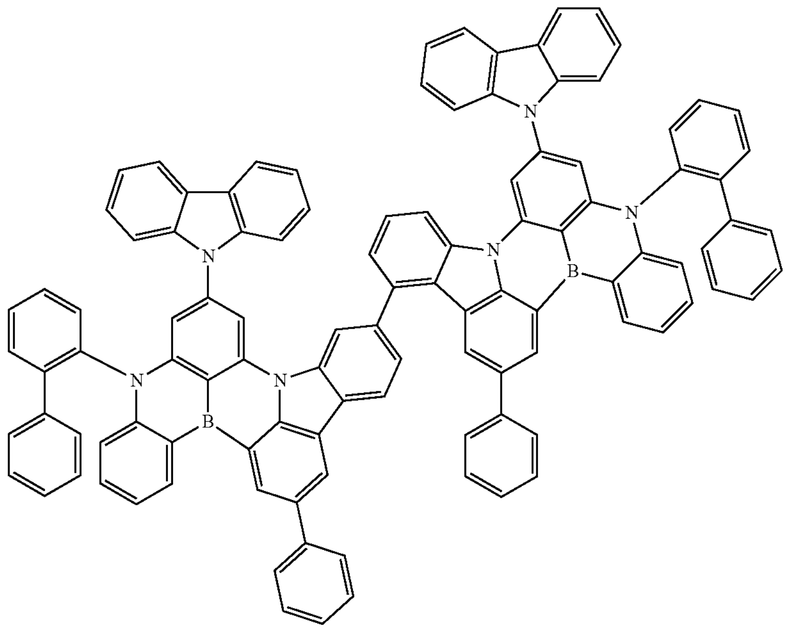
109
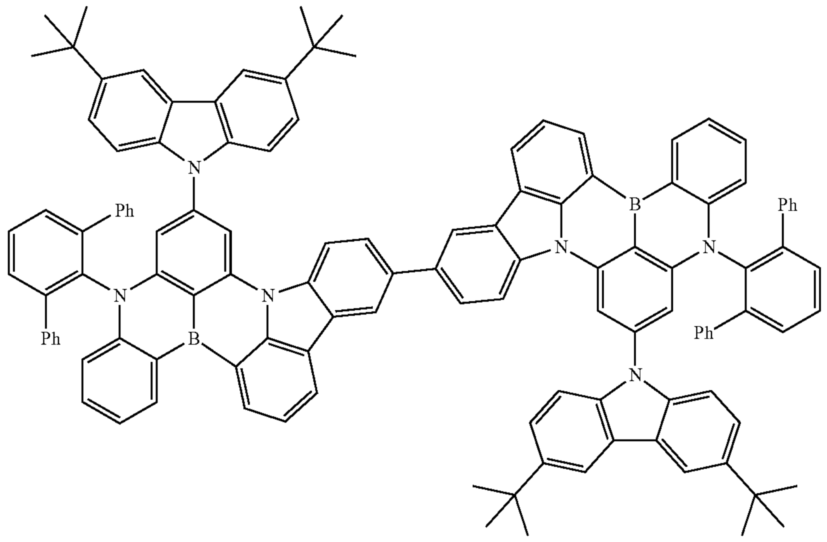

-continued
110
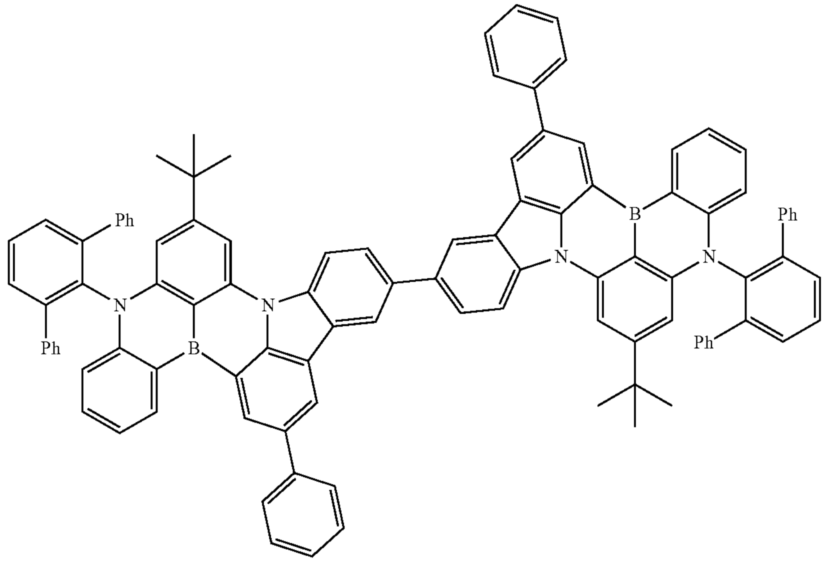
111
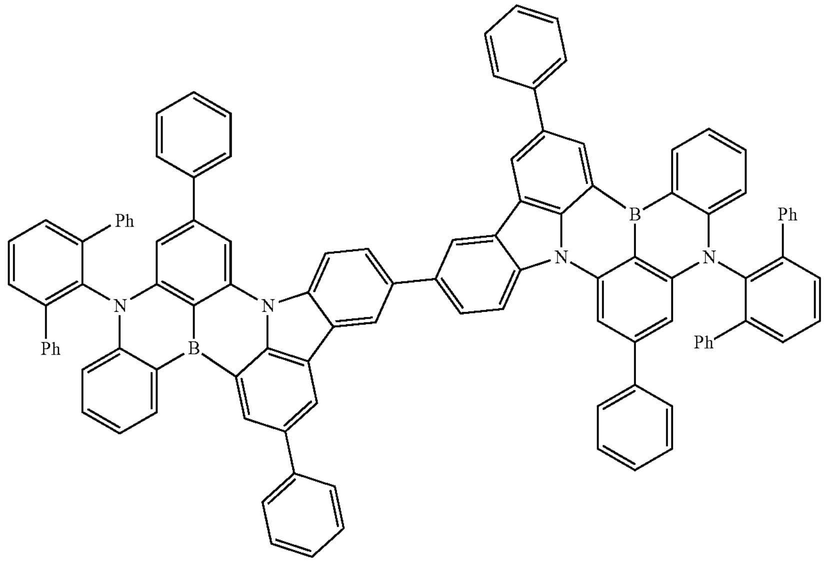
112
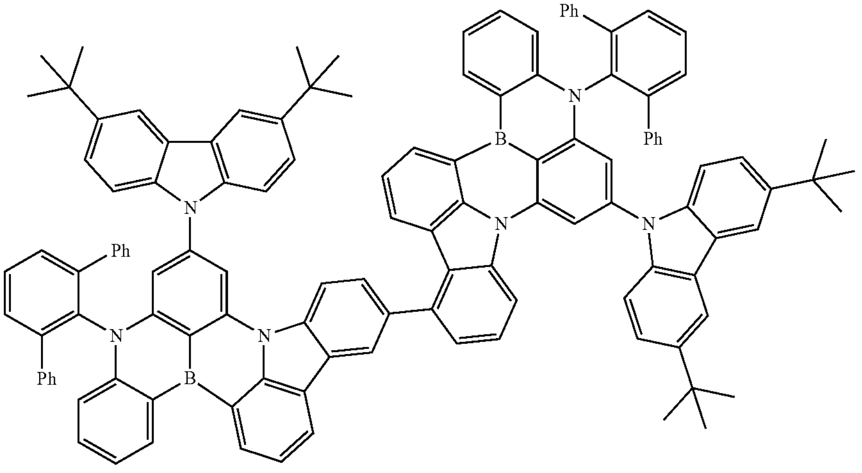

-continued
113
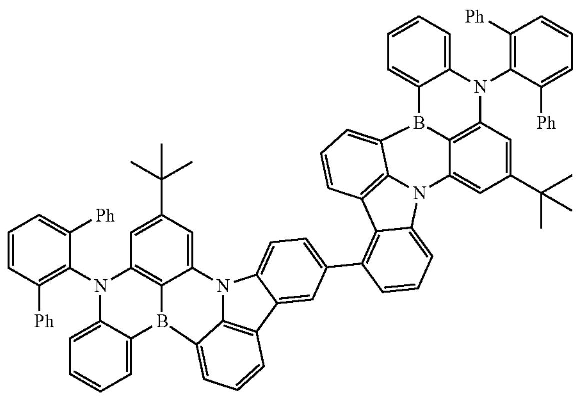
114
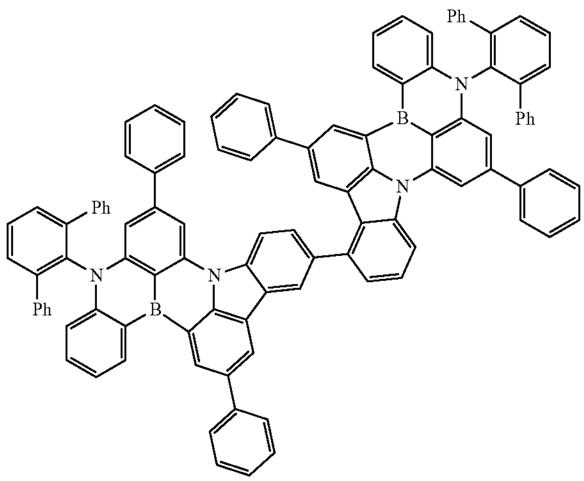
115
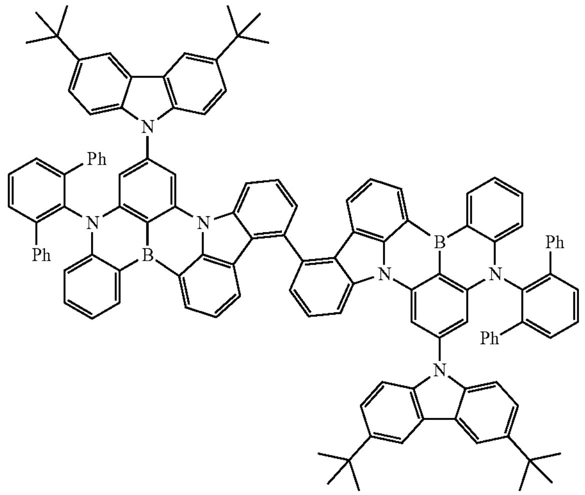
116
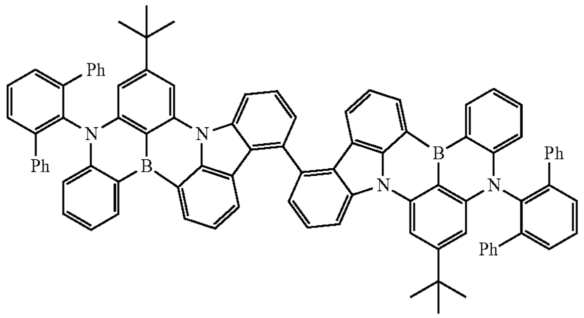
117
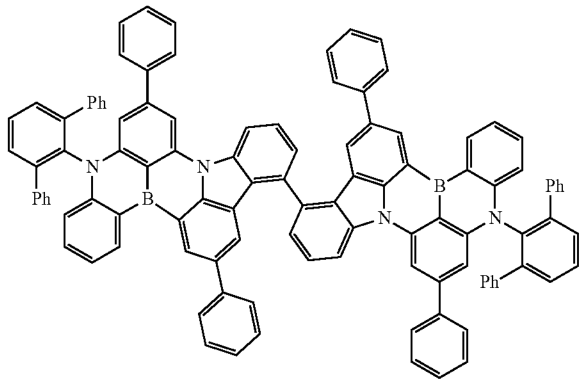
118
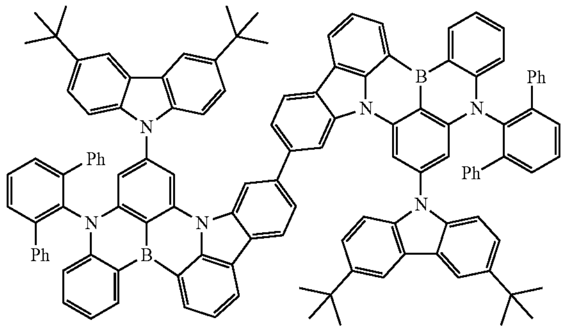

-continued
119
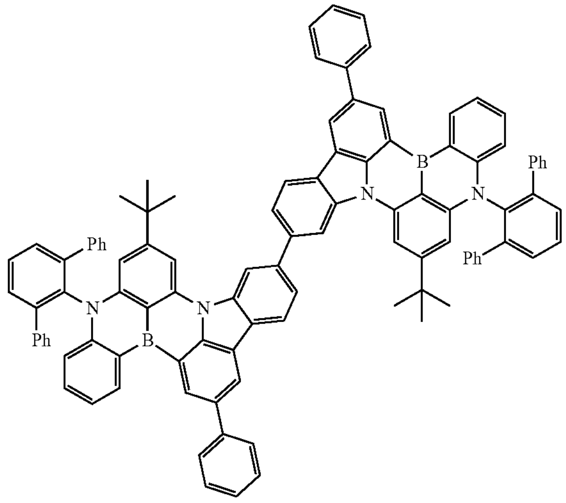
120
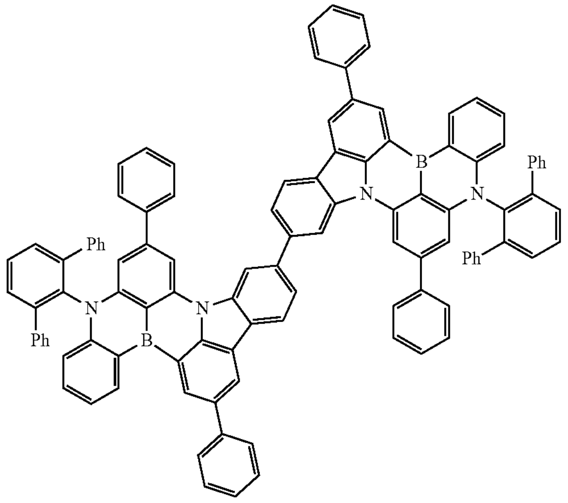
121
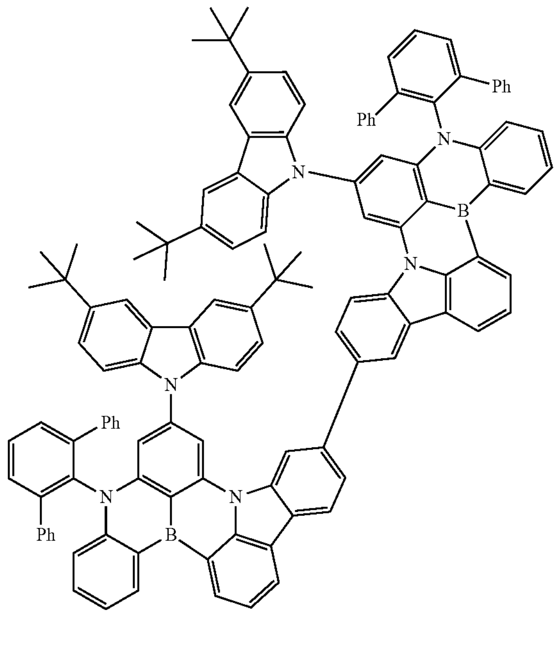
122
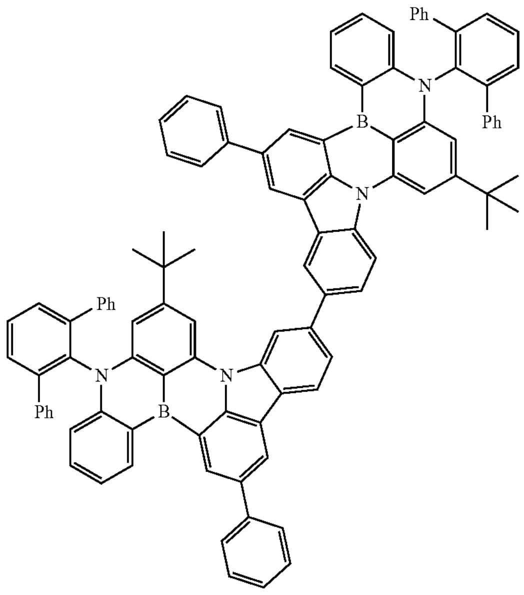

-continued
123
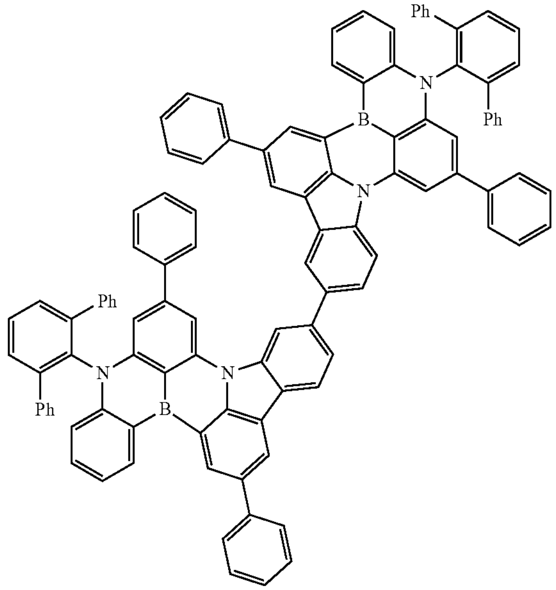
124
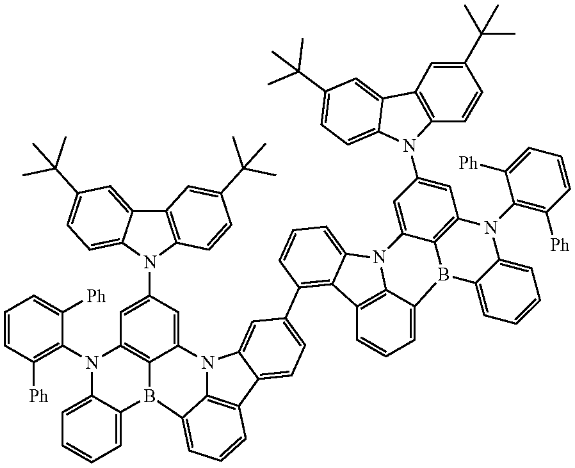
125
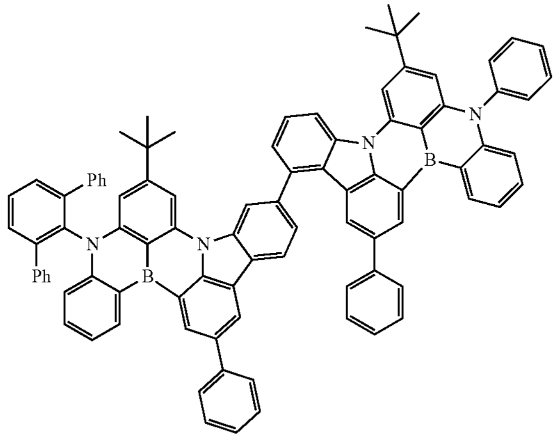
126
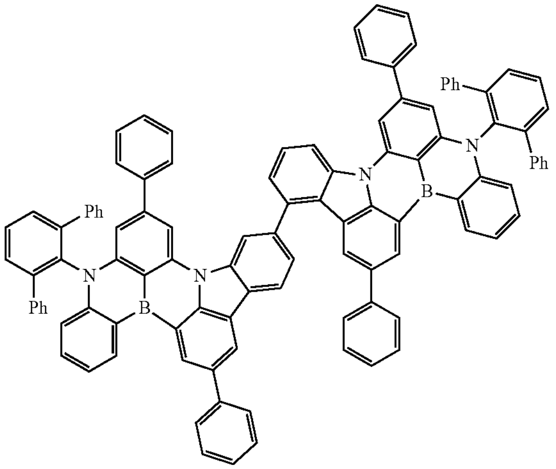
127
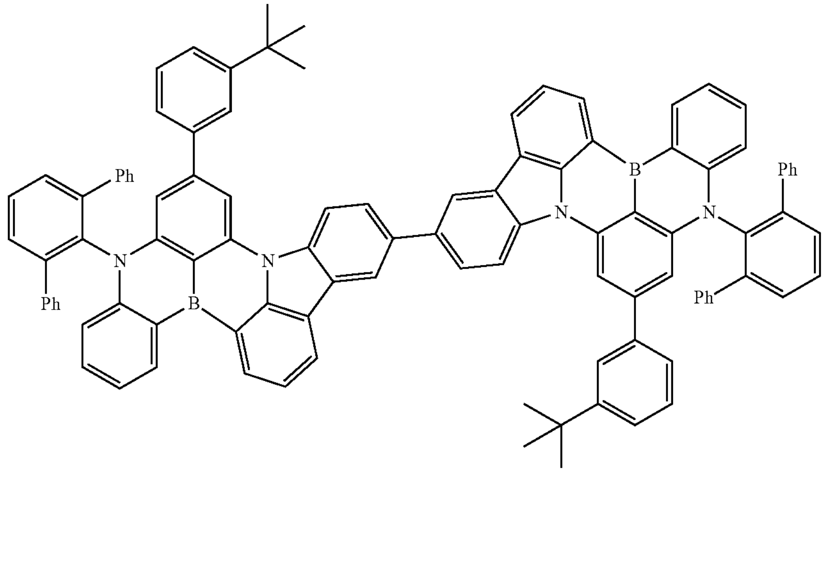

-continued
128
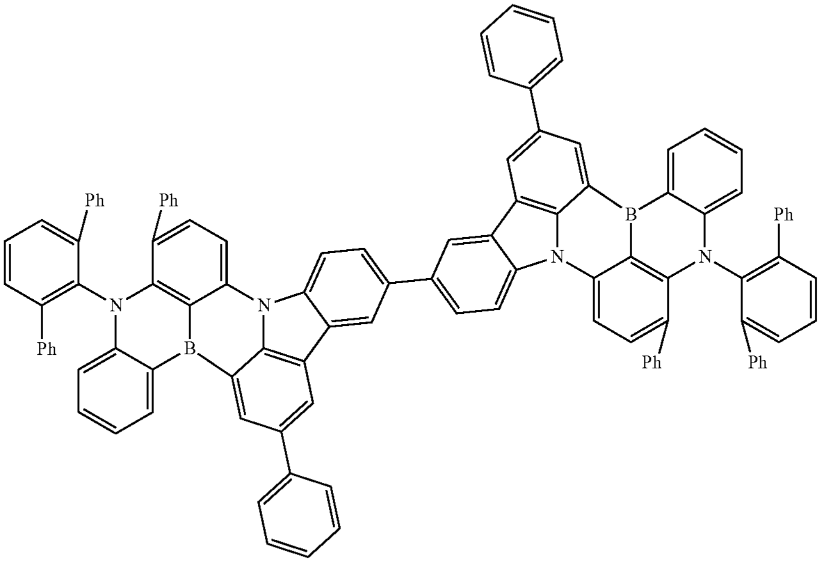
129
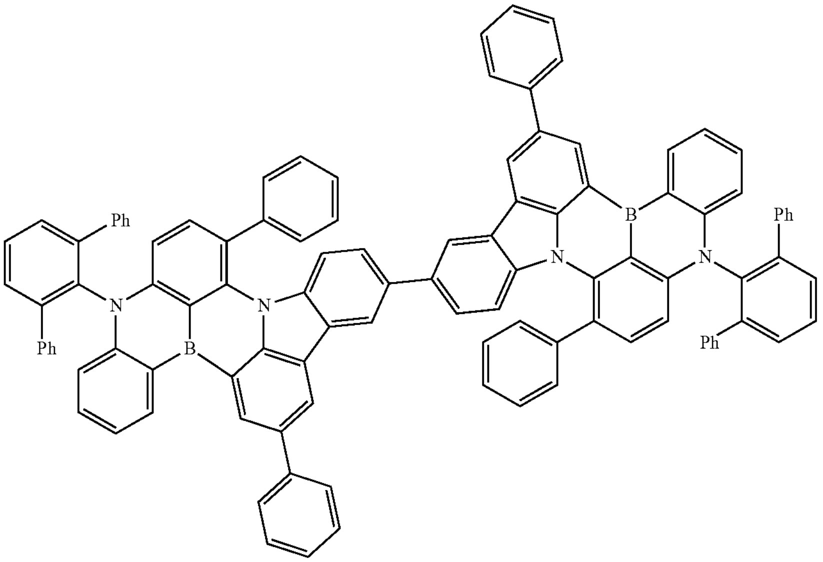
130
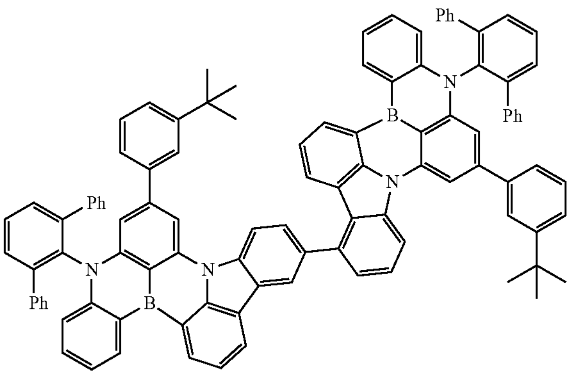
131
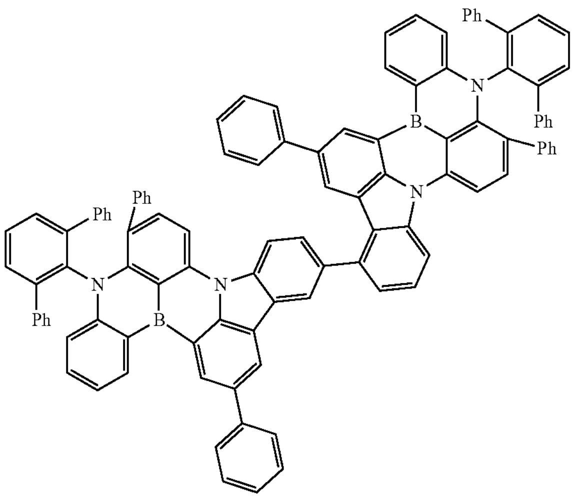

-continued
132
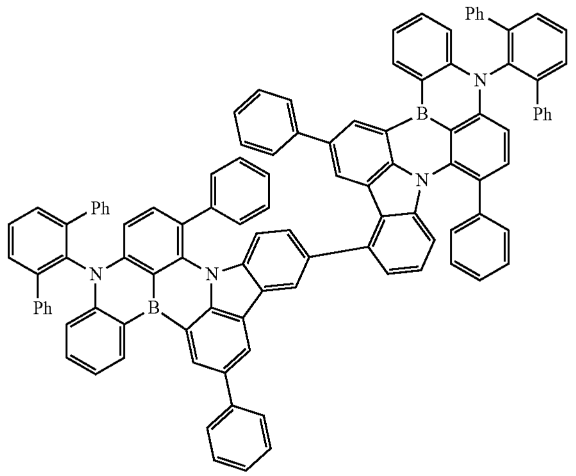
133
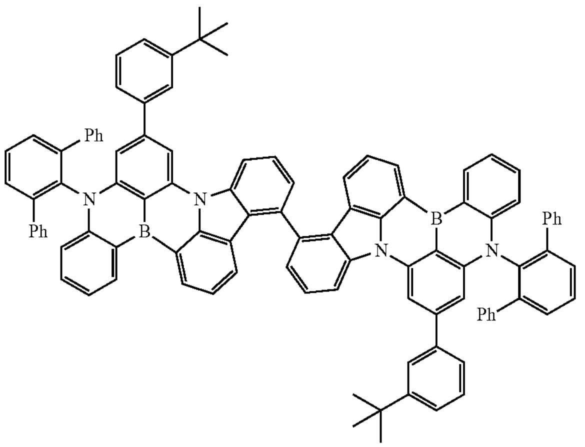
134
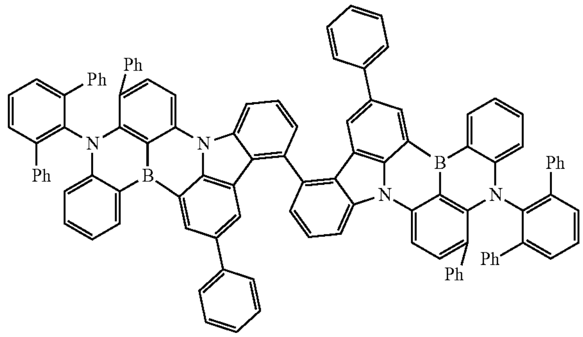
135
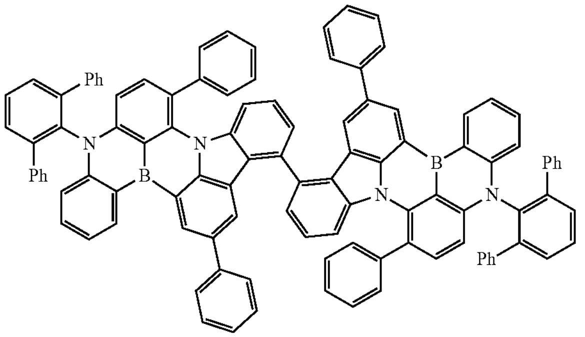
136
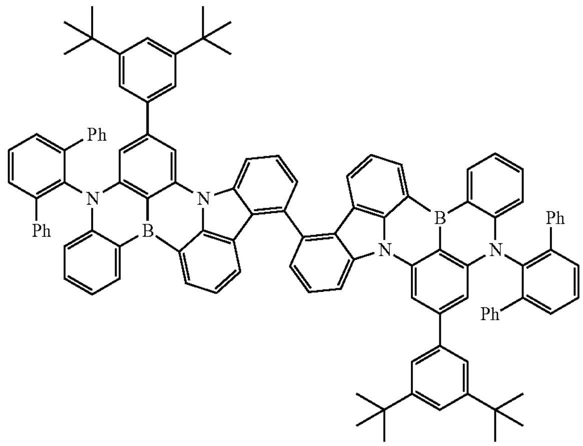
137
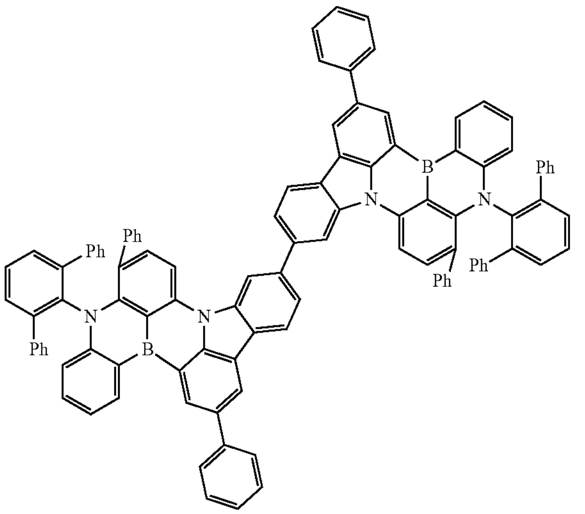

-continued
138
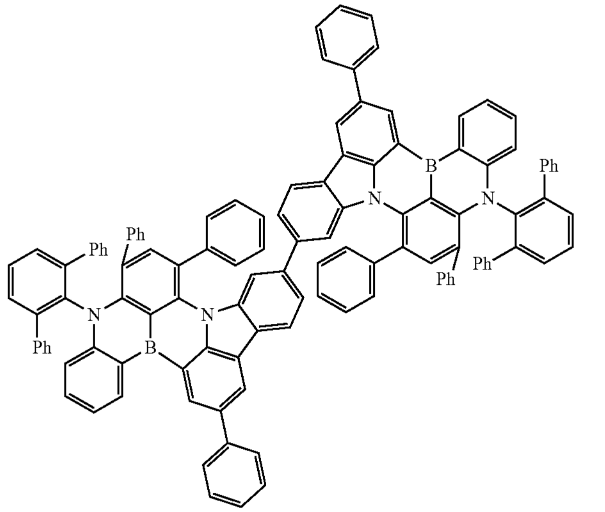
139
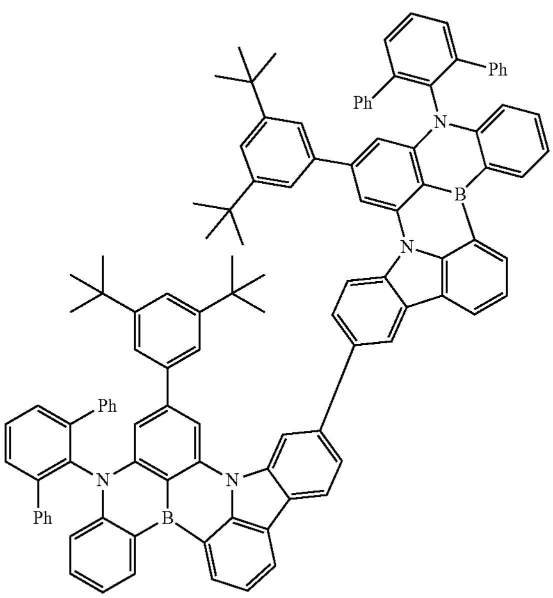
140
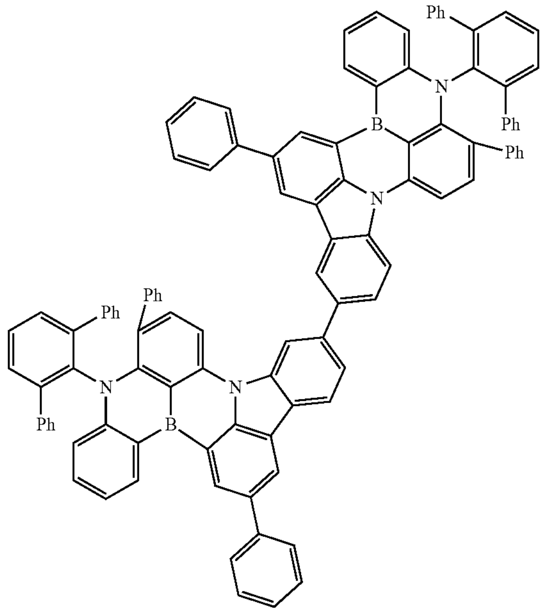
141
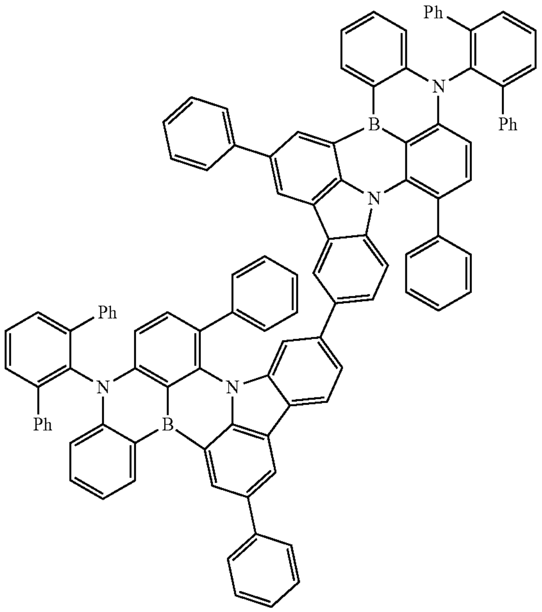

-continued
142
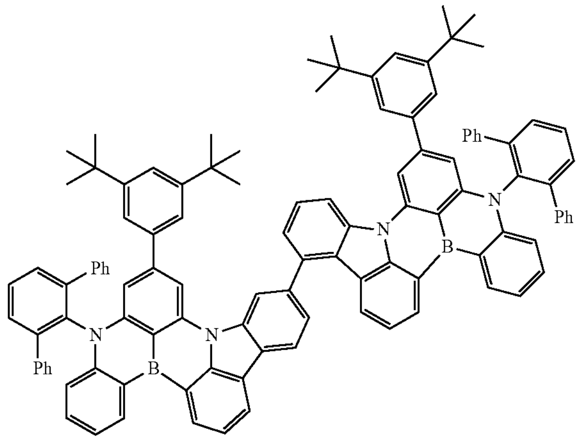
143
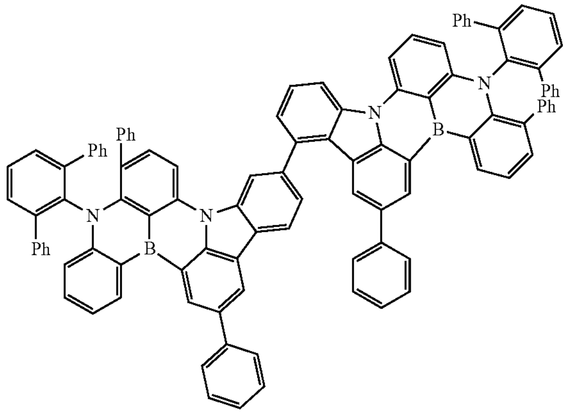
144
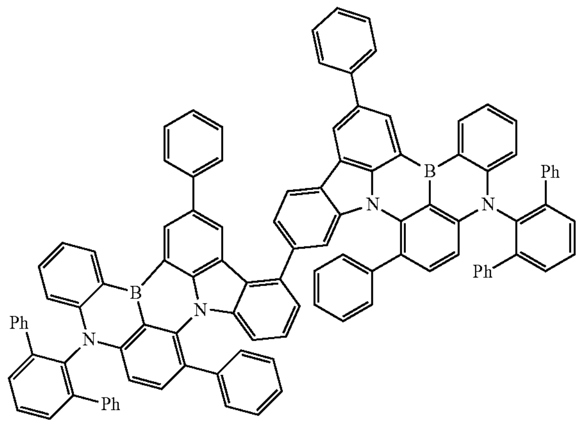
145
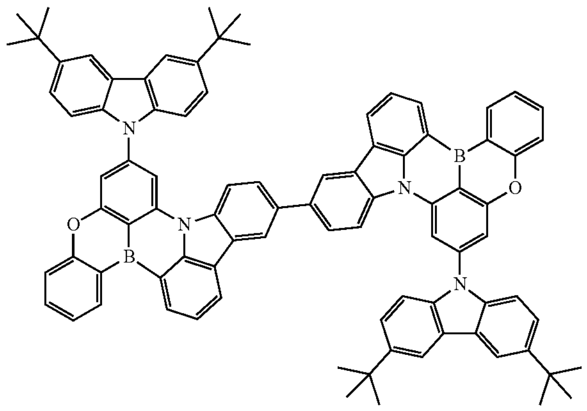
146
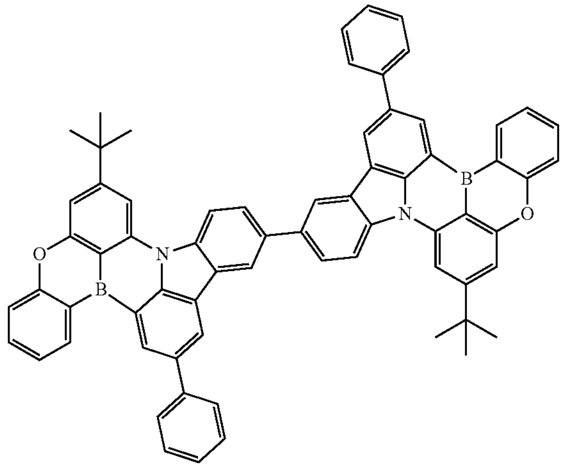
147
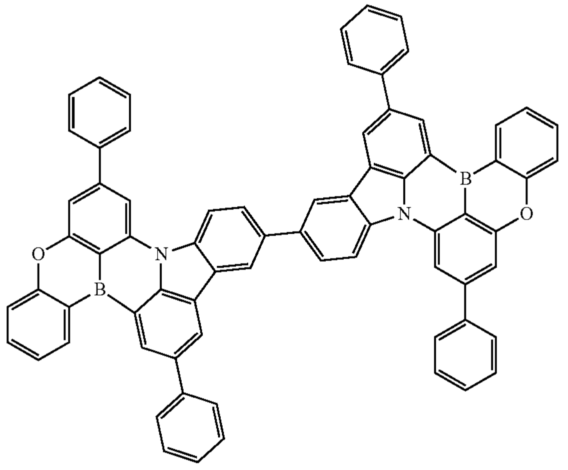

-continued
148
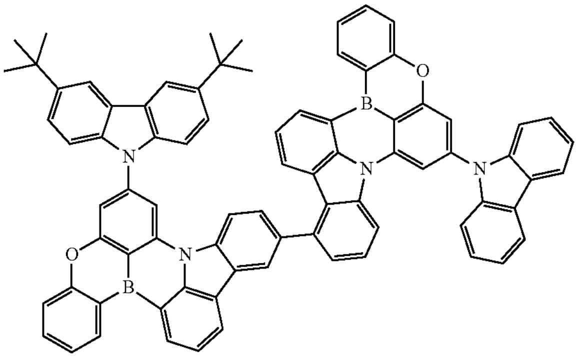
149
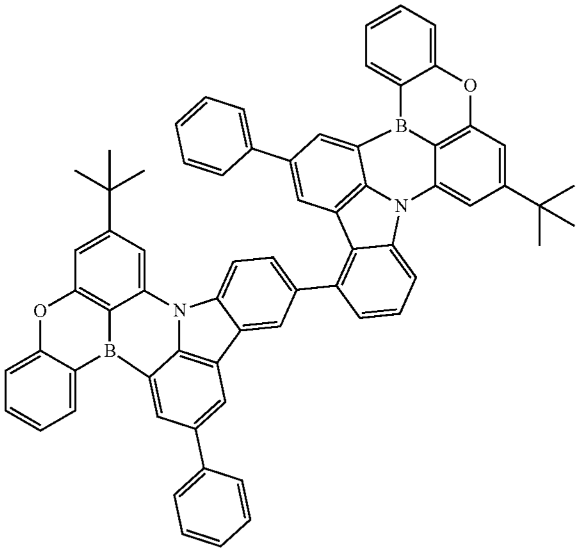
150
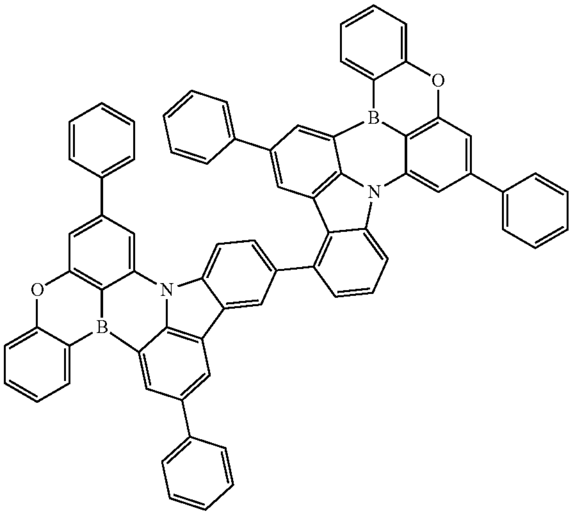
151
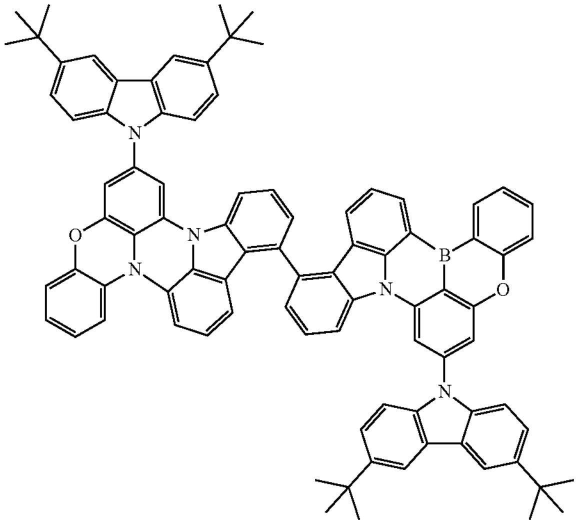
152
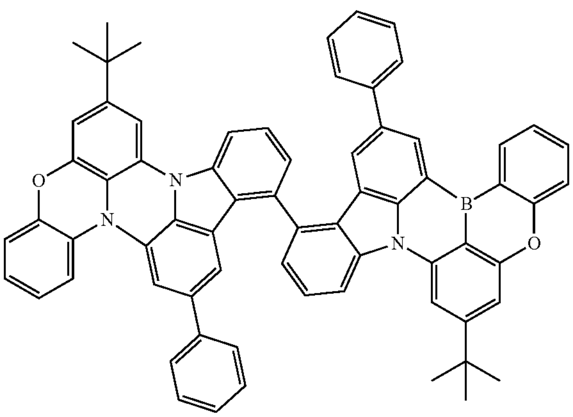
153
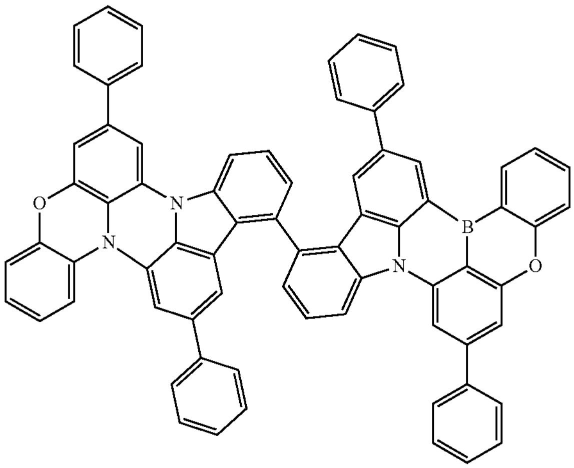

-continued
154
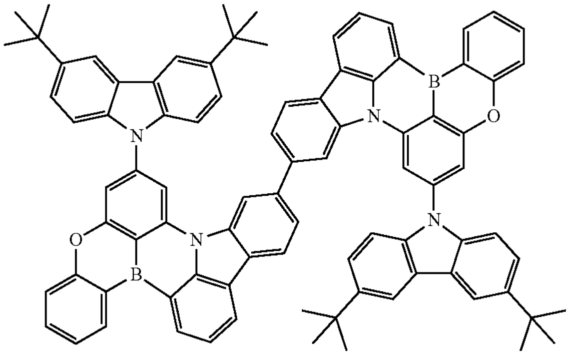
155
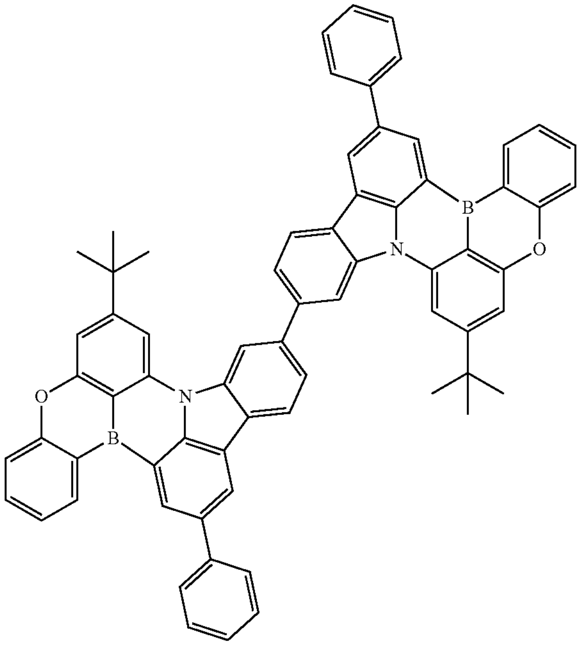
156
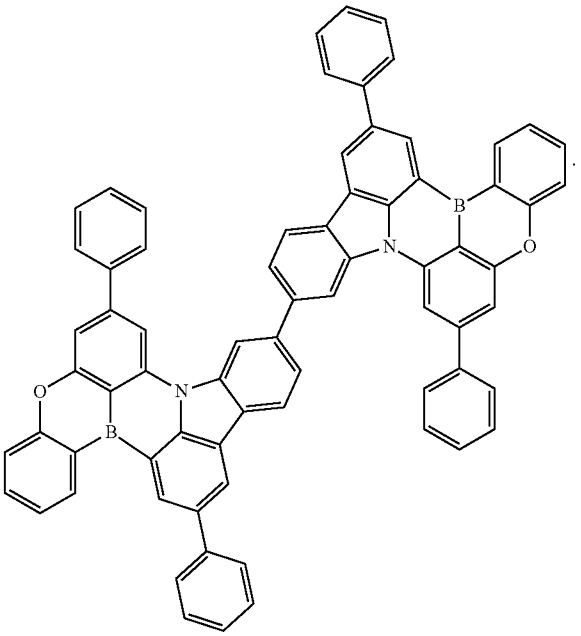
157
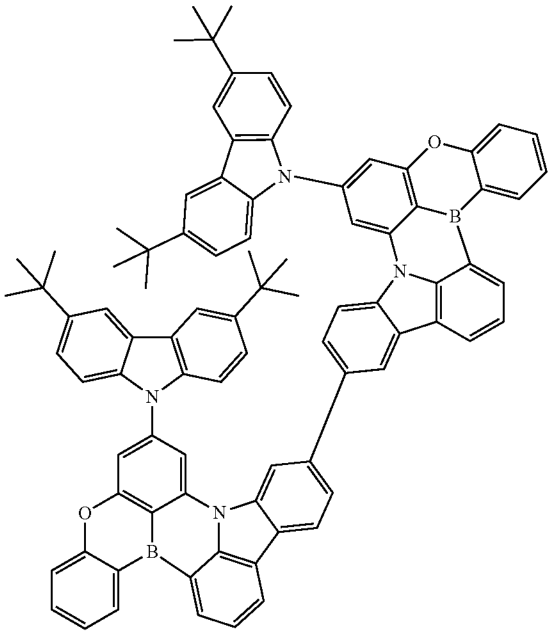

-continued
158
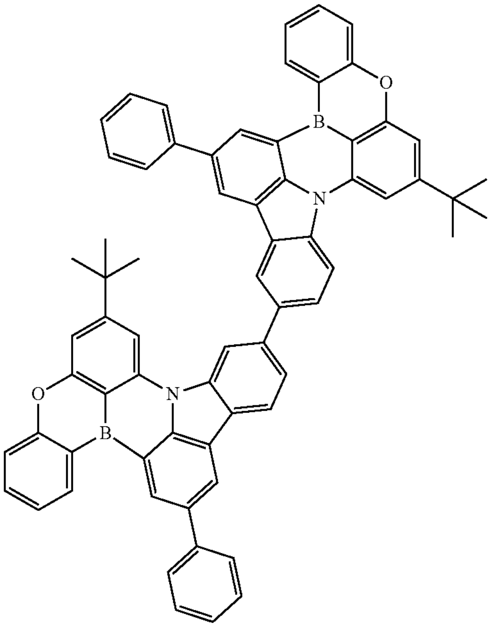
159
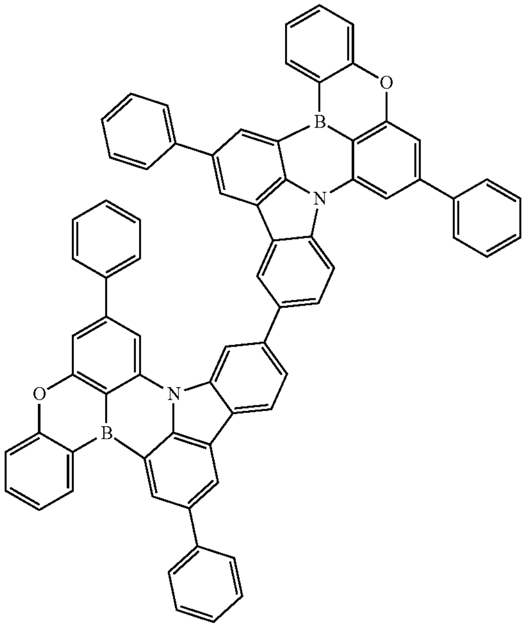
160
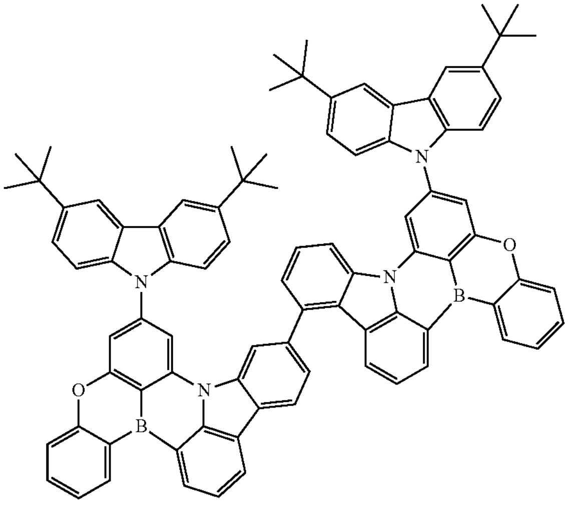
161
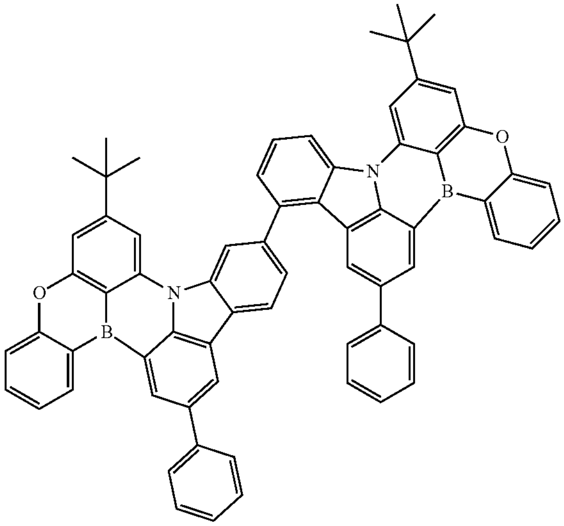

-continued
162
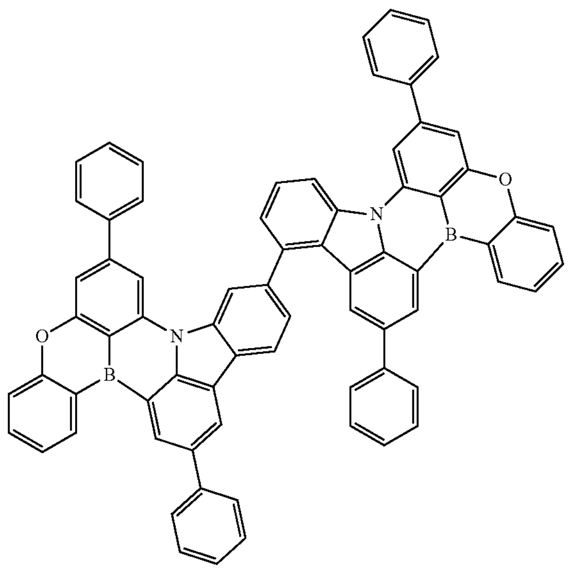
163
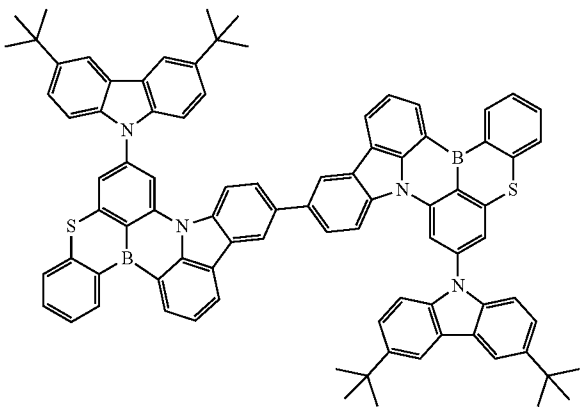
164
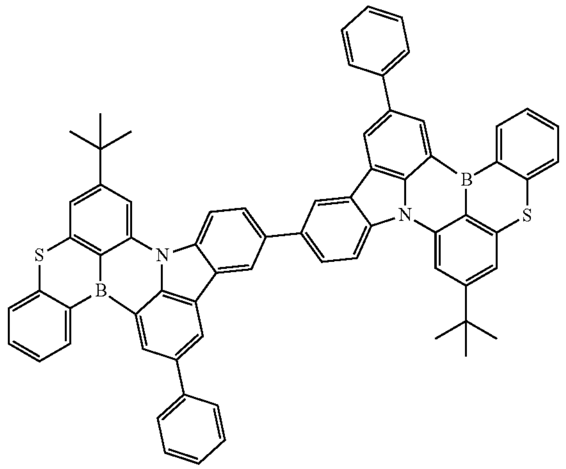
165
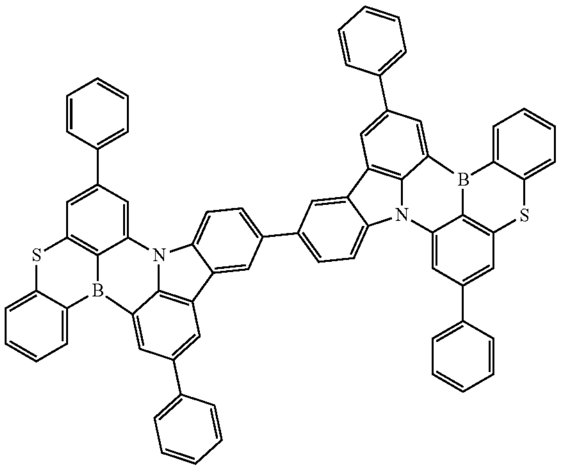
166
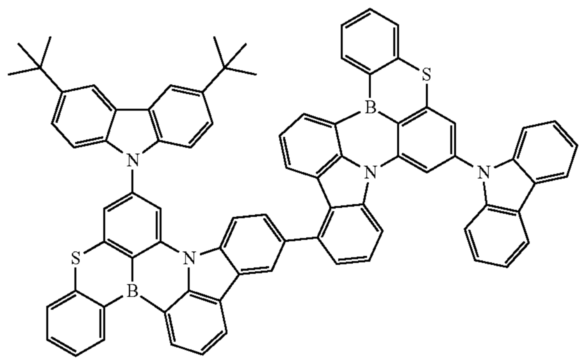
167
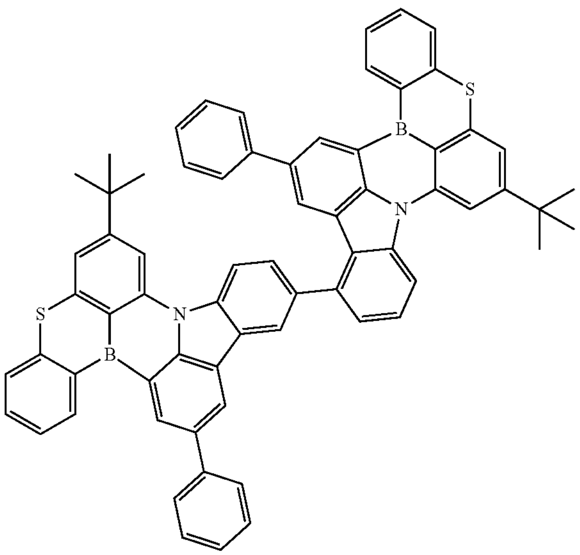

-continued
168
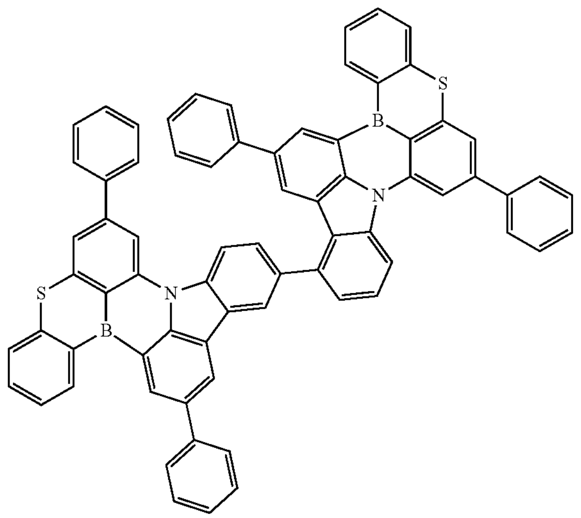
169
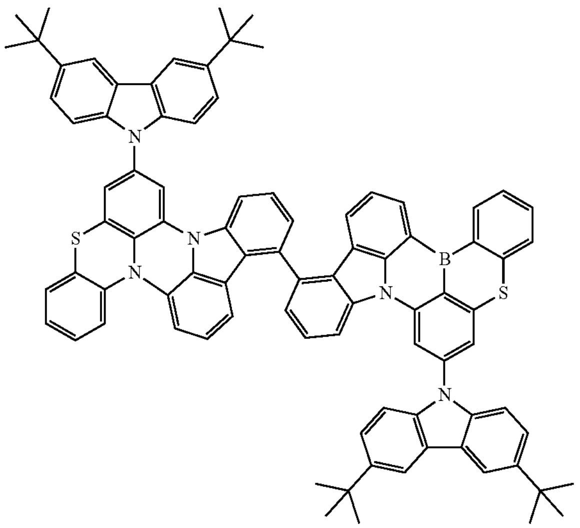
170
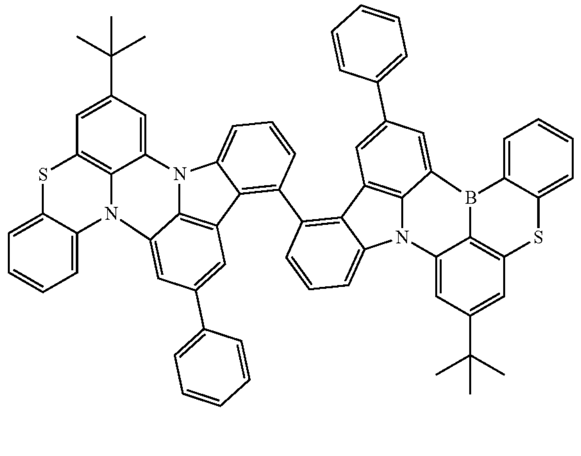
171
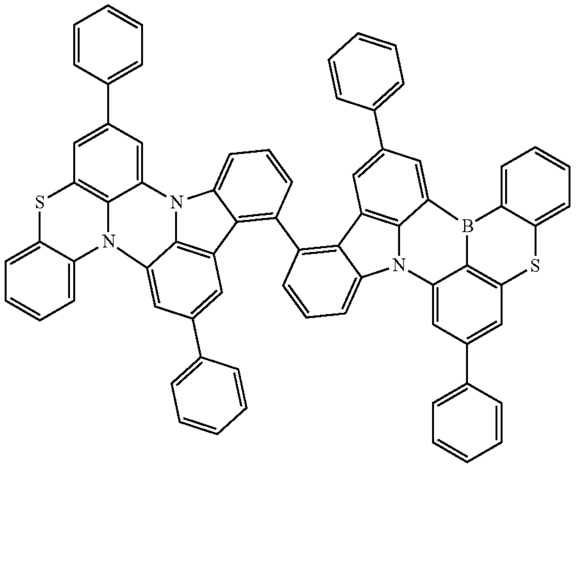

-continued
172
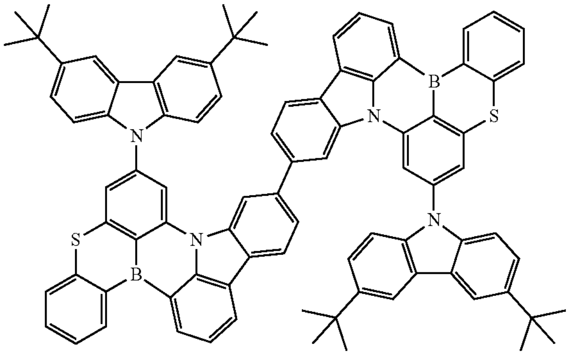
173
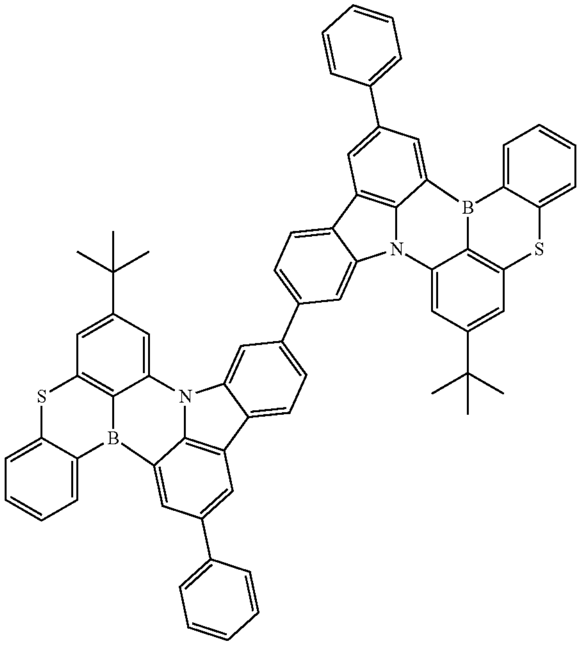
174
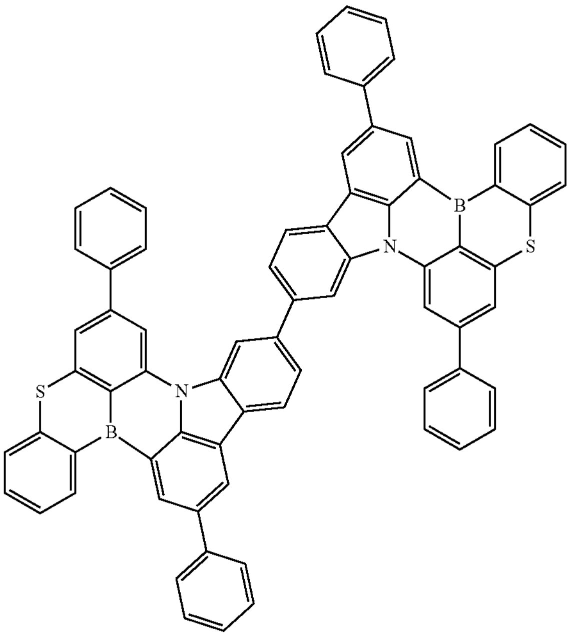
175
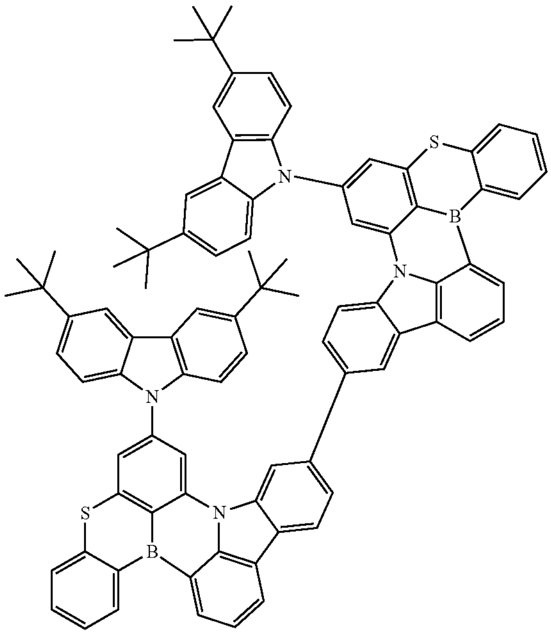

-continued
176
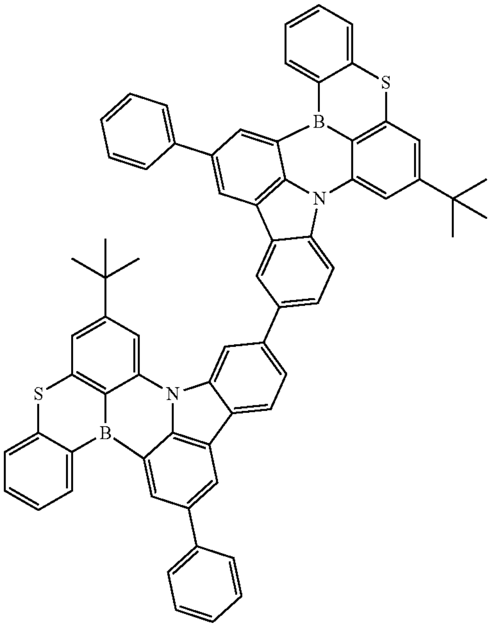
177
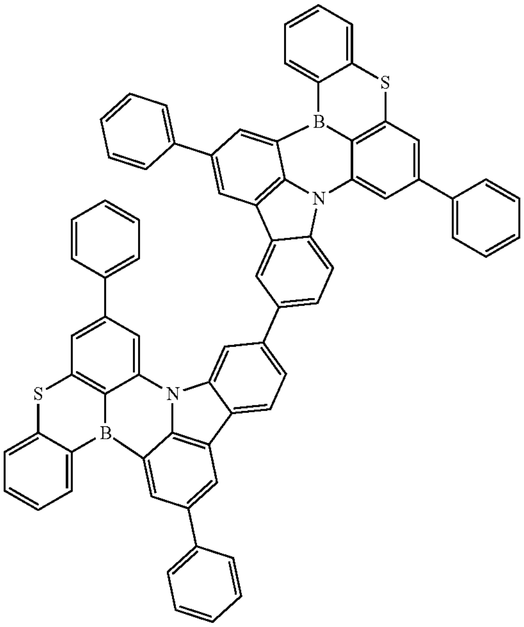
178
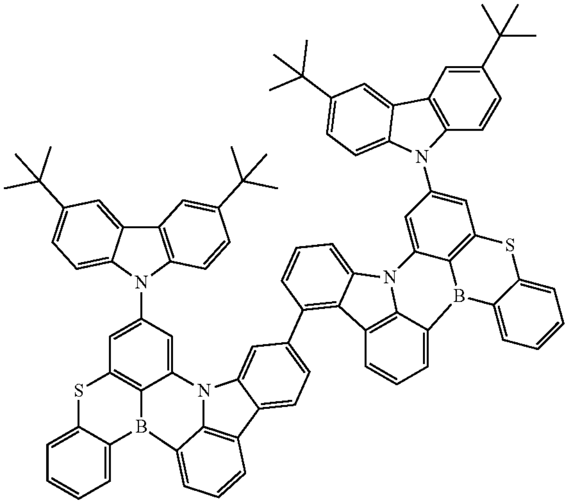
179
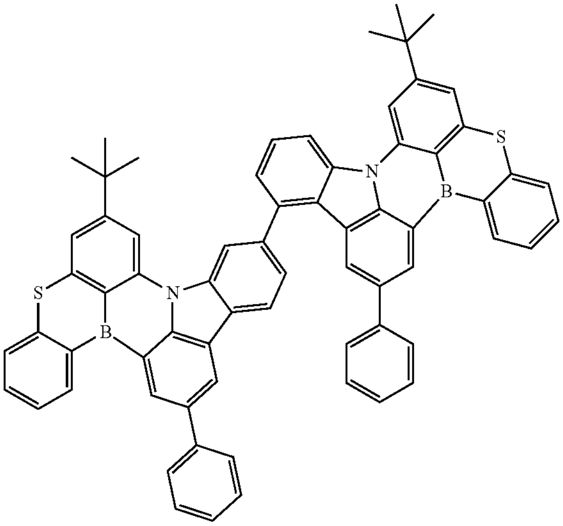

-continued

180

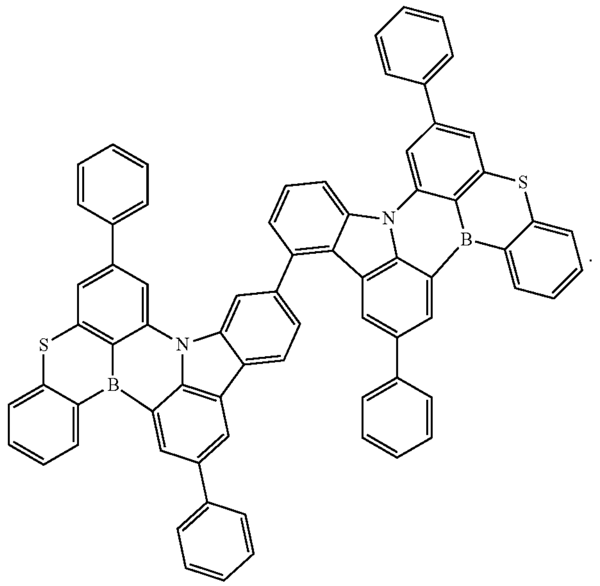

14. A light emitting device, comprising:

a first electrode;

a second electrode facing the first electrode; and an emission layer between the first electrode and the second electrode, wherein the emission layer comprises a host and a delayed fluorescence dopant, and the delayed fluorescence dopant comprises a fused polycyclic compound represented by Formula 1:

Formula 1

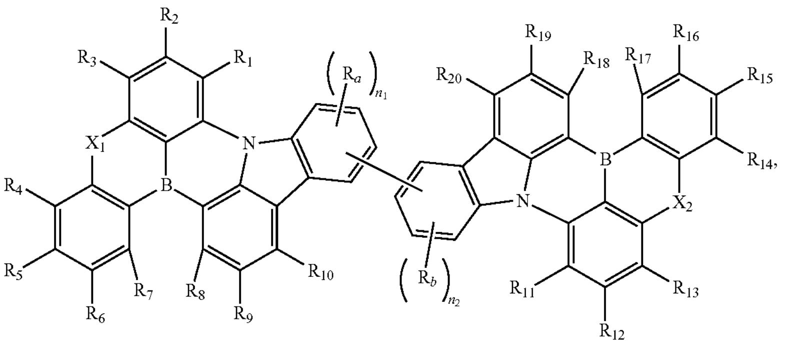

and wherein in Formula 1, $X_1$ and $X_2$ are each independently $NR_c$, O, S, or Se, $R_1$ to $R_{20}$, and $R_a$ to $R_c$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and "$n_1$" and "$n_2$" are each independently an integer of 1 to 3.

15. The light emitting device of claim 14, wherein the host comprises a compound represented by Formula E-2a or Formula E-2b:

Formula E-2a

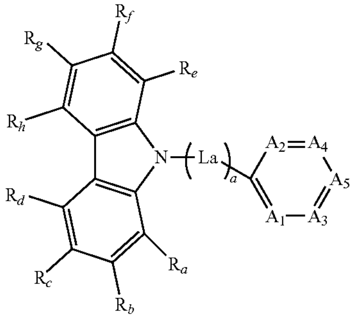

Formula E-2b $(\text{Cbz1}-\!(L_b)_b\!-\text{Cbz2})$, wherein in Formula E-2a,

"a" is an integer of 0 to 10, $L_a$ is a direct linkage, a substituted or unsubstituted arylene group having 6 to 30 ring-forming carbon atoms, or a substituted or unsubstituted heteroarylene group having 2 to 30 ring-forming carbon atoms, $A_1$ to $A_5$ are each independently N or $CR_i$, $R_a$ to $R_i$ are each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or combined with an adjacent group to form a ring, and two or three selected among $A_1$ to $A_5$ are N, and a remainder thereof are each $CR_i$, and wherein in Formula E-2b, Cbz1 and Cbz2 are each independently an unsubstituted carbazole group, or a carbazole group substituted with an aryl group having 6 to 30 ring-forming carbon atoms, $L_b$ is a direct linkage, a substituted or unsubstituted arylene group having 6 to 30 ring-forming carbon atoms, or a substituted or unsubstituted heteroarylene group having 2 to 30 ring-forming carbon atoms, and "b" is an integer of 0 to 10.

16. The light emitting device of claim 14, further comprising a hole transport region between the first electrode and the emission layer, and the hole transport region comprises a compound represented by Formula H-a:

Formula H-a

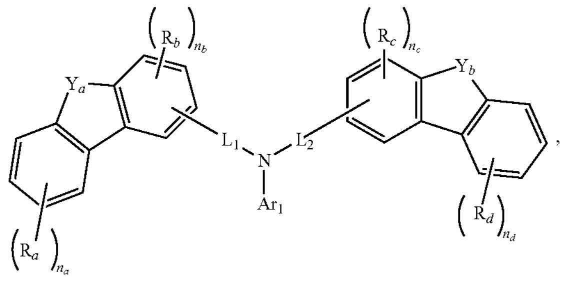

and wherein in Formula H-a, $Y_a$ and $Y_b$ are each independently $CR_eR_f$, $NR_g$, O, or S, $Ar_1$ is a substituted or unsubstituted aryl group having 6 to 30 ring-forming carbon atoms, or a substituted or unsubstituted heteroaryl group having 2 to 30 ring-forming carbon atoms, $L_1$ and $L_2$ are each independently a direct linkage, a substituted or unsubstituted arylene group having 6 to 30 ring-forming carbon atoms, or a substituted or unsubstituted heteroarylene group having 2 to 30 ring-forming carbon atoms, $R_a$ to $R_g$ are each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or combined with an adjacent group to form a ring, "$n_a$" and "$n_d$" are each independently an integer of 0 to 4, and "$n_b$" and "$n_c$" are each independently an integer of 0 to 3.

17. The light emitting device of claim 14, wherein the fused polycyclic compound represented by Formula 1 is represented by any one among Formula 2-1 to Formula 2-6:

Formula 2-1

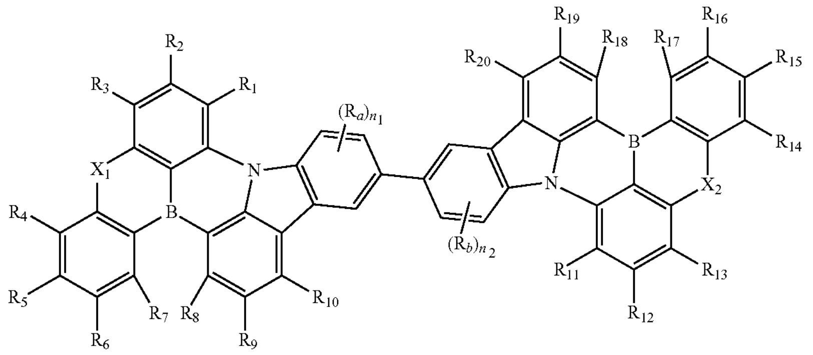

-continued
Formula 2-2
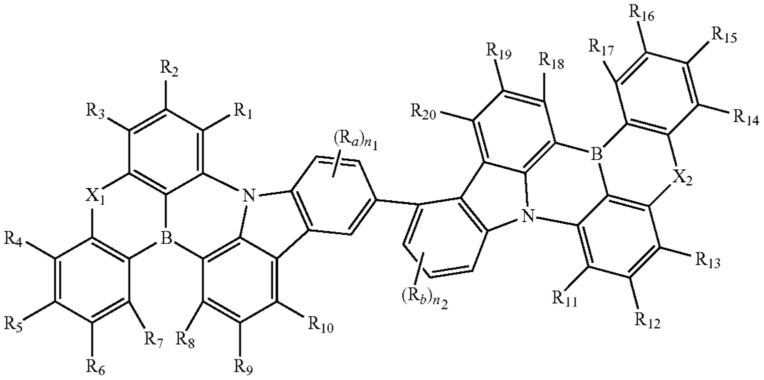
Formula 2-3
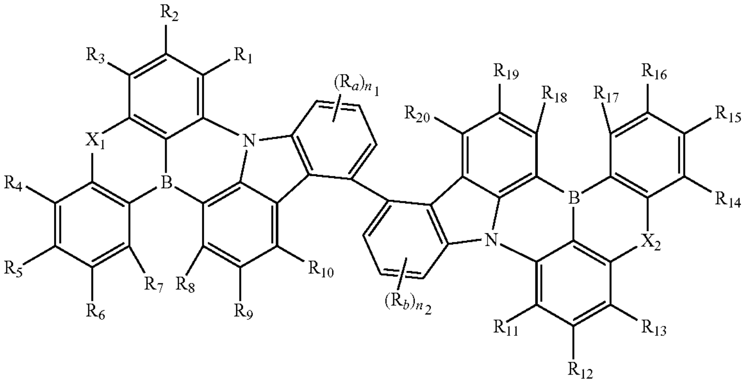
Formula 2-4
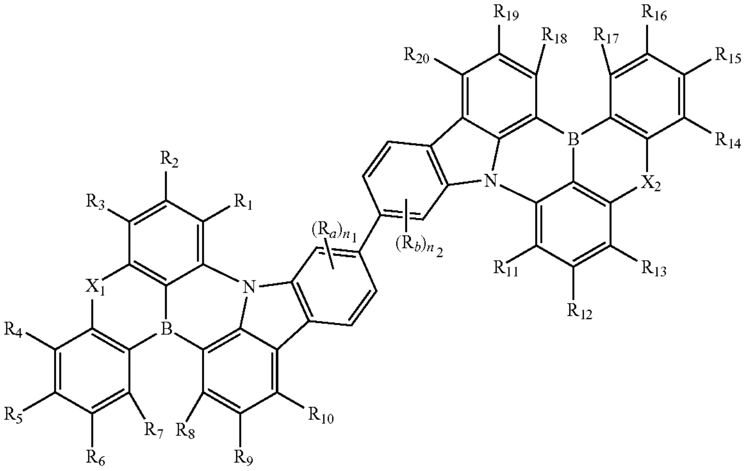
Formula 2-5
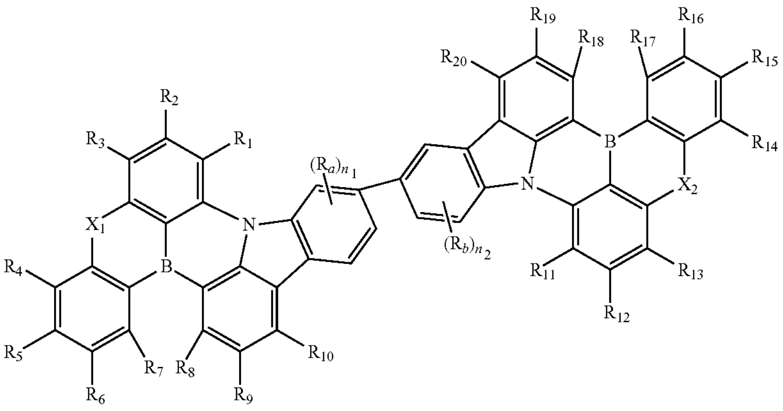

-continued

Formula 2-6

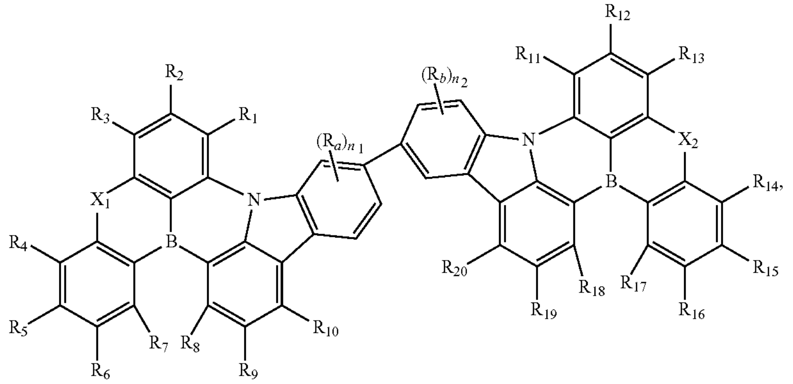

and wherein in Formula 2-1 to Formula 2-6, $X_1$, $X_2$, $R_1$ to $R_{20}$, $R_a$ to $R_c$, "$n_1$" and "$n_2$" are the same as respectively defined in connection with Formula 1.

18. The light emitting device of claim 14, wherein the fused polycyclic compound represented by Formula 1 is represented by Formula 3:

Formula 3

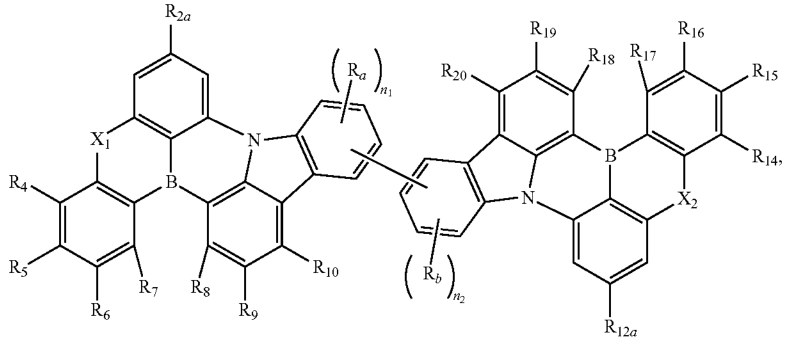

and wherein in Formula 3, $R_{2a}$ and $R_{12a}$ are each independently a deuterium atom, a halogen atom, a substituted or unsubstituted amine group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, and $X_1$, $X_2$, $R_4$ to $R_{10}$, $R_{14}$ to $R_{20}$, $R_a$ to $R_c$, "$n_1$" and "$n_2$" are the same as respectively defined in connection with Formula 1.

19. The light emitting device of claim 14, wherein the fused polycyclic compound represented by Formula 1 is represented by any one among Formula 4-1 to Formula 4-3:

Formula 4-1

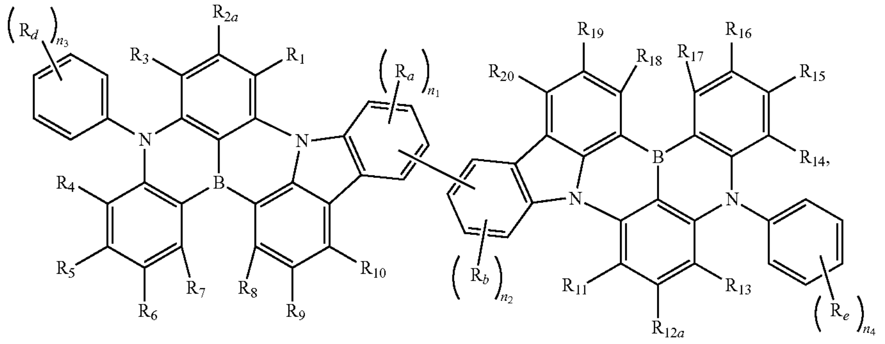

Formula 4-2

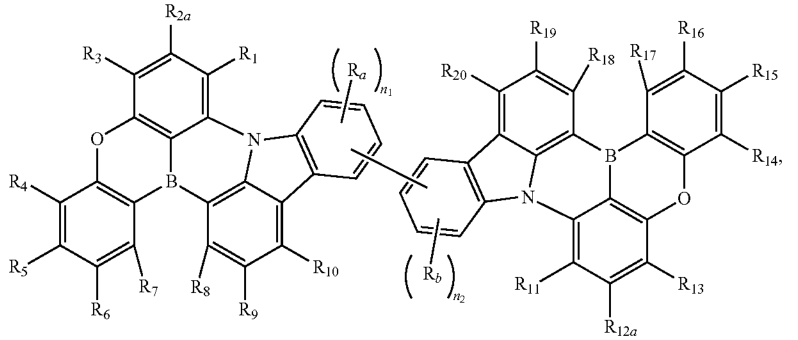

Formula 4-3

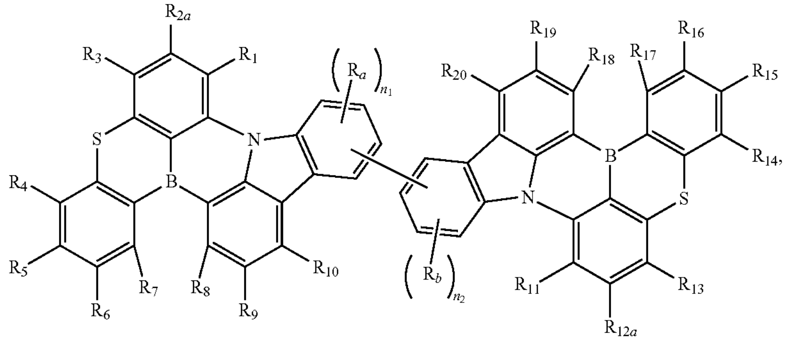

and wherein in Formula 4-1 to Formula 4-3, $R_d$ and $R_e$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group having 2 to 30 carbon atoms, a substituted or unsubstituted aryl group having 6 to 60 ring-forming carbon atoms, or a substituted or unsubstituted heteroaryl group having 2 to 60 ring-forming carbon atoms, "$n_3$" and "$n_4$" are each independently an integer of 1 to 5, and $R_1$ to $R_{20}$, $R_a$, $R_b$, "$n_1$" and "$n_2$" are the same as respectively defined in connection with Formula 1.

20. The light emitting device of claim 14, wherein the fused polycyclic compound comprises at least one among compounds in Compound Group 1:
Compound Group 1
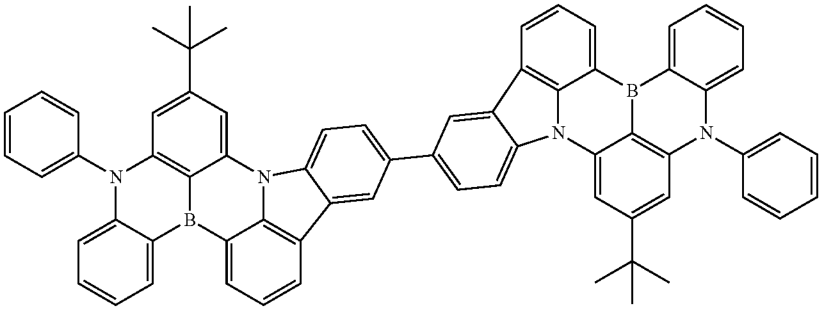
1
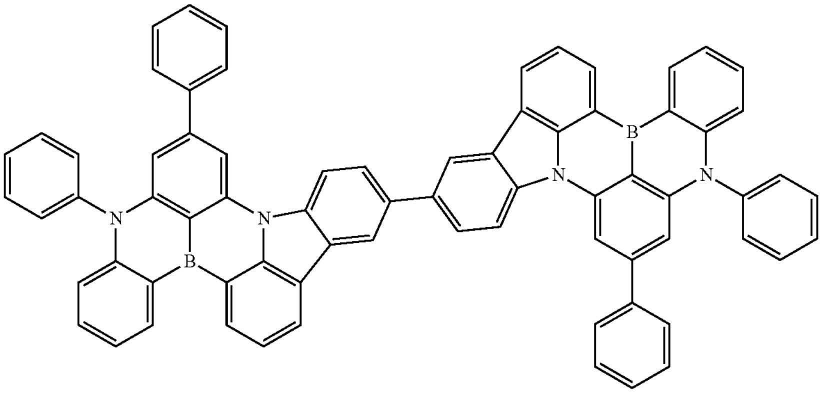
2
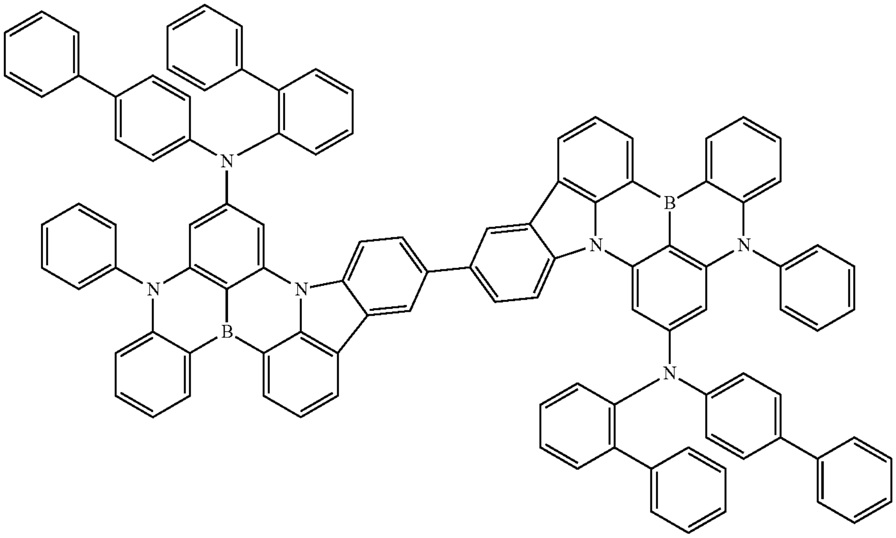
3

-continued
4
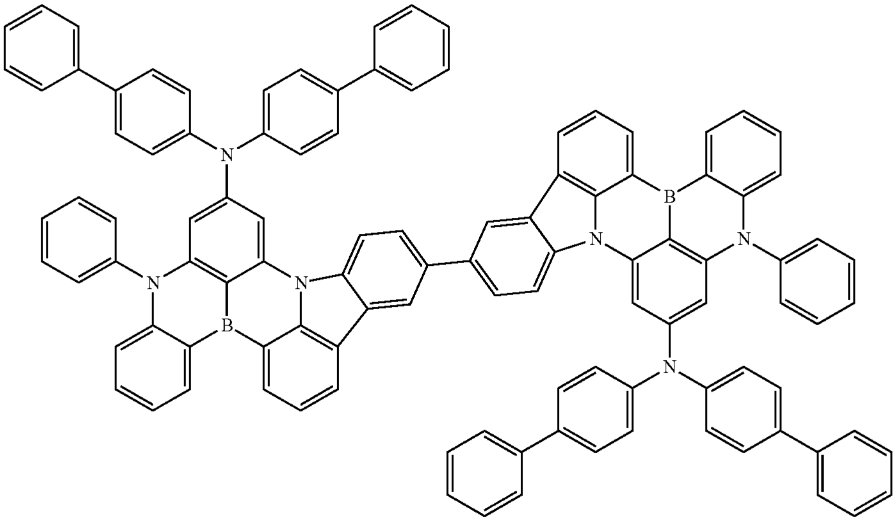
5
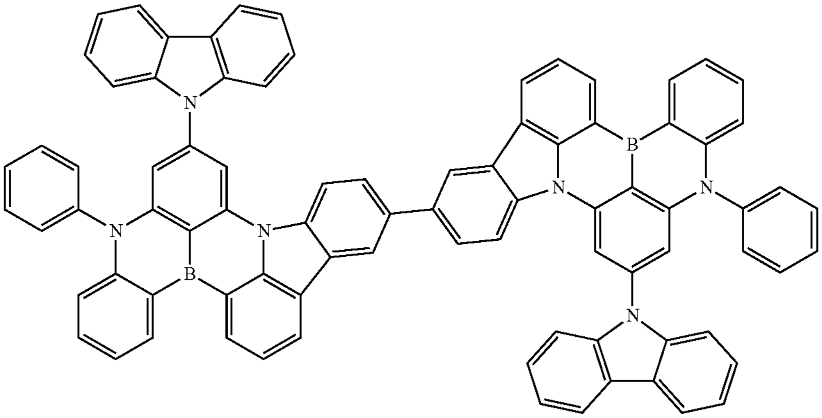
6
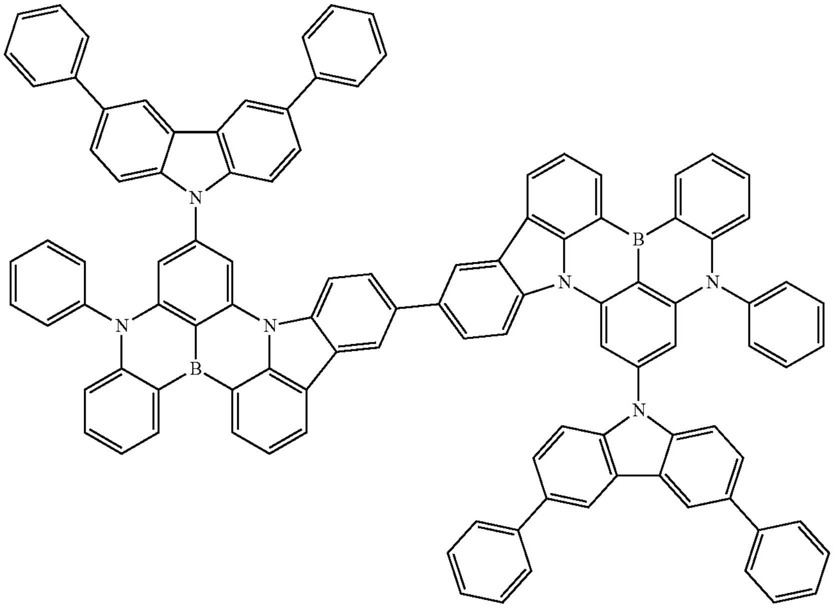

-continued
7
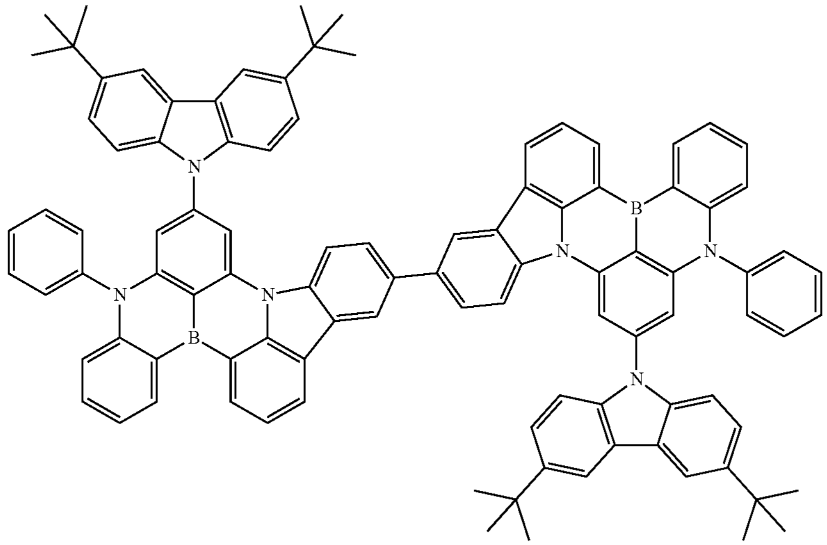
8
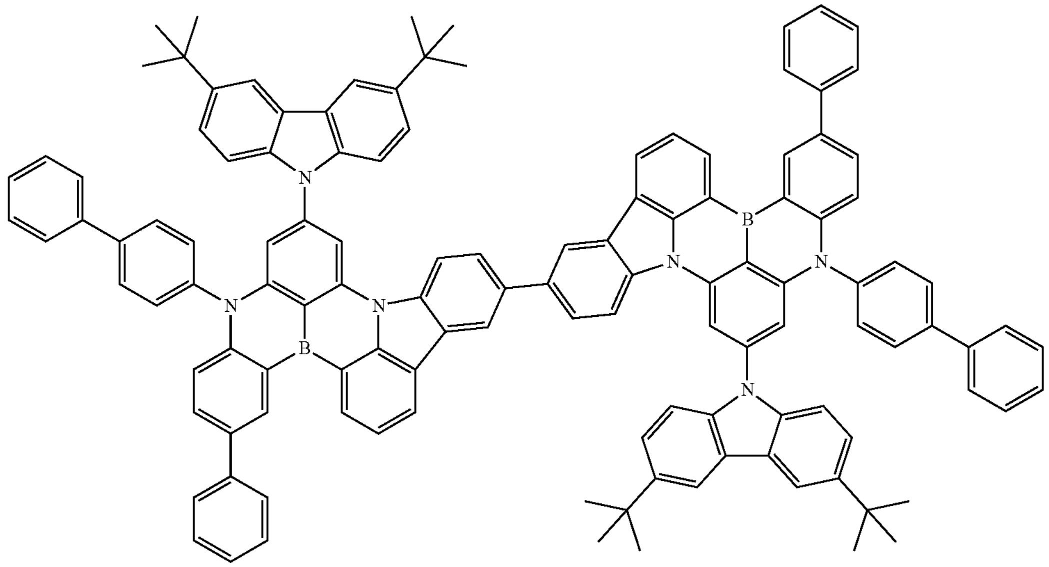
9
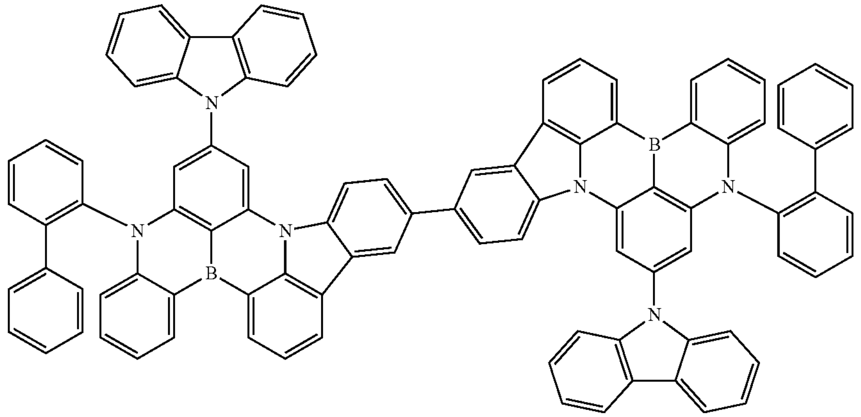

-continued
10
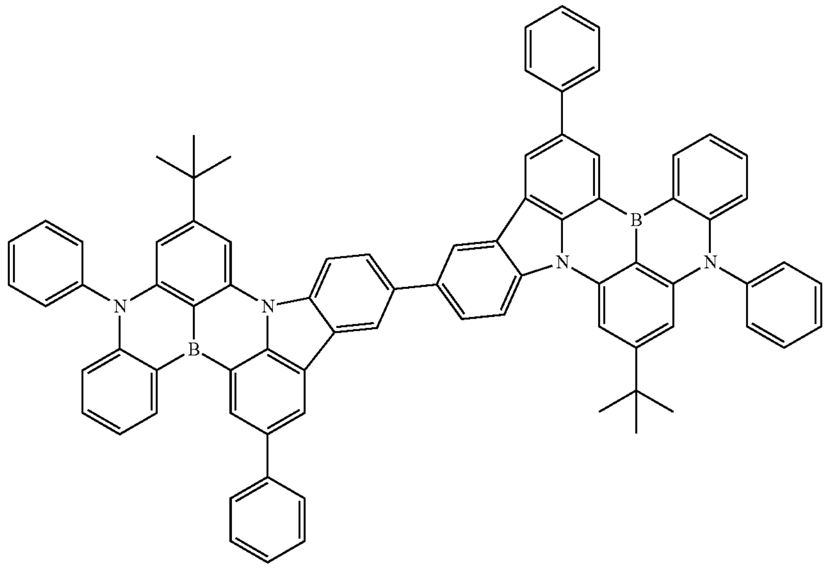
11
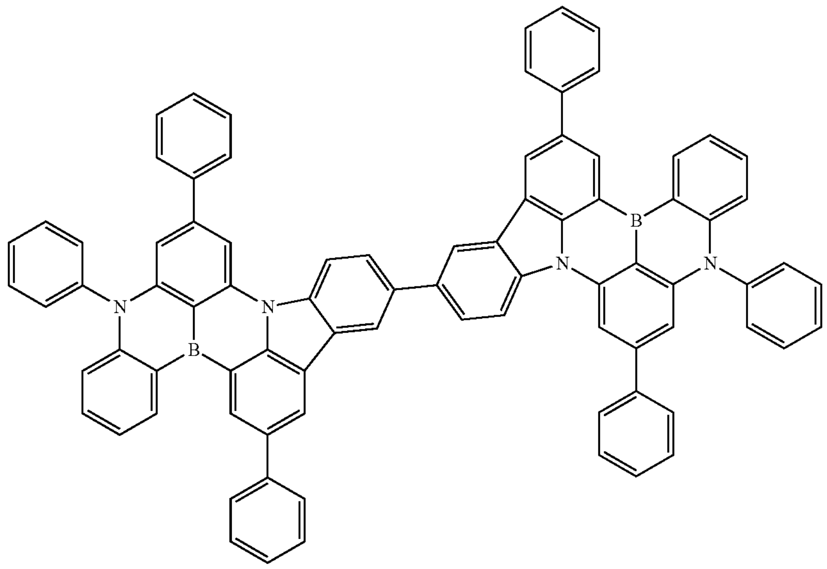

-continued
12
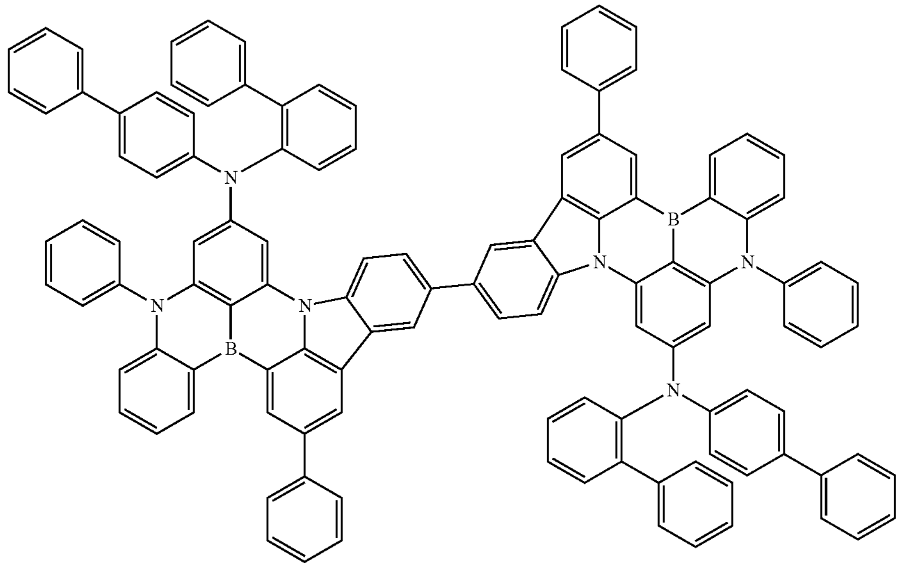
13
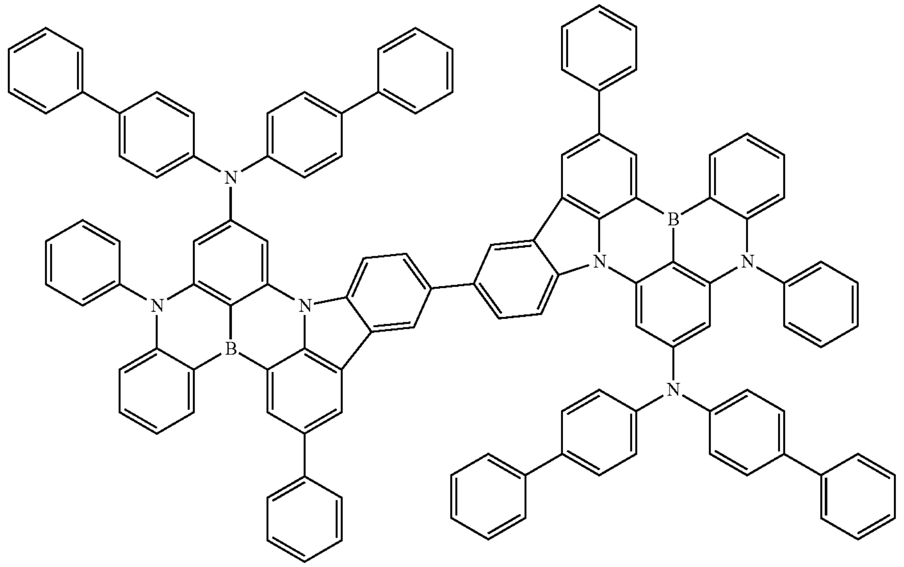

-continued
14
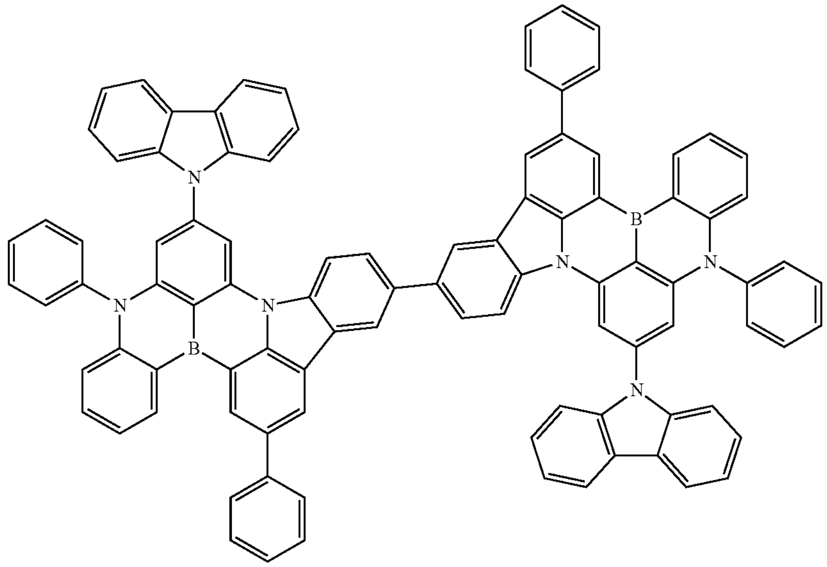
15
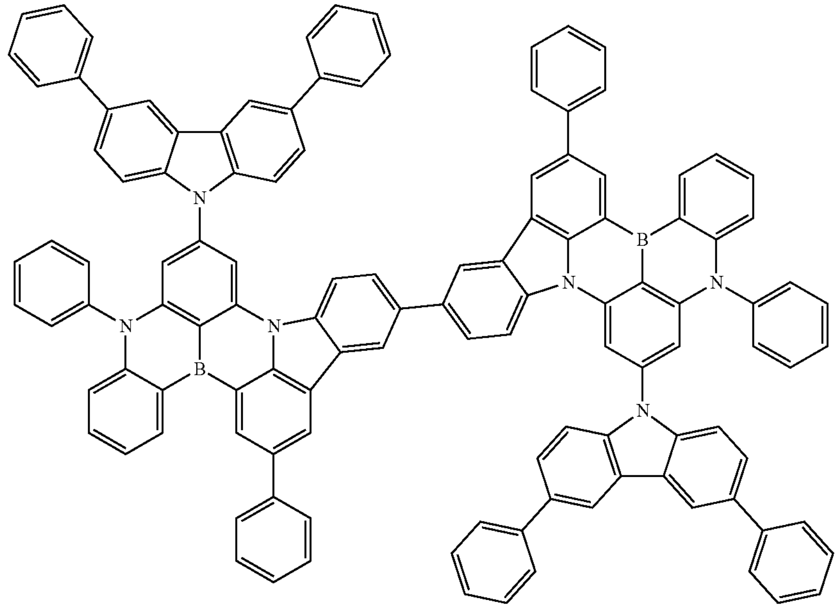

-continued
16
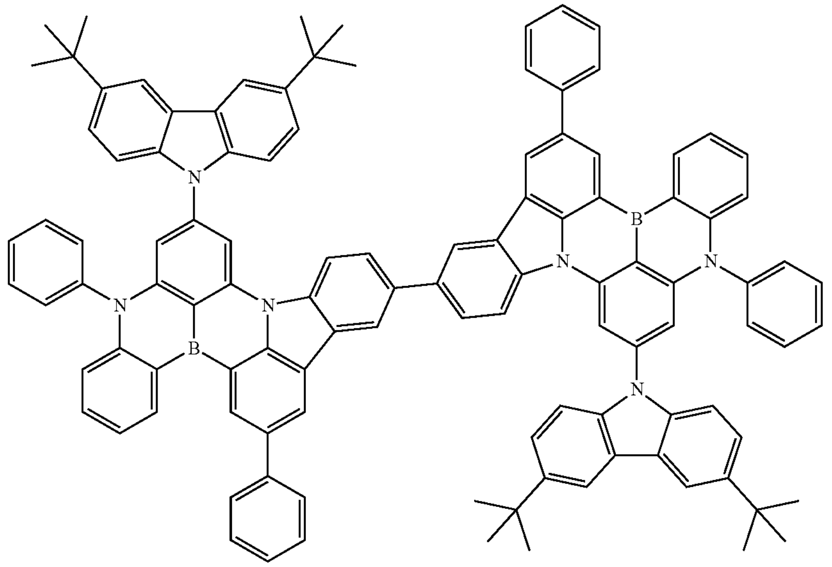
17
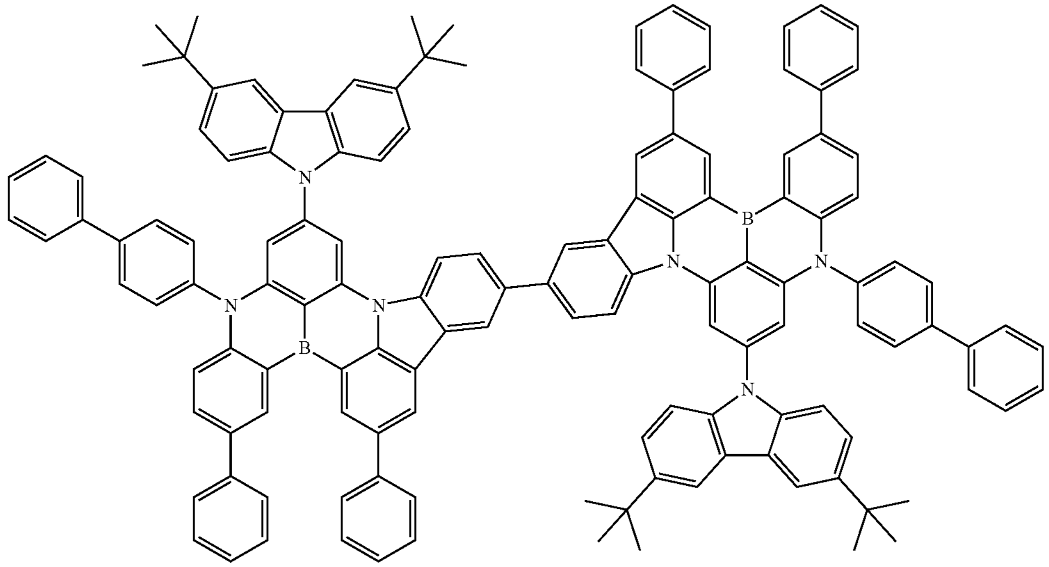

-continued
18
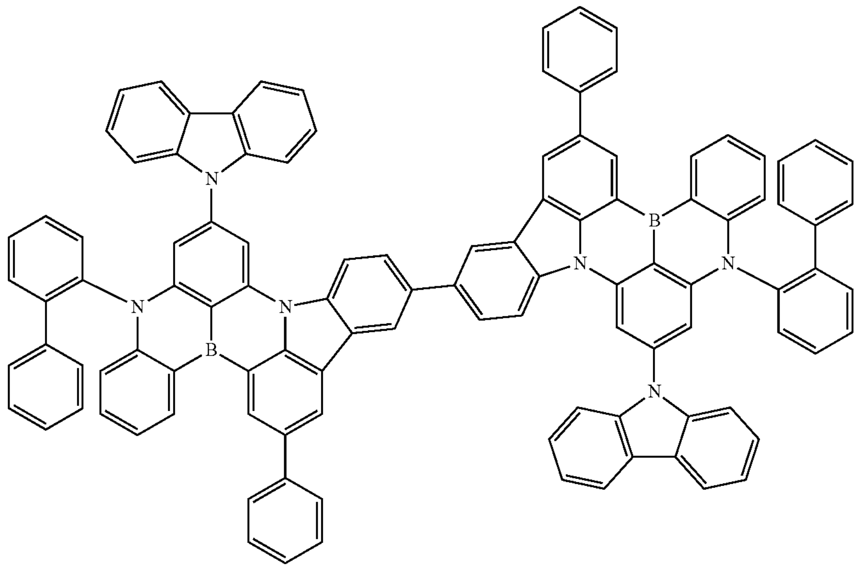
19
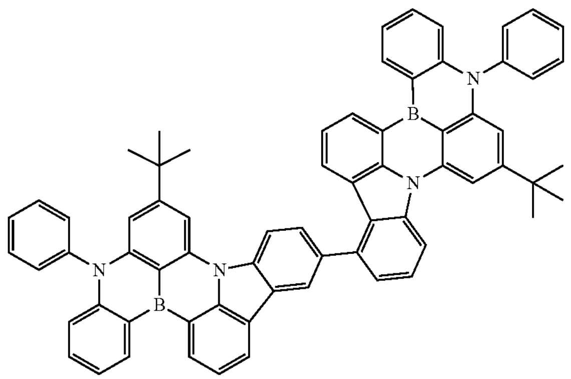
20
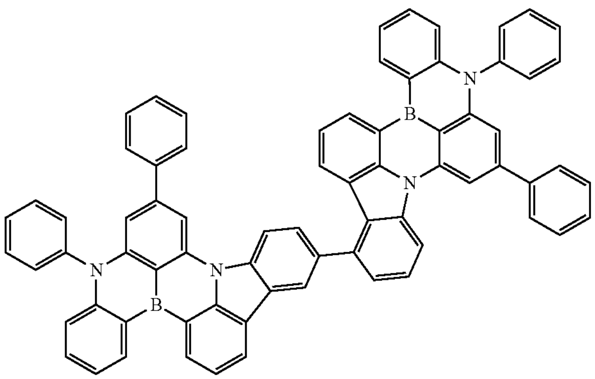
21
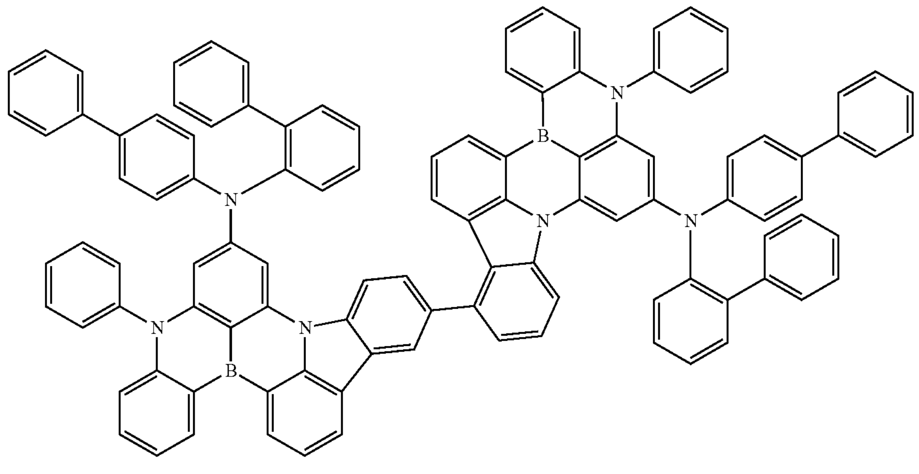

-continued
22
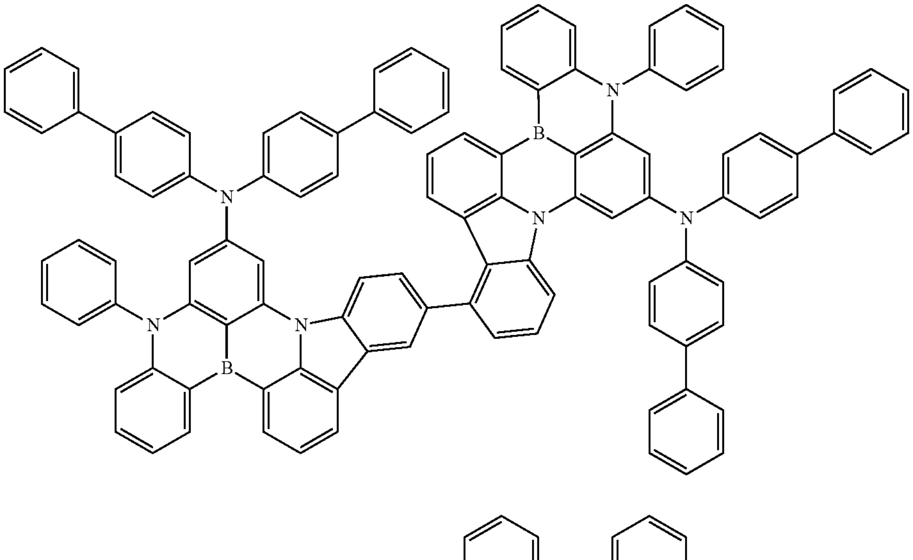
23
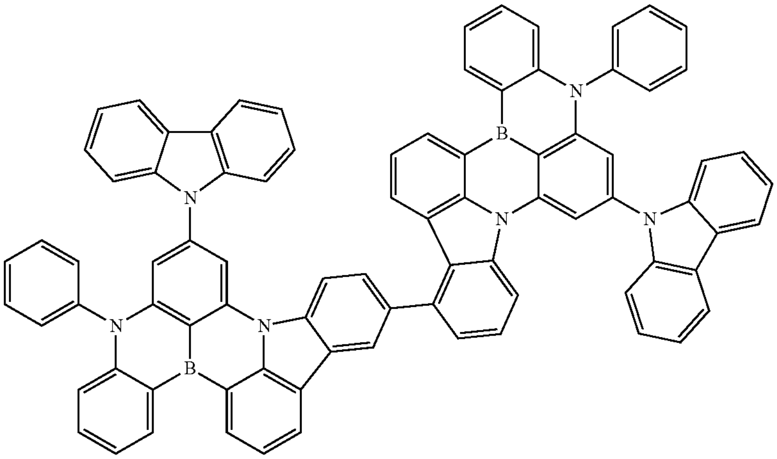
24
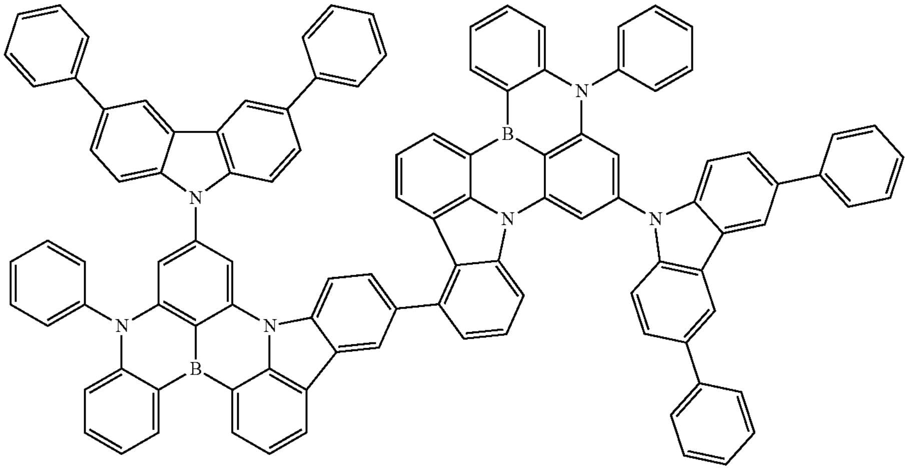

-continued
25
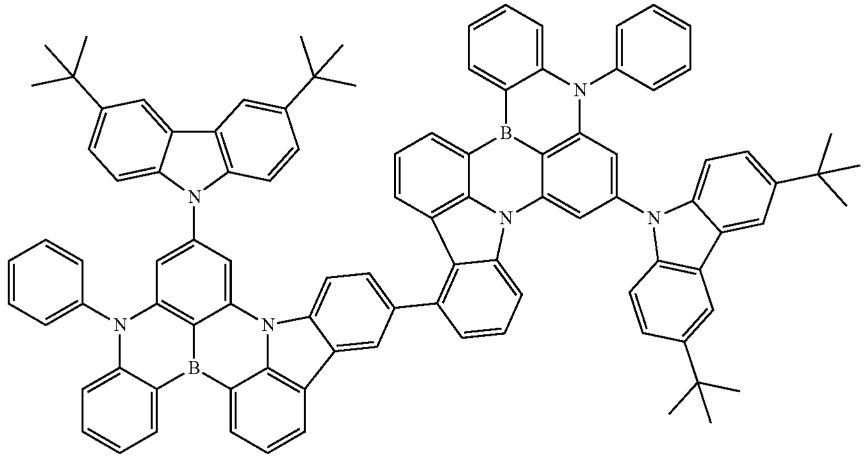
26
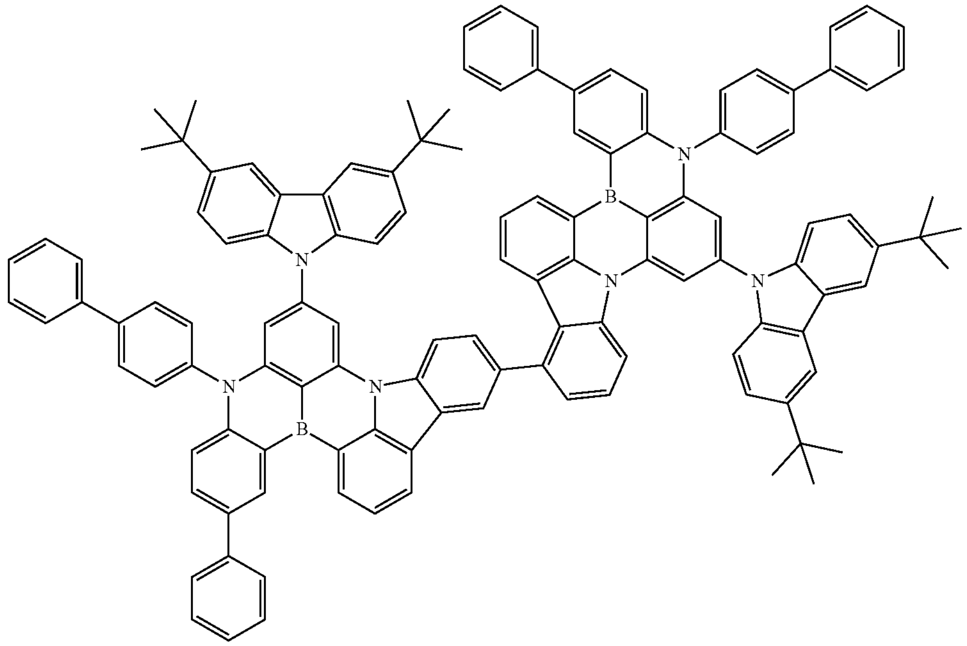
27
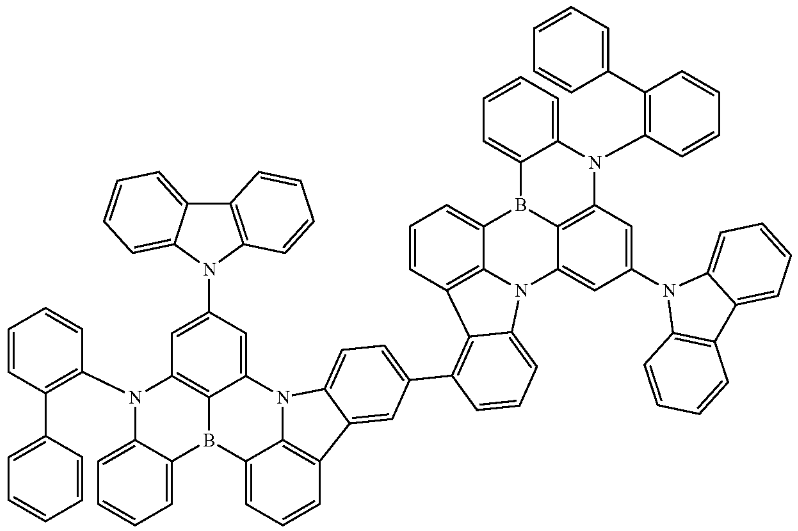

-continued
28
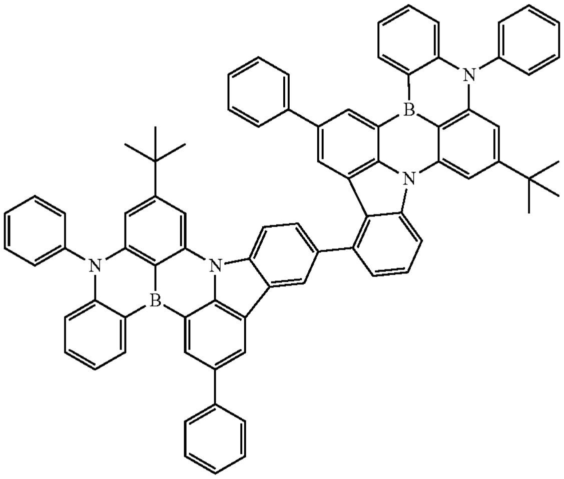
29
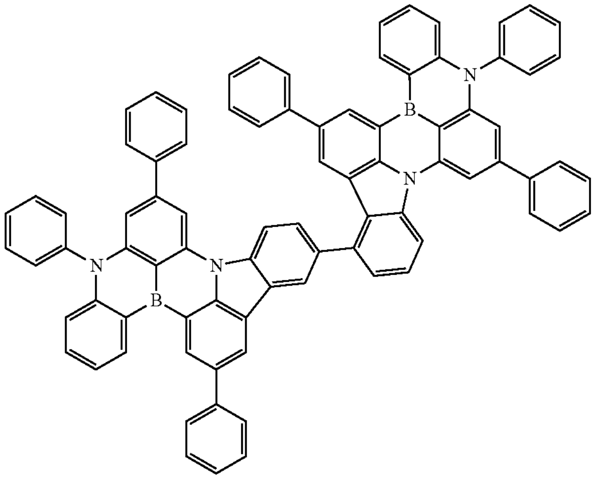
30
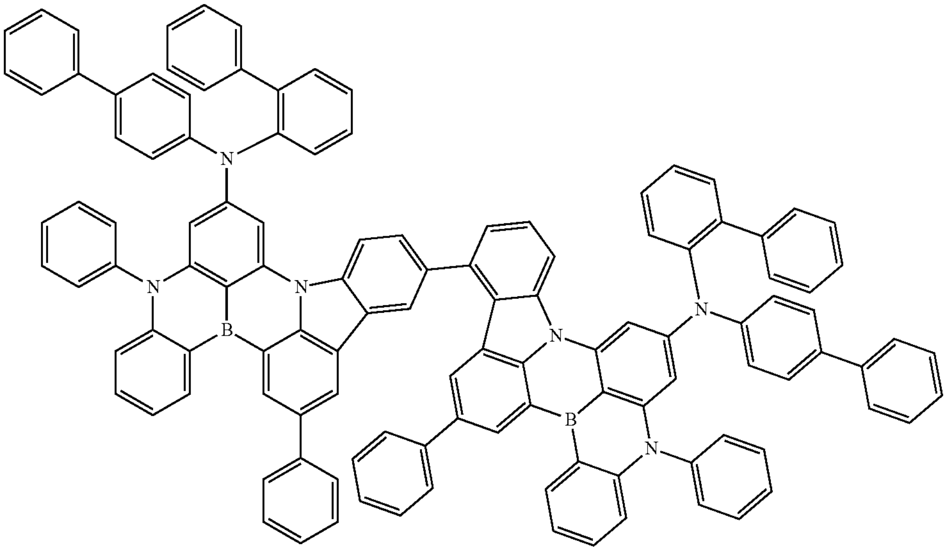
31
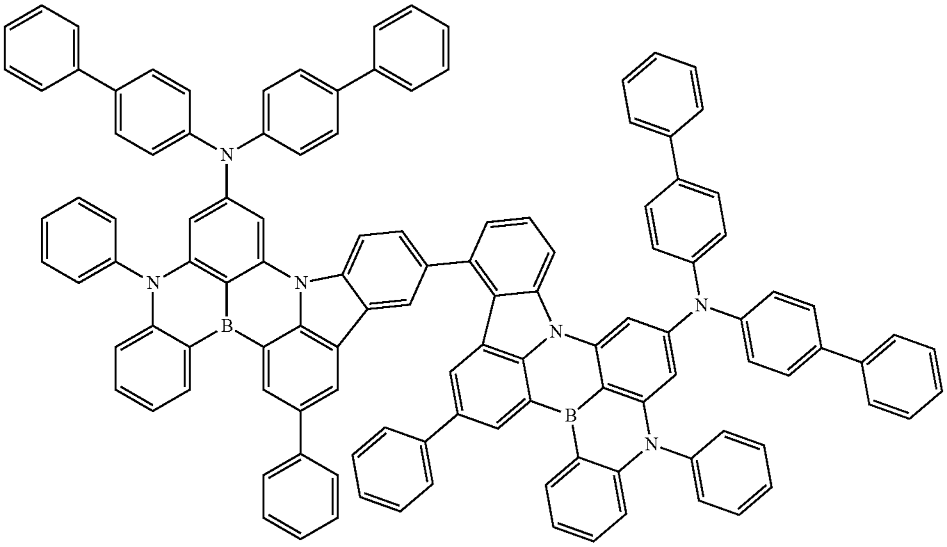

-continued
32
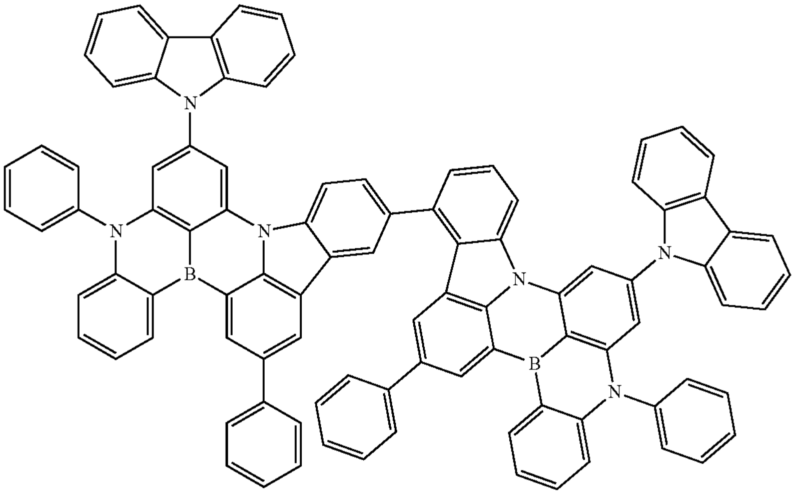
33
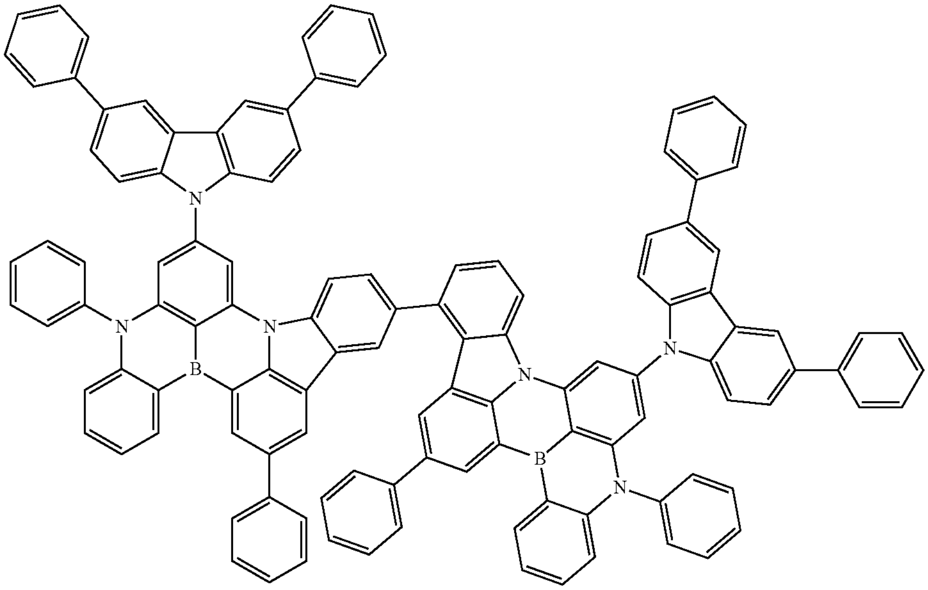
34
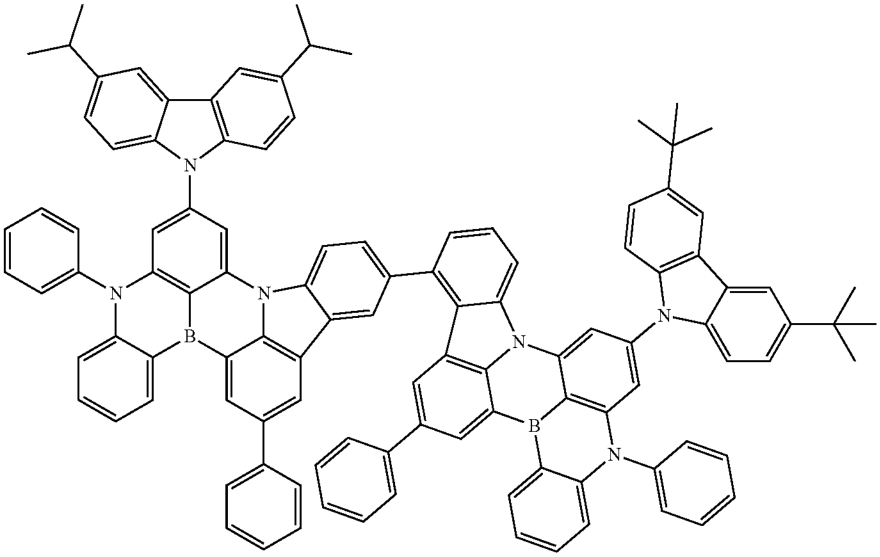

-continued
35
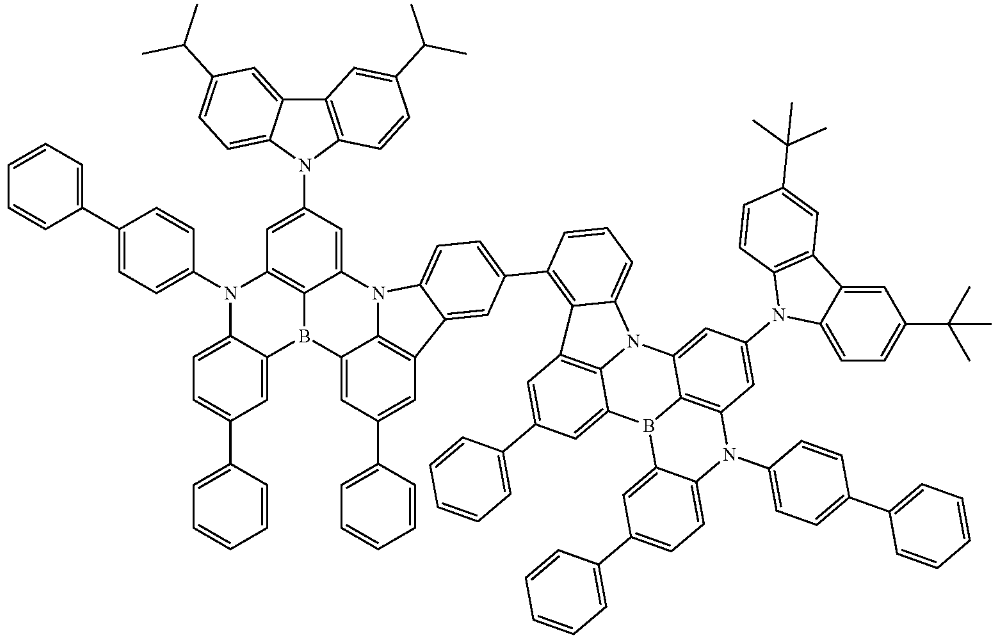
36
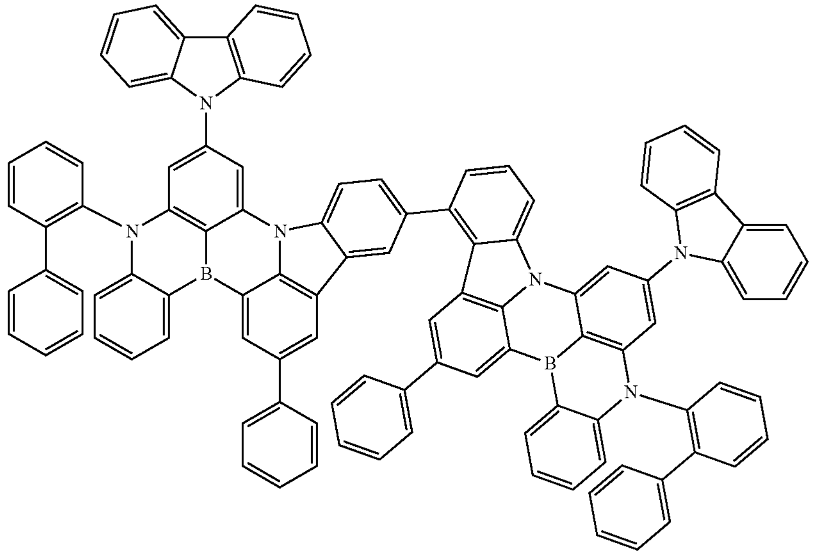
37
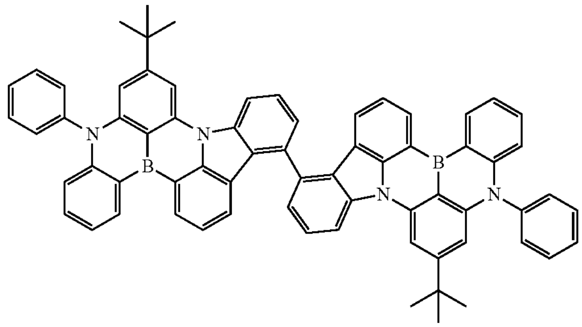
38
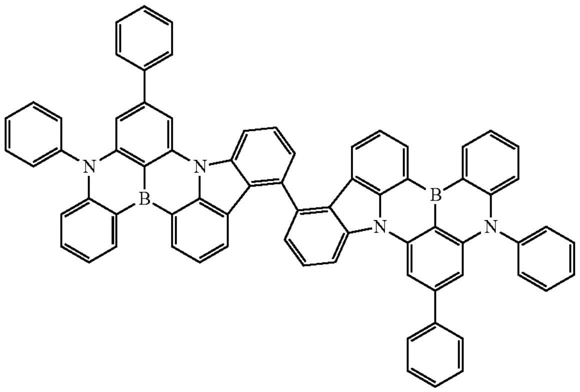

-continued
39
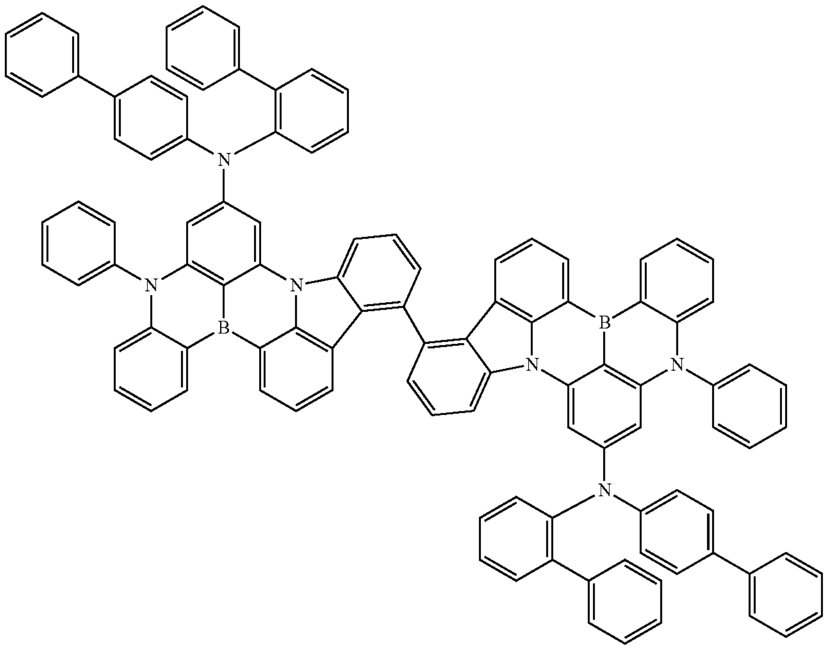
40
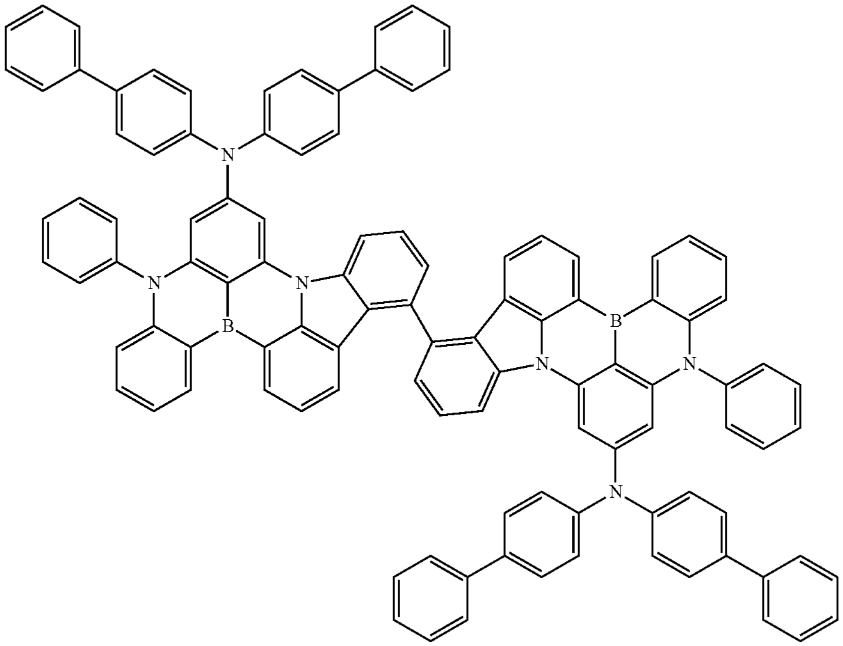

-continued
41
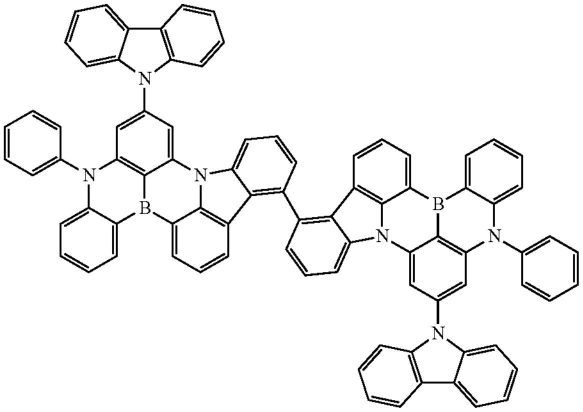
42
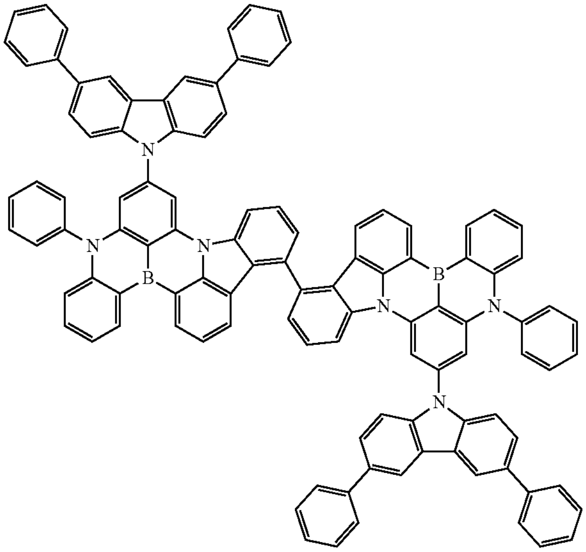
43
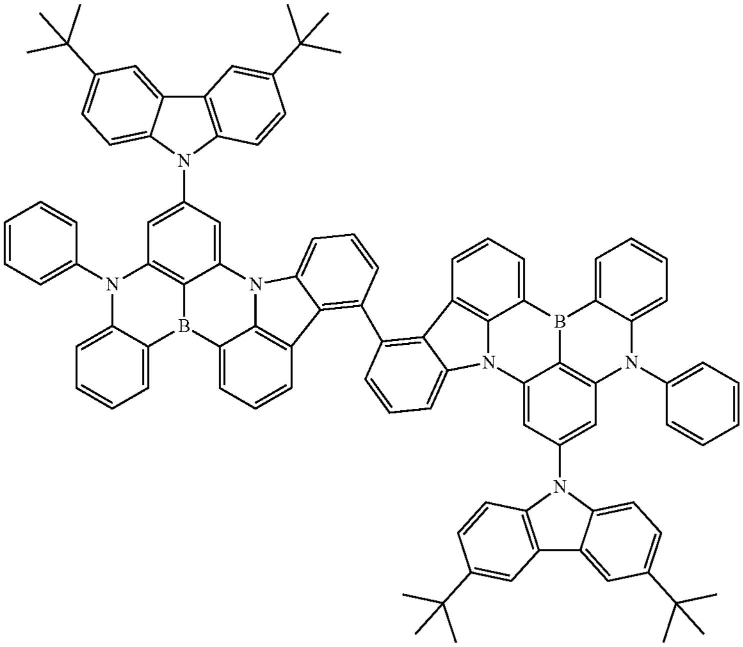

-continued
44
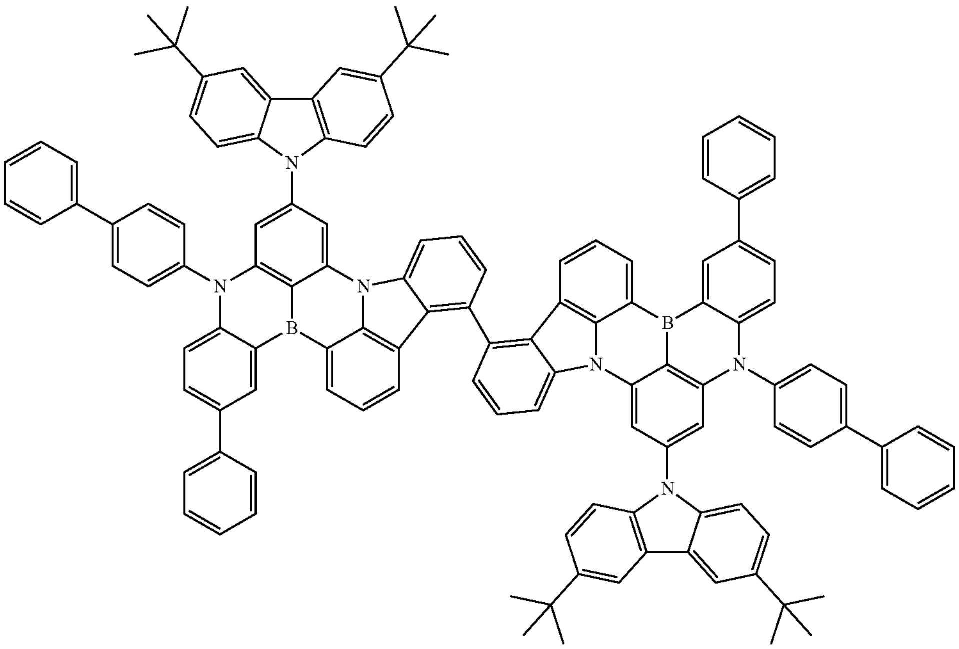
45
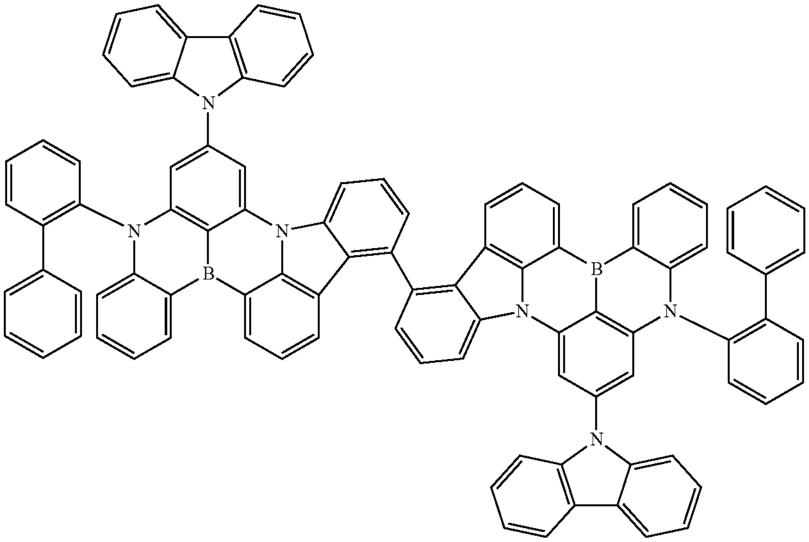
46
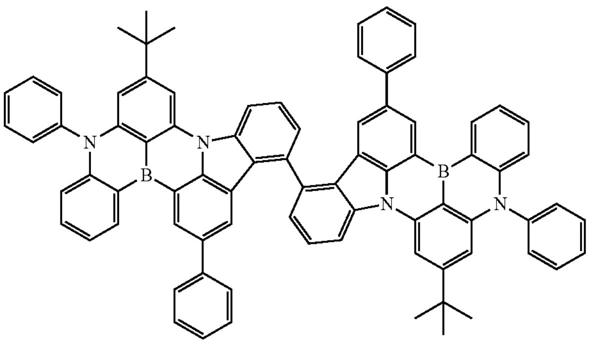
47
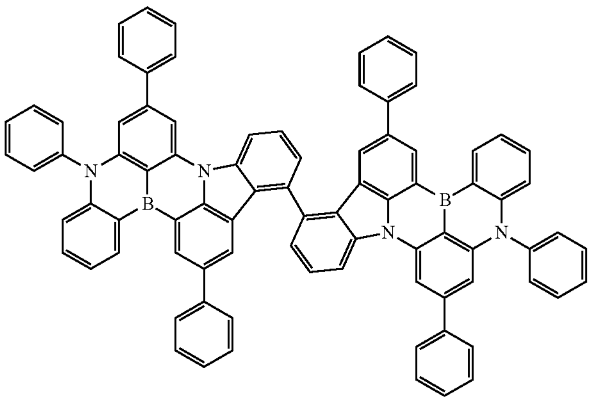

-continued
48
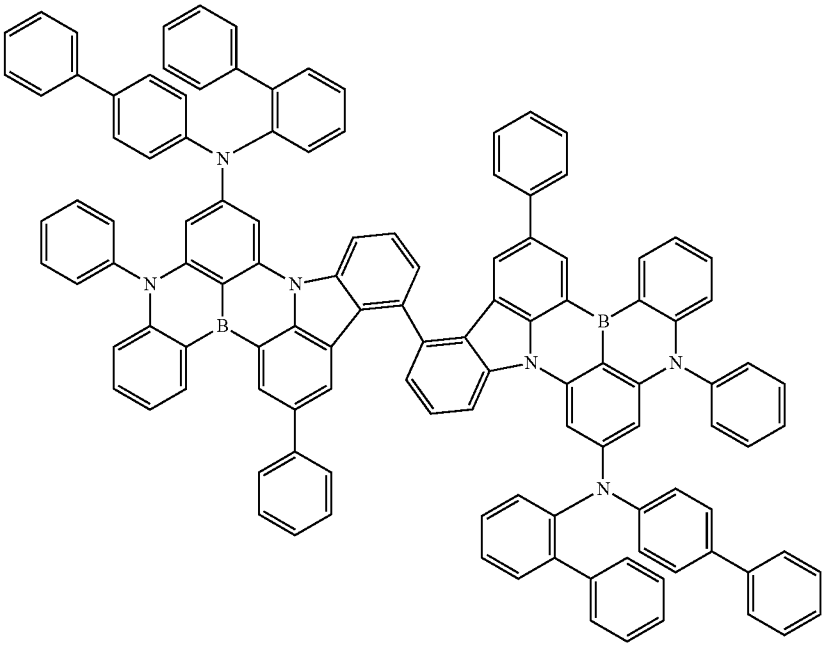
49
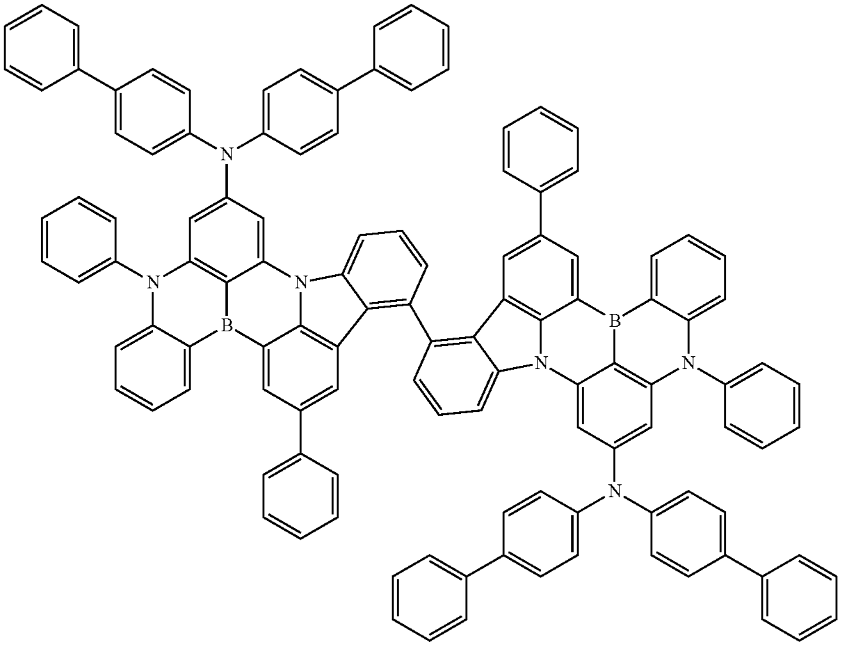

-continued
50
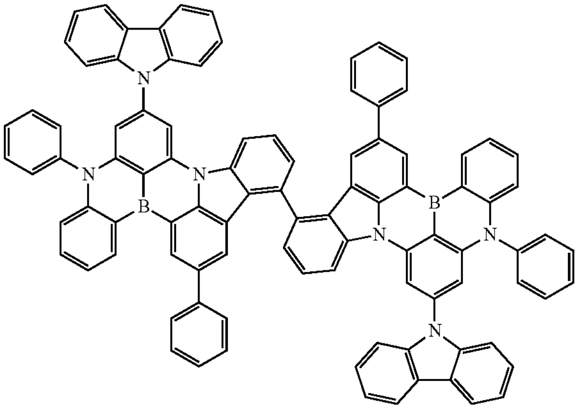
51
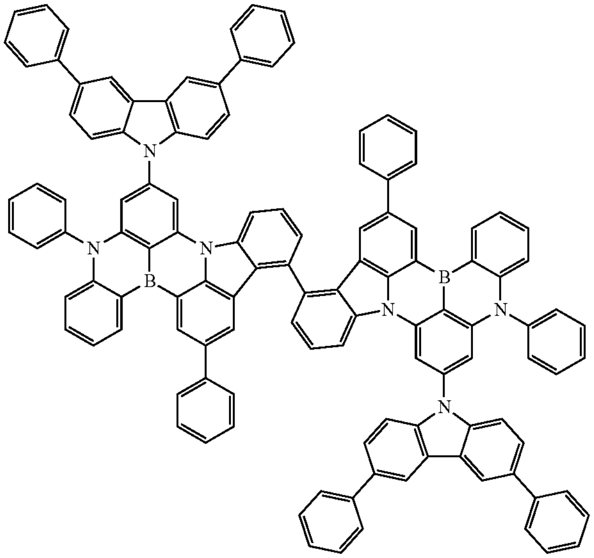
52
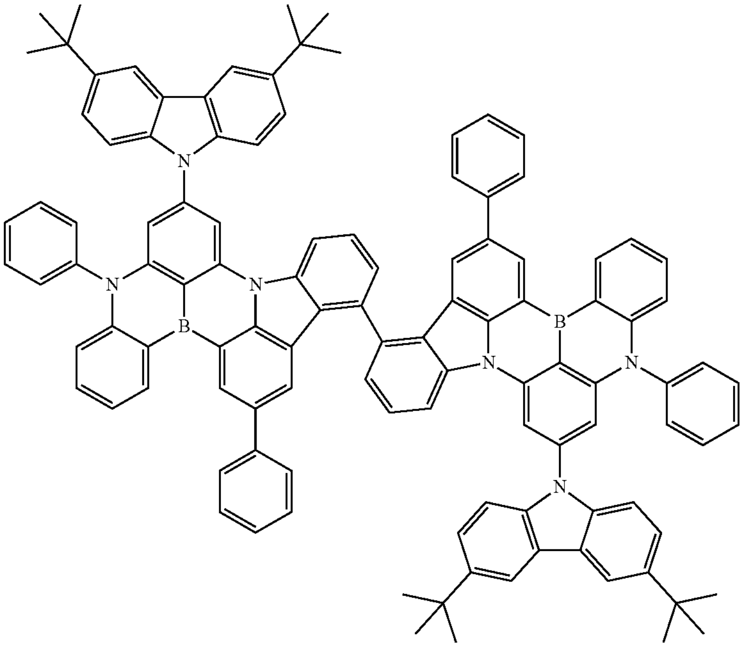

-continued
53
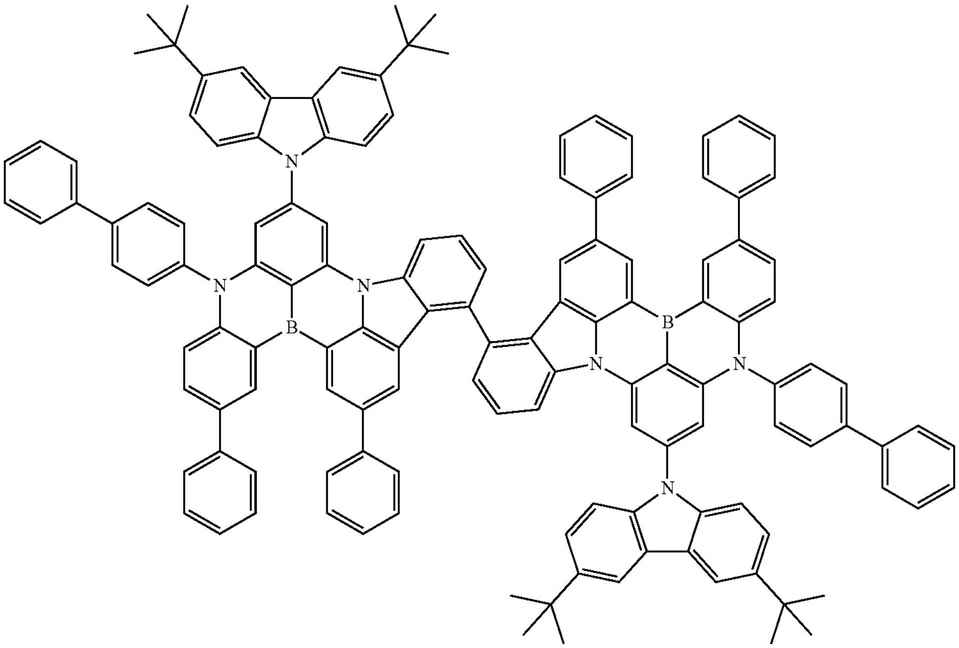
54
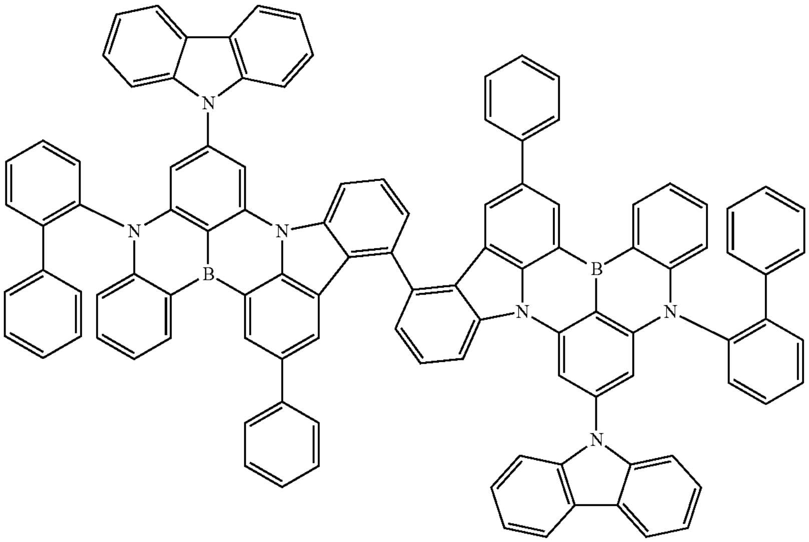
55
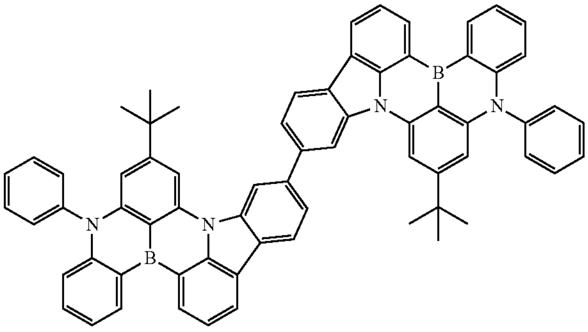
56
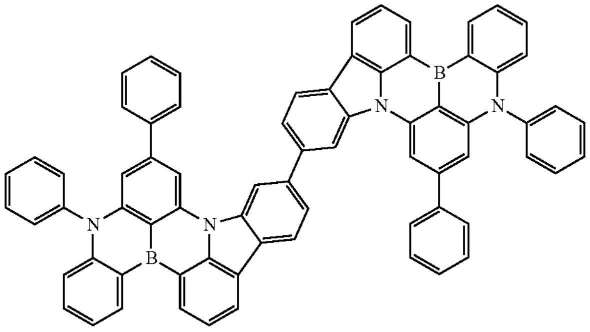

-continued
57
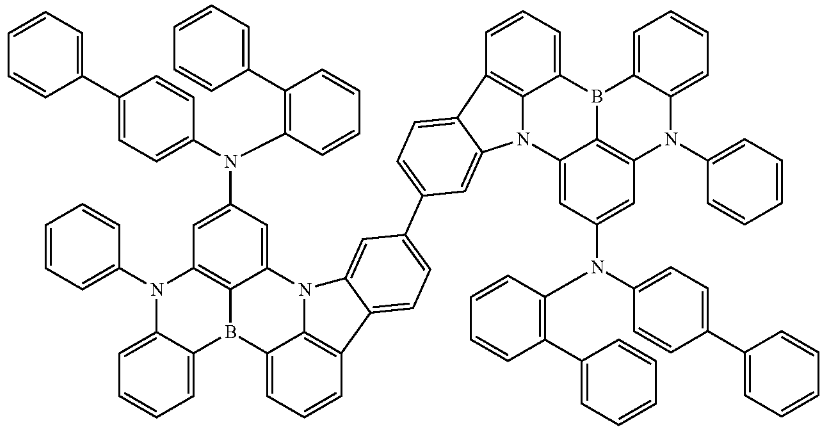
58
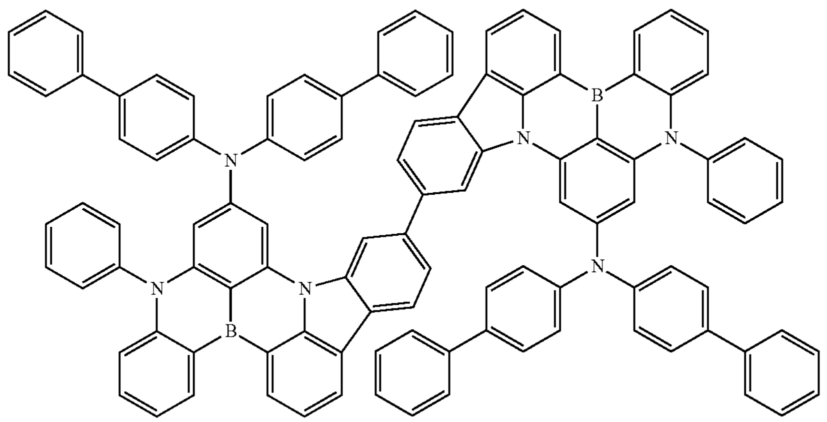
59
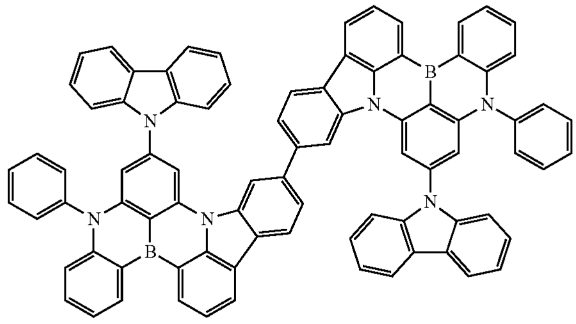
60
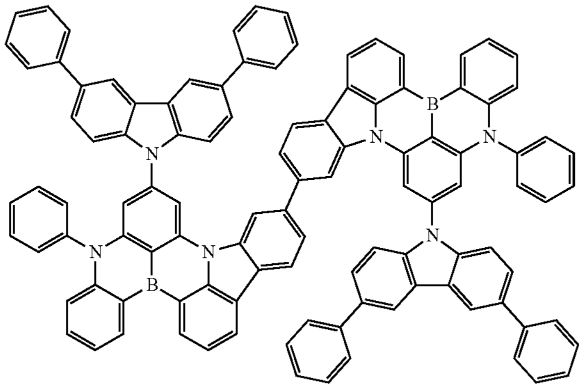

-continued
61
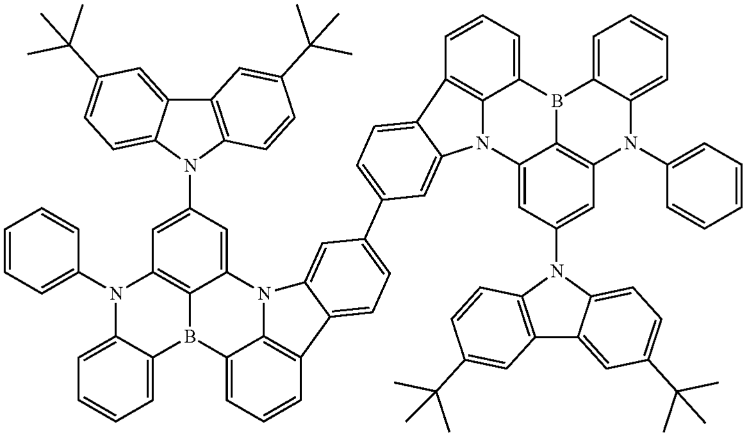
62
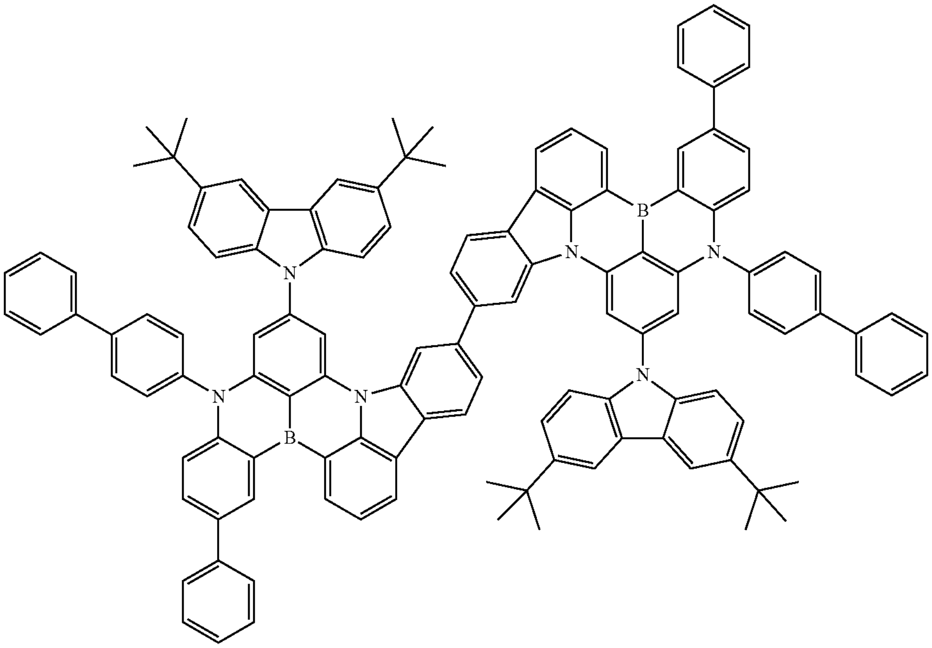
63
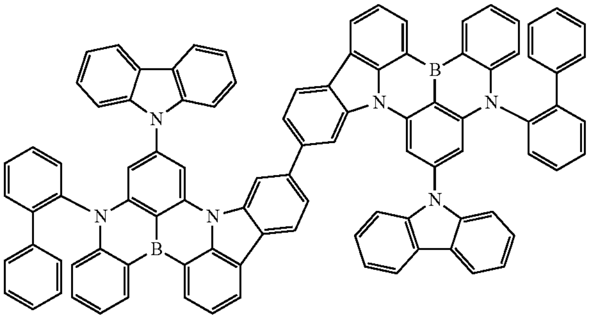
64
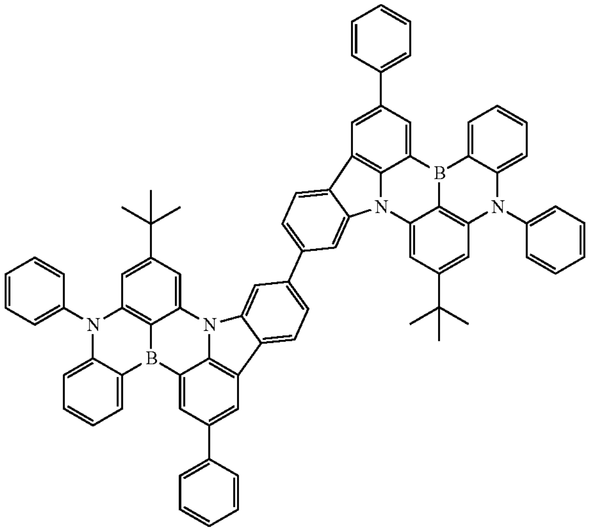

-continued
65
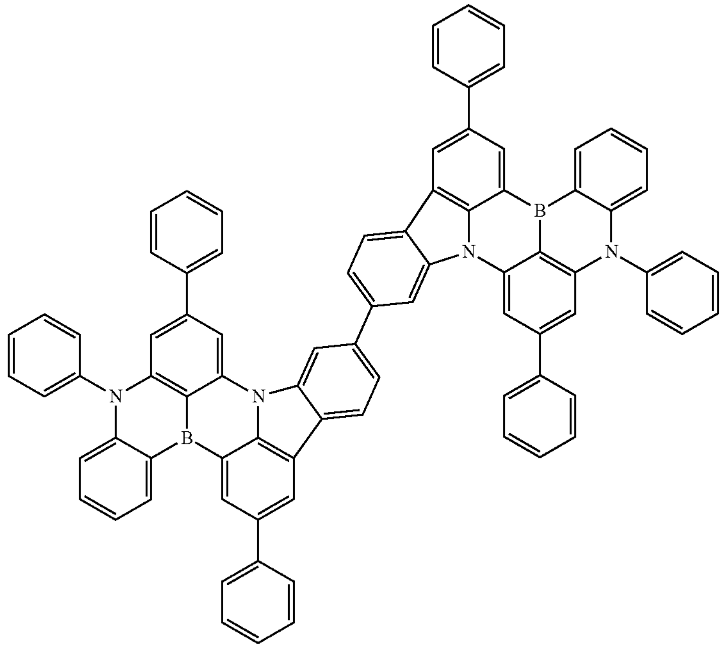
66
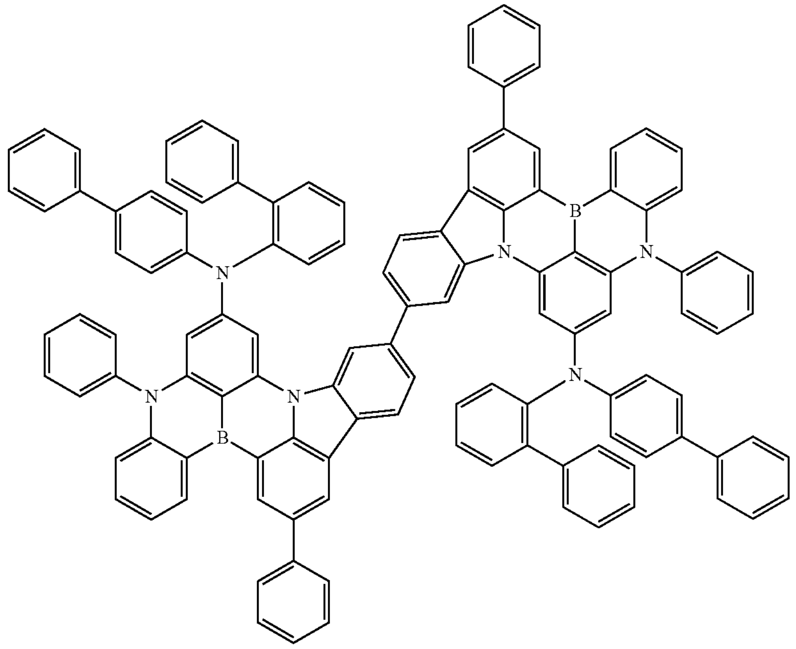

-continued
67
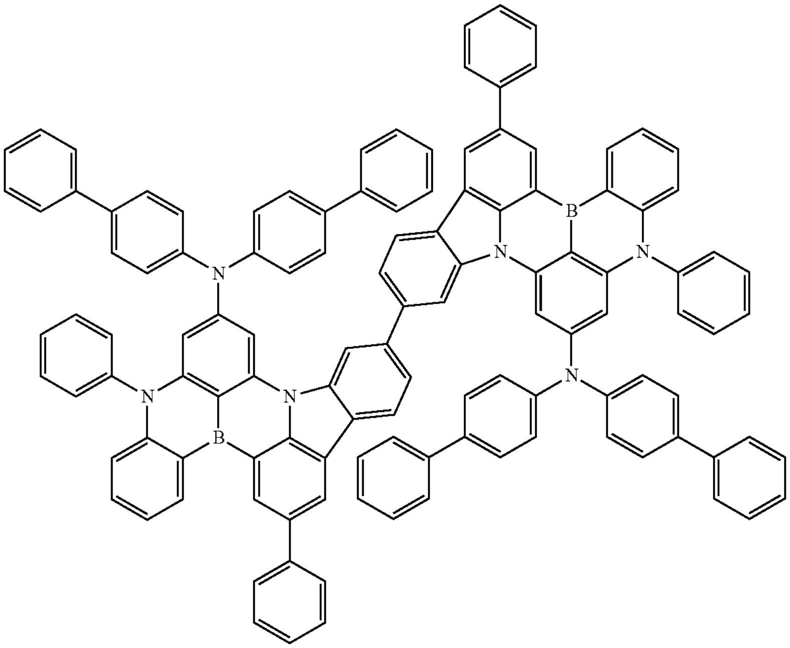
68
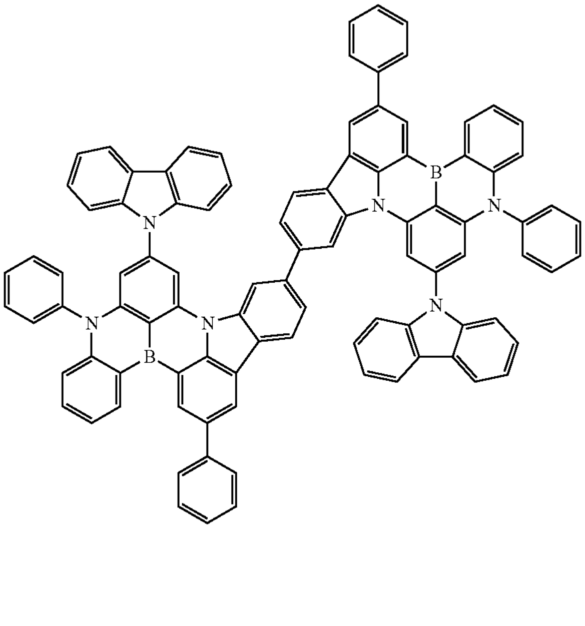
69
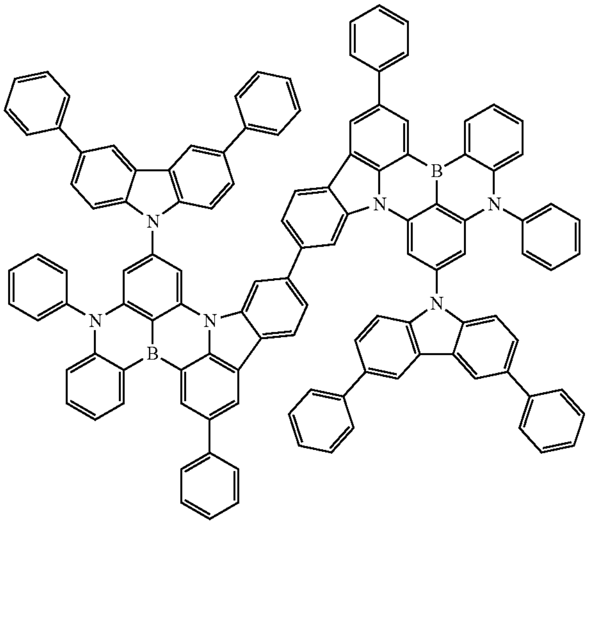

-continued
70
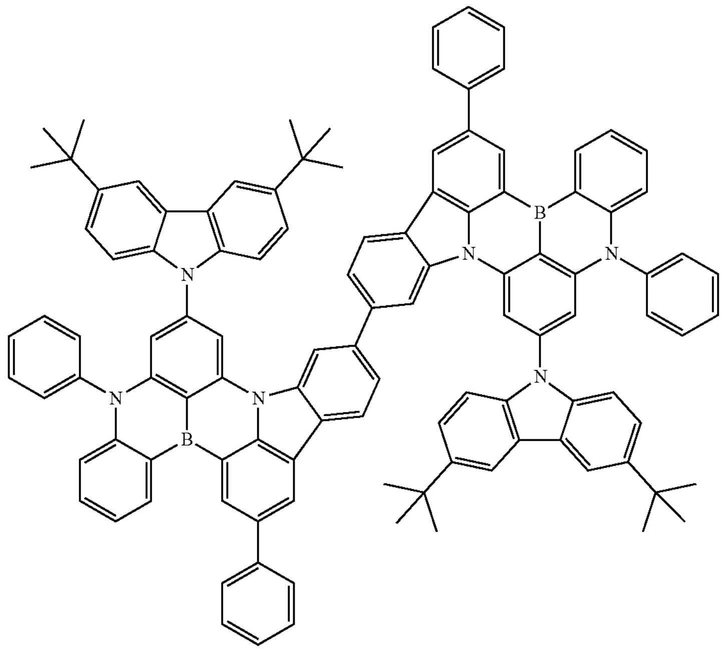
71
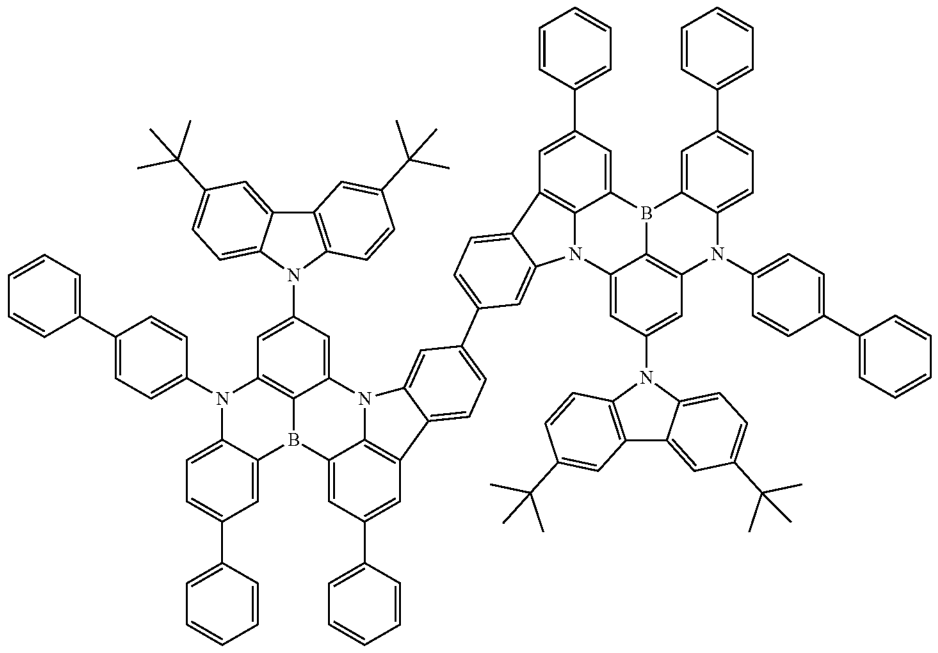

-continued
72
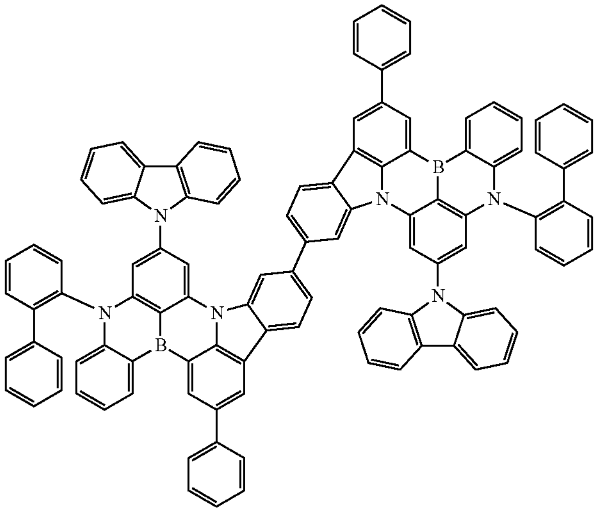
73
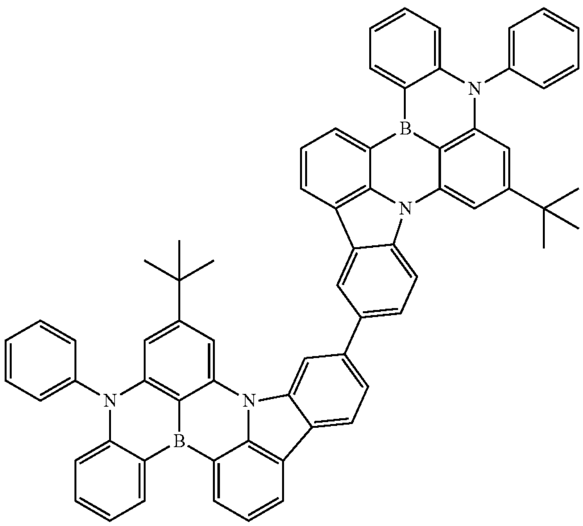
74
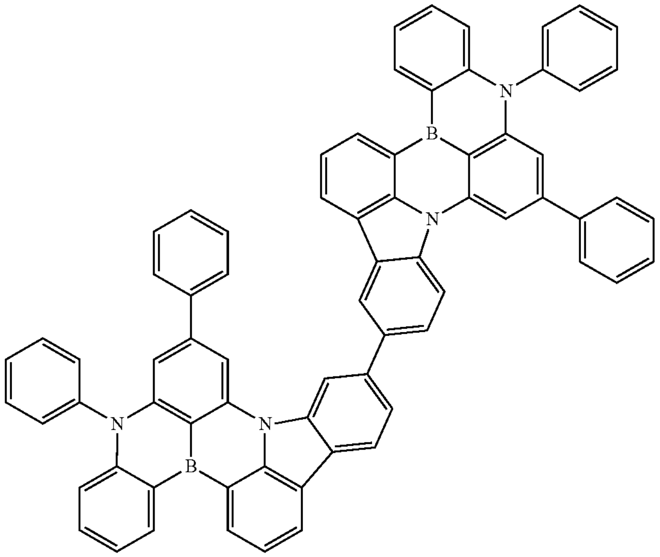
75
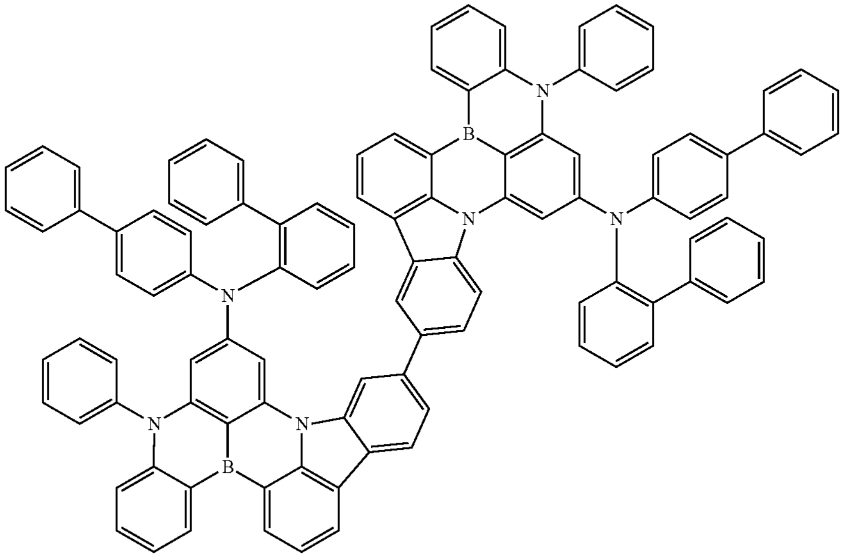

-continued
76
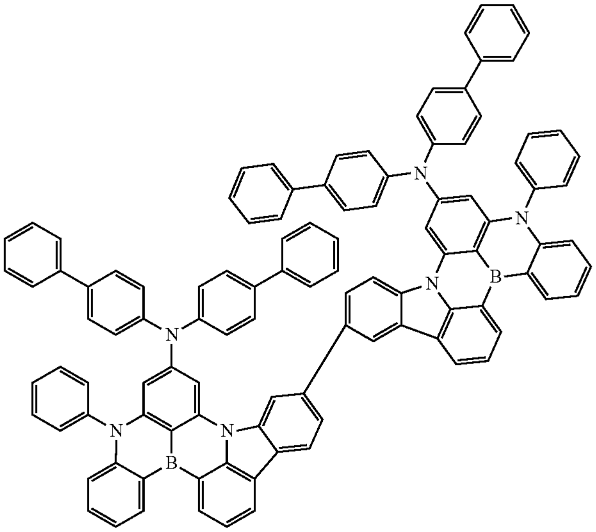
77
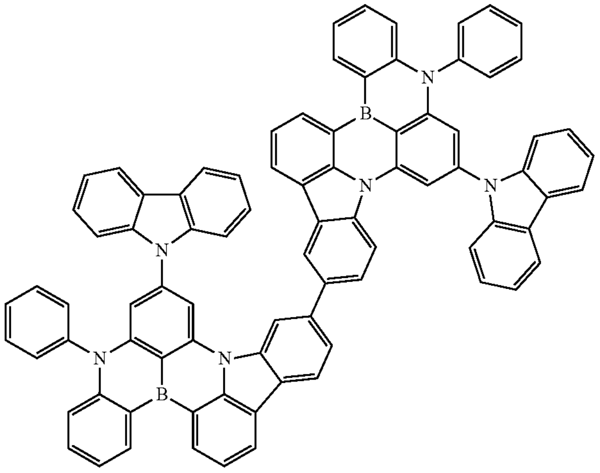
78
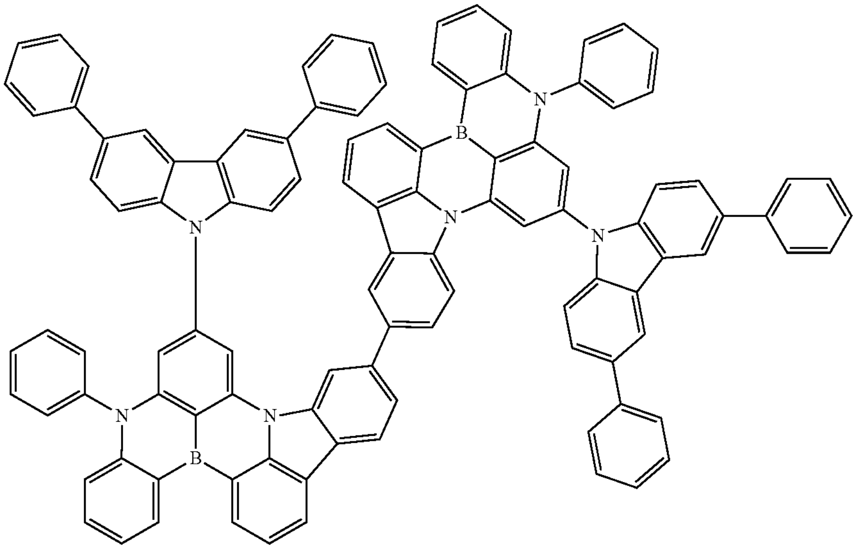

-continued
79
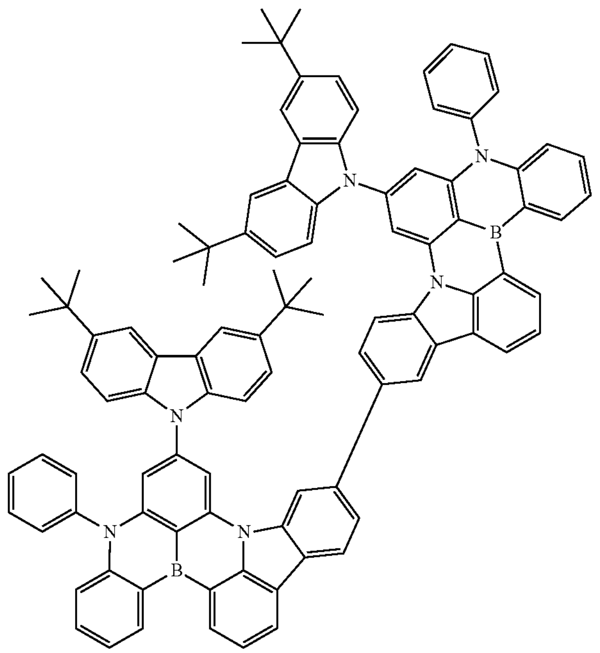
80
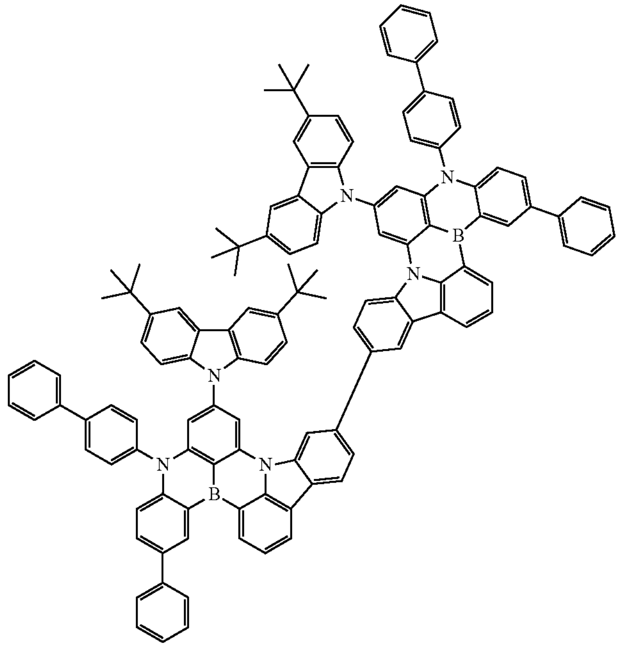

-continued
81
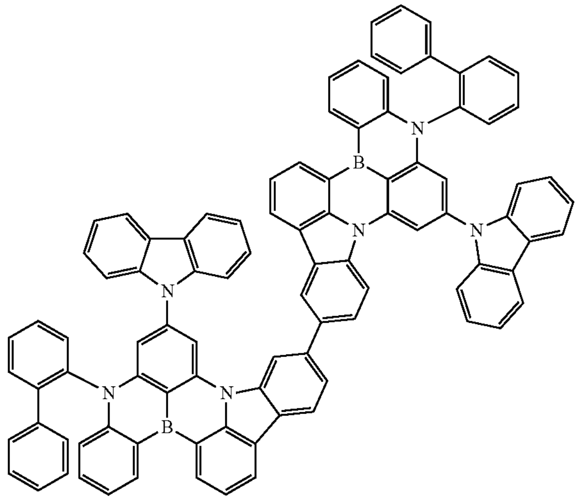
82
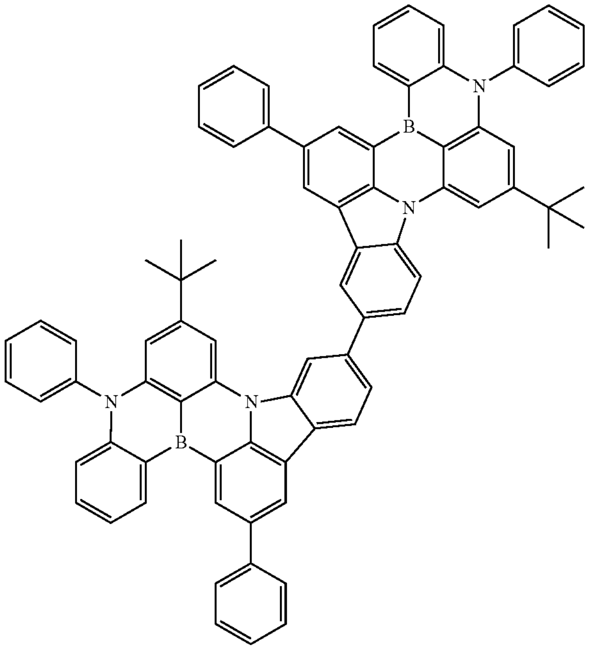
83
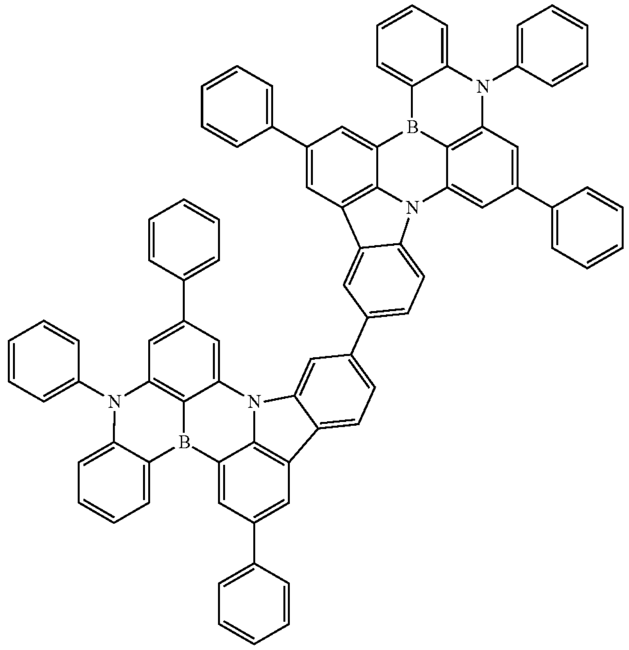

-continued
84
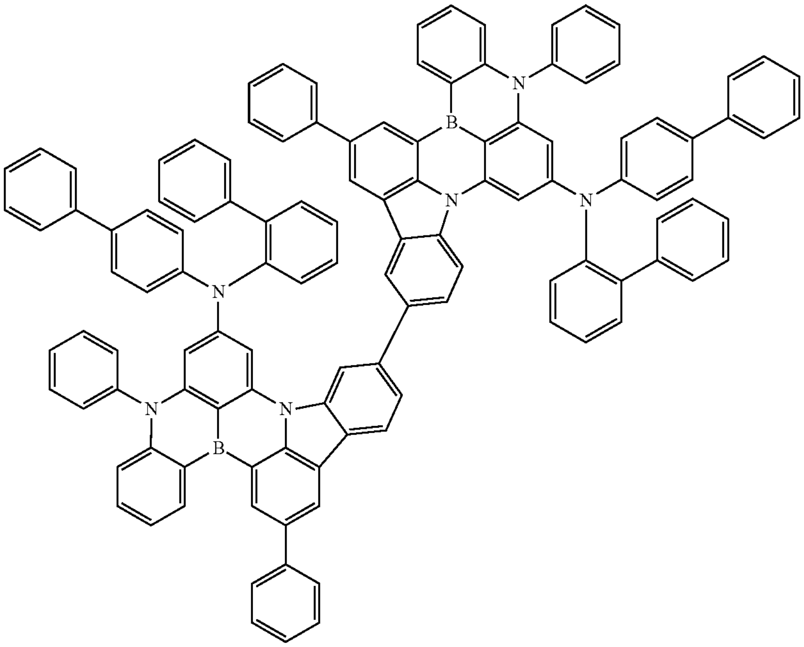
85
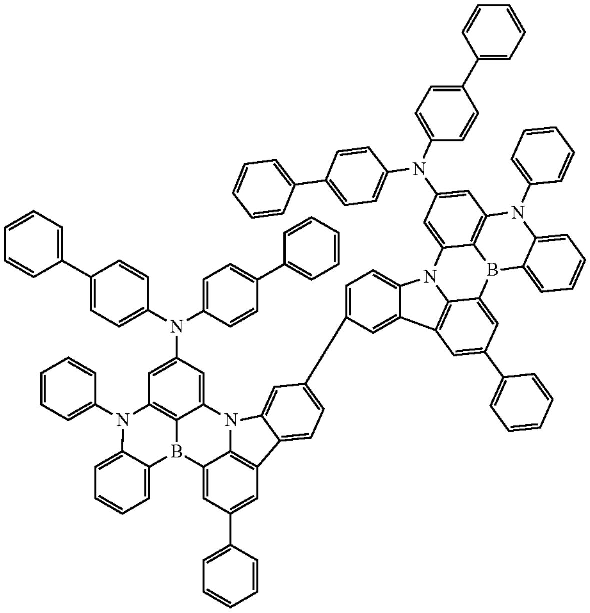
86
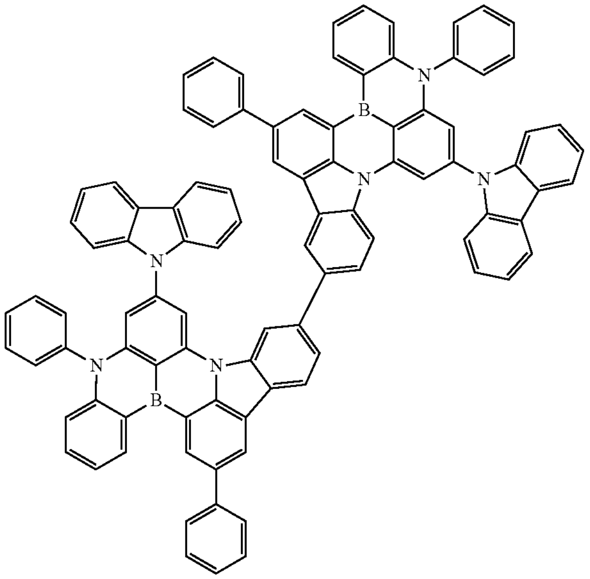

-continued
87
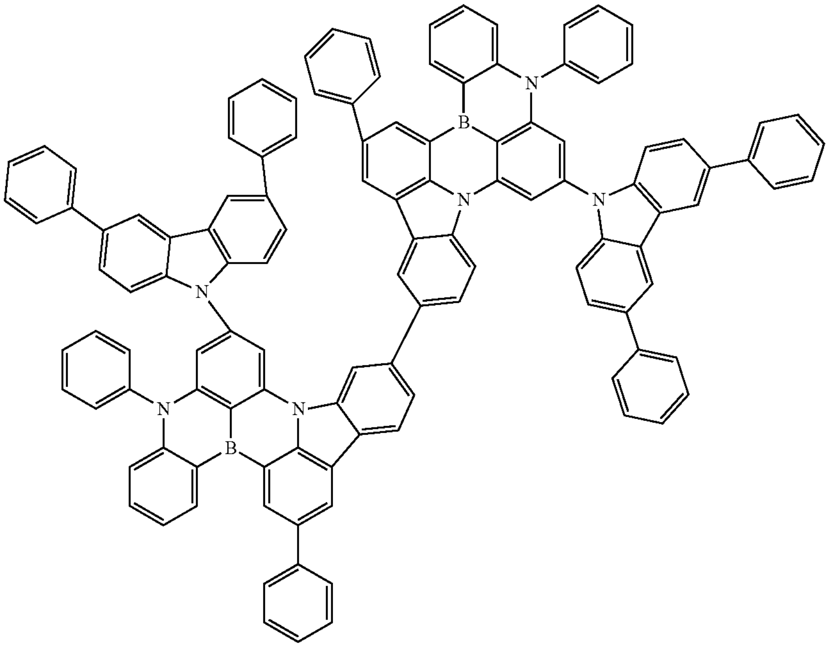
88
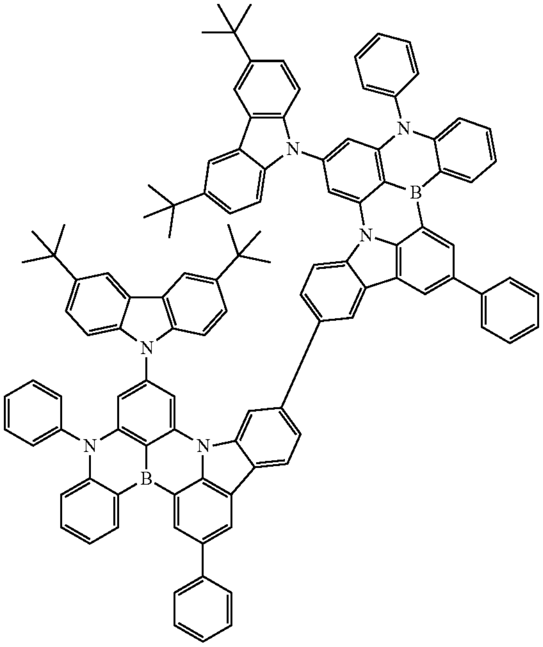
89
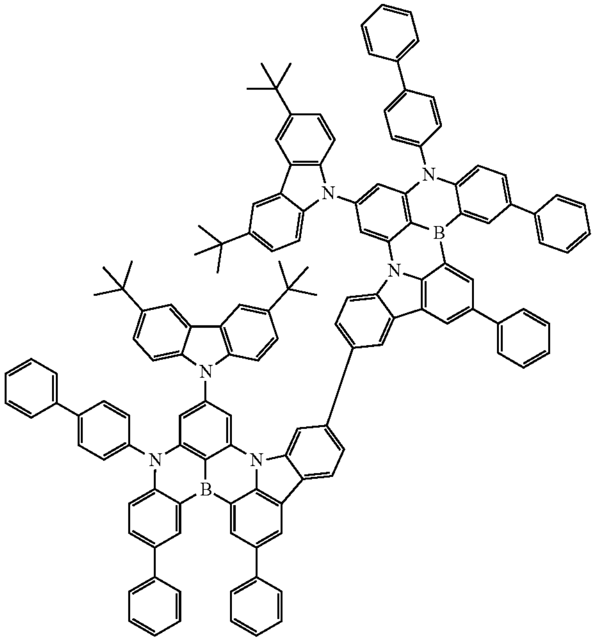

-continued
90
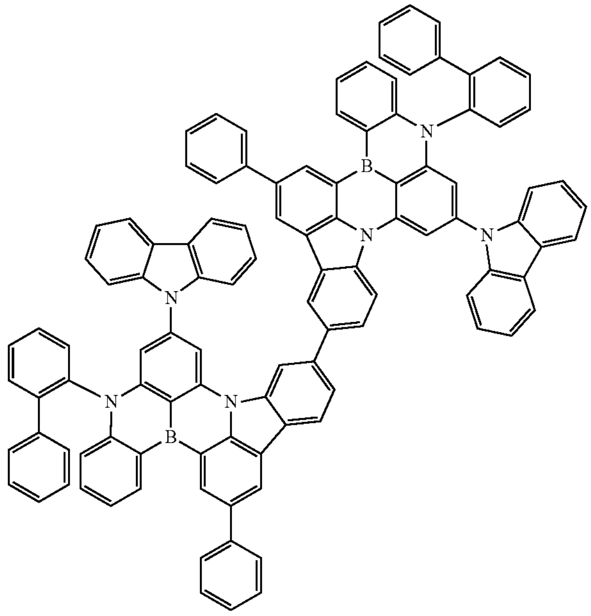
91
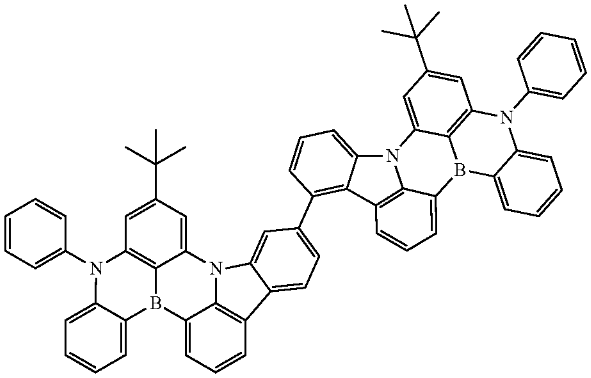
92
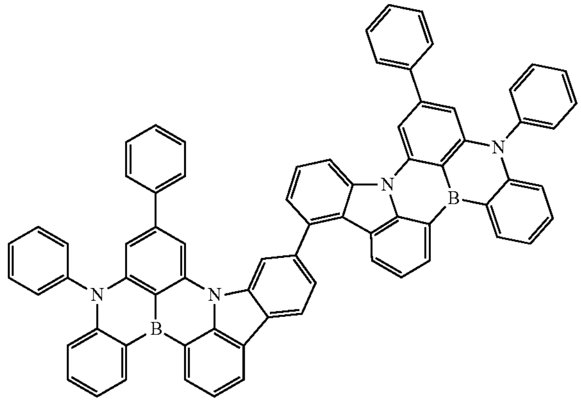
93
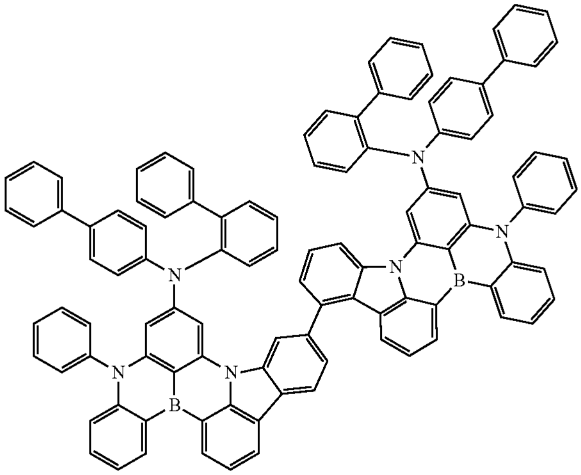
94
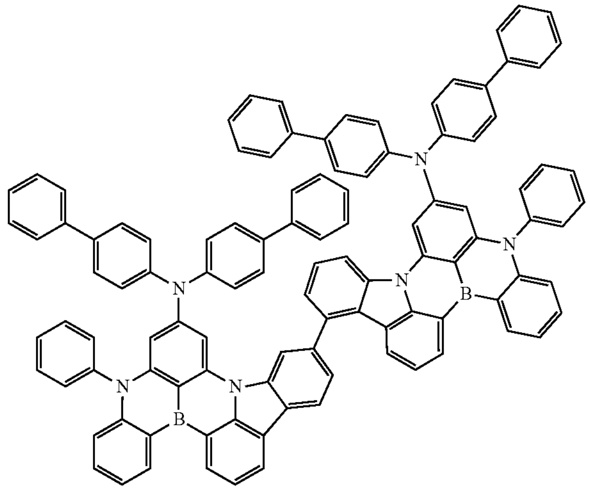
95
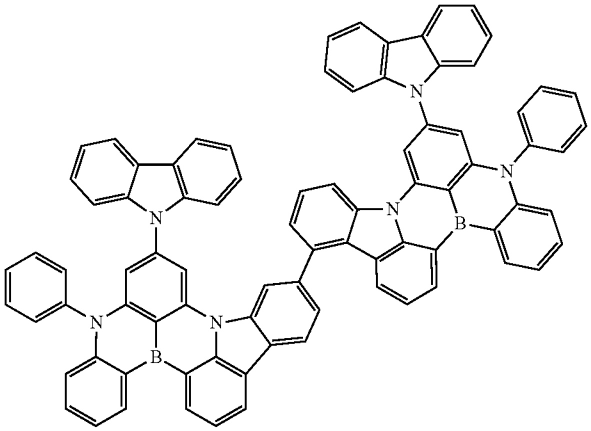

-continued
96
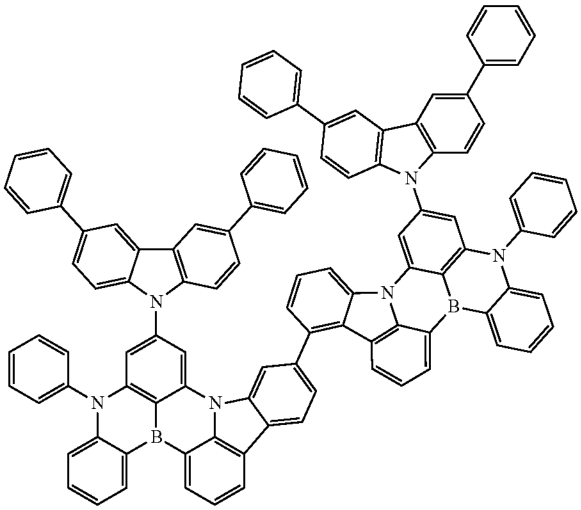
97
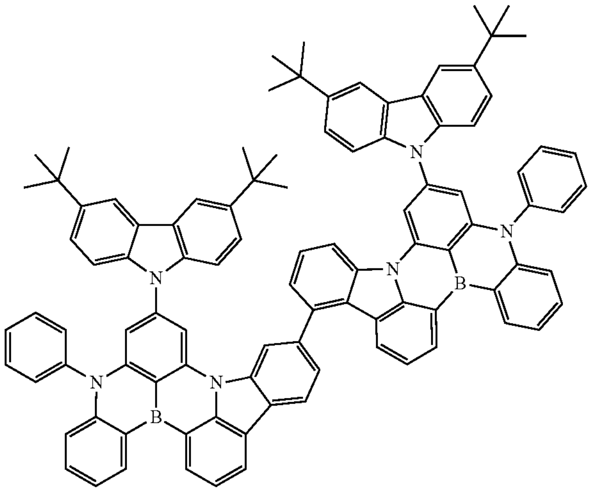
98
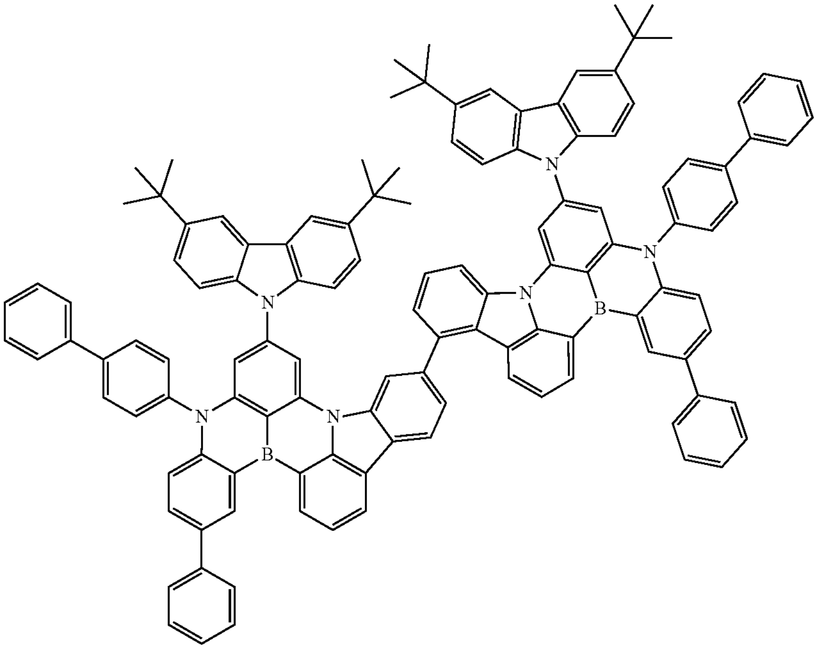

-continued
99
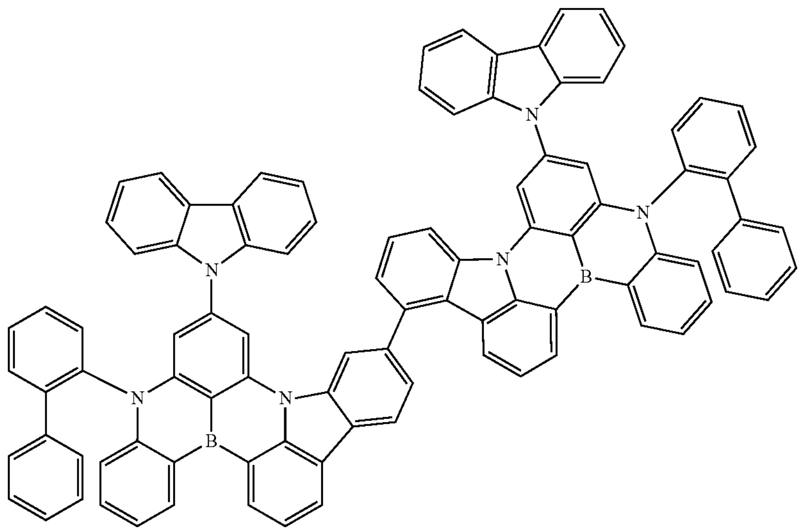
100
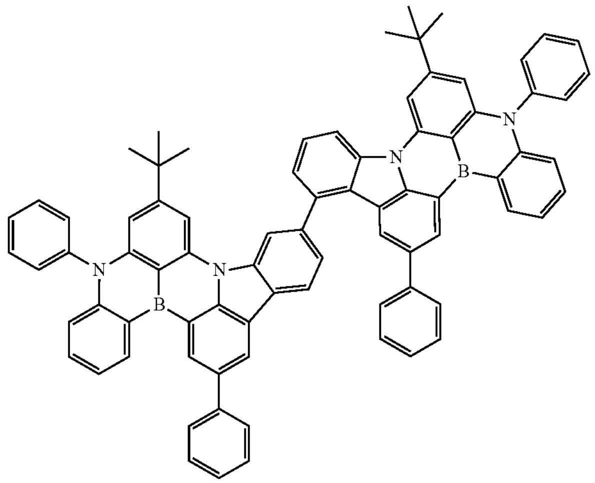
101
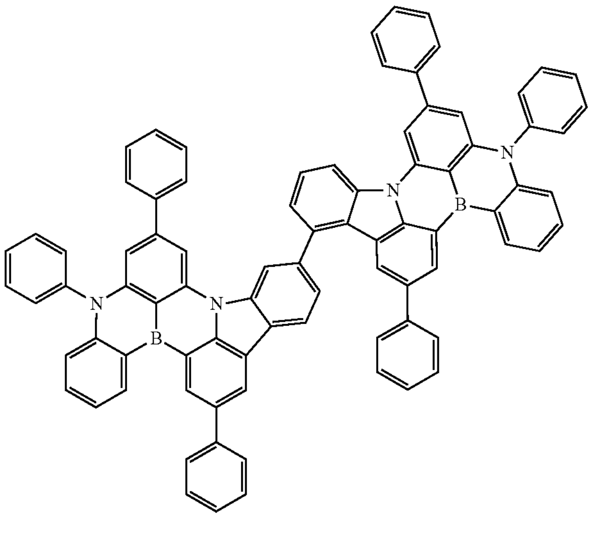

-continued
102
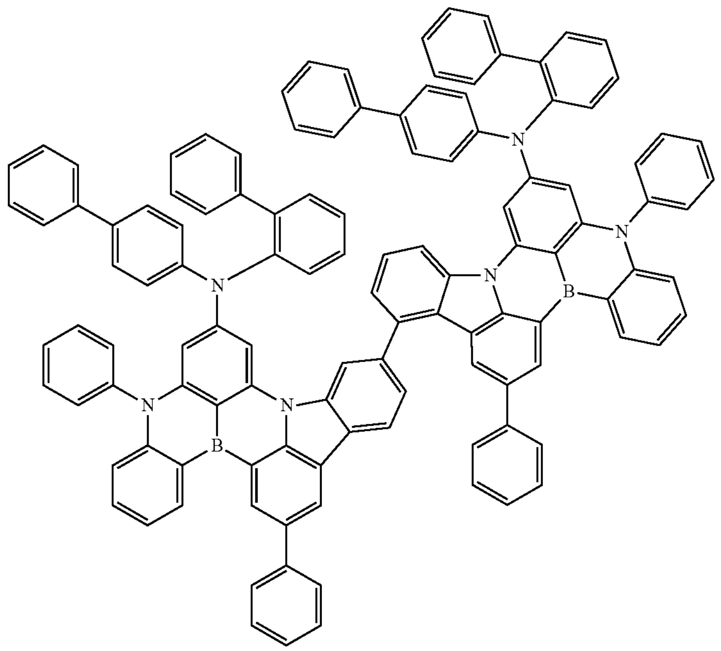
103
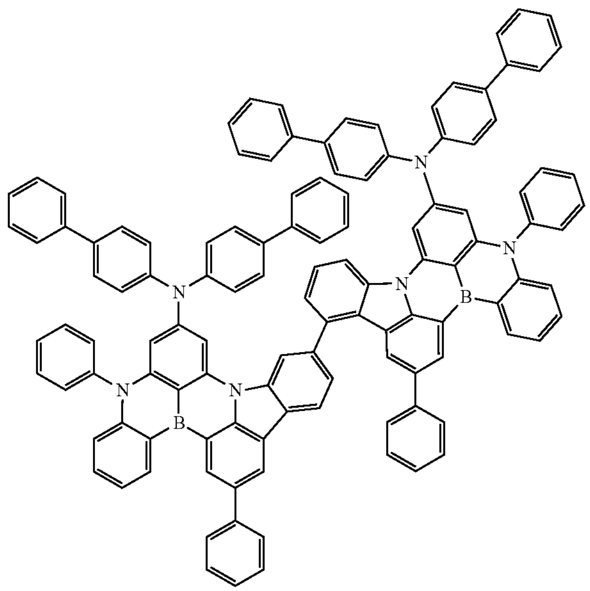
104
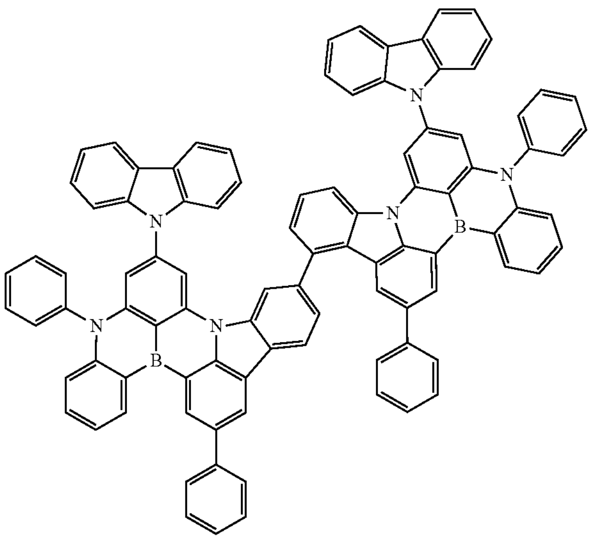

-continued
105
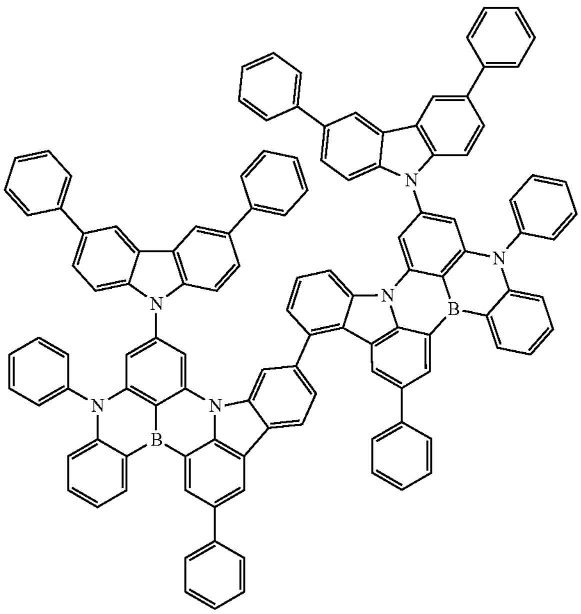
106
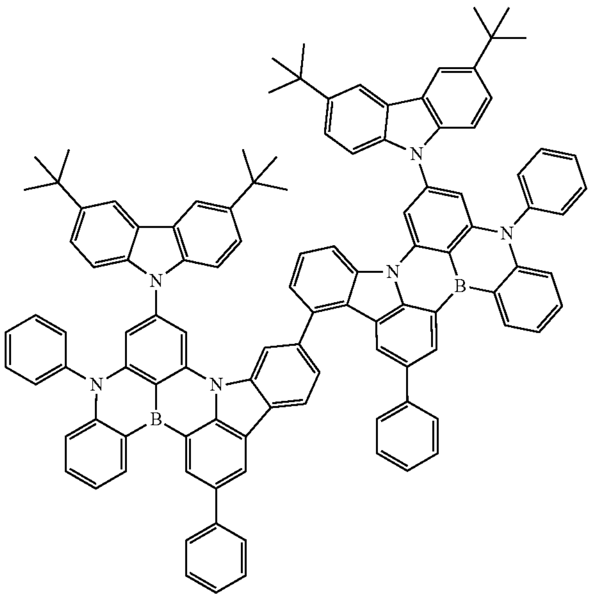
107
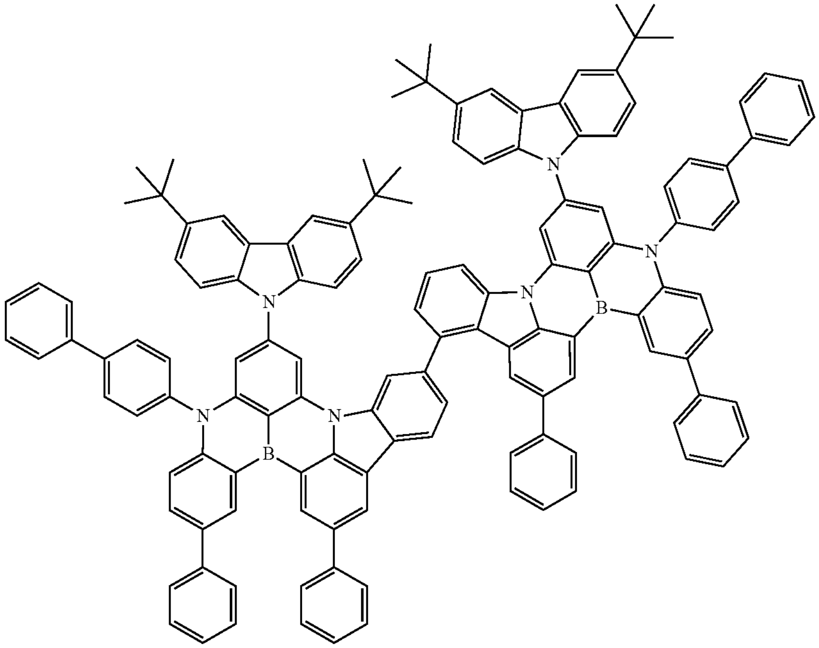

-continued
108
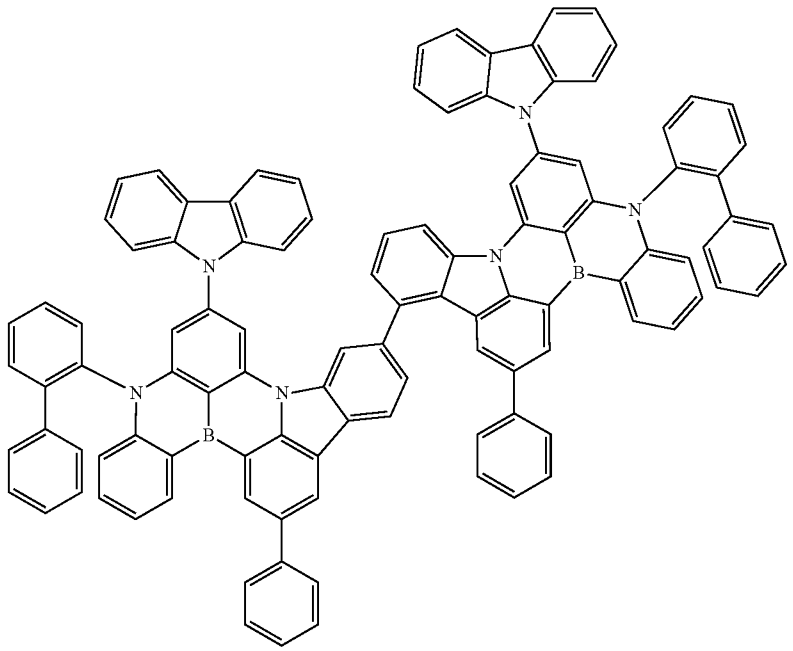
109
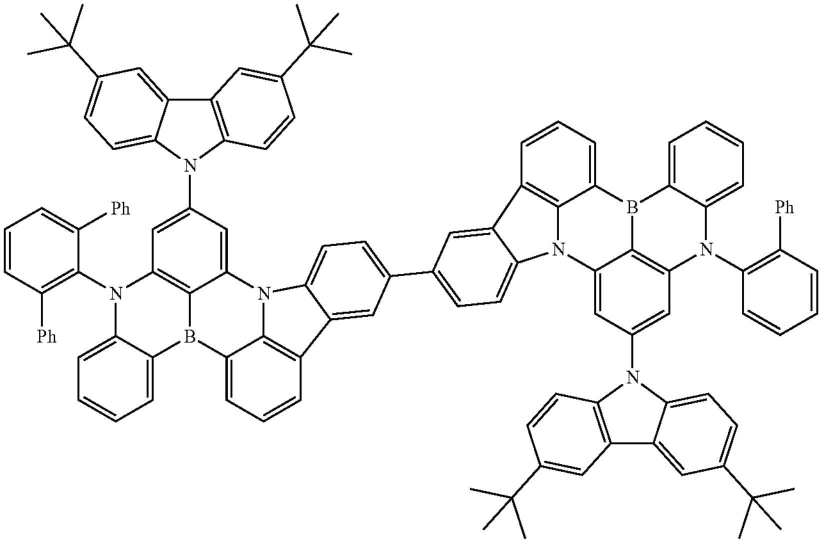

-continued
110
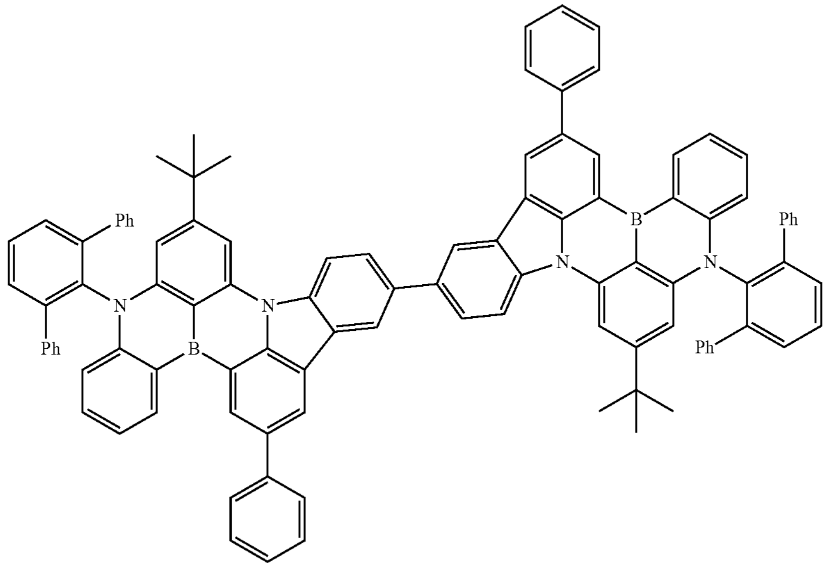
111
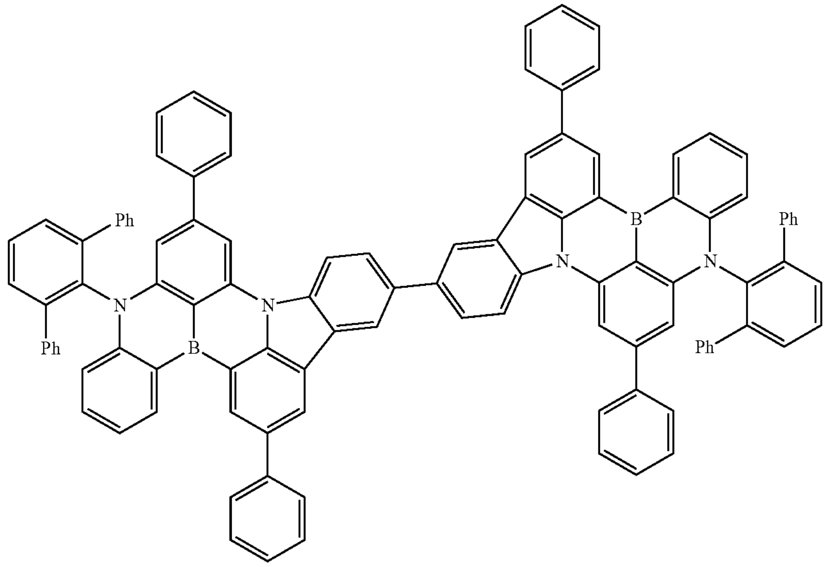
112
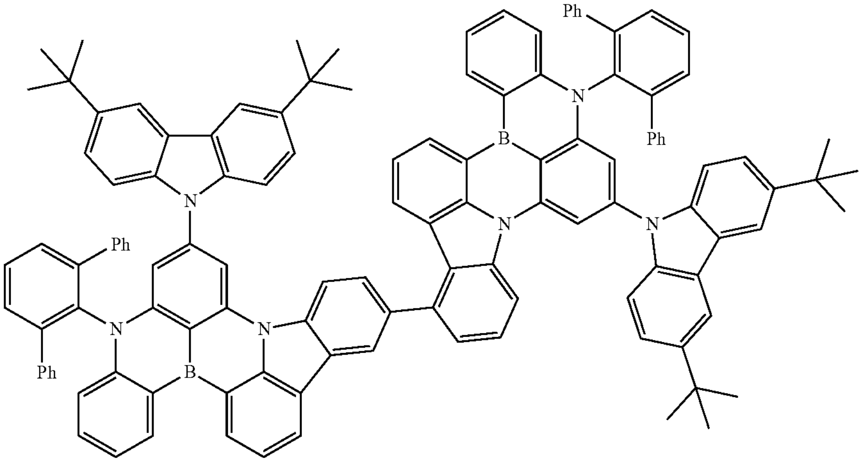

-continued
113
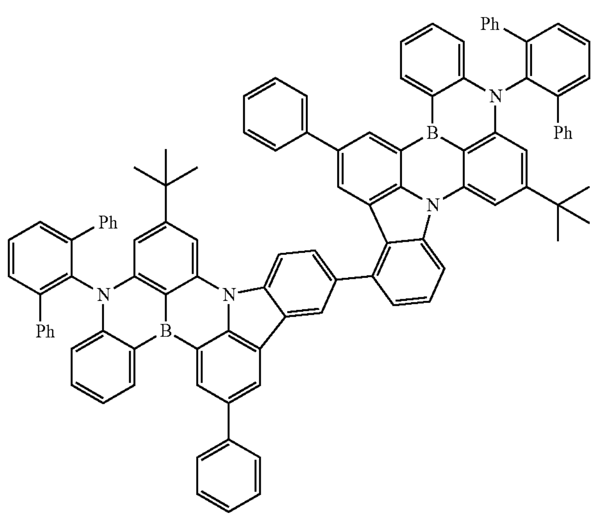
114
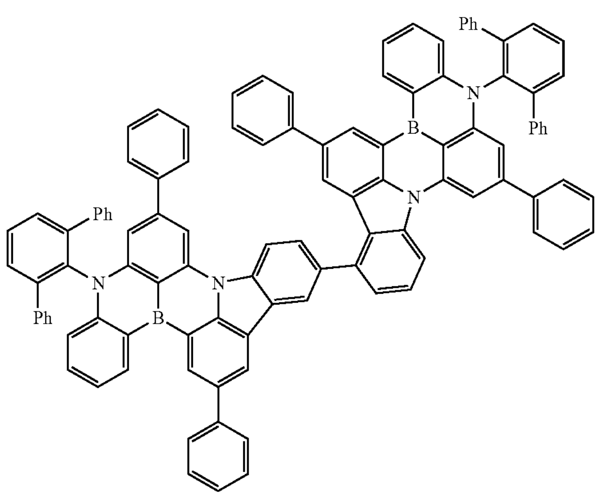
115
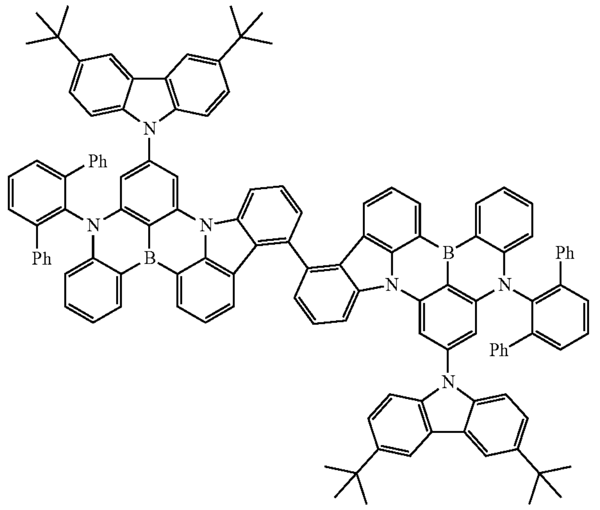
116
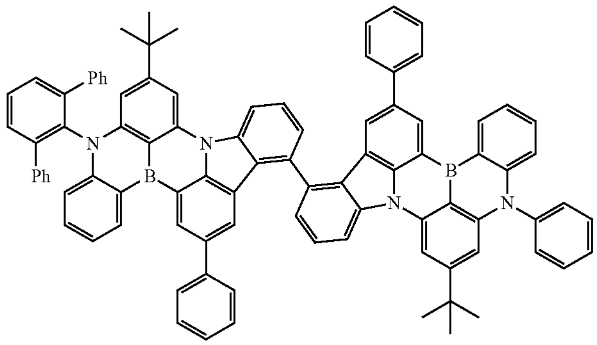
117
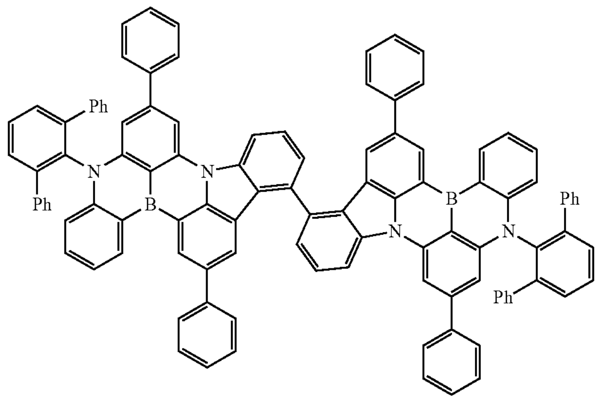
118
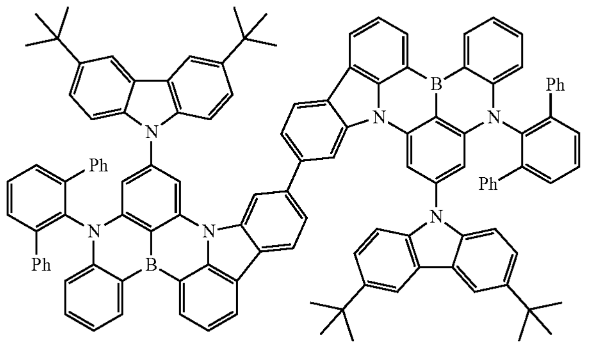

-continued
119
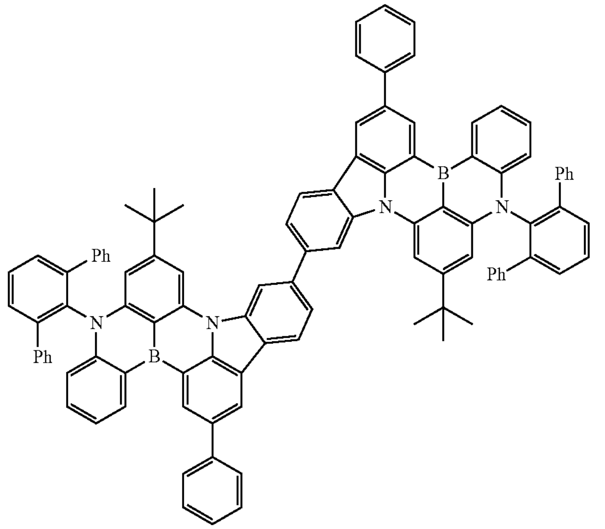
120
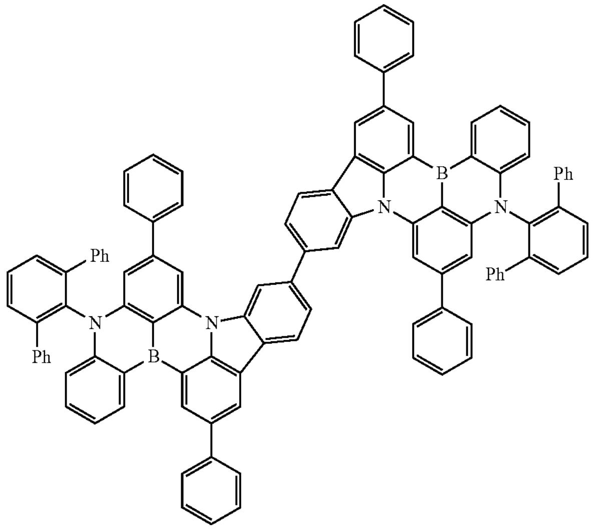
121
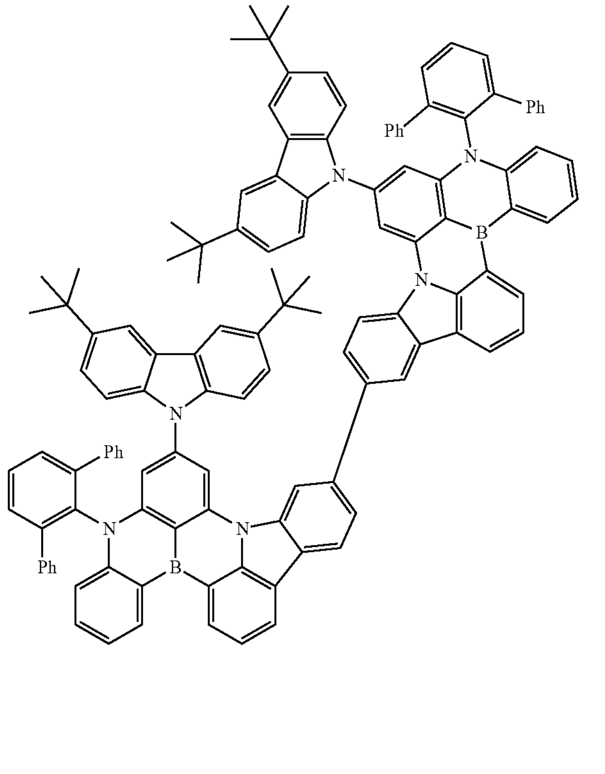
122
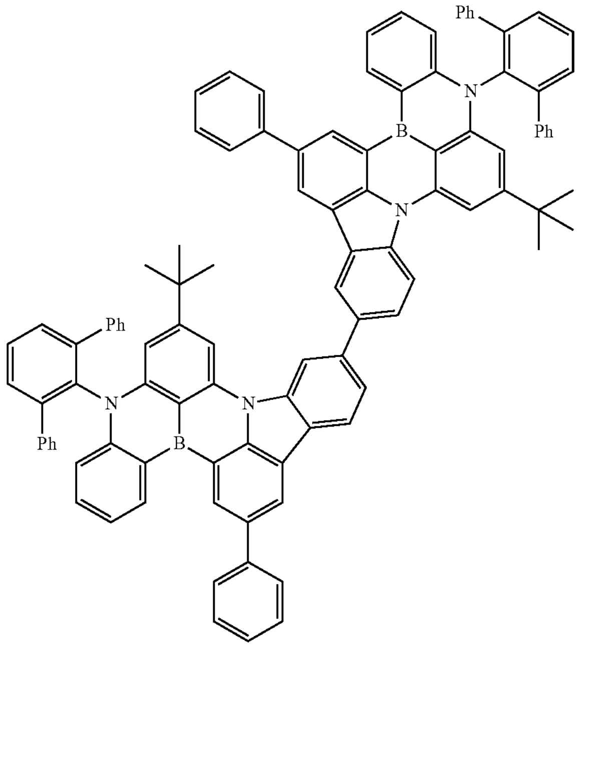

-continued
123
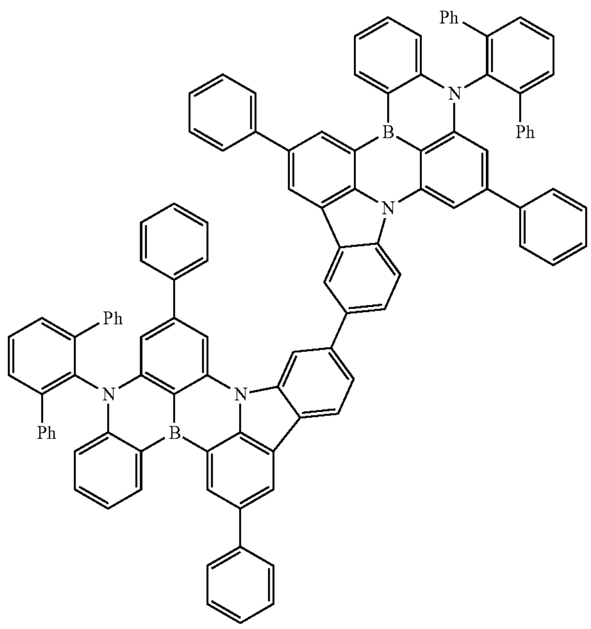
124
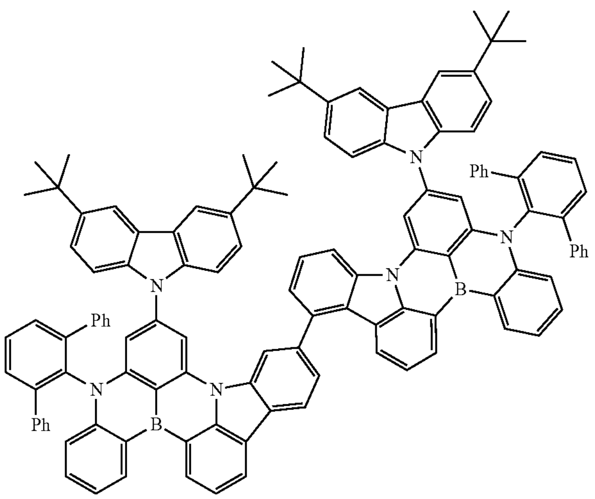
125
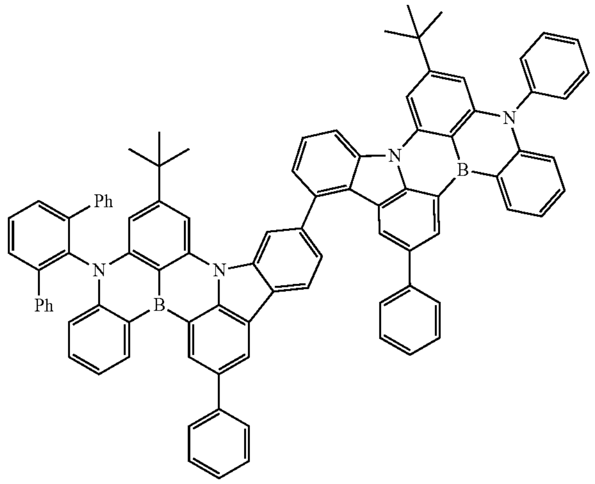
126
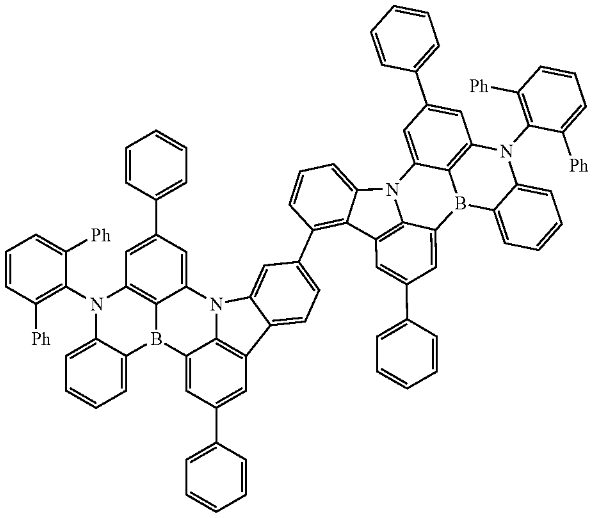
127
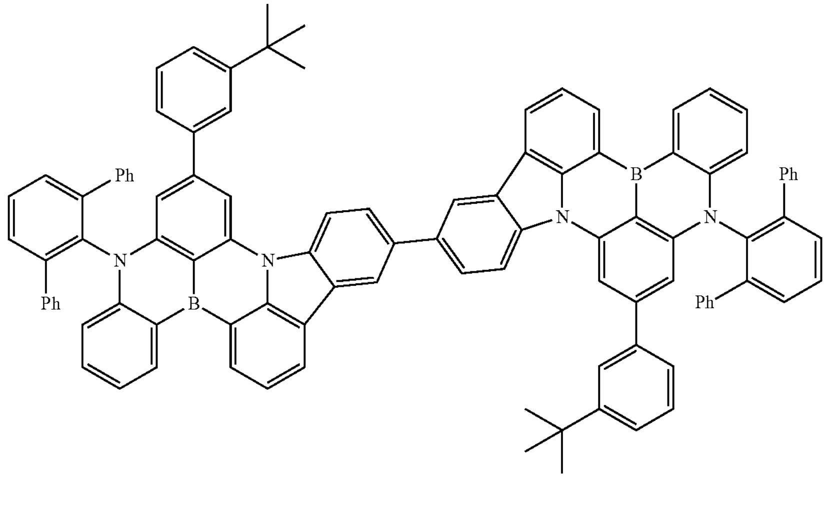

-continued
128
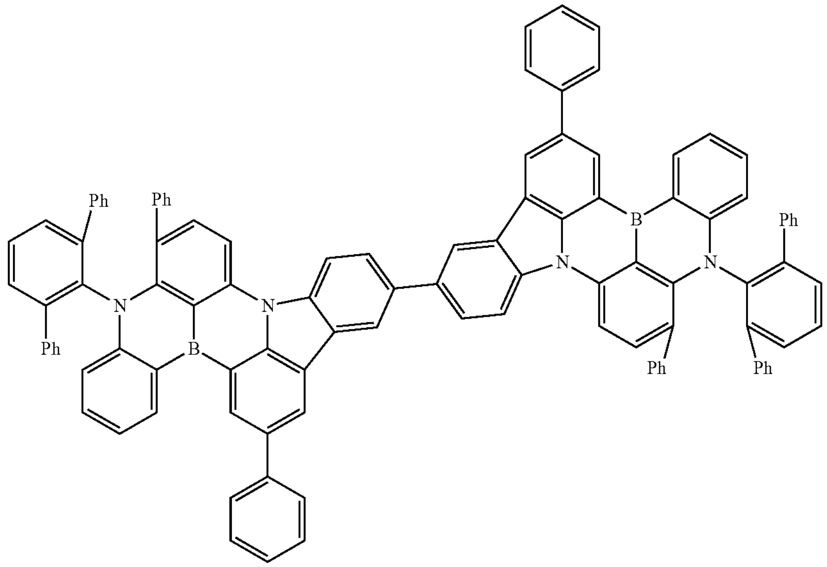
129
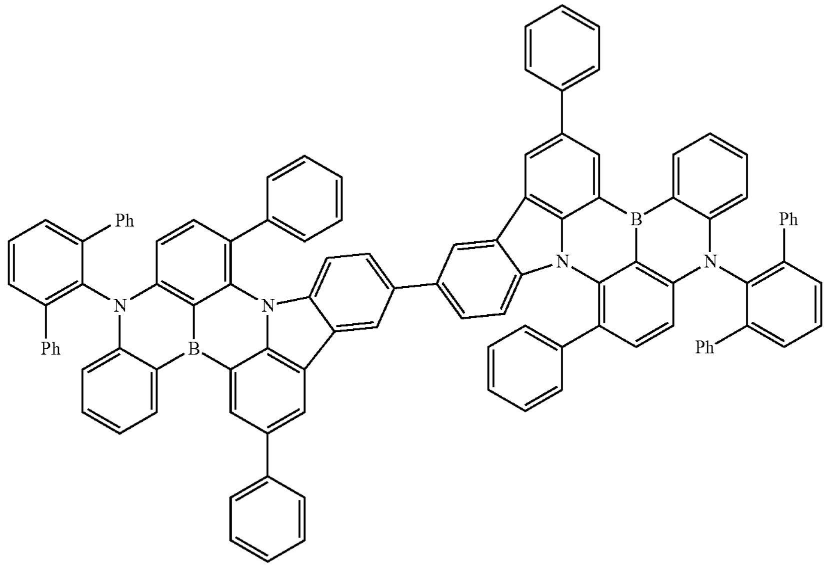
130
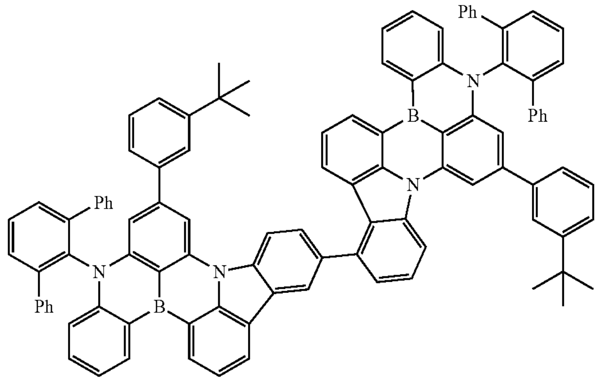
131
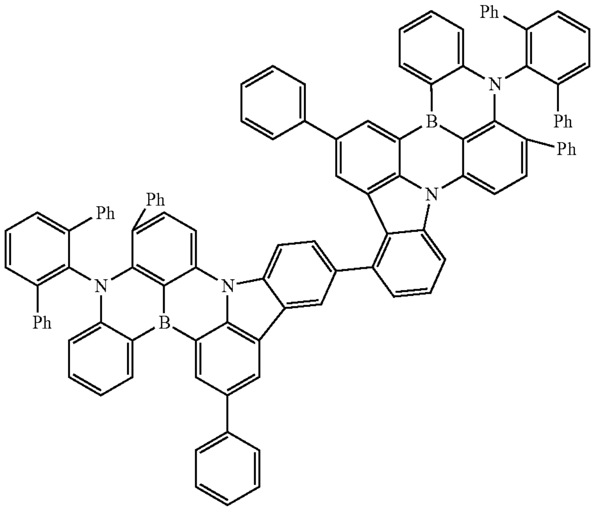

-continued
132
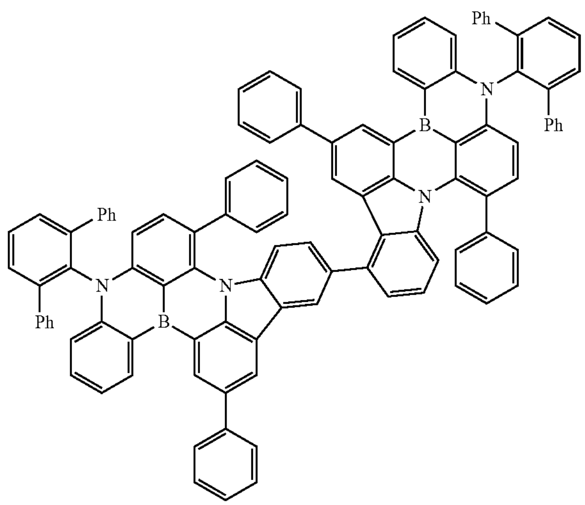
133
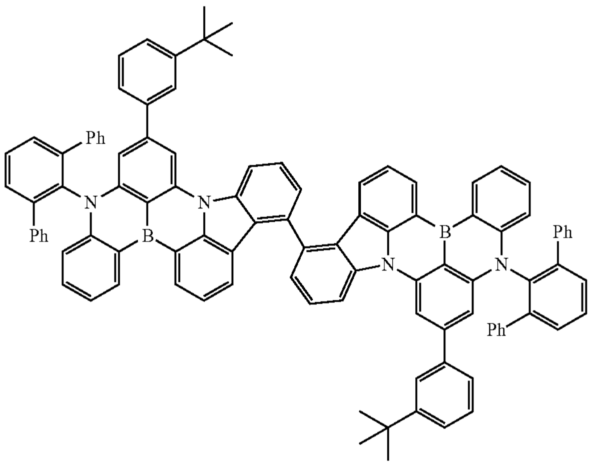
134
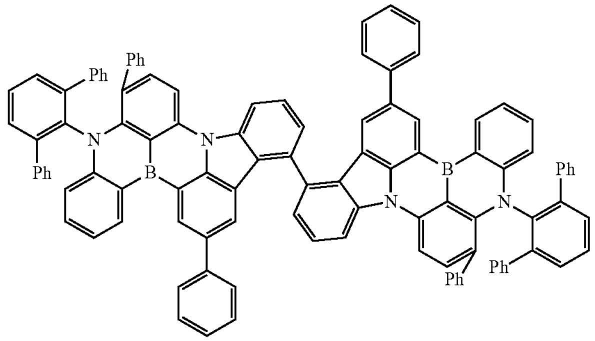
135
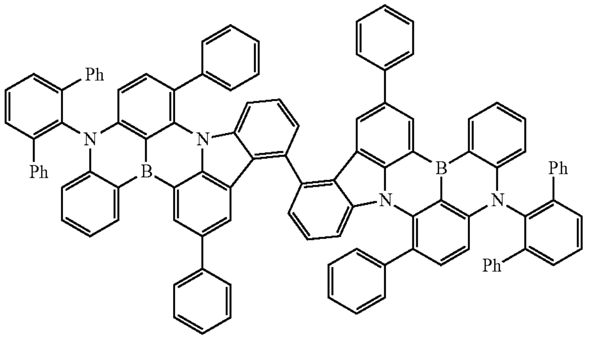
136
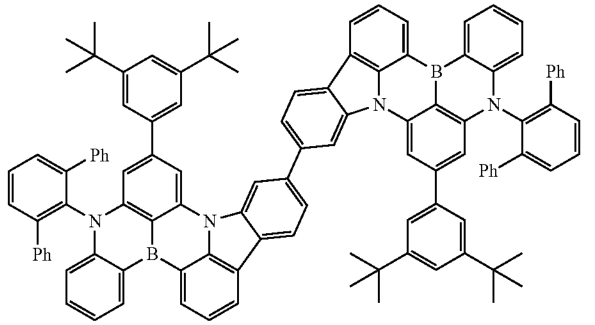
137
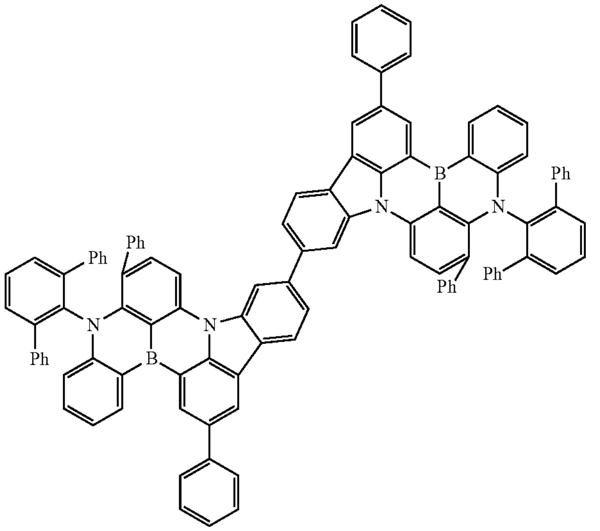

-continued
138
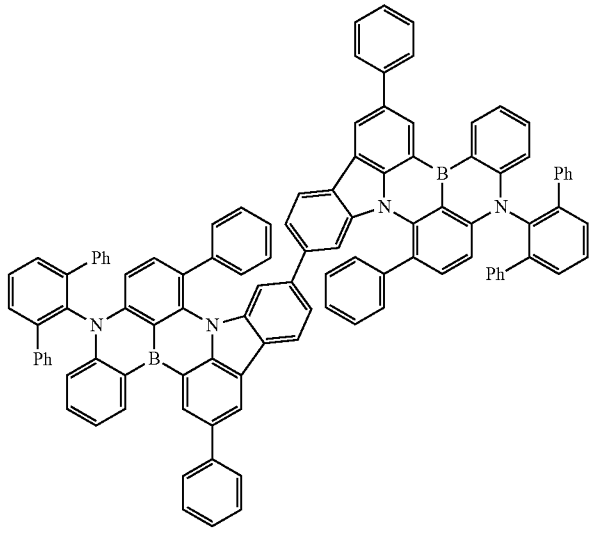
139
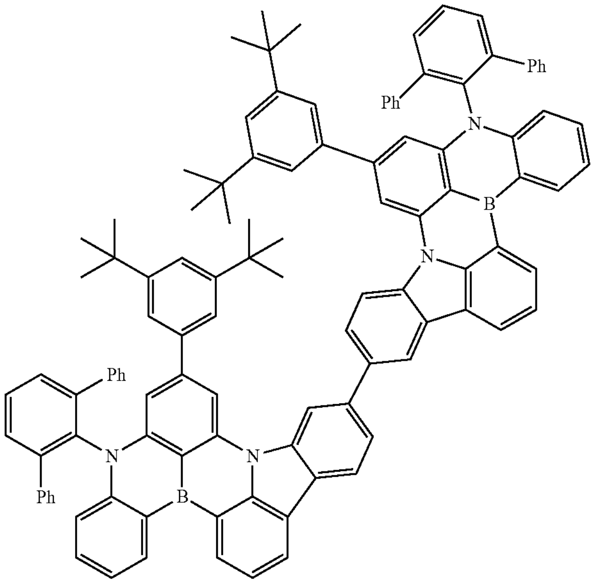
140
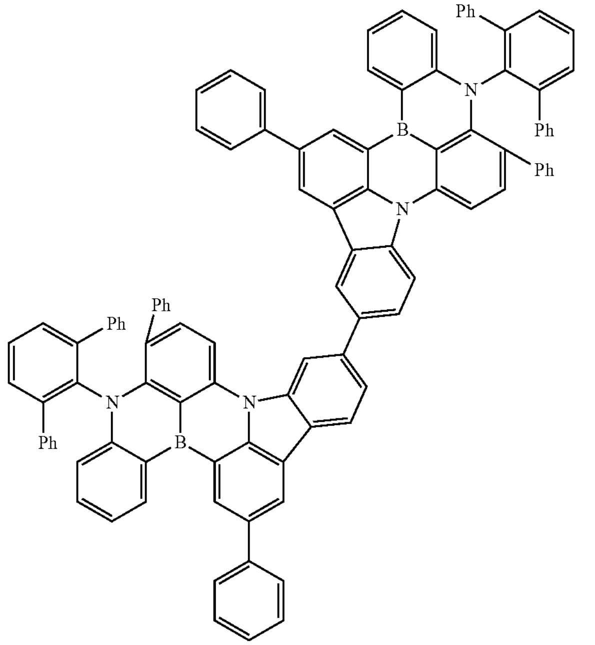
141
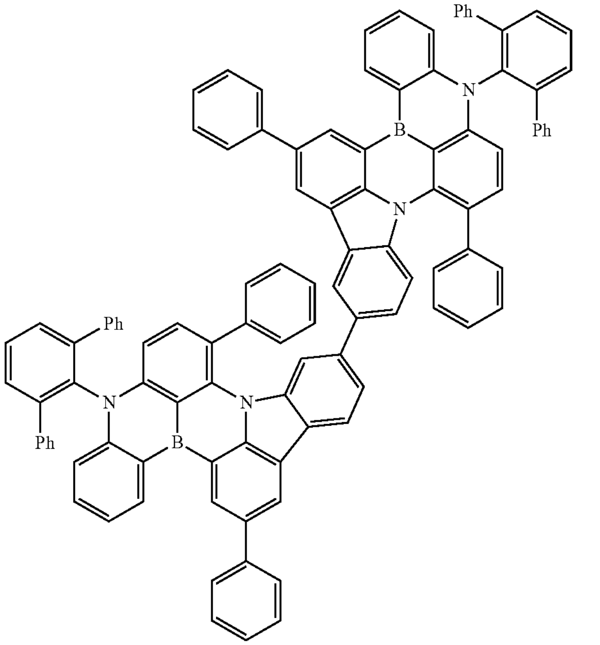

-continued
142
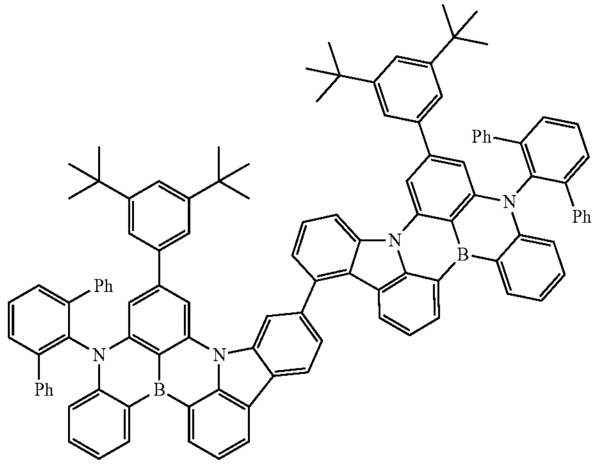
143
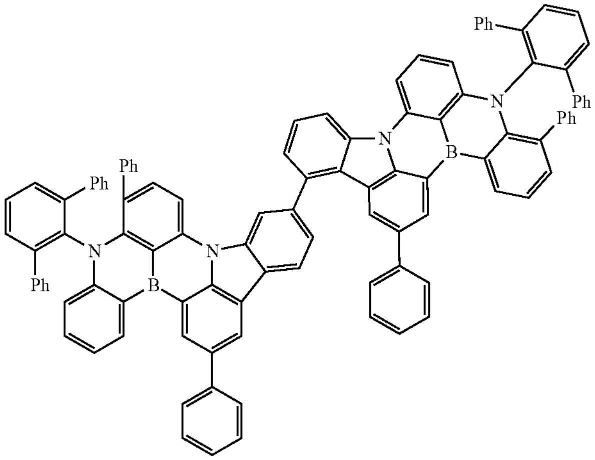
144
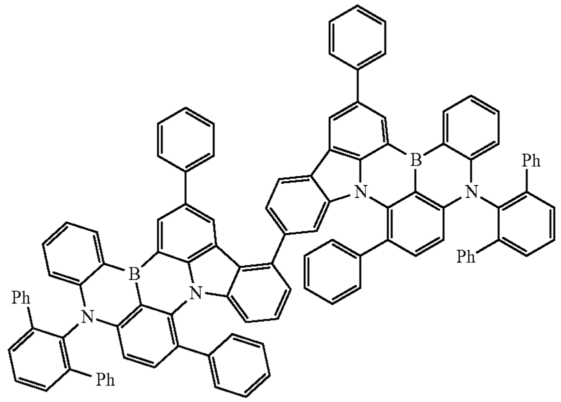
145
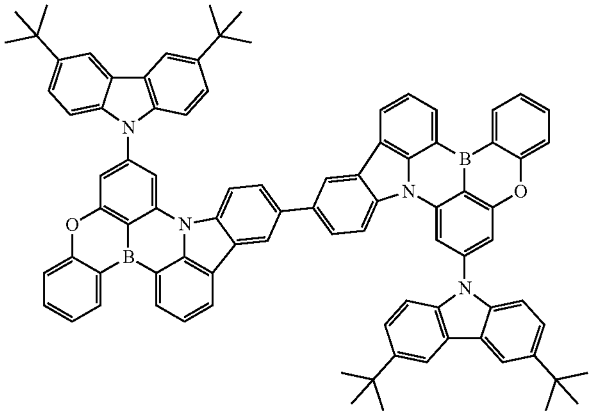
146
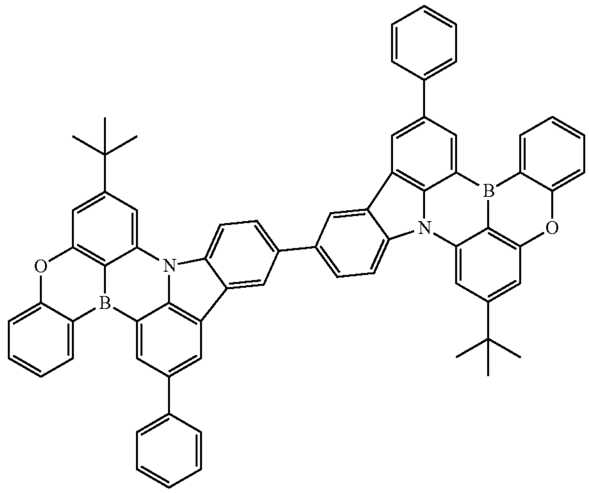
147
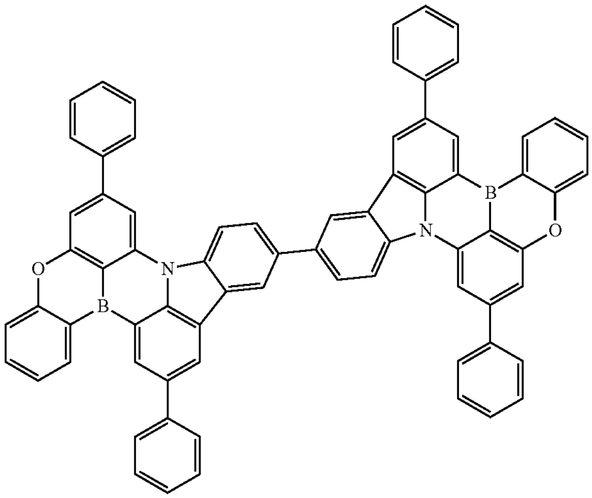

-continued
148
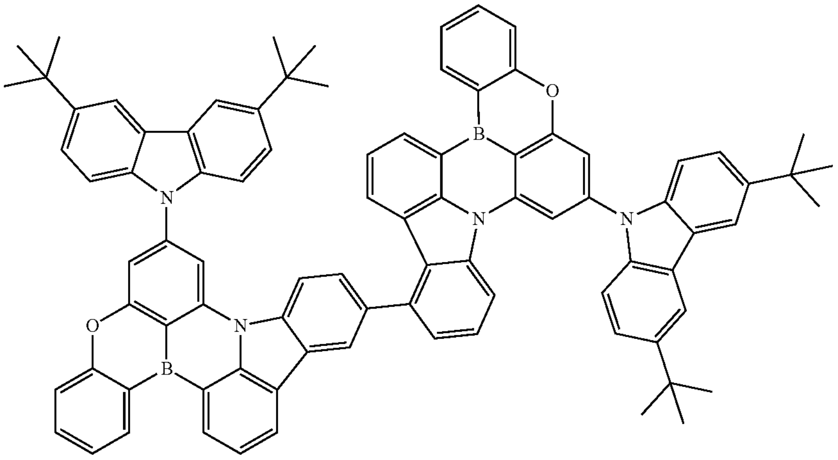
149
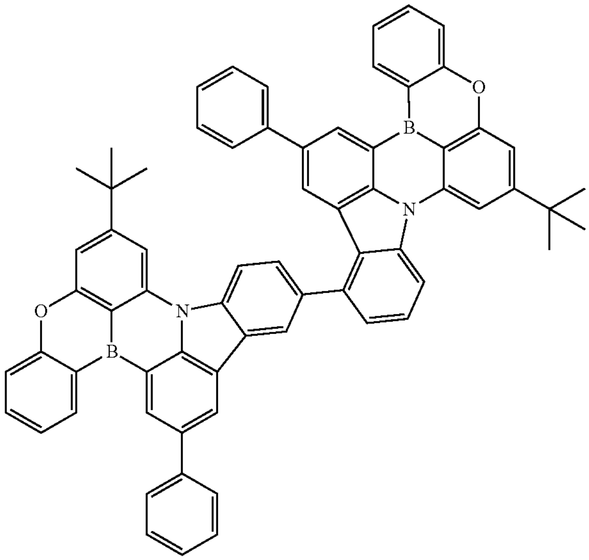
150
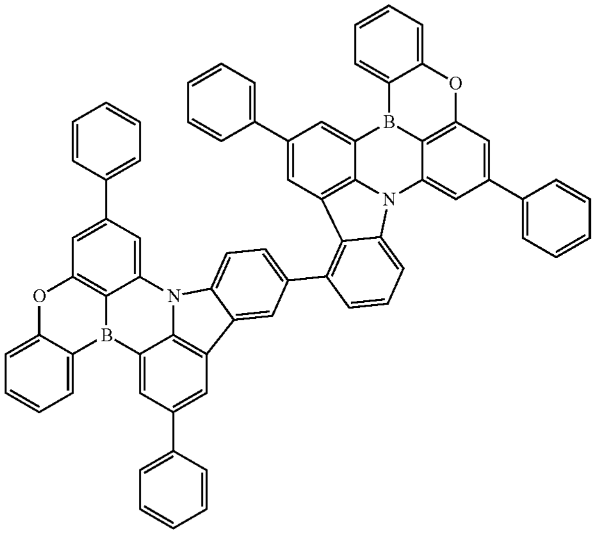
151
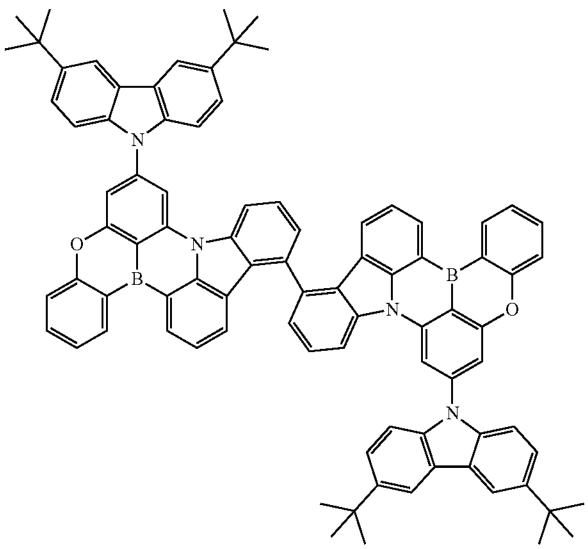
152
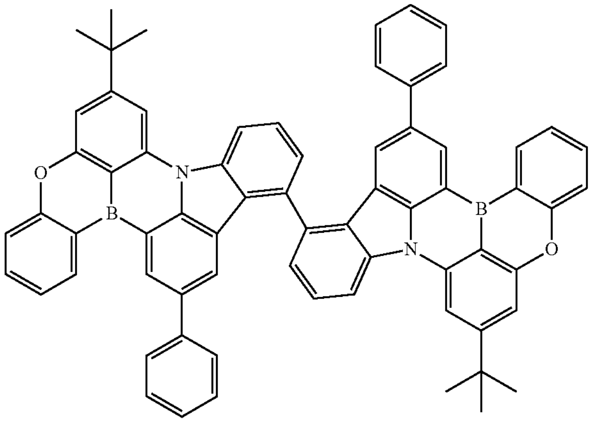

-continued
153
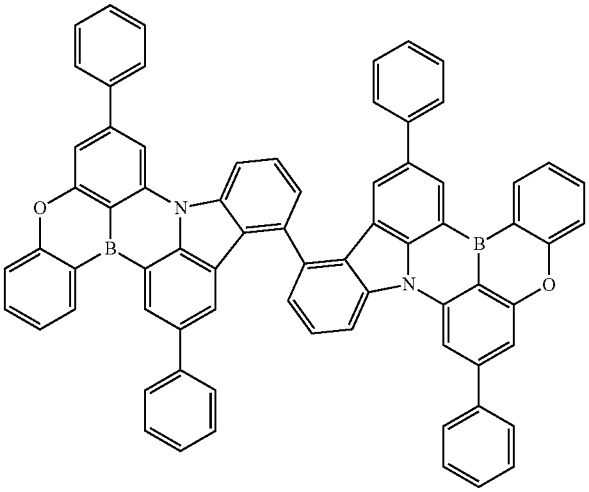
154
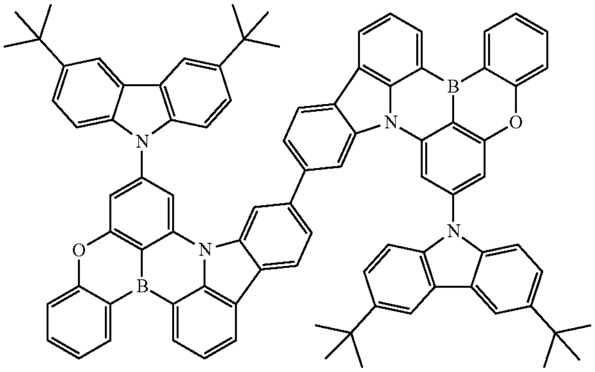
155
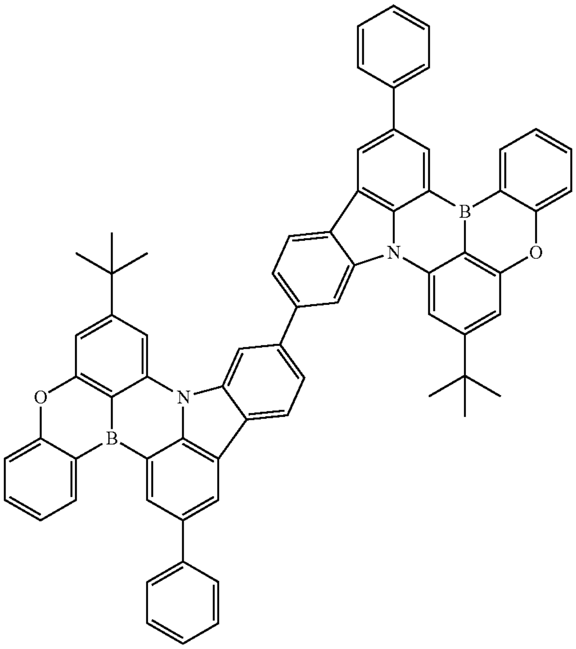
156
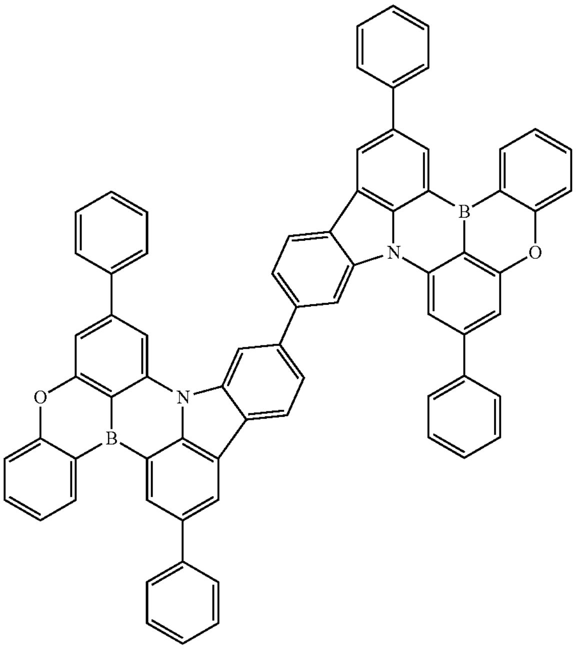

-continued
157
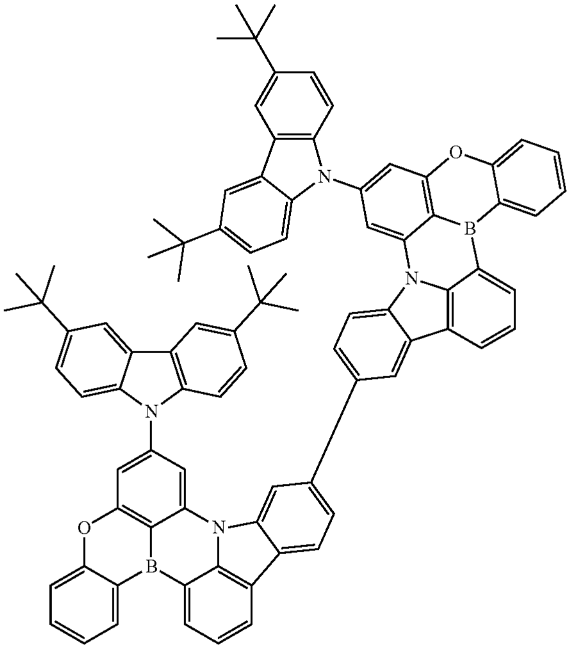
158
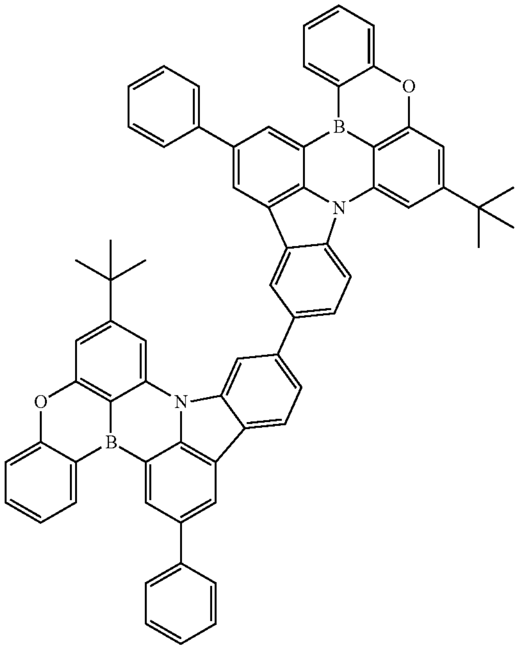
159
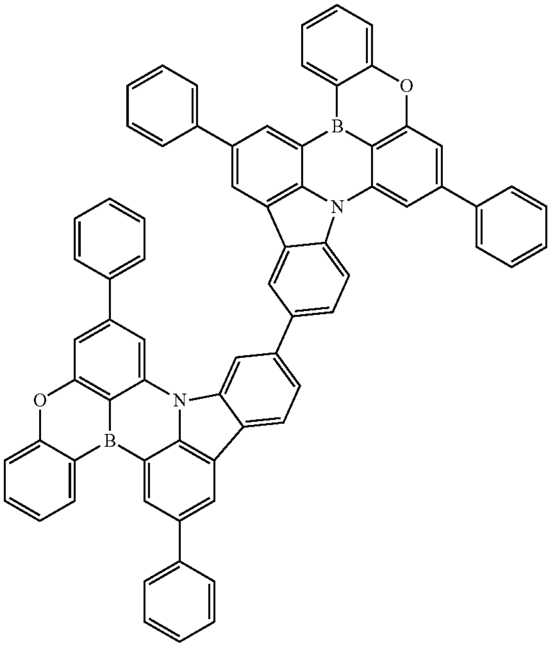
160
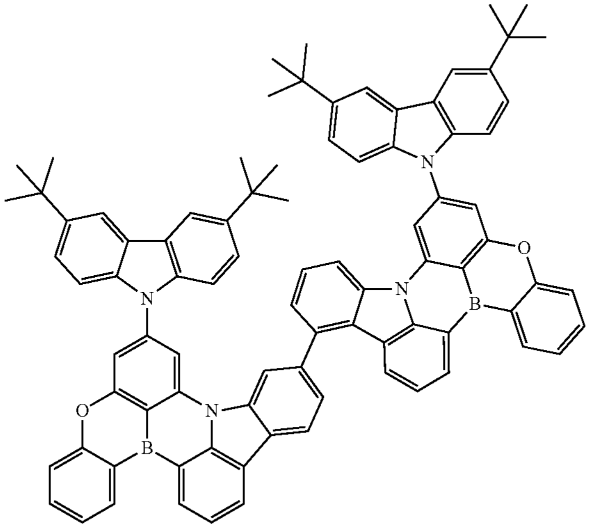

-continued
161
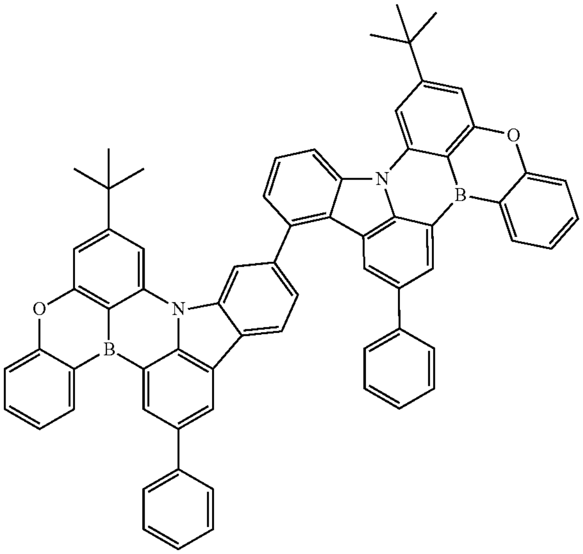
162
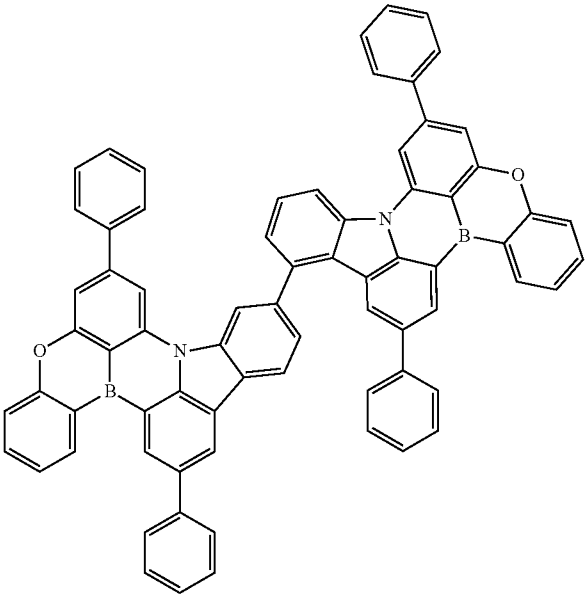
163
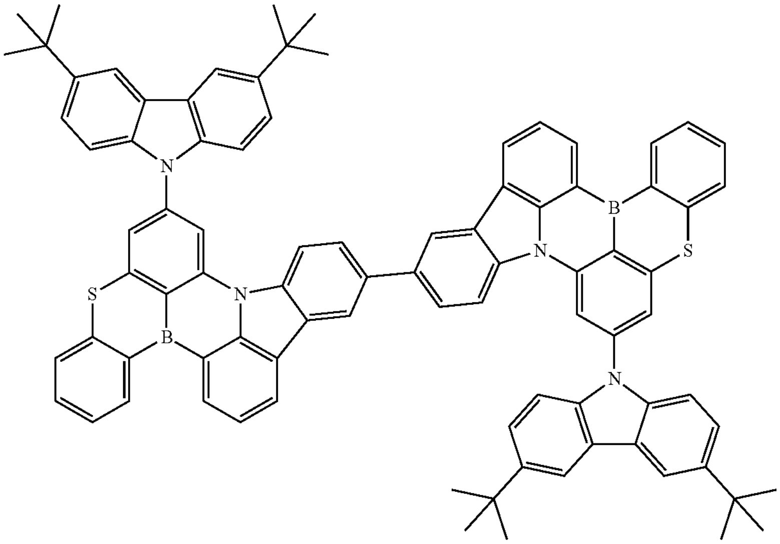

-continued
164
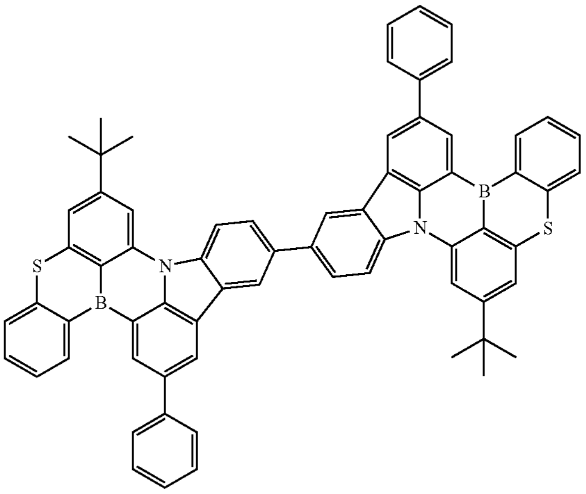
165
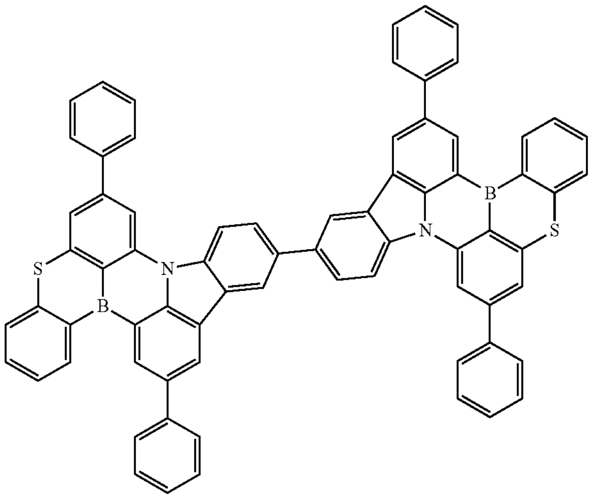
166
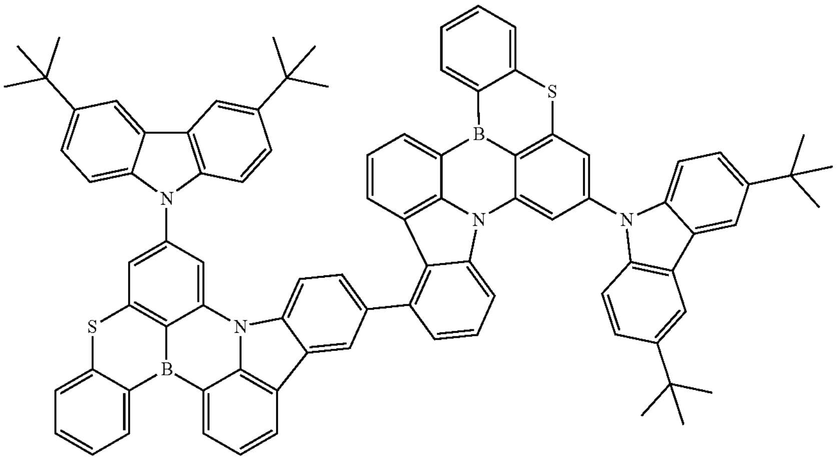
167
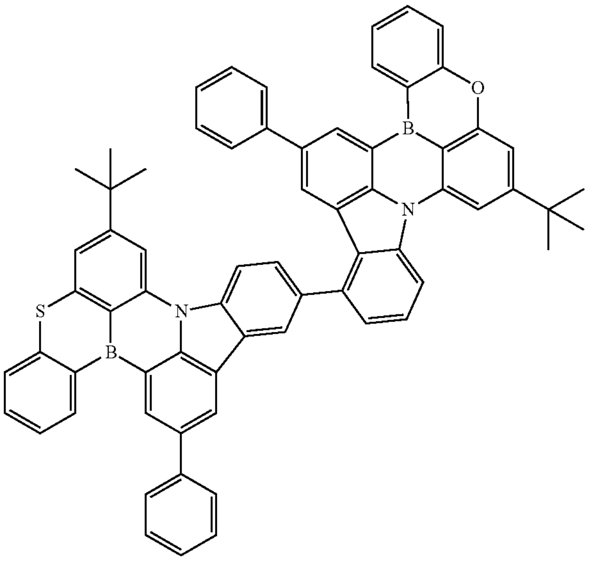
168
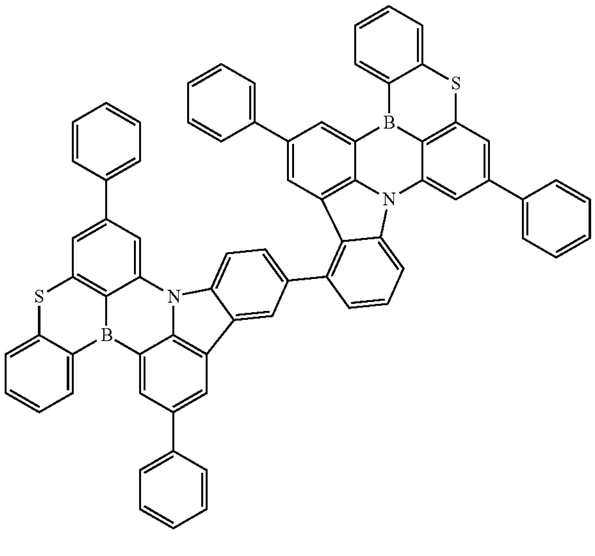

-continued
169
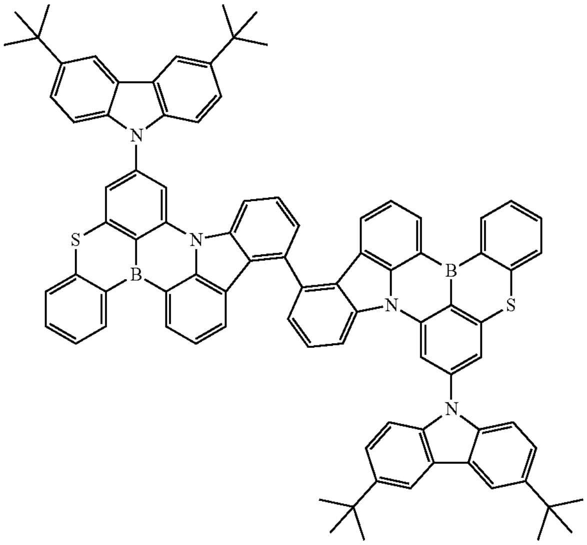
170
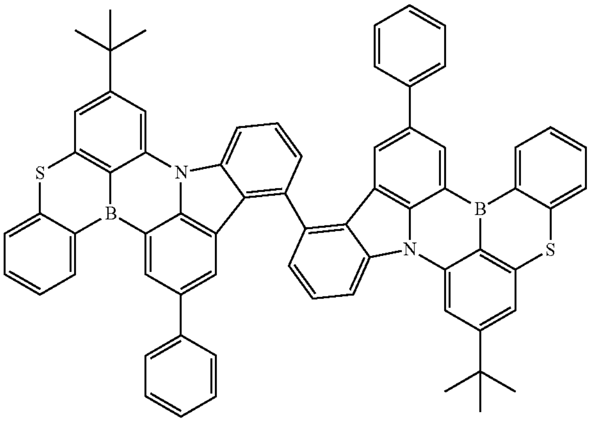
171
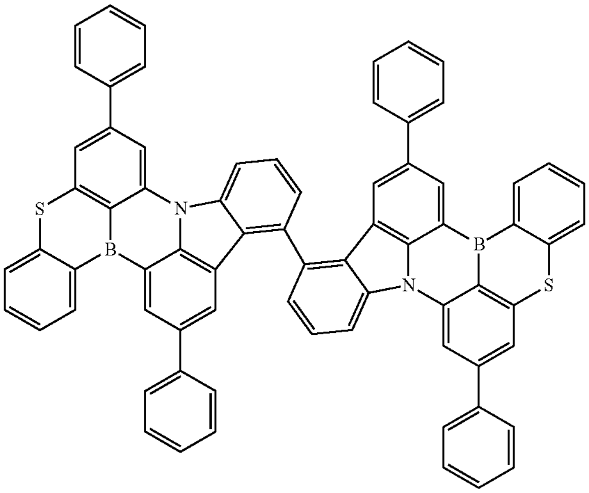
172
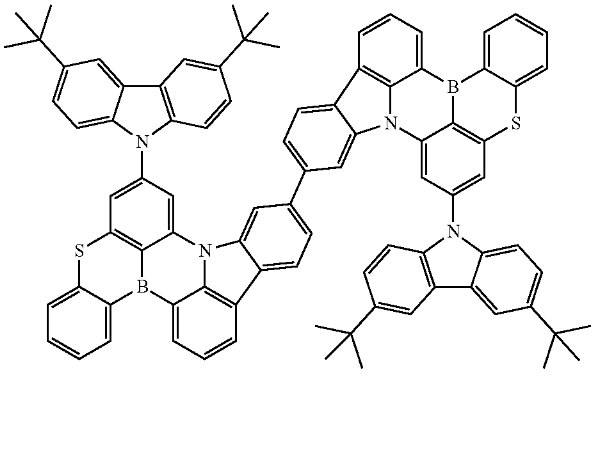

-continued
173
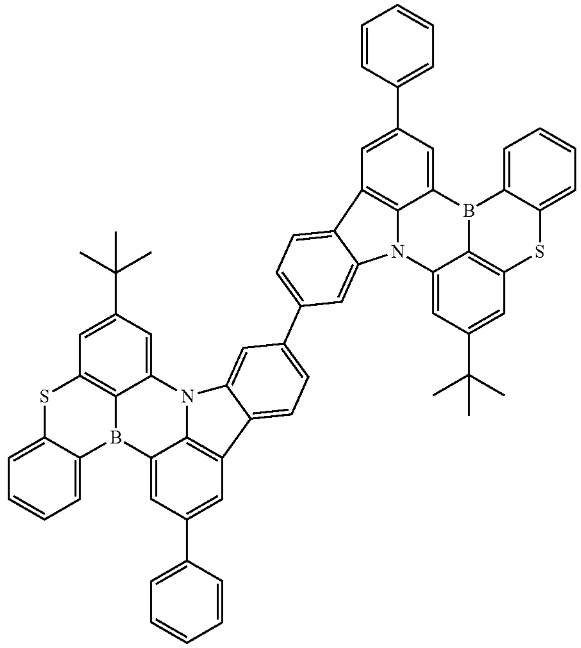
174
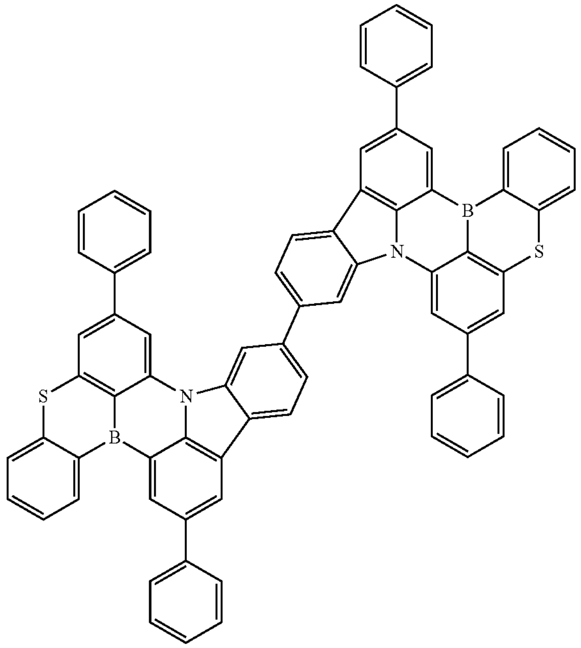
175
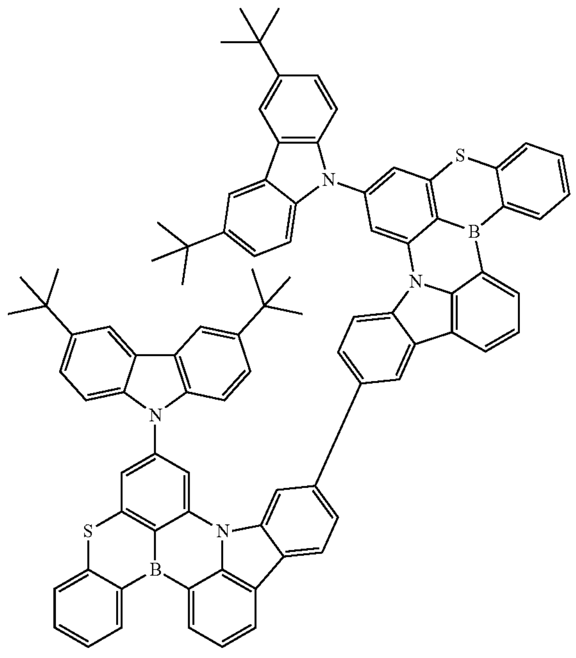
176
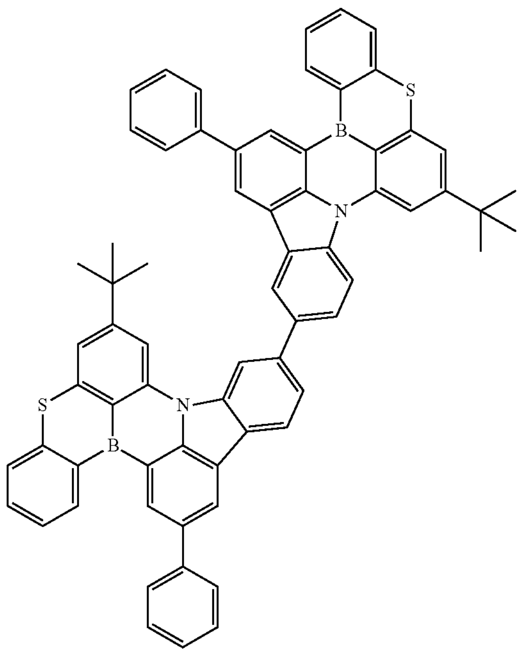

-continued
177
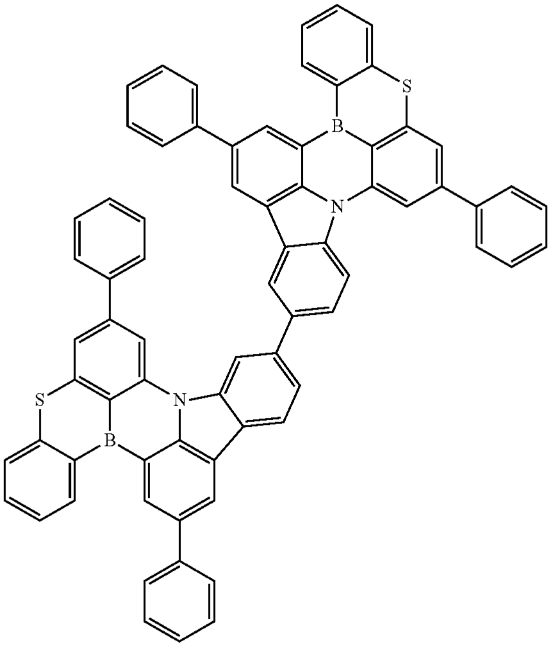
178
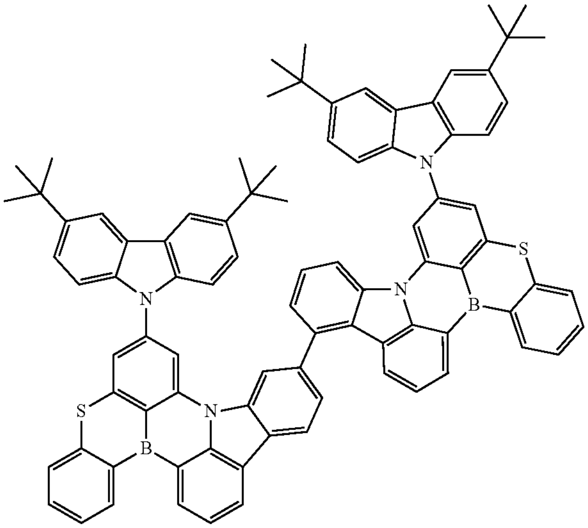
179
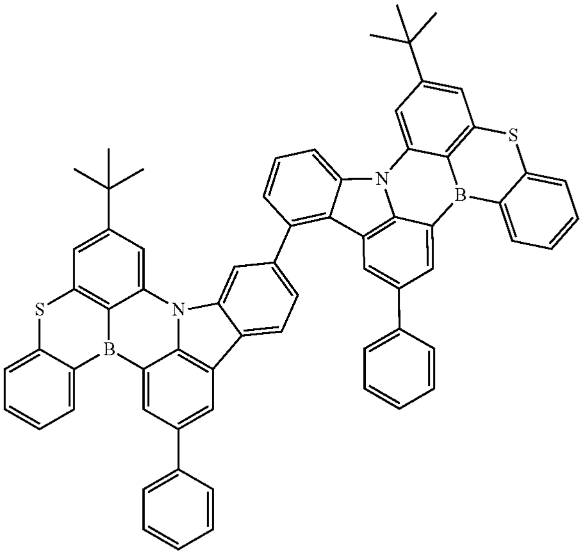
180
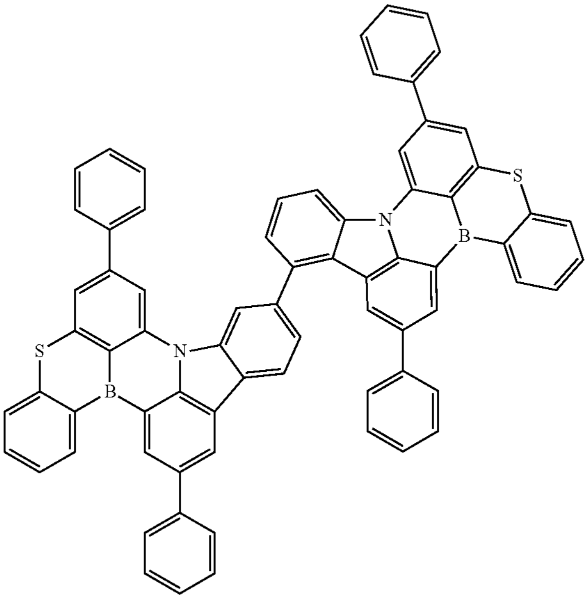
.
* * * * *